US010971507B2

(12) United States Patent
Kaminaga

(10) Patent No.: US 10,971,507 B2
(45) **Date of Patent: *Apr. 6, 2021**

(54) THREE-DIMENSIONAL MEMORY DEVICE CONTAINING THROUGH-MEMORY-LEVEL CONTACT VIA STRUCTURES

(71) Applicant: SANDISK TECHNOLOGIES LLC, Addison, TX (US)

(72) Inventor: Michimoto Kaminaga, Nagoya (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/589,337

(22) Filed: Oct. 1, 2019

(65) Prior Publication Data

US 2020/0035694 A1 Jan. 30, 2020

Related U.S. Application Data

(63) Continuation-in-part of application No. 15/950,505, filed on Apr. 11, 2018, now Pat. No. 10,304,852, and (Continued)

(51) Int. Cl.

*H01L 27/11521* (2017.01)
*H01L 27/06* (2006.01)

(Continued)

(52) U.S. Cl.

CPC .. *H01L 27/11521* (2013.01); *H01L 21/30608* (2013.01); *H01L 21/76813* (2013.01);

(Continued)

(58) Field of Classification Search

CPC ......... H01L 27/11521; H01L 27/11556; H01L 27/11578; H01L 27/0688; H01L 21/76831;

(Continued)

(56) References Cited

U.S. PATENT DOCUMENTS 5,915,167 A 6/1999 Leedy
8,193,571 B2 6/2012 Katsumata et al.

(Continued)

FOREIGN PATENT DOCUMENTS

KR 20100097459 A 9/2010
KR 20170026815 A 3/2017

(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.

(Continued)

*Primary Examiner* — Khiem D Nguyen
(74) *Attorney, Agent, or Firm* — The Marbury Law Group PLLC

(57) ABSTRACT

A first alternating stack of first insulating layers and first sacrificial material layers with first stepped surfaces is formed over a substrate. A first retro-stepped dielectric material portion is formed on the first stepped surfaces. A second alternating stack of second insulating layers and second sacrificial material layers with second stepped surfaces is formed over the first alternating stack. A second retro-stepped dielectric material portion is formed on the second stepped surfaces. A first conductive via structure is formed through the second retro-stepped dielectric material portion, a bottommost insulating layer of the second alternating stack, and the first retro-stepped dielectric material portion. The sacrificial material layers are replaced with electrically conductive layers. The first conductive via structure is electrically connected to a first electrically conductive layer that replaces a first sacrificial material layer, and is electrically isolated from each second electrically conductive layer in the second alternating stack.

5 Claims, 194 Drawing Sheets

Related U.S. Application Data a continuation-in-part of application No. 16/251,780, filed on Jan. 18, 2019, now Pat. No. 10,727,248, which is a continuation-in-part of application No. 16/181,721, filed on Nov. 6, 2018, which is a continuation-in-part of application No. 15/950,505, filed on Apr. 11, 2018, now Pat. No. 10,304,852.

(60) Provisional application No. 62/630,930, filed on Feb. 15, 2018.

(51) Int. Cl.
*H01L 27/11578* (2017.01)
*H01L 21/306* (2006.01)
*H01L 21/768* (2006.01)
*H01L 27/11556* (2017.01)

(52) U.S. Cl.
CPC .... *H01L 21/76831* (2013.01); *H01L 27/0688* (2013.01); *H01L 27/11556* (2013.01); *H01L 27/11578* (2013.01)

(58) Field of Classification Search
CPC ......... H01L 27/11582; H01L 27/11575; H01L 27/11573; H01L 27/1157; H01L 27/11524; H01L 27/11529; H01L 27/11531; H01L 23/5226; H01L 21/76877; H01L 21/76805; H01L 21/76816; H01L 21/76813; H01L 27/76831
See application file for complete search history.

(56) References Cited

U.S. PATENT DOCUMENTS 8,395,190 B2 3/2013 Shim et al.
8,890,235 B2* 11/2014 Kidoh ............... H01L 27/11573 257/326
8,912,060 B2* 12/2014 Uenaka ............. H01L 29/66833 438/257
9,412,749 B1 8/2016 Shimabukuro
9,455,267 B2 9/2016 Zhang et al.
9,466,531 B2* 10/2016 Freeman ........... H01L 27/11582
9,570,463 B1 2/2017 Zhang et al.
9,576,967 B1 2/2017 Kimura et al.
9,627,403 B2 4/2017 Liu et al.
9,659,956 B1 5/2017 Pachamuthu et al.
9,673,213 B1 6/2017 Yu et al.
9,728,499 B2 8/2017 Shimabukuro et al.
9,728,547 B1 8/2017 Ohsaki et al.
9,754,963 B1 9/2017 Kawamura et al.
9,786,681 B1 10/2017 Ariyoshi
9,806,093 B2 10/2017 Toyama et al.
9,853,038 B1 12/2017 Cui
9,881,929 B1 1/2018 Ravikirthi et al.
9,978,766 B1 5/2018 Hosoda et al.
9,991,280 B2 6/2018 Nakamura et al.
10,014,316 B2 7/2018 Yu et al.
10,038,006 B2* 7/2018 Furihata .............. H01L 27/1157
10,090,321 B2 10/2018 Nakajima
10,192,784 B1 1/2019 Cui et al.
10,304,852 B1 5/2019 Cui et al.
2006/0110880 A1 5/2006 Yuan
2009/0230449 A1 9/2009 Sakaguchi et al.
2010/0090188 A1 4/2010 Futatsuyama
2010/0133598 A1 6/2010 Chae et al.
2010/0213527 A1 8/2010 Shim et al.
2010/0224962 A1 9/2010 Kim
2010/0254191 A1 10/2010 Son et al.
2011/0031546 A1 2/2011 Uenaka et al.
2011/0065272 A1 3/2011 Mizukami et al.
2011/0198687 A1 8/2011 Lee
2011/0248327 A1 10/2011 Son et al.
2011/0266606 A1 11/2011 Park et al.
2012/0061744 A1* 3/2012 Hwang ............. H01L 27/11573 257/324
2012/0098050 A1 4/2012 Shim et al.
2012/0181701 A1 7/2012 Chen et al.
2012/0306090 A1* 12/2012 Smith ............... H01L 21/76816 257/773
2013/0313627 A1 11/2013 Lee et al.
2014/0042519 A1 2/2014 Lee et al.
2014/0092686 A1 4/2014 Shim et al.
2014/0192594 A1 7/2014 Lue
2014/0231954 A1 8/2014 Lue
2015/0055413 A1 2/2015 Alsmeier
2015/0076586 A1 3/2015 Rabkin et al.
2015/0115455 A1 4/2015 Chen
2015/0155292 A1 6/2015 Son et al.
2015/0179662 A1 6/2015 Makala et al.
2015/0187425 A1 7/2015 Nam et al.
2015/0236038 A1 8/2015 Pachamuthu et al.
2016/0049421 A1 2/2016 Zhang et al.
2016/0086969 A1 3/2016 Zhang et al.
2016/0329341 A1 11/2016 Shimabukuro et al.
2017/0110402 A1 4/2017 Smith et al.
2017/0179026 A1* 6/2017 Toyama ............ H01L 27/11573
2017/0179151 A1* 6/2017 Kai ..................... H01L 23/5226
2017/0179152 A1 6/2017 Toyama et al.
2017/0236746 A1 8/2017 Yu et al.
2017/0236835 A1* 8/2017 Nakamura ........ H01L 27/11582 257/314
2017/0287926 A1 10/2017 Ariyoshi
2017/0358590 A1 12/2017 Kang et al.
2017/0373087 A1 12/2017 Ito et al.
2017/0373197 A1 12/2017 Sharangpani et al.
2018/0040627 A1 2/2018 Kanakamedala et al.
2018/0108671 A1 4/2018 Yu et al.
2018/0130812 A1 5/2018 Hosoda et al.
2018/0138194 A1 5/2018 Shigemura et al.
2018/0151588 A1 5/2018 Tsutsumi et al.
2018/0172771 A1 6/2018 Miyamoto et al.
2018/0182771 A1 6/2018 Costa et al.
2018/0277596 A1 9/2018 Mori
2019/0229125 A1 7/2019 Zhou et al.
2019/0252403 A1 8/2019 Kaminaga et al.
2019/0252404 A1 8/2019 Kaminaga et al.

FOREIGN PATENT DOCUMENTS

KR 20170119158 A 10/2017
WO 2017142806 A1 8/2017
WO 2017213721 A1 12/2017

OTHER PUBLICATIONS

International Searching Authority, Invitation to Pay Additional Fees and Partial International Search for PCT/US2015/048513, dated Dec. 1, 2015, 8 pages.
International Search Report and Written Opinion of the International Search Authority for International Patent Application No. PCT/US2018/061854, dated Mar. 11, 2019, 13 pages.
USPTO Office Communication, Final Office Action for U.S. Appl. No. 16/181,721, dated Feb. 5, 2020, 21 pages.
USPTO Office Communication, Final Office Action for U.S. Appl. No. 16/881,353, dated Sep. 3, 2020, 25 pages.

* cited by examiner

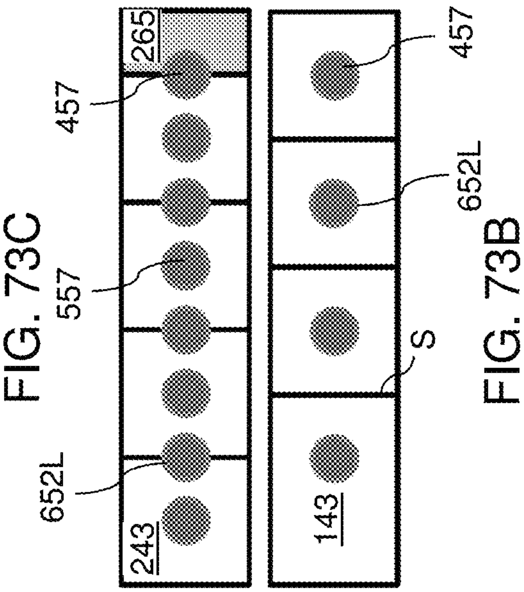
FIG. 73C
FIG. 73B
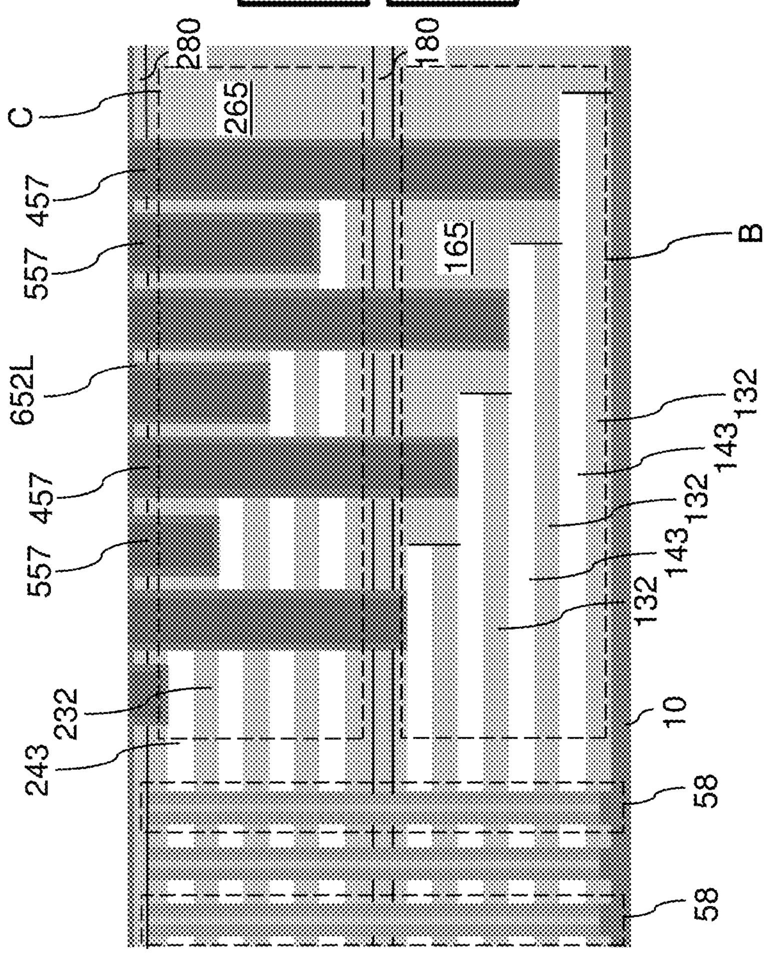
FIG. 73A

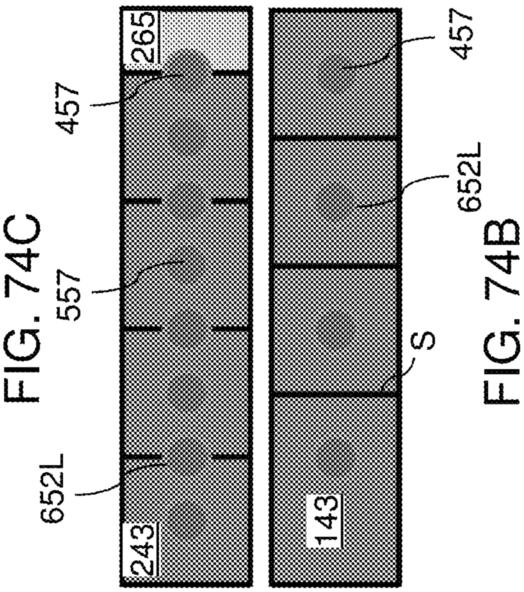
FIG. 74C
FIG. 74B
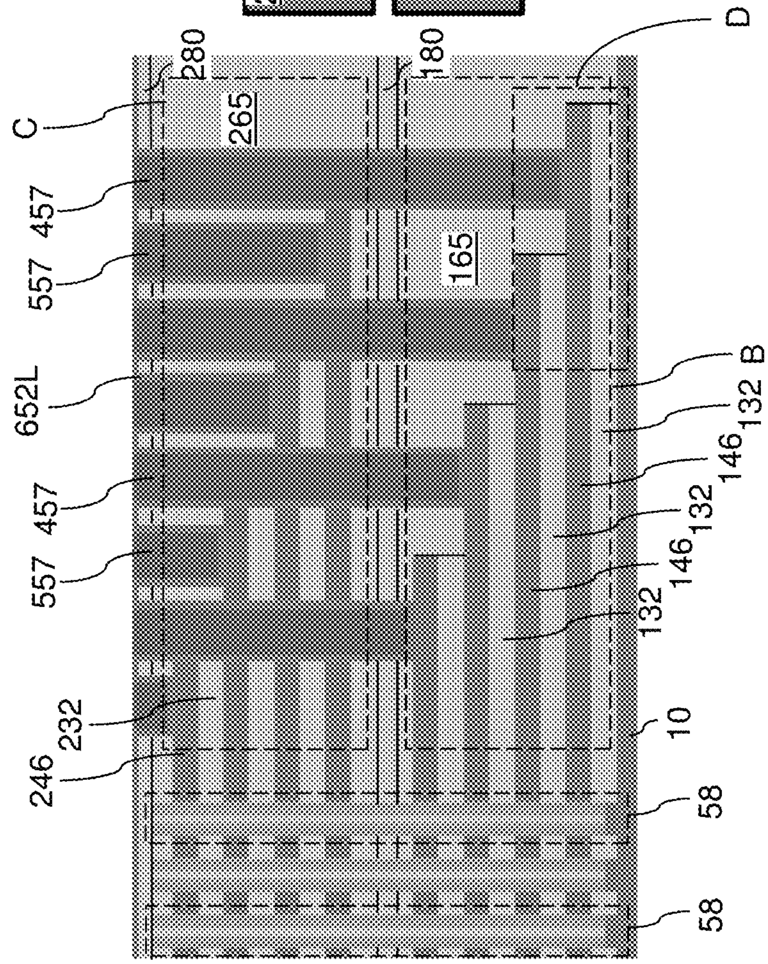
FIG. 74A

FIG. 79C
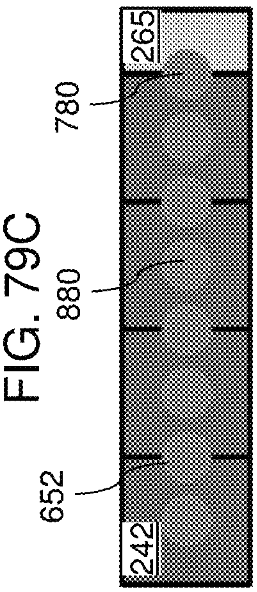
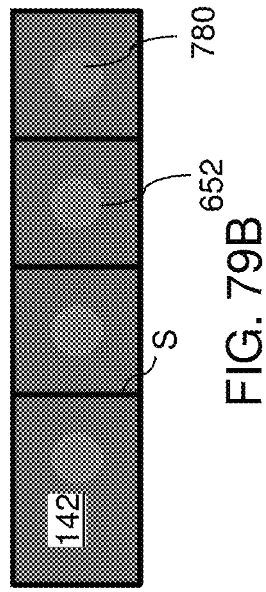
FIG. 79B
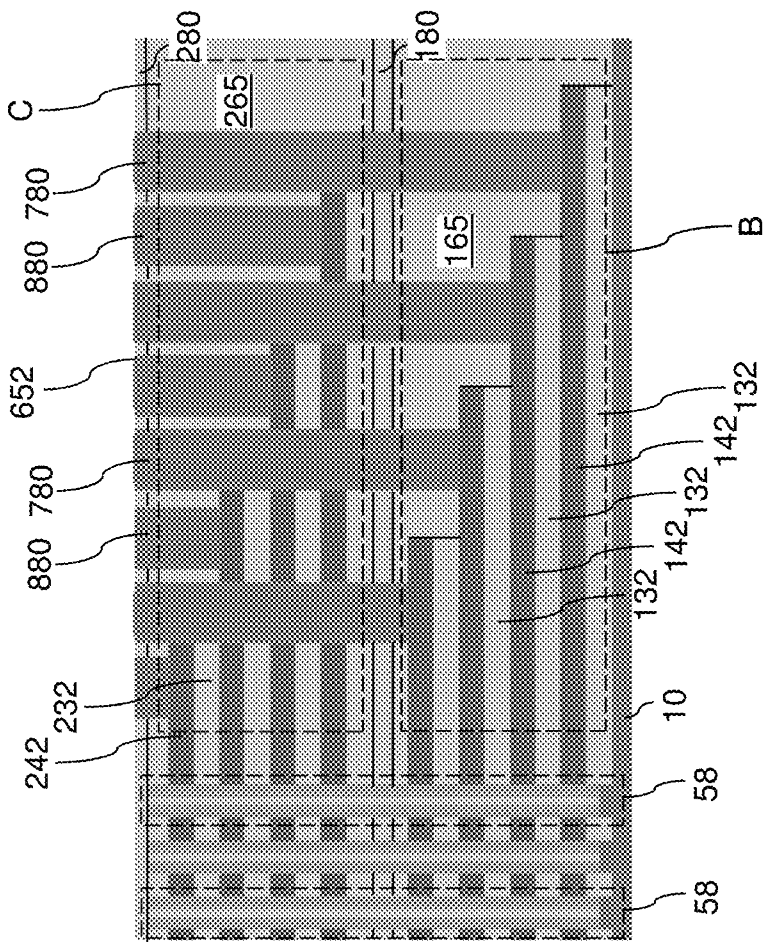
FIG. 79A

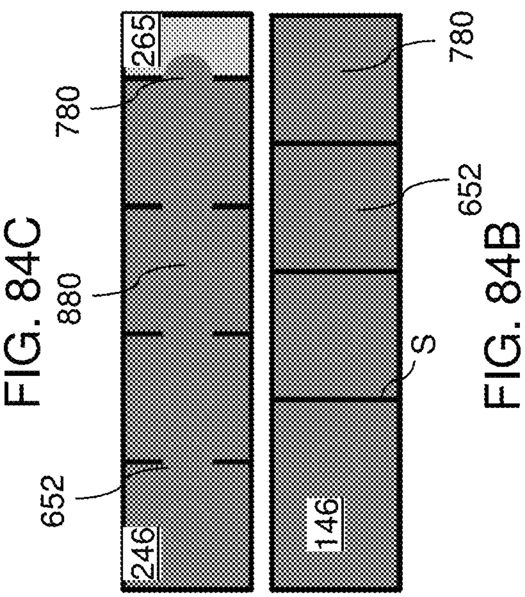
FIG. 84C
FIG. 84B
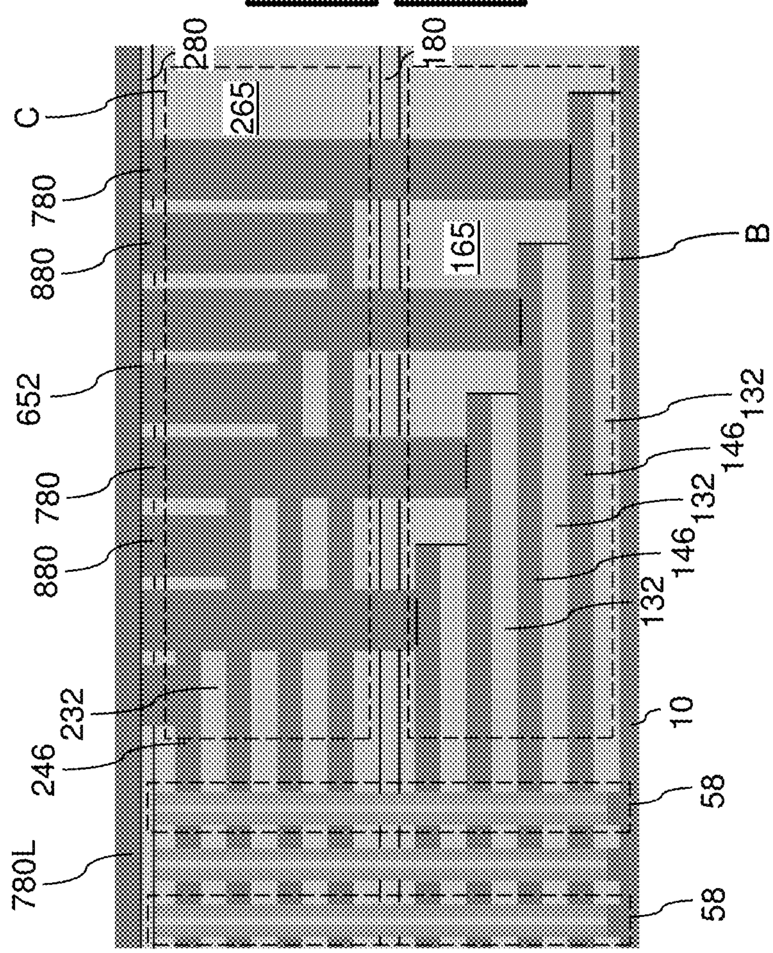
FIG. 84A

THREE-DIMENSIONAL MEMORY DEVICE CONTAINING THROUGH-MEMORY-LEVEL CONTACT VIA STRUCTURES

RELATED APPLICATIONS

The present application is a continuation-in-part application of U.S. patent application Ser. No. 16/251,780 filed on Jan. 18, 2019, issued as U.S. Pat. No. 10,727,248, which is a continuation-in-part application of U.S. patent application Ser. No. 16/181,721 filed on Nov. 6, 2018, which is a continuation-in-part application of U.S. patent application Ser. No. 15/950,505, filed on Apr. 11, 2018, issued as U.S. Pat. No. 10,304,852, which claims the benefit of priority of U.S. Provisional Application Ser. No. 62/630,930 filed on Feb. 15, 2018. The entire contents of each of the above-referenced applications are incorporated herein by reference.

FIELD

The present disclosure relates generally to the field of semiconductor devices and specifically to a three-dimensional memory device including through-memory-level contact via structures and methods of making the same.

BACKGROUND

Recently, ultra-high density storage devices using three-dimensional (3D) memory stack structures have been proposed. For example, a 3D NAND stacked memory device may be formed from an array of an alternating stack of insulating materials and spacer material layers that are formed as electrically conductive layers or replaced with electrically conductive layers over a substrate containing peripheral devices (e.g., driver/logic circuits). Memory openings are formed through the alternating stack, and are filled with memory stack structures, each of which includes a vertical stack of memory elements and a vertical semiconductor channel. Semiconductor devices or metal interconnect structures may be provided underneath the alternating stack.

SUMMARY

According to an aspect of the present disclosure, a device structure is provided, which comprises: a first alternating stack of first insulating layers and first electrically conductive layers located over a substrate and including first stepped surfaces in a staircase region; a first retro-stepped dielectric material portion overlying the first stepped surfaces of the first alternating stack; a second alternating stack of second insulating layers and second electrically conductive layers located over the first alternating stack and including second stepped surfaces in the staircase region; a second retro-stepped dielectric material portion overlying the second stepped surfaces of the second alternating stack; and a first laterally-insulated staircase region via structure vertically extending through a first subset of the second electrically conductive layers of the second alternating stack and the first retro-stepped dielectric material portion, wherein the first laterally-insulated staircase region via structure comprises a first conductive via structure that is electrically connected to one of the first electrically conductive layers, and is electrically isolated from each of the second electrically conductive layers.

According to another aspect of the present disclosure, a method of forming a device structure is provided, which comprises the steps of: forming a first alternating stack of first insulating layers and first sacrificial material layers over a substrate; patterning the first alternating stack to form first stepped surfaces in a staircase region; forming a first retro-stepped dielectric material portion on the first stepped surfaces; forming a second alternating stack of second insulating layers and second sacrificial material layers over the first alternating stack; patterning the second alternating stack to form second stepped surfaces in the staircase region; forming a second retro-stepped dielectric material portion on the second stepped surfaces; forming a first laterally-insulated staircase region via structure including a first conductive via structure through the second retro-stepped dielectric material portion, a subset of layers of the second alternating stack that includes at least a bottommost insulating layer of the second alternating stack, and the first retro-stepped dielectric material portion; and replacing the first sacrificial material layers and the second sacrificial material layers with first electrically conductive layers and second electrically conductive layers, respectively, prior to, concurrently with, or after, formation of the first conductive via structure, wherein the first conductive via structure is electrically connected to one of the first electrically conductive layers, and is electrically isolated from each of the second electrically conductive layers.

According to an embodiment of the present disclosure, a device structure is provided, which comprises: an alternating stack of insulating layers and electrically conductive layers located over a substrate and including stepped surfaces in a staircase region; a retro-stepped dielectric material portion overlying the stepped surfaces of the alternating stack; and a laterally-insulated staircase region via structure vertically extending through the alternating stack and the retro-stepped dielectric material portion. The laterally-insulated staircase region via structure comprises a ribbed insulating spacer comprising a neck portion that extends through the alternating stack, and laterally-protruding annular rib regions extending from the neck portion at each level of insulating layers, and a conductive via structure extending through the neck portion of the ribbed insulating spacer and contacting one of the electrically conductive layers.

According to another embodiment of the present disclosure, a method of forming a device structure is provided, which comprises the steps of: forming an alternating stack of insulating layers and spacer material layers including stepped surfaces in a staircase region over a substrate, wherein the spacer material layers are formed as, or are subsequently replaced with, electrically conductive layers; forming a retro-stepped dielectric material portion over the stepped surfaces of the alternating stack; forming a via cavity through the retro-stepped dielectric material portion and a subset of layers within the alternating stack; forming a ribbed via cavity by isotropically recessing each insulating layer within the subset of layers within the alternating stack around the via cavity; depositing a conformal dielectric via liner at a periphery of the ribbed via cavity; forming a ribbed insulating liner by performing an anisotropic etch process on the conformal dielectric via liner, wherein a remaining portion of the conformal dielectric via liner constitutes the ribbed insulating liner; and forming a conductive via structure within remaining portions of the conformal dielectric via liner by depositing a conductive material therein.

According to yet another embodiment of the present disclosure, a device structure is provided, which comprises: an alternating stack of insulating layers and electrically conductive layers located over a substrate and including stepped surfaces in a staircase region; a dielectric liner located on the stepped surfaces; a retro-stepped dielectric material portion overlying the dielectric liner and having a top surface located at, or above, a topmost surface of the alternating stack; a flanged conductive via structure including a conductive pillar portion extending through the retro-stepped dielectric material portion, the dielectric liner, a horizontal surface from the stepped surfaces, and a subset of layers within the alternating stack, and a conductive flange portion laterally protruding from the conductive pillar portion and contacting a top surface of a topmost electrically conductive layer in the subset of layers within the alternating stack; and annular insulating spacers located at each level of electrically conductive layers in the subset of layers within the alternating stack and laterally surrounding the conductive pillar portion.

According to still another embodiment of the present disclosure, a method of forming a device structure is provided, which comprises the steps of: forming an alternating stack of insulating layers and spacer material layers including stepped surfaces in a staircase region over a substrate, wherein the spacer material layers are formed as, or are subsequently replaced with, electrically conductive layers; forming a dielectric liner on the stepped surfaces; forming a retro-stepped dielectric material portion over the stepped surfaces of the alternating stack; forming a via cavity through the retro-stepped dielectric material portion, a horizontal portion of the dielectric liner, and a subset of layers within the alternating stack; forming an annular lateral cavity region by laterally recessing the horizontal portion of the dielectric liner around the via cavity selective to dielectric materials of the insulating layers and the retro-stepped dielectric material portion; and forming a flanged conductive via structure in the via cavity and the annular lateral cavity region by depositing a conductive material therein, wherein the flanged conductive via structure contacts an annular top surface of a topmost electrically conductive layer comprise electrically conductive layers through which the flanged conductive via structure vertically extends.

BRIEF DESCRIPTION OF THE DRAWINGS

FIG. 71A is a vertical cross-sectional view of a region of the sixth exemplary structure after formation of a continuous dielectric liner according to an embodiment of the present disclosure.

FIG. 71B is a see-through top-down view of region B of FIG. 71A.

FIG. 71C is a see-through top-down view of region C of FIG. 71A.

FIG. 72A is a vertical cross-sectional view of a region of the sixth exemplary structure after formation of inter-tier sacrificial via fill structures according to an embodiment of the present disclosure.

FIG. 72B is a see-through top-down view of region B of FIG. 72A.

FIG. 72C is a see-through top-down view of region C of FIG. 72A.

FIG. 73A is a vertical cross-sectional view of a region of the sixth exemplary structure after formation of backside recesses by removal of the sacrificial material layers according to an embodiment of the present disclosure.

FIG. 73B is a see-through top-down view of region B of FIG. 73A.

FIG. 73C is a see-through top-down view of region C of FIG. 73A.

FIG. 74A is a vertical cross-sectional view of a region of the sixth exemplary structure after formation of electrically conductive layers in the backside recesses according to an embodiment of the present disclosure.

FIG. 74B is a see-through top-down view of region B of FIG. 74A.

FIG. 74C is a see-through top-down view of region C of FIG. 74A.

Figure 74D:
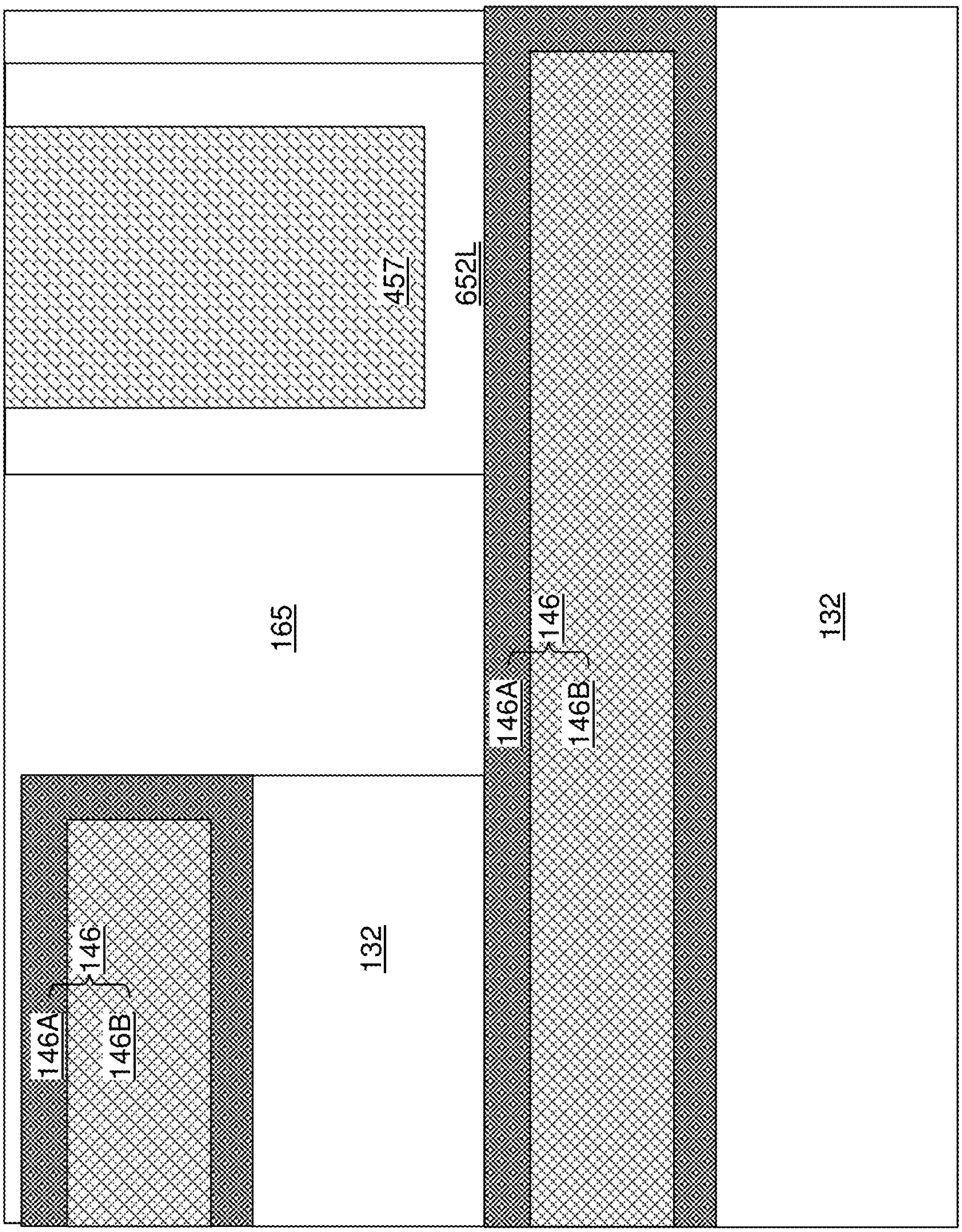

FIG. 74D is a magnified view of region D of FIG. 74A.

Figure 75C:
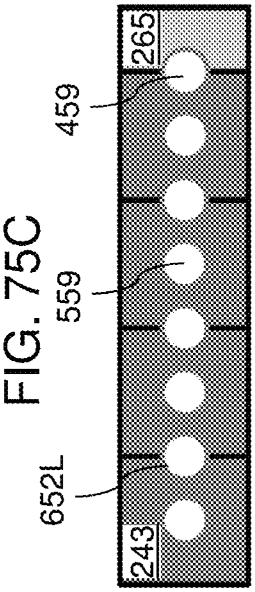
Figure 75B:
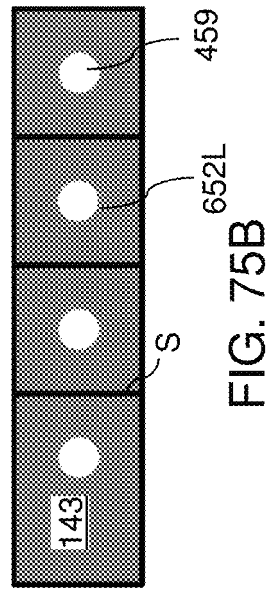
Figure 75A:
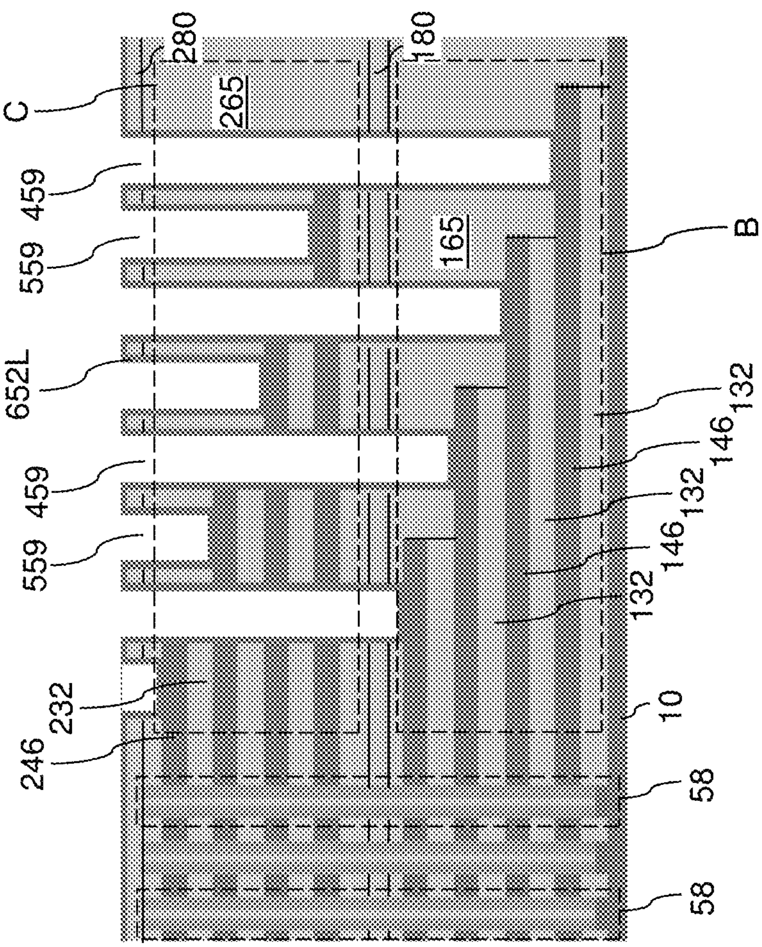

FIG. 75A is a vertical cross-sectional view of a region of the sixth exemplary structure after formation of voids in the inter-tier via cavities and second-tier via cavities according to an embodiment of the present disclosure.

FIG. 75B is a see-through top-down view of region B of FIG. 75A.

FIG. 75C is a see-through top-down view of region C of FIG. 75A.

Figures 76A, 76B, 76C:
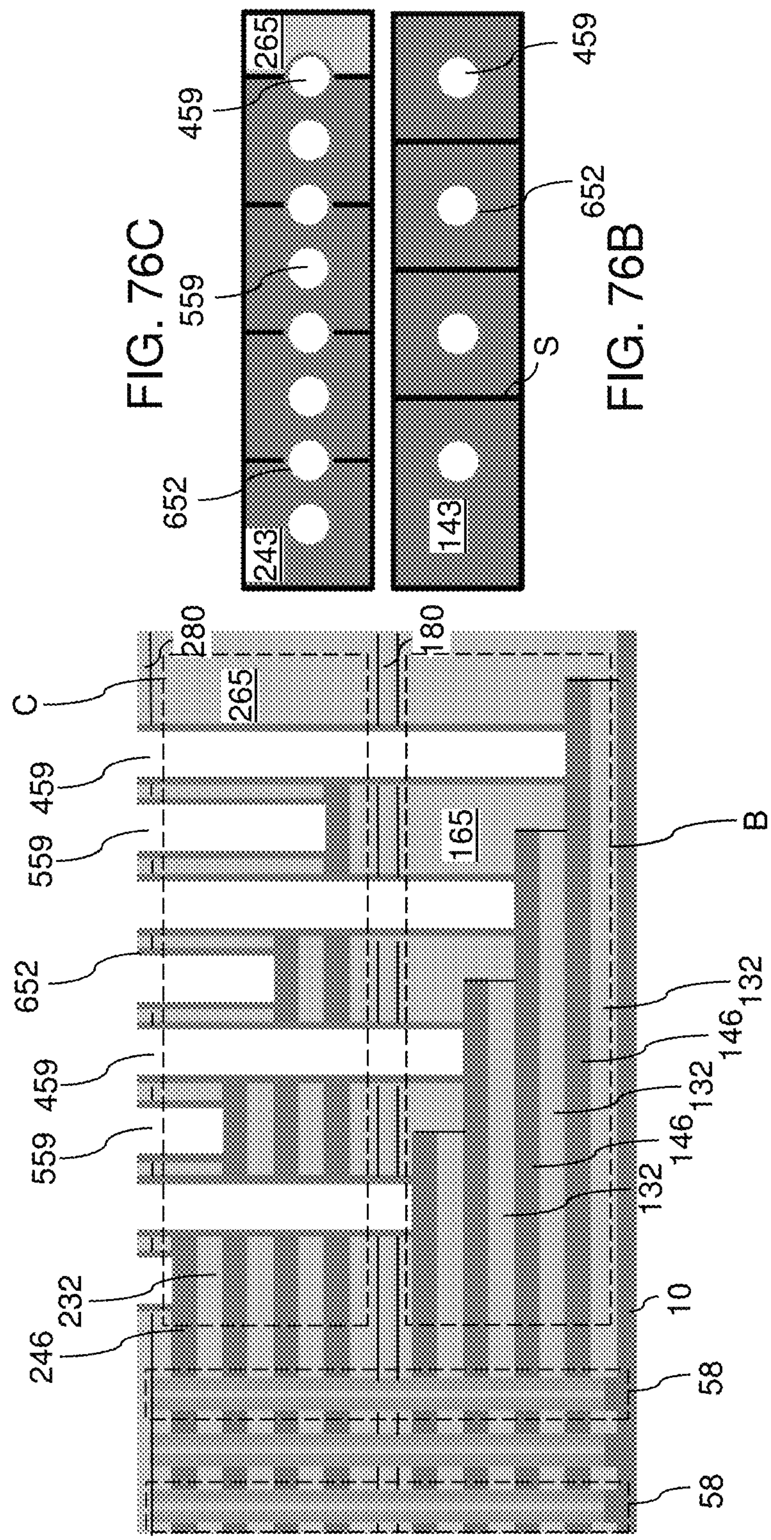

FIG. 76A is a vertical cross-sectional view of a region of the sixth exemplary structure after formation of dielectric liners by anisotropically etching the continuous dielectric liner according to an embodiment of the present disclosure.

FIG. 76B is a see-through top-down view of region B of FIG. 76A.

FIG. 76C is a see-through top-down view of region C of FIG. 76A.

Figures 77A, 77B, 77C:
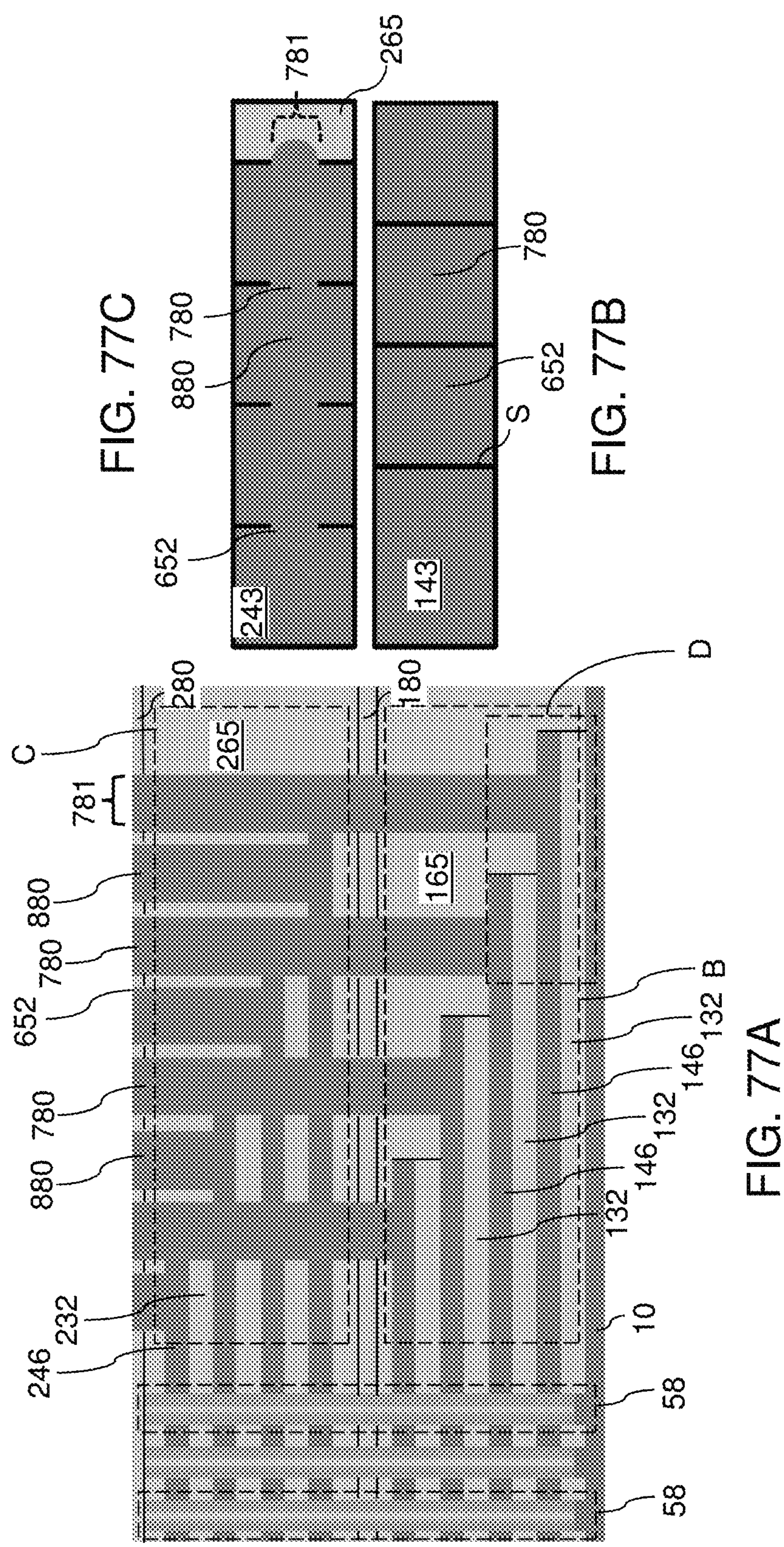

FIG. 77A is a vertical cross-sectional view of a region of the sixth exemplary structure after formation of laterally-insulated staircase region via structures according to an embodiment of the present disclosure.

FIG. 77B is a see-through top-down view of region B of FIG. 77A.

FIG. 77C is a see-through top-down view of region C of FIG. 77A.

Figure 77D:
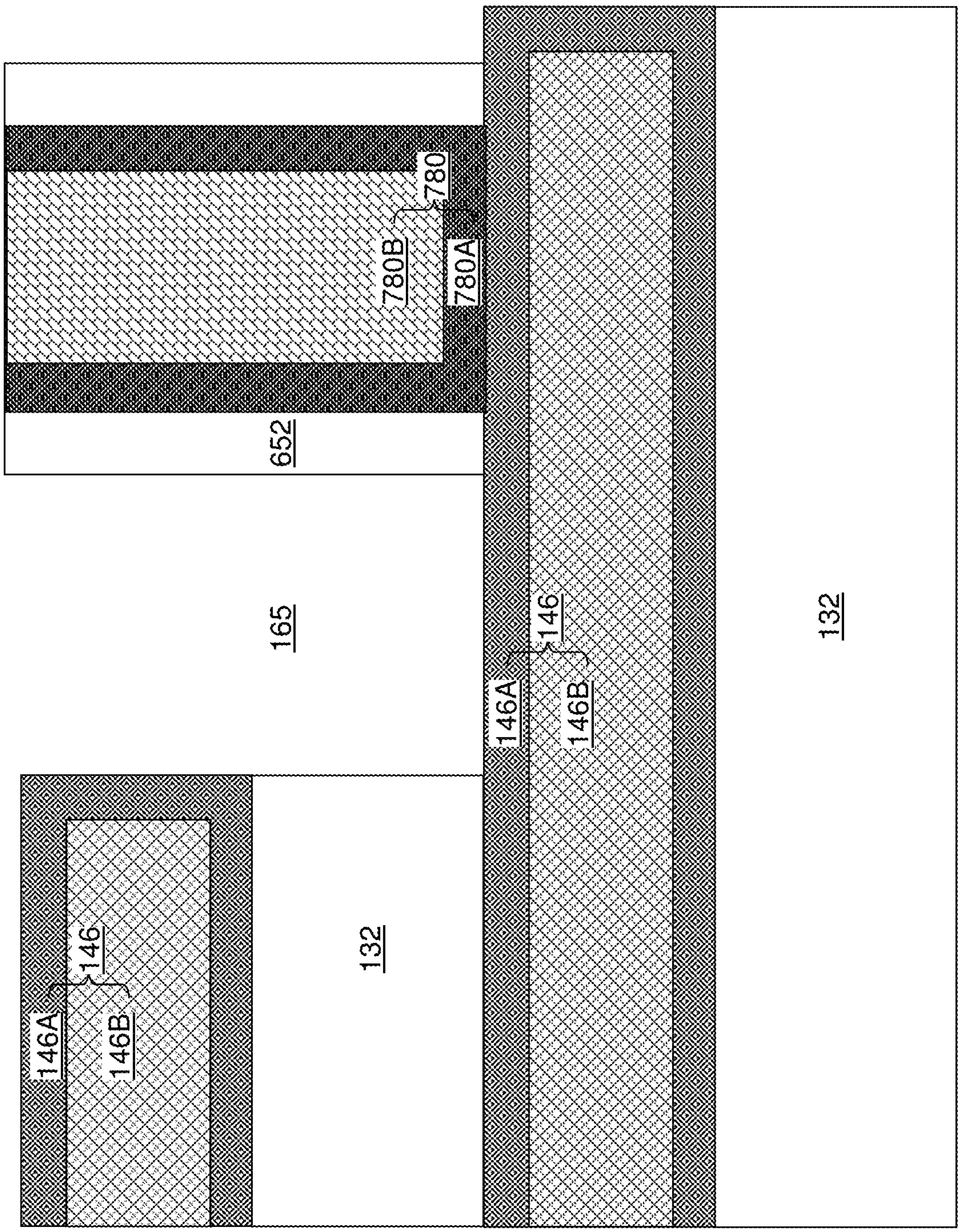

FIG. 77D is a magnified view of region D of FIG. 77A.

Figures 78A, 78B, 78C:
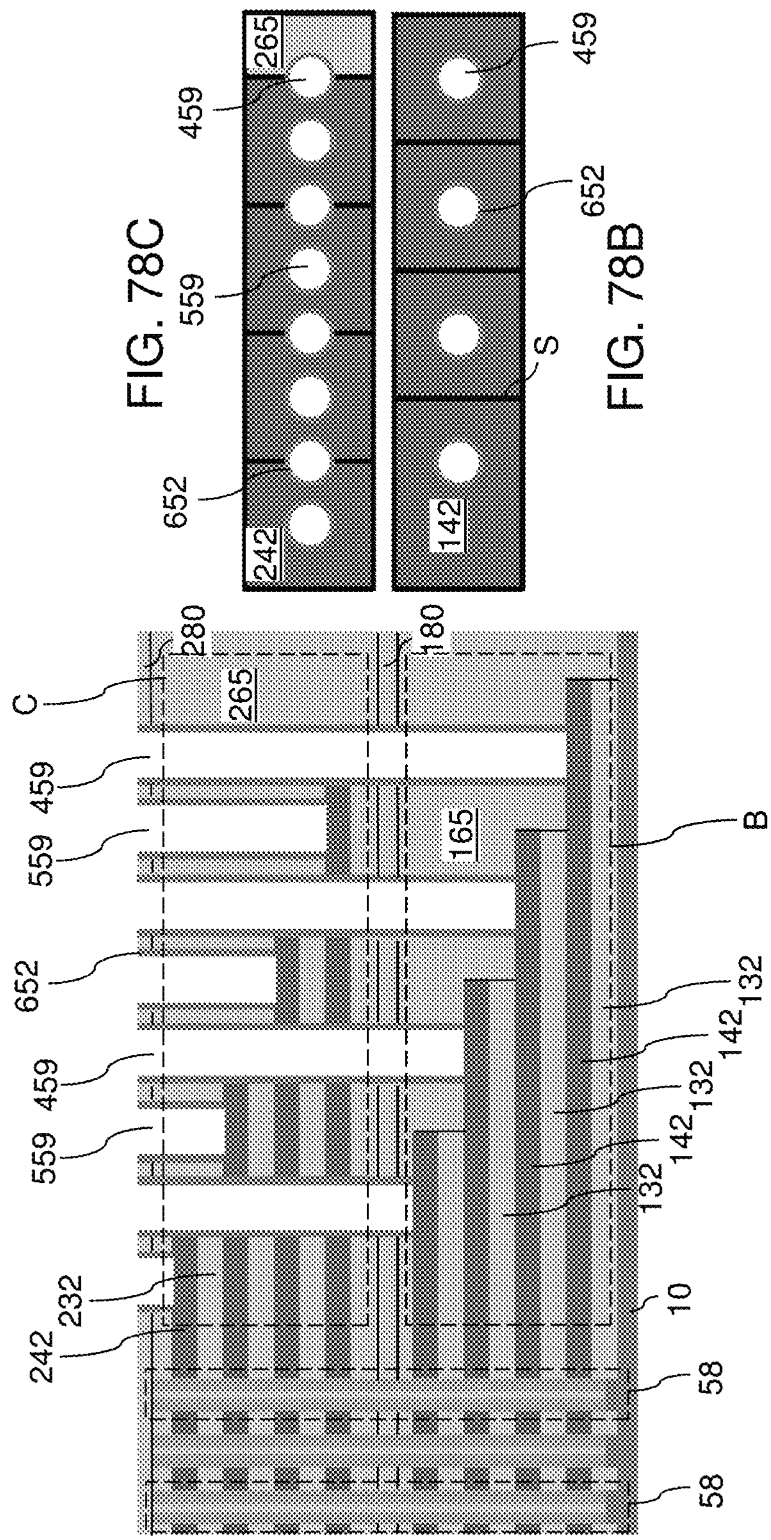

FIG. 78A is a vertical cross-sectional view of a region of a first alternative configuration of the sixth exemplary structure after formation of dielectric liners according to an embodiment of the present disclosure.

FIG. 78B is a see-through top-down view of region B of FIG. 78A.

FIG. 78C is a see-through top-down view of region C of FIG. 78A.

FIG. 79A is a vertical cross-sectional view of a region of the first alternative configuration of the sixth exemplary structure after formation of laterally-insulated staircase region via structures according to an embodiment of the present disclosure.

FIG. 79B is a see-through top-down view of region B of FIG. 79A.

FIG. 79C is a see-through top-down view of region C of FIG. 79A.

Figure 80C:
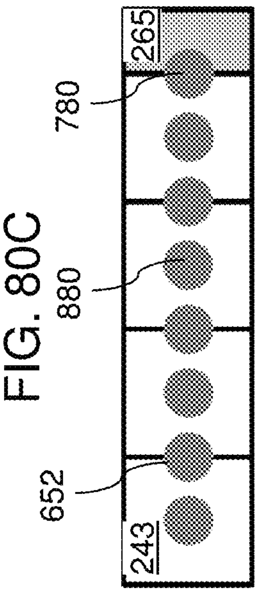
Figure 80B:
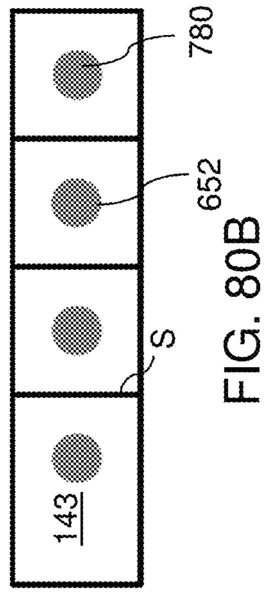
Figure 80A:
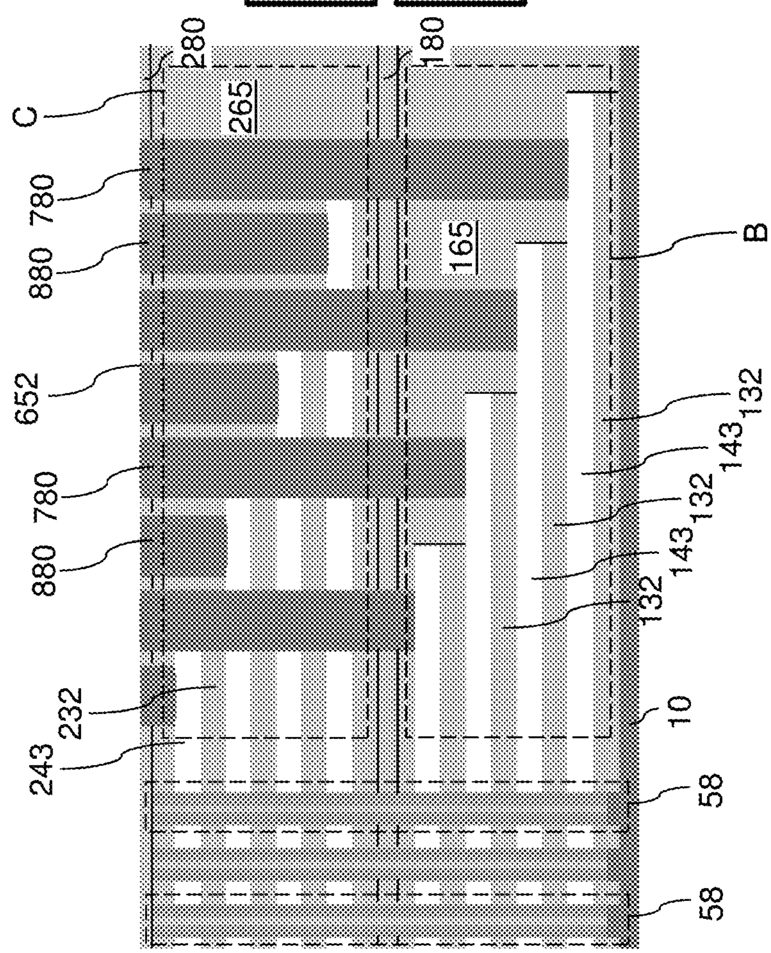

FIG. 80A is a vertical cross-sectional view of a region of the first alternative configuration of the sixth exemplary structure after formation of backside recesses by removal of sacrificial material layers according to an embodiment of the present disclosure.

FIG. 80B is a see-through top-down view of region B of FIG. 80A.

FIG. 80C is a see-through top-down view of region C of FIG. 80A.

Figures 81A, 81B, 81C:
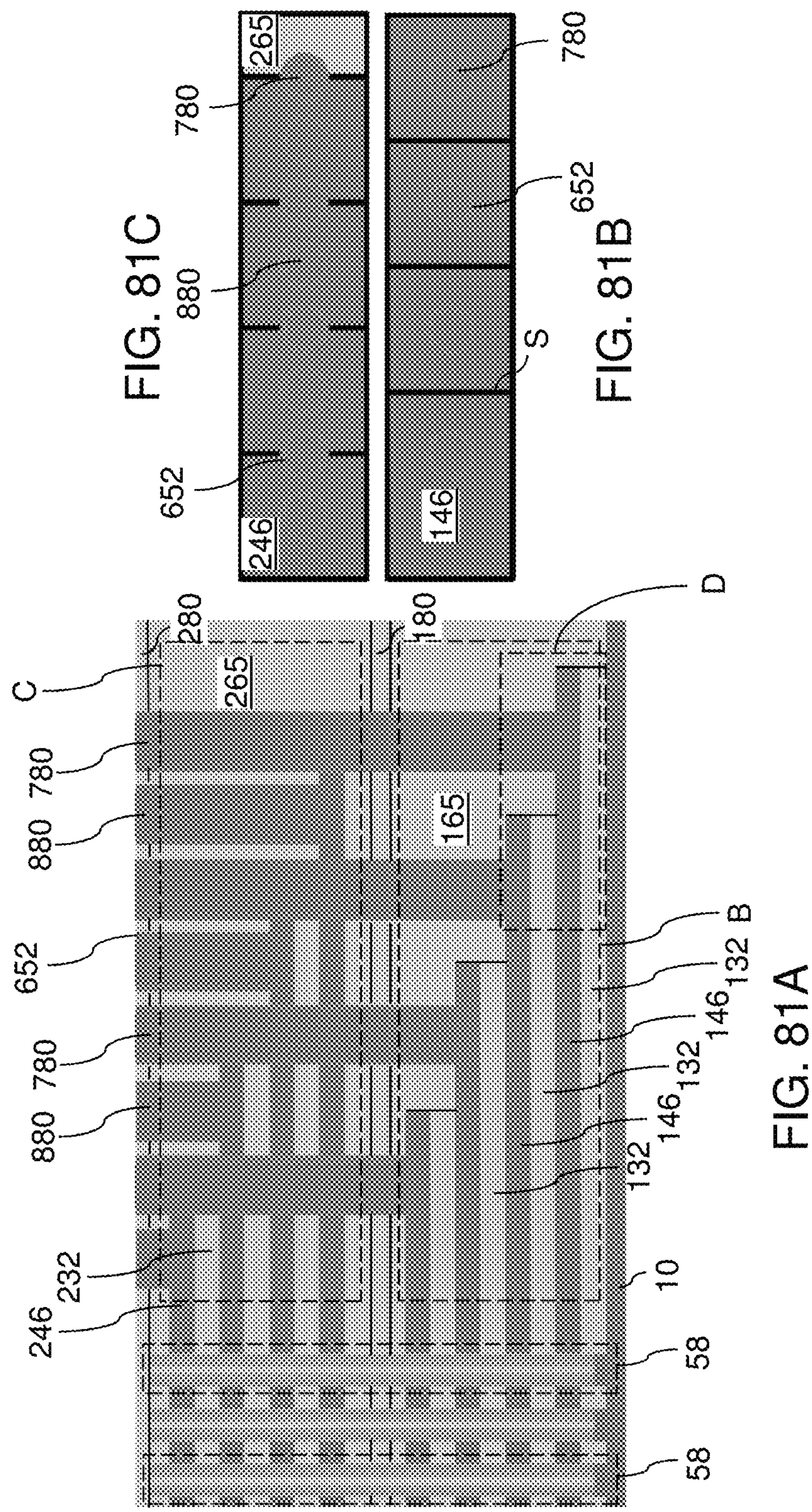

FIG. 81A is a vertical cross-sectional view of a region of the first alternative configuration of the sixth exemplary structure after formation of electrically conductive layers according to an embodiment of the present disclosure.

FIG. 81B is a see-through top-down view of region B of FIG. 81A.

FIG. 81C is a see-through top-down view of region C of FIG. 81A.

Figure 81D:
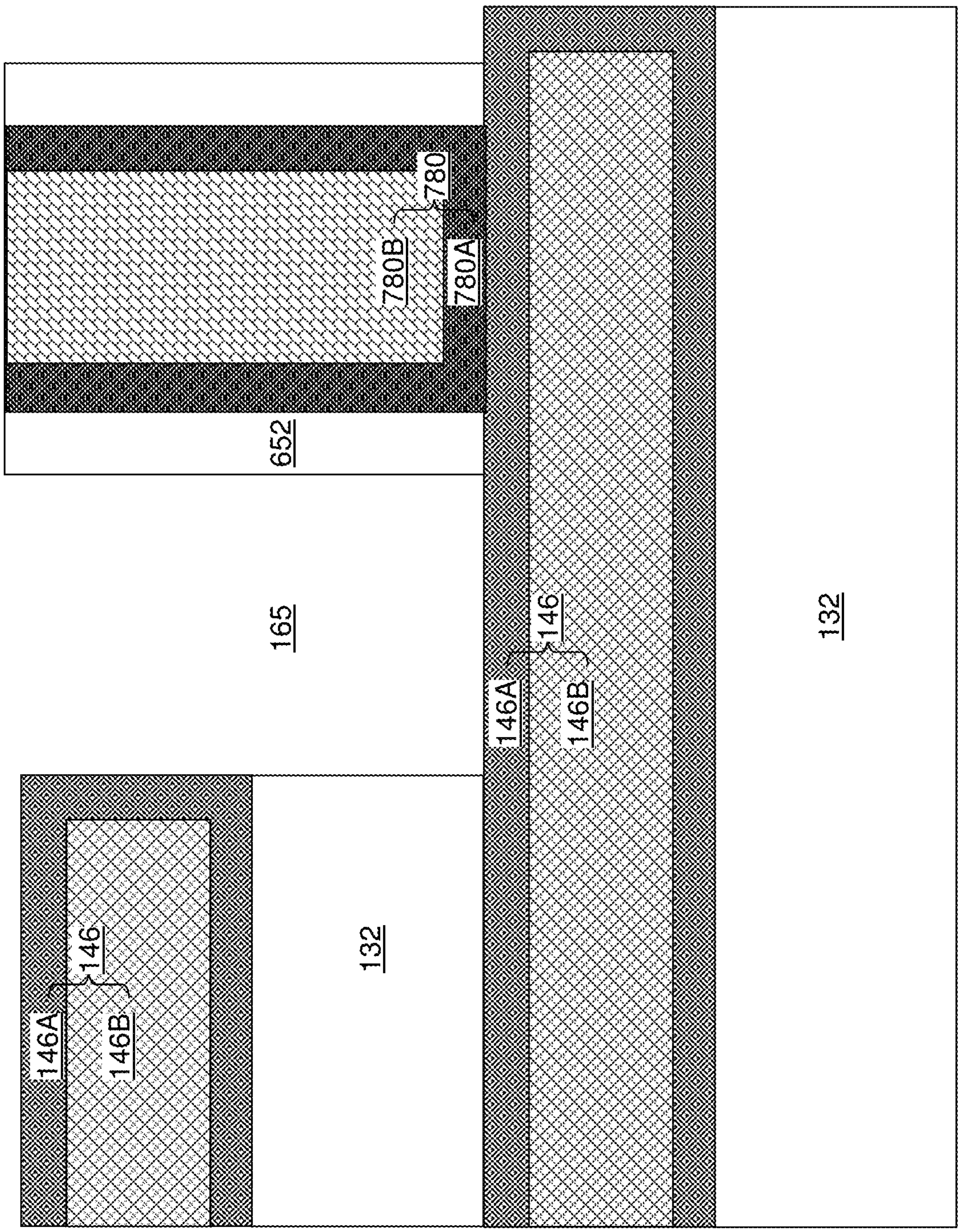

FIG. 81D is a magnified view of region D of FIG. 81A.

Figure 82C:
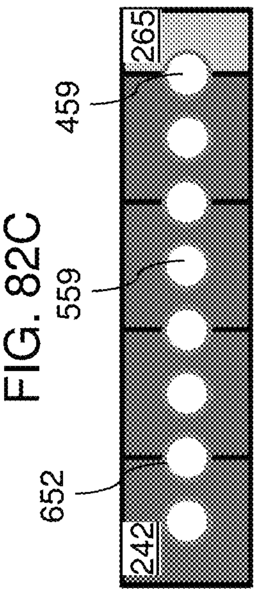
Figure 82B:
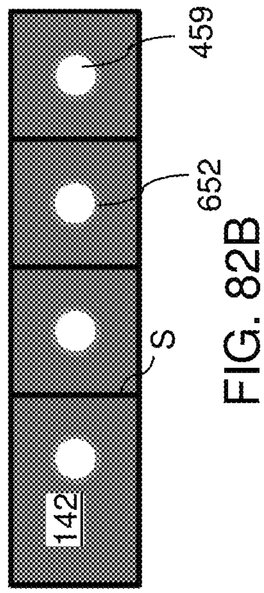
Figure 82A:
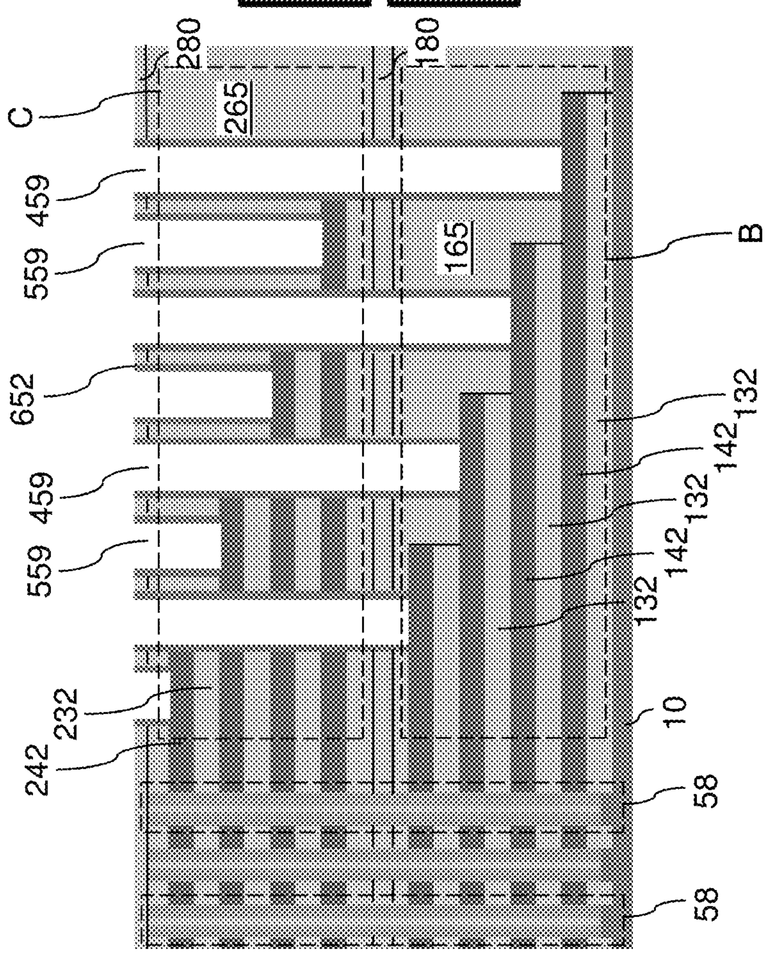

FIG. 82A is a vertical cross-sectional view of a region of a second alternative configuration of the sixth exemplary structure after formation of dielectric liners according to an embodiment of the present disclosure.

FIG. 82B is a see-through top-down view of region B of FIG. 82A.

FIG. 82C is a see-through top-down view of region C of FIG. 82A.

Figure 83C:
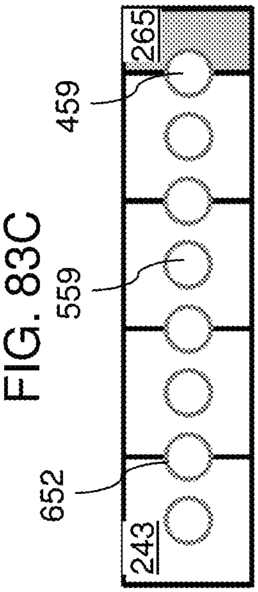
Figure 83B:
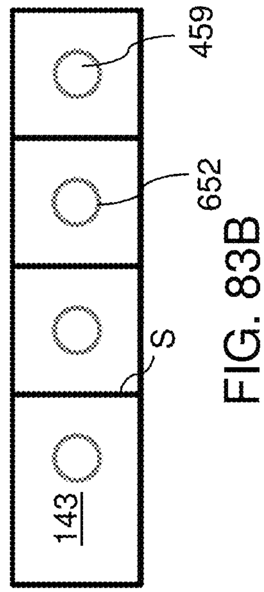
Figure 83A:
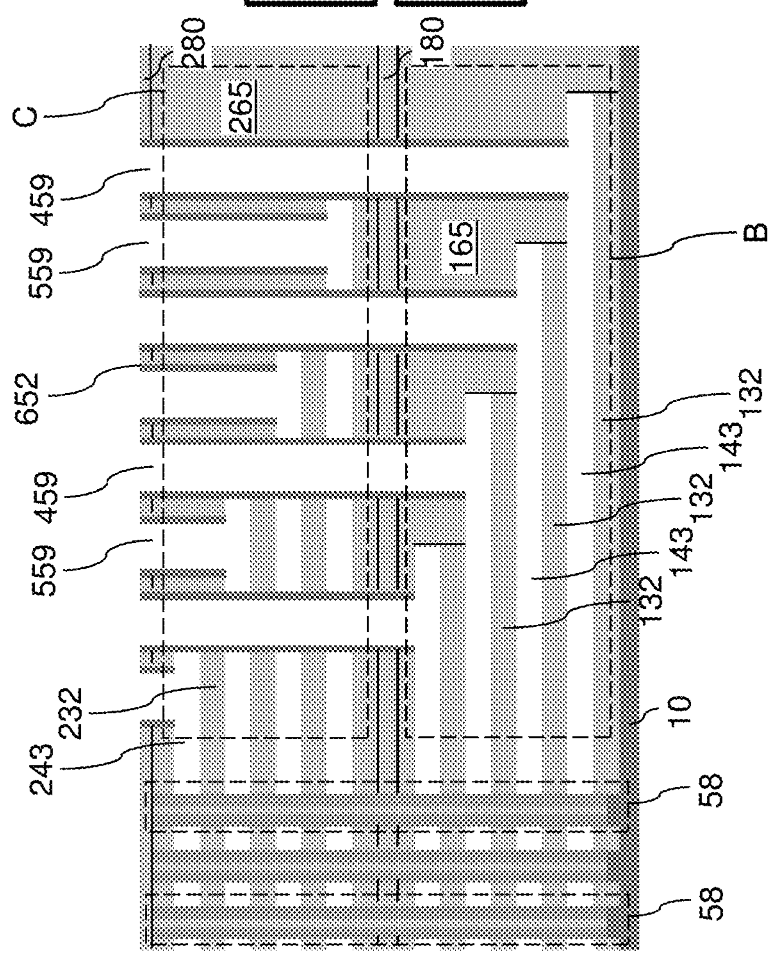

FIG. 83A is a vertical cross-sectional view of a region of the second alternative configuration of the sixth exemplary structure after formation of backside recesses according to an embodiment of the present disclosure.

FIG. 83B is a see-through top-down view of region B of FIG. 83A.

FIG. 83C is a see-through top-down view of region C of FIG. 83A.

FIG. 84A is a vertical cross-sectional view of a region of the second alternative configuration of the sixth exemplary structure after simultaneous deposition of at least one conductive material in the backside recesses, the inter-tier via cavities, and the second-tier via cavities according to an embodiment of the present disclosure.

FIG. 84B is a see-through top-down view of region B of FIG. 84A.

FIG. 84C is a see-through top-down view of region C of FIG. 84A.

Figures 85A, 85B, 85C:
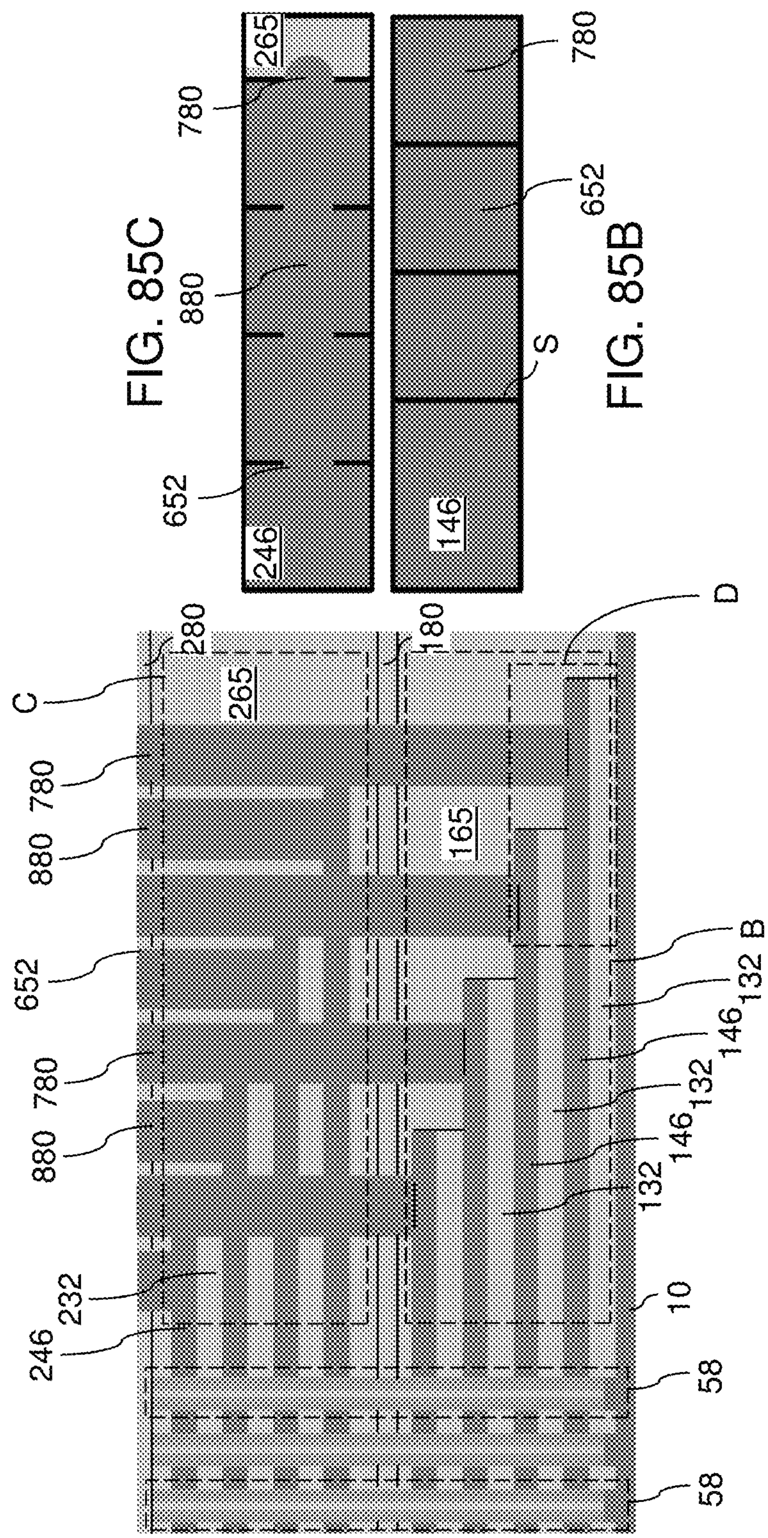

FIG. 85A is a vertical cross-sectional view of a region of the second alternative configuration of the sixth exemplary structure after removal of excess portions of the at least one conductive material from above the second alternating stack according to an embodiment of the present disclosure.

FIG. 85B is a see-through top-down view of region B of FIG. 85A.

FIG. 85C is a see-through top-down view of region C of FIG. 85A.

Figure 85D:
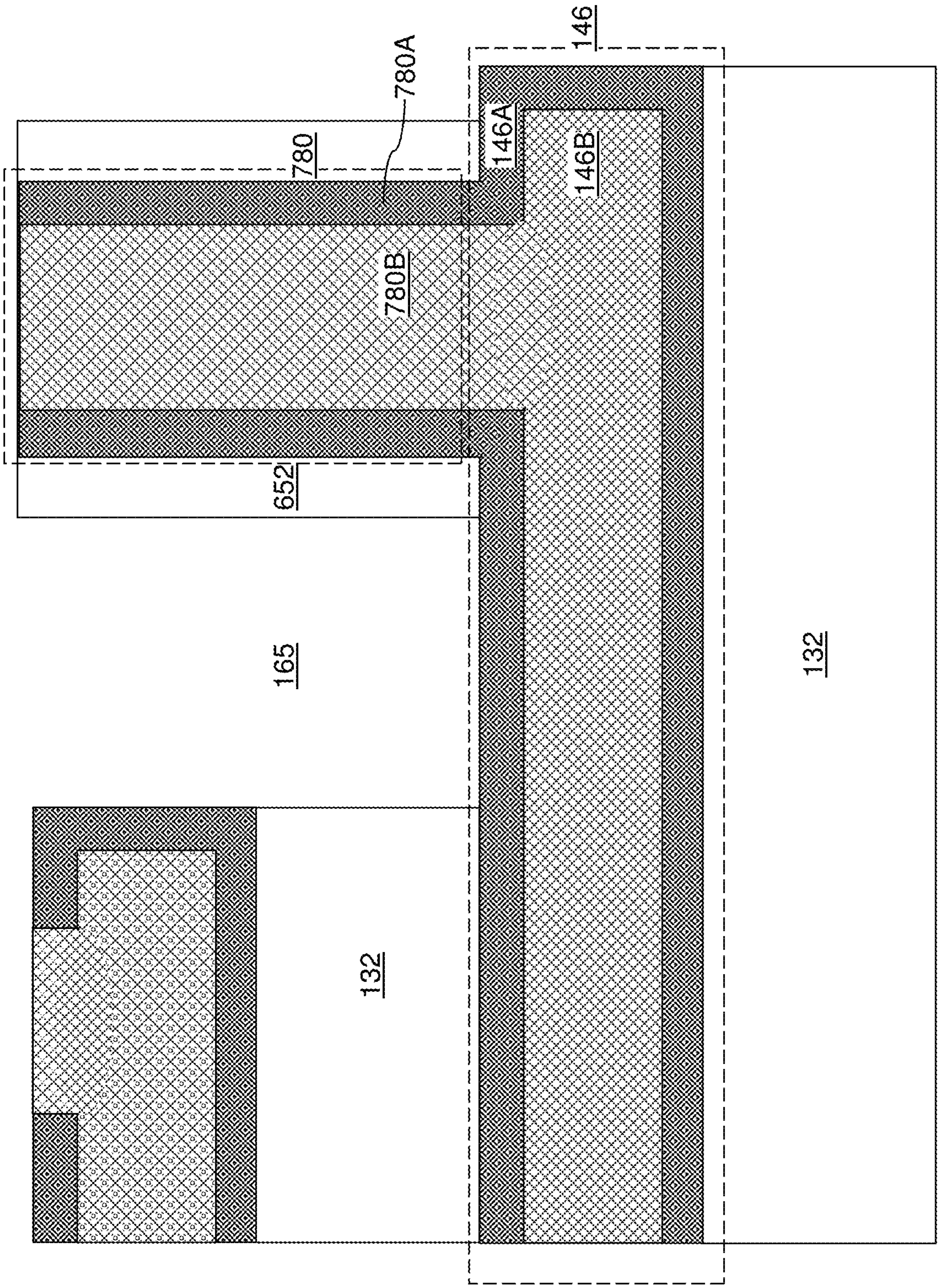

FIG. 85D is a magnified view of region D of FIG. 85A.

DETAILED DESCRIPTION

Various interconnection structures are used to provide electrical connection between the electrically conductive lines of the alternating stack (which function as word lines) and the peripheral device provided underneath the alternating stack on a semiconductor substrate. Generally, such interconnect structures include word line contact via structures that vertically extend upward from stepped surfaces of the electrically conductive layers in a staircase region, metal line structures that are connected to an upper end of each word line contact via structure, and peripheral region interconnection via structures that vertically extend through a dielectric material portion that is laterally offset from the alternating stack. Further, in case the electrically conductive layers are formed by replacement of sacrificial material layers, formation of support pillar structures in the staircase region provides structural support during replacement of sacrificial material layers with the electrically conductive layers. This configuration increases the chip size and introduces additional processing steps, thereby increasing the total cost for manufacture of a three-dimensional memory device.

The number of word lines is expected to increase in future three-dimensional memory devices. Correspondingly, the contact area for forming word line contact via structures and support pillar structures, and additional area for providing peripheral region interconnection via structures are expected to increase in next generation three-dimensional memory devices. In addition, the depth of via cavities formed by reactive ion etching increases with an increase in the total number of electrically conductive layers, and the processing cost and the etch selectivity need to be addressed as well. An efficient method is desired for providing electrical connections between the electrically conductive layers of the alternating stack and underlying semiconductor devices and/or metal interconnect structures.

In view of the above, an embodiment of the present disclosure provides a combined support pillar/word line contact via structure/peripheral region interconnection via structure which provides structural support for the stack insulating layers during word line replacement step and also provides electrical contact between the word lines and underlying peripheral devices. This combined structure reduces the chip area and cost for interconnecting peripheral devices to word lines. As discussed above, the present disclosure is directed to a three-dimensional memory device including through-memory-level contact via structures and methods of making the same, the various aspect of which are described herein in detail.

As used herein, a "through-memory-level contact via structure" refers to a contact via structure that extends through a level including memory devices. As used herein, a "level" refers to a region defined by a volume between a pair of horizontal planes that are vertically offset by two different separation distances from a top surface of a substrate. The embodiments of the present disclosure may be used to form various semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulating material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Figure 1A:
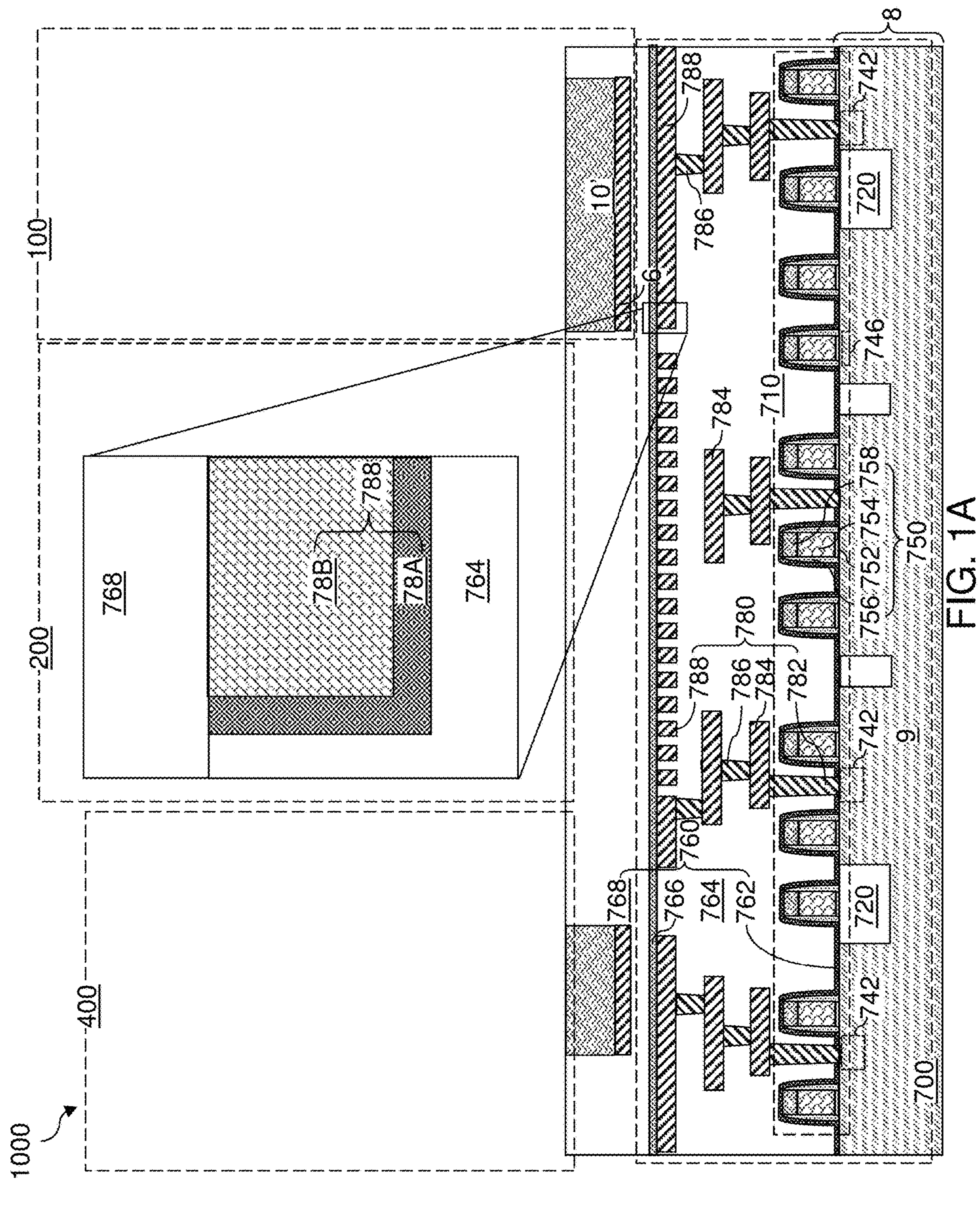
FIG. 1A is a vertical cross-sectional view of a first exemplary structure after formation of semiconductor devices, lower-level dielectric material layers including a silicon nitride layer, lower-level metal interconnect structures, and in-process source-level material layers on a semiconductor substrate according to a first embodiment of the present disclosure.
Figure 1B:
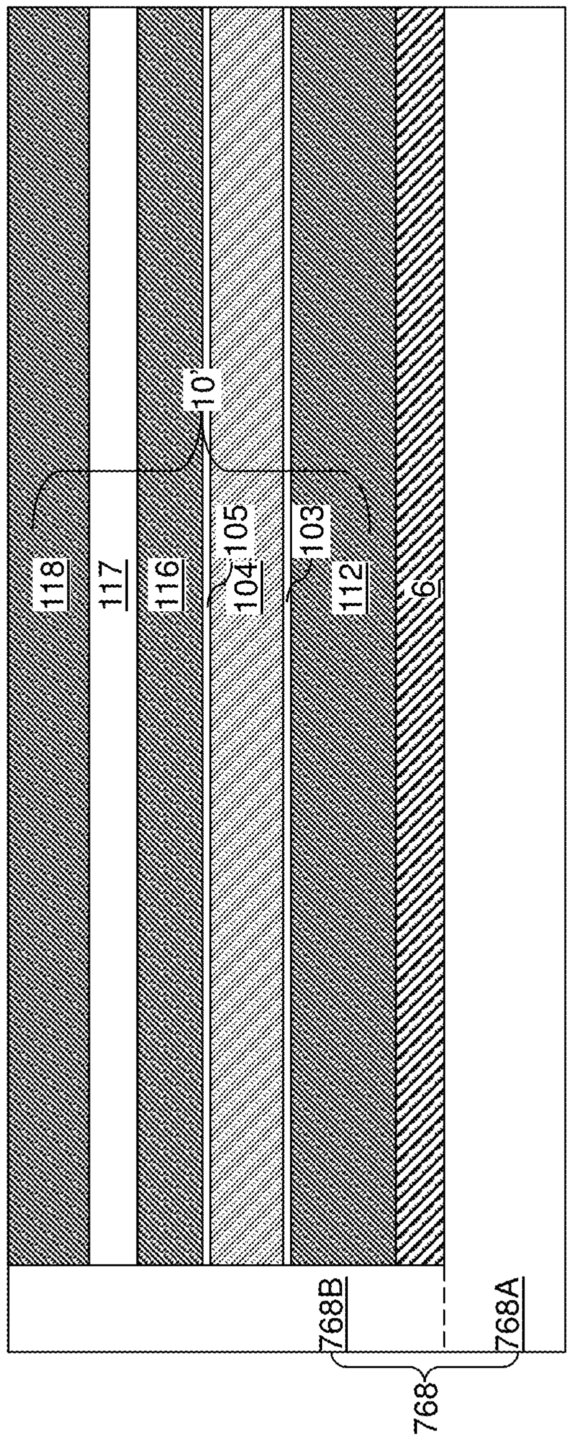
FIG. 1B is a magnified view of the in-process source-level material layers of FIG. 1A.

Referring to FIGS. 1A and 1B, a first exemplary structure according to the first embodiment of the present disclosure is illustrated. FIG. 1B is a magnified view of an in-process source-level material layers 10' illustrated in FIG. 1A. The first exemplary structure includes a substrate 8, and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from the semiconductor devices. The semiconductor devices 710 may include, for example, field effect transistors including respective transistor active regions 742 (i.e., source regions and drain regions), channel regions 746 and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which is herein referred to as lower-level dielectric material layers 760. The lower-level dielectric material layers 760 constitute a dielectric layer stack in which each lower-level dielectric material layer 760 overlies or underlies other lower-level dielectric material layers 760. The lower-level dielectric material layers 760 may include, for example, a dielectric liner 762 such as a silicon nitride liner that blocks diffusion of mobile ions and/or apply appropriate stress to underlying structures, at least one first dielectric material layer 764 that overlies the dielectric liner 762, a silicon nitride layer (e.g., hydrogen diffusion barrier) 766 that overlies the at least one first dielectric material layer 764, and at least one second dielectric material layer 768.

The dielectric layer stack including the lower-level dielectric material layers 760 functions as a matrix for lower-level metal interconnect structures 780 that provide electrical wiring to and from the various nodes of the semiconductor devices and landing pads for through-stack contact via structures to be subsequently formed. The lower-level metal interconnect structures 780 may be formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the at least one first dielectric material layer 764. The at least one first dielectric material layer 764 may be a plurality of dielectric material layers in which various elements of the lower-level metal interconnect structures 780 are sequentially formed. Each dielectric material layer selected from the at least one first dielectric material layer 764 may include any of doped silicate glass, undoped silicate glass, organosilicate glass, silicon nitride, silicon oxynitride, and dielectric metal oxides (such as aluminum oxide). In one embodiment, the at least one first dielectric material layer 764 may comprise, or consist essentially of, dielectric material layers having dielectric constants that do not exceed the dielectric constant of undoped silicate glass (silicon oxide) of 3.9.

The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and topmost lower-level metal line structures 788 that are configured to function as landing pads for through-stack contact via structures to be subsequently formed. In this case, the at least one first dielectric material layer 764 may be a plurality of dielectric material layers that are formed level by level while incorporating components of the lower-level metal interconnect structures 780 within each respective level. For example, single damascene processes may be used to form the lower-level metal interconnect structures 780, and each level of the lower-level metal via structures 786 may be formed within a respective via level dielectric material layer and each level of the lower-level metal line structures (784, 788) may be formed within a respective line level dielectric material layer. Alternatively, a dual damascene process may be used to form integrated line and via structures, each of which includes a lower-level metal line structure and at least one lower-level metal via structure.

The topmost lower-level metal line structures 788 may be formed within a topmost dielectric material layer of the at least one first dielectric material layer 764 (which may be a plurality of dielectric material layers). Each of the lower-level metal interconnect structures 780 may include a metallic nitride liner 78A and a metallic fill material portion 78B. Each metallic nitride liner 78A may include a conductive metallic nitride material such as TiN, TaN, and/or WN. Each metallic fill material portion 78B may include an elemental metal (such as Cu, W, Al, Co, Ru) or an intermetallic alloy of at least two metals. Top surfaces of the topmost lower-level metal line structures 788 and the topmost surface of the at least one first dielectric material layer 764 may be planarized by a planarization process, such as chemical mechanical planarization. In this case, the top surfaces of the topmost lower-level metal line structures 788 and the topmost surface of the at least one first dielectric material layer 764 may be within a horizontal plane that is parallel to the top surface of the substrate 8.

The silicon nitride layer 766 may be formed directly on the top surfaces of the topmost lower-level metal line structures 788 and the topmost surface of the at least one first dielectric material layer 764. Alternatively, a portion of the first dielectric material layer 764 maybe located on the top surfaces of the topmost lower-level metal line structures 788 below the silicon nitride layer 766. In one embodiment, the silicon nitride layer 766 is a substantially stoichiometric silicon nitride layer which has a composition of $Si_3N_4$. A silicon nitride material formed by thermal decomposition of a silicon nitride precursor is preferred for the purpose of blocking hydrogen diffusion. In one embodiment, the silicon nitride layer 766 may be deposited by a low pressure chemical vapor deposition (LPCVD) using dichlorosilane ($SiH_2Cl_2$) and ammonia ($NH_3$) as precursor gases. The temperature of the LPCVD process may be in a range from 750 degrees Celsius to 825 degrees Celsius, although lesser and greater deposition temperatures may also be used. The sum of the partial pressures of dichlorosilane and ammonia may be in a range from 50 mTorr to 500 mTorr, although lesser and greater pressures may also be used. The thickness of the silicon nitride layer 766 is selected such that the silicon nitride layer 766 functions as a sufficiently robust hydrogen diffusion barrier for subsequent thermal processes. For example, the thickness of the silicon nitride layer 766 may be in a range from 6 nm to 100 nm, although lesser and greater thicknesses may also be used.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional planar conductive material layer 6 and an in-process source-level material layers 10'. The optional planar conductive material layer 6, if present, provides a high conductivity conduction path for electrical current that flows into, or out of, the in-process source-level material layers 10'. The optional planar conductive material layer 6 includes a conductive material such as a metal or a heavily doped semiconductor material. The optional planar conductive material layer 6, for example, may include a tungsten layer having a thickness in a range from 3 nm to 100 nm, although lesser and greater thicknesses may also be used. A metal nitride layer (not shown) may be provided as a diffusion barrier layer on top of the planar conductive material layer 6. The planar conductive material layer 6 may function as a special source line in the completed device. In addition, the planar conductive material layer 6 may comprise an etch stop layer and may comprise any suitable conductive, semiconductor or insulating layer. The optional planar conductive material layer 6 may include a metallic compound material such as a conductive metallic nitride (e.g., TiN) and/or a metal (e.g., W). The thickness of the optional planar conductive material layer 6 may be in a range from 5 nm to 100 nm, although lesser and greater thicknesses may also be used.

As shown in FIG. 1B, the in-process source-level material layers 10' may include various layers that are subsequently modified to form source-level material layers. The source-level material layers, upon formation, include a buried source layer that functions as a common source region for vertical field effect transistors of a three-dimensional memory device. In one embodiment, the in-process source-level material layer 10' may include, from bottom to top, a lower source layer 112, a lower sacrificial liner 103, a source-level sacrificial layer 104, an upper sacrificial liner 105, an upper source layer 116, a source-level insulating layer 117, and an optional source-select-level conductive layer 118.

The lower source layer 112 and the upper source layer 116 may include a doped semiconductor material such as doped polysilicon or doped amorphous silicon. The conductivity type of the lower source layer 112 and the upper source layer 116 may be the opposite of the conductivity of vertical semiconductor channels to be subsequently formed. For example, if the vertical semiconductor channels to be subsequently formed have a doping of a first conductivity type, the lower source layer 112 and the upper source layer 116 have a doping of a second conductivity type that is the opposite of the first conductivity type. The thickness of each of the lower source layer 112 and the upper source layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped poly silicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 10' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8).

The optional planar conductive material layer 6 and the in-process source-level material layers 10' may be patterned to provide openings in areas in which through-stack contact via structures and through-dielectric contact via structures are to be subsequently formed. Patterned portions of the stack of the planar conductive material layer 6 and the in-process source-level material layers 10' are present in each memory array region 100 in which three-dimensional memory stack structures are to be subsequently formed. The at least one second dielectric material layer 768 may include a blanket layer portion 768A underlying the planar conductive material layer 6 and the in-process source-level material layers 10' and a patterned portion 768B that fills gaps from the patterned portions of the planar conductive material layer 6 and the in-process source-level material layers 10'.

Openings in the optional planar conductive material layer 6 and the in-process source-level material layers 10' may be formed within the area of a staircase region 200 in which contact via structures contacting word line electrically conductive layers are to be subsequently formed. In one embodiment, additional openings in the optional planar conductive material layer 6 and the in-process source-level material layers 10' may be formed within the area of a memory array region 100, in which a three-dimensional memory array including memory stack structures is to be subsequently formed. A peripheral device region 400 that is subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed within the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-stack contact via structures may be subsequently formed directly on the lower-level metal interconnect structures 780 to provide electrical connection to memory devices to be subsequently formed. In one embodiment, the pattern of the lower-level metal interconnect structures 780 may be selected such that the topmost lower-level metal line structures 788 (which are a subset of the lower-level metal interconnect structures 780 located at the topmost portion of the lower-level metal interconnect structures 780) may provide landing pad structures for the through-stack contact via structures to be subsequently formed.

Figure 2:
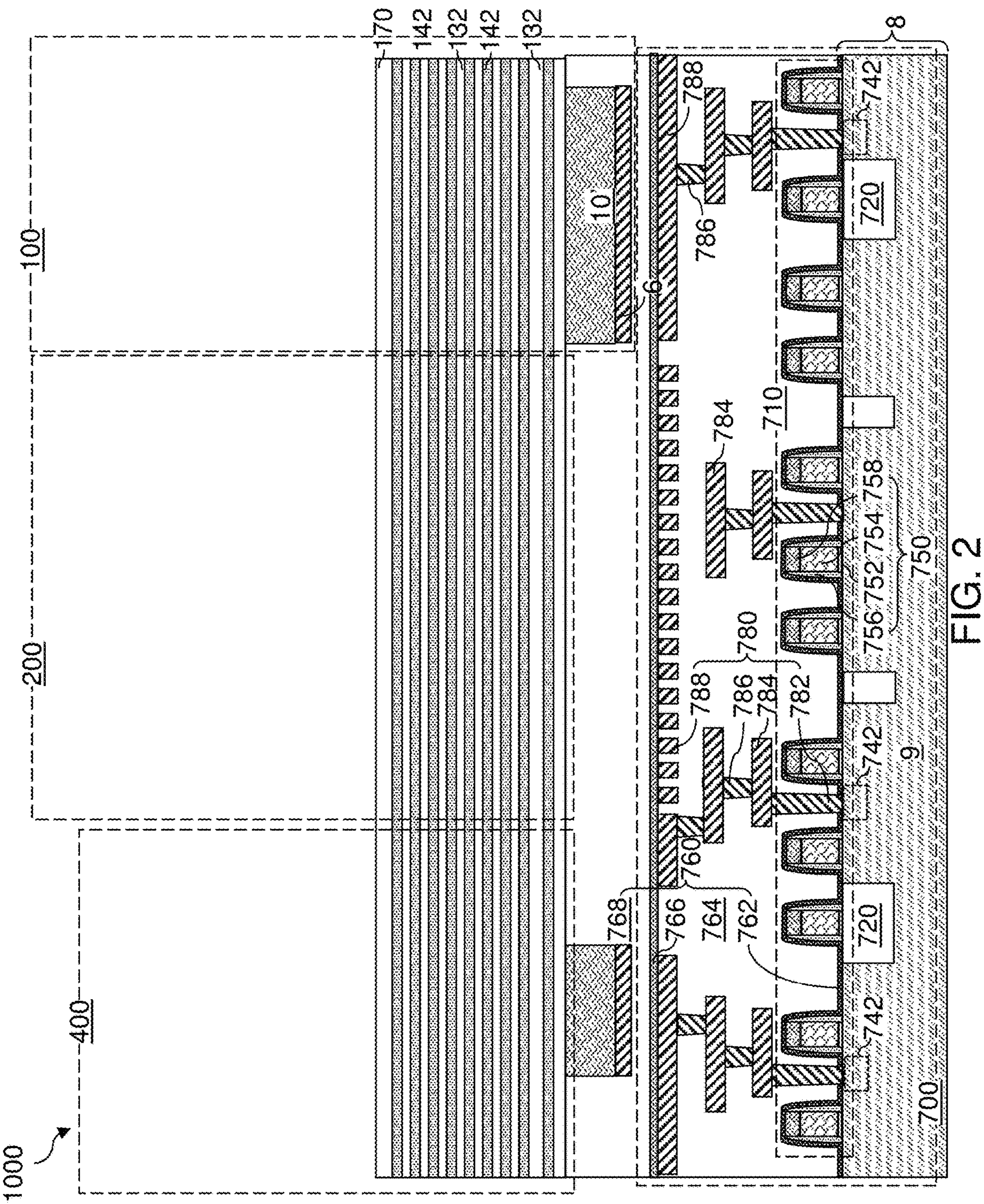
FIG. 2 is a vertical cross-sectional view of the first exemplary structure after formation of a first alternating stack of first insulting layers and first spacer material layers according to the first embodiment of the present disclosure.

Referring to FIG. 2, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first alternating stack. The level of the first alternating stack is herein referred to as a first-tier level, and the level of the alternating stack to be subsequently formed immediately above the first-tier level is herein referred to as a second-tier level, etc.

The first alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over in-process source-level material layers 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first alternating stack (132, 142) may have a uniform thickness that is substantially invariant within each respective first sacrificial material layer 142.

A first insulating cap layer 170 is subsequently formed over the stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the insulating cap layer 170 may be in a range from 20 nm to 300 nm, although lesser and greater thicknesses may also be used.

Figure 3:
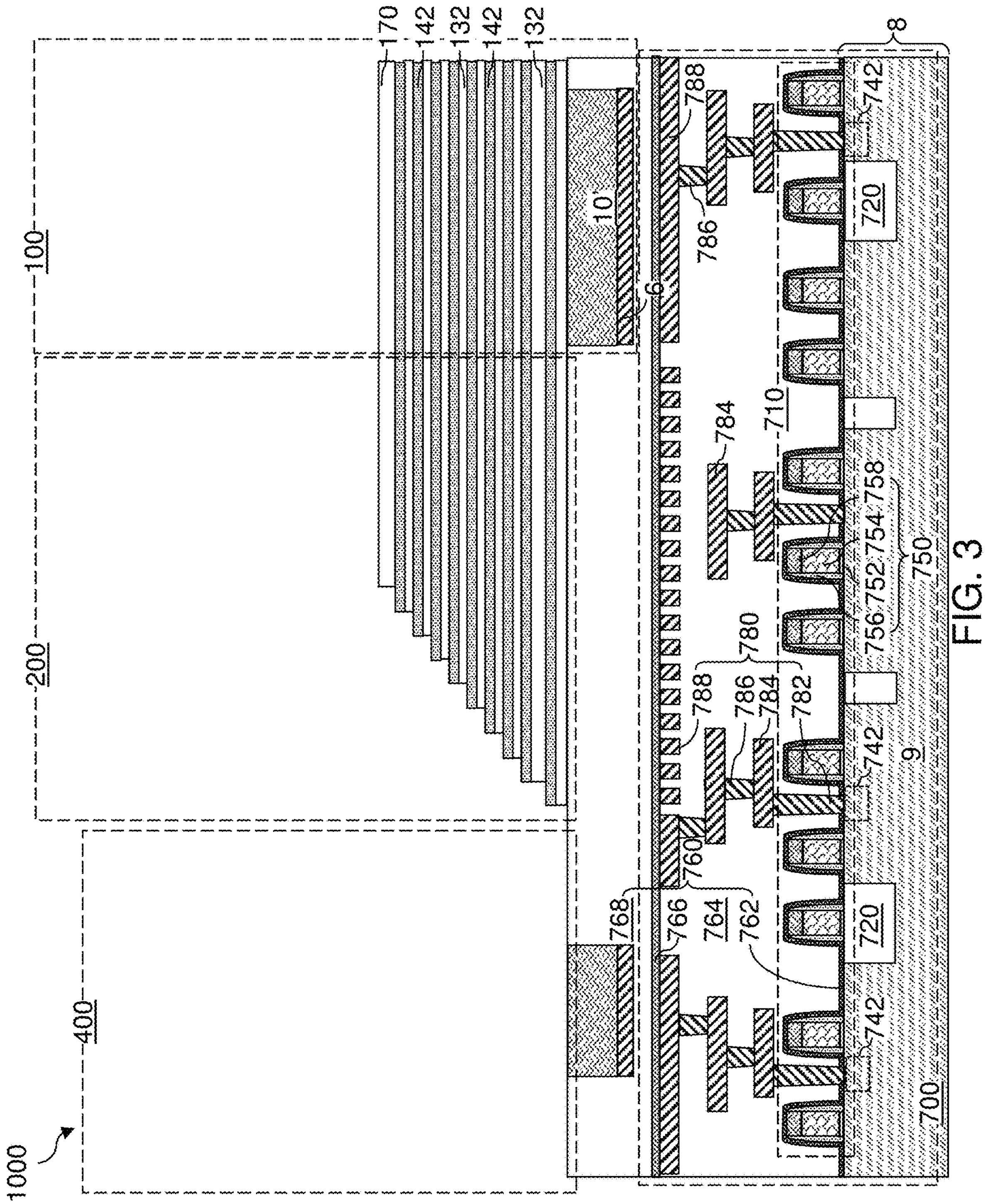
FIG. 3 is a vertical cross-sectional view of the first exemplary structure after patterning a first-tier staircase region on the first alternating stack according to the first embodiment of the present disclosure.

Referring to FIG. 3, the first insulating cap layer 170 and the first alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area.

Figure 4:
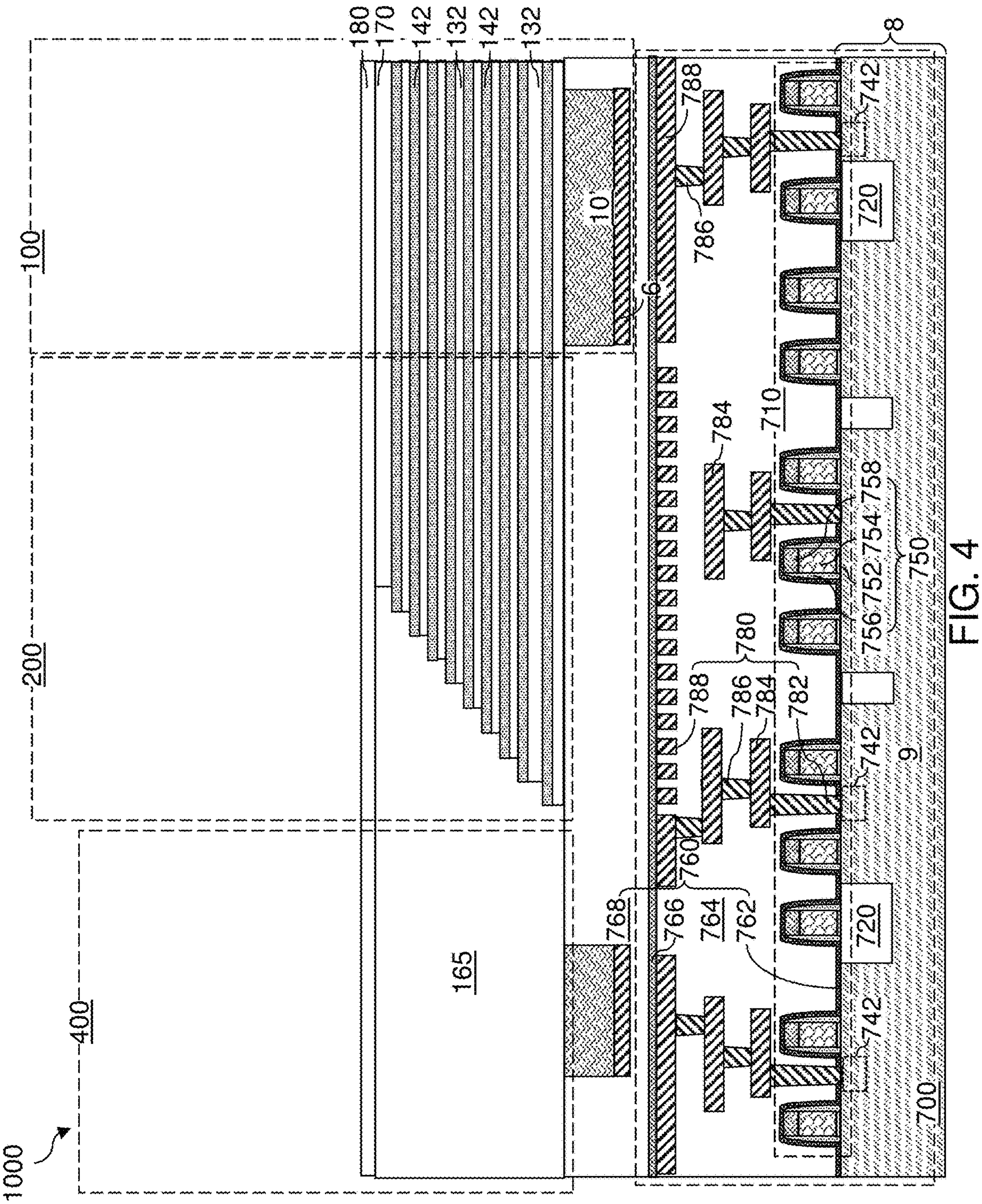
FIG. 4 is a vertical cross-sectional view of the first exemplary structure after formation of a first retro-stepped dielectric material portion and an inter-tier dielectric layer according to the first embodiment of the present disclosure.

Referring to FIG. 4, a dielectric material may be deposited to fill the first stepped cavity to form a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 165, 170). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 5A:
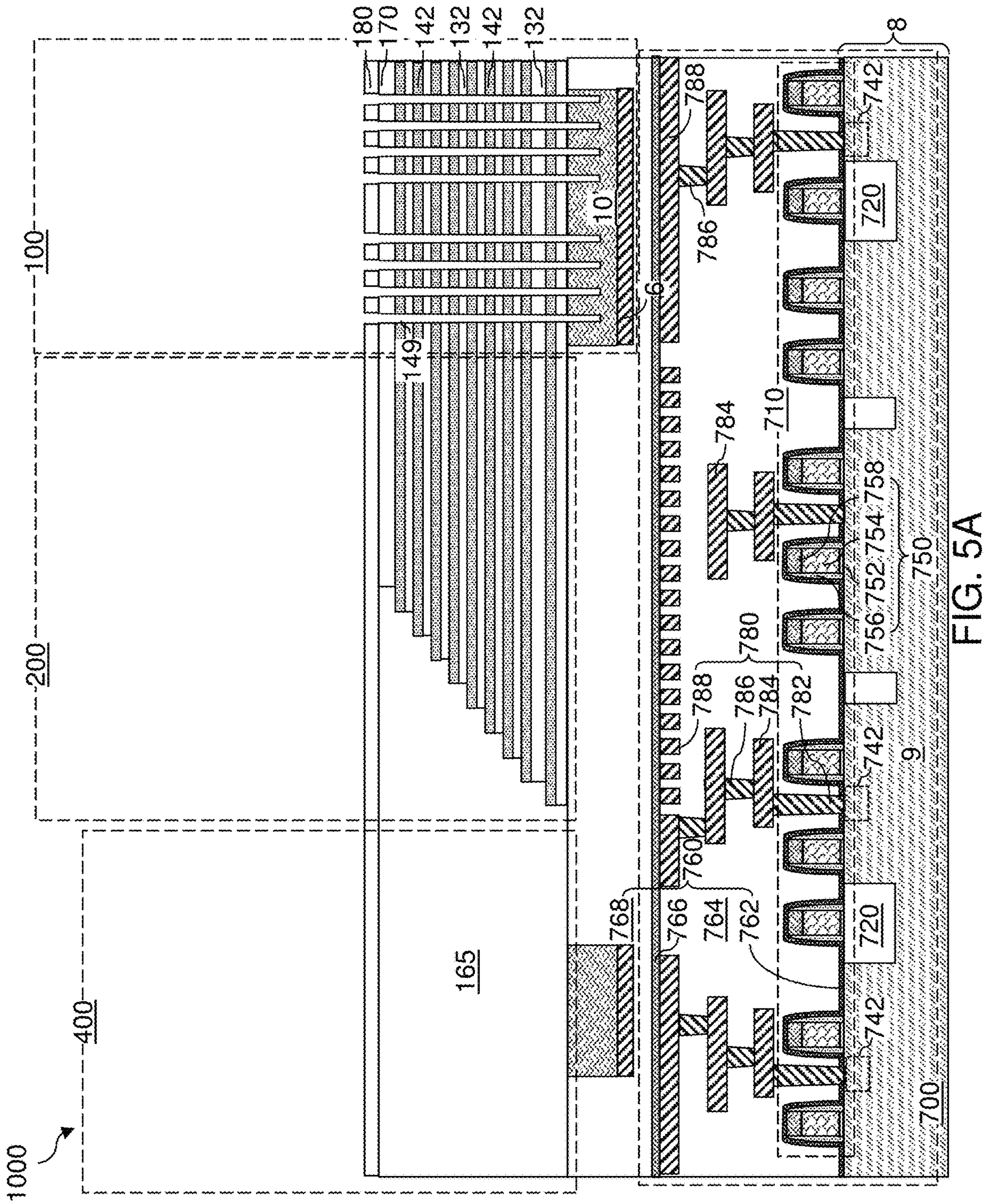
FIG. 5A is a vertical cross-sectional view of the first exemplary structure after formation of first-tier memory openings according to the first embodiment of the present disclosure.
Figure 5B:
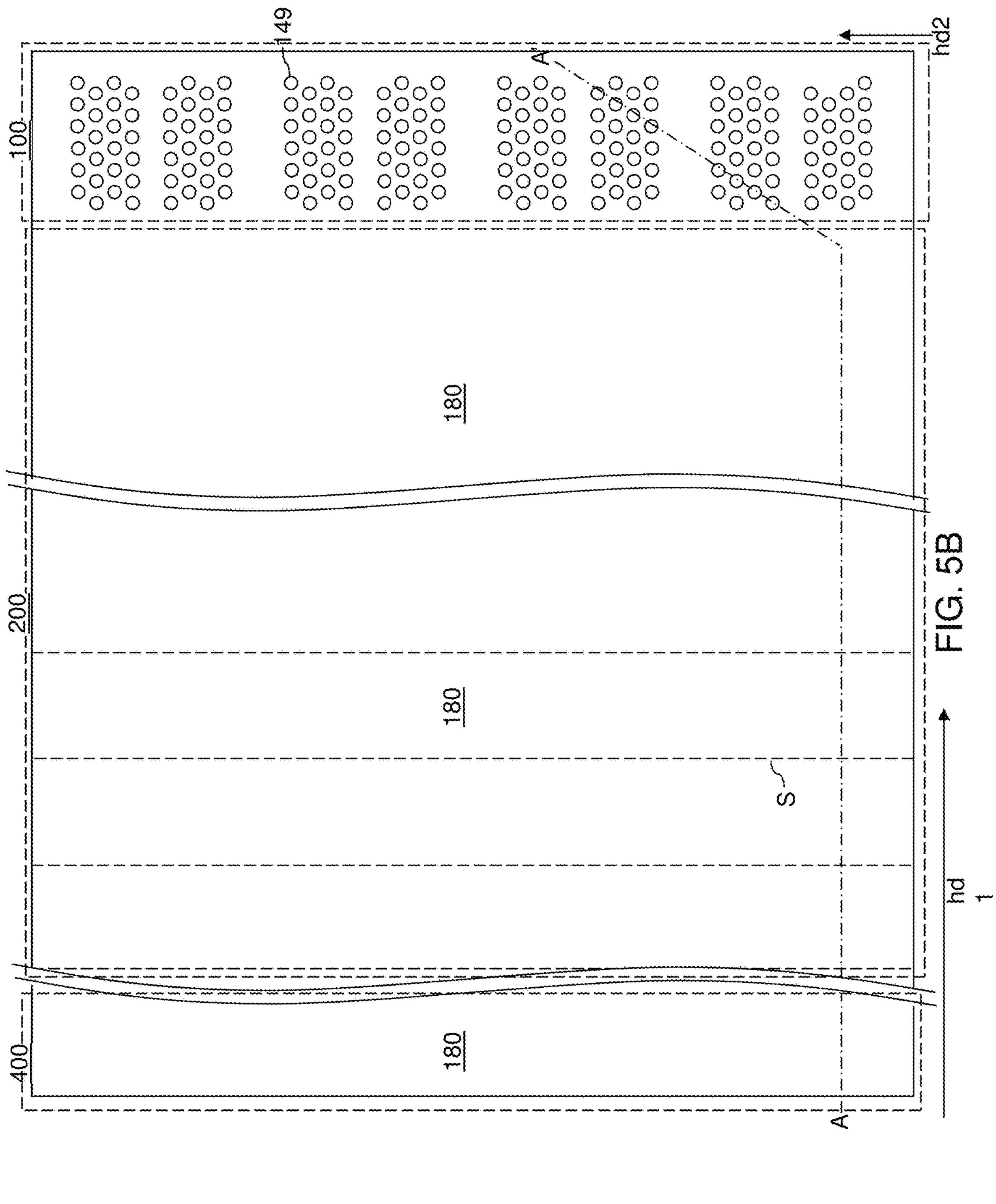
FIG. 5B is a top-down view of the first exemplary structure of FIG. 5A. The hinged vertical plane A-A' corresponds to the plane of the vertical cross-sectional view of FIG. 5A.

Referring to FIGS. 5A and 5B, first-tier memory openings 149 may be formed. Locations of steps S in the first alternating stack (132, 142) are illustrated as dotted lines in FIG. 5B. The first-tier memory openings 149 extend through the first alternating stack (132, 142) at least to a top surface of the in-process source-level material layers 10'. The first-tier memory openings 149 may be formed in the memory array region 100 at locations at which memory stack structures including vertical stacks of memory elements are to be subsequently formed. For example, a lithographic material stack (not shown) including at least a photoresist layer may be formed over the first insulating cap layer 170 (and the optional inter-tier dielectric layer 180, if present), and may be lithographically patterned to form openings within the lithographic material stack. The pattern in the lithographic material stack may be transferred through the first insulating cap layer 170 (and the optional inter-tier dielectric layer 180), and through the entirety of the first alternating stack (132, 142) by at least one anisotropic etch that uses the patterned lithographic material stack as an etch mask. Portions of the first insulating cap layer 170 (and the optional inter-tier dielectric layer 180), and the first alternating stack (132, 142) underlying the openings in the patterned lithographic material stack are etched to form the first-tier memory openings 149. In other words, the transfer of the pattern in the patterned lithographic material stack through the first insulating cap layer 170 and the first alternating stack (132, 142) forms the first-tier memory openings 149.

In one embodiment, the chemistry of the anisotropic etch process used to etch through the materials of the first alternating stack (132, 142) may alternate to optimize etching of the first and second materials in the first alternating stack (132, 142). The anisotropic etch may be, for example, a series of reactive ion etches or a single etch (e.g., $CF_4$/$O_2$/Ar etch). The sidewalls of the first-tier memory openings 149 may be substantially vertical, or may be tapered. Subsequently, the patterned lithographic material stack may be subsequently removed, for example, by ashing.

Figure 6B:
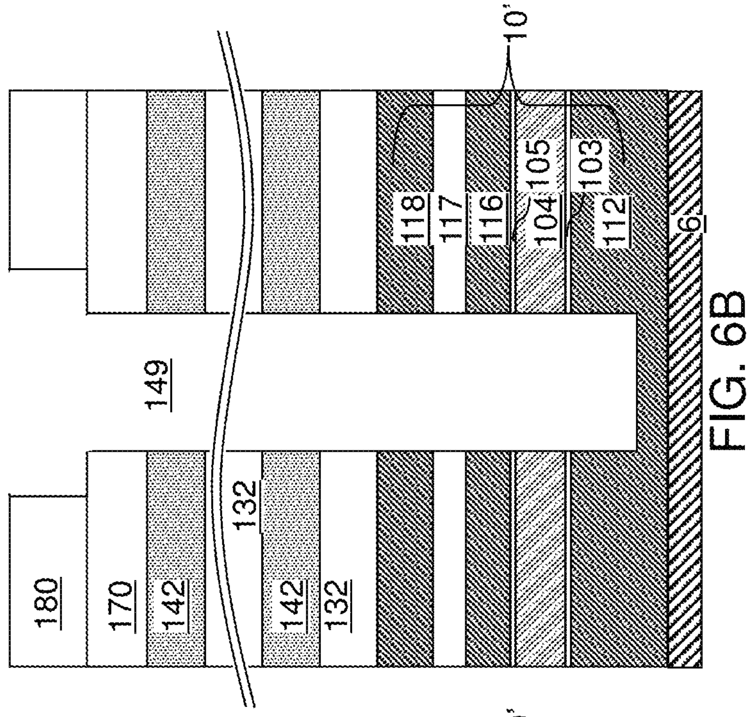
FIGS. 6A-6B illustrate a sequential vertical cross-sectional view of a first-tier memory opening during expansion of an upper region of the first-tier memory opening according to the first embodiment of the present disclosure.
Figure 6A:
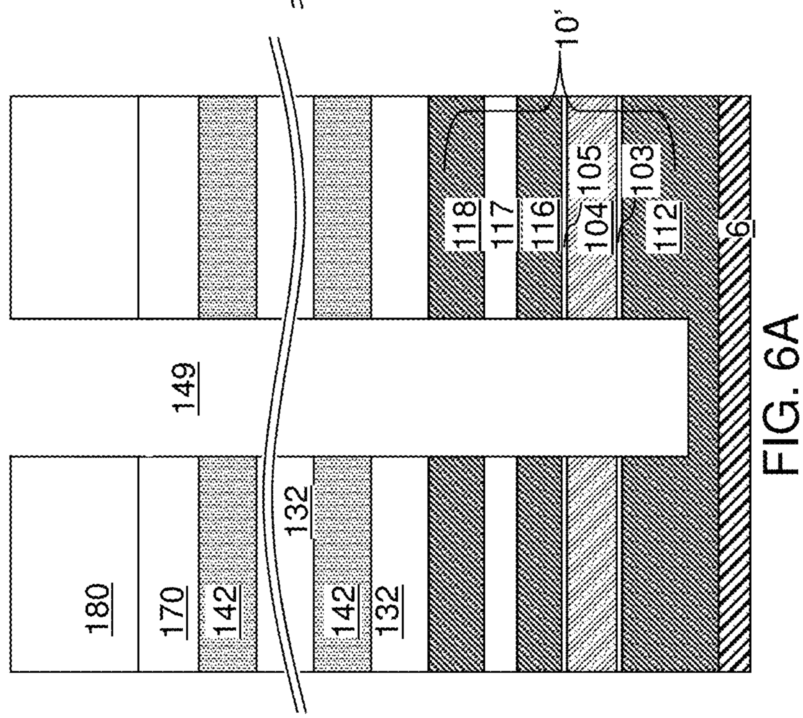

Optionally, the portions of the first-tier memory openings 149 at the level of the inter-tier dielectric layer 180 may be laterally expanded by an isotropic etch. FIGS. 6A and 6B illustrate a processing sequence for laterally expanding portions of the first-tier memory openings 149 at the level of the inter-tier dielectric layer 180. FIG. 6A illustrates a first-tier memory opening 149 immediately after the anisotropic etch that forms the first-tier memory openings 149. The anisotropic etch may terminate after each of the first-tier memory openings 149 extends to the lower source layer 112. The inter-tier dielectric layer 180 may comprise a dielectric material (such as borosilicate glass) having a greater etch rate than the first insulating layers 132 (that may include undoped silicate glass). Referring to FIG. 6B, an isotropic etch (such as a wet etch using HF) may be used to expand the lateral dimensions of the first-tier memory openings at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second alternating stack (to be subsequently formed prior to formation of the second-tier memory openings).

Figure 7:
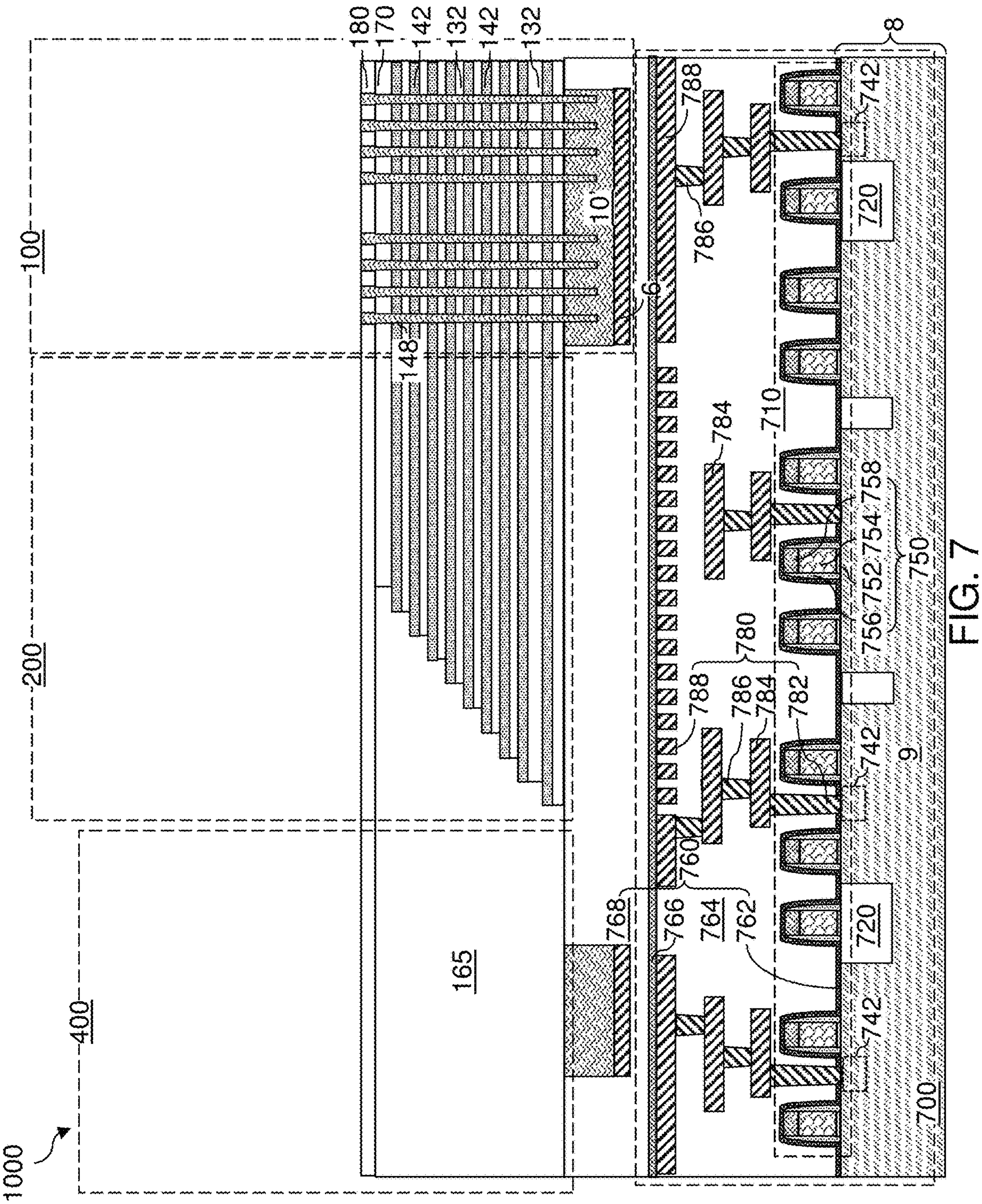
FIG. 7 is a vertical cross-sectional view of the first exemplary structure after formation of sacrificial memory opening fill portions according to the first embodiment of the present disclosure.

Referring to FIG. 7, sacrificial memory opening fill portions 148 may be formed in the first-tier memory openings 149. For example, a sacrificial fill material layer is deposited in the first-tier memory openings 149. The sacrificial fill material layer includes a sacrificial material which may be subsequently removed selective to the materials of the first insulator layers 132 and the first sacrificial material layers 142. In one embodiment, the sacrificial fill material layer may include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer having a thickness in a range from 1 nm to 3 nm) may be used prior to depositing the sacrificial fill material layer. The sacrificial fill material layer may be formed by a non-conformal deposition or a conformal deposition method. In another embodiment, the sacrificial fill material layer may include amorphous silicon or a carbon-containing material (such as amorphous carbon or diamond-like carbon) that may be subsequently removed by ashing.

Portions of the deposited sacrificial material may be removed from above the first insulating cap layer 170 (and the optional inter-tier dielectric layer 180, if present). For example, the sacrificial fill material layer may be recessed to a top surface of the first insulating cap layer 170 (and the optional inter-tier dielectric layer 180) using a planarization process. The planarization process may include a recess etch, chemical mechanical planarization (CMP), or a combination thereof. The top surface of the first insulating cap layer 170 (and optionally the inter-tier dielectric layer 180 if present) may be used as an etch stop layer or a planarization stop layer. Each remaining portion of the sacrificial material in a first-tier memory opening 149 constitutes a sacrificial memory opening fill portion 148. The top surfaces of the sacrificial memory opening fill portions 148 may be coplanar with the top surface of the inter-tier dielectric layer 180 (or the first insulating cap layer 170 if the inter-tier dielectric layer 180 is not present). The sacrificial memory opening fill portion 148 may, or may not, include cavities therein.

Figure 8A:
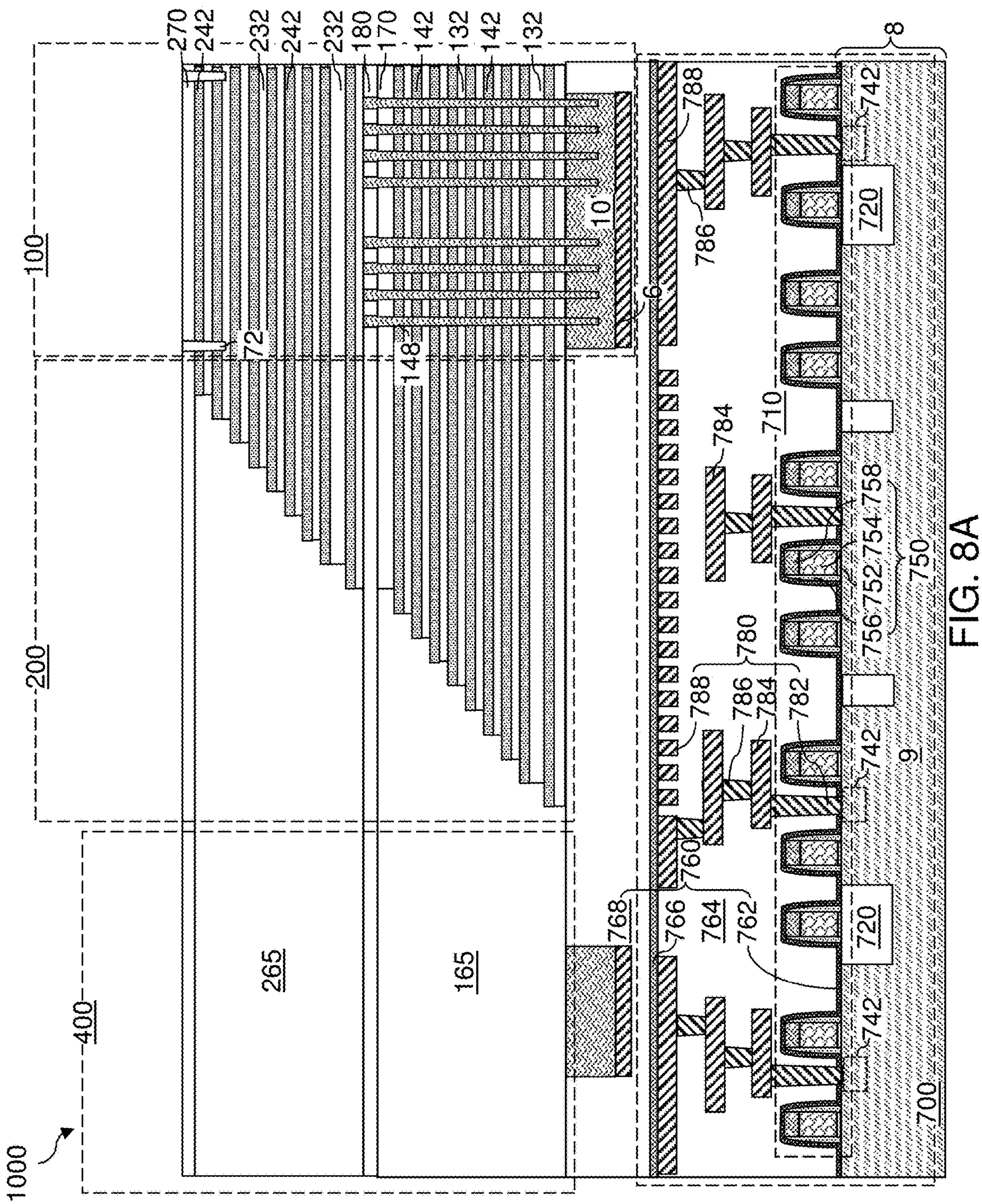
FIG. 8A is a vertical cross-sectional view of the first exemplary structure after formation of a second alternating stack of second insulating layers and second spacer material layers, a second retro-stepped dielectric material portion, and a second insulating cap layer according to the first embodiment of the present disclosure.
Figure 8B:
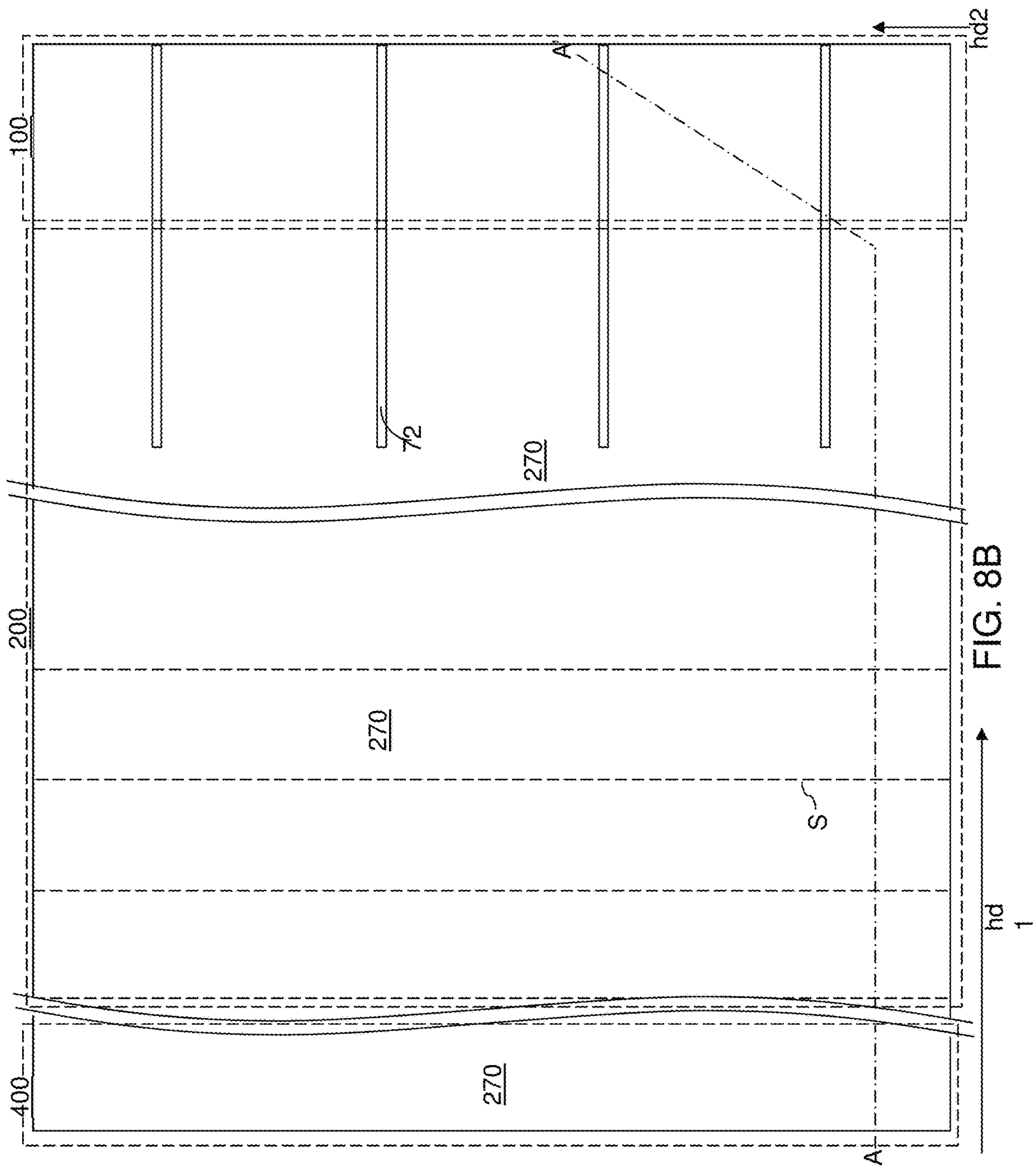
FIG. 8B is a top-down view of the first exemplary structure of FIG. 8A. The hinged vertical plane A-A' corresponds to the plane of the vertical cross-sectional view of FIG. 8A.

Referring to FIGS. 8A and 8B, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers maybe subsequently formed on the top surface of the first alternating stack (132, 142). The second alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 10', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second alternating stack (232, 242). The second sacrificial material layers 242 that are cut by the select-drain-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1.

Figure 9A:
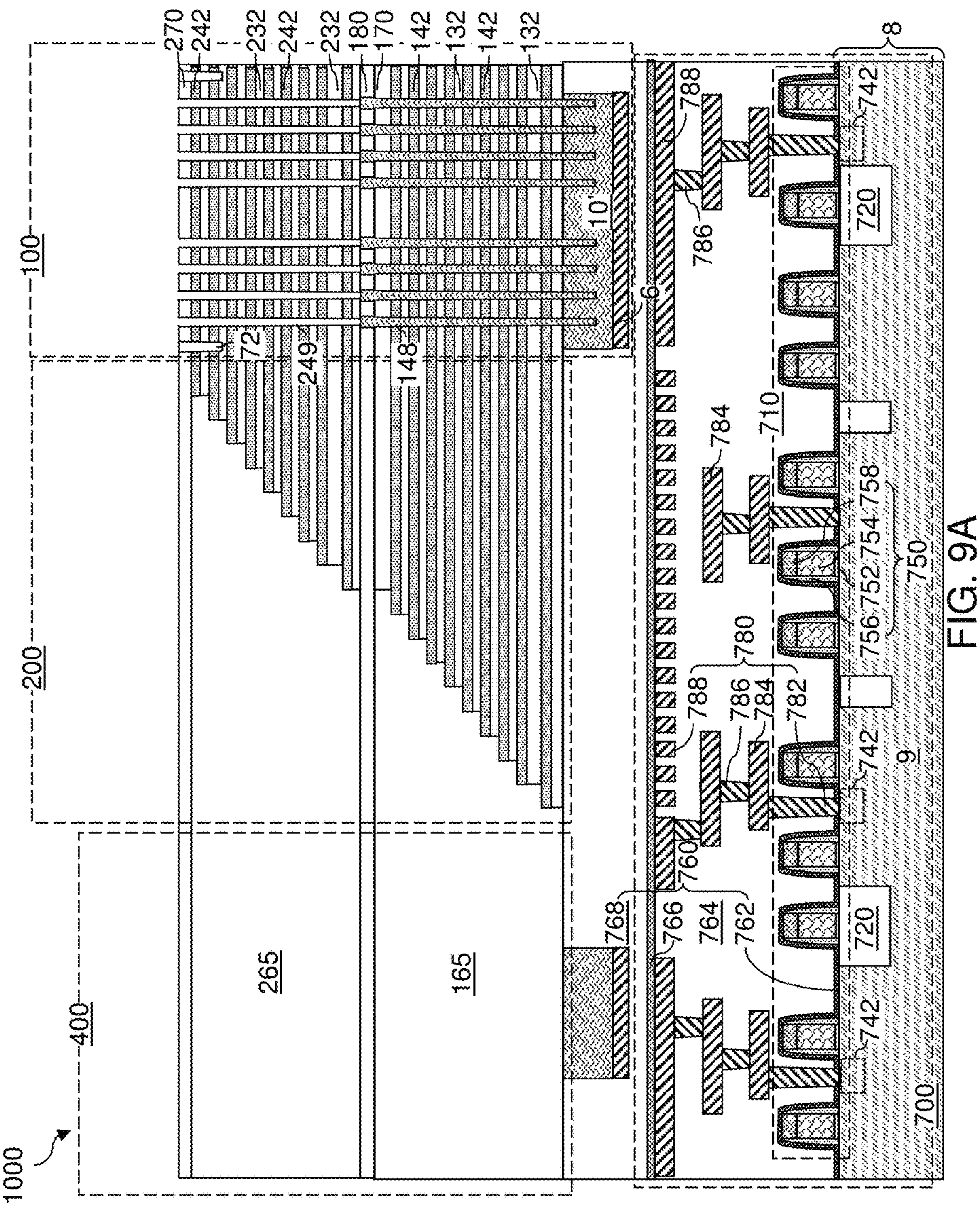
FIG. 9A is a vertical cross-sectional view of the first exemplary structure after formation of second-tier memory openings according to the first embodiment of the present disclosure.
Figure 9B:
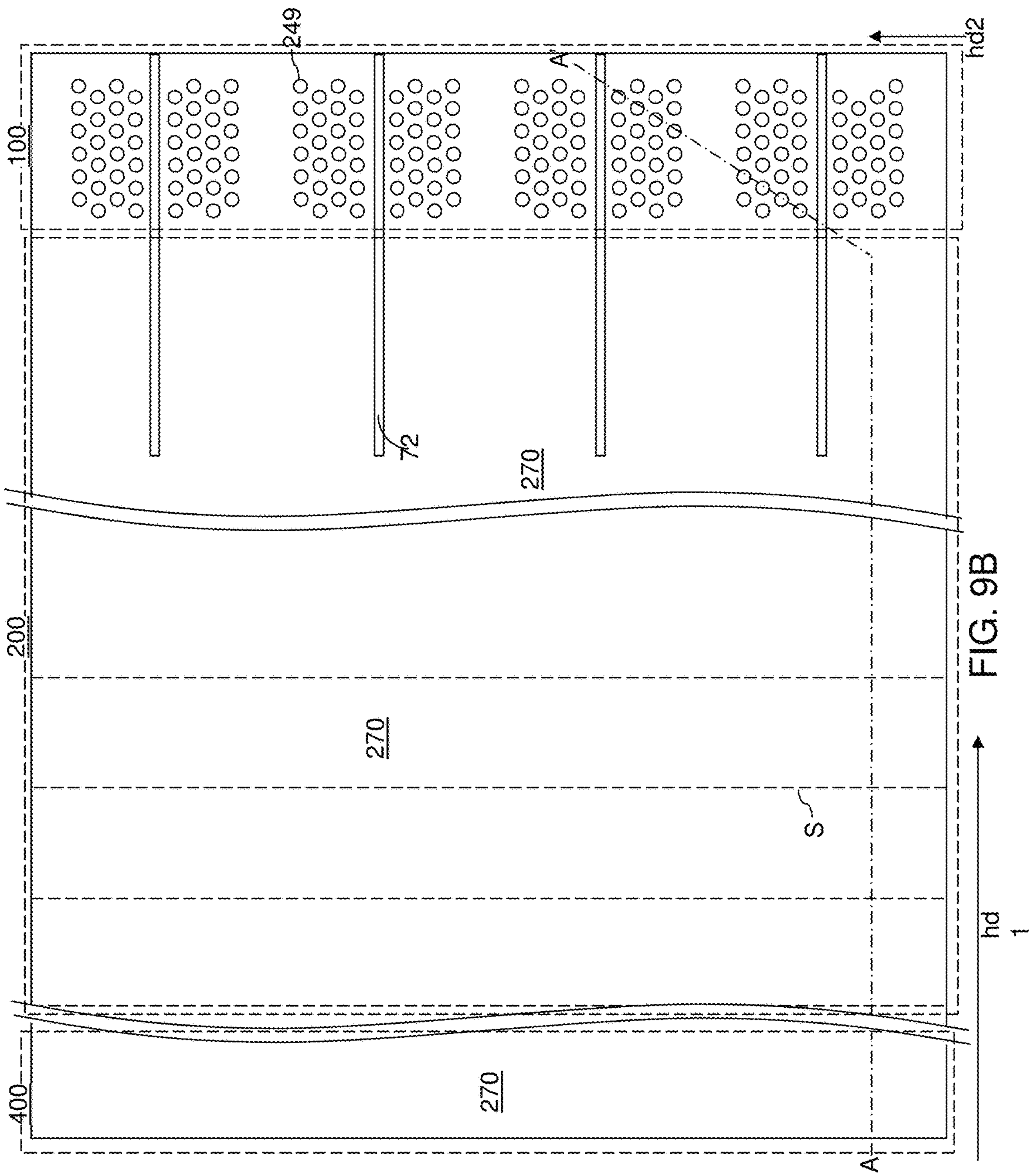
FIG. 9B is a top-down view of the first exemplary structure of FIG. 9A. The hinged vertical plane A-A' corresponds to the plane of the vertical cross-sectional view of FIG. 9A.

Referring to FIGS. 9A and 9B, second-tier memory openings 249 extending through the second-tier structure (232, 242, 270, 265) are formed in areas overlying the sacrificial memory opening fill portions 148. For example, a photoresist layer may be applied over the second-tier structure (232, 242, 270, 265), and may be lithographically patterned to form a same pattern as the pattern of the sacrificial memory opening fill portions 148, i.e., the pattern of the first-tier memory openings 149. Thus, the lithographic mask used to pattern the first-tier memory openings 149 may be used to pattern the second-tier memory openings 249. An anisotropic etch may be performed to transfer the pattern of the lithographically patterned photoresist layer through the second-tier structure (232, 242, 270, 265). In one embodiment, the chemistry of the anisotropic etch process used to etch through the materials of the second alternating stack (232, 242) may alternate to optimize etching of the alternating material layers in the second alternating stack (232, 242). The anisotropic etch may be, for example, a series of reactive ion etches. The patterned lithographic material stack may be removed, for example, by ashing after the anisotropic etch process. A top surface of an underlying sacrificial memory opening fill portion 148 may be physically exposed at the bottom of each second-tier memory opening 249.

Figure 10A:
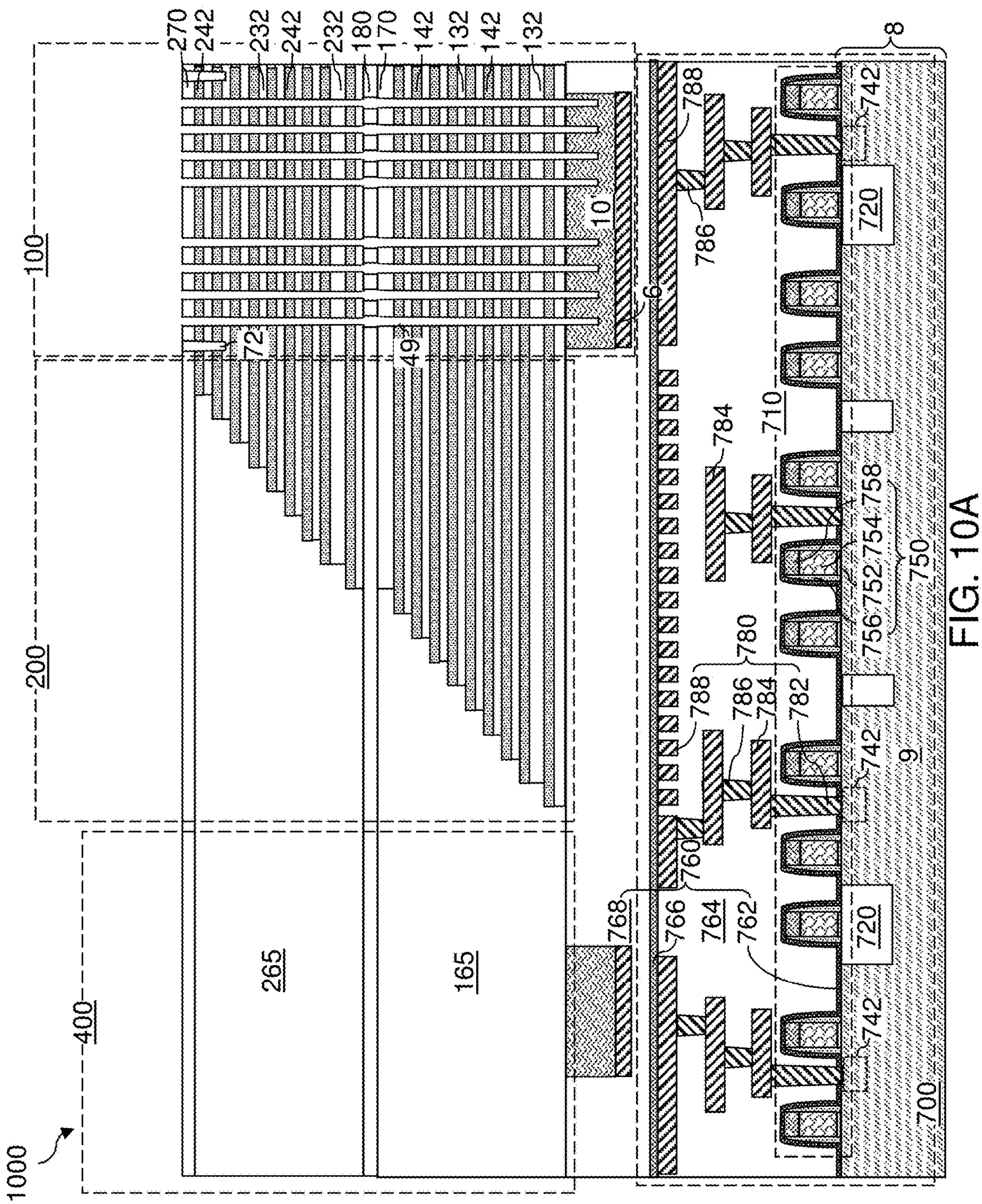
FIG. 10A is a vertical cross-sectional view of the first exemplary structure after formation of inter-tier memory openings according to the first embodiment of the present disclosure.
Figure 10B:
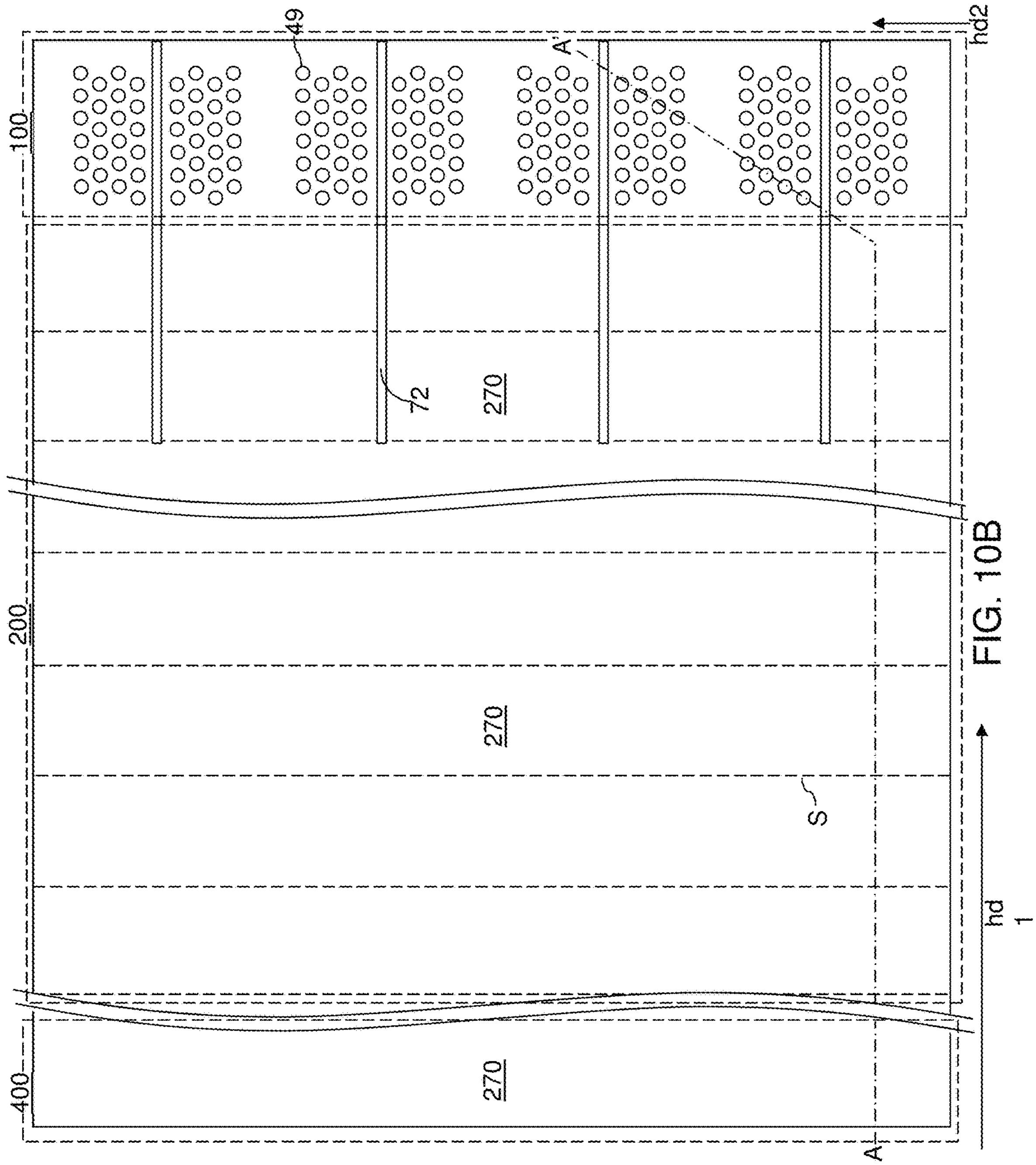
FIG. 10B is a top-down view of the first exemplary structure of FIG. 10A. The hinged vertical plane A-A' corresponds to the plane of the vertical cross-sectional view of FIG. 10A.

Referring to FIGS. 10A and 10B, an etch process may be performed to remove the sacrificial material of the sacrificial memory opening fill portions 148 selective to the materials of the second alternating stack (232, 242) and the first alternating stack (132, 142) (e.g., $C_4F_8/O_2/Ar$ etch). Upon removal of the sacrificial memory opening fill portions 148, each vertically adjoining pair of a second-tier memory opening 249 and a first-tier memory opening 149 forms a continuous cavity that extends through the first alternating stack (132, 142) and the second alternating stack (232, 242). The continuous cavities are herein referred to as memory openings 49 (or inter-tier memory openings). Surfaces of the in-process source-level material layers 10' may be physically exposed at the bottom of each memory opening 49. Locations of steps S in the first alternating stack (132, 142) and the second alternating stack (232, 242) are illustrated as dotted lines.

FIGS. 11A-11D provide sequential cross-sectional views of a memory opening 49 during formation of a memory opening fill structure 58. The same structural change occurs in each memory openings 49.

Figure 11B:
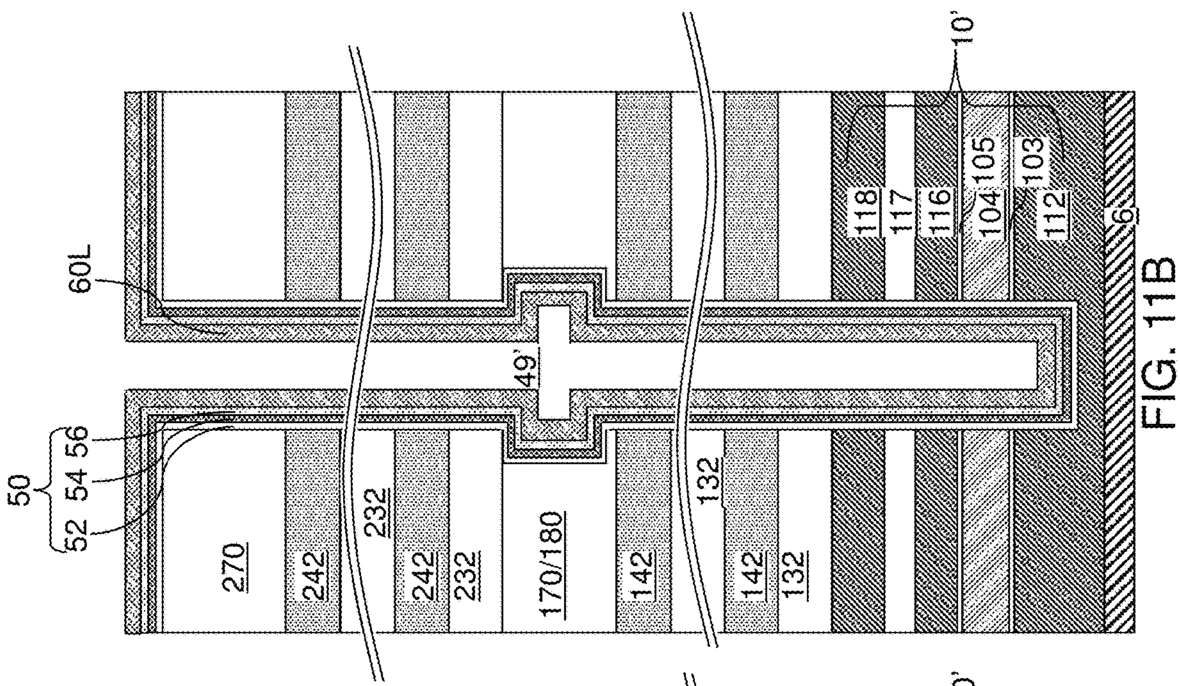
FIGS. 11A-11D are sequential vertical cross-sectional views of an inter-tier memory opening during formation of a memory opening fill structure according to the first embodiment of the present disclosure.
Figure 11A:
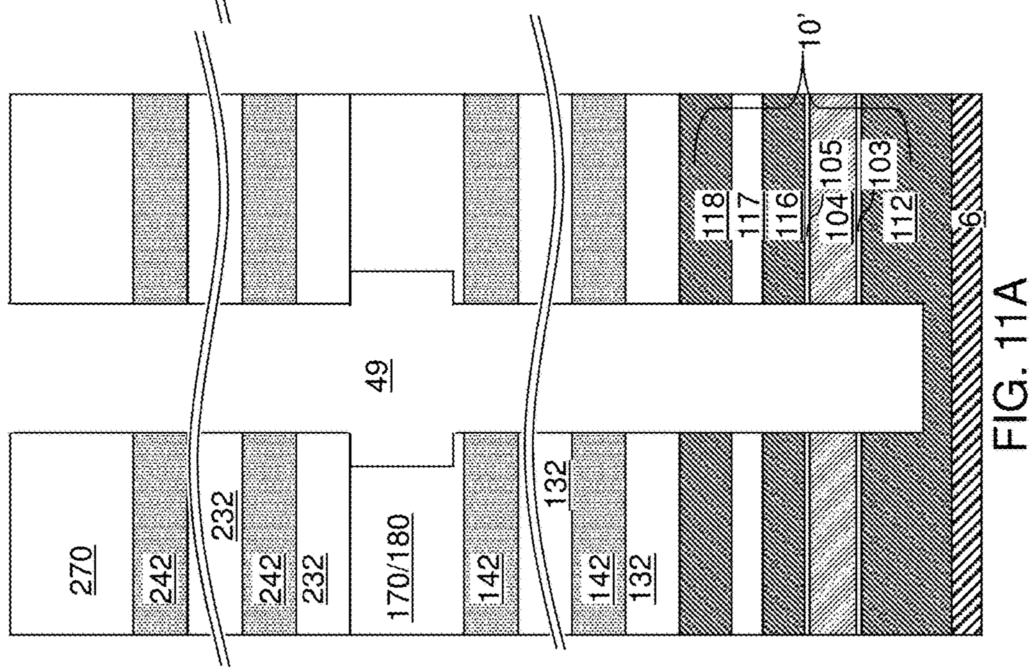

Referring to FIG. 11A, a memory opening 49 in the first exemplary device structure of FIGS. 10A and 10B is illustrated. The memory opening 49 extends through the first-tier structure and the second-tier structure.

Referring to FIG. 11B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer may be deposited, for example, by chemical vapor deposition (CVD), atomic layer deposition (ALD), pulsed laser deposition (PLD), liquid source misted chemical deposition, or a combination thereof. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. In one embodiment, the blocking dielectric layer 52 may include multiple dielectric metal oxide layers having different material compositions.

Alternatively or additionally, the blocking dielectric layer 52 may include a dielectric semiconductor compound such as silicon oxide, silicon oxynitride, silicon nitride, or a combination thereof. In one embodiment, the blocking dielectric layer 52 may include silicon oxide. In this case, the dielectric semiconductor compound of the blocking dielectric layer 52 may be formed by a conformal deposition method such as low pressure chemical vapor deposition, atomic layer deposition, or a combination thereof. The thickness of the dielectric semiconductor compound may be in a range from 1 nm to 20 nm, although lesser and greater thicknesses may also be used. Alternatively, the blocking dielectric layer 52 may be omitted, and a backside blocking dielectric layer may be formed after formation of backside recesses on surfaces of memory films to be subsequently formed.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer.

In another embodiment, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. While the present disclosure is described using an embodiment in which the charge storage layer 54 is a single continuous layer, embodiments are expressly contemplated herein in which the charge storage layer 54 is replaced with a plurality of memory material portions (which may be charge trapping material portions or electrically isolated conductive material portions) that are vertically spaced apart.

The charge storage layer 54 may be formed as a single charge storage layer of homogeneous composition, or may include a stack of multiple charge storage layers. The multiple charge storage layers, if used, may comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which may be, for example, ruthenium nanoparticles. The charge storage layer 54 may be formed, for example, by chemical vapor deposition (CVD), atomic layer deposition (ALD), physical vapor deposition (PVD), or any suitable deposition technique for storing electrical charges therein. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Figure 11D:
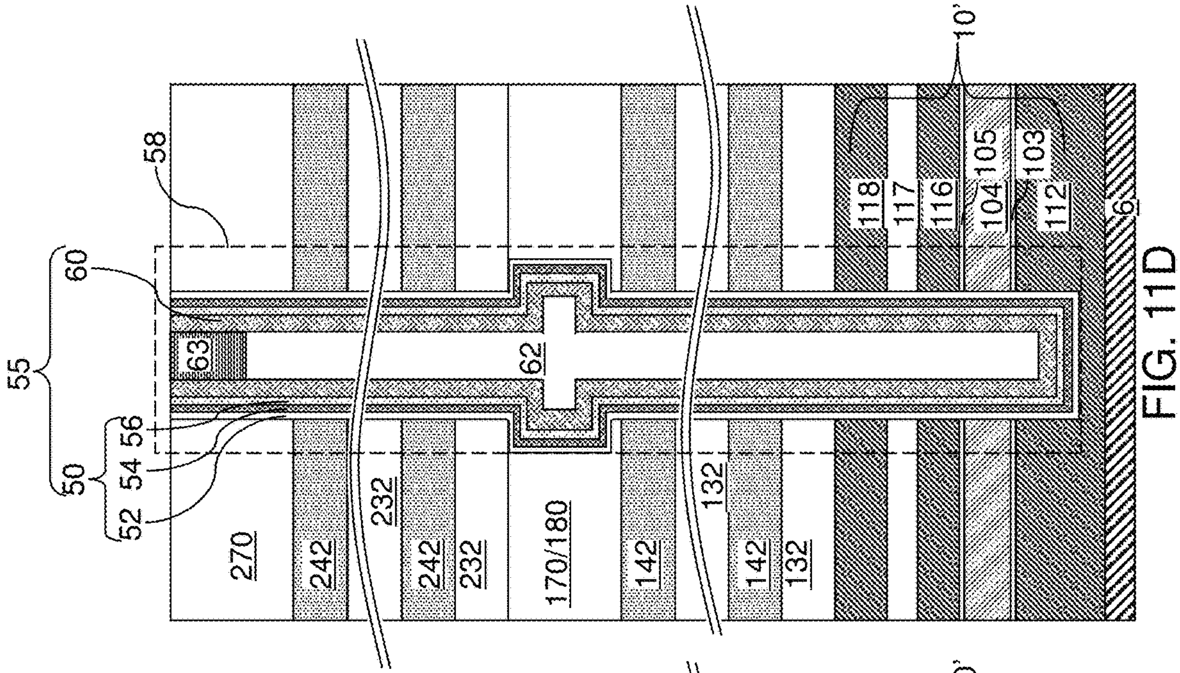
Figure 11C:
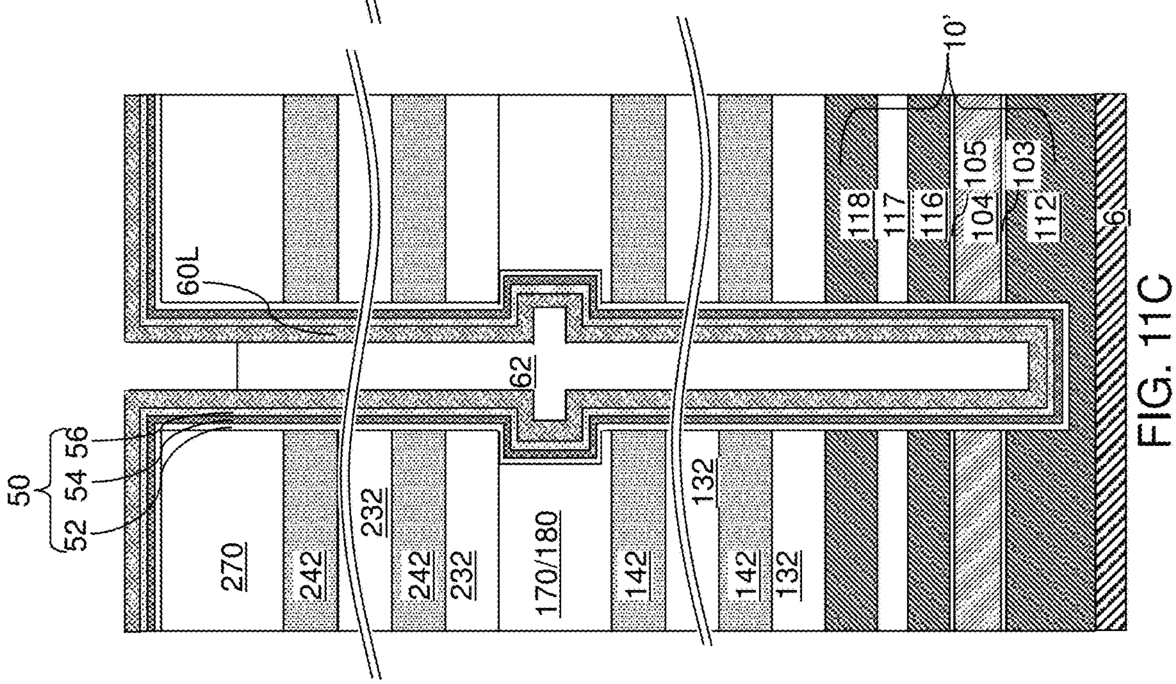

Referring to FIG. 11C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 11D, a doped semiconductor material may be deposited in cavities overlying the dielectric cores 62. The doped semiconductor material has a doping of the opposite conductivity type of the doping of the semiconductor channel material layer 60L. Thus, the doped semiconductor material has a doping of the second conductivity type. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material having a doping of the second conductivity type constitutes a drain region 63. The drain regions 63 may have a doping of a second conductivity type that is the opposite of the first conductivity type. For example, if the first conductivity type is p-type, the second conductivity type is n-type, and vice versa. The dopant concentration in the drain regions 63 may be in a range from $5.0\times10^{19}/cm^3$ to $2.0\times10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 10', the first-tier structure (132, 142, 170, 165), the second-tier structure (232, 242, 270, 265), the inter-tier dielectric layer 180, and the memory opening fill structures 58 collectively constitute a memory-level assembly.

Figure 12A:
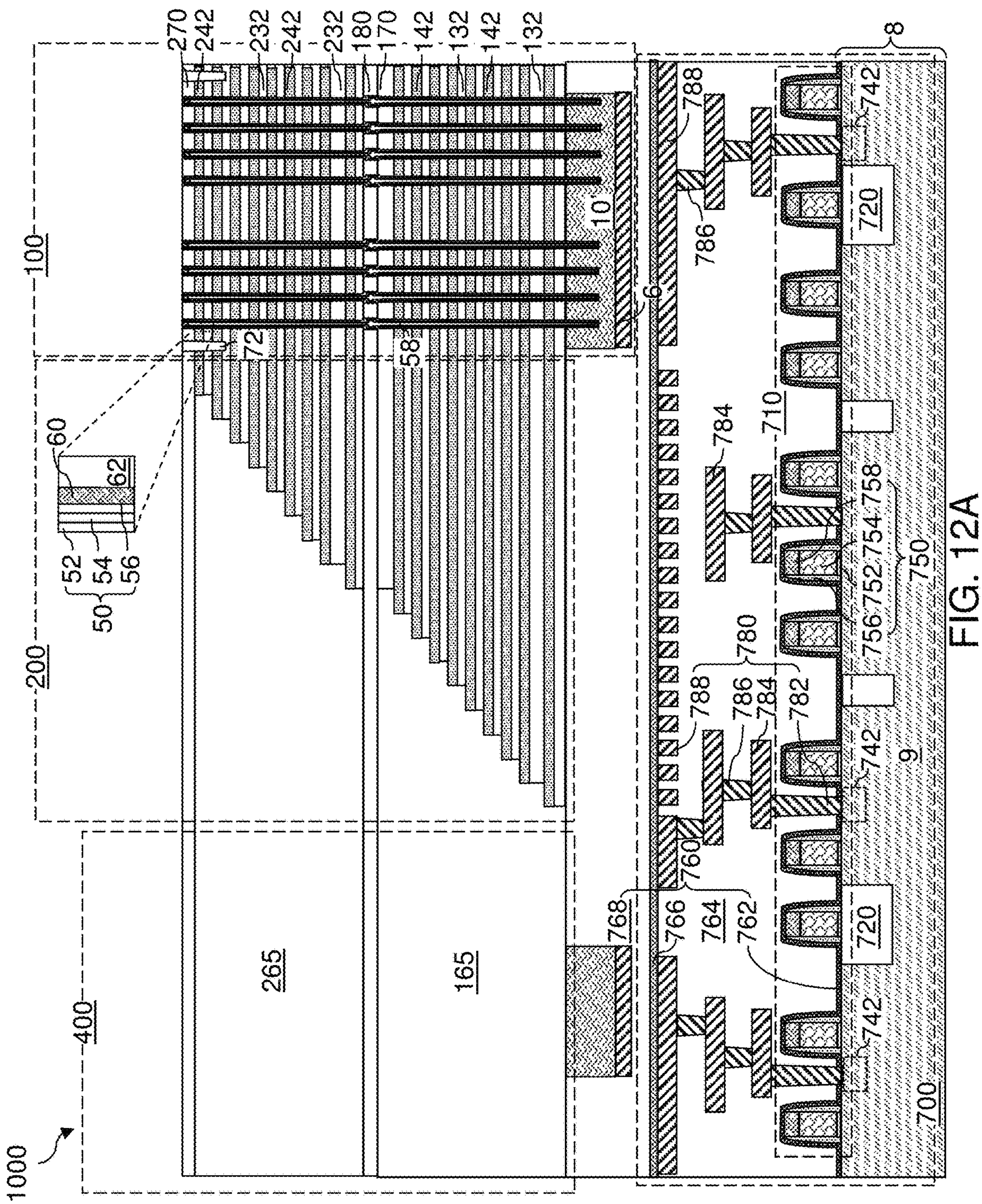
FIG. 12A is a vertical cross-sectional view of the first exemplary structure after formation of memory stack structures according to the first embodiment of the present disclosure.
Figure 12B:
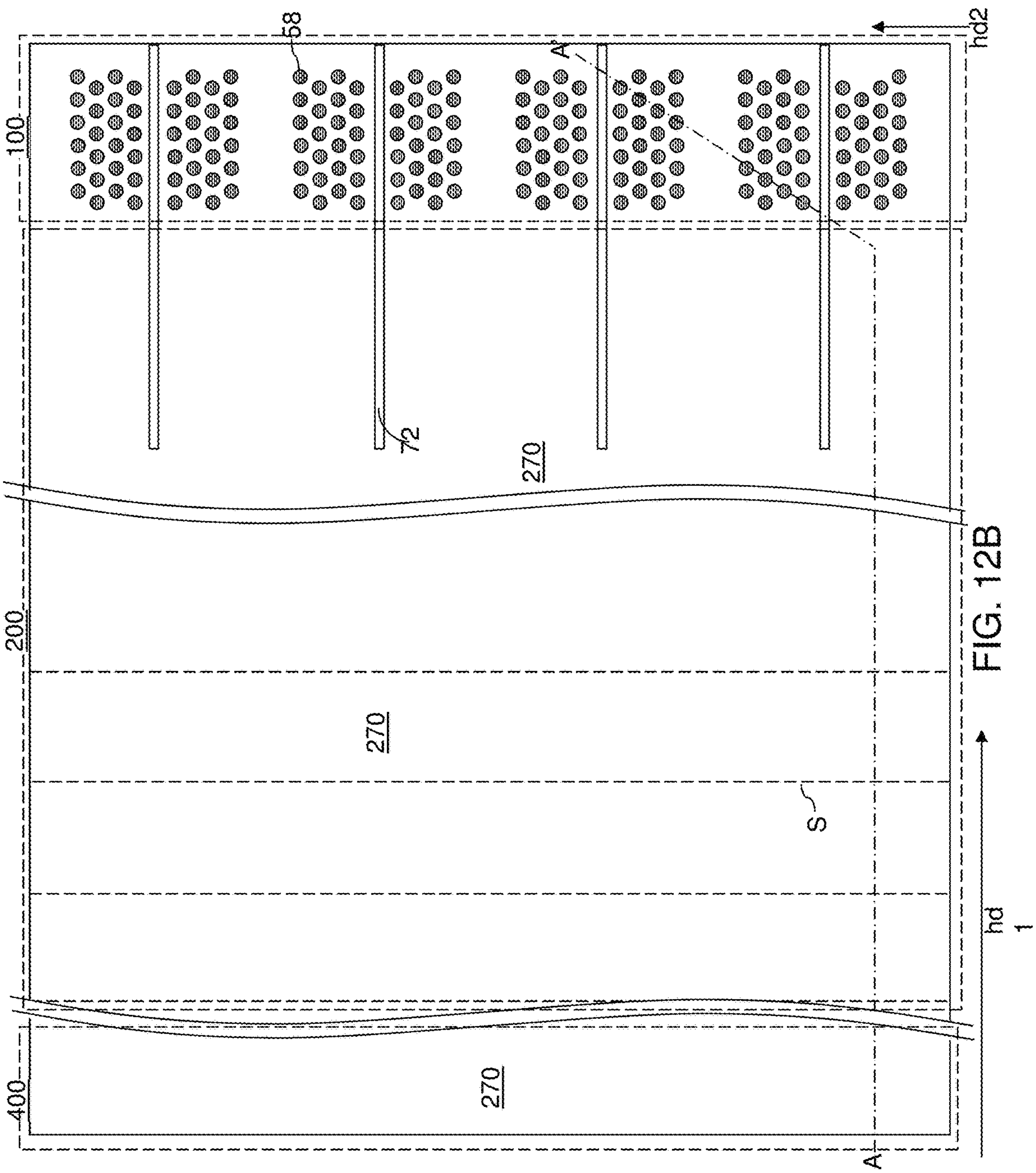
FIG. 12B is a top-down view of the first exemplary structure of FIG. 12A. The hinged vertical plane A-A' corresponds to the plane of the vertical cross-sectional view of FIG. 12A.

Referring to FIGS. 12A and 12B, the first exemplary structure is illustrated after formation of the memory opening fill structures 58.

Figure 13A:
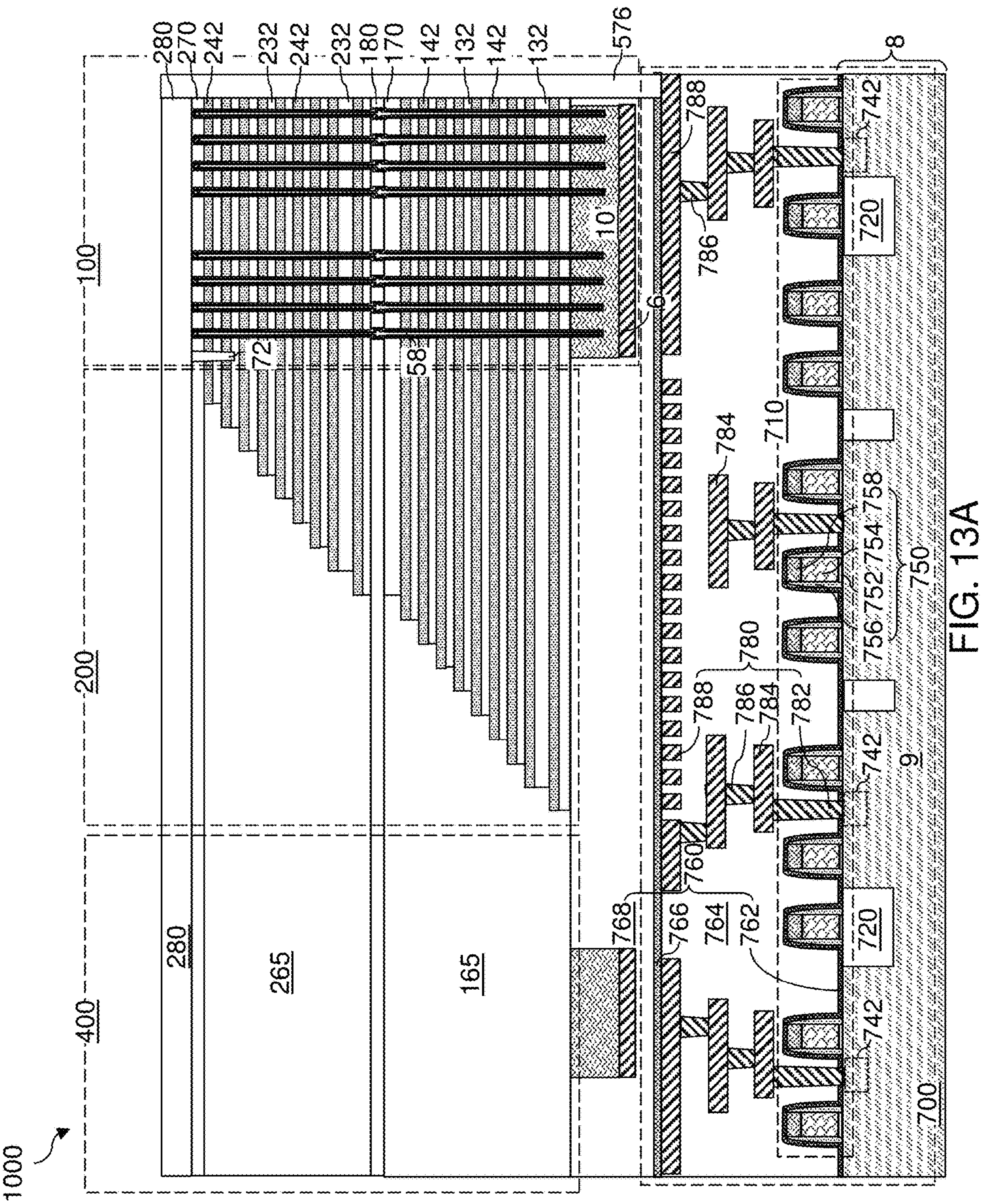
FIG. 13A is a vertical cross-sectional view of the first exemplary structure after formation of through-stack insulating material portion according to the first embodiment of the present disclosure.
Figure 13B:
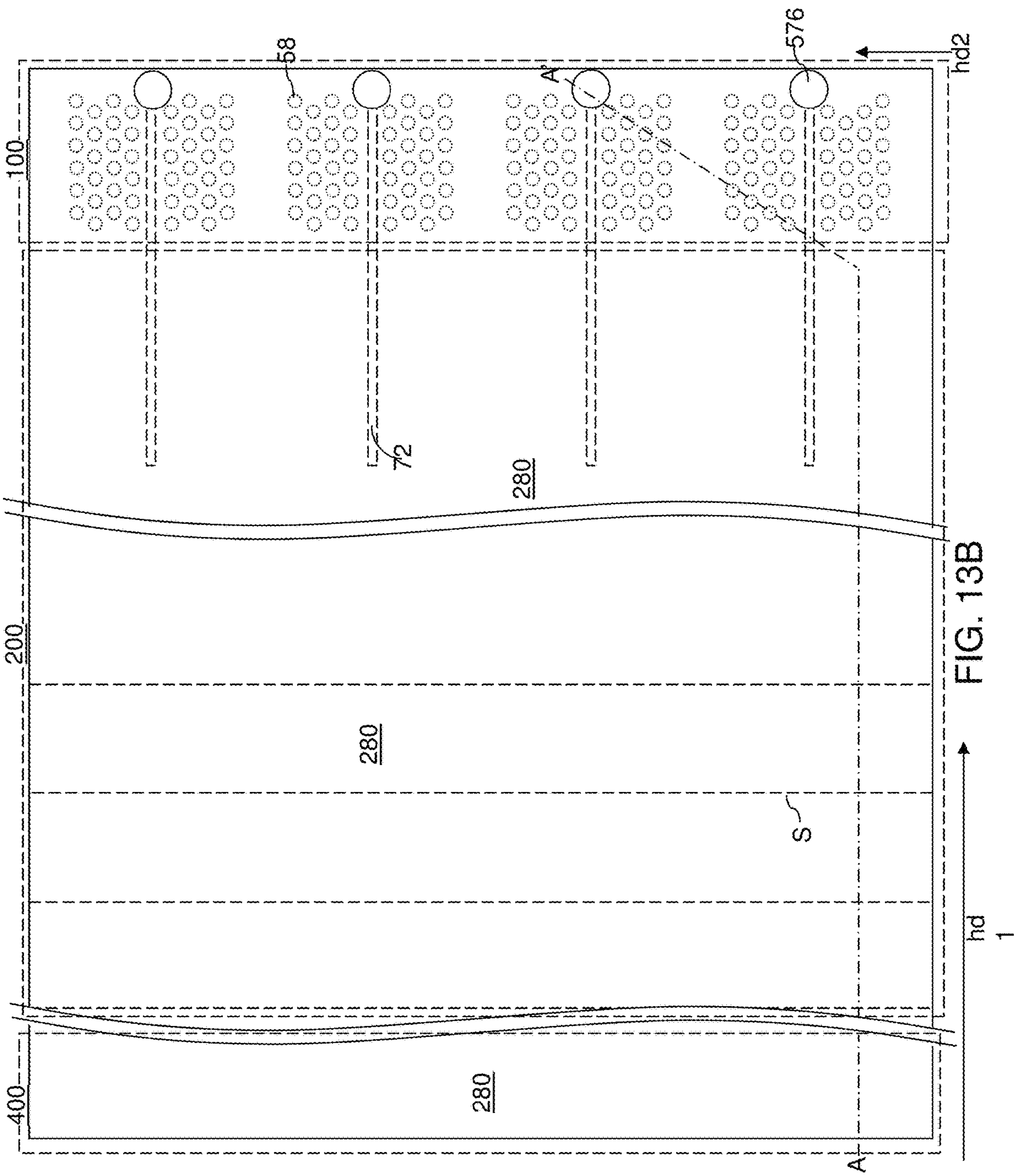
FIG. 13B is a top-down view of the first exemplary structure of FIG. 13A. The hinged vertical plane A-A' corresponds to the plane of the vertical cross-sectional view of FIG. 13A.
Figure 14A:
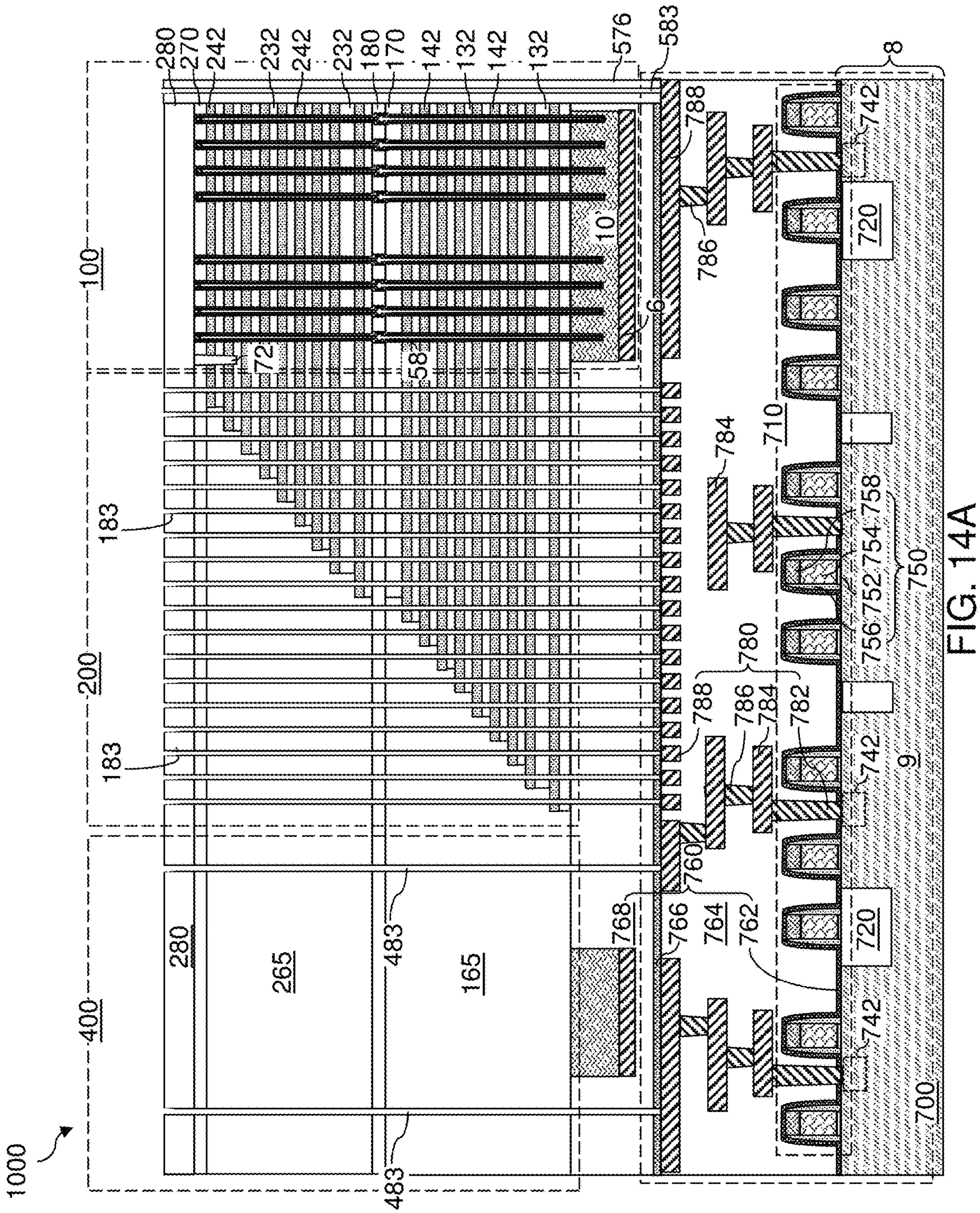
FIG. 14A is a vertical cross-sectional view of the first exemplary structure after formation of staircase region via cavities, peripheral region via cavities, and array region via cavities according to the first embodiment of the present disclosure.
Figure 14B:
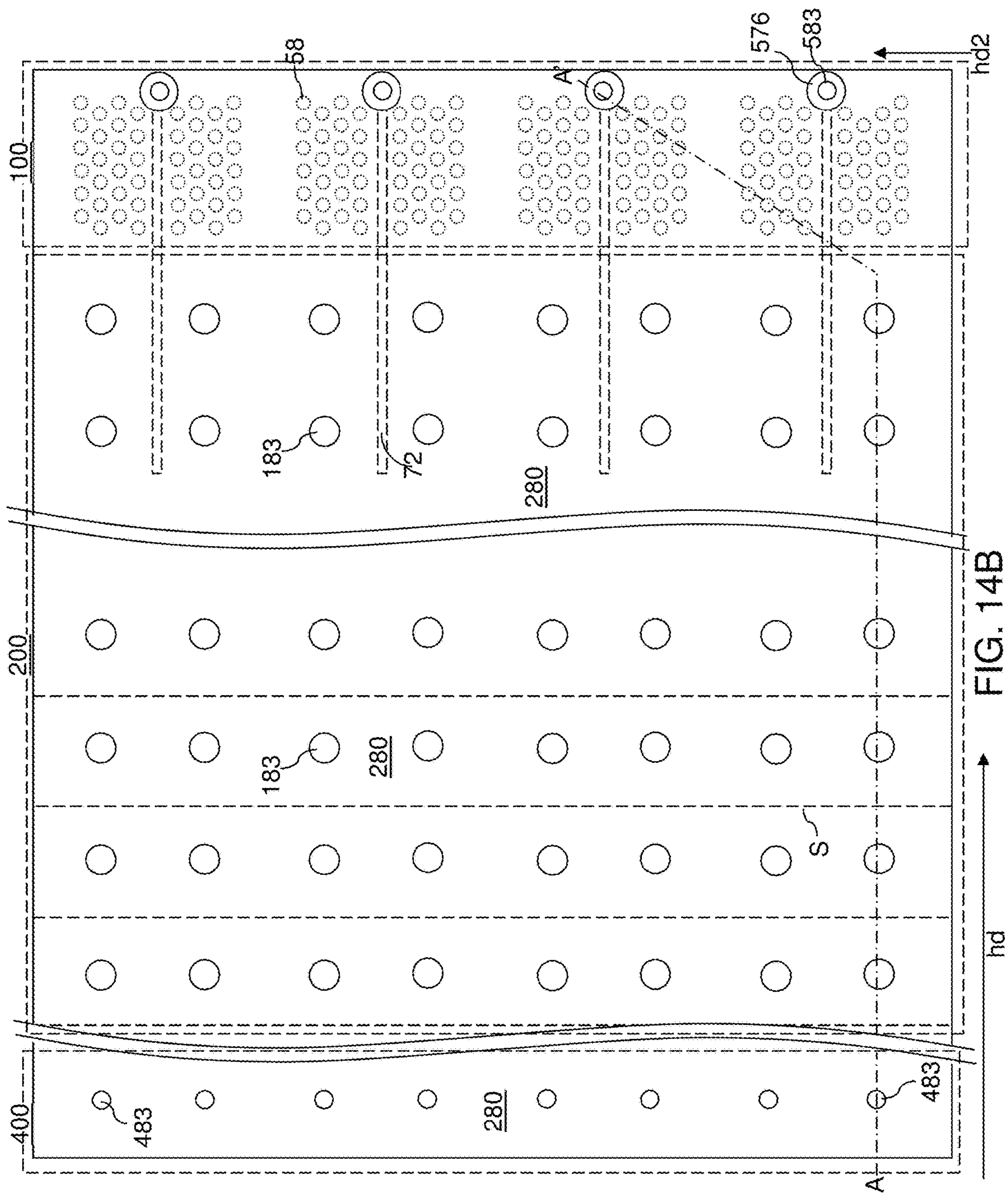
FIG. 14B is a top-down view of the first exemplary structure of FIG. 14A. The hinged vertical plane A-A' corresponds to the plane of the vertical cross-sectional view of FIG. 14A.
Figure 15A:
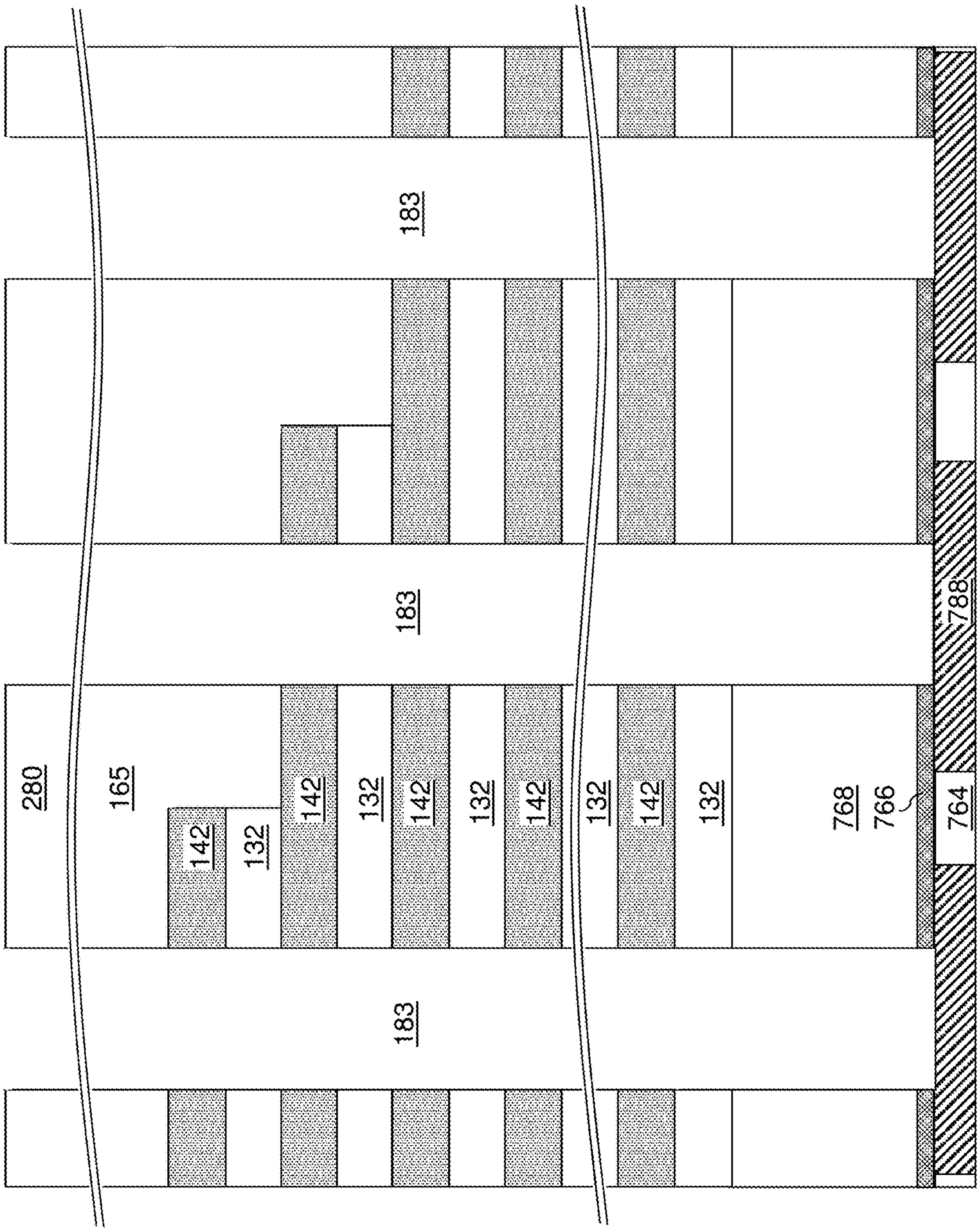
FIGS. 15A, 15B, and 15C are magnified vertical cross-sectional views of a staircase region via cavity, a peripheral region via cavity, and an array region via cavity, respectively, at the processing steps of FIGS. 14A and 14B.
Figure 15C:
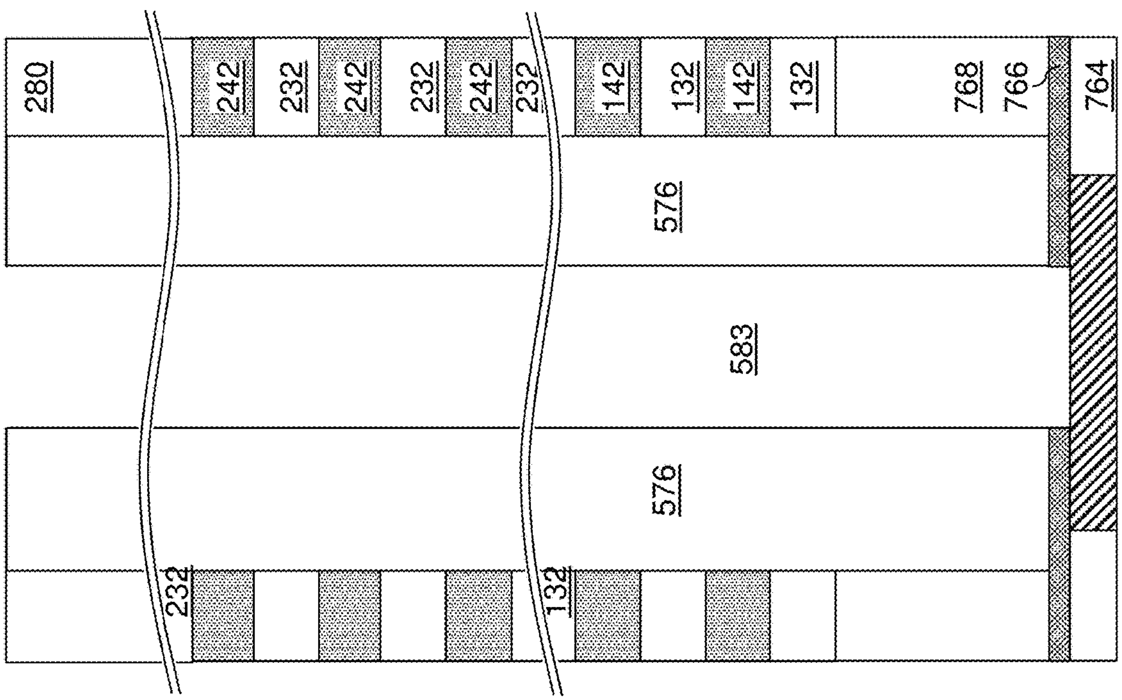
Figure 15B:
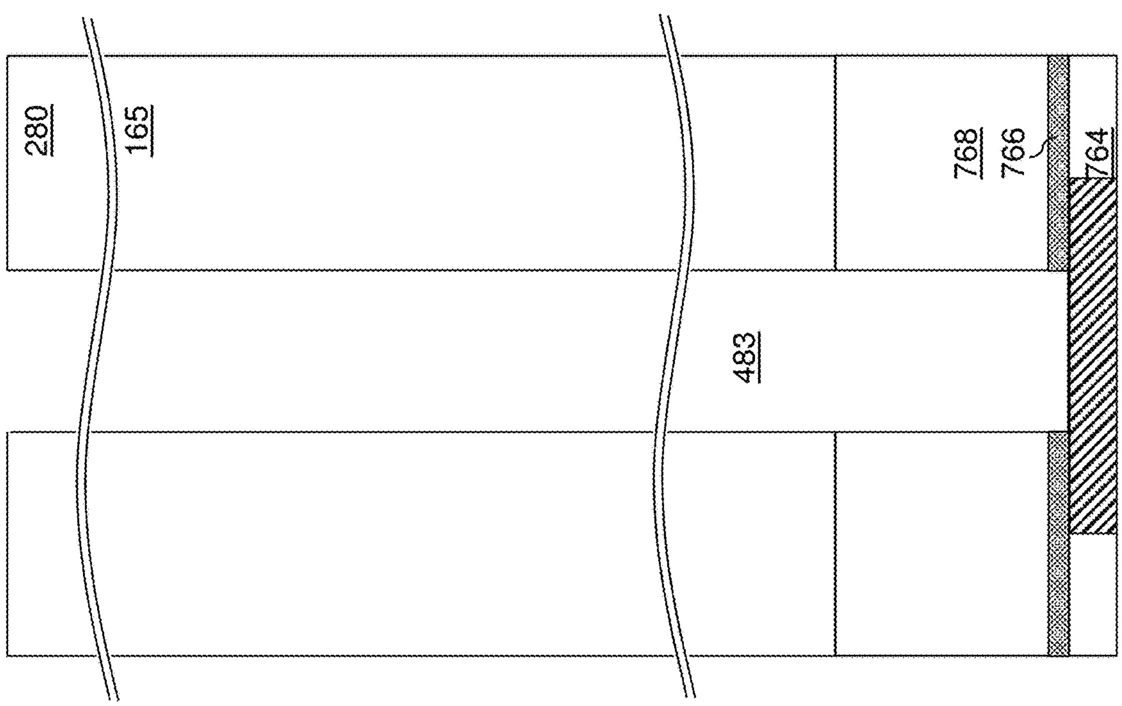

Referring to FIGS. 13A and 13B, a first contact level dielectric layer 280 may be formed over the memory-level assembly. The first contact level dielectric layer 280 is formed at a contact level through which various contact via structures are subsequently formed to the drain regions 63 and the various electrically conductive layers that replaces the sacrificial material layers (142, 242) in subsequent processing steps.

In one optional embodiment, through-stack via cavities may be formed with the memory array region 100, for example, by applying and patterning of a photoresist layer to form openings therein, and by anisotropically etching the portions of the first contact level dielectric layer 280, the alternating stacks (132, 146, 232, 246), and the at least one second dielectric material layer 768 that underlie the openings in the photoresist layer. In one embodiment, each of the through-stack via cavities may be formed within a respective three-dimensional memory array so that each through-stack via cavities is laterally surrounded by memory opening fill structures 58. In one embodiment, one or more of the through-stack via cavities may be formed through the drain-select-level isolation structures 72. However, other locations may also be selected. In one embodiment, the first-through-stack via cavities may be formed within areas of openings in the in-process source-level material layers 10' and the optional planar conductive material layer 6. The bottom surface of each through-stack via cavity may be formed at, or above, the silicon nitride layer 766. In one embodiment, the silicon nitride layer 766 may be used as an etch stop layer during the anisotropic etch process that forms the through-stack via cavities. In this case, the bottom surface of each through-stack via cavity may be formed at the silicon nitride layer 766, and the silicon nitride layer 766 may be physically exposed at the bottom of each through-stack via cavity.

A dielectric material is deposited in the through-stack via cavities. The dielectric material may include a silicon-oxide based material such as undoped silicate glass, doped silicate glass, or a flowable oxide material. The dielectric material may be deposited by a conformal deposition method such as chemical vapor deposition or spin coating. A void may be formed within an unfilled portion of each through-stack via cavity. Excess portion of the deposited dielectric material may be removed from above a horizontal plane including the top surface of the first contact level dielectric layer 280, for example, by chemical mechanical planarization or a recess etch. Each remaining dielectric material portion filling a respective one of the through-stack via cavity constitutes a through-stack insulating material portion 576. The through-stack insulating material portions 576 contact sidewalls of the alternating stacks (132, 146, 232, 246), and may contact the silicon nitride layer 766. In another embodiment, the through-stack via cavities and the through-stack insulating material portions 576 may be omitted.

Referring to FIGS. 14A, 14B, 15A, 15B, and 15C, a photoresist layer (not shown) may be applied over the first contact level dielectric layer 280, and may be lithographically patterned to form various openings in areas in which via cavities are to be subsequently formed. An optional opening may be formed over the through-stack insulating material portions 576 in the memory array region 100, and openings may be formed over horizontal surfaces of the stepped surfaces in the staircase region 200, and in the peripheral device region 400. An anisotropic etch process may be performed to transfer the pattern of the openings in the photoresist layer through the various material portions in the memory-level assembly. Various contact via cavities (183, 483, and optionally 583) may be formed through the memory-level assembly. Specifically, the various contact via cavities (183, 483, 583) may vertically extend to the top surfaces of the topmost lower-level metal line structures 788. In one embodiment, the silicon nitride layer 766 may be used as an etch stop layer in the final phase of the anisotropic etch process, and the anisotropic etch process may include a silicon nitride breakthrough etch step that etches through the silicon nitride layer 766 and physically exposes top surface of the topmost lower-level metal line structures 788.

The various contact via cavities (183, 483, 583) that are formed through the memory-level assembly include staircase region via cavities 183 that extend through a respective one of the horizontal surfaces of the stepped surfaces in the staircase region 200, peripheral region via cavities 483 that extend through the retro-stepped dielectric material portions (265, 165) in the peripheral device region 400, and optional array region via cavities 583 that are formed through a respective one of the through-stack insulating material portions 576 in the memory array region 100. In one embodiment, each of the various contact via cavities (183, 483, 583) may be a cylindrical via cavity. As used herein, a "cylindrical via cavity" refers to a via cavity having only a straight sidewall or straight sidewalls such that each straight sidewall is vertical or substantially vertical. As used herein, a surface is "substantially vertical" if the taper angle of the surface with respect to a vertical direction is less than 5 degrees. Each staircase region via cavity 183 is a cylindrical via cavity that extends through a second retro-stepped dielectric material portion 265 and a subset of layers within the second alternating stack (232, 242) and the first alternating stack (132, 142) and over the lower-level metal interconnect structures 780. A top surface of a respective one of the lower-level metal interconnect structures 780 (such as the topmost lower-level metal line structures 788) may be physically exposed at the bottom of each of the various contact via cavities (183, 483, 583).

Figure 16A:
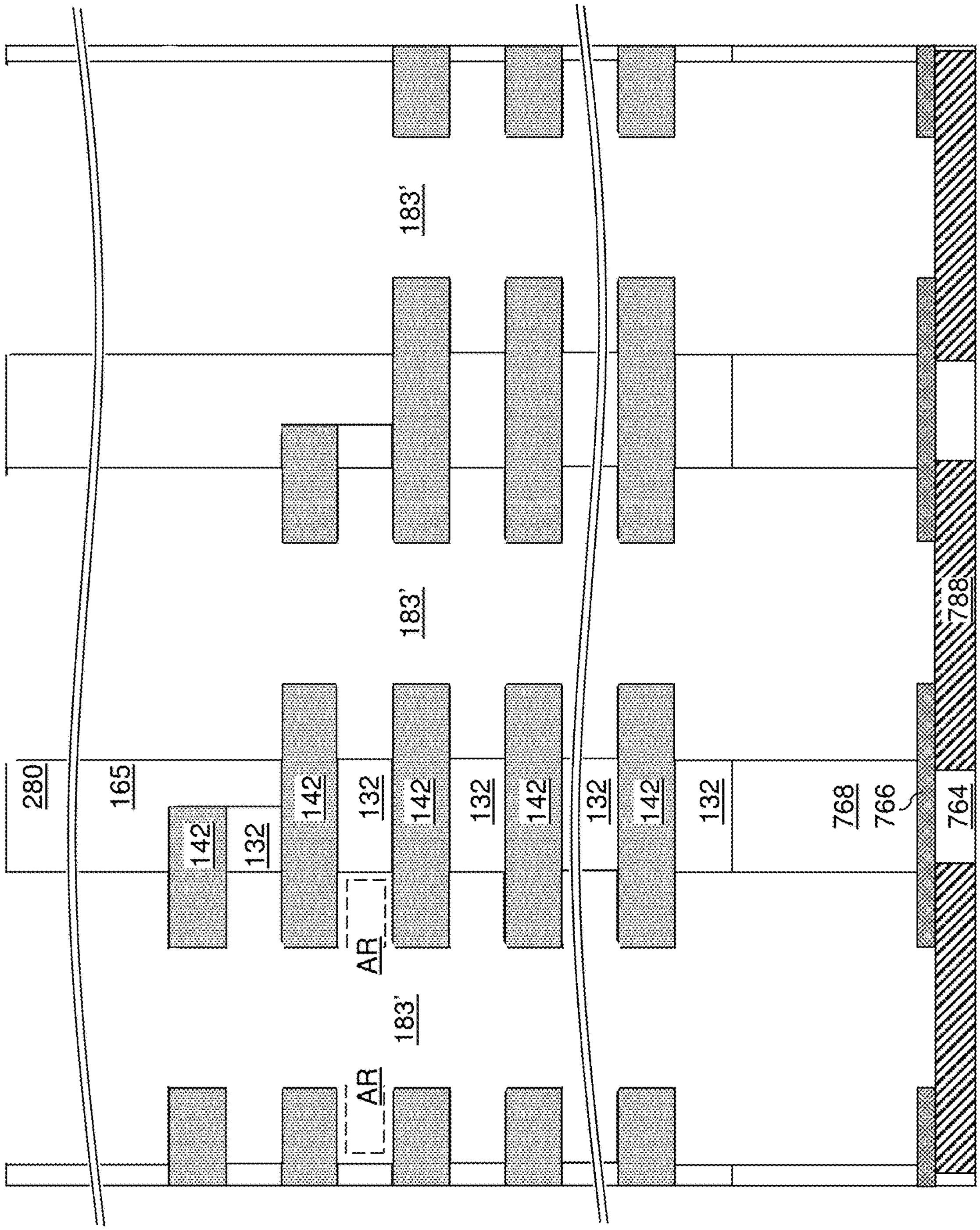
FIGS. 16A, 16B, and 16C are magnified vertical cross-sectional views of a staircase region via cavity, a peripheral region via cavity, and an array region via cavity, respectively, after an isotropic etch process that converts the staircase region via cavity into a ribbed via cavity according to the first embodiment of the present disclosure.
Figure 16C:
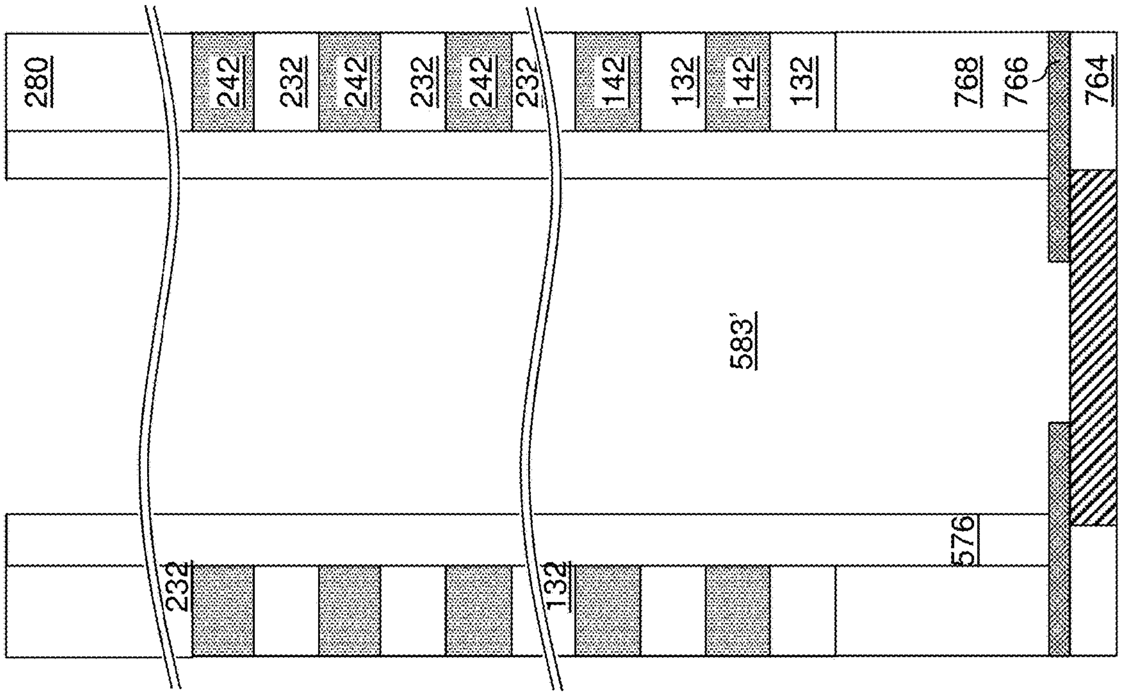
Figure 16B:
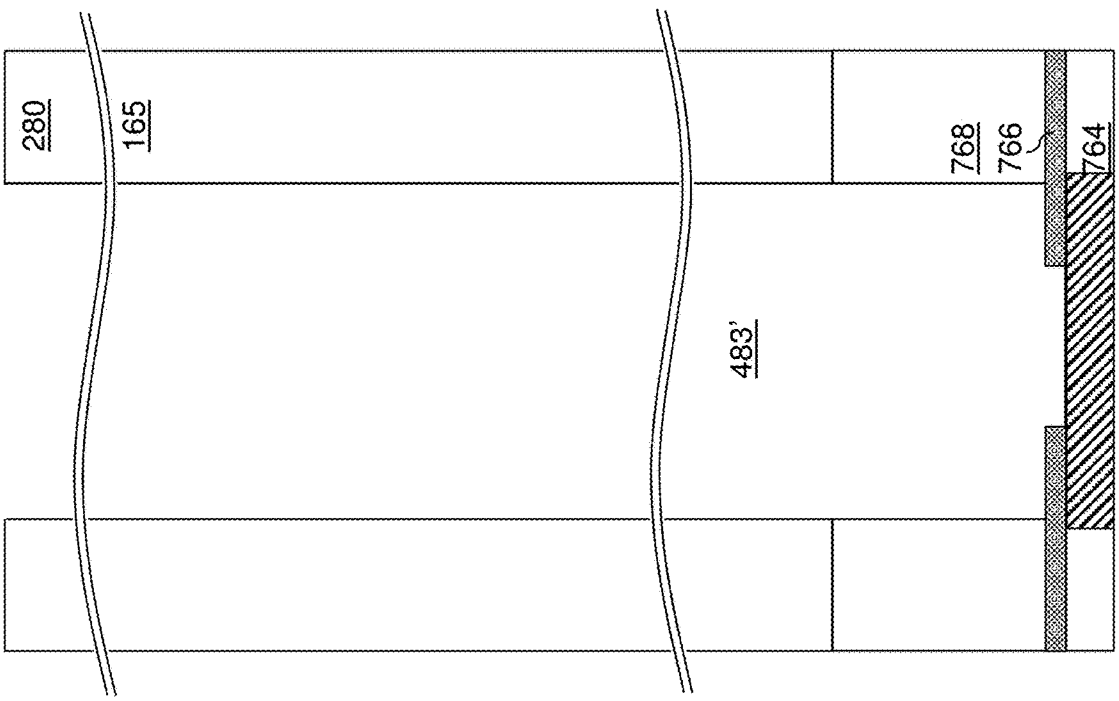

Referring to FIGS. 16A, 16B, and 16C, an isotropic etch process may be performed to laterally recess the insulating layers (132, 232) with respect to the spacer material layers such as the first and second sacrificial material layers (142, 242). Each staircase region via cavity 183 may be converted from a cylindrical via cavity to a ribbed via cavity 183'. As used herein, a "ribbed via cavity" refers to a via cavity including at least one annular laterally protruding volume. Each annular laterally protruding volume of a ribbed via cavity is herein referred to as a "rib region."

In one embodiment, the retro-stepped dielectric material portions (165, 265) may include a same dielectric material or a similar dielectric material as the insulating layers (132, 232). For example, the first and second insulating layers (132, 232) may include undoped silicate glass, and the retro-stepped dielectric material portions (165, 265) may include undoped silicate glass or doped silicate glass. In this case, the ribbed via cavities 183' may be formed from the cylindrical staircase region via cavities 183 by etching materials of the retro-stepped dielectric material portions (165, 265) and the insulating layers (132, 232) selective to the spacer material layers (i.e., the first and second sacrificial material layers (142, 242)).

In one embodiment, the dielectric materials of the first contact level dielectric layer 290, the first and second insulating cap layers (170, 270), the first and second retro-stepped dielectric material portions (165, 265), and the insulating layers (132, 232) may comprise silicon oxide materials (such as undoped silicate glass and various doped silicate glasses), and the first and second sacrificial material layers (142, 242) may include a sacrificial material that is not a silicate glass material (such as silicon nitride or a semiconductor material). In this case, the isotropic etch process may etch the dielectric materials of the first contact level dielectric layer 290, the first and second insulating cap layers (170, 270), the first and second retro-stepped dielectric material portions (165, 265), and the insulating layers (132, 232) may be etched selective to the materials of the first and second sacrificial material layers (142, 242) to form the ribbed via cavities 183'.

In one embodiment, the spacer material layers of the alternating stacks (132, 142, 232, 242) may include sacrificial material layers (142, 242) that are composed of silicon nitride, and the insulating layers (132, 232) and the retro-stepped dielectric material portions (265, 165) may include silicon oxide materials. In this case, the retro-stepped dielectric material portions (165, 265) and each insulating layer (132, 232) physically exposed to the staircase region via cavities 183 may be isotropically recessed by a wet etch process using hydrofluoric acid. Each ribbed via cavity 183' may include a ribbed cavity region extending through the alternating stacks (132, 142, 232, 242), an overlying cavity laterally surrounded by the second retro-stepped dielectric material portion 265 and optionally by the first retro-stepped dielectric material portion 165 (in case the ribbed via cavity 183' extends only through the first alternating stack (132, 142) and does not extend through the second alternating stack (232, 242)), an underlying cavity that underlies the alternating stacks (132, 142, 232, 242), and annular recesses AR, or rib regions, formed at levels of insulating layers (132, 232) in the subset of layers within the alternating stacks (132, 142, 232, 242) through which the ribbed via cavity 183' vertically extends.

Each of the peripheral region via cavities 483 and the array region via cavities 583 may be isotropically expanded laterally to form expanded peripheral region via cavities 483' and expanded array region via cavities 583'. In one embodiment, the dielectric materials of the first contact level dielectric layer 280, the first and second insulating cap layers (170, 270), the first and second retro-stepped dielectric material portions (165, 265), and the insulating layers (132, 232) may include a same dielectric material such as undoped silicate glass, and the peripheral region via cavities 483' and the expanded array region via cavities 583' may be cylindrical cavities. Alternatively, the dielectric materials of the first contact level dielectric layer 280, the first and second insulating cap layers (170, 270), the first and second retro-stepped dielectric material portions (165, 265), and the insulating layers (132, 232) may have different etch rates during the isotropic etch process, and the peripheral region via cavities 483' and expanded array region via cavities 583' may include lateral steps having a lesser lateral dimension than the recess distance by which the sacrificial material layers (142, 242) are laterally recessed.

Figure 17A:
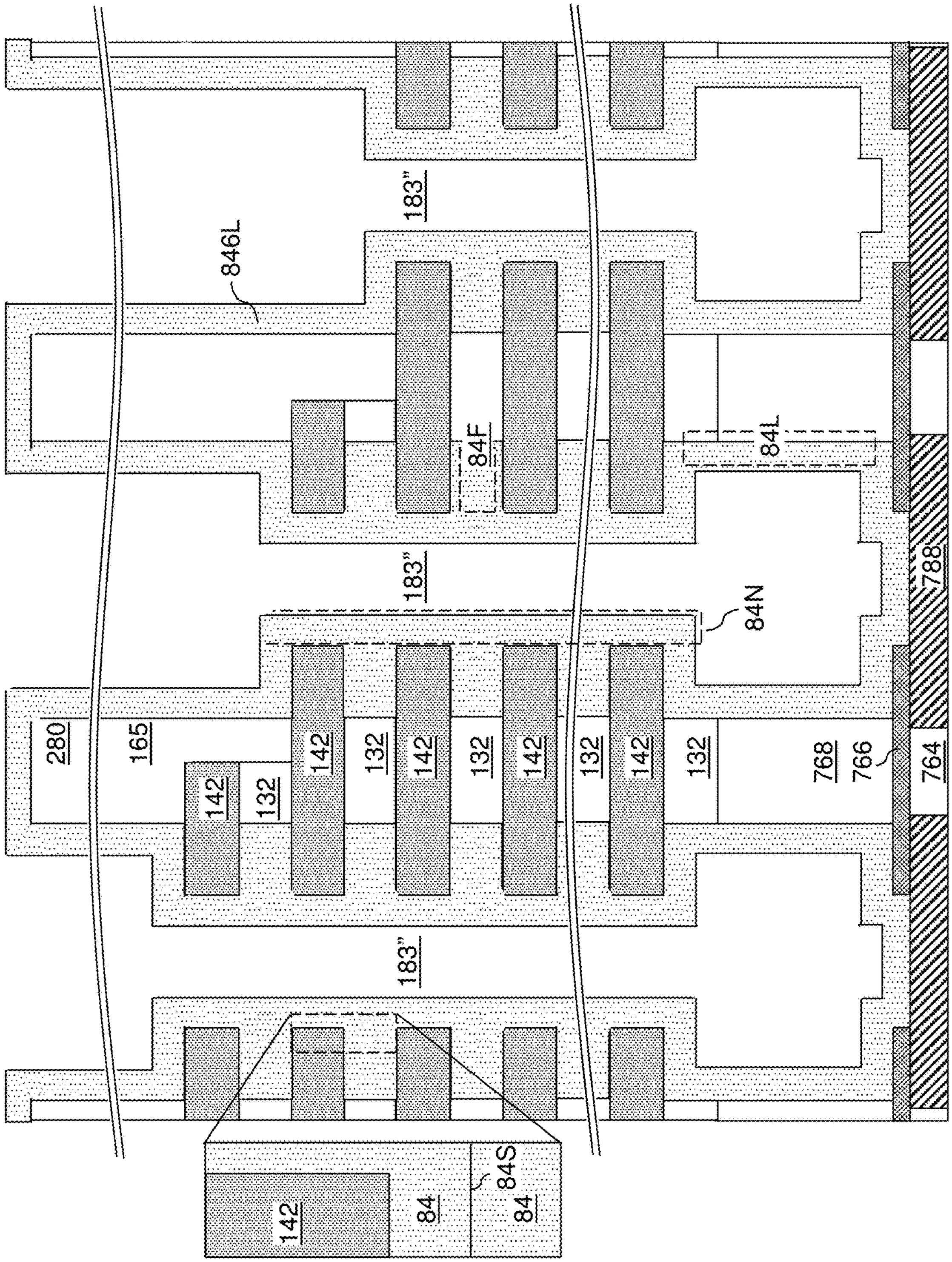
FIGS. 17A, 17B, and 17C are magnified vertical cross-sectional views of a staircase region via cavity, a peripheral region via cavity, and an array region via cavity, respectively, after deposition of a conformal dielectric via liner according to the first embodiment of the present disclosure.
Figure 17C:
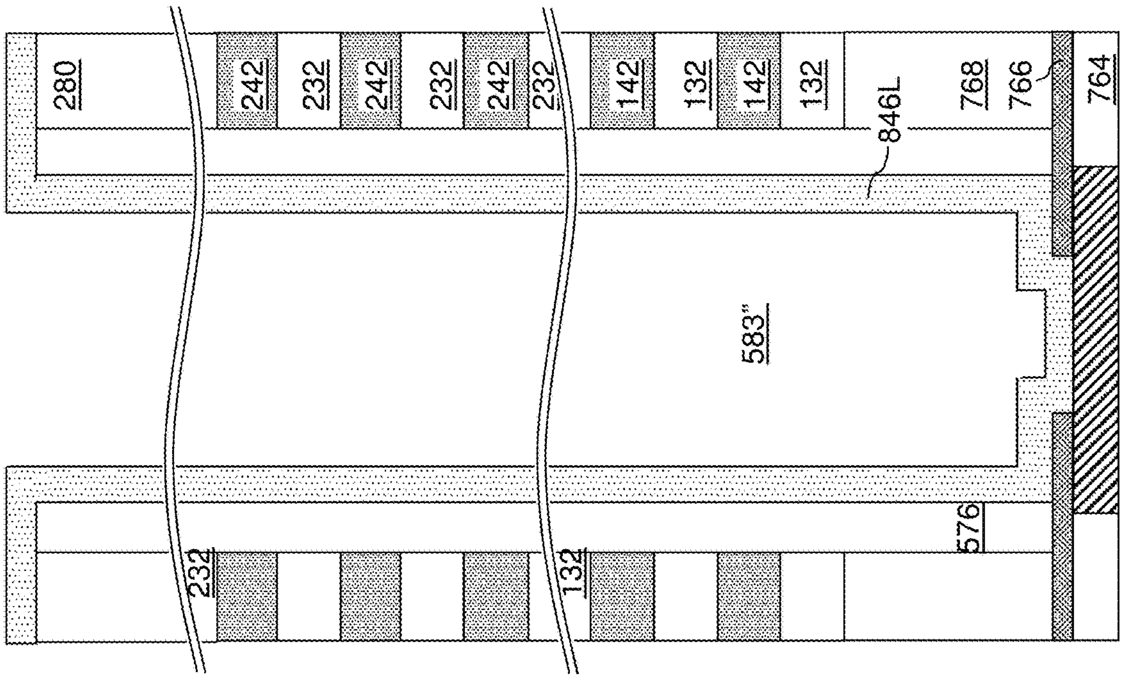
Figure 17B:
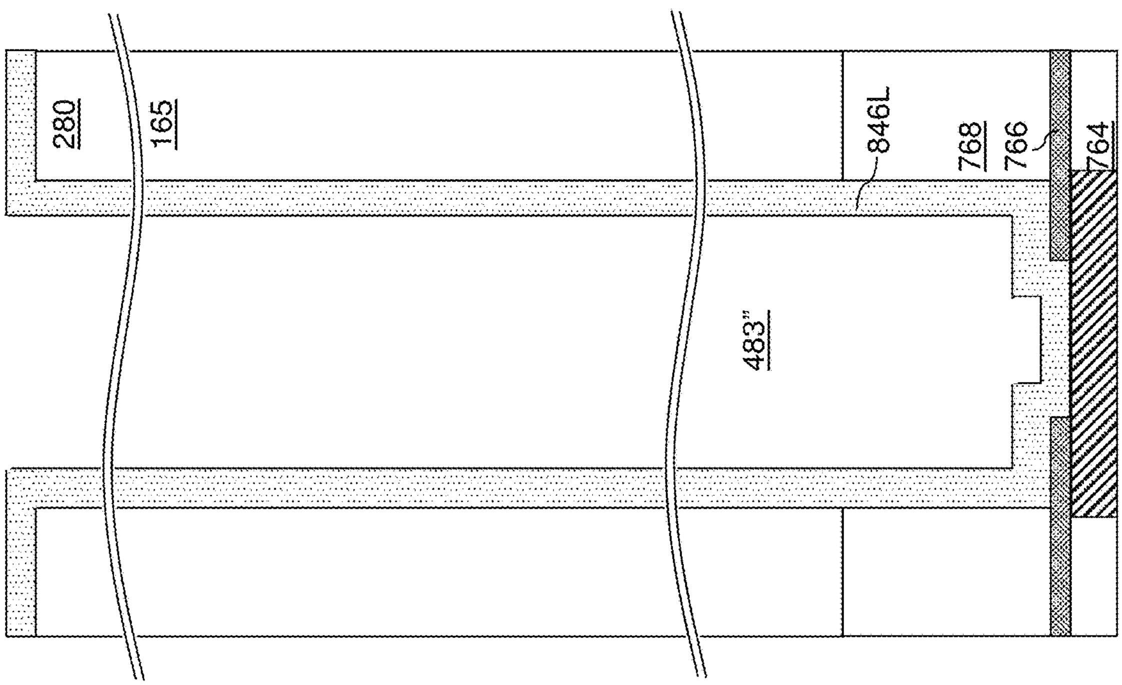
Figure 18A:
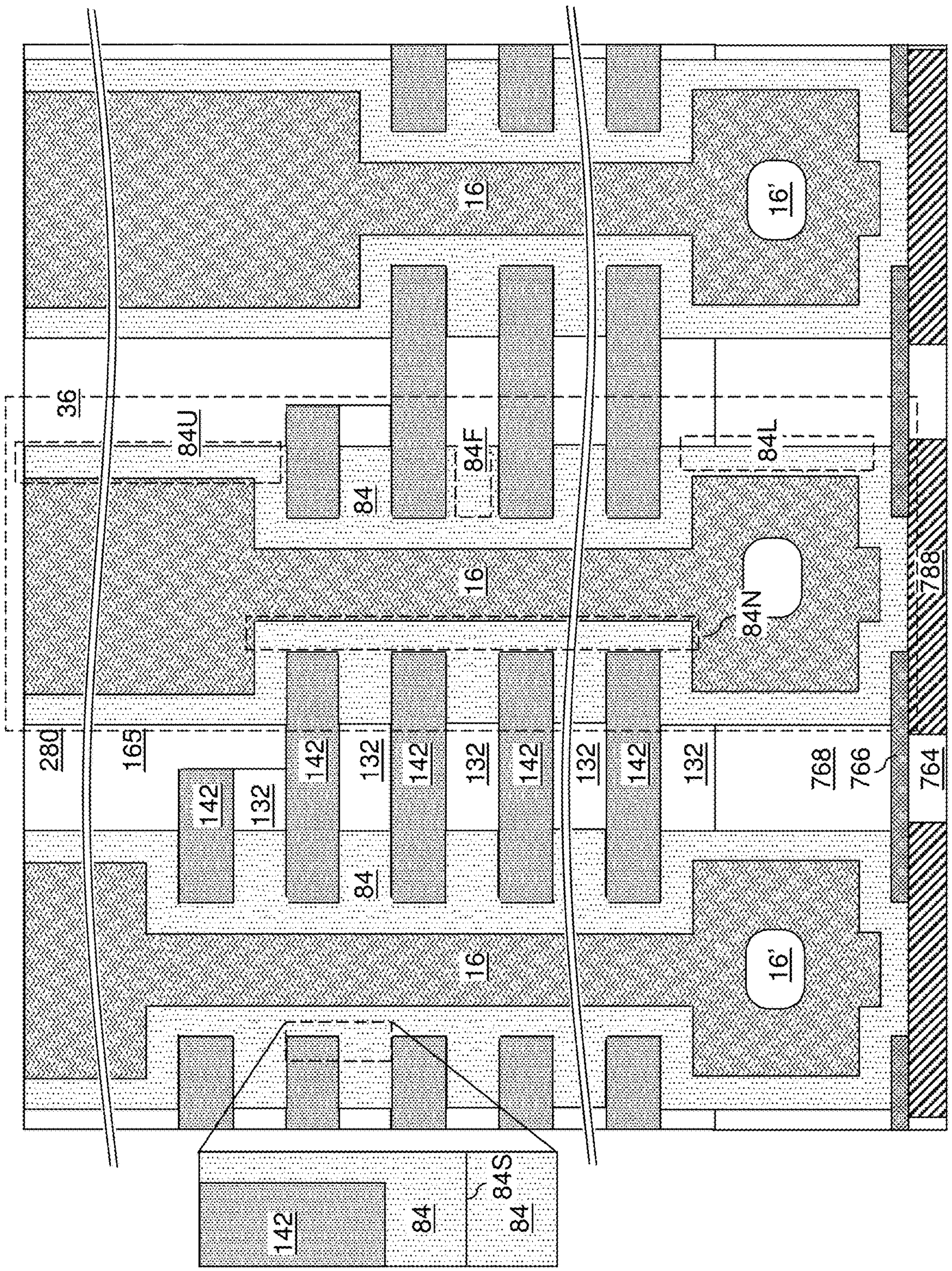
FIGS. 18A, 18B, and 18C are magnified vertical cross-sectional views of a staircase region via cavity, a peripheral region via cavity, and an array region via cavity, respectively, after formation of various sacrificial via fill material portions therein according to the first embodiment of the present disclosure.
Figure 18C:
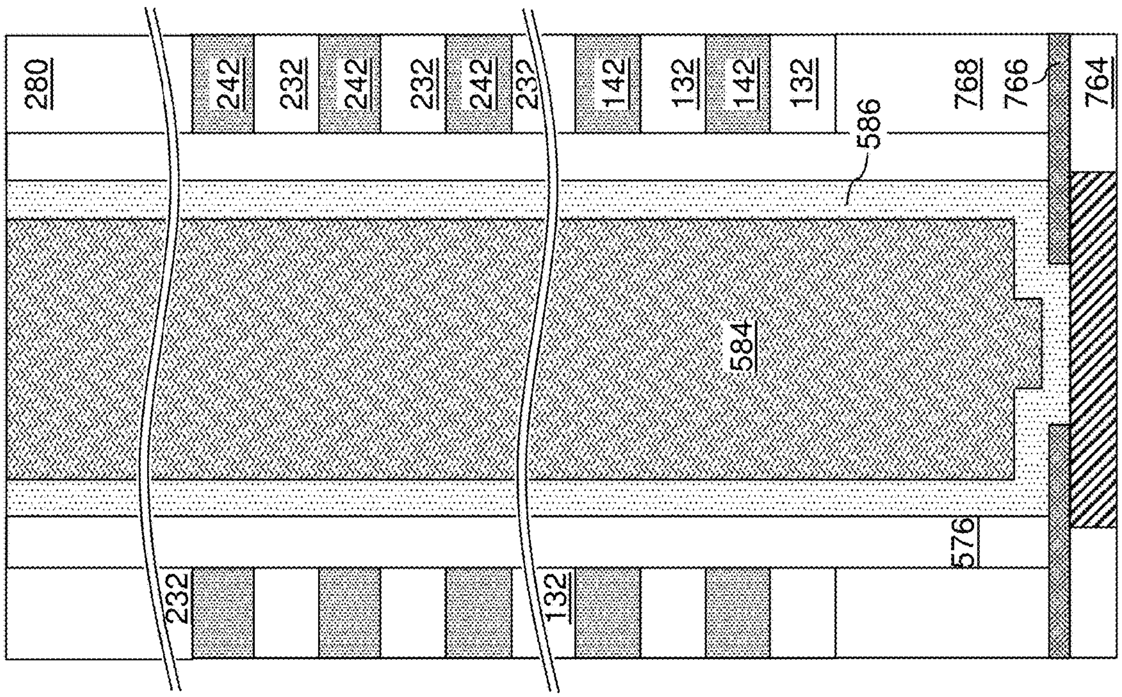
Figure 18B:
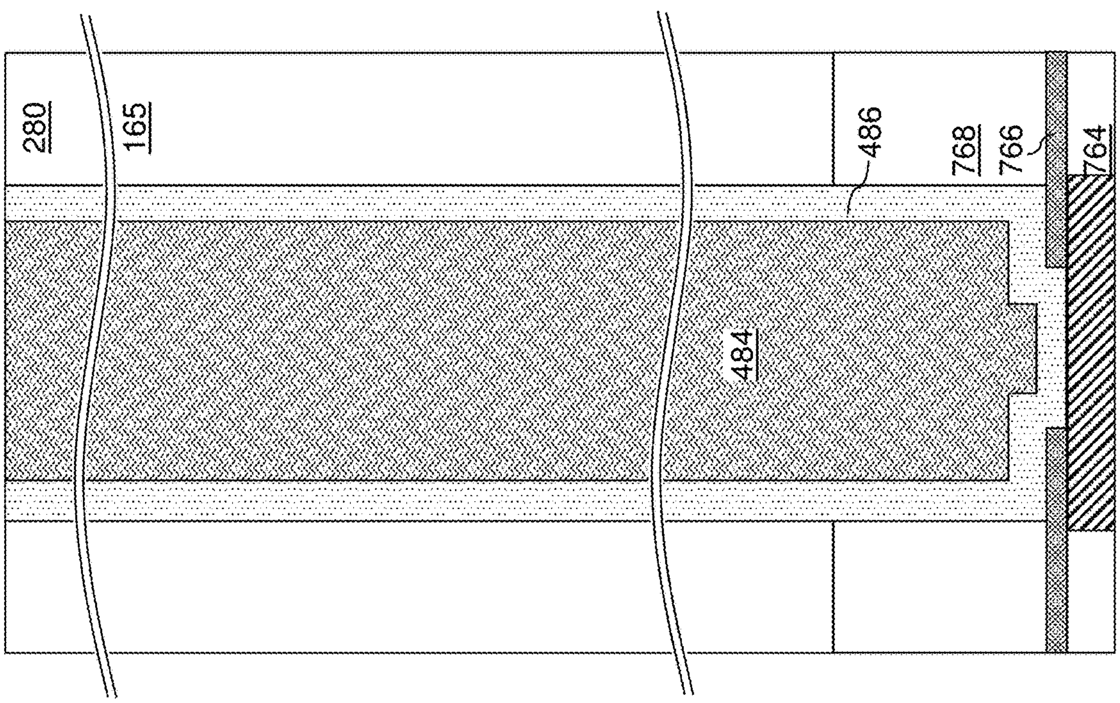
Figure 19:
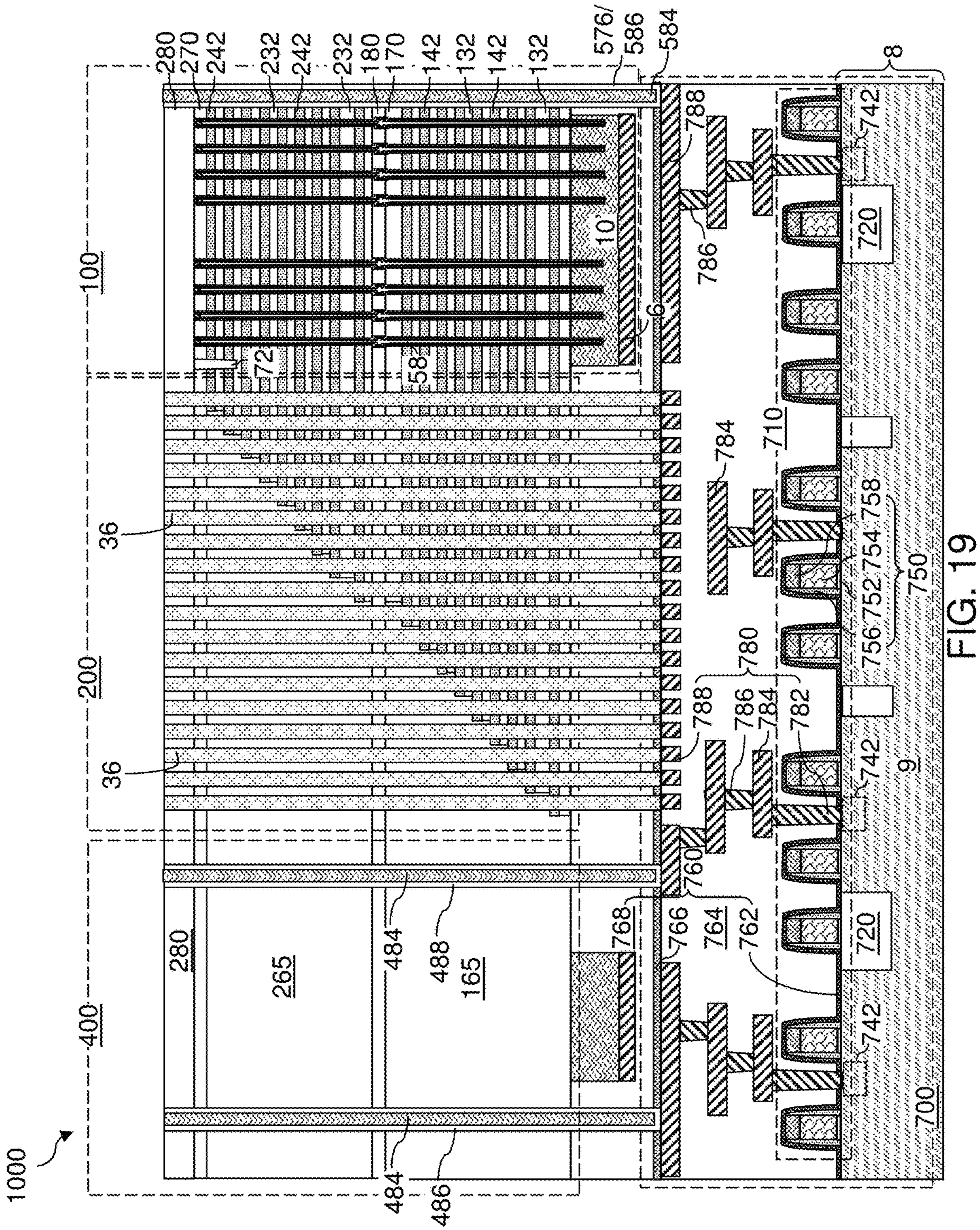
FIG. 19 is a vertical cross-sectional view of the first exemplary structure at the processing steps of FIGS. 18A, 18B, and 18C.

Referring to FIGS. 17A, 17B, and 17C, a conformal dielectric via liner 846L may be deposited at the periphery of the ribbed via cavities 183', the expanded peripheral region via cavities 483', and expanded array region via cavities 583' by a conformal deposition process. The conformal dielectric via liner 846L includes a dielectric material that is different from the material of the sacrificial material layers (142, 242). For example, the conformal dielectric via liner 846L may include silicon oxide or a dielectric metal oxide (such as aluminum oxide). In one embodiment, the conformal dielectric via liner 846L may include undoped silicate glass formed by thermal decomposition of tetraethylorthosilicate (TEOS). The thickness of the conformal dielectric via liner 846L may be greater than one half of the maximum thickness of the sacrificial material layers (142, 242). Portions 84F of the conformal dielectric via liner 846L deposited at peripheries of the ribbed via cavities 183' fill the annular recesses AR (i.e., the rib regions). A neck portion 84N of the conformal dielectric via liner 846L may be formed around each set of at least one annular portions of the conformal dielectric via liner 846L that fill the annular recess(es) of each ribbed via cavity 183'. An annular seam 84S may be present within each portion of the conformal dielectric via liner 846L that fills the annular recesses AR. The conformal dielectric via liner 846L may be formed directly on each physically exposed top surface of the lower-level metal interconnect structures 780 (such as the physically exposed top surfaces of the topmost lower-level metal line structures 788). An unfilled void 183" may be present within each ribbed via cavity 183' after deposition of the conformal dielectric via liner 846L. An unfilled void 483" may be present within each expanded peripheral region via cavity 483' after deposition of the conformal dielectric via liner 846L. An unfilled void 583" may be present within each expanded array region via cavity 583' after deposition of the conformal dielectric via liner 846L.

Referring to FIGS. 18A, 18B, 18C, and 19, a sacrificial via fill material may be deposited in each of the unfilled voids (183", 483", 583") in the staircase region via cavities, the peripheral region via cavities, and the array region via cavities by a conformal deposition process. Various sacrificial via fill material portions (16, 484, 584) may be formed in the unfilled voids (183", 483", 583") by deposition of the sacrificial via fill material and planarization of the sacrificial via fill material from above the top surface of the first contact level dielectric layer 280. The sacrificial via fill material is a material that may be removed selective to the material of the conformal dielectric via liner 846L. For example, the sacrificial via fill material may comprise a semiconductor material such as amorphous silicon or a dielectric material such as organosilicate glass. The sacrificial via fill material may be deposited by a non-conformal deposition process or a conformal deposition process. A void 16' may be present at a lower portion of each staircase region via cavity. Planarization of the sacrificial via fill material may be performed by a chemical mechanical planarization (CMP) process or by a recess etch process. Horizontal portions of the conformal dielectric via liner 846L may be removed from above the top surface of the first contact level dielectric layer 280 by the planarization process.

Each remaining portion of the sacrificial material filling the voids constitutes a sacrificial via fill material portion (16, 484, 584). The sacrificial via fill material portions (16, 484, 584) include staircase region sacrificial via fill material portions 16 formed in the staircase region via cavities, peripheral region sacrificial via fill material portions 484 formed in the peripheral region via cavities, and array region sacrificial via fill material portions 584 formed in the array region via cavities. Each remaining portion of the conformal dielectric via liner 486L in the various via cavities constitute a conformal insulating liner (84, 486, 586). The conformal insulating liners (84, 486, 586) include staircase region conformal dielectric via liners 84, peripheral region conformal insulating liners 486, and array region conformal insulating liners 586. Each staircase region conformal dielectric via liner 84 may include neck portion 84N that vertically extends through a respective subset of the layers in the alternating stacks (132, 142, 232, 242), an upper cylindrical portion 84U extending through the first contact level dielectric layer 280 and the second retro-stepped dielectric material portion 265 and optionally through the first retro-stepped dielectric material portion 165, a lower cylindrical portion 84L that extends through the bottommost first insulating layer 132 and the at least one second dielectric material layer 768, and a bottom portion that contacts a respective topmost lower-level metal line structure 788 and an annular surface of the silicon nitride layer 766. Each adjoining set of a staircase region conformal dielectric via liner 84 and a staircase region sacrificial via fill material portion 16 constitutes a staircase region sacrificial via structure 36.

Figure 20A:
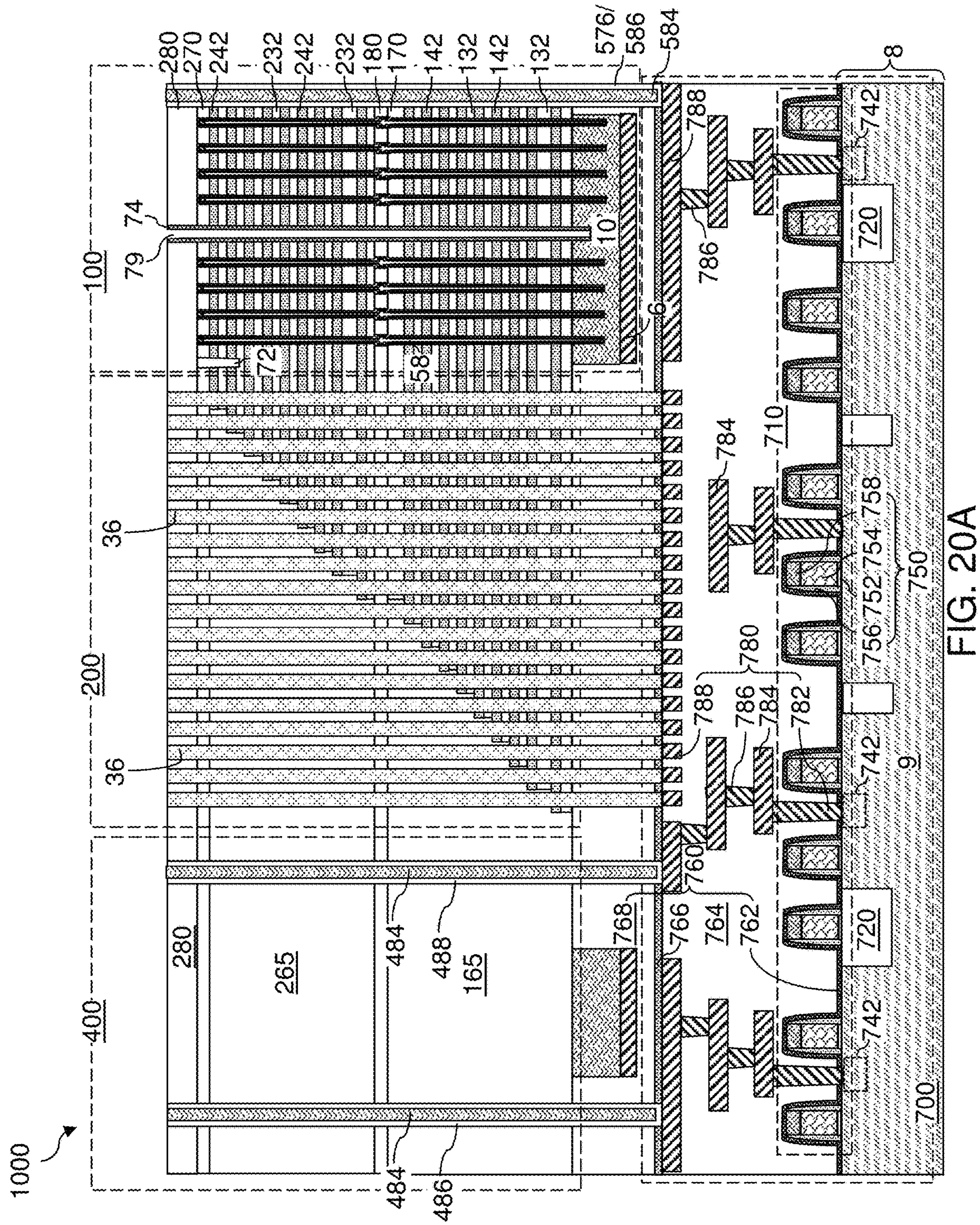
FIG. 20A is a vertical cross-sectional view of the first exemplary structure after formation of backside trenches according to the first embodiment of the present disclosure.
Figure 20B:
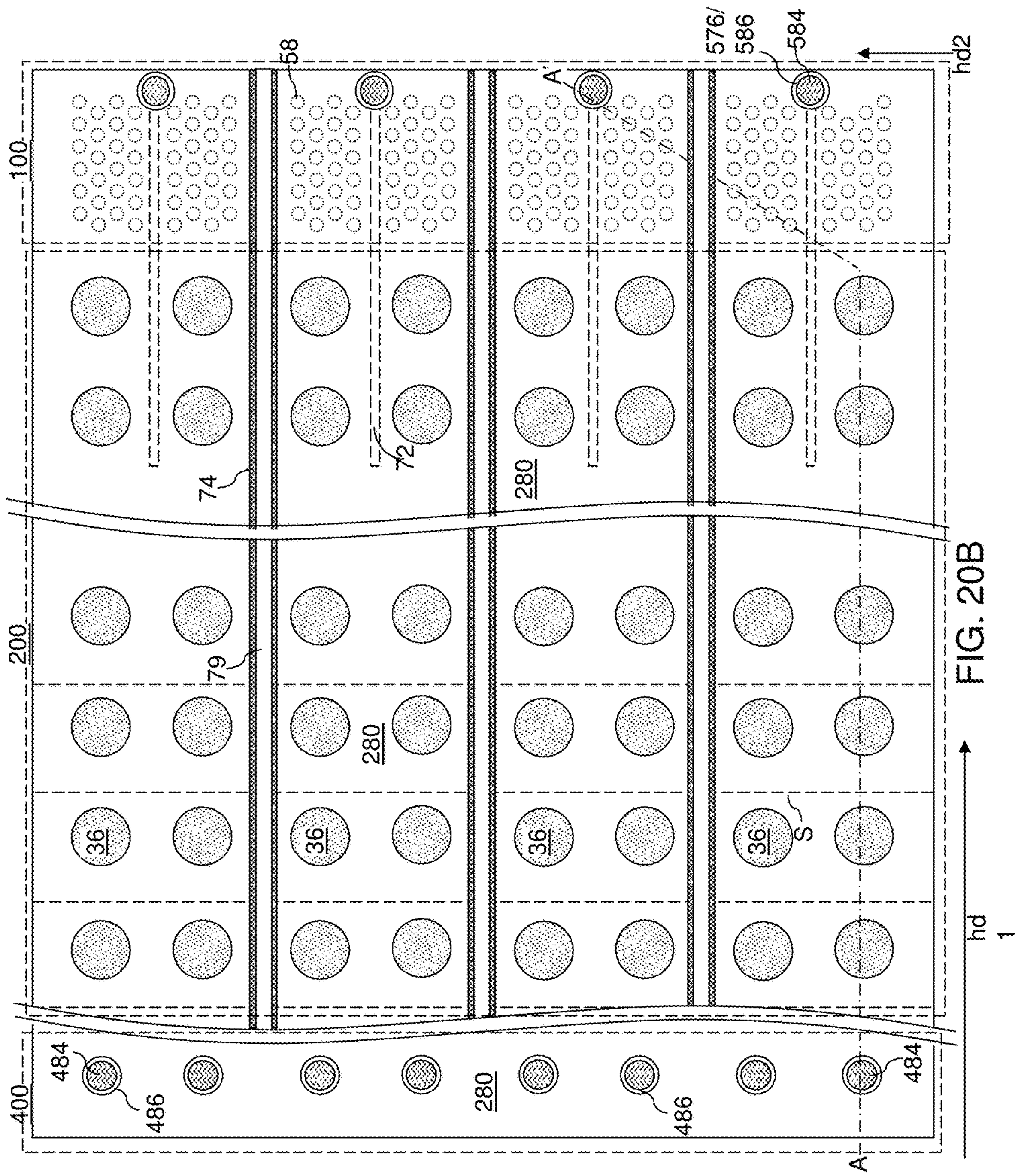
FIG. 20B is a top-down view of the first exemplary structure of FIG. 20A. The hinged vertical plane A-A' corresponds to the plane of the vertical cross-sectional view of FIG. 20A.
Figure 21A:
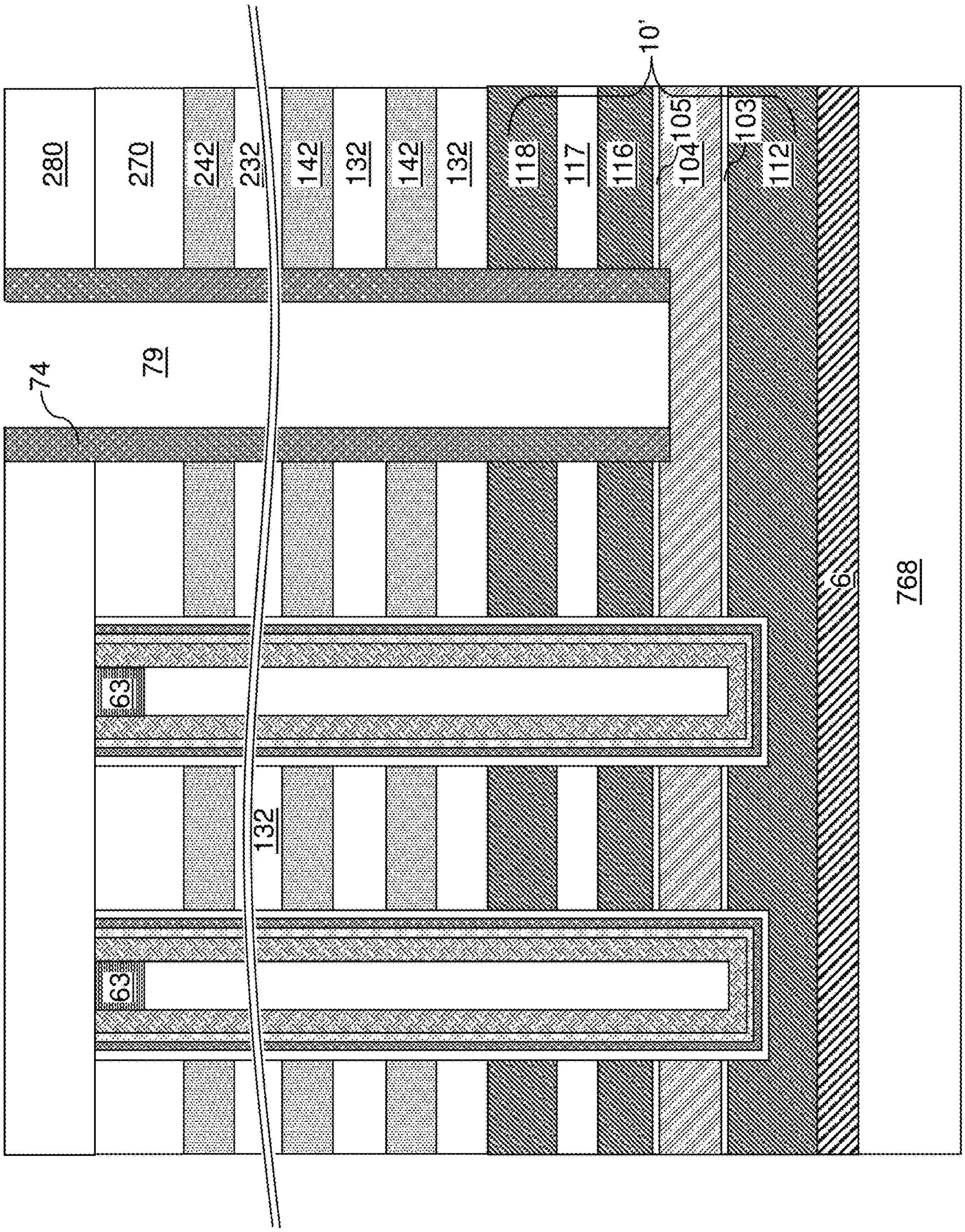
FIGS. 21A-21E are sequential vertical cross-sectional views of a region of the first exemplary structure during formation of source-level material layers by replacement of various material portions within the in-process source-level material layers of FIG. 1B with a middle buried semiconductor layer according to the first embodiment of the present disclosure.

Referring to FIGS. 20A, 20B, and 21A, backside trenches 79 are subsequently formed through the first contact level dielectric layer 280 and the memory-level assembly. For example, a photoresist layer may be applied and lithographically patterned over the first contact level dielectric layer 280 to form elongated openings that extend along the first (e.g., word line) horizontal direction hd1. An anisotropic etch is performed to transfer the pattern in the patterned photoresist layer through a predominant portion of the memory-level assembly to the in-process source-level material layers 10'. For example, the backside trenches 79 may extend through the optional source-select-level conductive layer 118, the source-level insulating layer 117, the upper source layer 116, and the upper sacrificial liner 105 and into the source-level sacrificial layer 104. The optional source-select-level conductive layer 118 and the source-level sacrificial layer 104 may be used as etch stop layers for the anisotropic etch process that forms the backside trenches 79. The photoresist layer may be subsequently removed, for example, by ashing.

The backside trenches 79 extend along the first horizontal direction hd1, and thus, are elongated along the first horizontal direction hd1. The backside trenches 79 may be laterally spaced from one another along a second horizontal direction hd2, which may be perpendicular to the first horizontal direction hd1. The backside trenches 79 may extend through the memory array region 100 (which may extend over a memory plane) and the staircase region 200. The backside trenches 79 may laterally divide the memory-level assembly into memory blocks.

Backside trench spacers 74 may be formed on sidewalls of the backside trenches 79 by conformal deposition of a dielectric spacer material and an anisotropic etch of the dielectric spacer material. The dielectric spacer material is a material that may be removed selective to the materials of first and second insulating layers (132, 232). For example, the dielectric spacer material may include silicon nitride. The lateral thickness of the backside trench spacers 74 may be in a range from 4 nm to 60 nm, such as from 8 nm to 30 nm, although lesser and greater thicknesses may also be used.

Figure 21B:
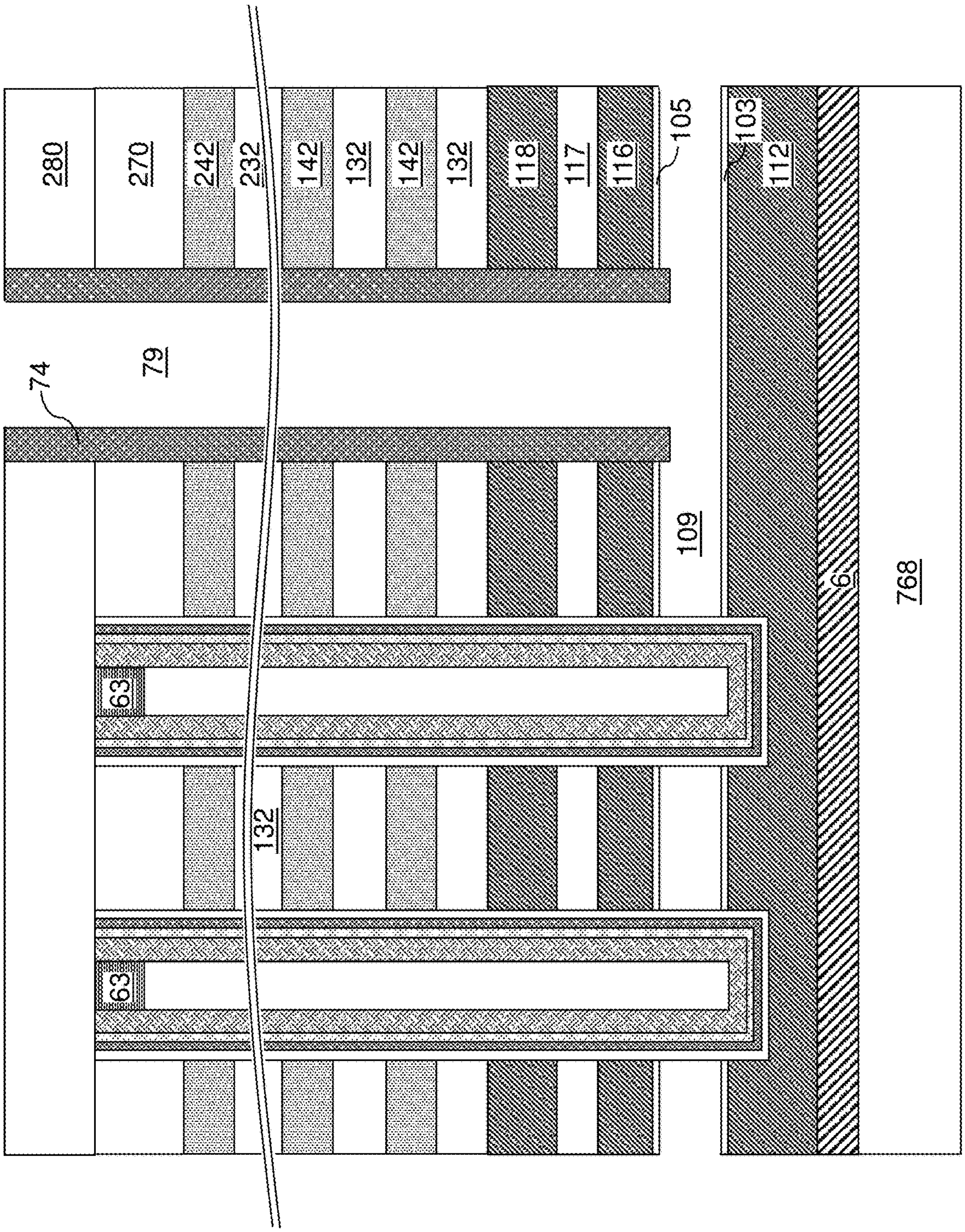

Referring to FIG. 21B, an etchant that etches the material of the source-level sacrificial layer 104 selective to the materials of the backside trench spacers 74, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 74 include silicon nitride, and the upper and lower sacrificial liners (105, 103) include silicon oxide, a wet etch process using hot trimethyl-2 hydroxyethyl ammonium hydroxide ("hot TMY") may be used to remove the source-level sacrificial layer 104 selective to the backside trench spacers 74 and the upper and lower sacrificial liners (105, 103). A source cavity 109 is formed in the volume from which the source-level sacrificial layer 104 is removed.

Figure 21C:
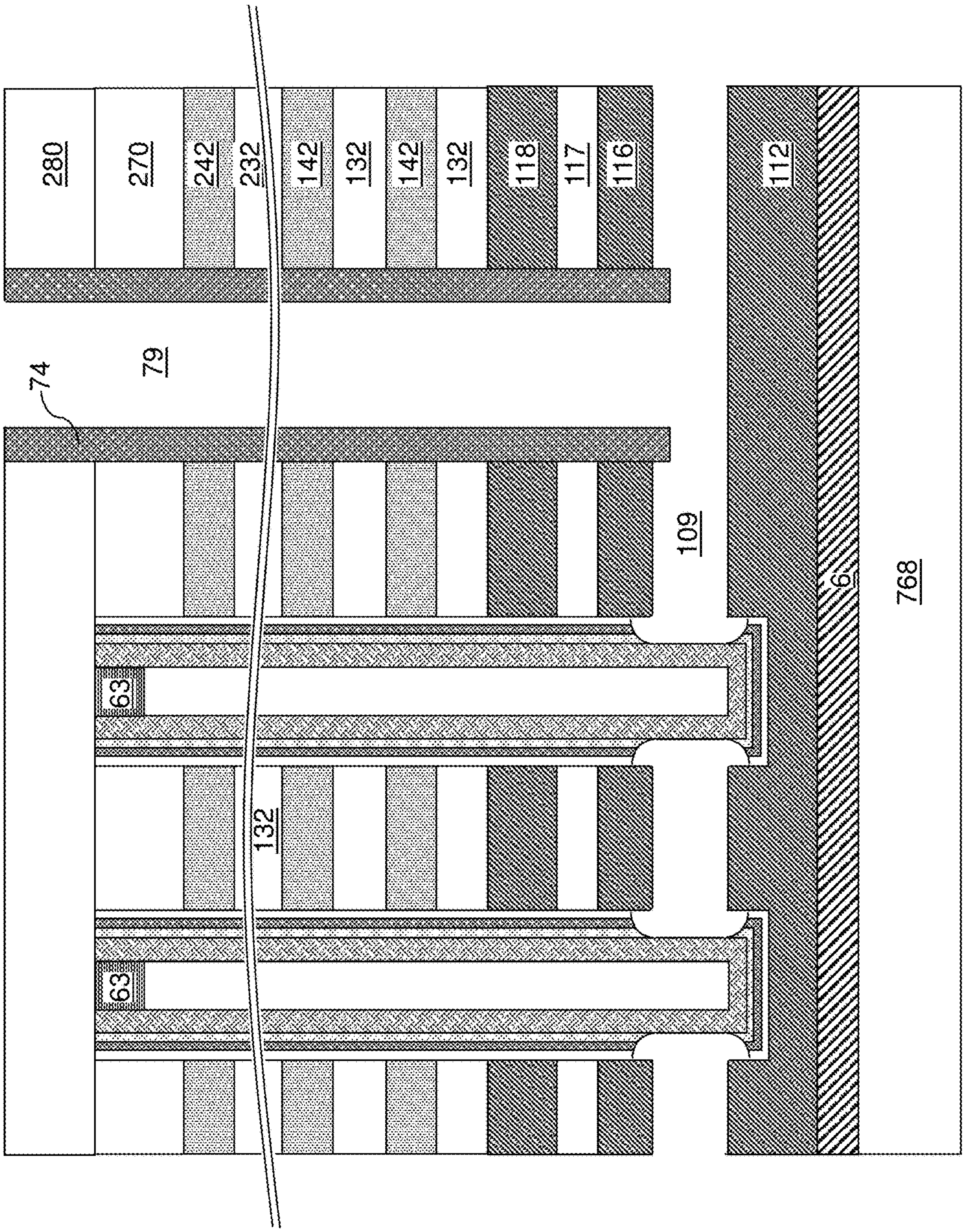

Referring to FIG. 21C, a sequence of isotropic etchants, such as wet etchants, may be applied through the backside trenches 79 and the source cavity 109 to the physically exposed portions of the memory films 50 in the source cavity 109 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source layer 112 and a bottom surface of the upper source layer 116 may be physically exposed to the source cavity 109.

Figure 21D:
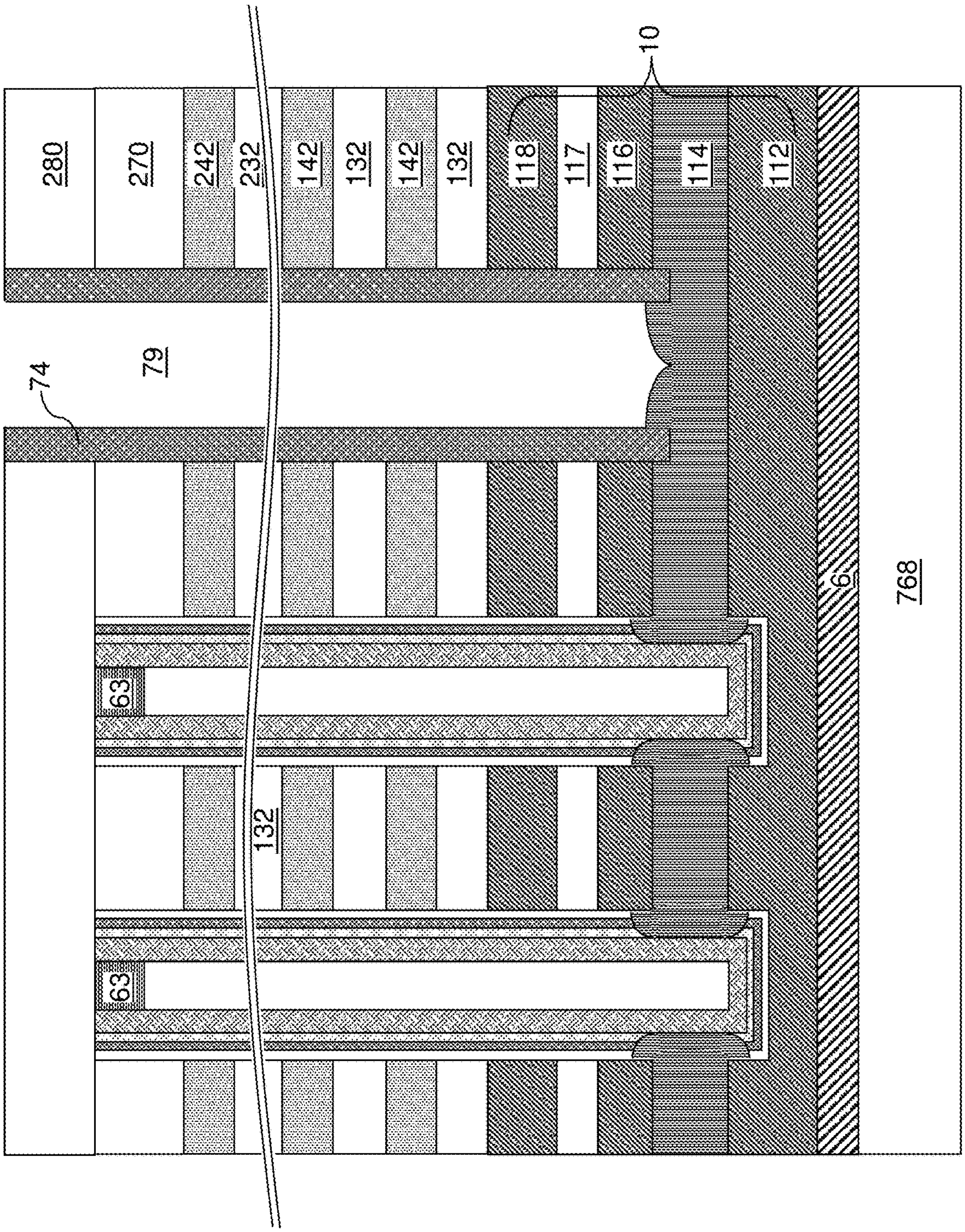

Referring to FIG. 21D, a doped semiconductor material having a doping of the second conductivity type may be deposited by a selective semiconductor deposition process. A semiconductor precursor gas, an etchant, and a dopant precursor gas may be flowed concurrently into a process chamber including the first exemplary structure during the selective semiconductor deposition process. For example, if the second conductivity type is n-type, a semiconductor precursor gas such as silane, disilane, or dichlorosilane, an etchant gas such as hydrogen chloride, and a dopant precursor gas such as phosphine, arsine, or stibine may be flowed. The deposited doped semiconductor material forms a source contact layer 114, which may contact sidewalls of the vertical semiconductor channels 60. The duration of the selective semiconductor deposition process may be selected such that the source cavity is filled with the source contact layer 114, and the source contact layer 114 contacts the exposed portions of the vertical semiconductor channel 60 and bottom end portions of inner sidewalls of the backside trench spacers 74. In one embodiment, the doped semiconductor material may include doped polysilicon.

The layer stack including the lower source layer 112, the source contact layer 114, and the upper source layer 116 constitutes a buried source layer (112, 114, 116), which functions as a common source region that is connected each of the vertical semiconductor channels 60 and has a doping of the second conductivity type. The average dopant concentration in the buried source layer (112, 114, 116) may be in a range from $5.0\times10^{19}/cm^3$ to $2.0\times10^{21}/cm^3$, although lesser and greater dopant concentrations may also be used. The set of layers including the buried source layer (112, 114, 116), the source-level insulating layer 117, and the optional source-select-level conductive layer 118 constitutes source-level material layers 10, which replaces the in-process source-level material layers 10'.

Figure 21E:
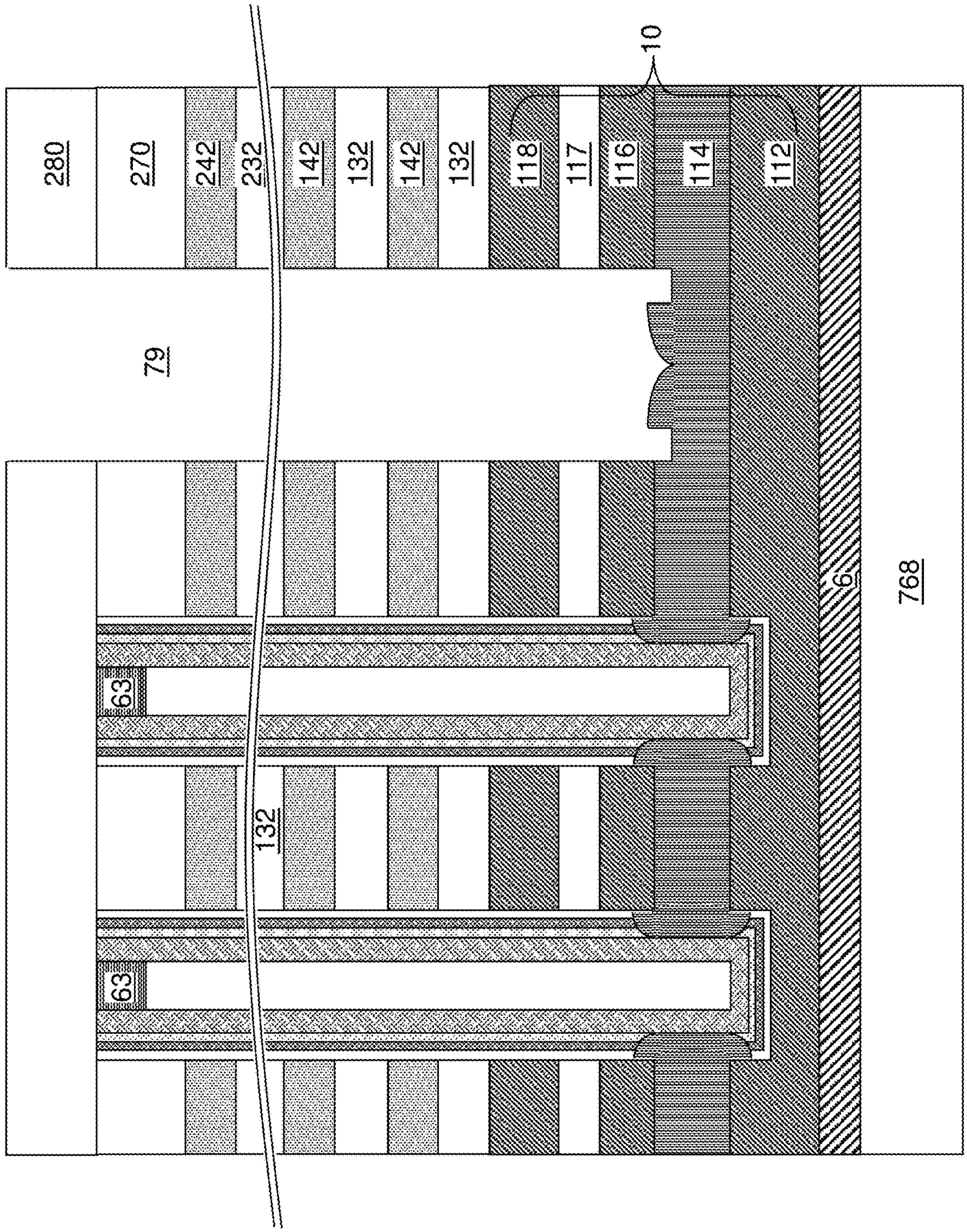
Figure 22:
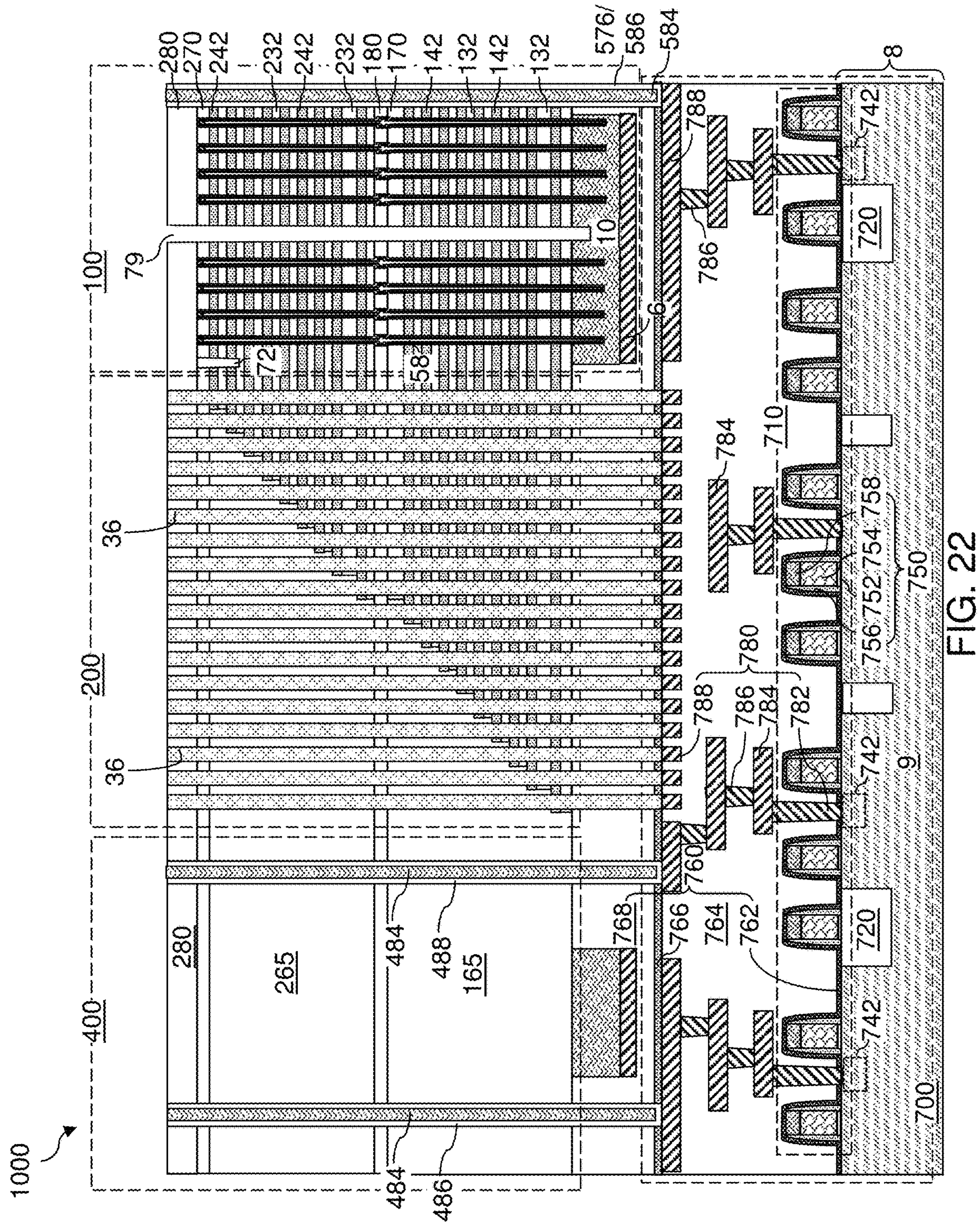
FIG. 22 is a vertical cross-sectional view of the first exemplary structure at the processing steps of FIG. 21E.

Referring to FIGS. 21E and 22, an isotropic etch process may be performed to remove the backside trench spacers 74. In an illustrative example, if the backside trench spacers 74 include silicon nitride, a wet etch using hot phosphoric acid may be used to remove the backside trench spacers selective to the materials of the source contact layer 114, the insulating layers (132, 232), the first and second insulating cap layer (170, 270), and the first contact level dielectric layer 280.

Figure 23:
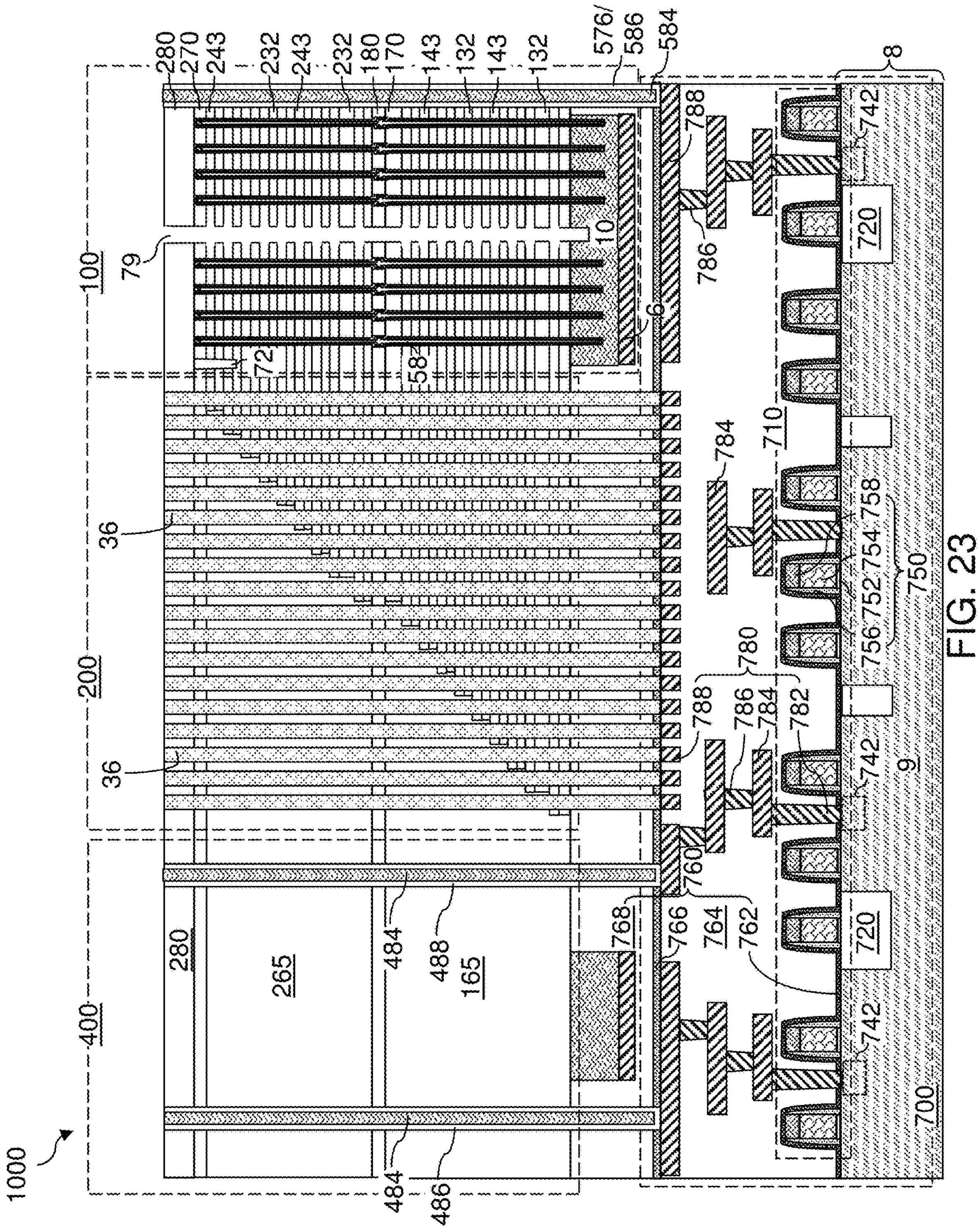
FIG. 23 is a vertical cross-sectional view of the first exemplary structure after formation of backside recesses according to the first embodiment of the present disclosure.

Referring to FIG. 23, an etchant that selectively etches the materials of the first and second sacrificial material layers (142, 242) with respect to the materials of the first and second insulating layers (132, 232), the first and second insulating cap layers (170, 270), the material of the conformal insulating liners (84, 486, 586), the material of the outermost layer of the memory films 50, and materials of the sacrificial via fill material portions (16, 484, 584) may be introduced into the backside trenches 79, for example, using an isotropic etch process. For example, the first and second sacrificial material layers (142, 242) may include silicon nitride, the materials of the first and second insulating layers (132, 232), the first and second insulating cap layers (170, 270), the material of the conformal insulating liners (84, 486, 586), and the material of the outermost layer of the memory films 50 may include silicon oxide materials, and the materials of the sacrificial via fill material portions (16, 484, 584) may include doped polysilicon, a doped silicon-containing alloy material, or a doped silicate glass or an organosilicate glass having a greater etch rate than the silicon oxide materials of the first and second insulating layers (132, 232), the first and second insulating cap layers (170, 270), the material of the conformal insulating liners (84, 486, 586). First backside recesses 143 are formed in volumes from which the first sacrificial material layers 142 are removed. Second backside recesses 243 are formed in volumes from which the second sacrificial material layers 242 are removed.

The isotropic etch process may be a wet etch process using a wet etch solution, or may be a gas phase (dry) etch process in which the etchant is introduced in a vapor phase into the backside trench 79. For example, if the first and second sacrificial material layers (142, 242) include silicon nitride, the etch process may be a wet etch process in which the first exemplary structure is immersed within a wet etch tank including phosphoric acid, which etches silicon nitride selective to silicon oxide, silicon, and various other materials used in the art. In case the sacrificial material layers (142, 242) comprise a semiconductor material, a wet etch process (which may us a wet etchant such as a KOH solution) or a dry etch process (which may include gas phase HCl) may be used.

Each of the first and second backside recesses (143, 243) may be a laterally extending cavity having a lateral dimension that is greater than the vertical extent of the cavity. In other words, the lateral dimension of each of the first and second backside recesses (143, 243) may be greater than the height of the respective backside recess (143, 243). A plurality of first backside recesses 143 may be formed in the volumes from which the material of the first sacrificial material layers 142 is removed. A plurality of second backside recesses 243 may be formed in the volumes from which the material of the second sacrificial material layers 242 is removed. Each of the first and second backside recesses (143, 243) may extend substantially parallel to the top surface of the substrate 8. A backside recess (143, 243) may be vertically bounded by a top surface of an underlying insulating layer (132 or 232) and a bottom surface of an overlying insulating layer (132 or 232). In one embodiment, each of the first and second backside recesses (243, 243) may have a uniform height throughout.

Figure 24:
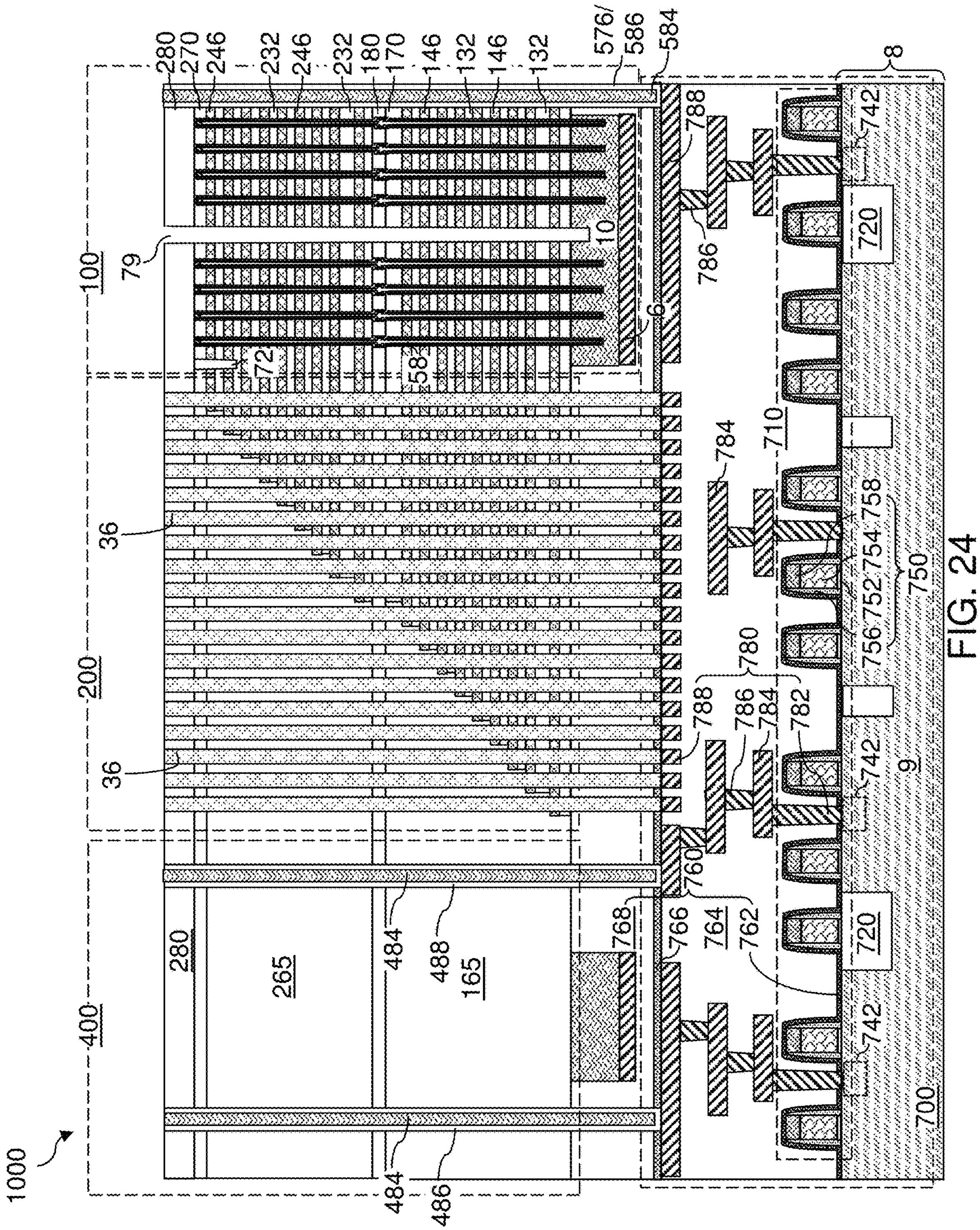
FIG. 24 is a vertical cross-sectional view of the first exemplary structure after formation of electrically conductive layers in the backside recesses according to the first embodiment of the present disclosure.

Referring to FIG. 24, a backside blocking dielectric layer (not shown) may be optionally deposited in the backside recesses and the backside trenches 79 and over the first contact level dielectric layer 280. The backside blocking dielectric layer may be deposited on the physically exposed portions of the outer surfaces of the memory stack structures 55, which are portions of the memory opening fill structures 58. The backside blocking dielectric layer includes a dielectric material such as a dielectric metal oxide, silicon oxide, or a combination thereof. If used, the backside blocking dielectric layer may be formed by a conformal deposition process such as atomic layer deposition or chemical vapor deposition. The thickness of the backside blocking dielectric layer may be in a range from 1 nm to 60 nm, although lesser and greater thicknesses may also be used.

At least one conductive material may be deposited in the plurality of backside recesses (243, 243), on the sidewalls of the backside trench 79, and over the first contact level dielectric layer 280. The at least one conductive material may include at least one metallic material, i.e., an electrically conductive material that includes at least one metallic element.

A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact level dielectric layer 280. Thus, the first and second sacrificial material layers (142, 242) may be replaced with the first and second conductive material layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

The metallic material may be deposited by a conformal deposition method, which may be, for example, chemical vapor deposition (CVD), atomic layer deposition (ALD), electroless plating, electroplating, or a combination thereof. The metallic material may be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that may be deposited in the backside recesses include tungsten, tungsten nitride, titanium, titanium nitride, tantalum, tantalum nitride, cobalt, and ruthenium. In one embodiment, the metallic material may comprise a metal such as tungsten and/or metal nitride. In one embodiment, the metallic material for filling the backside recesses may be a combination of titanium nitride layer and a tungsten fill material. In one embodiment, the metallic material may be deposited by chemical vapor deposition or atomic layer deposition.

Residual conductive material may be removed from inside the backside trenches 79. Specifically, the deposited metallic material of the continuous metallic material layer may be etched back from the sidewalls of each backside trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) may be a conductive line structure.

A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Referring to FIGS. 25A-25E, an insulating material may be deposited in the backside trenches 79 by a conformal deposition process. Excess portions of the insulating material deposited over the top surface of the first contact level dielectric layer 280 may be removed by a planarization process such as a recess etch or a chemical mechanical planarization (CMP) process. Each remaining portion of the insulating material in the backside trenches 79 constitutes a dielectric wall structure 76. The dielectric wall structures 76 include an insulating material such as silicon oxide, silicon nitride, and/or a dielectric metal oxide. Each dielectric wall structure 76 may vertically extend through first alternating stacks (132, 146) of first insulating layers 132 and first electrically conductive layers 146 and second alternating stacks (232, 246) of second insulating layers 232 and second electrically conductive layers 246, and laterally extends along the first horizontal direction hd1 and are laterally spaced apart from one another along the second horizontal direction hd2. Backside blocking dielectric layers 44 are explicitly illustrated in FIGS. 25C-25E.

Figure 26:
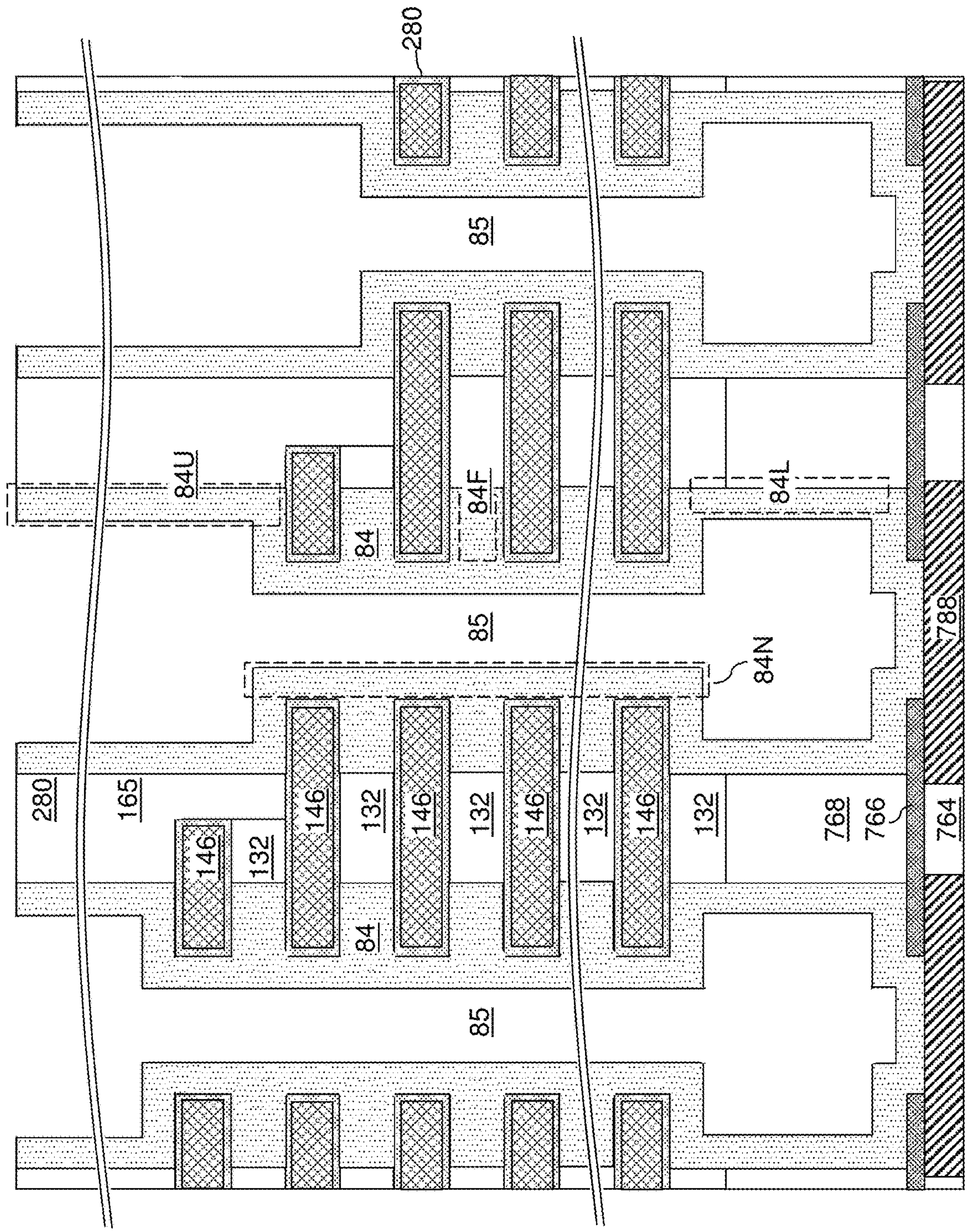
FIG. 26 is a magnified vertical cross-sectional view of a staircase region via cavity after removal of sacrificial via fill material portions according to the first embodiment of the present disclosure.

Referring to FIG. 26, the sacrificial materials of the sacrificial via fill material portions (16, 484, 584) may be removed selective to the material of the conformal insulating liners (84, 486, 586) and the first contact level dielectric layer 280. For example, if the sacrificial via fill material portions (16, 484, 584) include a doped semiconductor material such a doped amorphous silicon or polysilicon, a wet etch using a KOH or TMY solution may be used to remove the sacrificial via fill material portions (16, 484, 584). If the sacrificial via fill material portions (16, 484, 584) include organosilicate glass or a doped silicate glass such as borosilicate glass, the sacrificial via fill material portions (16, 484, 584) may be removed by a wet etch process using a dilute hydrofluoric acid. Each staircase via cavity may include a staircase region conformal dielectric via liner 84 and a column-shaped void 85 including a shaft-shaped void region extending through a subset of layers of the alternating stacks (132, 246, 232, 246), a capital-shaped void region overlying the shaft-shaped void region, and a base-shaped void region underlying the shaft-shaped void region.

As used herein, a "column-shaped" element refers to an element that has a general shape of a Doric column, i.e., an element that has a shaft portion that extends with a straight sidewall or a tapered sidewall, a capital (i.e., cap) portion having a greater lateral dimension than the shaft portion and overlying the shaft portion, and a base portion having a greater lateral dimension than the shaft portion and underlying the shaft portion. Each staircase region conformal dielectric via liner 84 may include neck portion 84N that surrounds the shaft portion and vertically extends through a respective subset of the layers in the alternating stacks (132, 142, 232, 242), an upper cylindrical portion 84U that surrounds the capital portion and extends through the first contact level dielectric layer 280 and the second retro-stepped dielectric material portion 265 and optionally through the first retro-stepped dielectric material portion 165, a lower cylindrical portion 84L that surrounds the base portion and extends through the bottommost first insulating layer 132 and the at least one second dielectric material layer 768, and a bottom portion that contacts a respective topmost lower-level metal line structure 788 and an annular surface of the silicon nitride layer 766.

Figure 27A:
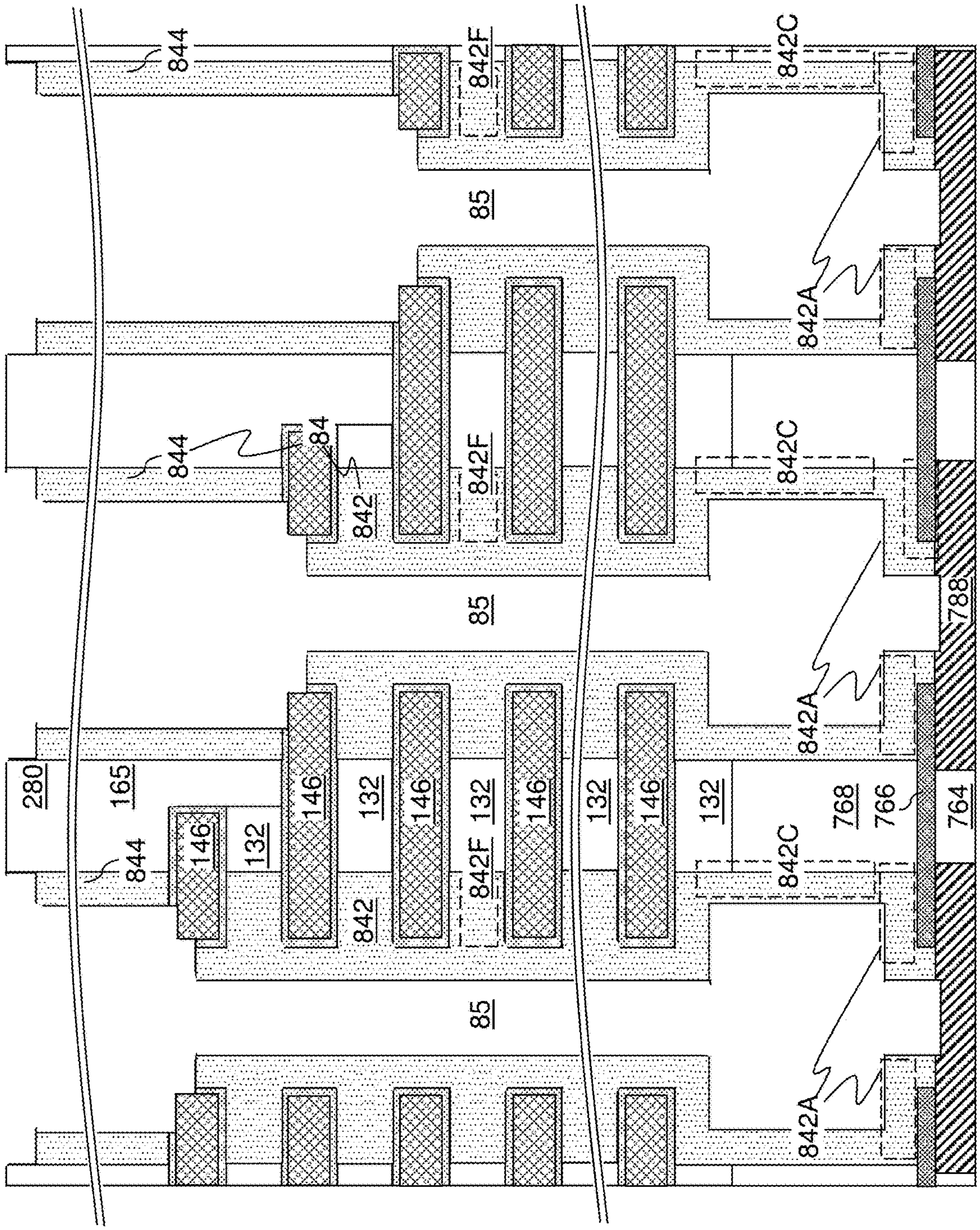
FIGS. 27A, 27B, and 27C are magnified vertical cross-sectional views of a staircase region via cavity, a peripheral region via cavity, and an array region via cavity, respectively, after an anisotropic etch process that physically exposes annular surfaces of the electrically conductive layers and surfaces of underlying lower-level metal interconnect structures according to the first embodiment of the present disclosure.
Figure 27C:
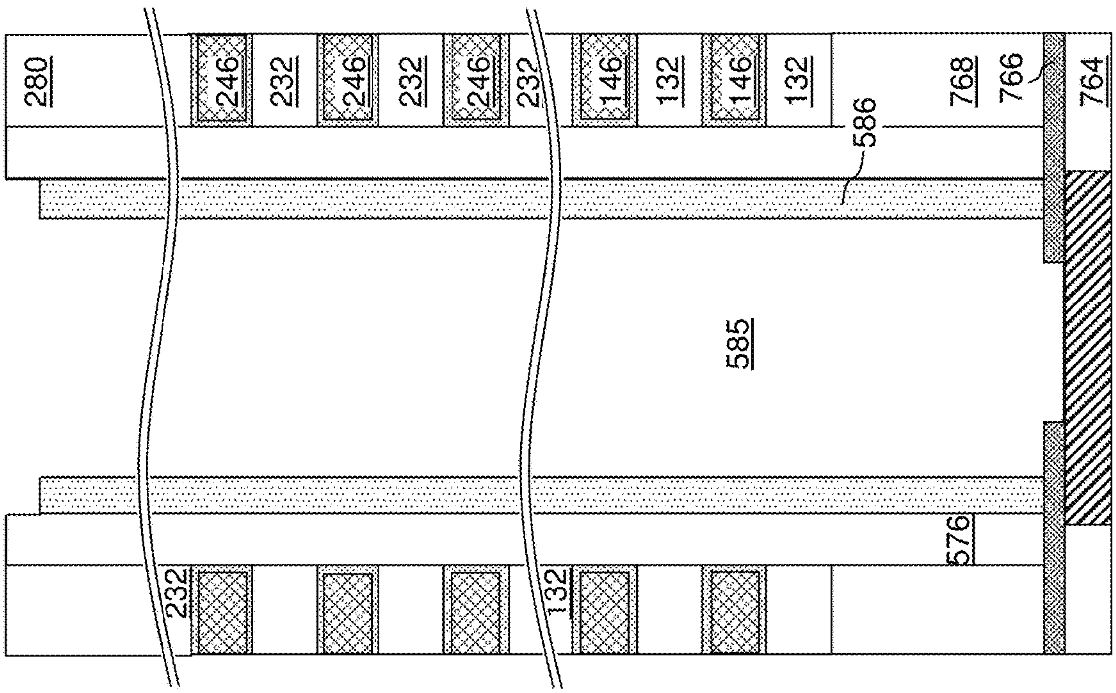
Figure 27B:
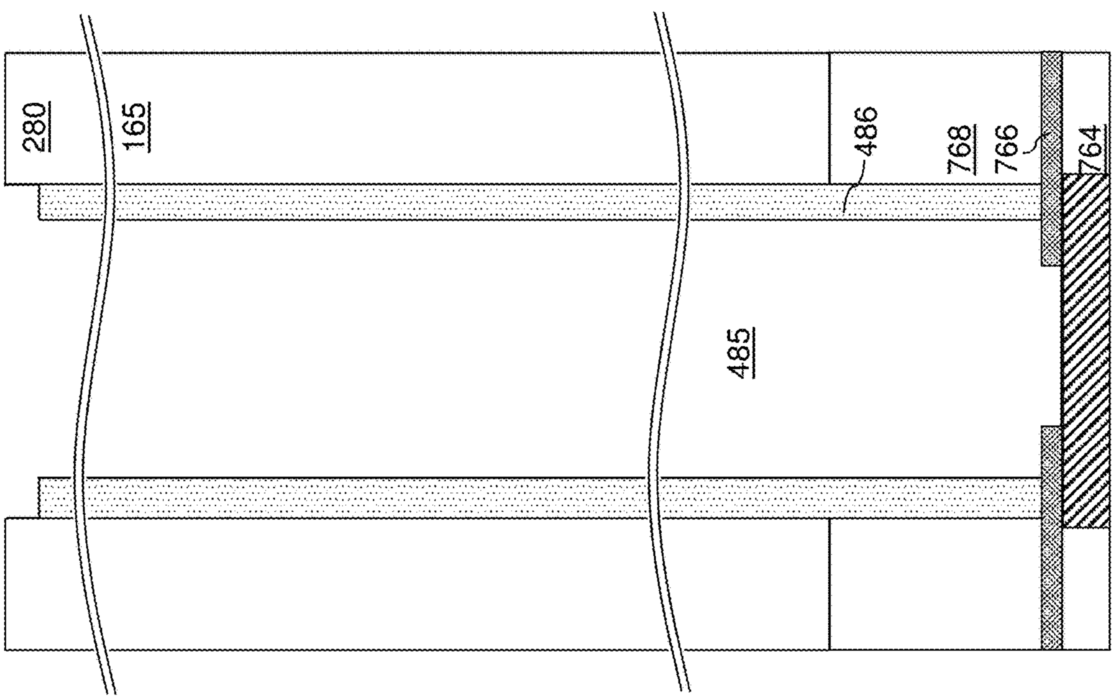
Figure 28A:
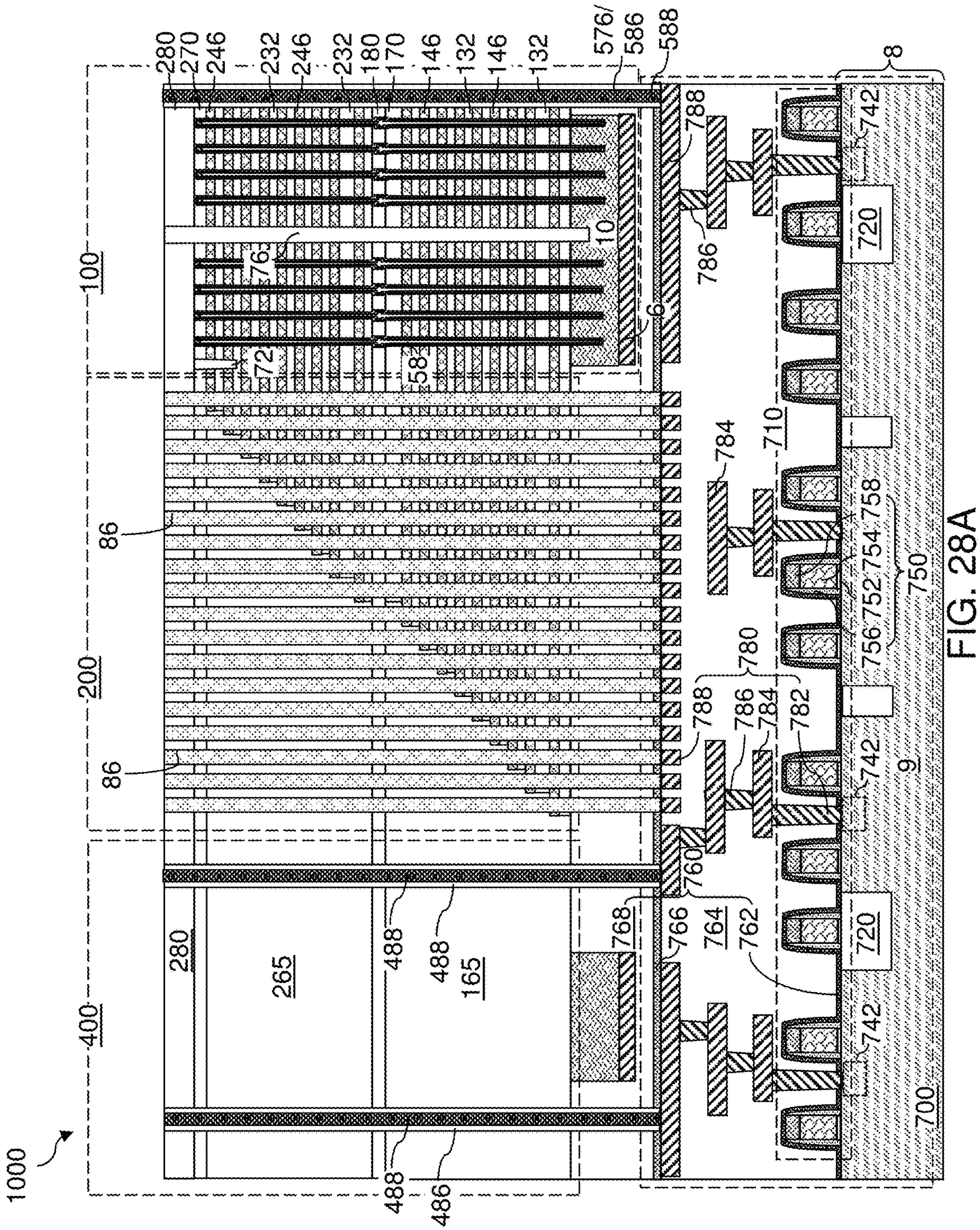
FIG. 28A is a vertical cross-sectional view of the first exemplary structure after formation of various contact via structures in the various via cavities according to the first embodiment of the present disclosure.
Figure 28B:
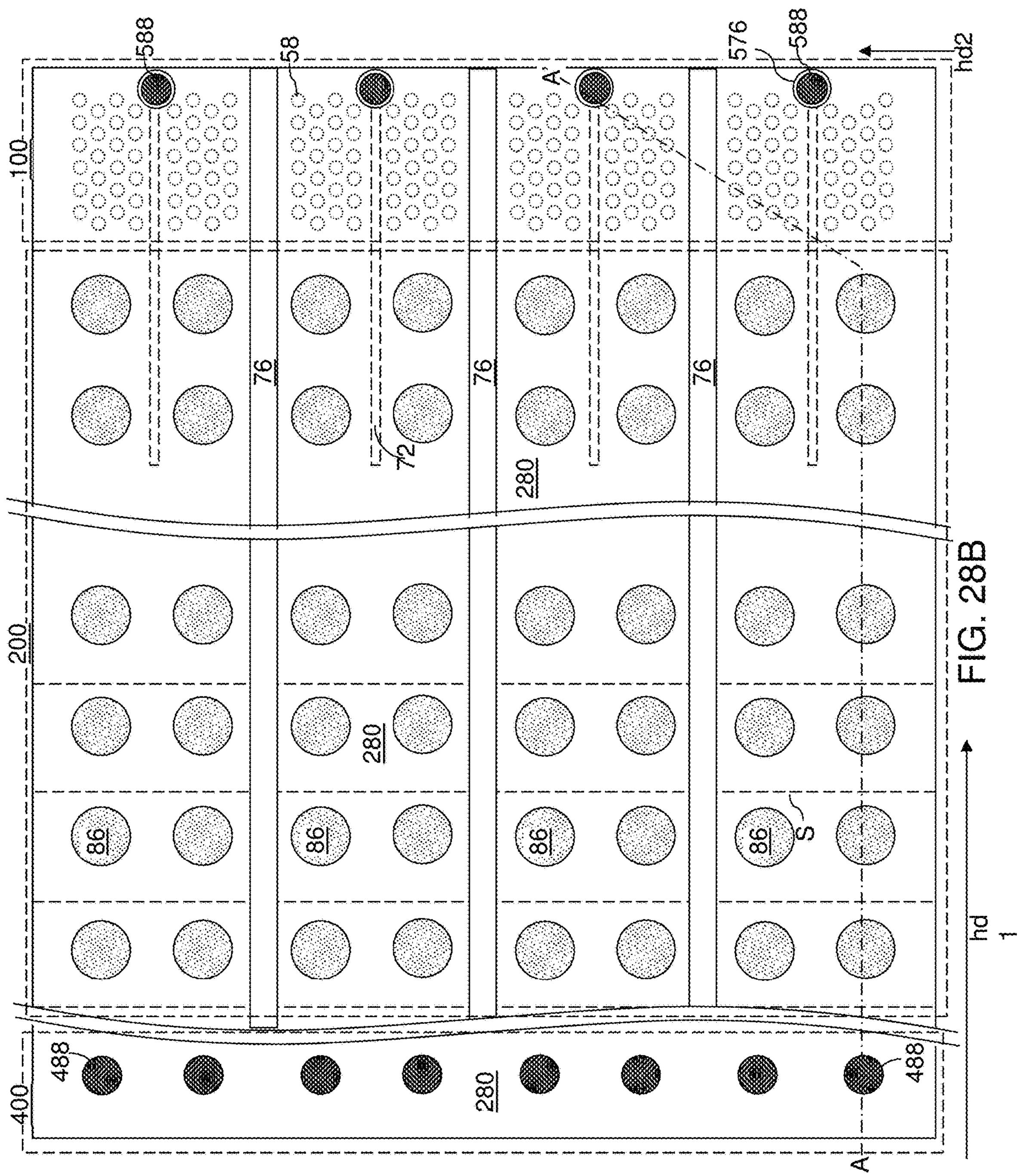
FIG. 28B is a top-down view of the first exemplary structure of FIG. 28A. The hinged vertical plane A-A' corresponds to the plane of the vertical cross-sectional view of FIG. 28A.
Figure 28C:
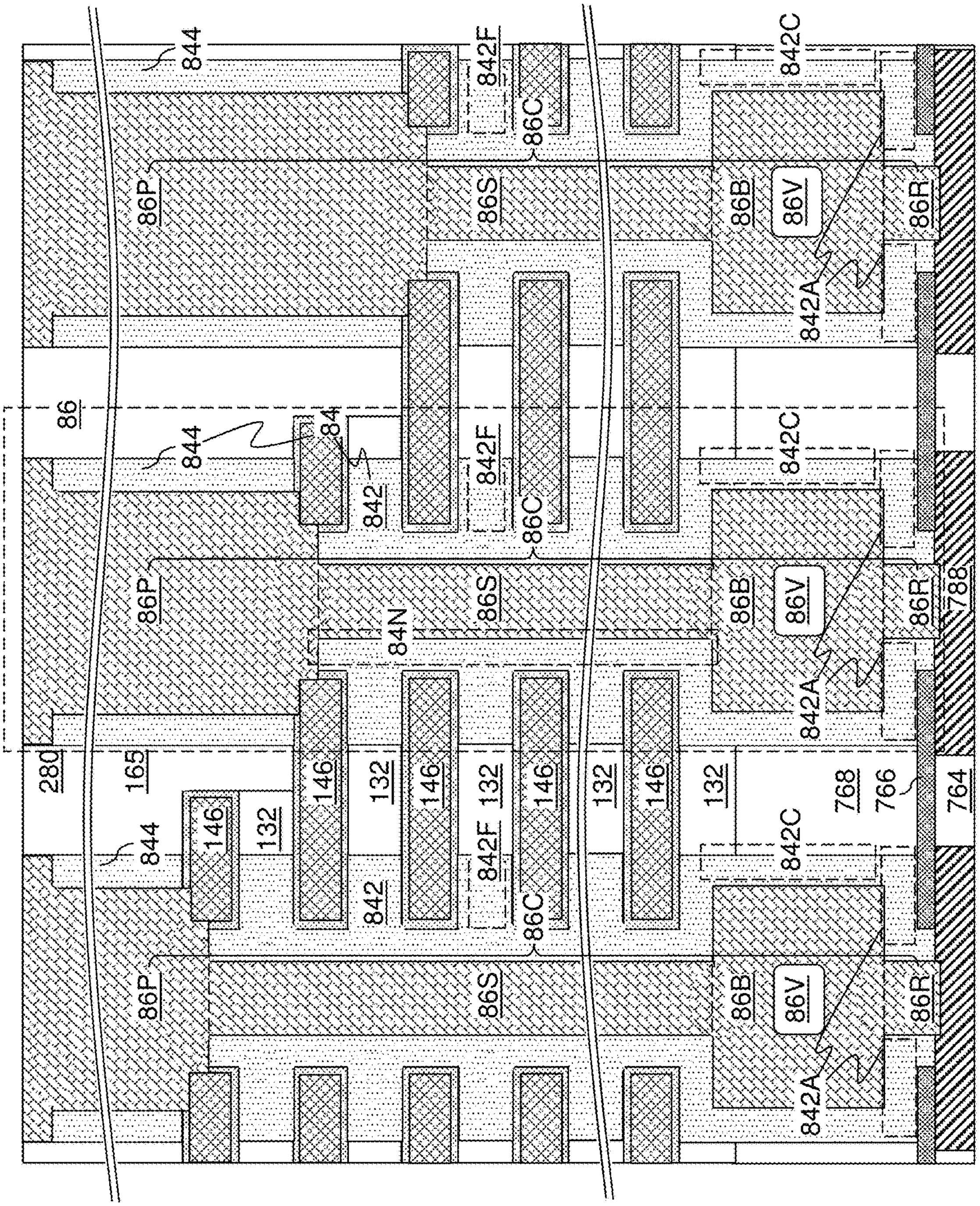
FIGS. 28C, 28D, and 28E are magnified vertical cross-sectional views of a staircase region via cavity, a peripheral region via cavity, and an array region via cavity, respectively, at the processing steps of FIGS. 28A and 28B.
Figure 28E:
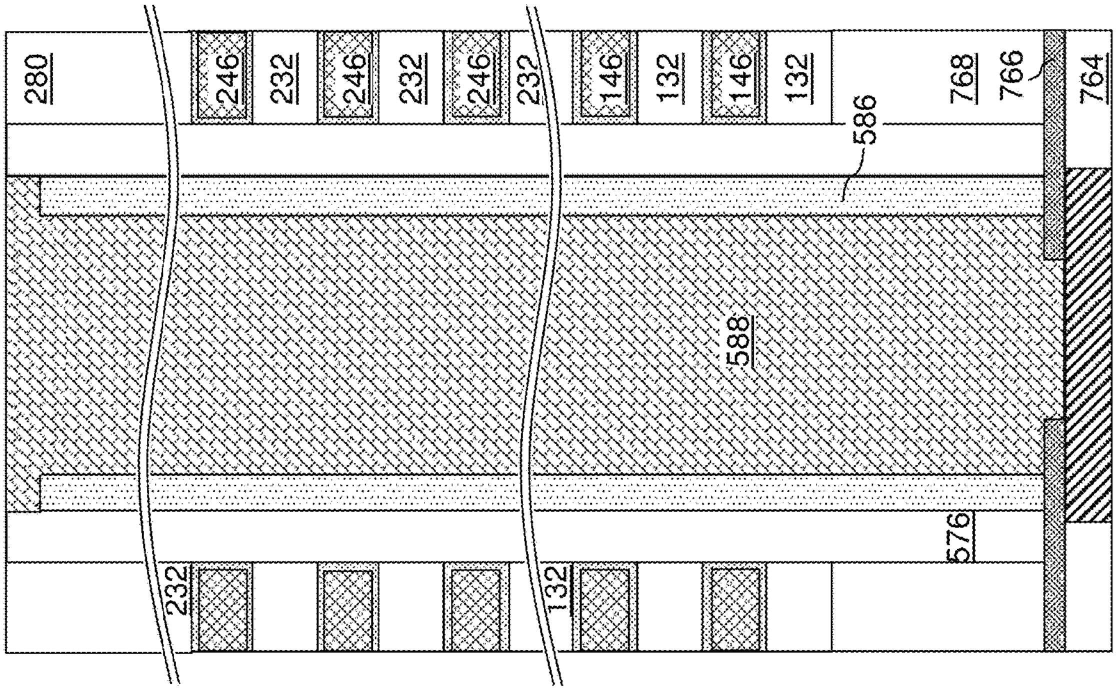
Figure 28D:
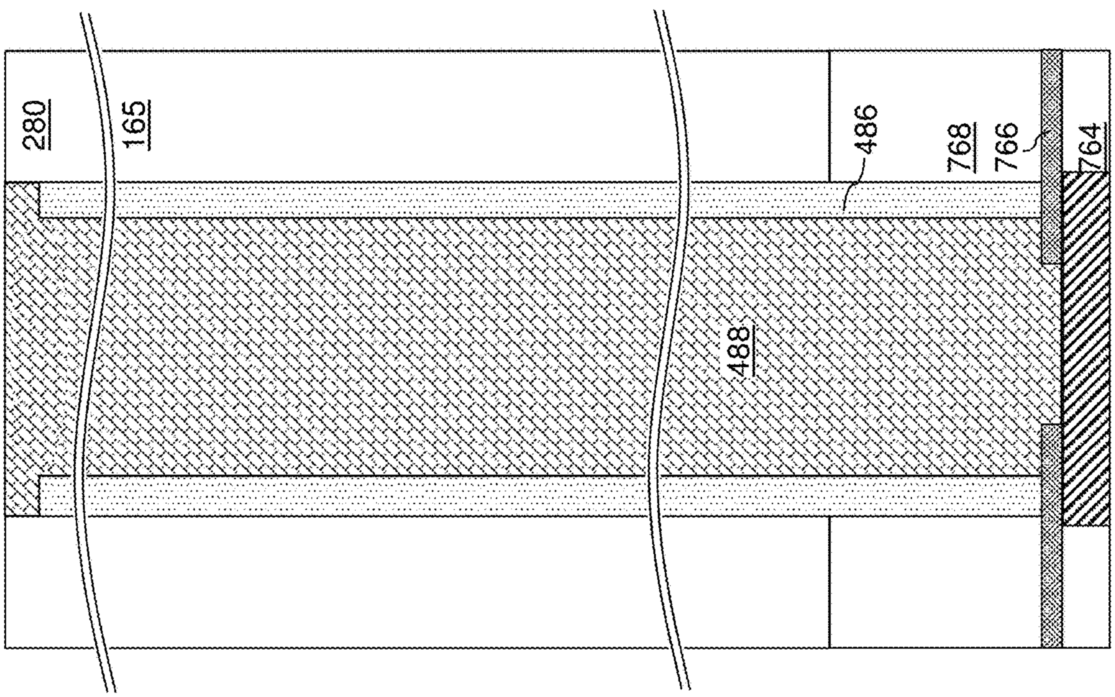
Figure 28F:
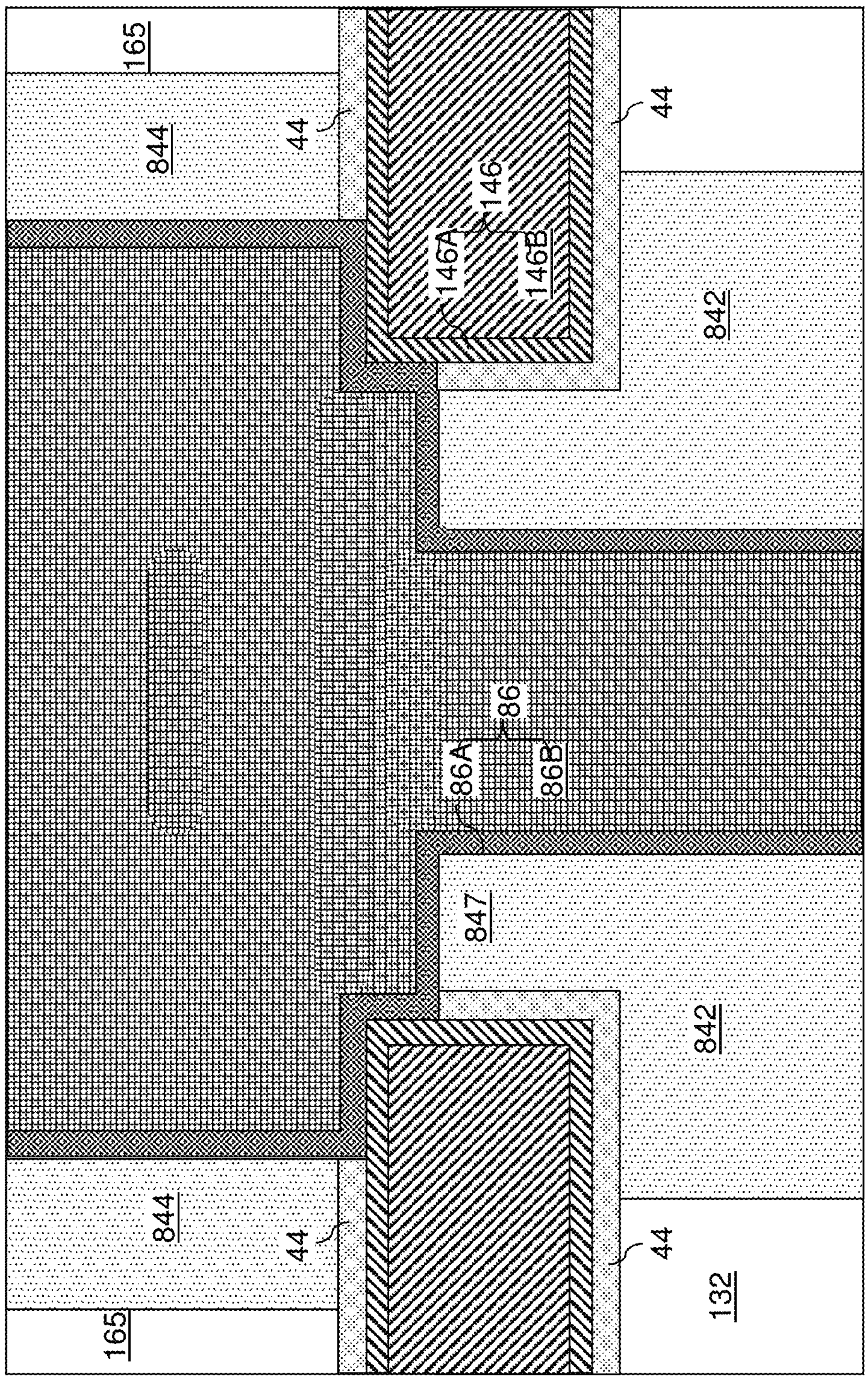
FIG. 28F is a magnified view of a region of a column-shaped conductive via structure that is formed in a staircase region via cavity.

Referring to FIGS. 27A, 27B, and 27C, an anisotropic etch process may be performed to remove horizontal portions of the staircase region conformal dielectric via liner 84 that are not masked by an overlying structure. The anisotropic etch process may include a terminal etch step that etches physically exposed portions of the backside blocking dielectric layers 44. Thus, an annular top surface of a respective topmost electrically conductive layer (146 or 246) and a cylindrical surface of the topmost electrically conductive layer (146 or 246) from the set of electrically conductive layers (146, 246) through which each respective column-shaped void 85 extends may be physically exposed within each staircase region via cavity. Different electrically conductive layers comprise the topmost electrically conductive layer in various column-shaped voids 85 because different voids extend through different parts of the staircase region 200. Further, an opening may be formed at the bottommost portion of each staircase region conformal dielectric via liner 84.

Each staircase region conformal dielectric via liner 84 may be divided into a ribbed insulating liner 842 and a cylindrical insulating liner 844. Each ribbed insulating liner 842 includes a neck portion 84N that continuously extends from a topmost electrically conductive layer (146 and/or 246) within a subset of the electrically conductive layers (146 and/or 246) to a bottommost electrically conductive layer (146 and/or 246) within the subset of the electrically conductive layers (146 and/or 246), laterally-protruding annular rib regions 842F having annular shapes, a cylindrical portion 842C having a cylindrical shape and underlying the alternating stack (132, 146, 232, 246), and an annular region 842A adjoining a bottom portion of the cylindrical portion 842C and having an annular shape. Outer sidewalls of the laterally-protruding annular rib regions 842 may be cylindrical. Each cylindrical insulating spacer 844 may be formed within the second retro-stepped dielectric material portion 265, and may be formed within the first retro-stepped dielectric material portion 165. A top surface of a lower-level metal interconnect structure 780 (such as a topmost lower-level metal line structure 788) may be physically exposed by the anisotropic etch process underneath each column-shaped void 85.

The anisotropic etch removes horizontal portions of the peripheral region conformal insulating liners 486 and array region conformal insulating liners 586. A peripheral region cylindrical void 485 may be formed within each peripheral region via cavity, and an array region cylindrical void 585 may be formed within each array region via cavity. An annular top surface of the silicon nitride layer 766 may be physically exposed at the bottom of each peripheral region cylindrical void 485 and at the bottom of each array region cylindrical void 585. Further, a top surface of the lower-level metal interconnect structure 780 (such as the topmost lower-level metal line structures 788) may be physically exposed by the anisotropic etch process underneath the peripheral region cylindrical voids 485 and the array region cylindrical voids 585.

Referring to FIGS. 28A-28F, at least one conductive material may be deposited in the column-shaped voids 85, the peripheral region cylindrical voids 485, and the array region cylindrical voids 585. The at least one conductive material may include a metallic liner material that is conformally deposited to form a metallic liner 86A within each void, and a metal fill material that is conformally deposited to form a metallic fill material portion 86B. In one embodiment, the metallic liner 86A may include a conductive metal nitride such as TiN, and the metallic fill material portion 86B may include a metal such as tungsten, cobalt, molybdenum, or copper.

Each combination of a metallic liner 86A and a metallic fill material portion 86B filling a column-shaped void 85 constitutes a column-shaped conductive via structure 86C. Each column-shaped conductive via structure 86C may include a conductive shaft portion 86S extending through a set of electrically conductive layers (146, 246), a conductive capital portion 86P overlying the conductive shaft portion 86S and contacting a respective topmost electrically conductive layer (146 or 246) whose top surface is exposed in each column-shaped void 85, a conductive base portion 86B underlying the bottommost electrically conductive layer 146 within the set of electrically conductive layers (146, 246), and a downward-protruding conductive portion 86R that protrudes downward from the conductive base portion 86B. An encapsulated void 86V may be present within each conductive base portion 86B due to the conformal nature of the deposition process used to deposit the conductive material(s) of the column-shaped conductive via structures 86C. The conductive capital portion 86P and the conductive base portion 86B have greater lateral extents than the conductive shaft portion 86S within each column-shaped conductive via structure 86C.

Each column-shaped conductive via structure 86C is formed directly on the top surface of the topmost electrically conductive layer (146 or 246) from the set of electrically conductive layers (146, 246) through which the respective column-shaped conductive via structure 86C extends. Each electrically conductive layer (146, 246) within the subset of the electrically conductive layers (146, 246) other than the topmost electrically conductive layer (146 or 246) is electrically isolated from the column-shaped conductive via structure 86C by a ribbed insulating liner 842. Each column-shaped conductive via structure 86C is formed on inner sidewalls of a ribbed insulating liner 842 and a cylindrical insulating liner 844. At least one of the column-shaped conductive via structures 86C may be formed directly on a top surface of a lower-level metal interconnect structure 780.

Each combination of a metallic liner 86A and a metallic fill material portion 86B filling a peripheral region cylindrical void 485 constitutes a peripheral region contact via structure 488. Each combination of a metallic liner 86A and a metallic fill material portion 86B filling an array region cylindrical void 585 constitutes an array region contact via structure 588. Each of the peripheral region contact via structures 488 and the array region contact via structures 588 may contact a respective one of the lower-level metal interconnect structures 780 (such as the topmost lower-level metal line structures 788). Each of the peripheral region contact via structures 488 and the array region contact via structures 588 may include a downward-protruding portion that protrudes through the silicon nitride layer 766 to contact a respective one of the lower-level metal interconnect structures 780. Each electrically conductive layer (146, 246) may include a metallic nitride liner 146A and a metallic fill material portion 146B.

Each combination of a column-shaped conductive via structure 86C, a ribbed insulating liner 842, and a cylindrical insulating liner 844 located within a staircase region via cavity constitutes a laterally-insulated staircase region via structure 86. Each laterally-insulated staircase region via structure 86 includes a respective column-shaped conductive via structure 86 as a conductive via structure, and include a respective ribbed insulating liner 842 and a respective cylindrical insulating liner 844 as a laterally insulating structure. The gap between the ribbed insulating liner 842 and the cylindrical insulating liner 844 provides an annular electrically conductive path at which the column-shaped conductive via structure 86C and an electrically conductive layer (146 or 246) makes a surface-to-surface contact.

Figure 29A:
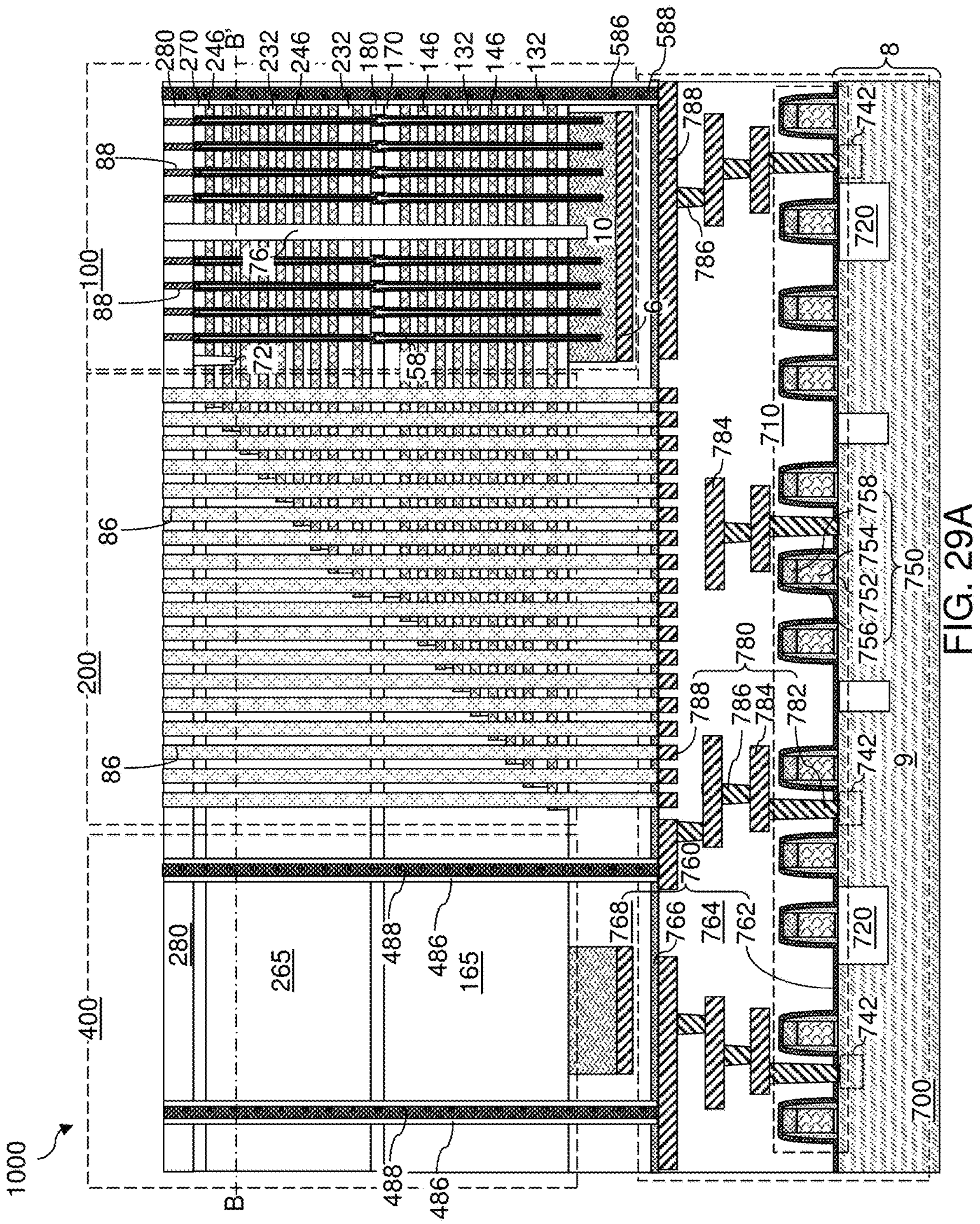
FIG. 29A is a vertical cross-sectional view of the first exemplary structure after formation of drain contact via structures according to the first embodiment of the present disclosure.
Figure 29B:
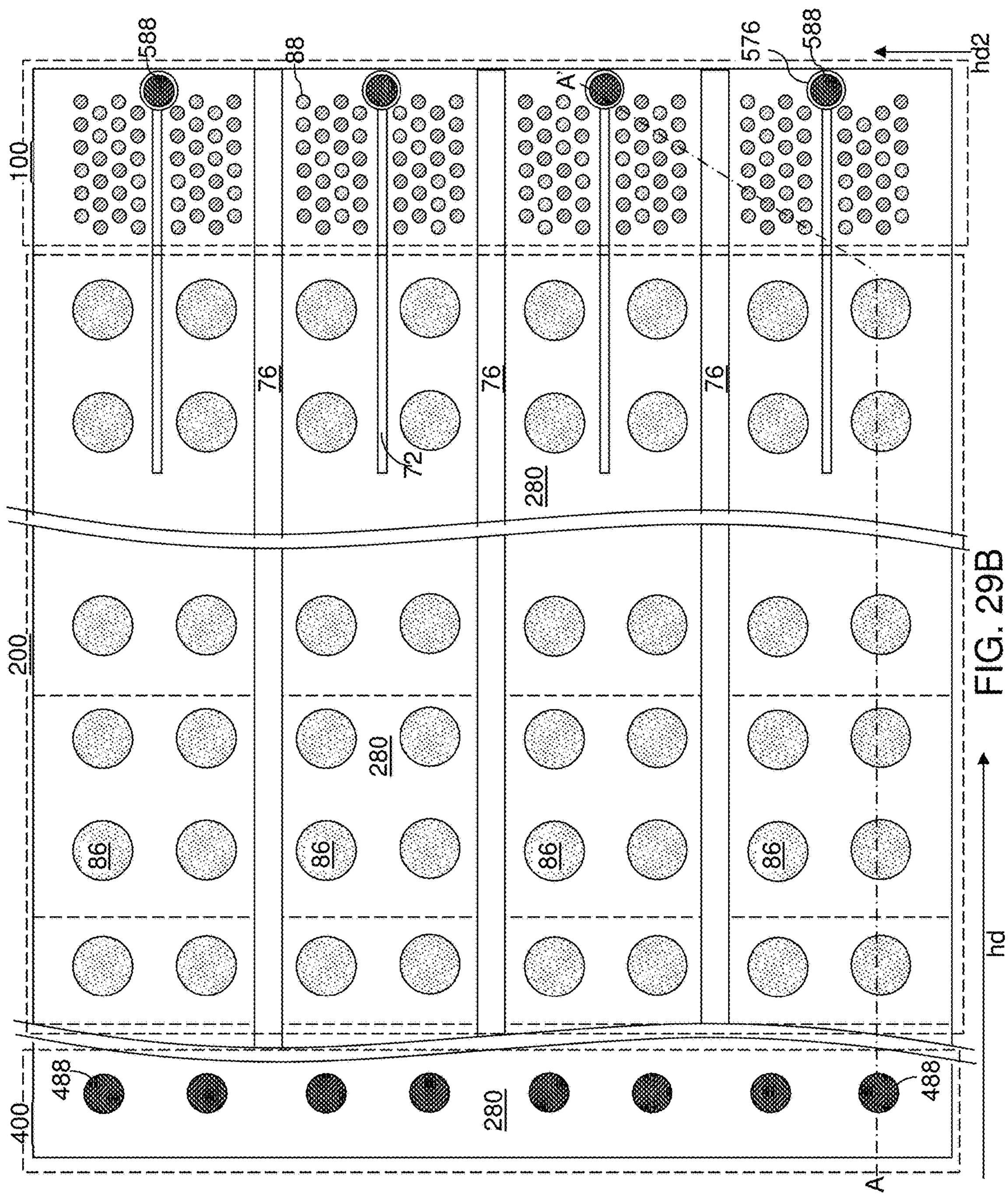
FIG. 29B is a horizontal cross-sectional view of the first exemplary structure along the horizontal plane B-B' of FIG. 28A. The hinged vertical plane A-A' corresponds to the plane of the vertical cross-sectional view of FIG. 28A.

Referring to FIGS. 29A and 29B, drain contact via structures 88 may be formed through the first contact level dielectric layer 280 directly on top surfaces of the drain regions 63.

Figure 30:
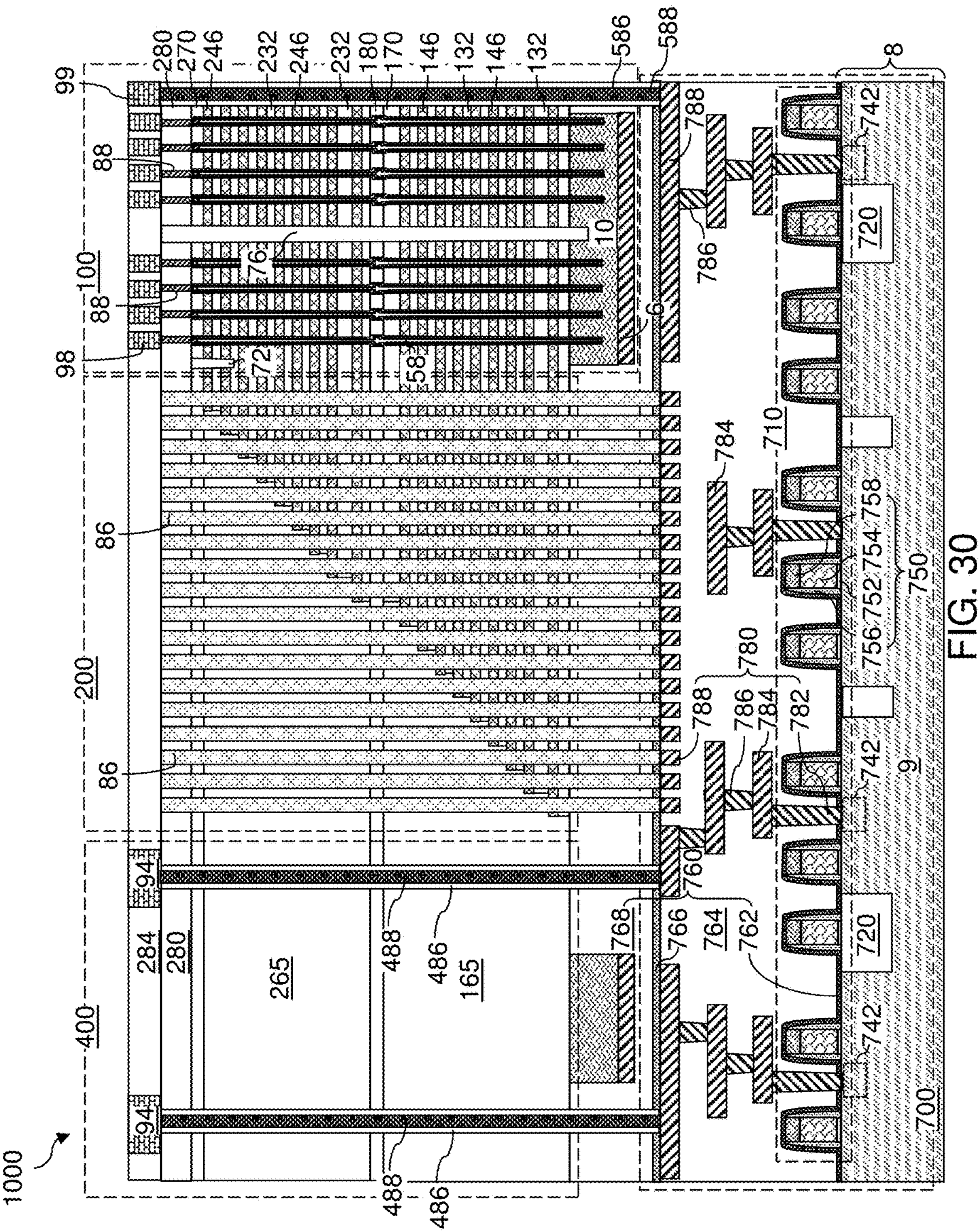
FIG. 30 is a vertical cross-sectional view of the first exemplary structure after formation of upper-level metal line structures according to the first embodiment of the present disclosure.

Referring to FIG. 30, the memory device 1000 includes at least one additional dielectric layer may be formed over the first contact level dielectric layer 280, and additional metal interconnect structures (herein referred to as upper-level metal interconnect structures) may be formed in the at least one additional dielectric layer. For example, the at least one additional dielectric layer may include a line-level dielectric layer 284 that is formed over the first contact level dielectric layer 280. The upper-level metal interconnect structures may include bit lines 98 contacting, or electrically connected to, a respective one of the drain contact via structures 88, peripheral region line structures 94 contacting, and/or electrically connected to, a respective one of the peripheral region contact via structures 488, and array region line structures 99 contacting, and/or electrically connected to, a respective one of the array region contact via structures 588. In one embodiment, no word line connection line structures contact a top surface the column-shaped conductive via structures 86C and the top surfaces of the column-shaped conductive via structures 86C are covered with a line-level dielectric layer 284, since the column-shaped conductive via structures 86C directly connect the word lines comprising the first and second electrically conductive layers (146, 246) to the lower-level metal interconnect structures 780 of the peripheral devices 700 located below the word lines without using overlying connection line structures.

Referring to the various drawings, such as FIGS. 29A and 30, and according to various embodiments of the present disclosure, a device structure 1000 is provided, which comprises: an alternating stack {(132, 146) and/or (232, 246)} of insulating layers (132 and/or 232) and electrically conductive layers (146 and/or 246) located over a substrate 8 and including stepped surfaces in a staircase region 200; a retro-stepped dielectric material portion (265 and/or 165) overlying the stepped surfaces of the alternating stack {(132, 146) and/or (232, 246)}; and a laterally-insulated staircase region via structure 86 vertically extending through the alternating stack {(132, 146) and/or (232, 246)} and the retro-stepped dielectric material portion (265 and/or 165). The laterally-insulated staircase region via structure 86 comprises a ribbed insulating spacer 842 including a neck portion 84N that extends through the alternating stack and laterally-protruding annular rib regions 842F extending from the neck portion at each level of insulating layers (132, 232), and a conductive via structure 86C extending through the neck portion 84N of the ribbed insulating spacer 842 and contacting one of the electrically conductive layers (146 or 246).

In one embodiment, the neck portion 84N continuously extends from a topmost electrically conductive layer (146 and/or 246) within a subset of the electrically conductive layers (146 and/or 246) in the respective column-shaped void 85 to a bottommost electrically conductive layer 146 within the subset of the electrically conductive layers (146 and/or 246) in the respective column-shaped void 85. The neck portion 84N includes laterally-protruding annular rib regions 842F located at each level of insulating layers (132, 232).

In one embodiment, the conductive via structure 86C is a column-shaped conductive via structure 86C that comprises: a conductive shaft portion 86S extending through the neck portion 84N of the ribbed insulating spacer 842; a conductive capital portion 86P overlying the conductive shaft portion 86S, and contacting the topmost electrically conductive layer (146 or 246) within the subset of electrically conductive layers through which it the conductive via structure 86C extends; and a conductive base portion 86B underlying the bottommost electrically conductive layer 146 within the subset. In one embodiment, the conductive capital portion 86P and the conductive base portion 86B have greater lateral extents than the conductive shaft portion 86S.

In one embodiment, outer sidewalls of the laterally-protruding annular rib regions 842F are laterally offset outward from a vertical sidewall (i.e., the inner sidewall) of the neck portion 84N by a same lateral offset distance (which may be the sum of the lateral etch distance during the recess etch process and the thickness of a staircase region conformal dielectric via liner 84). In one embodiment, the ribbed insulating spacer 842 includes a cylindrical portion 84C underlying the subset of the electrically conductive layers (146 and/or 246) and laterally surrounding the conductive base portion 86B.

In one embodiment, lower-level metal interconnect structures 780 may be formed within in lower-level dielectric material layers 760 and may be located between the substrate 8 and the alternating stack {(132, 146) and/or (232, 246)}. The column-shaped conductive via structure 86C comprises a downward protruding conductive portion 86R that protrudes downward from the conductive base portion 86B and having a lesser lateral extent than the conductive base portion 86B and contacting a top surface of one of the lower-level metal interconnect structures 780. The ribbed insulating spacer 842 includes an annular bottom opening through which the downward-protruding conductive portion 86R vertically extends.

In one embodiment, a contact area between the conductive capital portion 86P and a top surface of the topmost electrically conductive layer (146 or 246) is located between an outer periphery of a bottom surface of the conductive capital portion 86P and an inner periphery of the bottom surface of the conductive capital portion 86P, and the outer periphery of the bottom surface of the conductive capital portion 86P is laterally offset from the inner periphery of the bottom surface of the conductive capital portion 86P by a uniform lateral offset distance, which is the uniform width of the annular contact area. In one embodiment, a sidewall of the conductive capital portion 86P contacts an upper portion of a sidewall of the topmost electrically conductive layer (146 or 246), and a bottommost surface of the conductive capital portion 86P contacts a top surface of the ribbed insulating spacer 842. A cylindrical insulating spacer 844 may laterally surround the conductive capital portion 86P, overlie the topmost electrically conductive layer (146 or 246), and comprise a same dielectric material as the ribbed insulating spacer 842.

In one embodiment, memory stack structures 55 may extend through the alternating stack {(132, 146) and/or (232, 246)}. Each of the memory stack structures 55 comprises a vertical stack of charge storage elements (comprising sections of a charge storage layer located at levels of the electrically conductive layers (146, 246)), a tunneling dielectric layer 56 laterally surrounded by the vertical stack of charge storage elements, and a vertical semiconductor channel 60 laterally surrounded by the tunneling dielectric layer 56. A driver circuitry containing a lower-level metal interconnect structure 780 is located below the alternating stack (132, 146, 232, 246). The conductive via structure 86C (e.g., the downward-protruding conductive portion 86R of the conductive via structure 86C) physically contacts the lower-level metal interconnect structure 780 located below the alternating stack.

In one embodiment, the device structure comprises a monolithic three-dimensional NAND memory device, the electrically conductive layers (246, 246) comprise, or are electrically connected to, a respective word line of the monolithic three-dimensional NAND memory device, and the substrate 8 comprises a silicon substrate. In one embodiment, the monolithic three-dimensional NAND memory device comprises an array of monolithic three-dimensional NAND strings over the silicon substrate, at least one memory cell in a first device level of the array of monolithic three-dimensional NAND strings is located over another memory cell in a second device level of the array of monolithic three-dimensional NAND strings, and the silicon substrate contains an integrated circuit comprising a driver circuit for the memory device located thereon. In one embodiment, the electrically conductive layers (146, 246) comprise a plurality of control gate electrodes having a strip shape extending substantially parallel to the top surface of the substrate, and the plurality of control gate electrodes comprise at least a first control gate electrode located in the first device level and a second control gate electrode located in the second device level. In one embodiment, the array of monolithic three-dimensional NAND strings comprises: a plurality of semiconductor channels 60, wherein at least one end portion of each of the plurality of semiconductor channels extends substantially perpendicular to a top surface of the substrate 8, and one of the plurality of semiconductor channels 60 including the vertical semiconductor channel 60, and a plurality of charge storage elements, each charge storage element located adjacent to a respective one of the plurality of semiconductor channels 60.

Figure 31:
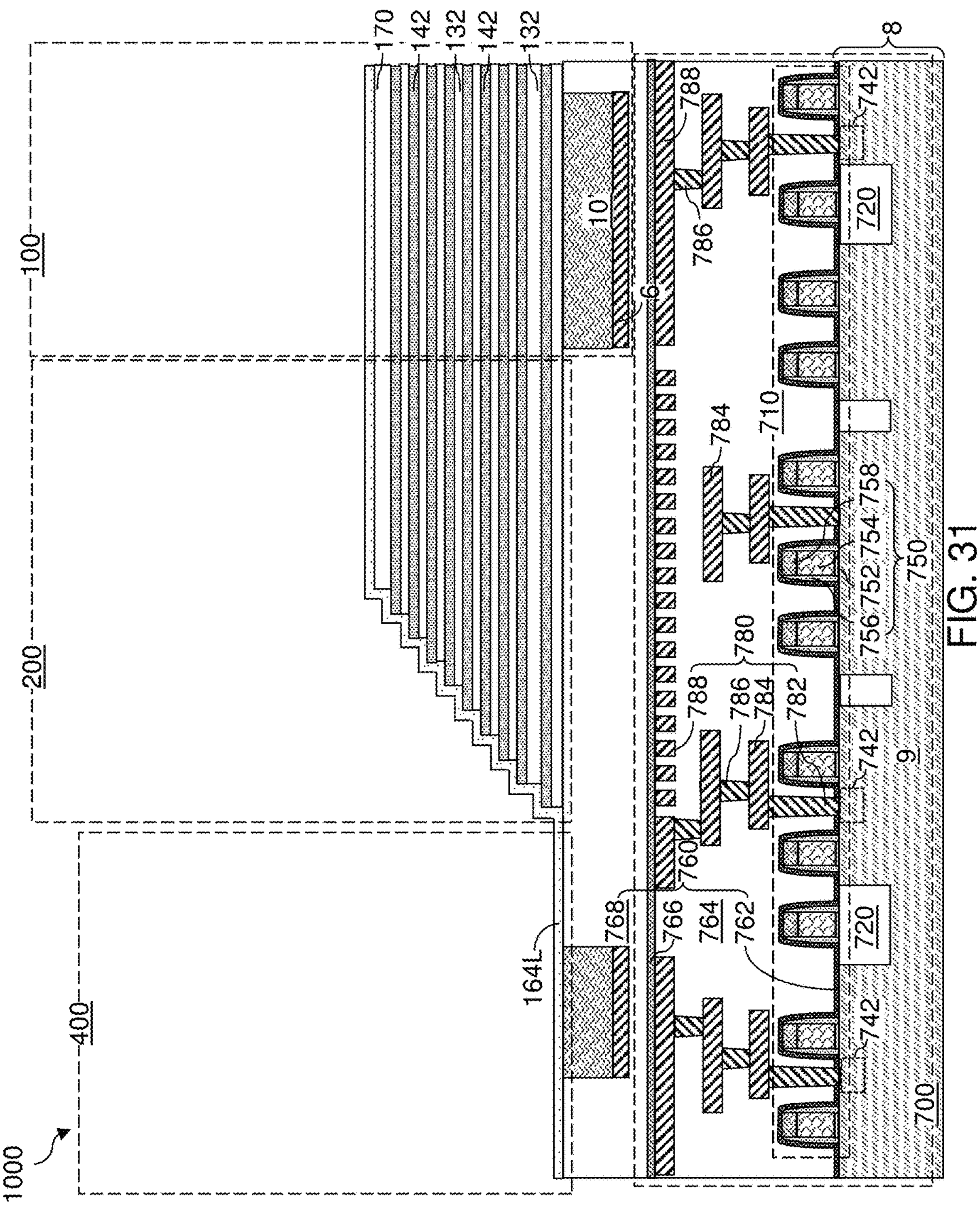
FIG. 31 is a vertical cross-sectional view of a second exemplary structure after formation of first stepped surfaces and a first dielectric liner layer according to a second embodiment of the present disclosure.

Referring to FIG. 31, a second exemplary structure according to a second embodiment of the present disclosure may be derived from the first exemplary structure of FIG. 3 by depositing a first dielectric liner layer 164L by a conformal deposition process. The first dielectric liner layer 164L includes a silicate glass material that provides a higher etch rate than undoped silicate glass. In one embodiment, the first insulating layers 132 may include a first silicon oxide material, and the first dielectric liner layer 164L may include a second silicon oxide material. The etch rate of the second silicon oxide material in a 100:1 dilute HF solution is greater than the etch rate of the first silicon oxide material in the 100:1 dilute HF solution by a factor of at least 3. As used herein, all etch rates are measured at room temperature (20 degrees Celsius). For example, the first dielectric liner layer 164L may include a borosilicate glass (BSG) including boron at an atomic concentration in a range from 1% to 10%, borophosphosilicate glass (BPSG) including boron and arsenic at an atomic concentration in a range from 1% to 10%, or an organosilicate glass including carbon at an atomic concentration in a range from 1% to 10% and hydrogen at an atomic concentration in a range from 0.5% to 10%. One non-limiting example of organosilicate glass comprises silicon oxide formed from coating a polysilazane (PSZ) inorganic polymer followed by thermally curing the polymer to form silicon oxide. The etch rate of the material of the first dielectric liner layer 164L in a 100:1 dilute hydrofluoric acid at room temperature may be at least 5 times, and preferably at least 10 times and/or at least 20 times, the etch rate of thermal silicon oxide in a 100:1 dilute hydrofluoric acid at room temperature. The first dielectric liner layer 164L may be deposited by a conformal deposition process such as low pressure chemical vapor deposition or a non-conformal deposition process such as plasma enhanced chemical vapor deposition. The thickness of the horizontal portions of the first dielectric liner layer 164L may be in a range from 10 nm to 100 nm, such as from 20 nm to 50 nm, although lesser and greater thicknesses may also be used.

Figure 32:
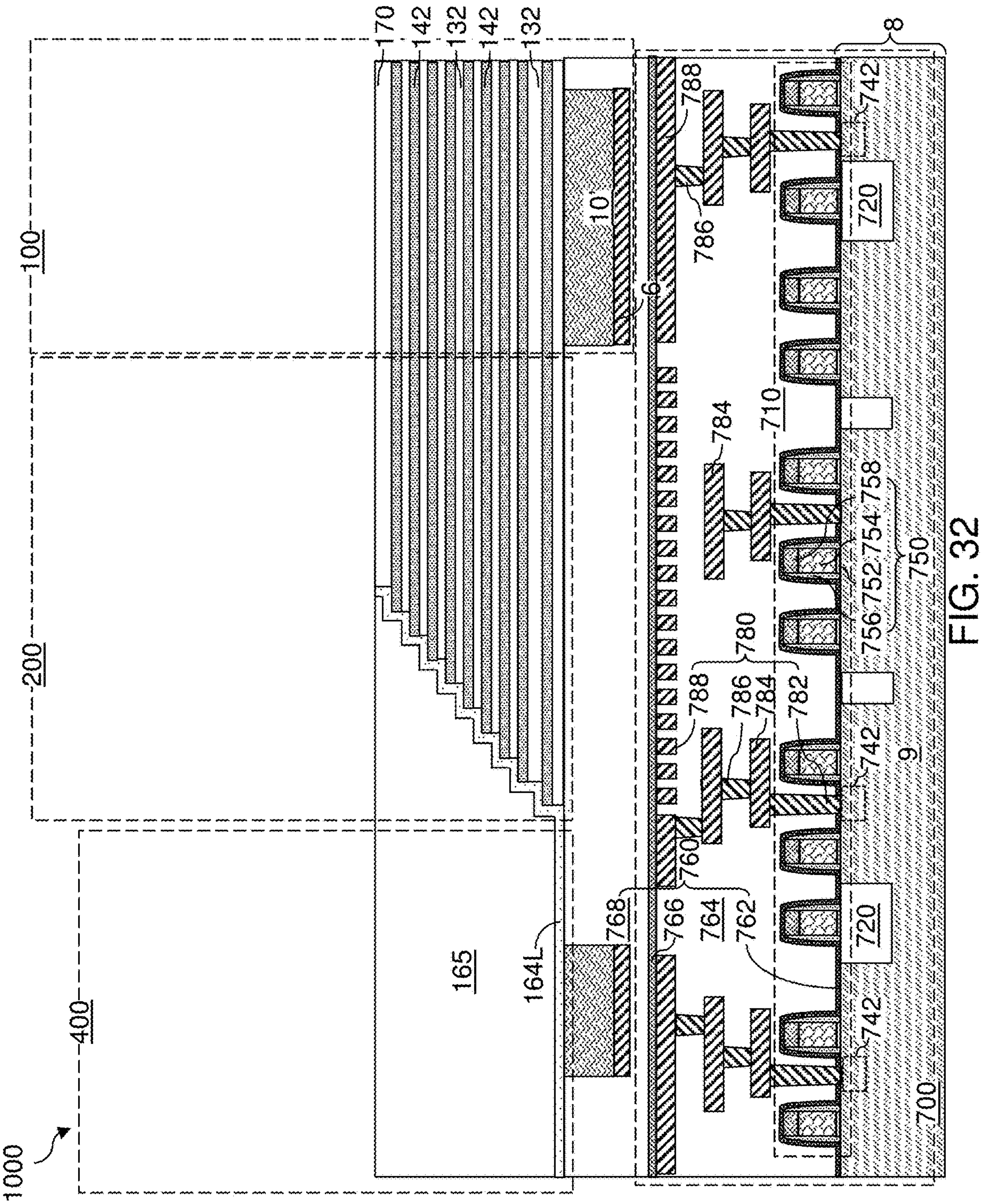
FIG. 32 is a vertical cross-sectional view of the second exemplary structure after formation of a first dielectric liner and a first retro-stepped dielectric material portion according to the second embodiment of the present disclosure.

Referring to FIG. 32, a dielectric fill material may be deposited over the first dielectric liner layer 164L. Portions of the deposited dielectric fill material and the dielectric material of the silicate glass material of the first dielectric liner layer 164L may be removed from above the horizontal plane including the top surface of the first insulating cap layer 170 by a planarization process such as chemical mechanical planarization (CMP). The remaining portion of the first dielectric liner layer 164L constitutes a first dielectric liner 164, and covers the entire stepped surfaces of the first alternating stack (132, 142). The remaining portion of deposited dielectric fill material constitutes a first retro-stepped dielectric material portion 165. The topmost surface of the first dielectric liner 164 and a top surface of the first retro-stepped dielectric material portion 165 may be formed within the same horizontal plane, which is the horizontal plane including the top surface of the first insulating cap layer 170.

The first retro-stepped dielectric material portion 165 includes a silicate glass having a lower etch rate than the silicate glass material of the first dielectric liner 164. For example, the first retro-stepped dielectric material portion 165 may include undoped silicate glass formed by thermal decomposition or plasma decomposition of tetraethylorthosilicate (TEOS), or a lightly doped silicate glass (such as phosphosilicate glass) that is substantially free of boron and formed by thermal decomposition of TEOS. The silicon oxide material of the first retro-stepped dielectric material portion 165 is herein referred to as a third silicon oxide material. The etch rate of the second silicon oxide material in the 100:1 dilute HF solution is greater than an etch rate of the third silicon oxide material in the 100:1 dilute HF solution by a factor of at least 3.

Figure 33A:
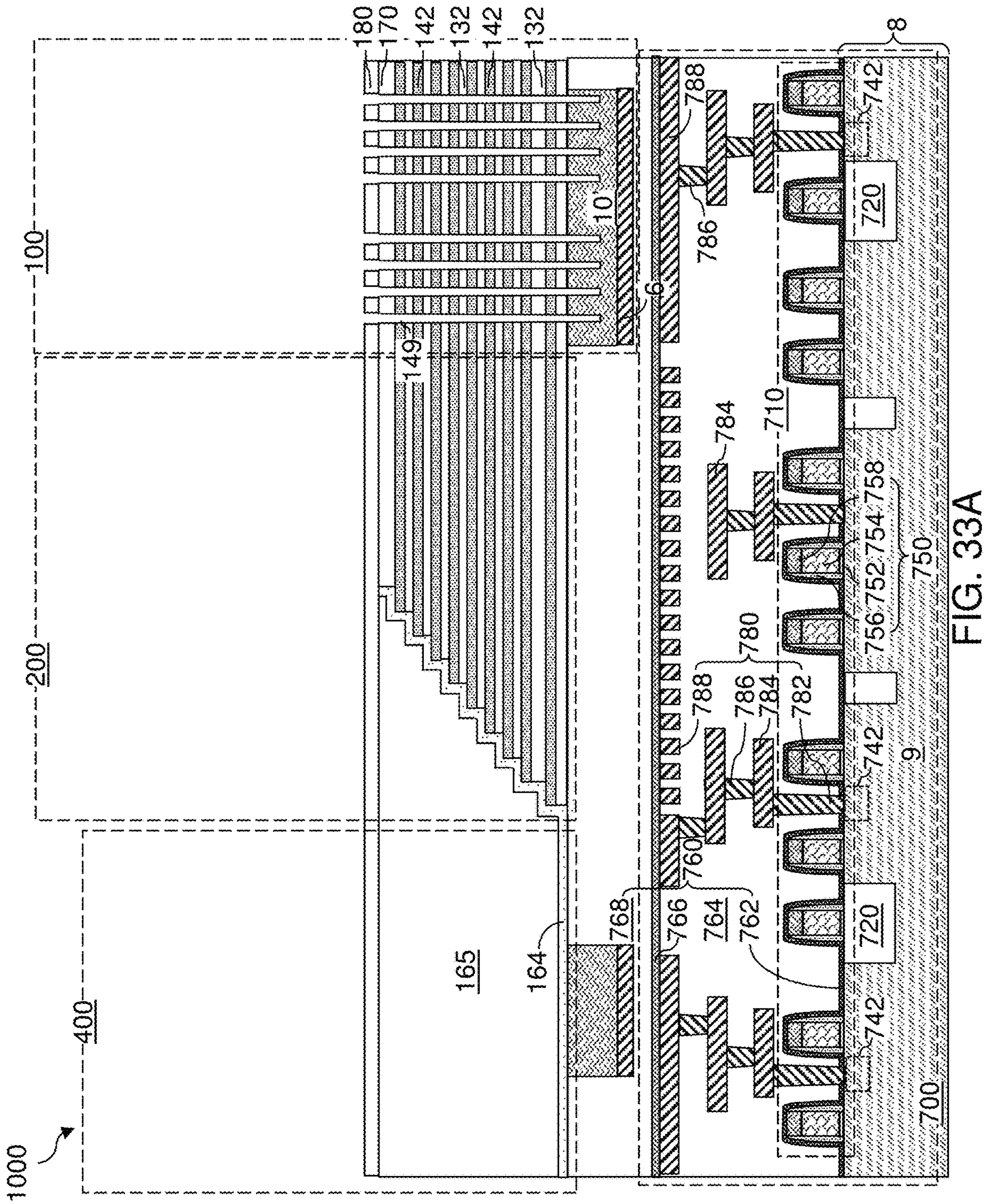
FIG. 33A is a vertical cross-sectional view of the second exemplary structure after formation of first-tier memory openings according to the second embodiment of the present disclosure.
Figure 33B:
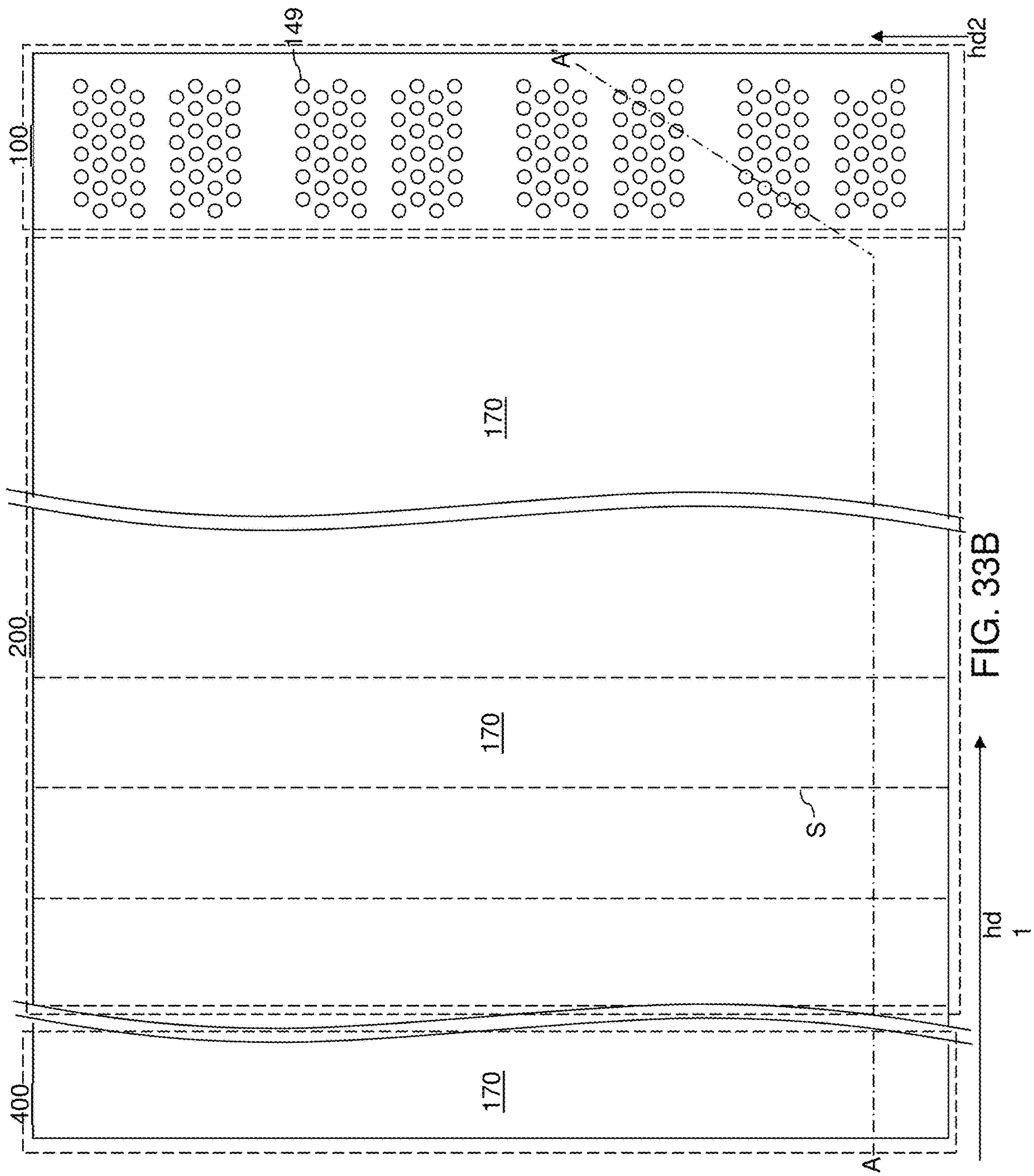
FIG. 33B is a top-down view of the second exemplary structure of FIG. 33A. The hinged vertical plane A-A' corresponds to the plane of the vertical cross-sectional view of FIG. 33A.

Referring to FIGS. 33A and 33B, an inter-tier dielectric layer 180 may be optionally deposited over the first-tier structure (132, 142, 164, 165, 170). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Subsequently, the processing steps as discussed above with reference to FIGS. 5A and 5B may be performed to form first-tier memory openings 149 in the memory array region 100 at locations at which memory stack structures including vertical stacks of memory elements are to be subsequently formed. Optionally, the processing steps of FIGS. 6A and 6B may be performed to laterally expand the portions of the first-tier memory openings 149 at the level of the inter-tier dielectric layer 180 may be laterally expanded by an isotropic etch.

Figure 34:
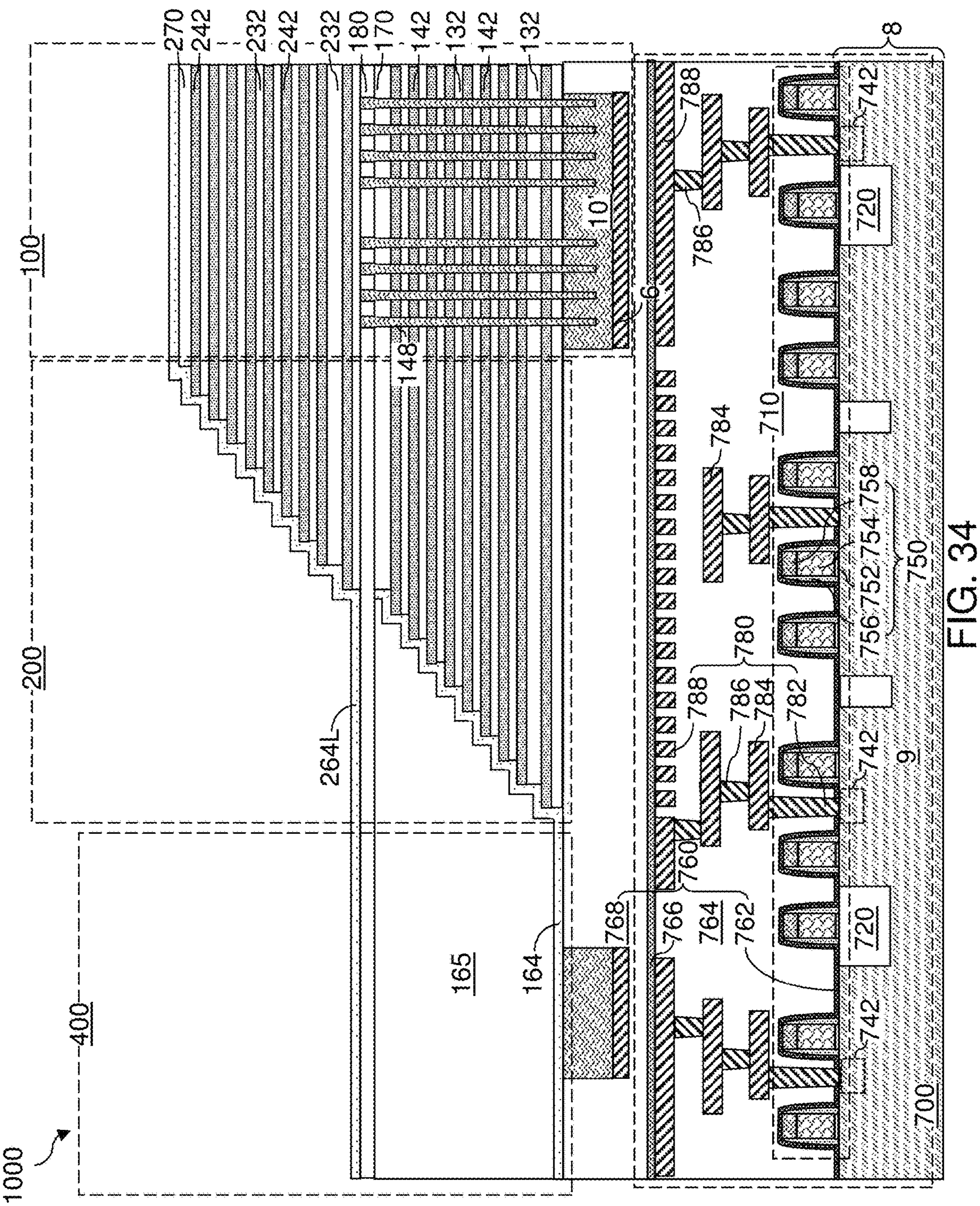
FIG. 34 is a vertical cross-sectional view of the second exemplary structure after formation of sacrificial memory opening fill portions, a second alternating stack of second insulating layers and second spacer material layers, second stepped surfaces, and a second dielectric liner layer according to the second embodiment of the present disclosure.

Referring to FIG. 34, sacrificial memory opening fill portions 148 may be formed in the first-tier memory openings 149. For example, a sacrificial fill material layer is deposited in the first-tier memory openings 149. The sacrificial fill material layer includes a sacrificial material which may be subsequently removed selective to the materials of the first insulator layers 132 and the first sacrificial material layers 142. In one embodiment, the sacrificial fill material layer may include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer having a thickness in a range from 1 nm to 3 nm) may be used prior to depositing the sacrificial fill material layer. The sacrificial fill material layer may be formed by a non-conformal deposition or a conformal deposition method. In another embodiment, the sacrificial fill material layer may include amorphous silicon or a carbon-containing material (such as amorphous carbon or diamond-like carbon) that may be subsequently removed by ashing.

Portions of the deposited sacrificial material may be removed from above the first insulating cap layer 170 (and the optional inter-tier dielectric layer 180, if present). For example, the sacrificial fill material layer may be recessed to a top surface of the first insulating cap layer 170 (and the optional inter-tier dielectric layer 180) using a planarization process. The planarization process may include a recess etch, chemical mechanical planarization (CMP), or a combination thereof. The top surface of the first insulating cap layer 170 (and optionally the inter-tier dielectric layer 180 if present) may be used as an etch stop layer or a planarization stop layer. Each remaining portion of the sacrificial material in a first-tier memory opening 149 constitutes a sacrificial memory opening fill portion 148. The top surfaces of the sacrificial memory opening fill portions 148 may be coplanar with the top surface of the inter-tier dielectric layer 180 (or the first insulating cap layer 170 if the inter-tier dielectric layer 180 is not present). The sacrificial memory opening fill portion 148 may, or may not, include cavities therein.

An additional alternating stack of insulating layers and spacer material layers, which may be sacrificial material layers, is formed over the first-tier structure (132, 142, 170, 154, 165, 148). For example, a second alternating stack (232, 242) of material layers may be subsequently formed on the top surface of the first alternating stack (132, 142). The second alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include the first insulating material, and each second sacrificial material layer 242 may include a sacrificial material. In this case, the second alternating stack (232, 242) may include an alternating plurality of second insulating layers 232 and second sacrificial material layers 242. The first insulating material of the second insulating layers 232 may be deposited, for example, by chemical vapor deposition (CVD). The material of the second sacrificial material layers 242 may be formed, for example, CVD or atomic layer deposition (ALD).

Insulating materials that may be used for the second insulating layers 232 may be any material that may be used for the first insulating layers 132. The material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Second stepped surfaces in the second stepped area may be formed in the staircase region 200 using a same set of processing steps as the processing steps used to form the first stepped surfaces in the first stepped area with suitable adjustment to the pattern of at least one masking layer. The second stepped surfaces of the second alternating stack (232, 242) may be laterally offset toward the memory array region 100 from the first stepped surfaces of the first alternating stack (132, 142).

A second dielectric liner layer 264L may be formed by a conformal deposition process. The second dielectric liner layer 264L includes a silicate glass material that provides a higher etch rate than undoped silicate glass. In one embodiment, the first and second insulating layers (132, 232) may include the first silicon oxide material, and the first dielectric liner 164 and the second dielectric liner layer 264L may include the second silicon oxide material. As discussed above, the etch rate of the second silicon oxide material in a 100:1 dilute HF solution is greater than the etch rate of the first silicon oxide material in the 100:1 dilute HF solution by a factor of at least 3. For example, the first dielectric liner 164 and the second dielectric liner layer 264L may include a borosilicate glass (BSG) including boron at an atomic concentration in a range from 1% to 10%, borophosphosilicate glass (BPSG) including boron and arsenic at an atomic concentration in a range from 1% to 10%, or an organosilicate glass (e.g., silicon oxide formed using a PSZ source) including carbon at an atomic concentration in a range from 1% to 10% and hydrogen at an atomic concentration in a range from 0.5% to 10%. The etch rate of the material of the first dielectric liner 164 and the second dielectric liner layer 264L in a 100:1 dilute hydrofluoric acid at room temperature may be at least 5 times, and preferably at least 10 times and/or at least 20 times, the etch rate of thermal silicon oxide in a 100:1 dilute hydrofluoric acid at room temperature. The second dielectric liner layer 264L may be deposited by a conformal deposition process such as low pressure chemical vapor deposition or a non-conformal deposition process such as plasma enhanced chemical vapor deposition. The thickness of the horizontal portions of the second dielectric liner layer 264L may be in a range from 10 nm to 100 nm, such as from 20 nm to 50 nm, although lesser and greater thicknesses may also be used.

Figure 35:
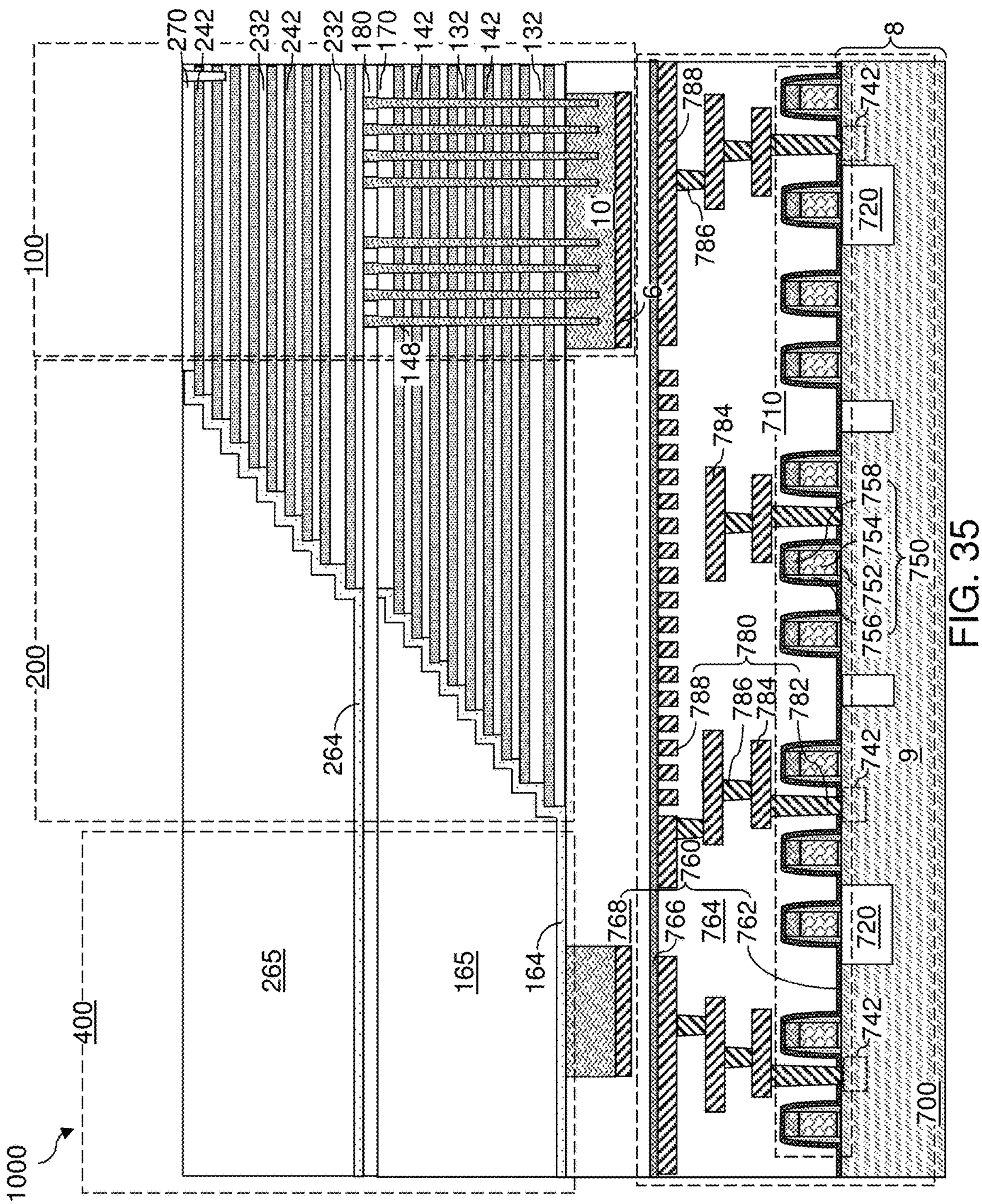
FIG. 35 is a vertical cross-sectional vie of the second exemplary structure after formation of a second dielectric liner and a second retro-stepped dielectric material portion according to the second embodiment of the present disclosure.

Referring to FIG. 35, a dielectric fill material may be deposited over the second dielectric liner layer 264L. Portions of the deposited dielectric fill material and the dielectric material of the silicate glass material of the second dielectric liner layer 264L may be removed from above the horizontal plane including the top surface of the second insulating cap layer 270 by a planarization process such as chemical mechanical planarization (CMP). The remaining portion of the second dielectric liner layer 264L constitutes a second dielectric liner 264, and covers the entire stepped surfaces of the second alternating stack (232, 242). The remaining portion of deposited dielectric fill material constitutes a second retro-stepped dielectric material portion 265. The topmost surface of the second dielectric liner 264 and a top surface of the second retro-stepped dielectric material portion 265 may be formed within the same horizontal plane, which is the horizontal plane including the top surface of the second insulating cap layer 270.

The second retro-stepped dielectric material portion 265 includes a silicate glass having a lower etch rate than the silicate glass material of the second dielectric liner 264. For example, the second retro-stepped dielectric material portion 265 may include undoped silicate glass formed by thermal decomposition or plasma decomposition of tetraethylorthosilicate (TEOS), or a lightly doped silicate glass (such as phosphosilicate glass) that is substantially free of boron and formed by thermal decomposition of TEOS. In one embodiment, the second retro-stepped dielectric material portion 265 may include the third silicon oxide material, which is the silicon oxide material of the first retro-stepped dielectric material portion 165.

Generally speaking, at least one alternating stack of insulating layers (132, 232) and spacer material layers (such as sacrificial material layers (142, 242)) may be formed over the in-process source-level material layers 10', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second alternating stack (232, 242). The second sacrificial material layers 242 that are cut by the select-drain-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1.

Figure 36A:
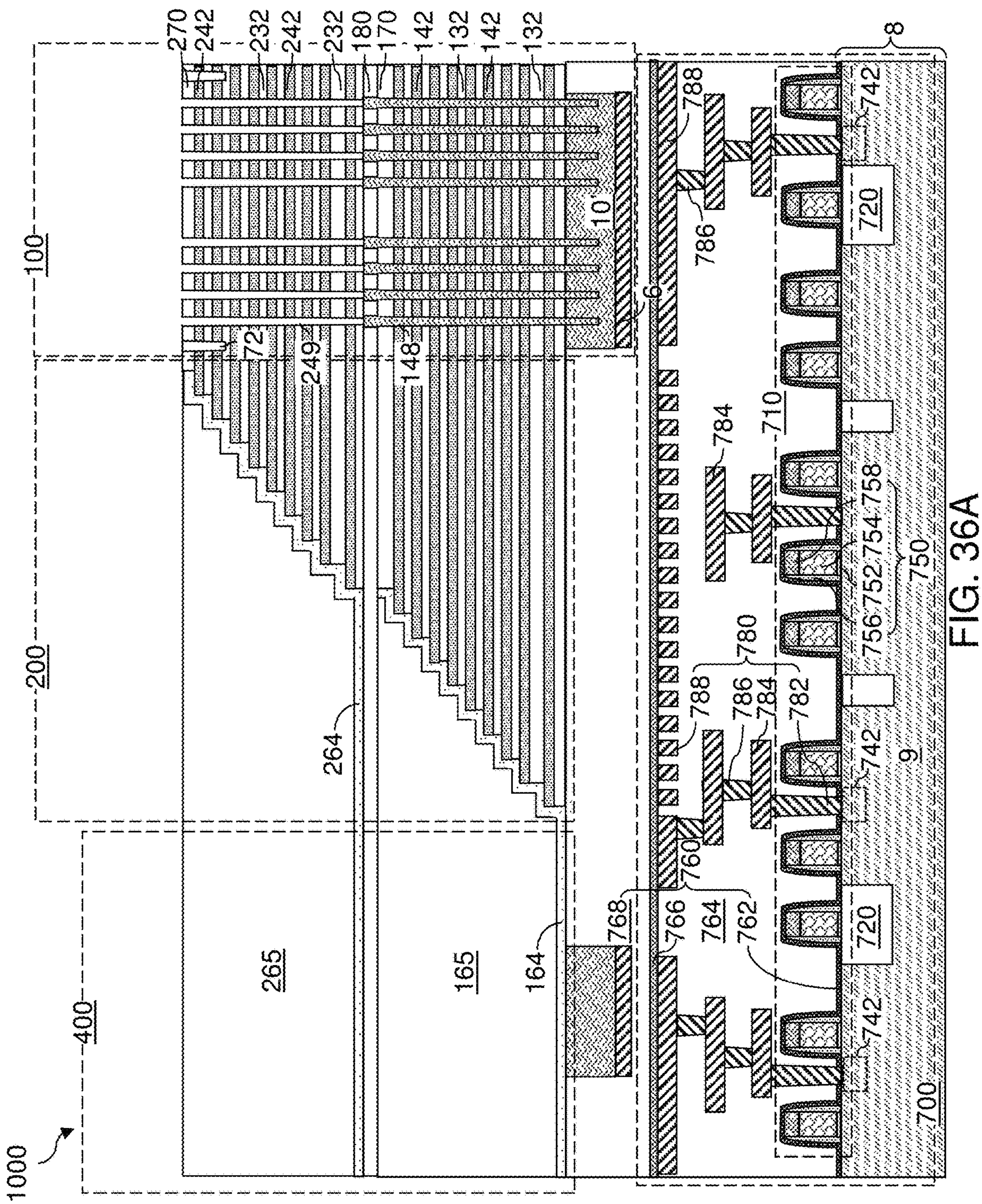
FIG. 36A is a vertical cross-sectional view of the second exemplary structure after formation of second-tier memory openings according to the second embodiment of the present disclosure.
Figure 36B:
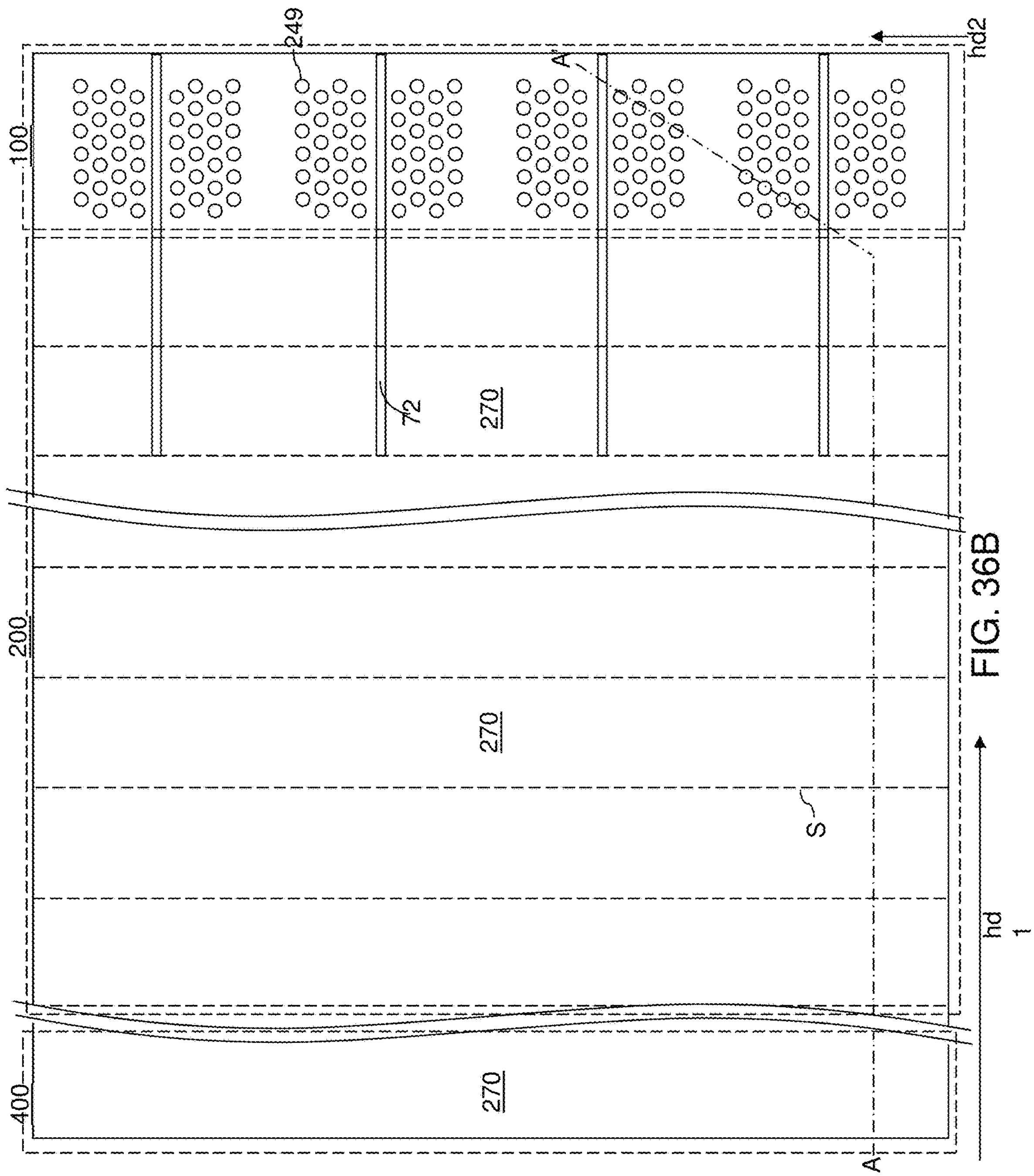
FIG. 36B is a top-down view of the second exemplary structure of FIG. 36A. The hinged vertical plane A-A' corresponds to the plane of the vertical cross-sectional view of FIG. 36A.

Referring to FIGS. 36A and 36B, second-tier memory openings 249 extending through the second-tier structure (232, 242, 270, 264, 265) are formed in areas overlying the sacrificial memory opening fill portions 148. For example, a photoresist layer may be applied over the second-tier structure (232, 242, 270, 264, 265), and may be lithographically patterned to form a same pattern as the pattern of the sacrificial memory opening fill portions 148, i.e., the pattern of the first-tier memory openings 149. Thus, the lithographic mask used to pattern the first-tier memory openings 149 may be used to pattern the second-tier memory openings 249. An anisotropic etch may be performed to transfer the pattern of the lithographically patterned photoresist layer through the second-tier structure (232, 242, 270, 264, 265). In one embodiment, the chemistry of the anisotropic etch process used to etch through the materials of the second alternating stack (232, 242) may alternate to optimize etching of the alternating material layers in the second alternating stack (232, 242). The anisotropic etch may be, for example, a series of reactive ion etches. The patterned lithographic material stack may be removed, for example, by ashing after the anisotropic etch process. A top surface of an underlying sacrificial memory opening fill portion 148 may be physically exposed at the bottom of each second-tier memory opening 249.

Figure 37A:
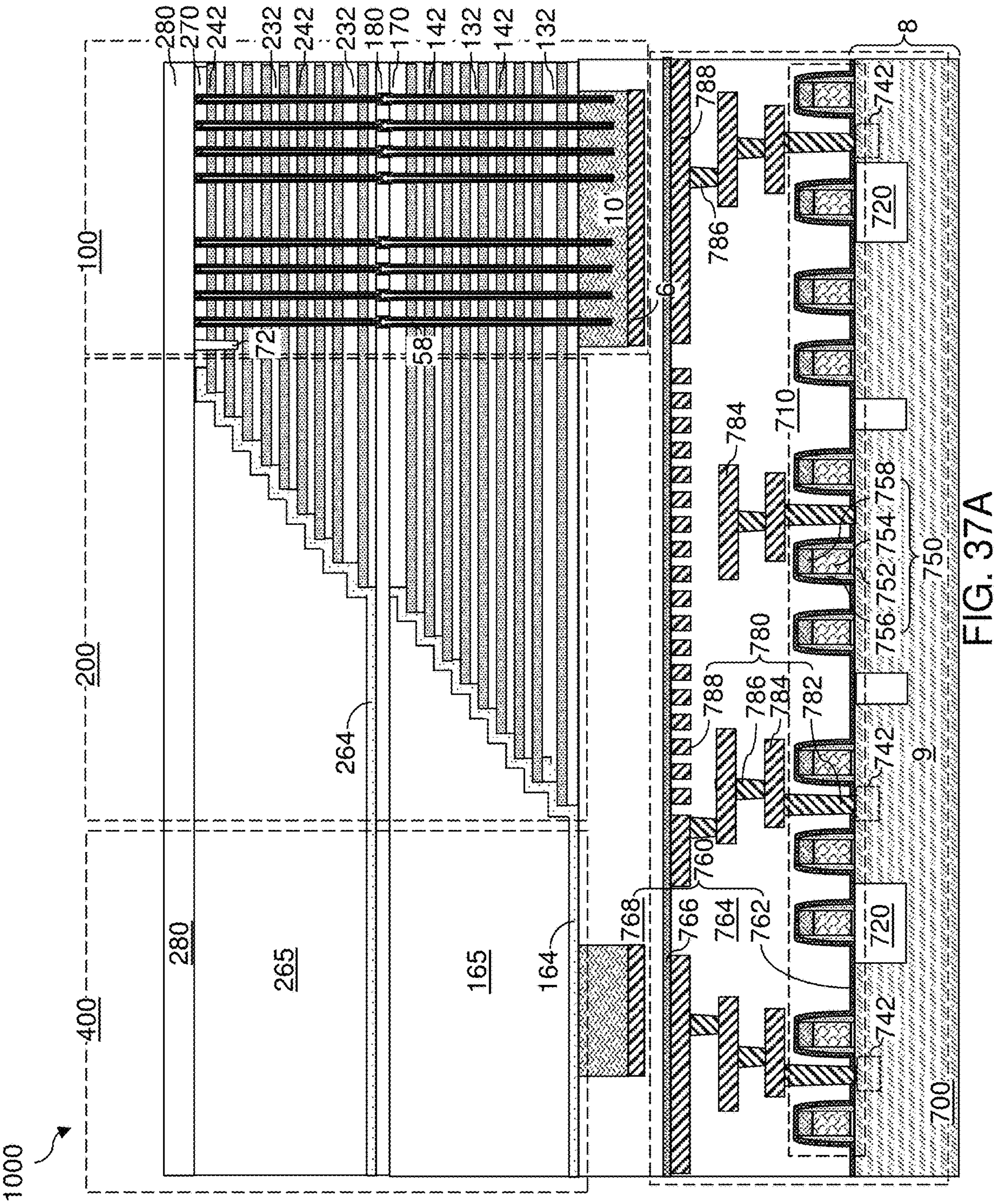
FIG. 37A is a vertical cross-sectional view of the second exemplary structure after formation of memory opening fill structures according to the second embodiment of the present disclosure.
Figure 37B:
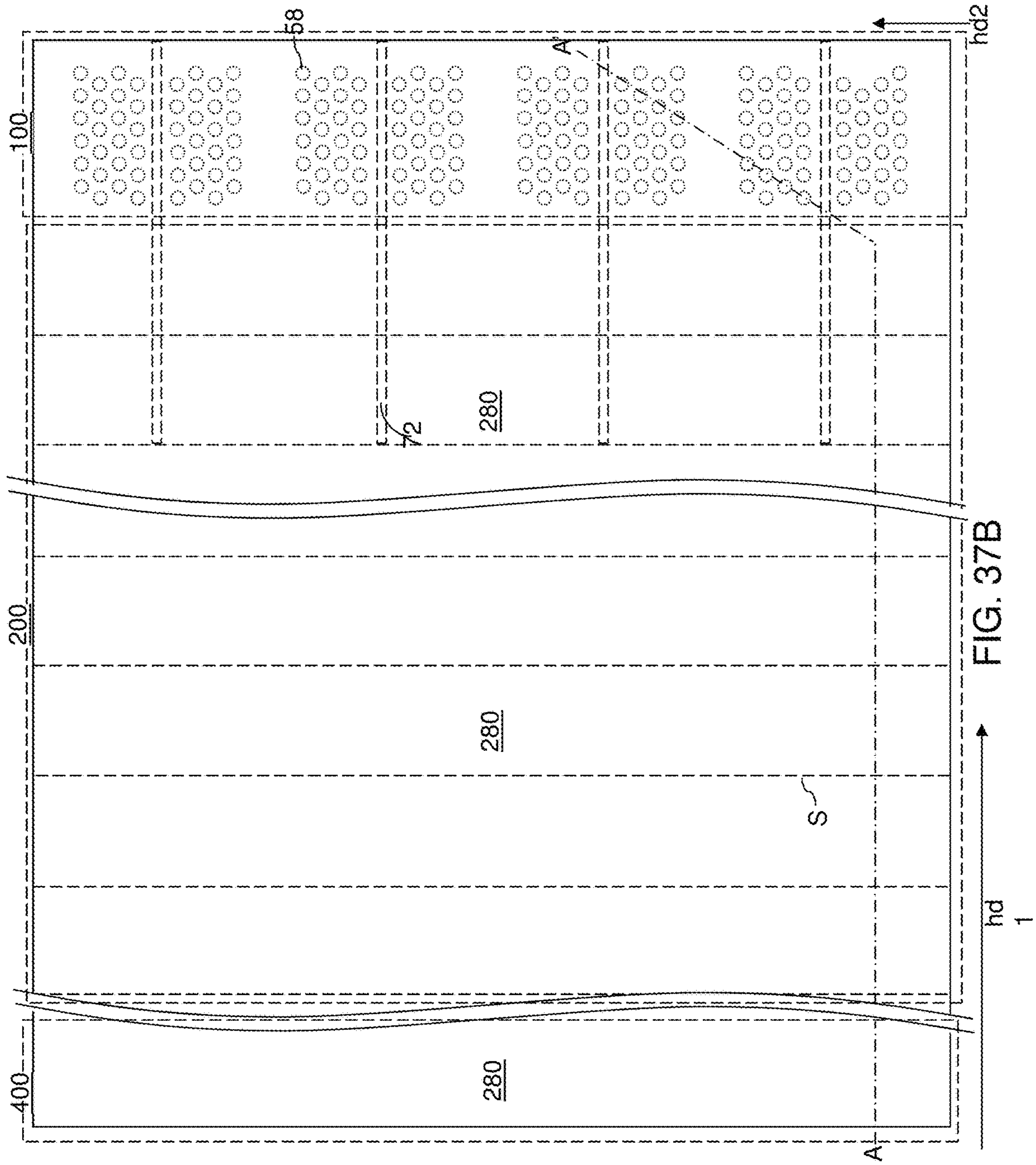
FIG. 37B is a top-down view of the second exemplary structure of FIG. 37A. The hinged vertical plane A-A' corresponds to the plane of the vertical cross-sectional view of FIG. 37A.
Figure 38A:
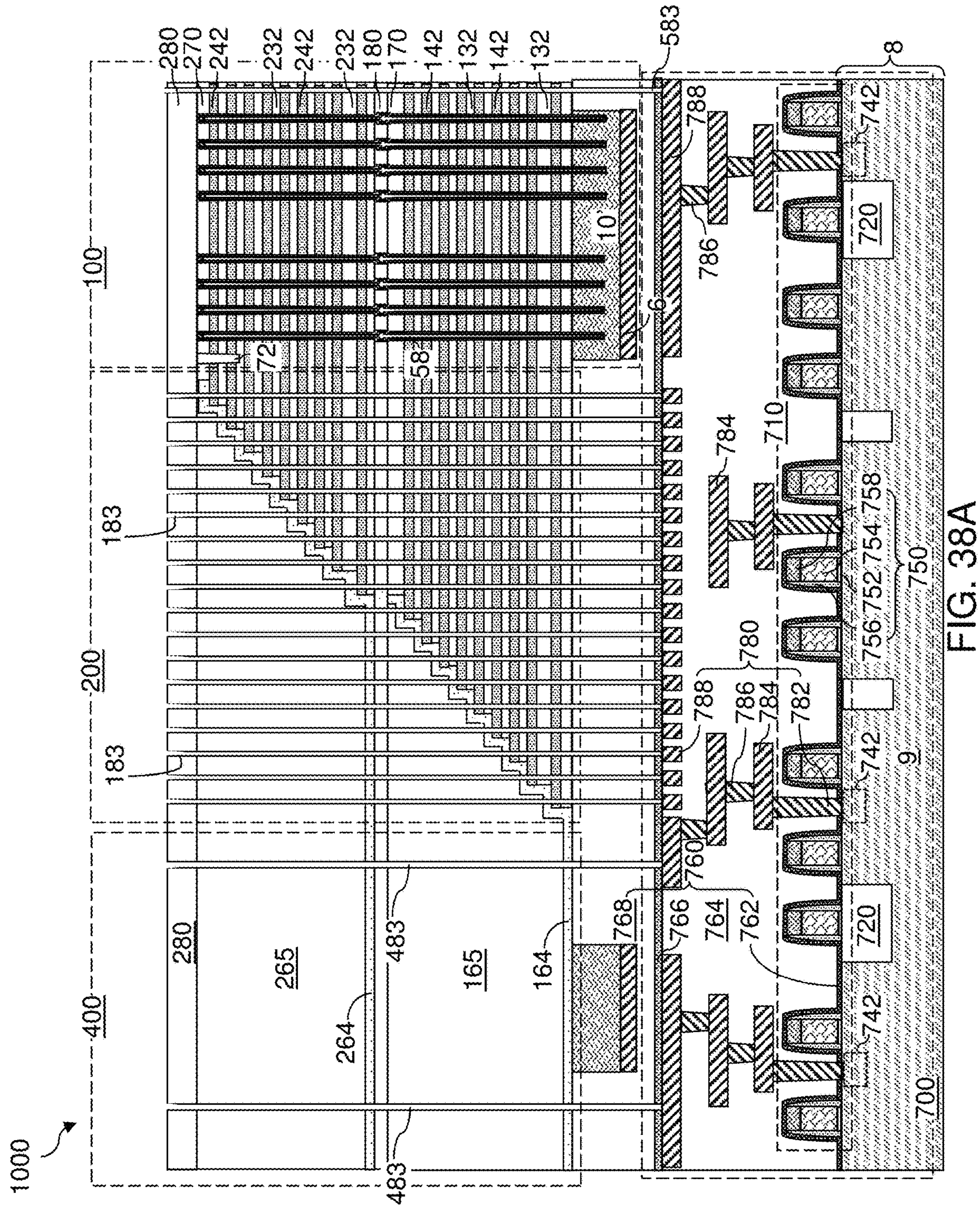
FIG. 38A is a vertical cross-sectional view of the second exemplary structure after formation of staircase region via cavities, peripheral region via cavities, and array region via cavities according to the second embodiment of the present disclosure.
Figure 38B:
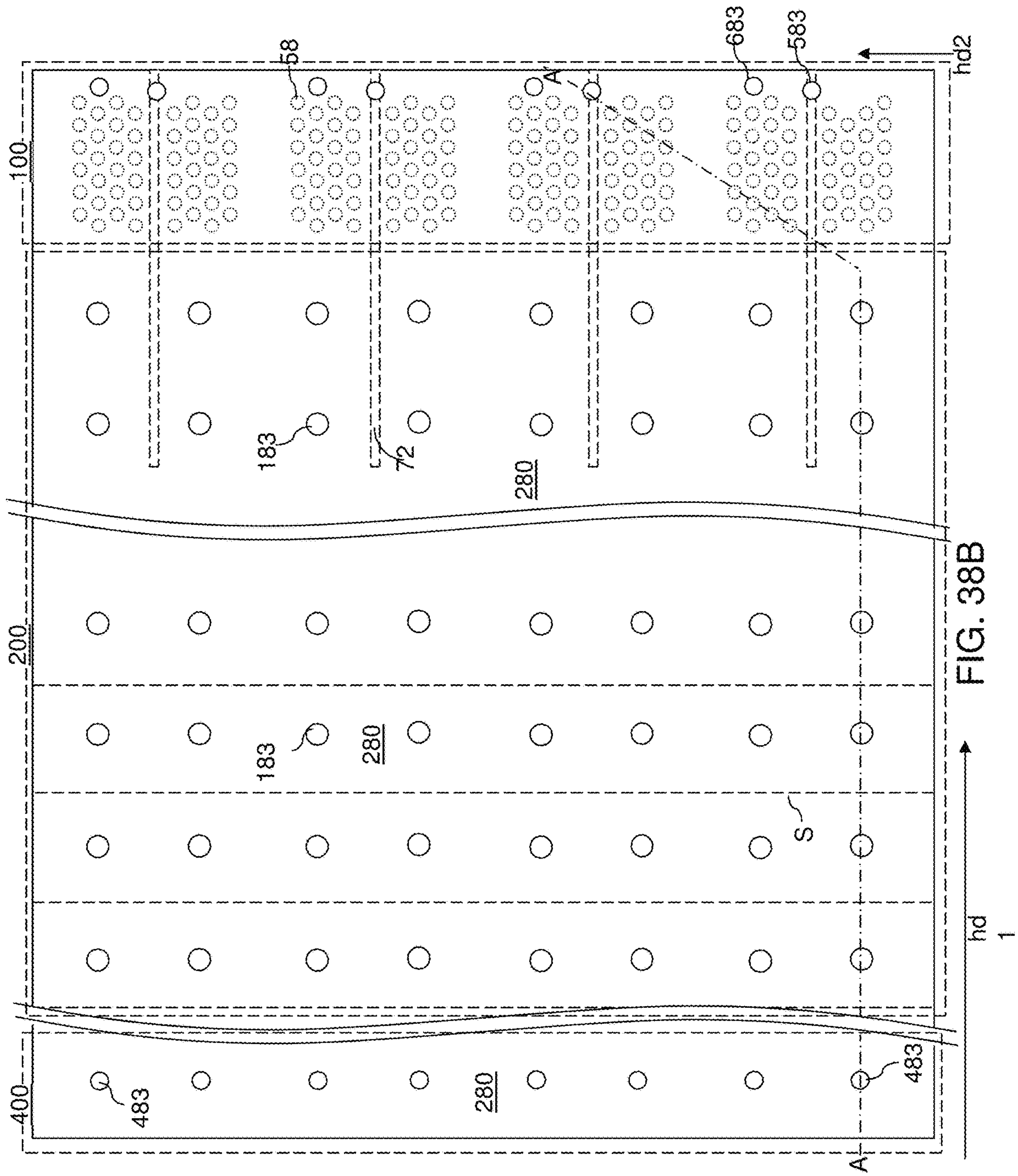
FIG. 38B is a top-down view of the second exemplary structure of FIG. 38A. The hinged vertical plane A-A' corresponds to the plane of the vertical cross-sectional view of FIG. 38A.
Figure 39A:
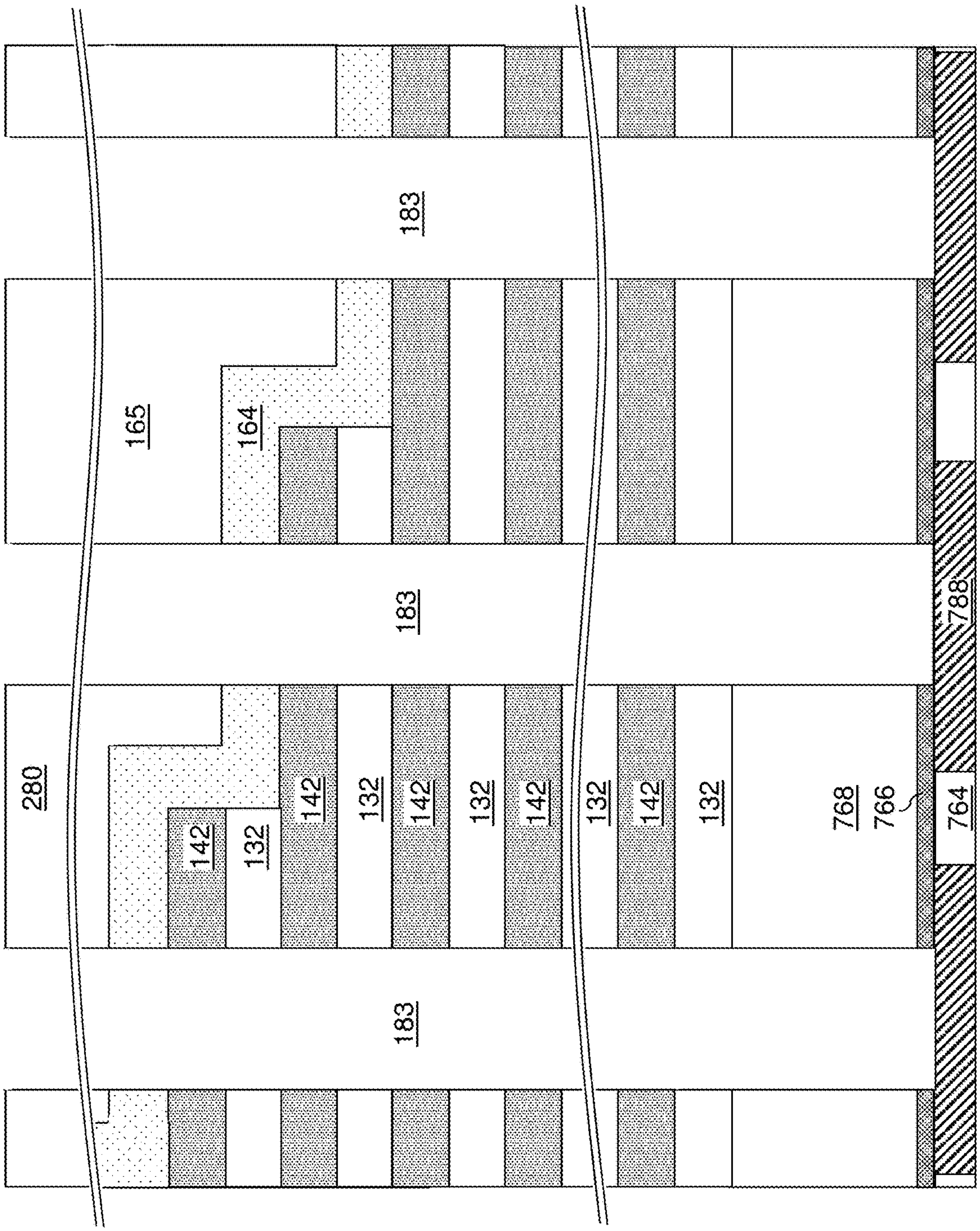
FIGS. 39A, 39B, 39C, and 39D are magnified vertical cross-sectional views of a staircase region via cavity, a peripheral region via cavity, an array region via cavity, and a source contact via cavity, respectively, at the processing steps of FIGS. 38A and 38B.
Figure 39C:
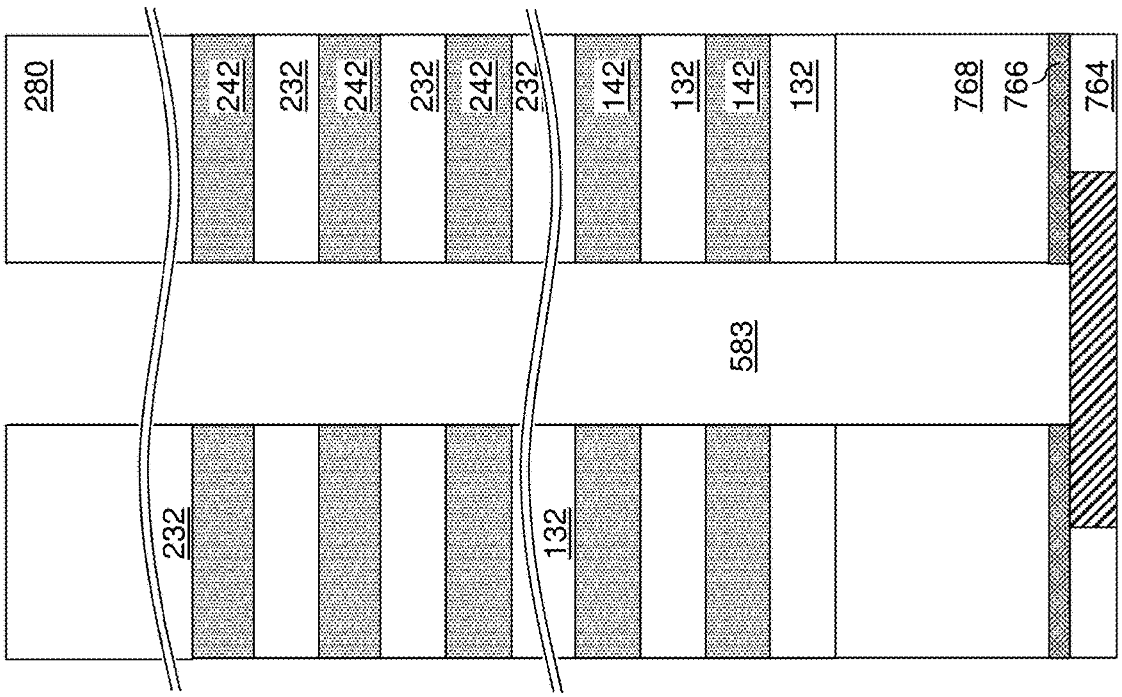
Figure 39B:
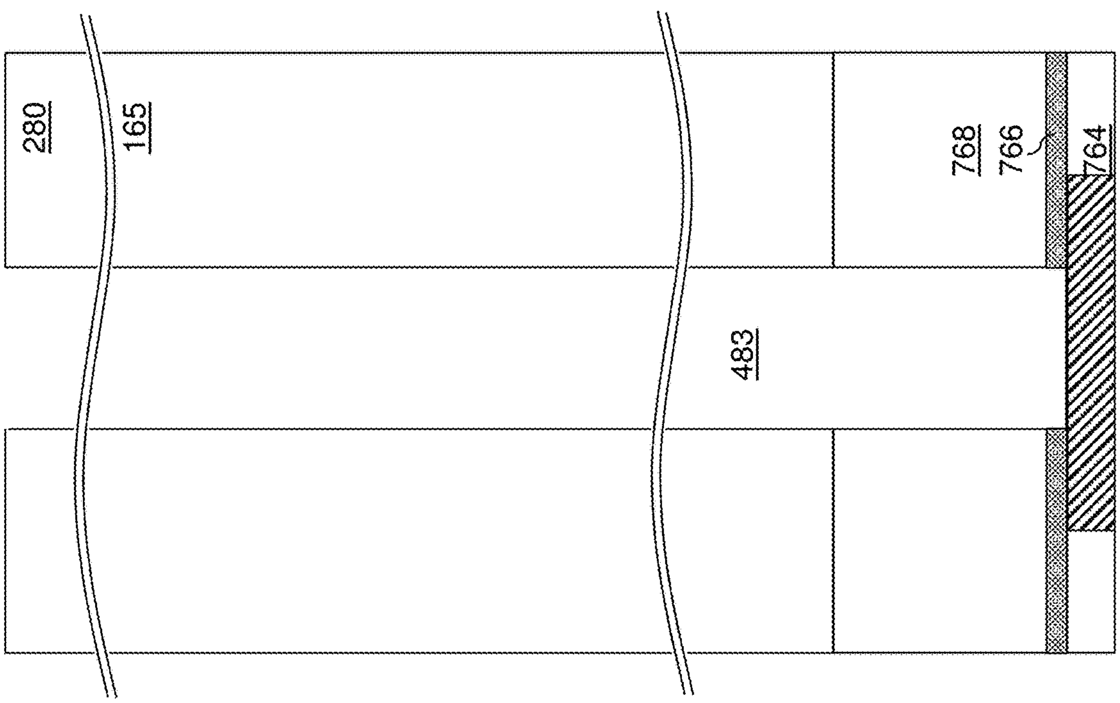
Figure 39D:
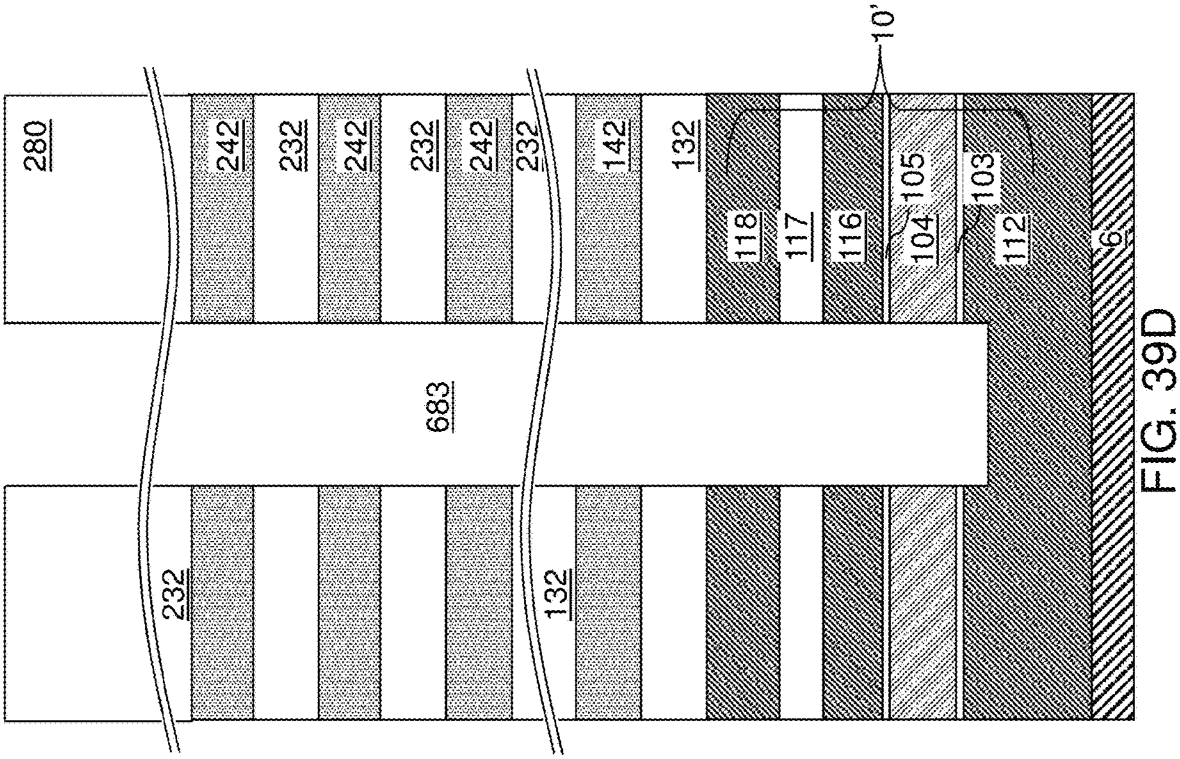
Figure 40A:
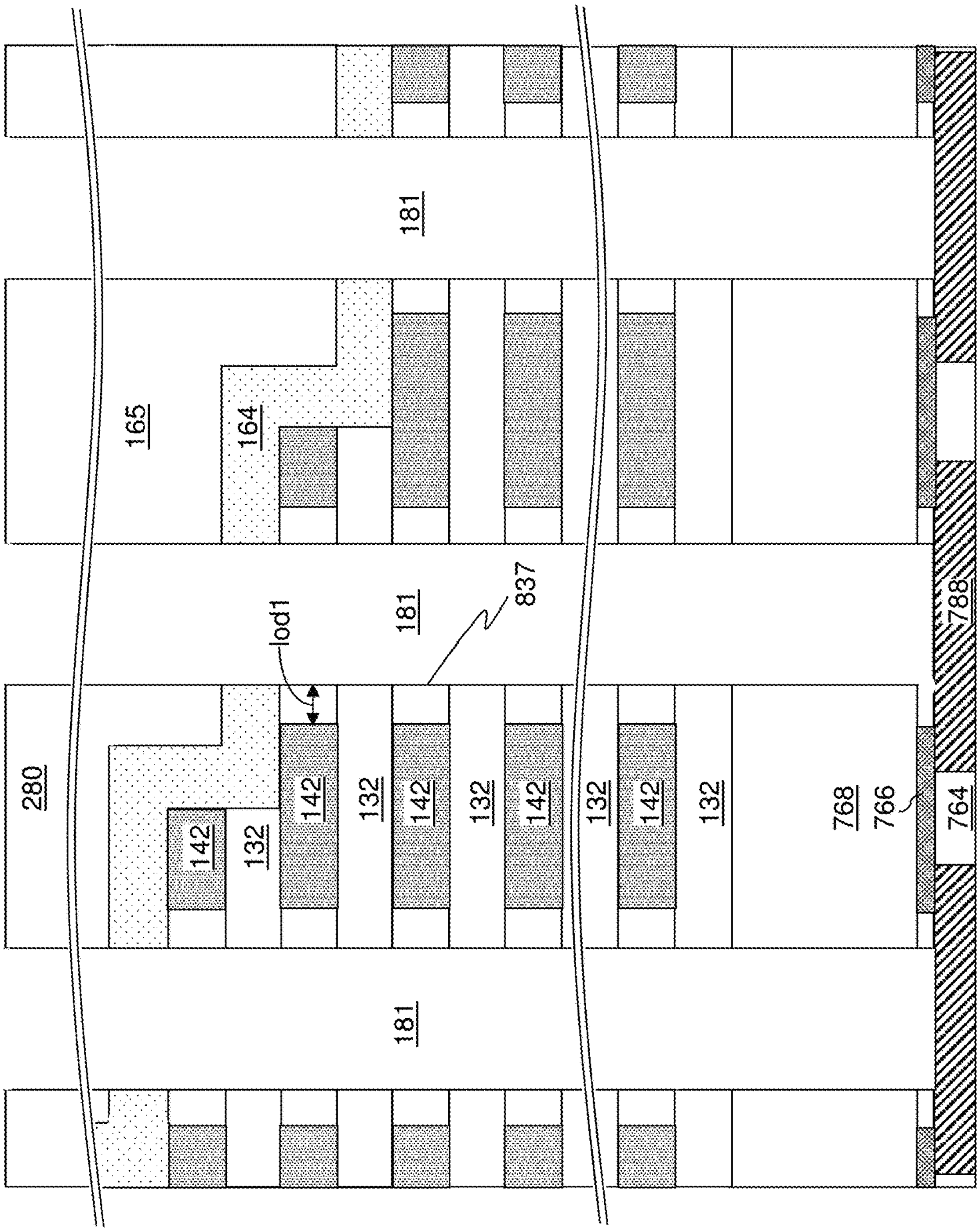
FIGS. 40A, 40B, 40C, and 40D are magnified vertical cross-sectional views of a staircase region via cavity, a peripheral region via cavity, an array region via cavity, and a source contact via cavity, respectively, after a first isotropic etch process that laterally recesses sacrificial material layers according to the second embodiment of the present disclosure.
Figure 40C:
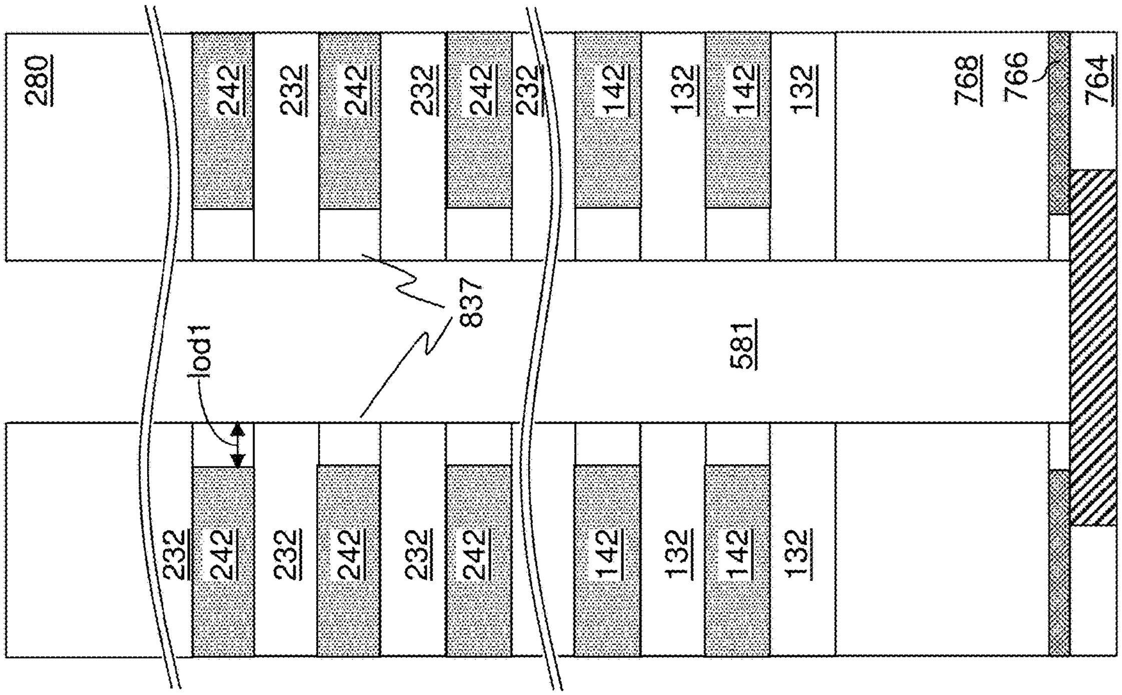
Figure 40B:
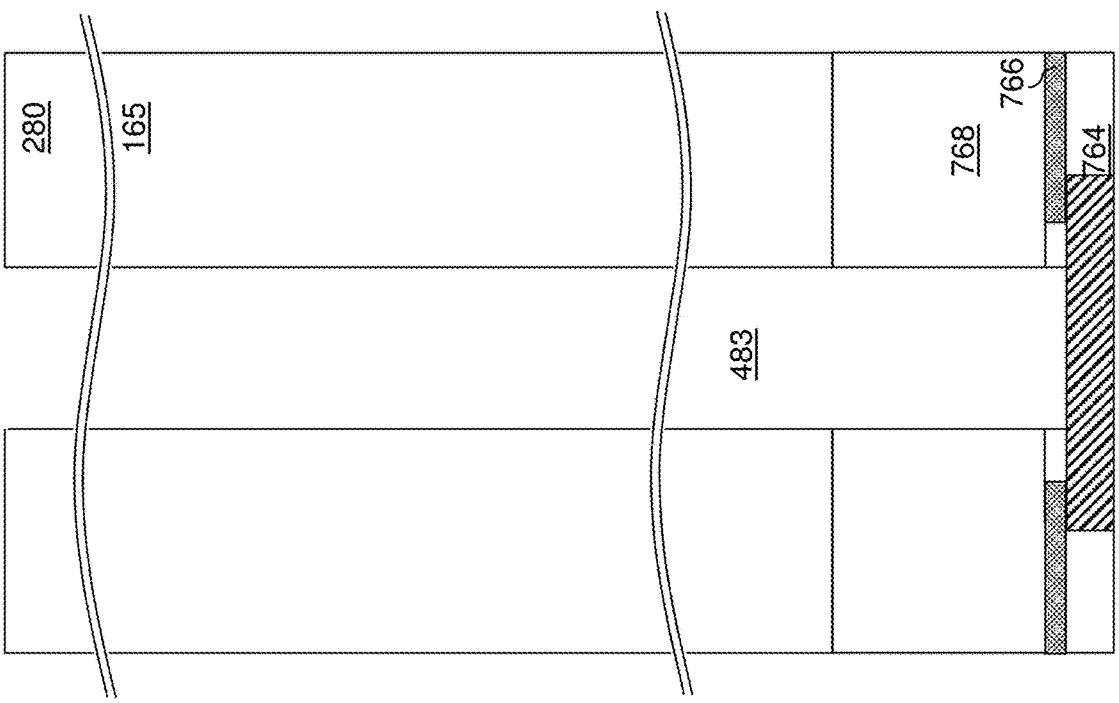
Figure 40D:
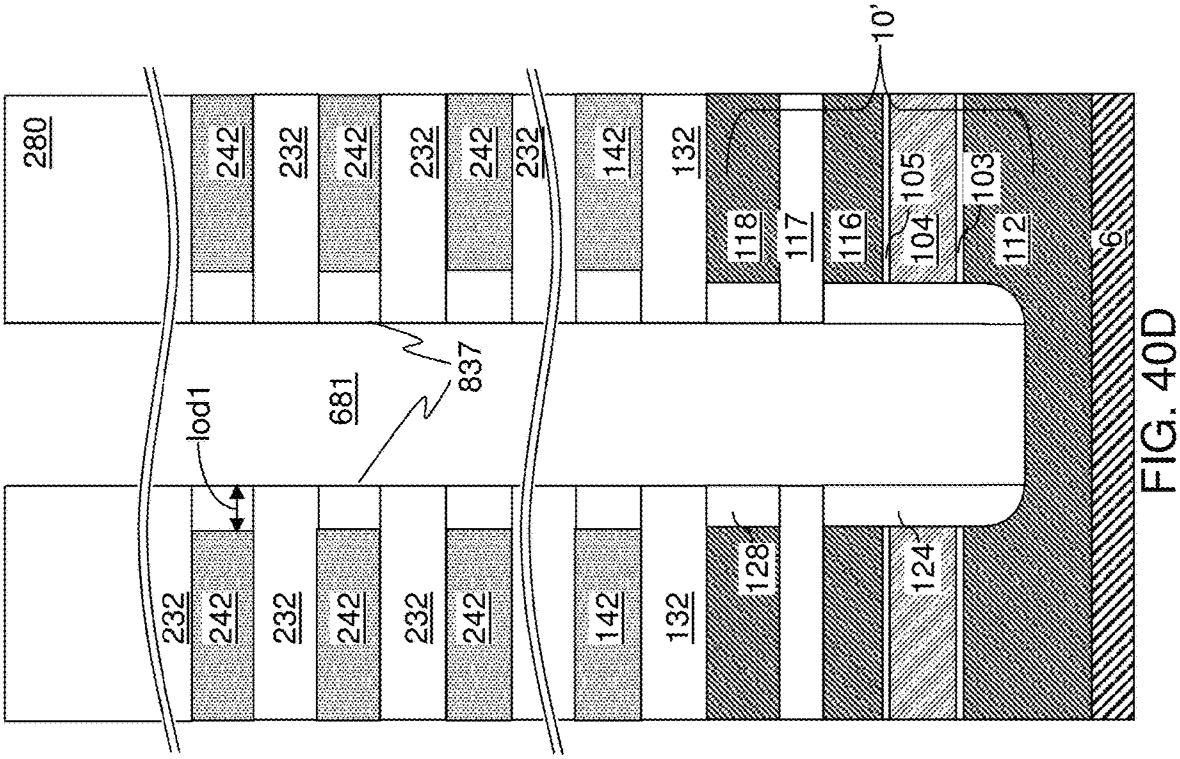
Figure 41A:
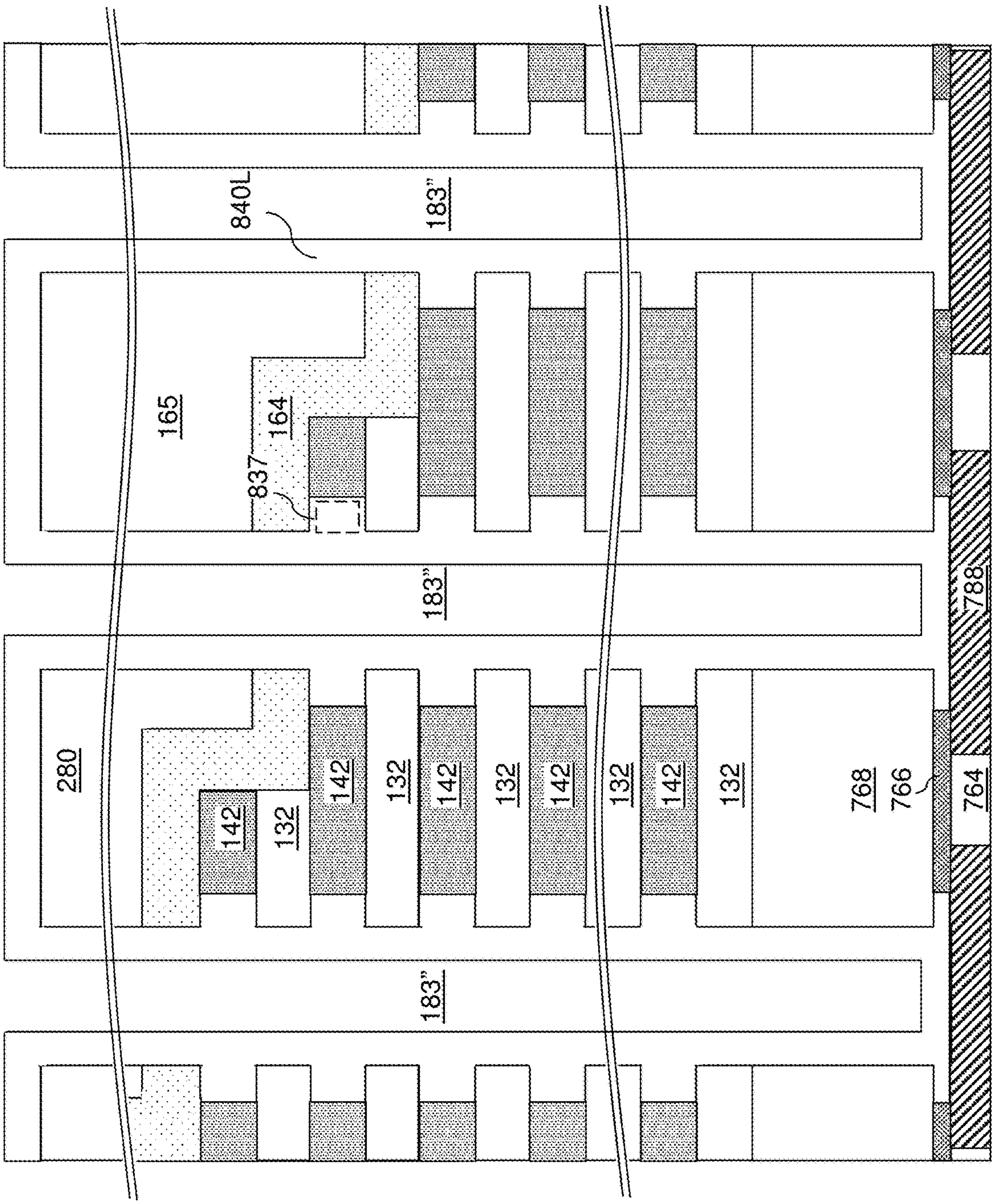
FIGS. 41A, 41B, 41C, and 41D are magnified vertical cross-sectional views of a staircase region via cavity, a peripheral region via cavity, an array region via cavity, and a source contact via cavity, respectively, after deposition of a conformal dielectric via liner according to the second embodiment of the present disclosure.
Figure 41C:
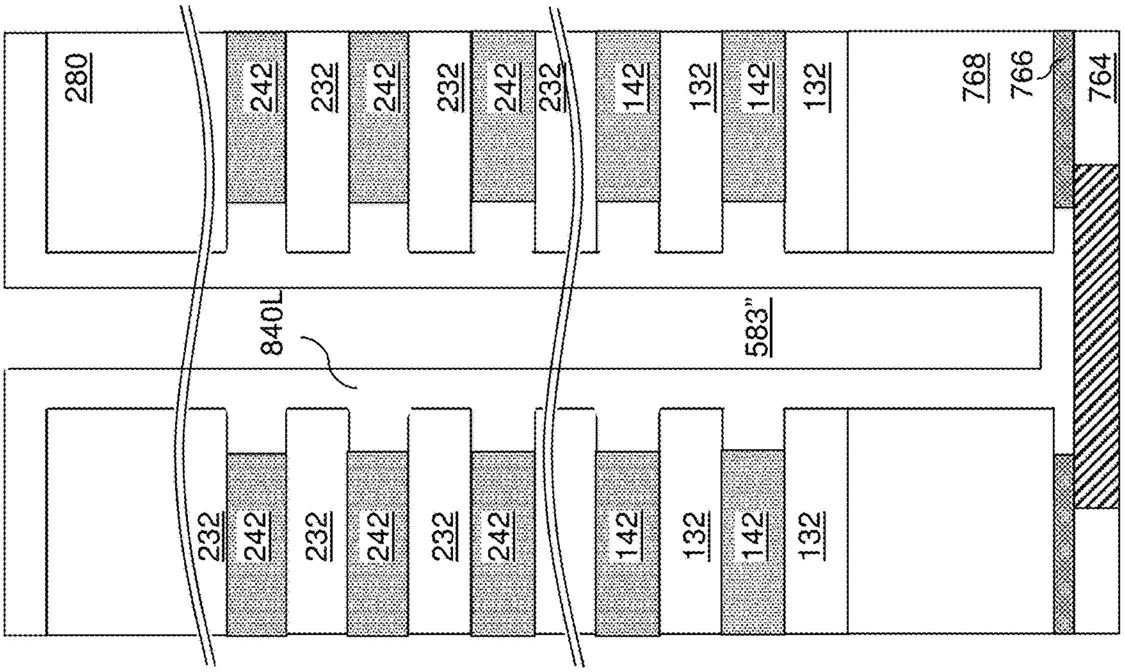
Figure 41B:
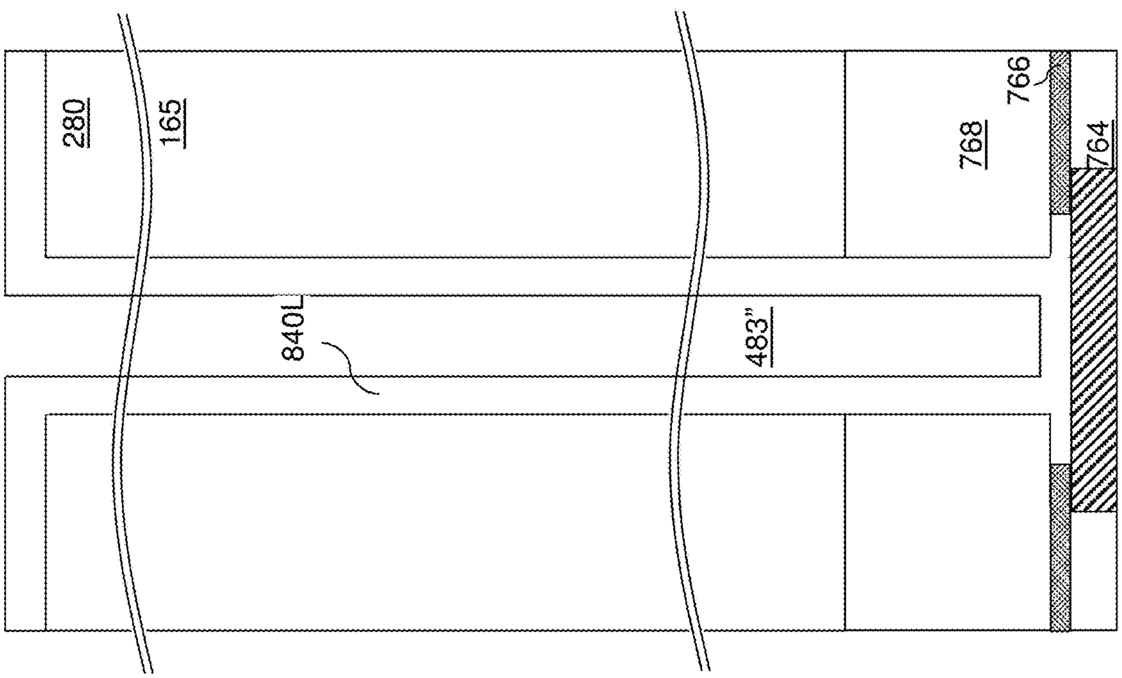
Figure 41D:
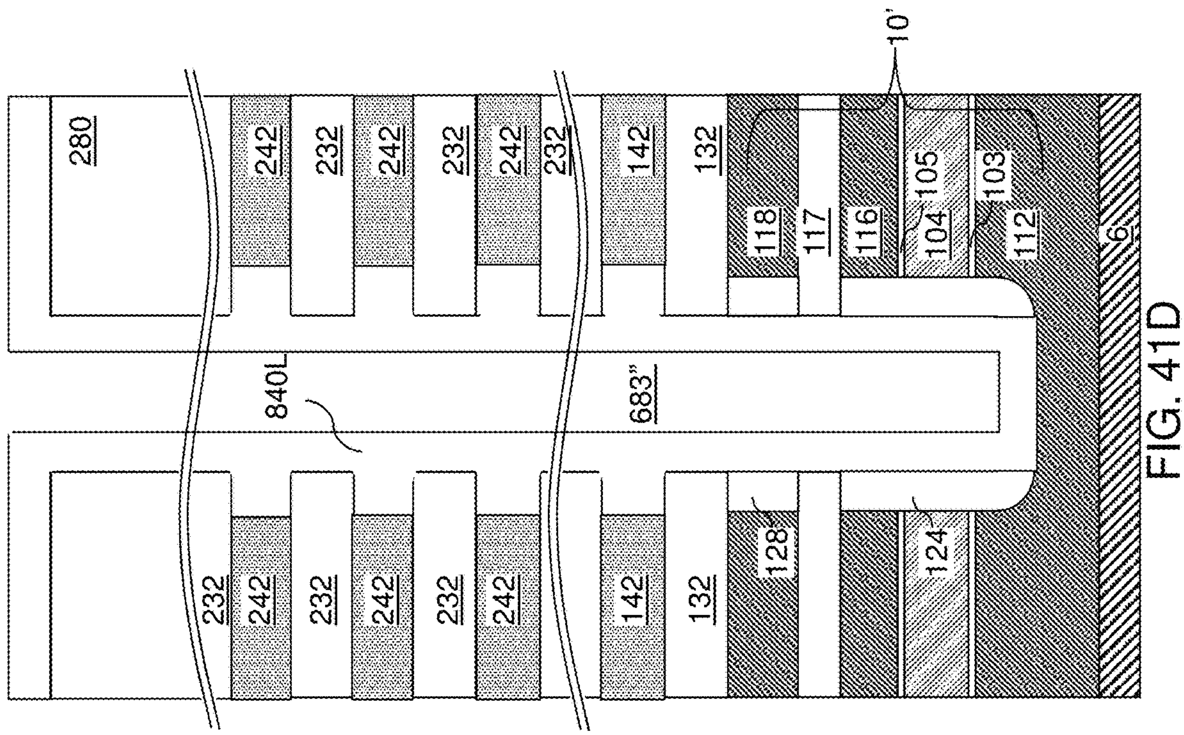
Figure 42A:
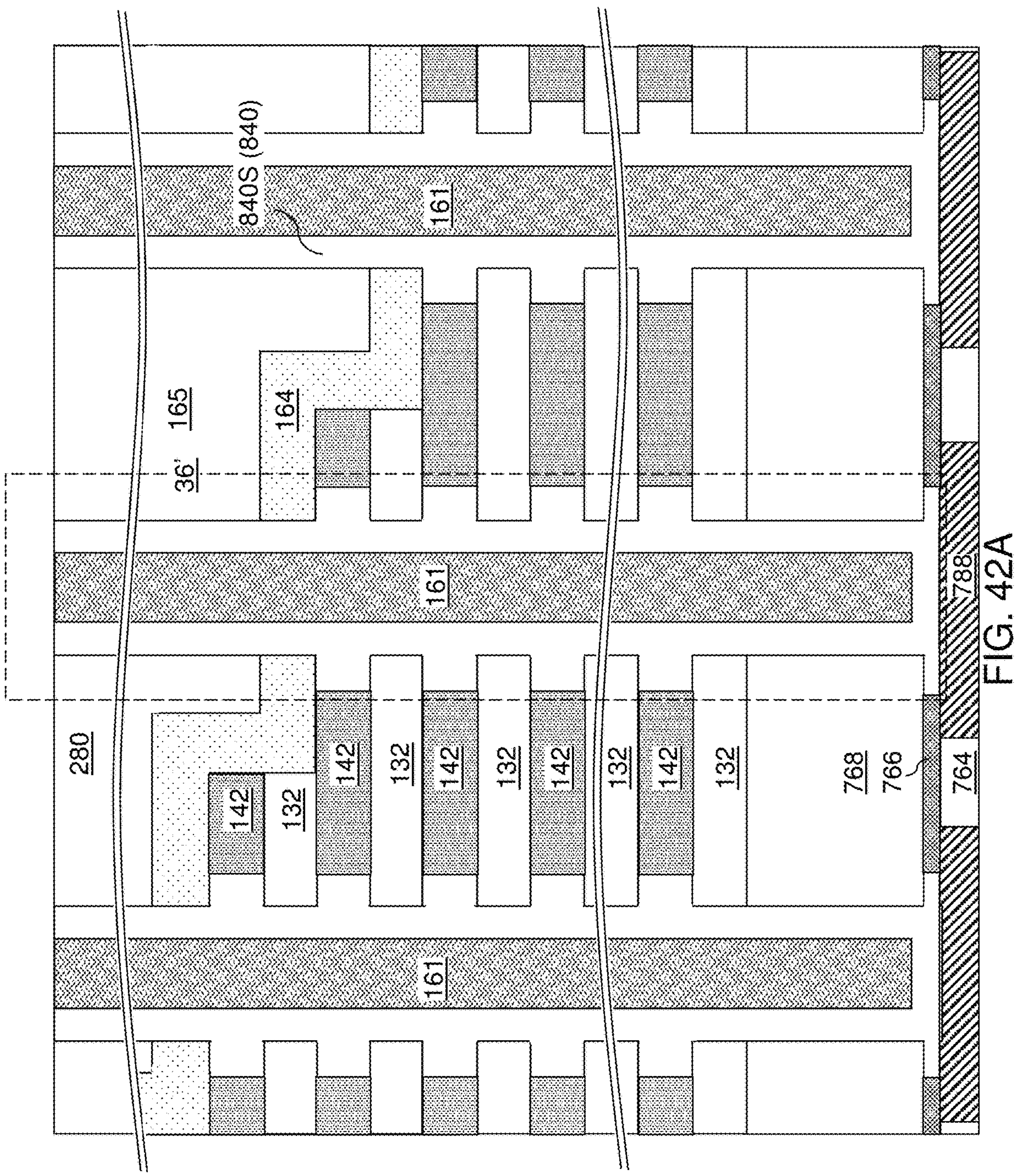
FIGS. 42A, 42B, 42C, and 42D are magnified vertical cross-sectional views of a staircase region via cavity, a peripheral region via cavity, an array region via cavity, and a source contact via cavity, respectively, after formation of various sacrificial via fill material portions therein according to the second embodiment of the present disclosure.
Figure 42B:
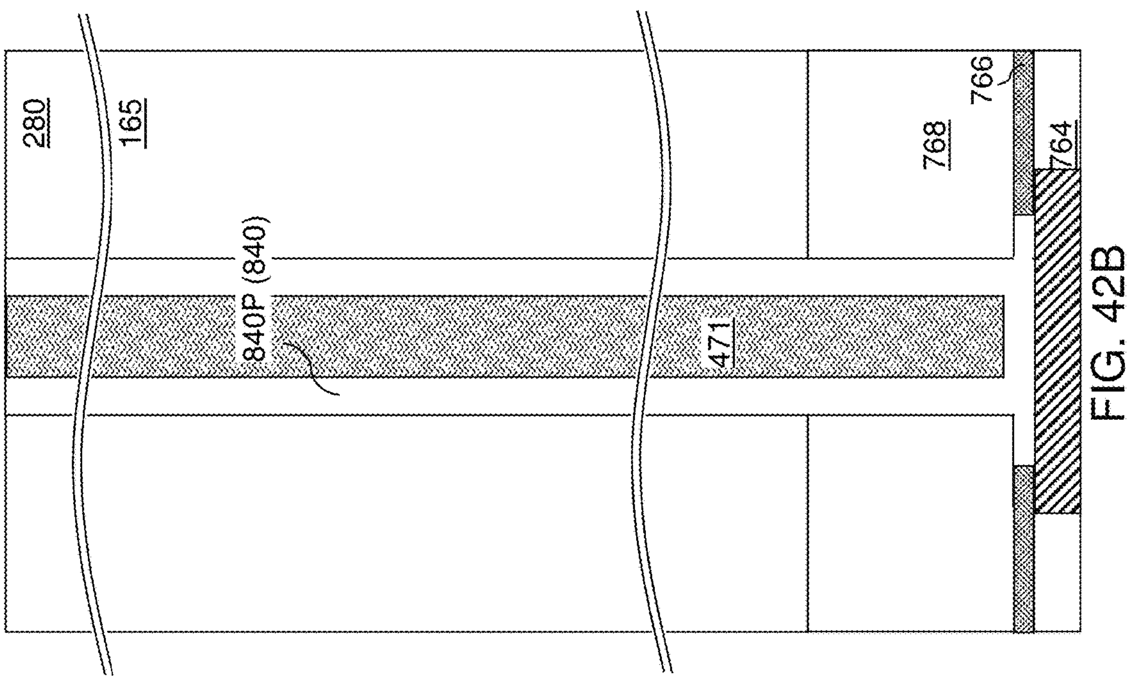
Figure 42C:
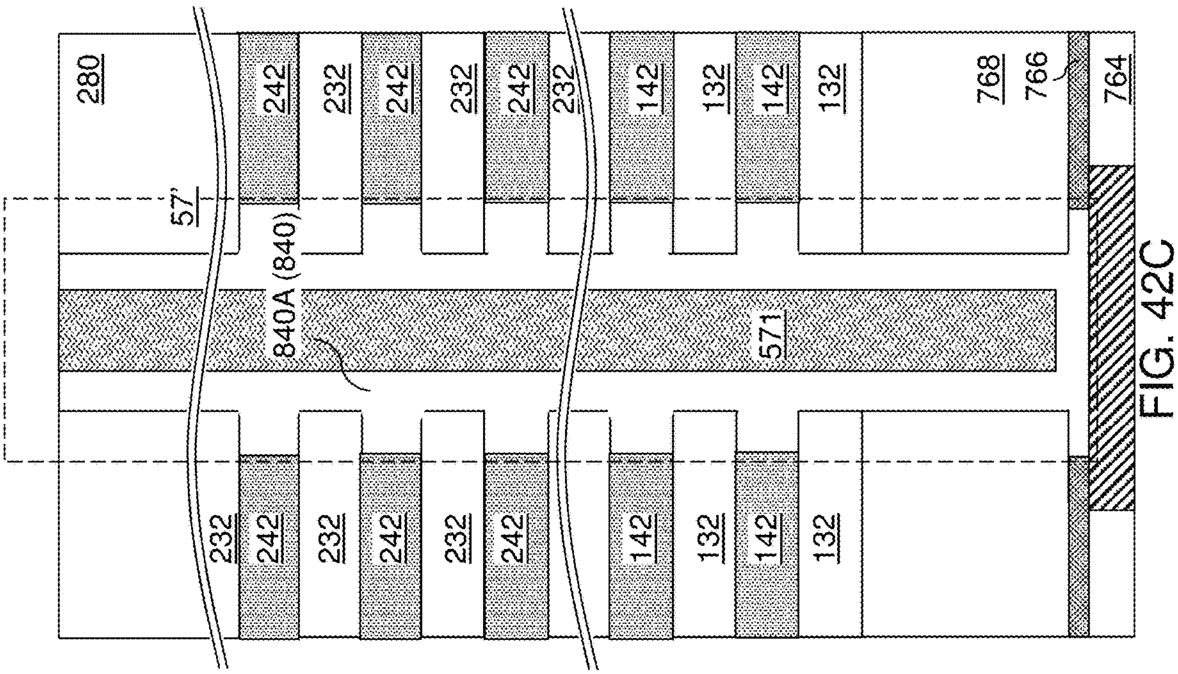
Figure 42D:
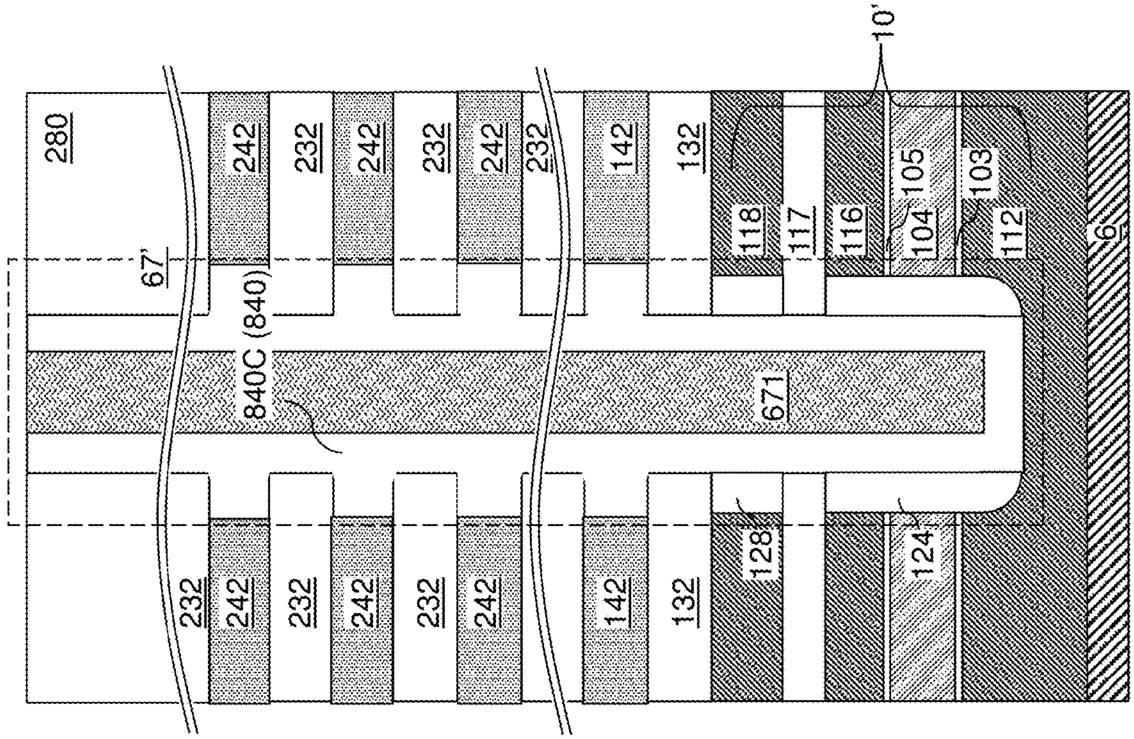

Referring to FIGS. 37A and 37B, an etch process may be performed to remove the sacrificial material of the sacrificial memory opening fill portions 148 selective to the materials of the second alternating stack (232, 242) and the first alternating stack (132, 142) (e.g., $C_4F_8/O_2/Ar$ etch). Upon removal of the sacrificial memory opening fill portions 148, each vertically adjoining pair of a second-tier memory opening 249 and a first-tier memory opening 149 forms a continuous cavity that extends through the first alternating stack (132, 142) and the second alternating stack (232, 242). The continuous cavities are herein referred to as memory openings (or inter-tier memory openings). Surfaces of the in-process source-level material layers 10' may be physically exposed at the bottom of each memory opening 49. Locations of steps S in the first alternating stack (132, 142) and the second alternating stack (232, 242) are illustrated as dotted lines.

A memory opening fill structure 58 may be formed in each of the memory openings. For example, the processing steps discussed above with reference to FIGS. 11A-11D may be used to form memory opening fill structures 58 in the memory openings. Each of the memory stack structures 58 comprises a vertical stack of charge storage elements (comprising a charge storage layer 54), a tunneling dielectric layer 56 laterally surrounded by the vertical stack of charge storage elements, and a vertical semiconductor channel 60 laterally surrounded by the tunneling dielectric layer 56 as illustrated in FIG. 11D. The in-process source-level material layers 10', the first-tier structure (132, 142, 170, 165), the second-tier structure (232, 242, 270, 265), the inter-tier dielectric layer 180, and the memory opening fill structures 58 collectively constitute a memory-level assembly.

A first contact level dielectric layer 280 may be formed over the memory-level assembly. The first contact level dielectric layer 280 is formed at a contact level through which various contact via structures are subsequently formed to the drain regions 63 and the various electrically conductive layers that replaces the sacrificial material layers (142, 242) in subsequent processing steps.

Referring to FIGS. 38A, 38B, and 39A-39D, a photoresist layer (not shown) may be applied over the first contact level dielectric layer 280, and may be lithographically patterned to form various openings in areas in which via cavities are to be subsequently formed. The openings may be formed adjacent to the memory stack structures 58 in the memory array region 100, over horizontal surfaces of the stepped surfaces in the staircase region 200, and in the peripheral device region 400. An anisotropic etch process may be performed to transfer the pattern of the openings in the photoresist layer through the various material portions in the memory-level assembly. Various contact via cavities (183, 483, 583, 683) may be formed through the memory-level assembly. Specifically, a first subset (183, 483, 583) of the various contact via cavities (183, 483, 583, 683) may vertically extend to the top surfaces of the topmost lower-level metal line structures 788. A second subset 683 of the various contact via cavities (183, 483, 583, 683) may vertically extend through the alternating stacks (132, 142, 232, 246) to the lower source layer 112. In one embodiment, the lower-level metal interconnect structures 780 and the source-level sacrificial layer 104 may function as an etch stop layer, and a terminal steps of the anisotropic etch process may include processing steps for etching the source-level sacrificial layer 104 and the lower sacrificial liner 103.

The various contact via cavities (183, 483, 583, 683) that are formed through the memory-level assembly include staircase region via cavities 183 that extend through a respective one of the horizontal surfaces of the stepped surfaces in the staircase region 200, peripheral region via cavities 483 that extend through the retro-stepped dielectric material portions (265, 165) in the peripheral device region 400, optional array region via cavities 583 that are formed through the alternating stacks (132, 142, 232, 242) in the memory array region 100 and extend to a respective one of the lower-level metal interconnect structures 780, and source contact via cavities 683 that extend through the alternating stacks (132, 142, 232, 242) and stop on the source-level sacrificial layer 104. In one embodiment, each of the various contact via cavities (183, 483, 583, 683) may be a cylindrical via cavity. Each staircase region via cavity 183 may be a cylindrical via cavity that extends through a second retro-stepped dielectric material portion 265 and a subset of layers within the second alternating stack (232, 242) and the first alternating stack (132, 142) over the lower-level metal interconnect structures 780. A top surface of a respective one of the lower-level metal interconnect structures 780 (such as the topmost lower-level metal line structures 788) may be physically exposed at the bottom of each of the various contact via cavities (183, 483, 583).

Referring to FIGS. 40A, 40B, 40C, and 40D, an oxidation process may be performed to convert physically exposed surface portions of the source-select-level conductive layer 118, the upper source layer 116, the source-level sacrificial layer 104, the lower source layer 112 and the sacrificial material layers (142, 242). A thermal oxidation process or a plasma oxidation process may be used. Semiconductor oxide material portions (such as silicon oxide portions) may be formed at the level of the in-process source-level material layers 10' around each source contact via cavity 683. Silicon oxide or silicon oxynitride rib portions 837 may be formed by oxidation of the exposed edges of the silicon nitride sacrificial material layers (142, 242). An anisotropic etch process may be performed to remove a horizontal portion of each semiconductor oxide material portion located on top surfaces of the lower source layer. Remaining vertical portions of the semiconductor oxide material portions may include annular source-select-level semiconductor oxide spacers 128 contacting the source-select-level conductive layer 118, and annular buried-source-level semiconductor oxide spacers 124 contacting the upper source layer 116, the source-level sacrificial layer 104, and the lower source layer 112.

The oxidation of the silicon nitride sacrificial material layers (142, 242) provides a first lateral offset distance lod1 between sidewalls of the insulating layers (132, 232) and sidewalls of the remaining sacrificial material layers (142, 242). The first lateral offset distance lod1 may be in a range from 5 nm to 40 nm, such as from 10 nm to 20 nm, although lesser and greater thicknesses may also be used. The first lateral offset distance lod1 (i.e., the width of the rib portions 837) may be the same as or different from the width of the semiconductor oxide portions (124, 128). Each staircase region via cavity 183 may be converted from a cylindrical via cavity to a staircase region via cavity 181. Each array region via cavity 583 may be converted to an array region via cavity 581. Each source contact via cavity 683 may be converted to a source contact via cavity 681.

Referring to FIGS. 41A-41D, an optional conformal dielectric via liner 840L may be deposited at the periphery of the staircase region via cavities 181, the peripheral region via cavities 483, the array region via cavities 581, and the source contact via cavities 681 by a conformal deposition process. The conformal dielectric via liner 840L includes a dielectric material that is different from the material of the sacrificial material layers (142, 242). Further, the dielectric material of the conformal dielectric via liner 840L has a lower etch rate in 100:1 dilute hydrofluoric acid than the materials of the first dielectric liner 164 and the second dielectric liner 264. For example, the conformal dielectric via liner 840L may include silicon oxide or a dielectric metal oxide (such as aluminum oxide). In one embodiment, the conformal dielectric via liner 840L may include undoped silicate glass formed by atomic layer deposition. The thickness of the conformal dielectric via liner 840L may be less than one half of the width of the respective via cavity. Alternatively, the conformal dielectric via liner 840L may be omitted.

The conformal dielectric via liner 840L may be formed directly on each physically exposed top surface of the lower-level metal interconnect structures 780 (such as the physically exposed top surfaces of the topmost lower-level metal line structures 788). An unfilled void 183" may be present within each staircase region via cavity 181 after deposition of the conformal dielectric via liner 840L. An unfilled void 483" may be present within each peripheral region via cavity 483 after deposition of the conformal dielectric via liner 840L. An unfilled void 583" may be present within each array region via cavity 581 after deposition of the conformal dielectric via liner 840L. An unfilled void 683" may be present within each source contact via cavity 681 after deposition of the conformal dielectric via liner 840L.

Referring to FIGS. 42A-42D, a sacrificial via fill material may be deposited in each of the unfilled voids (183", 483", 583", 683") in the staircase region via cavities, the peripheral region via cavities, the array region via cavities, and the source contact via cavities by a conformal deposition process. Various sacrificial via fill material portions (161, 471, 571, 671) may be formed in the unfilled voids (183", 483", 583", 683") by deposition of the sacrificial via fill material and planarization of the sacrificial via fill material from above the top surface of the first contact level dielectric layer 280. The sacrificial via fill material is a material that may be removed selective to the material of the conformal dielectric via liner 840L. For example, the sacrificial via fill material may comprise a semiconductor material such as amorphous silicon. The sacrificial via fill material may be deposited by a non-conformal deposition process or a conformal deposition process. Planarization of the sacrificial via fill material may be performed by a chemical mechanical planarization (CMP) process or by a recess etch process. Horizontal portions of the conformal dielectric via liner 840L may be removed from above the top surface of the first contact level dielectric layer 280 by the planarization process.

Each remaining portion of the sacrificial material filling the voids constitutes a sacrificial via fill material portion (161, 471, 571, 671). The sacrificial via fill material portions (161, 471, 571, 671) include staircase region sacrificial via fill material portions 161 formed in the staircase region via cavities, peripheral region sacrificial via fill material portions 471 formed in the peripheral region via cavities, array region sacrificial via fill material portions 571 formed in the array region via cavities, and source contact sacrificial via fill material portions 671 formed in the source contact via cavities. Each remaining portion of the conformal dielectric via liner 840L in the various via cavities constitute an optional dielectric via liner 840. The insulating liners 840 include staircase region ribbed dielectric via liners 840S (which include the rib portions 837 described above), peripheral region dielectric via liners 840P, array region ribbed dielectric via liners 840A (which include the rib portions 837 described above), and source contact ribbed dielectric via liners 840C. Each adjoining set of a staircase region ribbed dielectric via liner 840S and a staircase region sacrificial via fill material portion 161 constitutes a staircase region sacrificial via structure 36'. Each adjoining set of an array region ribbed dielectric via liner 840A and an array region sacrificial via fill material portion 571 constitutes an array region sacrificial via structure 57'. Each adjoining set of a source contact ribbed dielectric via liner 840C and a source contact sacrificial via fill material portion 671 constitutes a source contact sacrificial via structure 67'.

Figure 43:
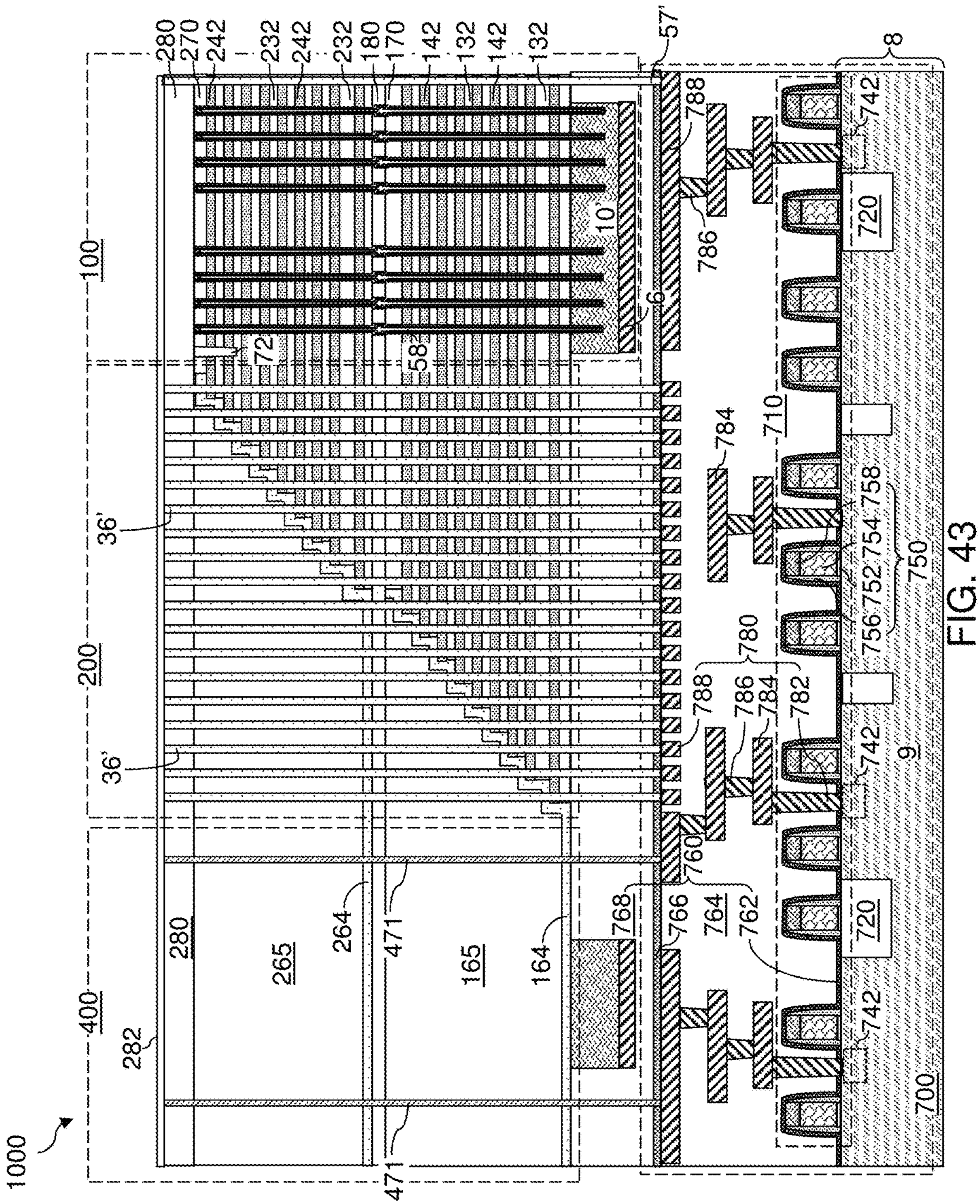
FIG. 43 is a vertical cross-sectional view of the second exemplary structure after formation of a sacrificial cover dielectric layer according to the second embodiment of the present disclosure.

Referring to FIG. 43, a sacrificial cover dielectric layer 282 may be deposited over the first contact level dielectric layer 280. The sacrificial cover dielectric layer 282 includes a dielectric material that protects the various sacrificial via fill material portions (161, 471, 571, 671) during subsequent etch processes. For example, the sacrificial cover dielectric layer 282 may include silicon oxide such as undoped silicate glass formed by decomposition of TEOS. The thickness of the sacrificial cover dielectric layer 282 may be in a range from 10 nm to 100 nm, although lesser and greater thicknesses may also be used.

Figure 44A:
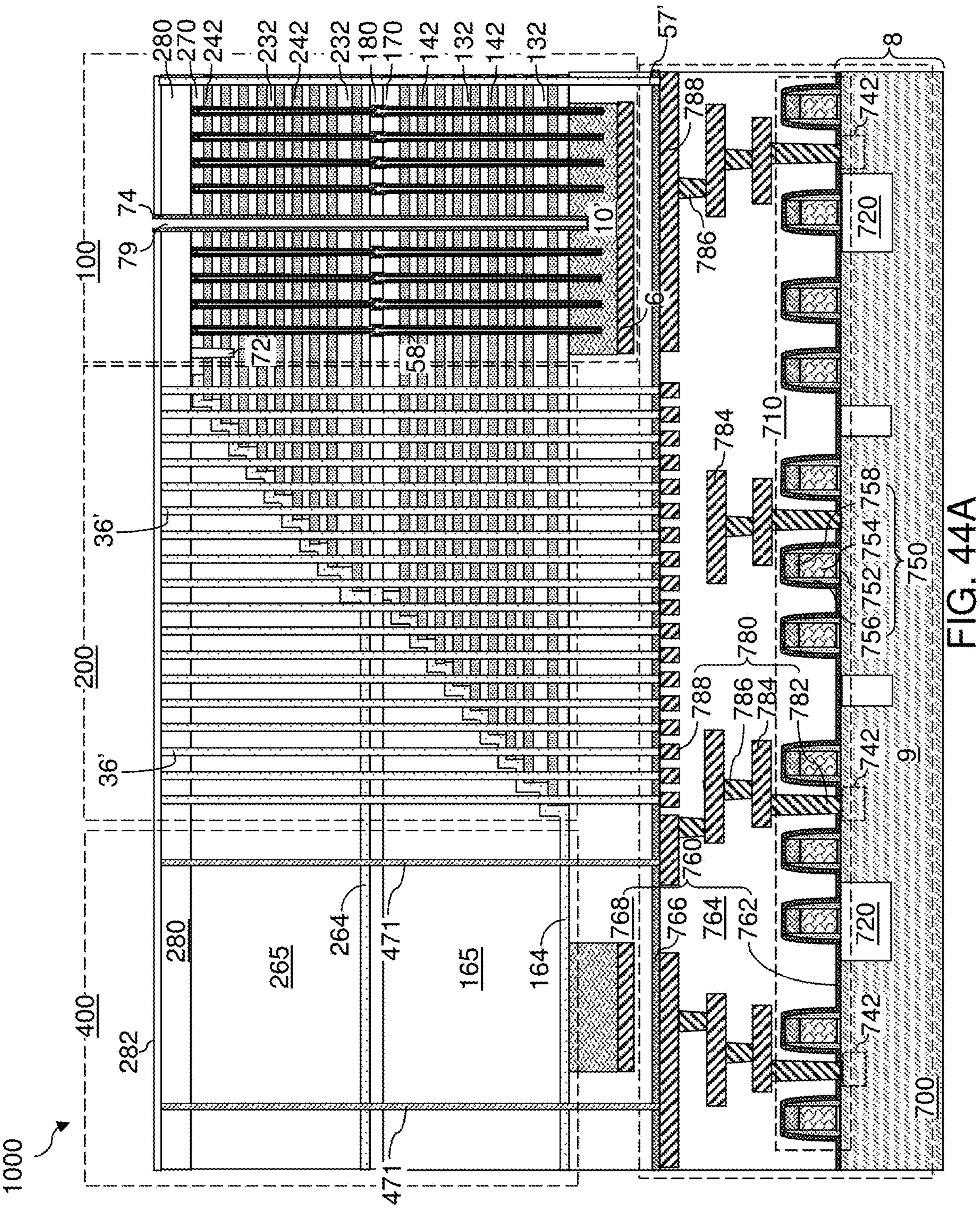
FIG. 44A is a vertical cross-sectional view of the second exemplary structure after formation of backside trenches according to the second embodiment of the present disclosure.
Figure 44B:
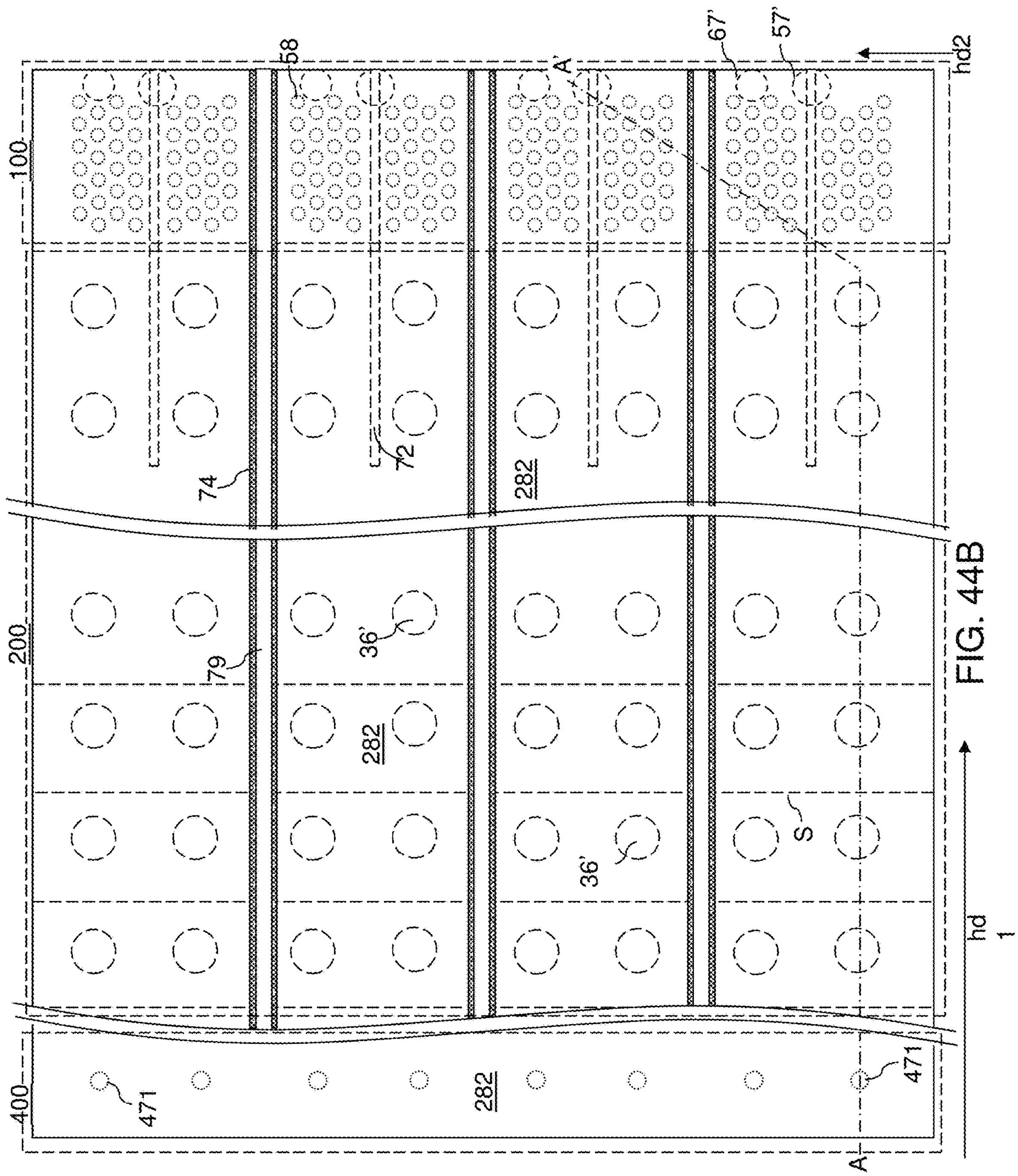
FIG. 44B is a top-down view of the second exemplary structure of FIG. 44A. The hinged vertical plane A-A' corresponds to the plane of the vertical cross-sectional view of FIG. 44A.

Referring to FIGS. 44A and 44B, backside trenches 79 are subsequently formed through the sacrificial cover dielectric layer 282 and the first contact level dielectric layer 280 and the memory-level assembly. For example, a photoresist layer may be applied and lithographically patterned over the sacrificial cover dielectric layer 282 to form elongated openings that extend along the first horizontal direction hd1. An anisotropic etch is performed to transfer the pattern in the patterned photoresist layer through a predominant portion of the memory-level assembly to the in-process source-level material layers 10'. For example, the backside trenches 79 may extend through the optional source-select-level conductive layer 118, the source-level insulating layer 117, the upper source layer 116, and the upper sacrificial liner 105 and into the source-level sacrificial layer 104. The optional source-select-level conductive layer 118 and the source-level sacrificial layer 104 may be used as etch stop layers for the anisotropic etch process that forms the backside trenches 79. The photoresist layer may be subsequently removed, for example, by ashing.

The backside trenches 79 extend along the first horizontal direction hd1, and thus, are elongated along the first horizontal direction hd1. The backside trenches 79 may be laterally spaced from one another along a second horizontal direction hd2, which may be perpendicular to the first horizontal direction hd1. The backside trenches 79 may extend through the memory array region 100 (which may extend over a memory plane) and the staircase region 200. The backside trenches 79 may laterally divide the memory-level assembly into memory blocks.

Backside trench spacers 74 may be formed on sidewalls of the backside trenches 79 by conformal deposition of a dielectric spacer material and an anisotropic etch of the dielectric spacer material. The dielectric spacer material is a material that may be removed selective to the materials of first and second insulating layers (132, 232). For example, the dielectric spacer material may include silicon nitride. The lateral thickness of the backside trench spacers 74 may be in a range from 4 nm to 60 nm, such as from 8 nm to 30 nm, although lesser and greater thicknesses may also be used.

Figure 45:
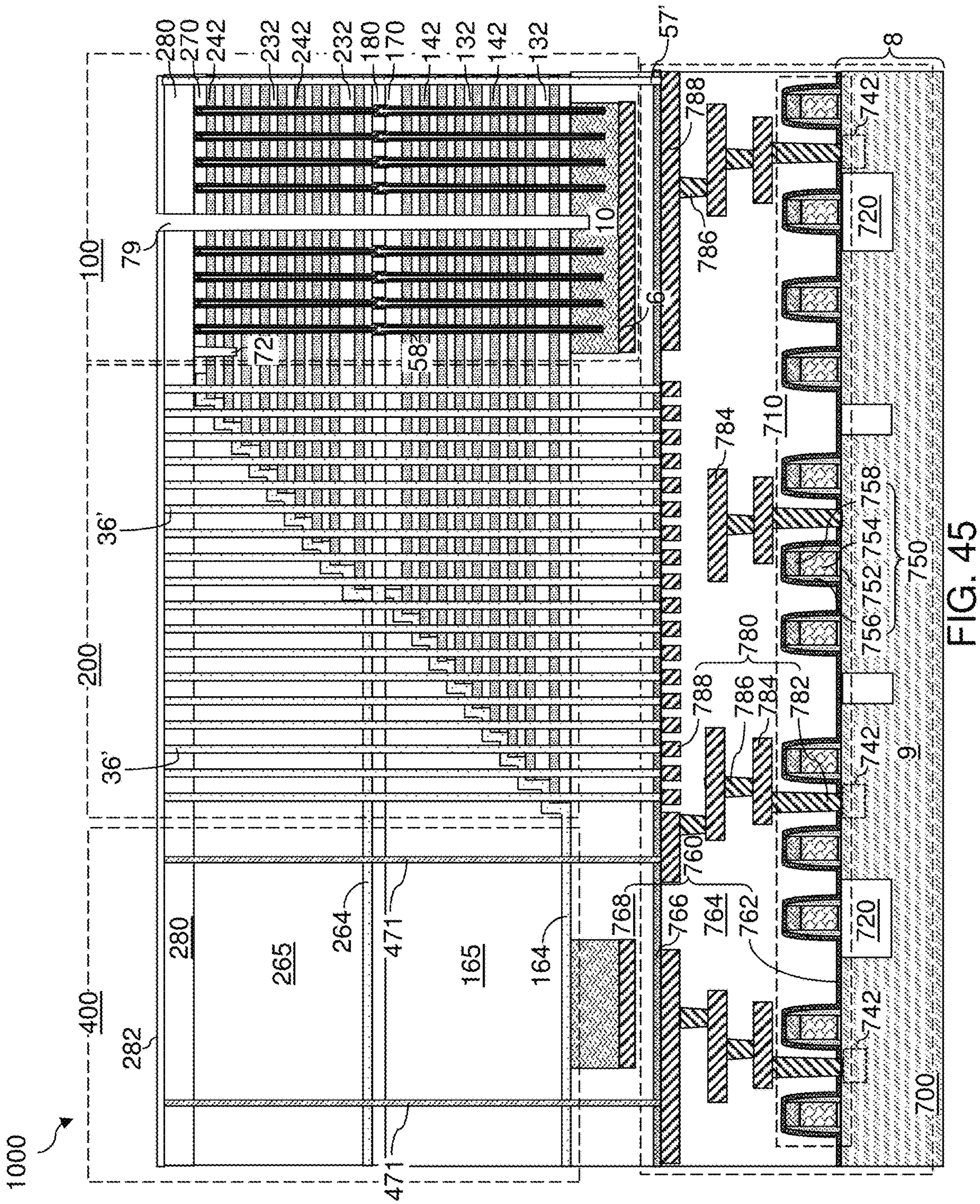
FIG. 45 is a vertical cross-sectional view of the second exemplary structure after formation of source-level material layers according to the second embodiment of the present disclosure.

Subsequently, the processing steps of FIGS. 21B-21E may be performed to replace the in-process source-level material layers 10' with source-level material layers 10. FIG. 45 illustrates the second exemplary structure after replacement of the in-process source-level material layers 10' with the source-level material layers 10.

Figure 46:
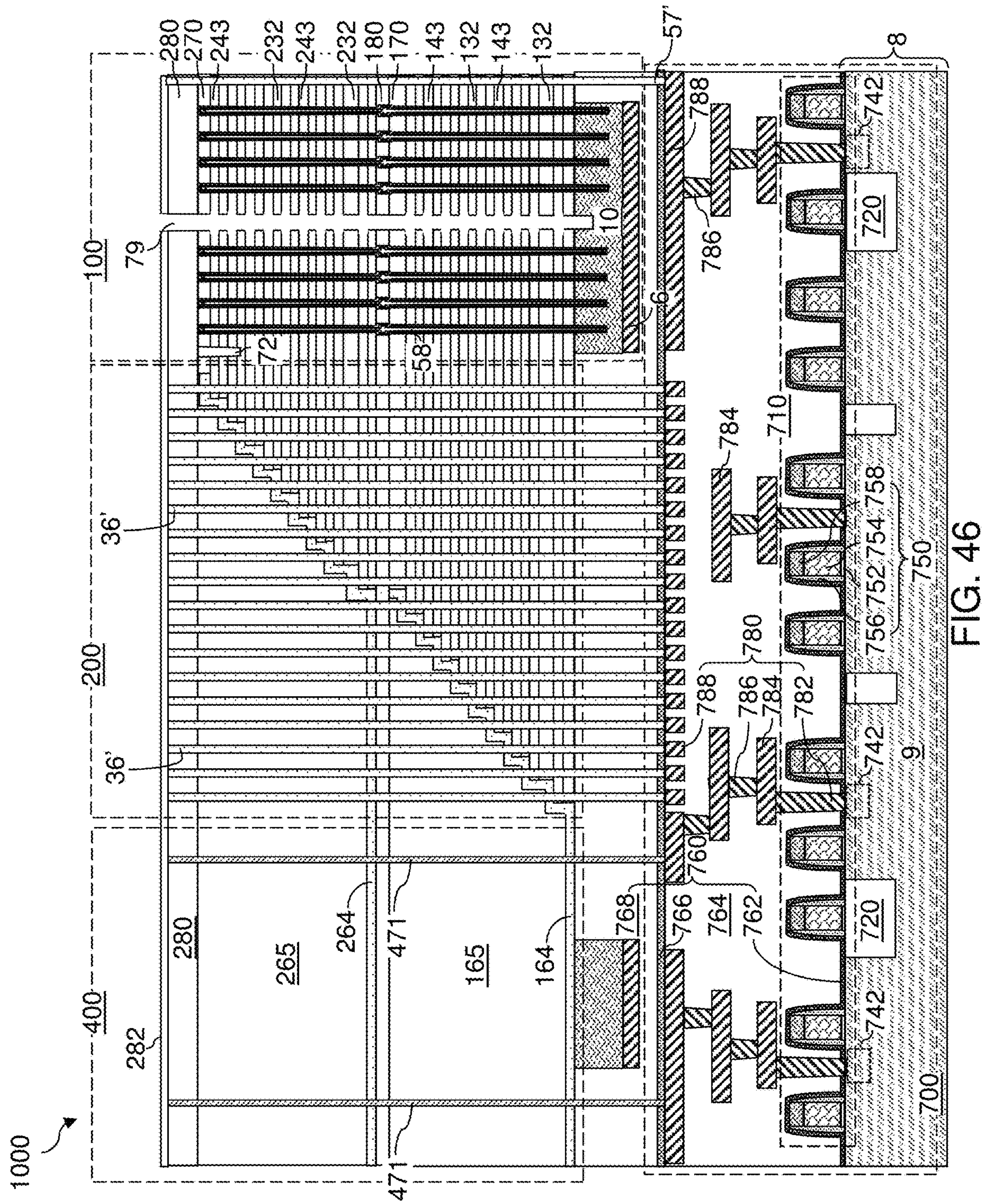
FIG. 46 is a vertical cross-sectional view of the second exemplary structure after formation of backside recesses according to the second embodiment of the present disclosure.

Referring to FIG. 46, the processing steps of FIG. 23 may be performed to remove the first and second sacrificial material layers (142, 242) and to form the first and second backside recesses (243, 243).

Figure 47:
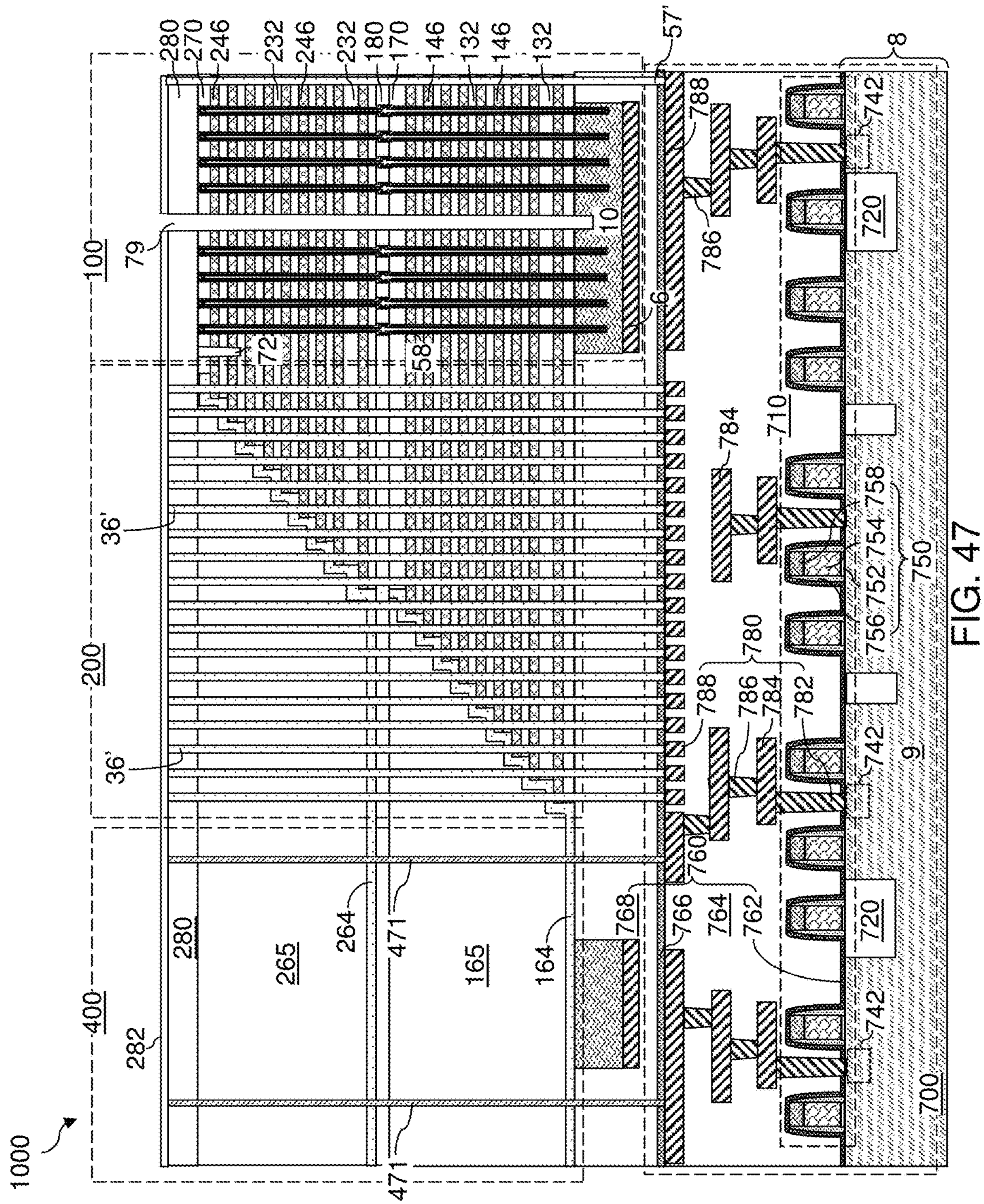
FIG. 47 is a vertical cross-sectional view of the second exemplary structure after formation of electrically conductive layers in the backside recesses according to the second embodiment of the present disclosure.
Figure 48A:
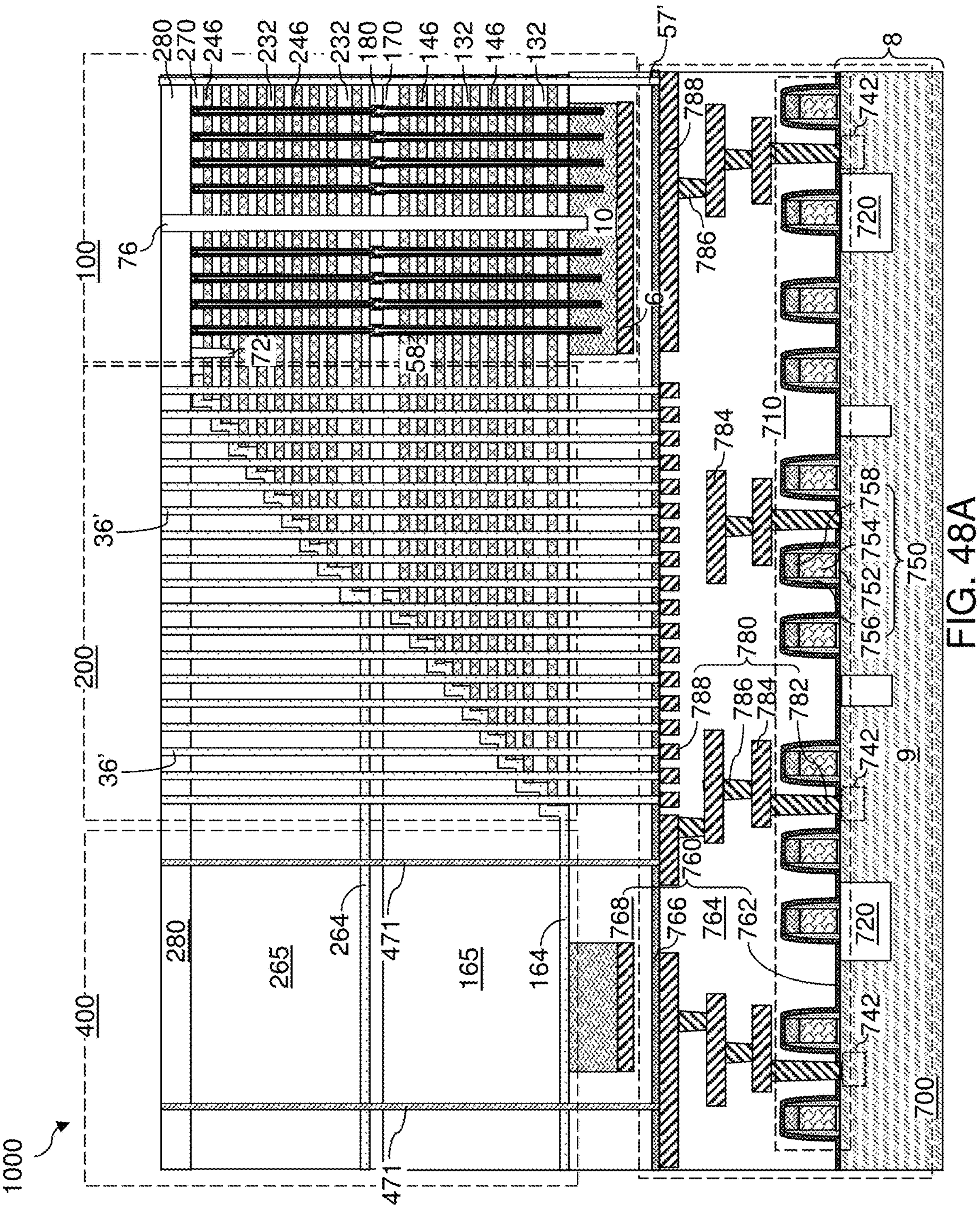
FIG. 48A is a vertical cross-sectional view of the second exemplary structure after formation of dielectric wall structures in the backside trenches according to the second embodiment of the present disclosure.
Figure 48B:
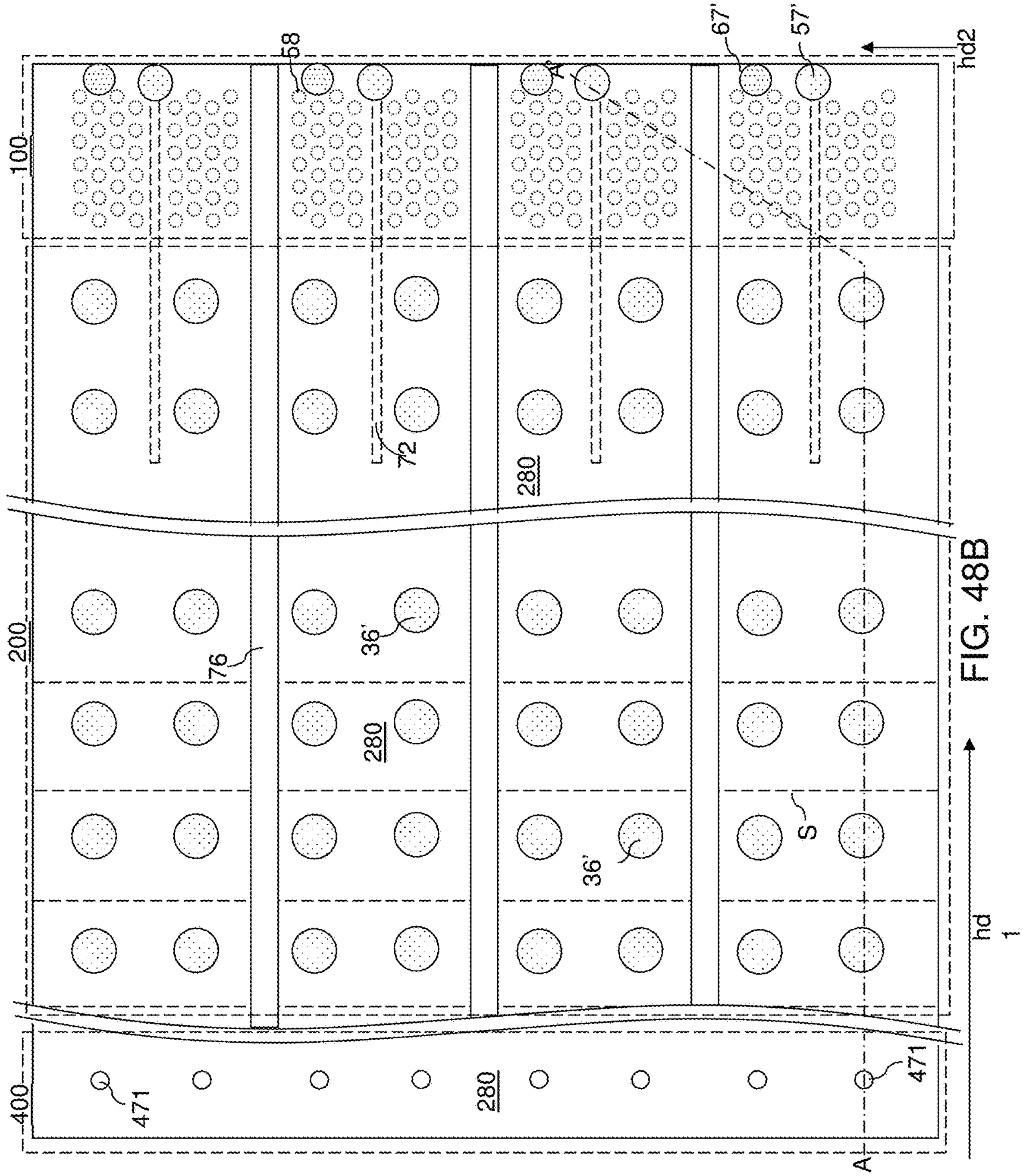
FIG. 48B is a top-down view of the second exemplary structure of FIG. 48A. The hinged vertical plane A-A' corresponds to the plane of the vertical cross-sectional view of FIG. 48A.
Figure 48C:
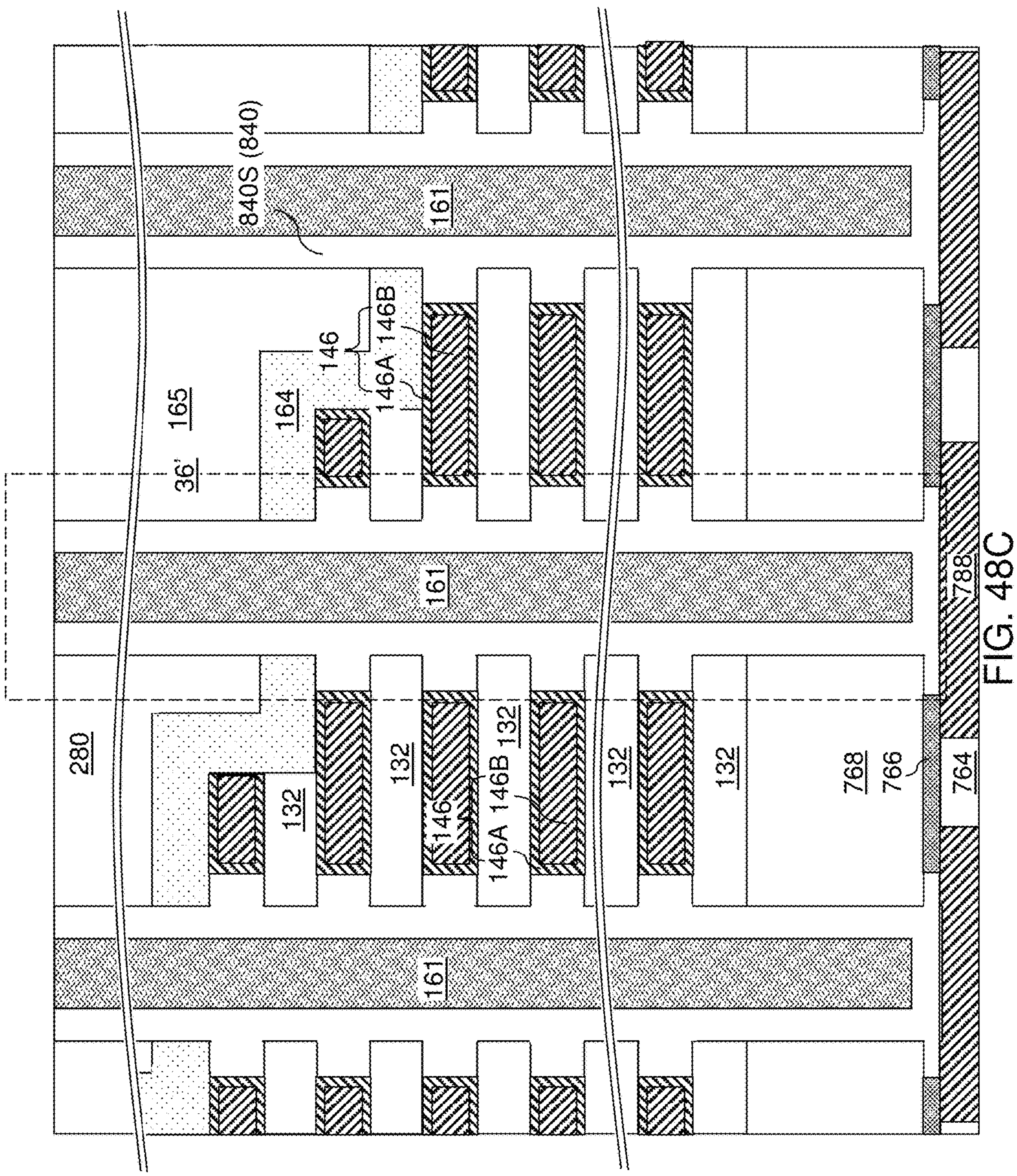
FIGS. 48C, 48D, 48E, and 48F are magnified vertical cross-sectional views of a staircase region via cavity, a peripheral region via cavity, an array region via cavity, and a source contact via cavity, respectively, at the processing steps of FIGS. 48A and 48B.
Figure 48E:
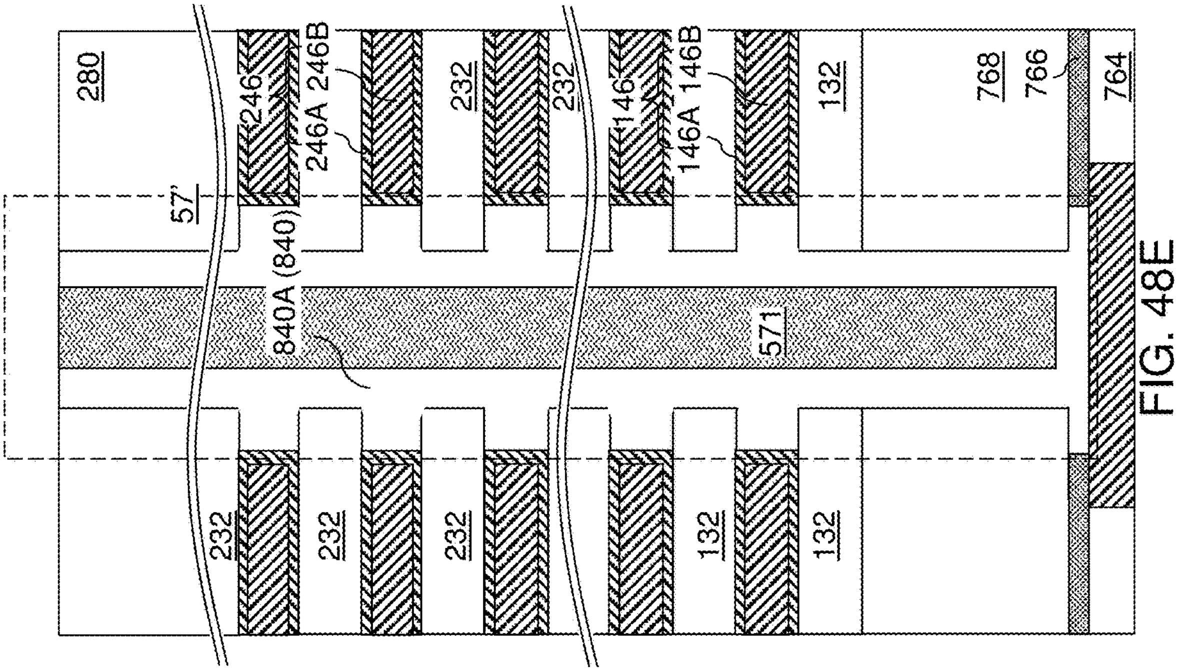
Figure 48D:
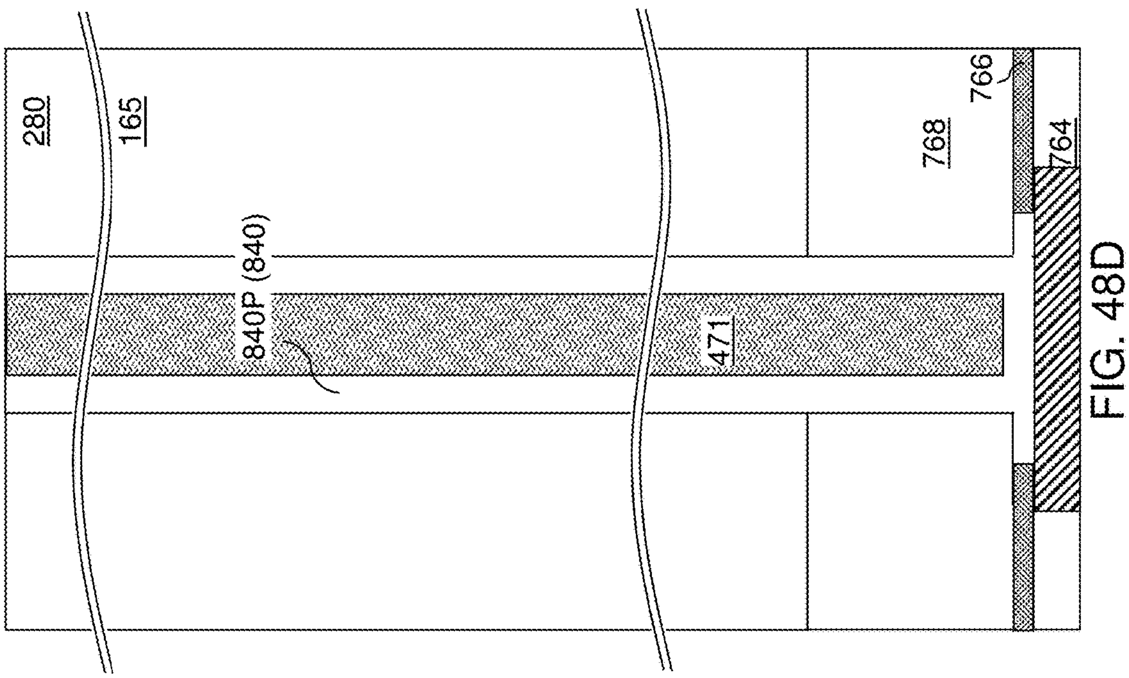
Figure 48F:
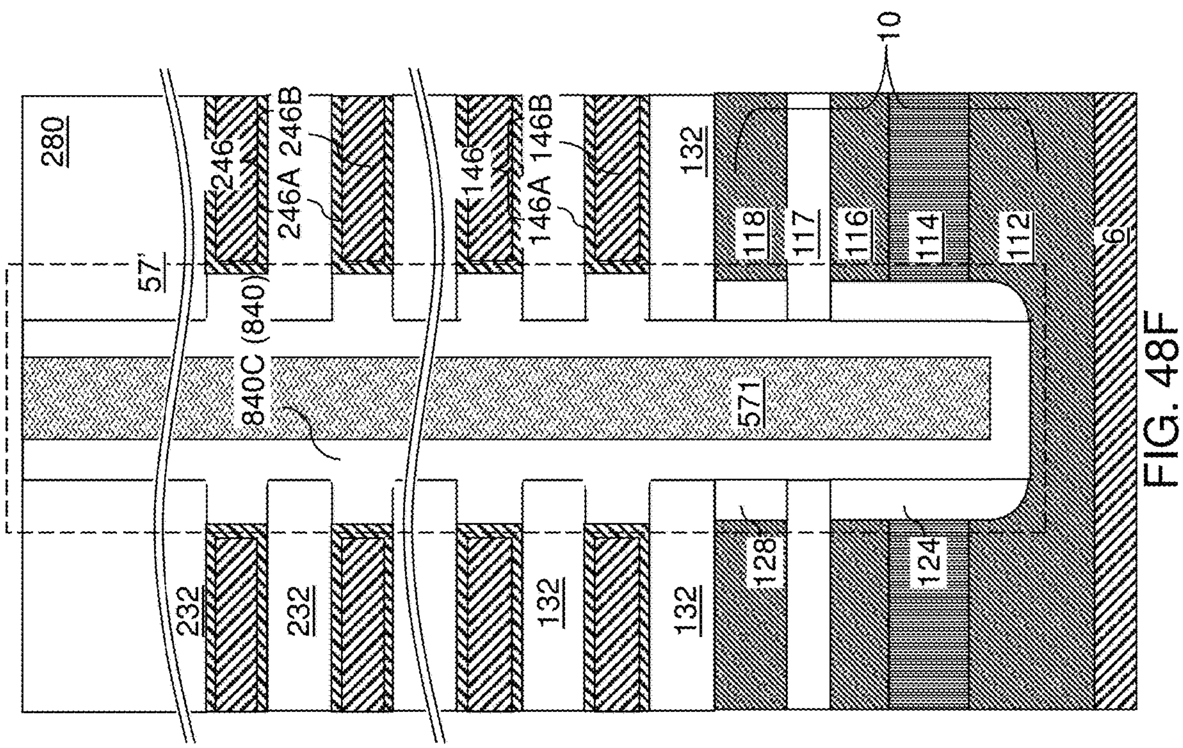
Figure 49A:
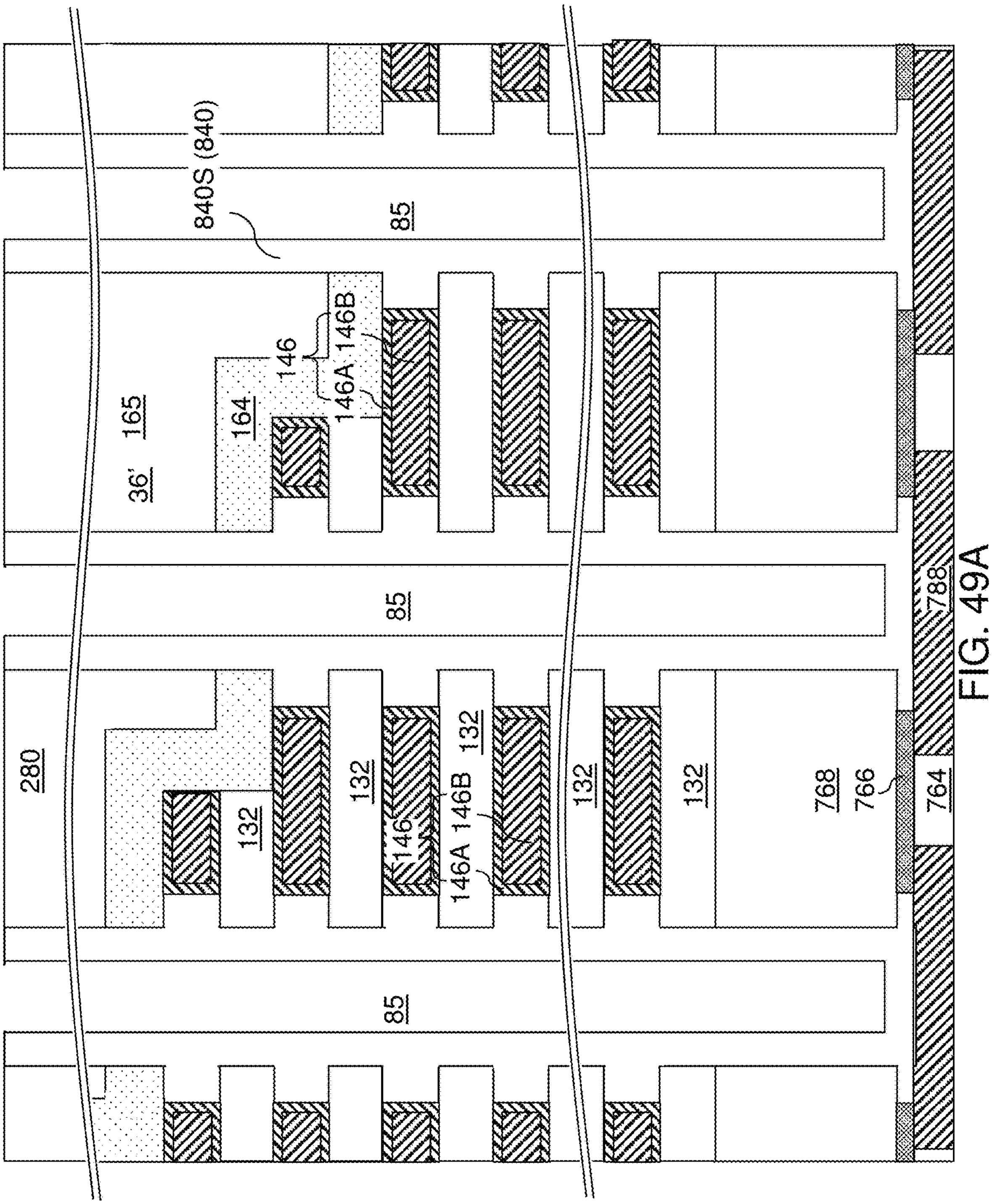
FIGS. 49A, 49B, 49C, and 49D are magnified vertical cross-sectional views of a staircase region via cavity, a peripheral region via cavity, an array region via cavity, and a source contact via cavity, respectively, after removal of sacrificial via fill material portions according to the second embodiment of the present disclosure.
Figure 49C:
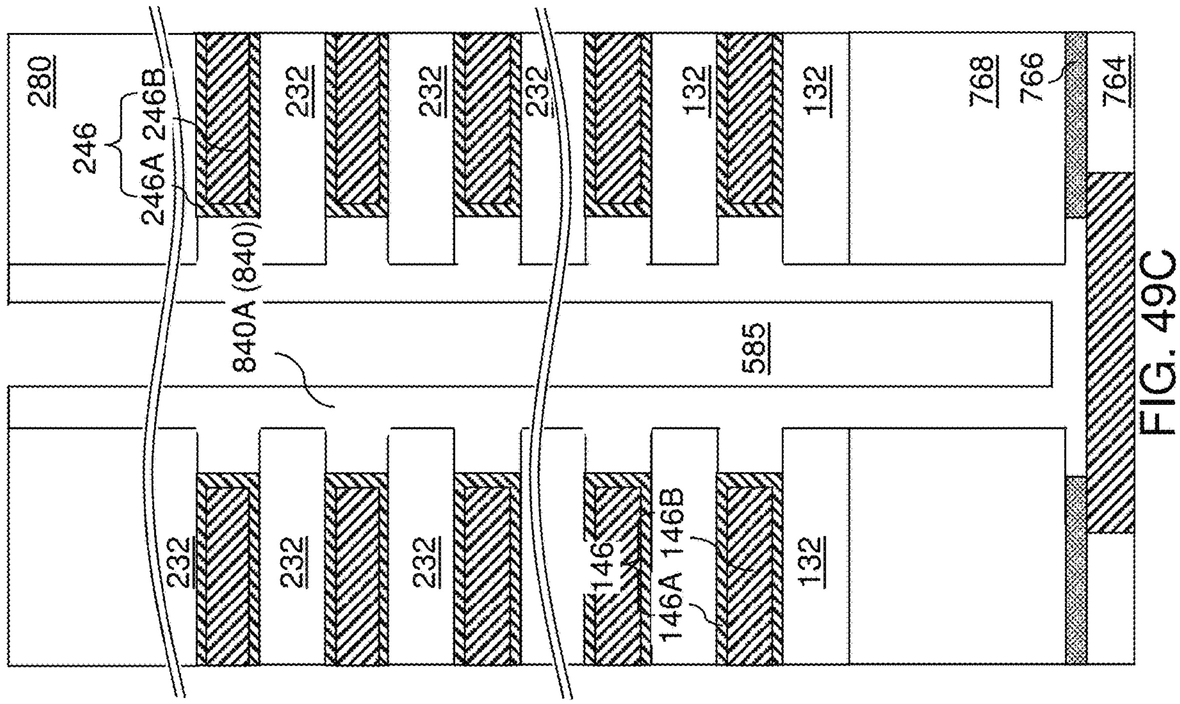
Figure 49B:
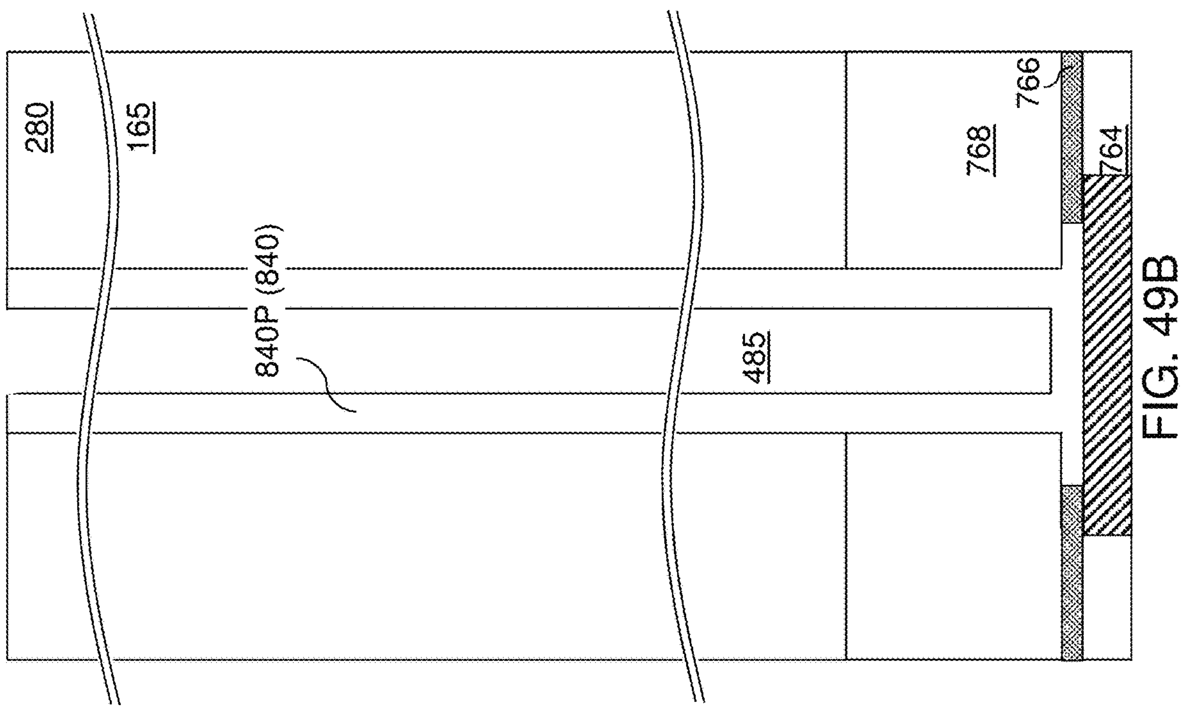
Figure 49D:
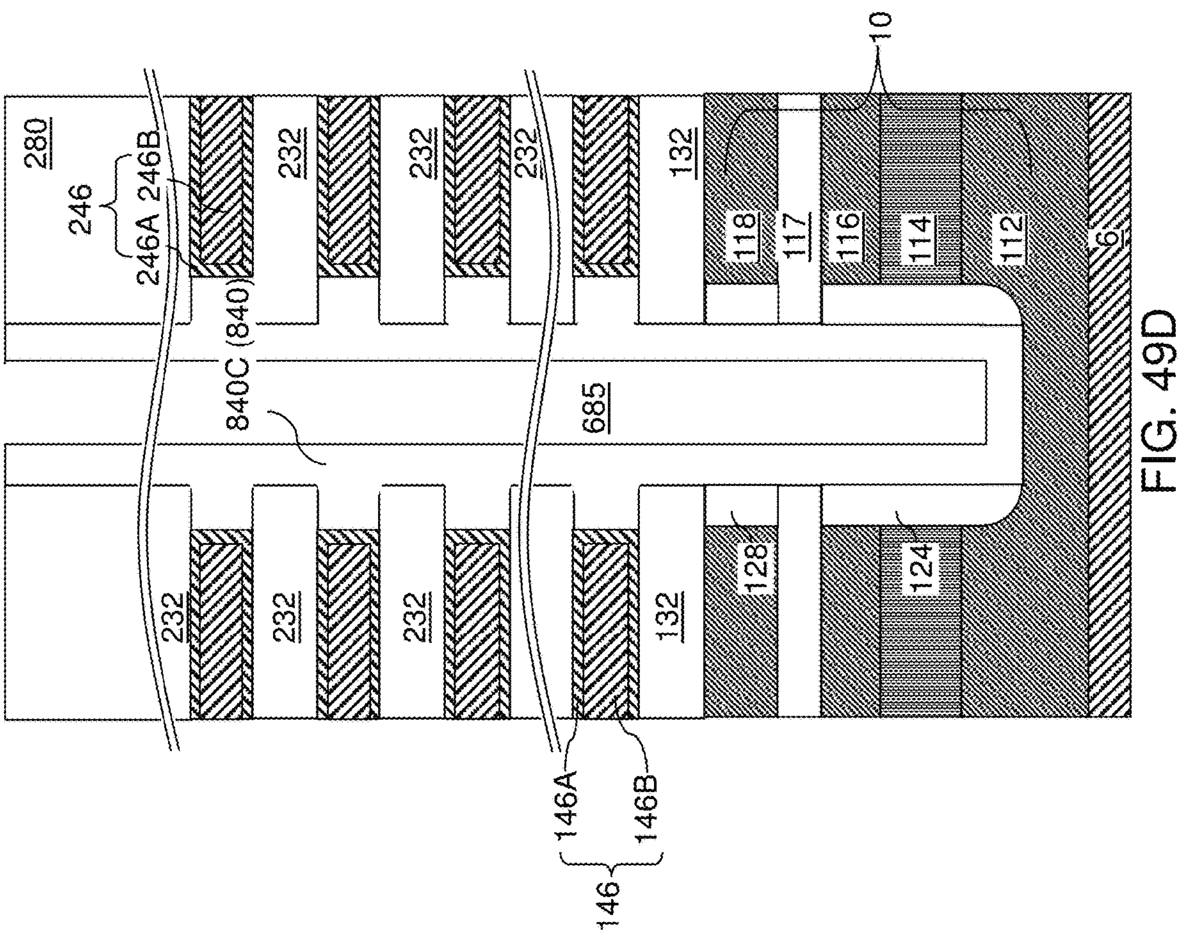
Figure 50A:
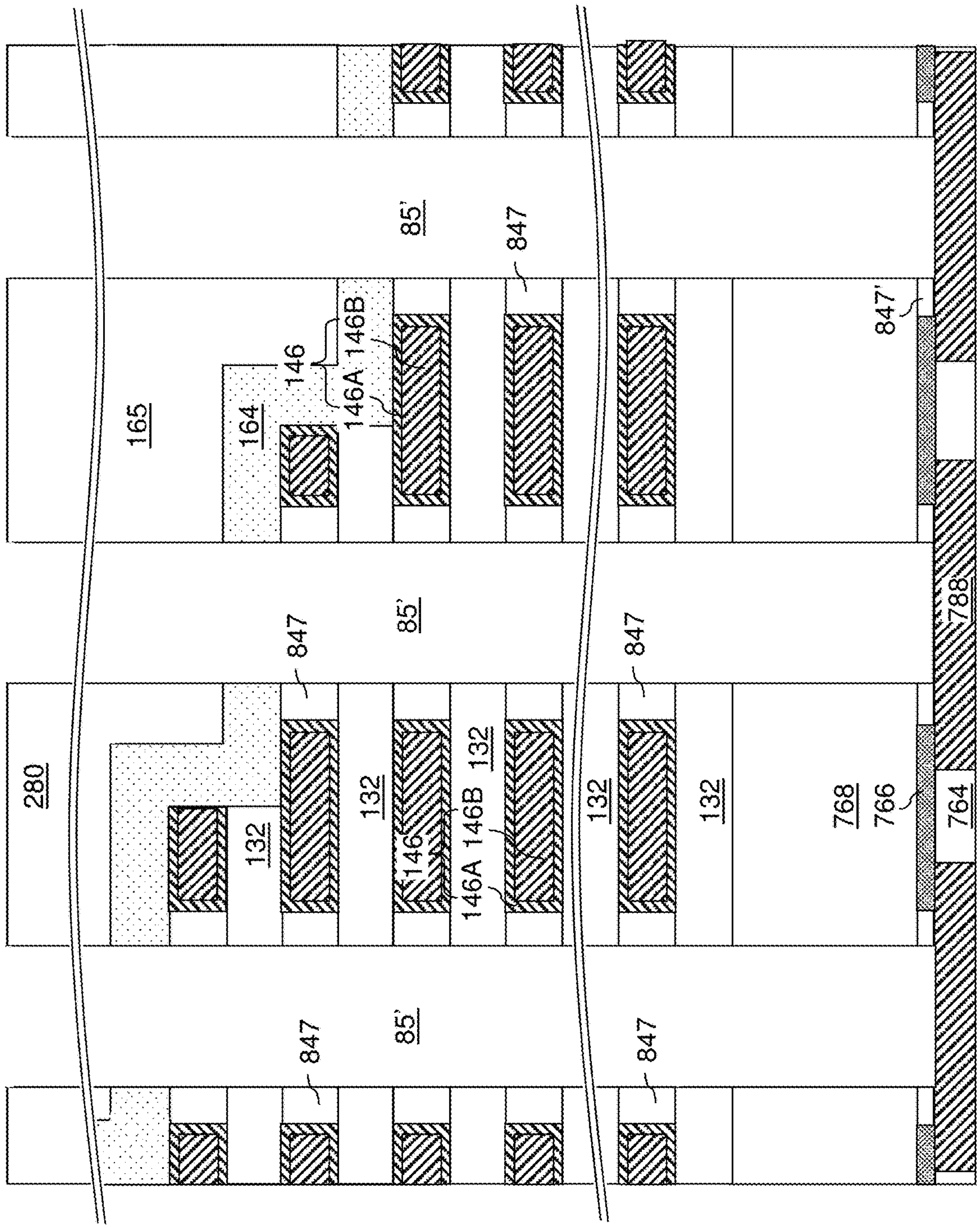
FIGS. 50A, 50B, 50C, and 50D are magnified vertical cross-sectional views of a staircase region via cavity, a peripheral region via cavity, an array region via cavity, and a source contact via cavity, respectively, after an isotropic etch process that partially etches the conformal dielectric via liner according to the second embodiment of the present disclosure.
Figure 50C:
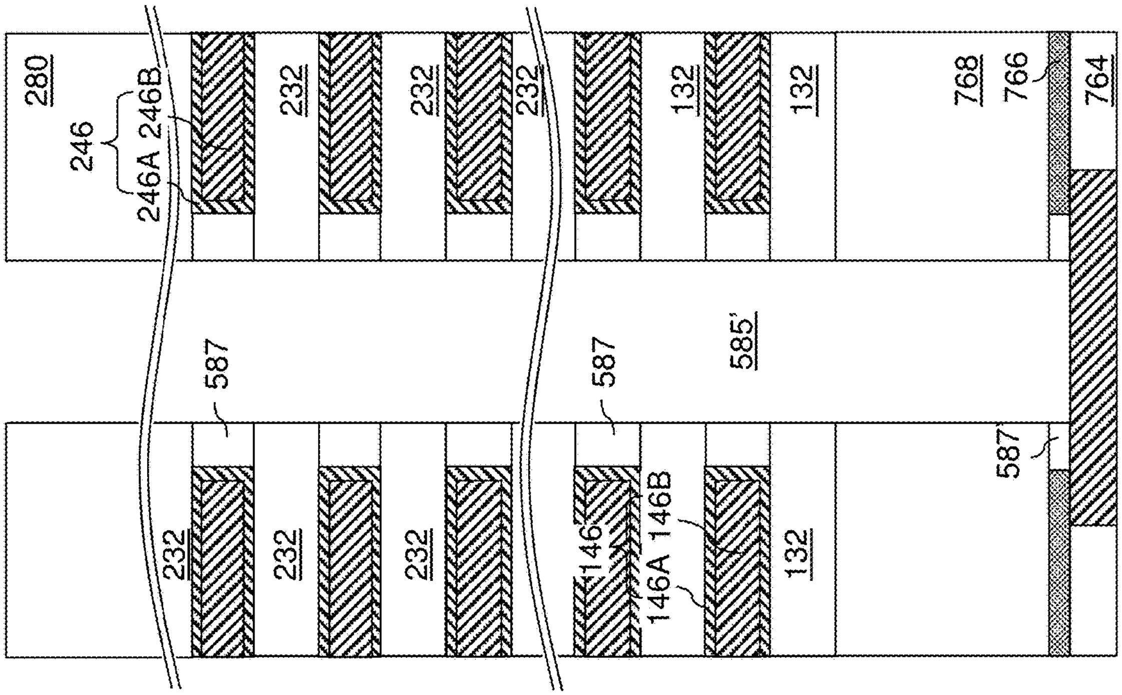
Figure 50B:
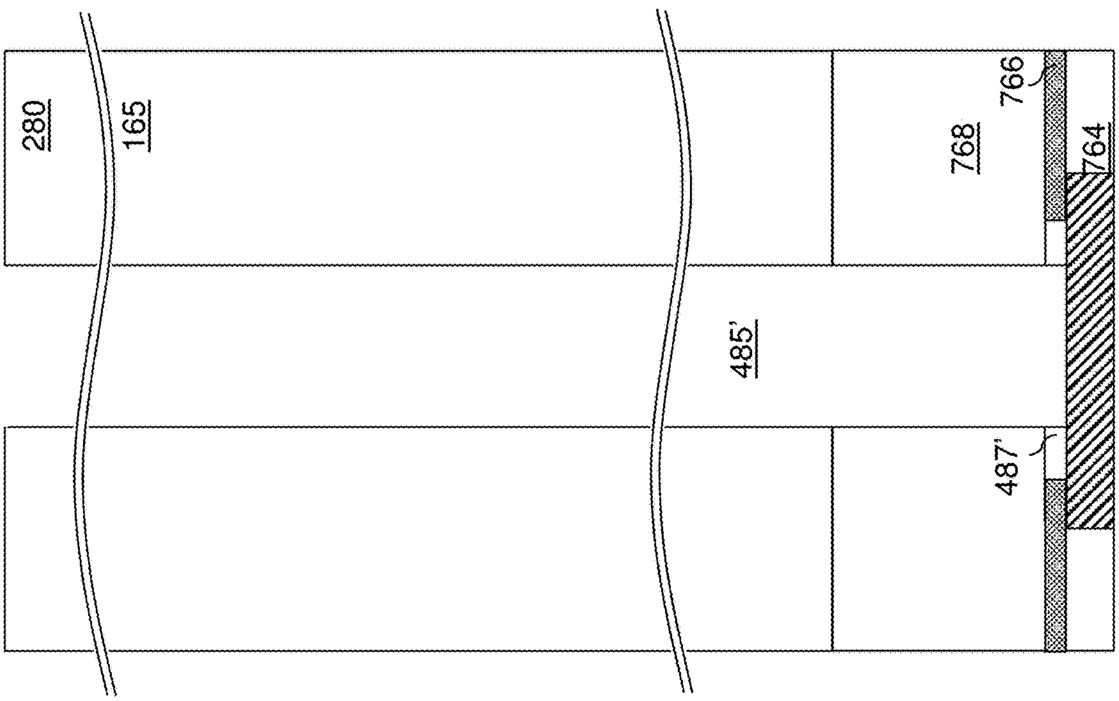
Figure 50D:
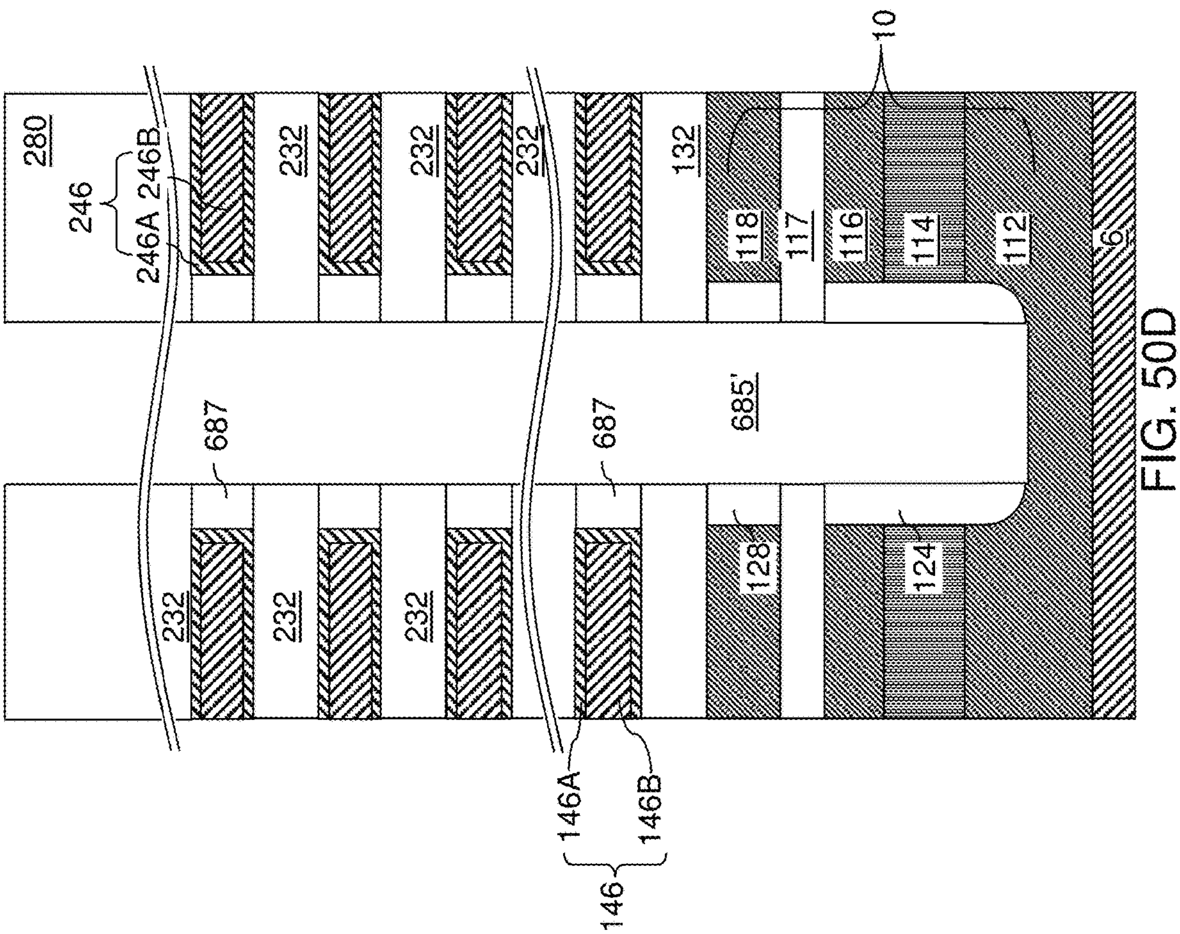
Figure 51A:
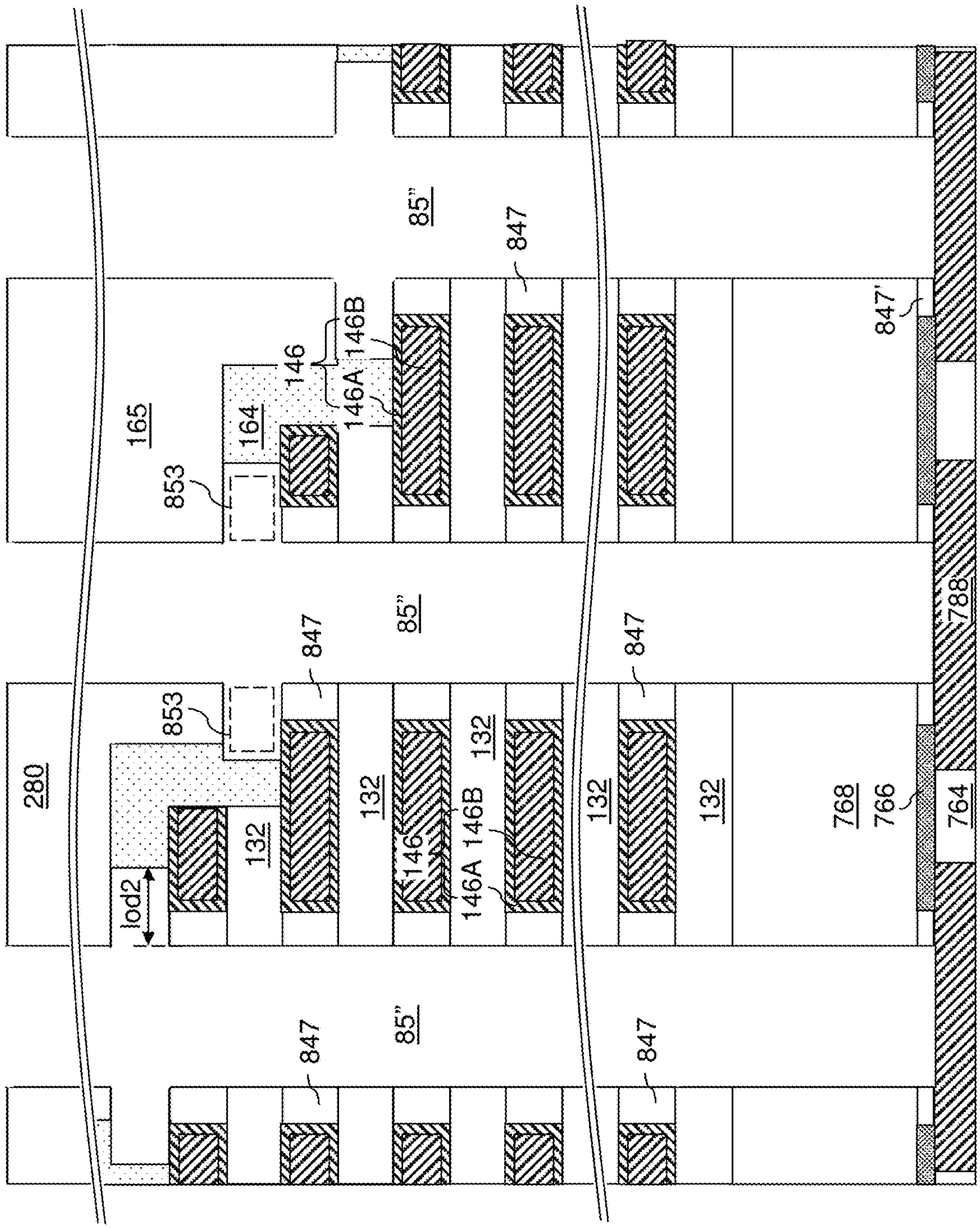
FIGS. 51A, 51B, 51C, and 51D are magnified vertical cross-sectional views of a staircase region via cavity, a peripheral region via cavity, an array region via cavity, and a source contact via cavity, respectively, after a second isotropic etch process that laterally recesses the first and second dielectric liners according to the second embodiment of the present disclosure.
Figure 51C:
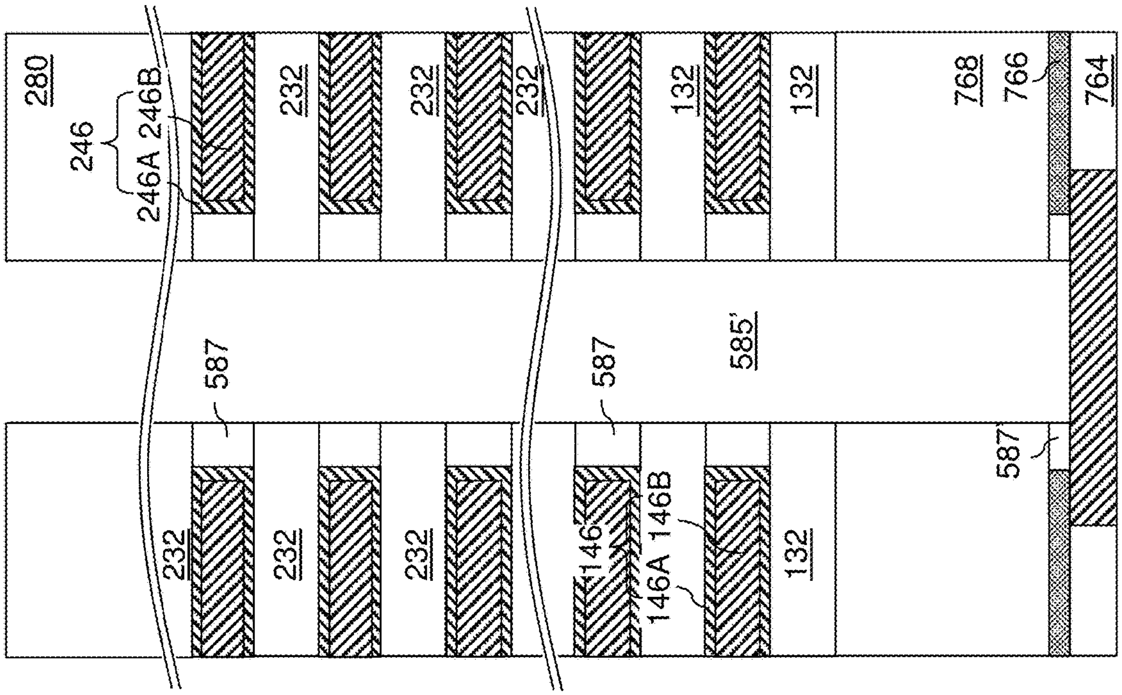
Figure 51B:
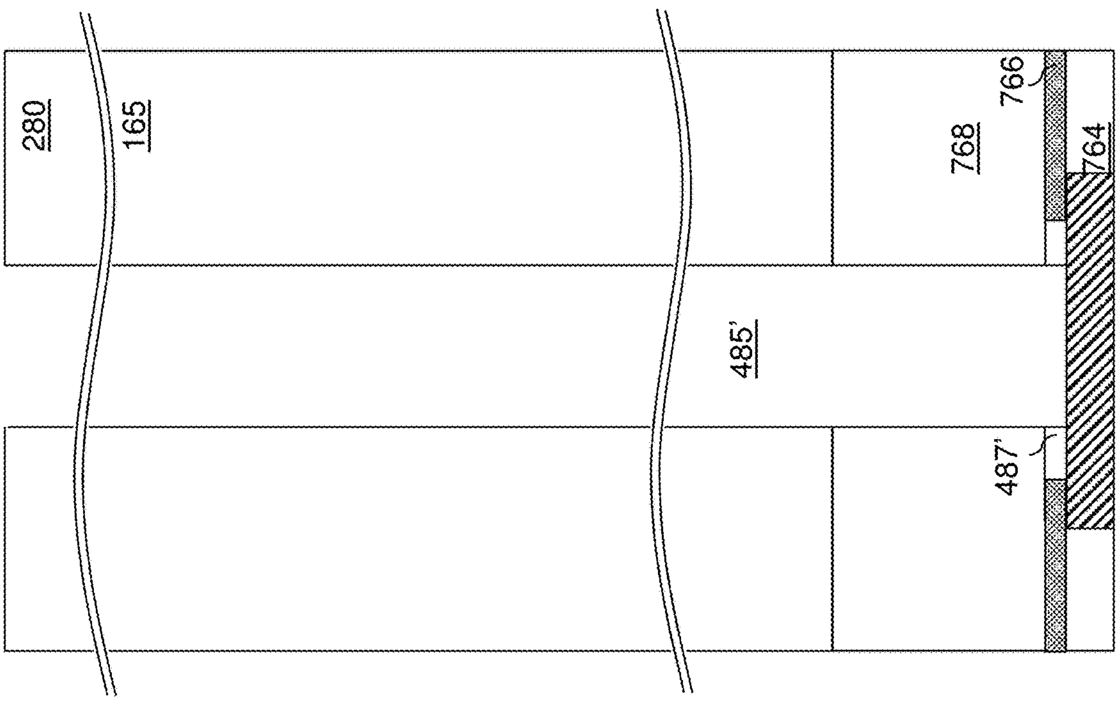
Figure 51D:
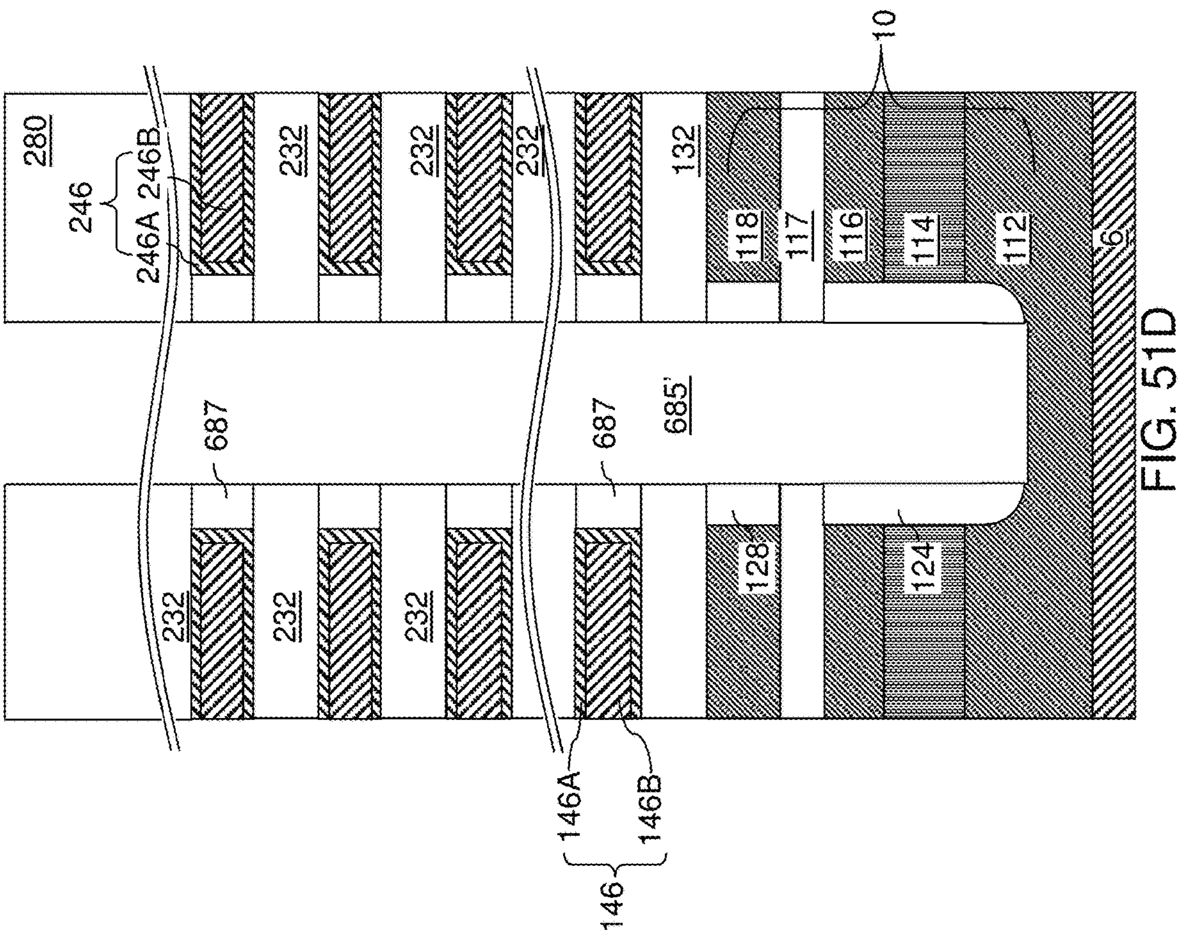

Referring to FIG. 47, the processing steps of FIG. 24 may be performed to form an optional backside blocking dielectric layer and electrically conductive layers (146, 246) in the backside recesses (143, 243). The electrically conductive layers (146, 246) may include first electrically conductive layers 146 formed in the first backside recesses 143 and second electrically conductive layers 246 formed in the second backside recesses 243.

Figure 25A:
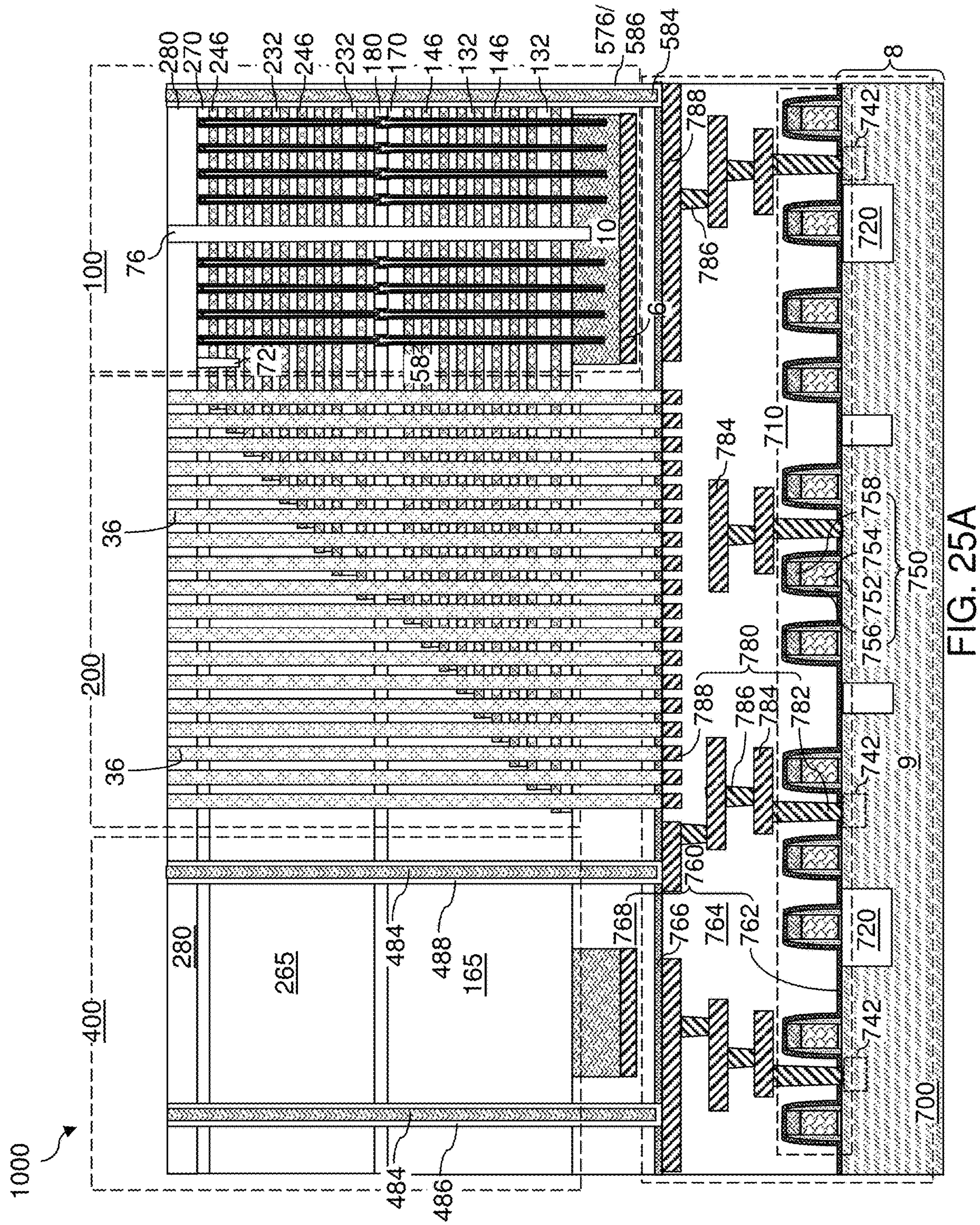
FIG. 25A is a vertical cross-sectional view of the first exemplary structure after formation of dielectric wall structures in the backside trenches according to the first embodiment of the present disclosure.
Figure 25B:
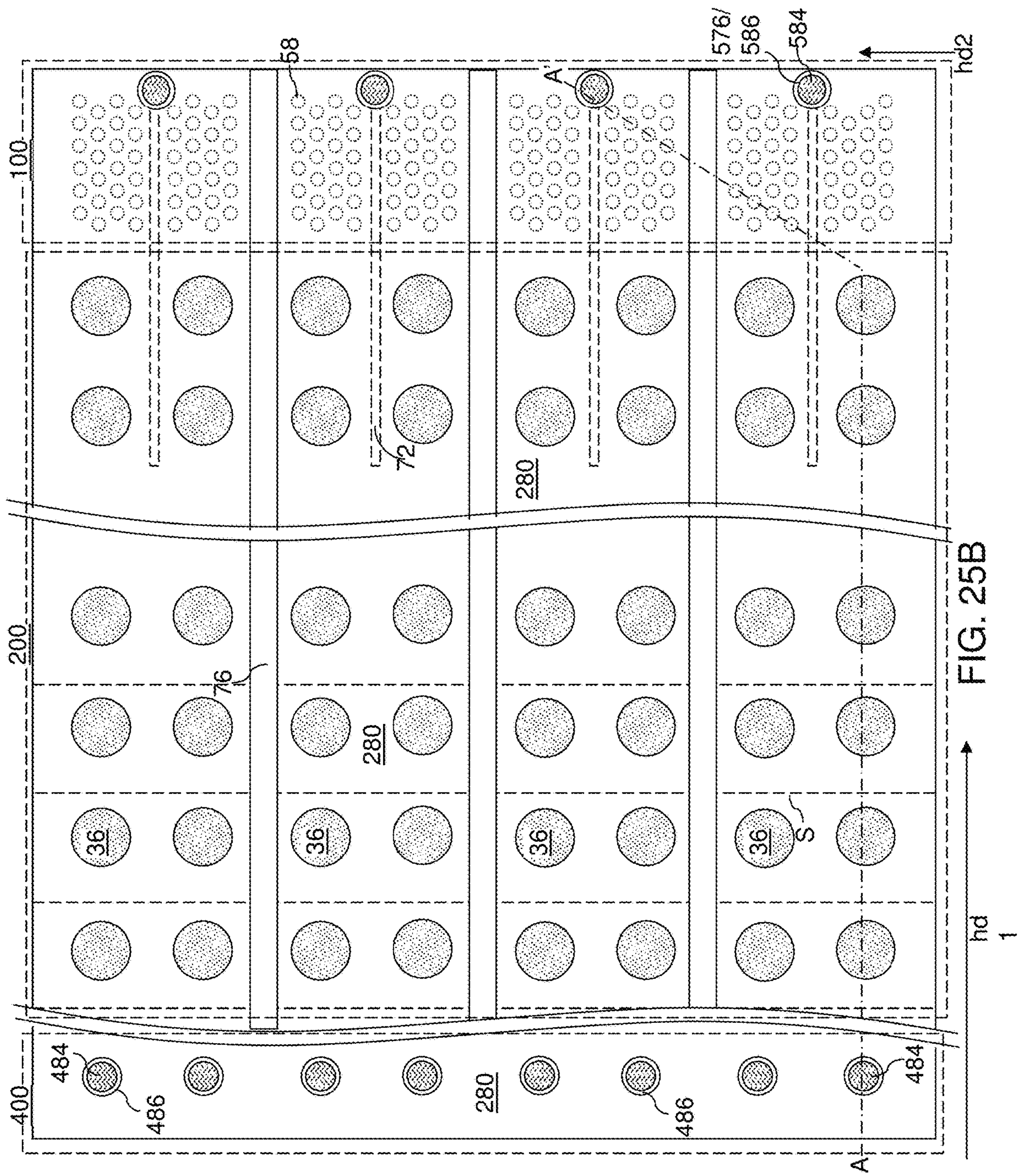
FIG. 25B is a top-down view of the first exemplary structure of FIG. 25A. The hinged vertical plane A-A' corresponds to the plane of the vertical cross-sectional view of FIG. 25A.
Figure 25C:
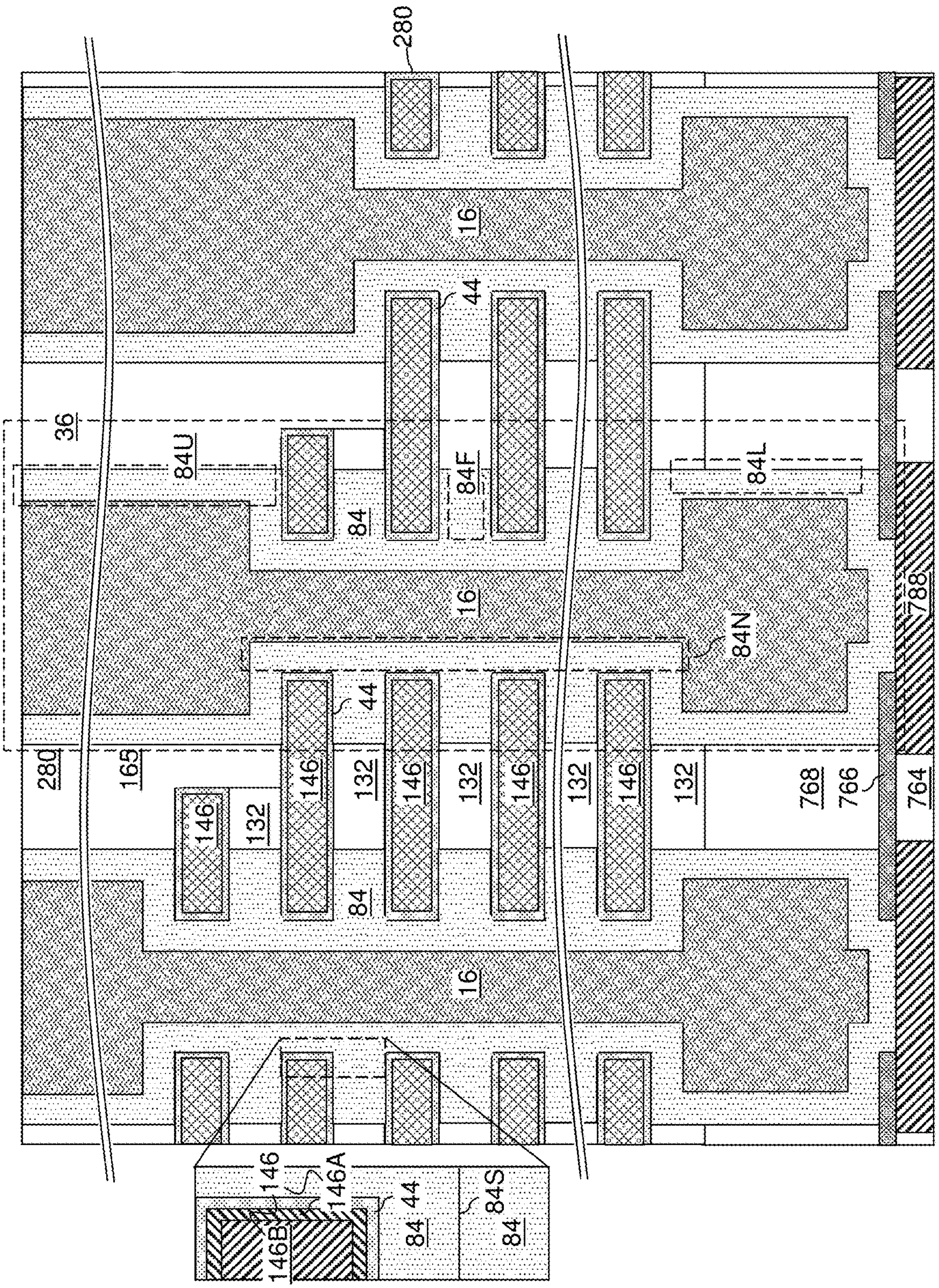
FIGS. 25C, 25D, and 25E are magnified vertical cross-sectional views of a staircase region via cavity, a peripheral region via cavity, and an array region via cavity, respectively, at the processing steps of FIGS. 25A and 25B.
Figure 25D:
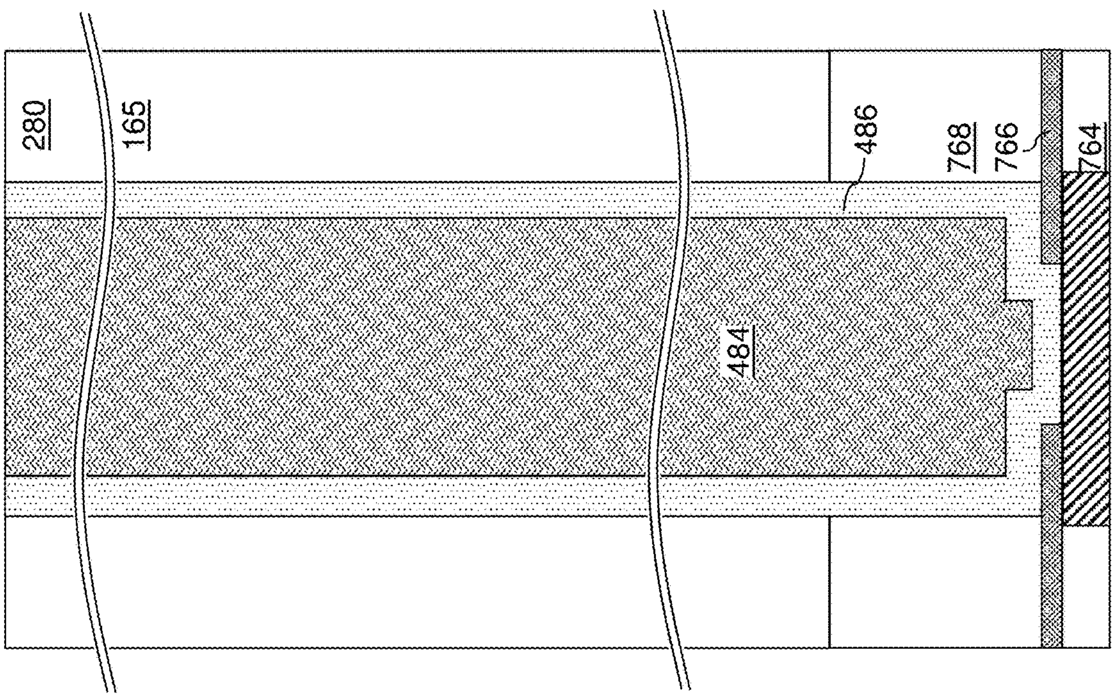
Figure 25E:
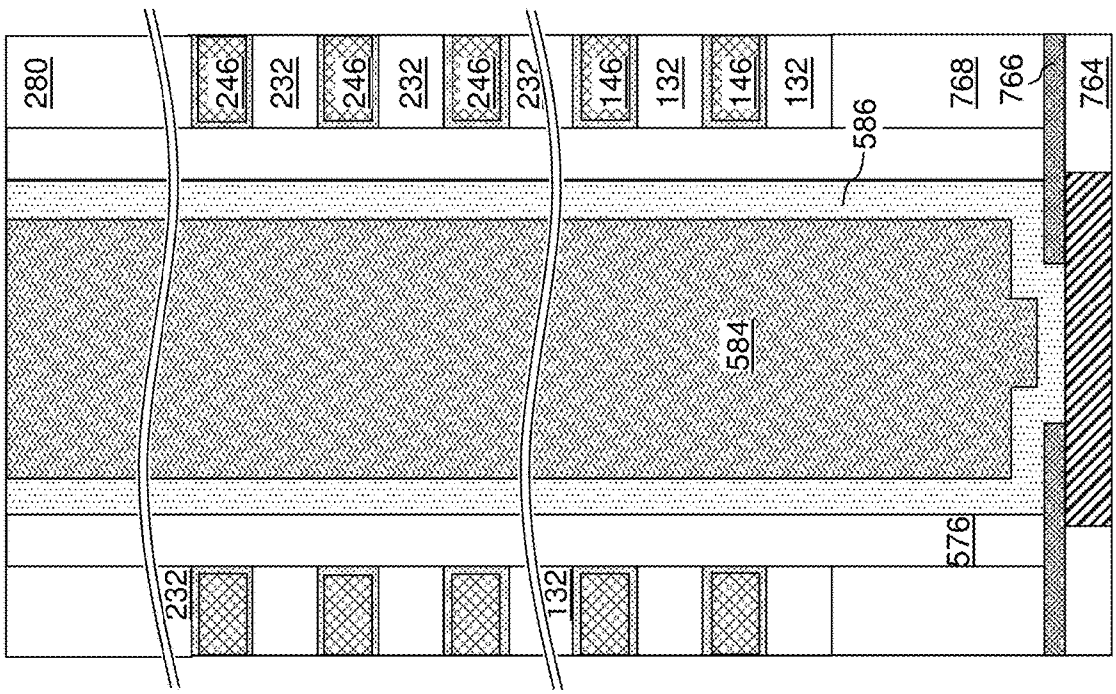

Referring to FIGS. 48A-48F, the processing steps of FIGS. 25A and 25B may be performed to form dielectric wall structures 76 in the backside trenches 79. Subsequently, the sacrificial cover dielectric layer 282 may be removed, for example, by a recess etch. Top surfaces of the various sacrificial via fill material portions (161, 471, 571, 671) may be physically exposed after removal of the sacrificial cover dielectric layer 282. FIGS. 48C-48F illustrate components of electrically conductive layers (146, 246). For example, each first electrically conductive layer 146 includes a first metallic nitride liner 146A and a first metallic fill material portion 146B, and each second electrically conductive layer 246 includes a second metallic nitride liner 246A and a second metallic fill material portion 246B. The first metallic nitride liners 146A and the second metallic nitride liners 246A may include a same metal nitride material such as TiN, TaN, and/or WN. The first metallic fill material portions 146B and the second metallic fill material portions 246B may include a same metal fill material such as W, Co, Mo, and/or Cu.

Referring to FIGS. 49A-49D, the material of the various sacrificial via fill material portions (161, 471, 571, 671) may be removed selective to the material of the insulating liners 840. For example, if the sacrificial via fill material portions (161, 471, 571, 671) include a doped semiconductor material such a doped polysilicon or amorphous silicon, a wet etch using a TMY or KOH solution may be used to remove the sacrificial via fill material portions (161, 471, 571, 671). Cylindrical voids (85, 485, 585, 685) may be formed in volumes from which the sacrificial via fill material portions (161, 471, 571, 671) are removed. The cylindrical voids (85, 485, 585, 685) may have straight vertical sidewalls. The cylindrical voids (85, 485, 585, 685) include staircase region cylindrical voids 85 formed within the staircase region via cavities, peripheral region cylindrical voids 485 formed in the peripheral region via cavities, array region cylindrical voids 585 formed in the array region via cavities, and source contact cylindrical voids 685 formed in the source contact via cavities.

Referring to FIGS. 50A-50D, an isotropic etch process is performed to partially etch the insulating liners 840. For example, if the insulating liners 840 include silicon oxide, the isotropic etch process may be a wet etch process using dilute hydrofluoric acid. The isotropic etch process removes portions of the insulating liners 840 located on sidewalls of the first and second insulating layers (132, 232), the first and second insulating cap layers (170, 270), and the first contact level dielectric layer 280. Remaining portions of the insulating liners 840 form annular insulating spacers (847, 847', 487', 587, 587', 687). Thus, each of the annular insulating spacers (847, 847', 487', 587, 587', 687) is formed by oxidizing the sacrificial material layers (142, 242). The remaining portions of the conformal dielectric via liner 840L constitute the annular insulating spacers (847, 847', 487', 587, 587', 687), which may comprise silicon oxide or silicon oxynitride (i.e., the remaining parts of the rib portions 837).

The annular insulating spacers (847, 847', 487', 587, 587', 687) may include staircase region insulating spacers 847, silicon-nitride-level insulating spacers (847', 487', 587'), array region insulating spacers 587, and source contact insulating spacers 687. A set of at least one staircase region insulating spacer 847 and a silicon-nitride-level insulating spacer 847' laterally surrounds each staircase region cylindrical void 85'. A silicon-nitride-level insulating spacer 487' laterally surrounds each peripheral region cylindrical void 485'. A vertical stack of array region insulating spacers 587 and a silicon-nitride-level insulating spacer 587' laterally surrounds each array region cylindrical void 585'. A vertical stack of source contact insulating spacers 687, an annular source-select-level semiconductor oxide spacer 128, and an annular buried-source-level semiconductor oxide spacer 124 laterally surrounds each source contact cylindrical void 685'. Top surfaces of the lower-level metal interconnect structures 780 may be physically exposed by etching through bottom portions of the conformal dielectric via liner 840L, i.e., the bottom portions of the various insulating liners 840.

Referring to FIGS. 51A, 51B, 51C, and 51D, a second isotropic etch process to laterally recess the first and second dielectric liners (164, 264) selective to the materials of the first and second insulating layers (132, 232), the first and second retro-stepped dielectric material portions (165, 265), the first and second insulating cap layers (170, 270), the first contact level dielectric layer 280, and the annular insulating spacers (847, 847', 487', 587, 587', 687). The second isotropic etch process forms an annular lateral cavity region 853 around each staircase region cylindrical void 85' by laterally recessing a respective horizontal portion of a dielectric liner (164, 264), which may be the first dielectric liner 164 or the second dielectric liner 264. The second isotropic etch process provides a second lateral offset distance lod2 between each laterally recessed sidewall of the horizontal portions of the dielectric liners (164, 264) and inner sidewalls of a most proximate one of the annular insulating spacers (847, 847', 487', 587, 587', 687). The second lateral offset distance lod2 is greater than the first lateral offset distance lod1 at the processing steps of FIGS. 40A-40D. Each staircase region cylindrical void 85' is converted into a staircase region flanged void 85", which includes the entire volume of the staircase region cylindrical void 85' and additionally includes the volume of an annular lateral cavity region 853. As used herein, a "flanged" element refers to an element that includes a projecting flat annular region that is attached to an axially extending element that extends perpendicular to a major surface of the projecting flat annular region.

Figure 52A:
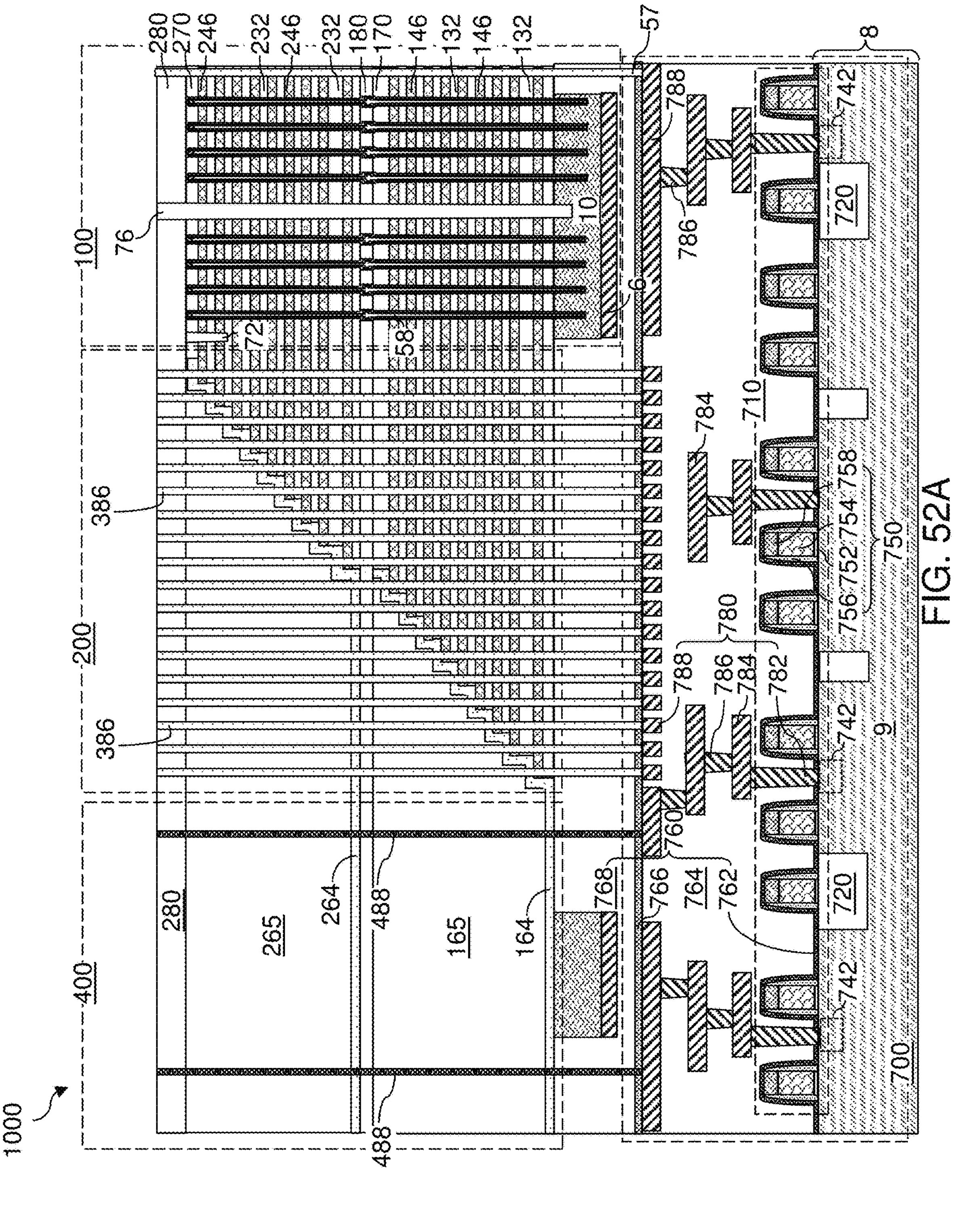
FIG. 52A is a vertical cross-sectional view of the second exemplary structure after formation of various contact via structures according to the second embodiment of the present disclosure.
Figure 52B:
FIG. 52B is a top-down view of the second exemplary structure of FIG. 52A. The hinged vertical plane A-A' corresponds to the plane of the vertical cross-sectional view of FIG. 52A.
Figure 52C:
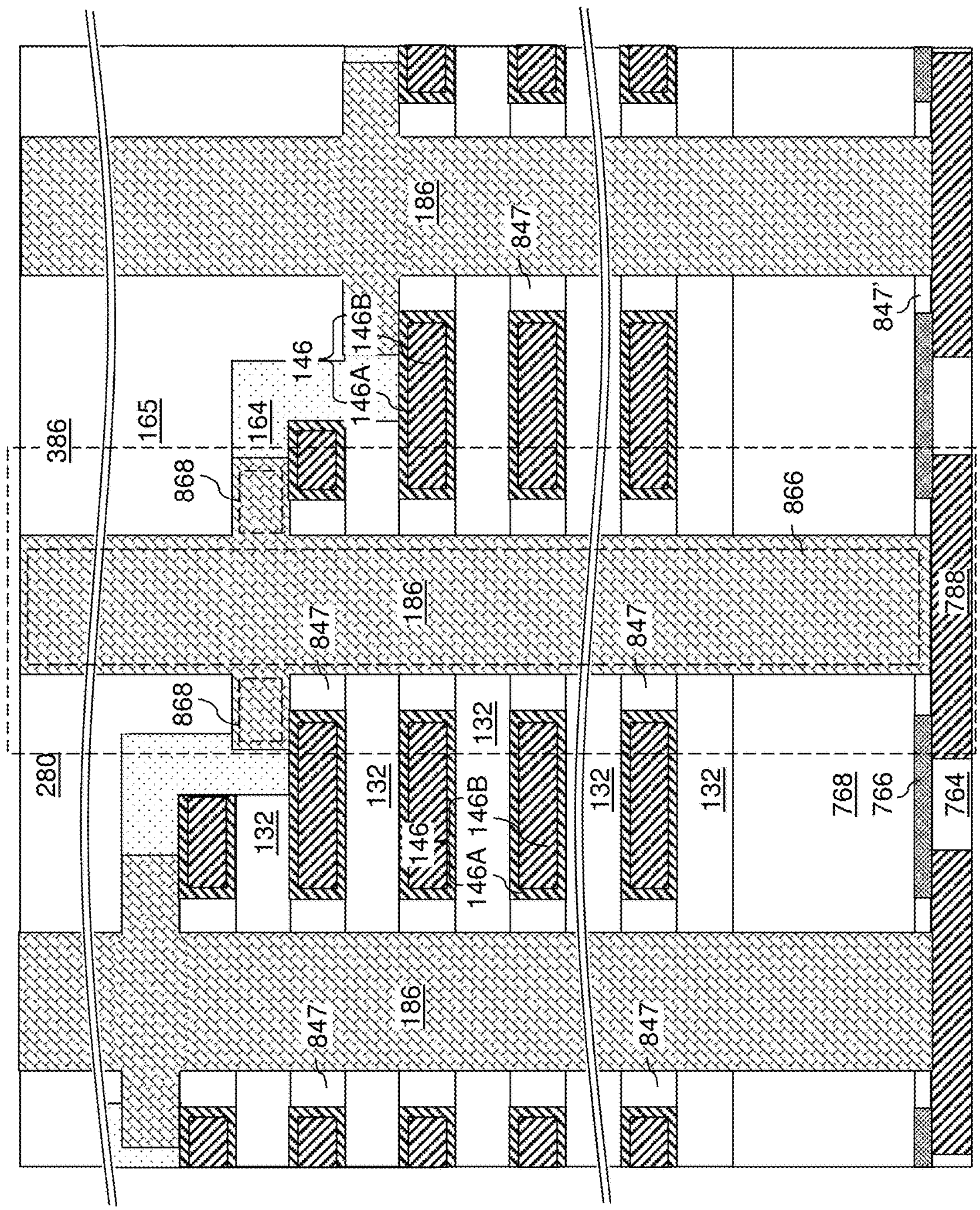
FIGS. 52C, 52D, 52E, and 52F are magnified vertical cross-sectional views of a staircase region via cavity, a peripheral region via cavity, an array region via cavity, and a source contact via cavity, respectively, at the processing steps of FIGS. 52A and 52B.
Figure 52E:
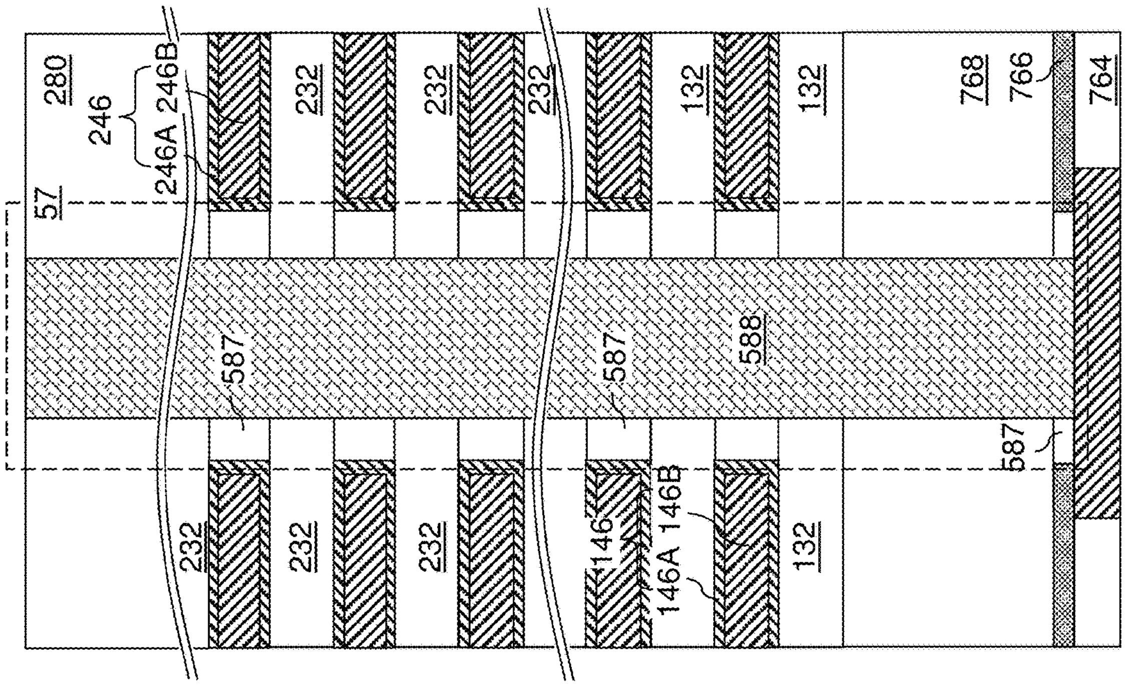
Figure 52D:
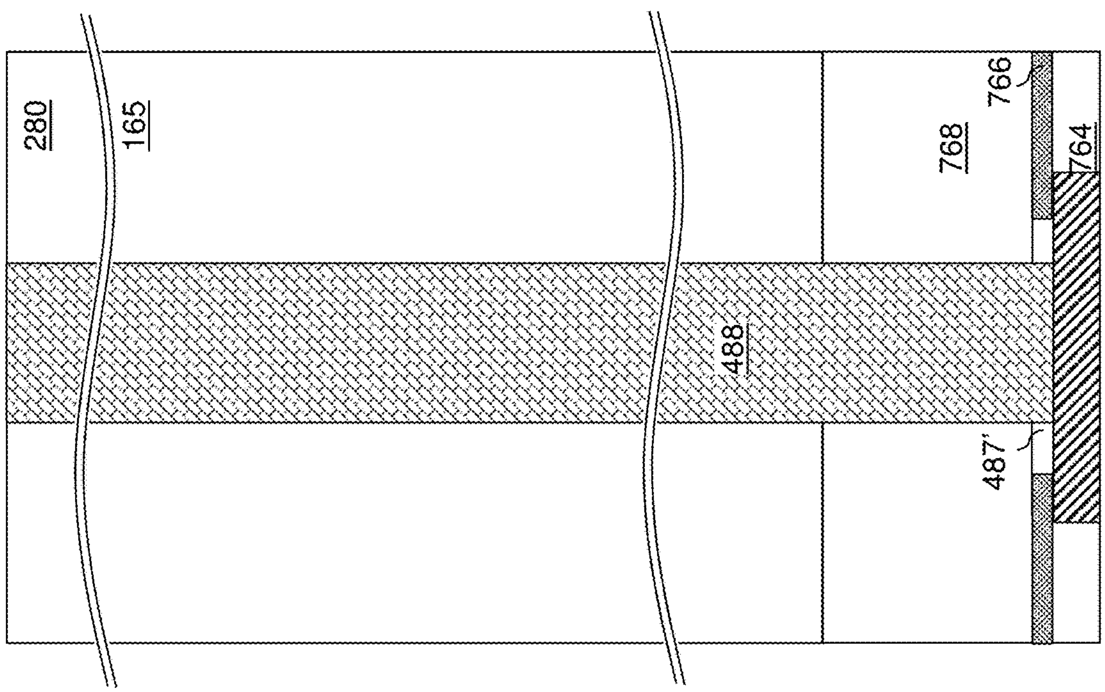
Figure 52F:
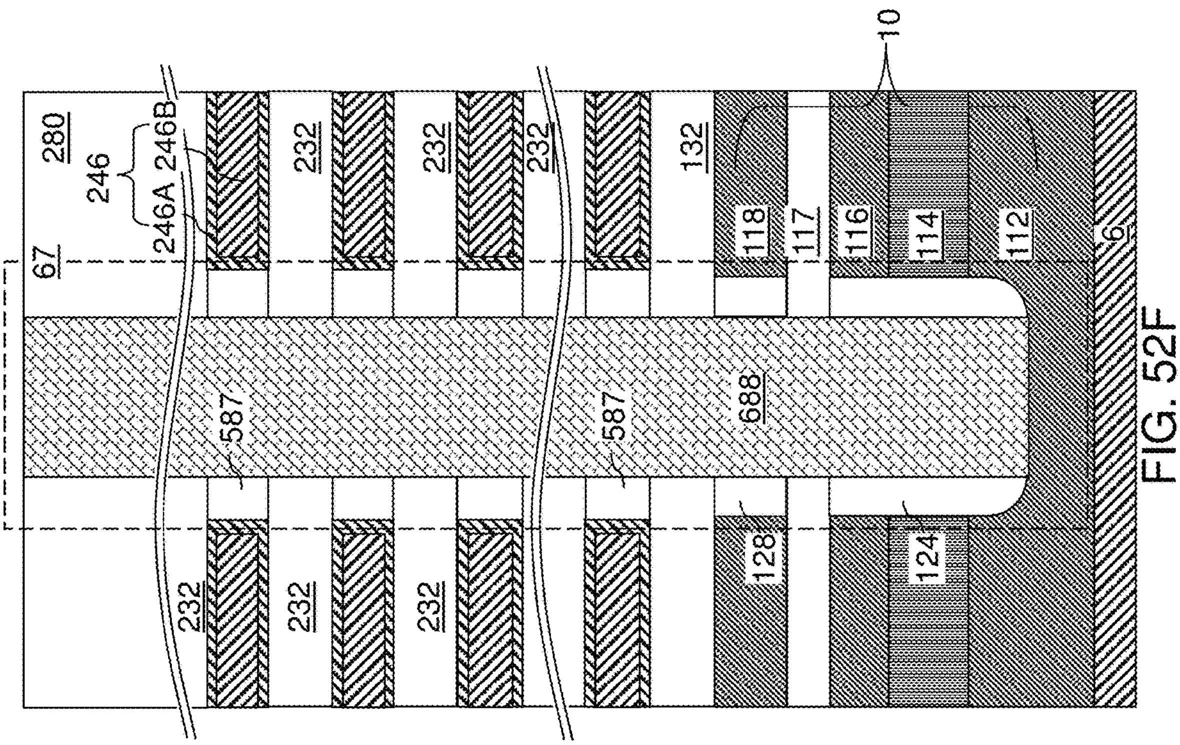
Figure 52G:
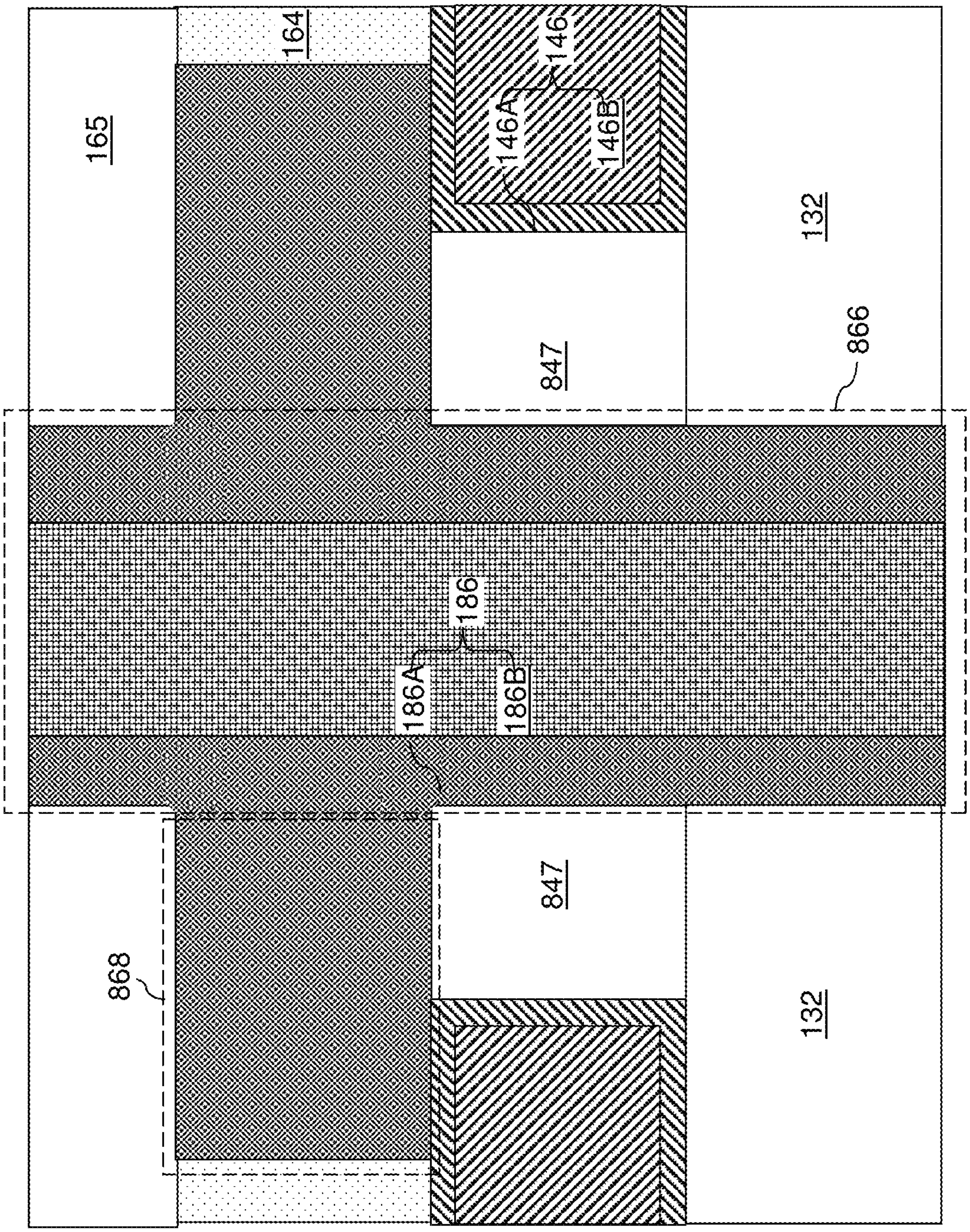
FIG. 52G is a magnified vertical cross-sectional view of a region of a flanged conducive via structure in the staircase region via cavity of FIG. 52C.

Referring to FIGS. 52A-52G, at least one conductive material may be deposited in the staircase region flanged voids 85", the peripheral region cylindrical voids 485', the array region cylindrical voids 585', and the source contact cylindrical voids 685'. As shown in FIG. 52G, the at least one conductive material may include a metallic liner material that is conformally deposited to form a metallic liner 186A within each void, and a metal fill material that is conformally deposited to form a metallic fill material portion 186B. In one embodiment, the metallic liner 186A may include a conductive metal nitride such as TiN, and the metallic fill material portion 186B may include a metal such as tungsten, cobalt, molybdenum, or copper. Excess portion of the at least one conductive material may be removed from above the top surface of the first contact level dielectric layer 280 by a planarization process such as chemical mechanical planarization.

Each combination of a metallic liner 186A and a metallic fill material portion 186B filling a staircase region flanged void 85" constitutes a flanged conductive via structure 186, such as a hook, cross or anchor shaped structure. Each flanged conductive via structure 186 may include a conductive pillar portion 866 having a cylindrical shape and a conductive flange portion 868 projecting from the conductive pillar portion 866 and having an annular shape. Depending on the thickness of the metallic nitride liner 186A, the entire conductive flange portion 868 may consist of only the metallic nitride liner 186A or a combination of the metallic nitride liner 186A and the metallic fill material portion 186B. Each combination of the metallic nitride liner 186A and the metallic fill material portion 186B filling a peripheral region cylindrical void 485' constitutes a peripheral region contact via structure 488. Each combination of the metallic nitride liner 186A and the metallic fill material portion 186B filling an array region cylindrical void 585' constitutes an array region contact via structure 588. Each combination of the metallic nitride liner 186A and the metallic fill material portion 186B filling a source contact cylindrical void 685' constitutes a source contact via structure 688.

Each flanged conductive via structure 186 contacts an annular top surface of a topmost electrically conductive layer (146 or 246) selected from electrically conductive layers (146, 246) through which the flanged conductive via structure 186 vertically extends. Further, each flanged conductive via structure 186 may be formed directly on the top surface of a lower-level metal interconnect structure 780 (such as a topmost lower-level metal line structure 788). Each peripheral region contact via structure 488 may contact a respective lower-level metal interconnect structure 780 (such as a topmost lower-level metal line structure 788) located in the peripheral device region 400. Each array region contact via structure 588 may contact a respective lower-level metal interconnect structure 780 (such as a topmost lower-level metal line structure 788) located in the memory array region 100. Each source contact via structure 688 contacts the lower source layer 112.

Each combination of a flanged conductive via structure 186 and annular insulating spacers (847, 847') laterally surrounding the flanged conductive via structure 186 collectively constitutes a laterally-insulated staircase region via structure 386. Each combination of an array region contact via structure 588 and annular insulating spacers (587, 587') laterally surrounding the array region contact via structure 588 collectively constitutes an array region laterally-insulated via structure 57. Each combination of a source contact via structure 688 and annular insulating spacers 687 laterally surrounding the source contact via structure 688 collectively constitutes a source region laterally-insulated via structure 67.

Figure 53:
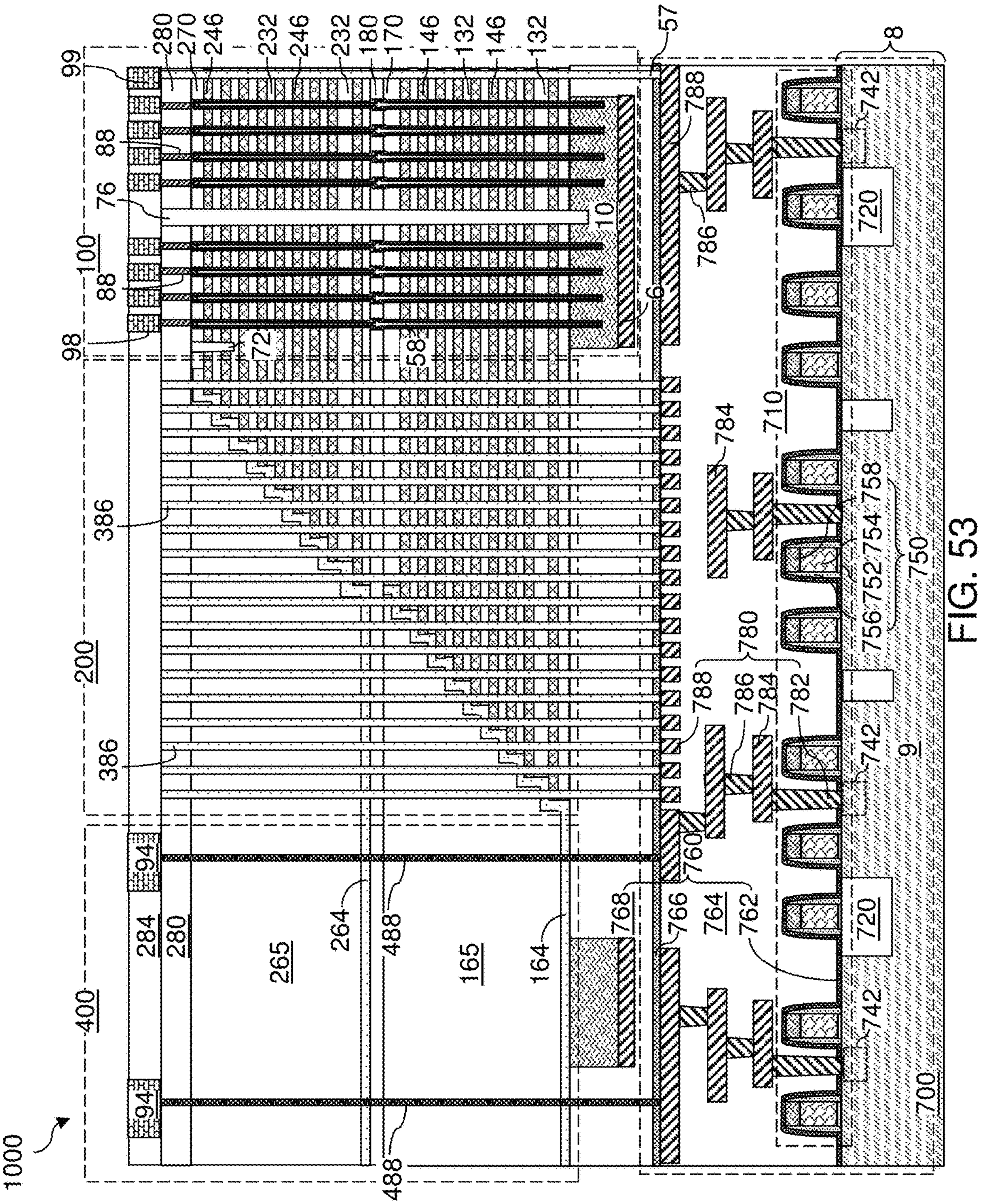
FIG. 53 is a vertical cross-sectional view of the second exemplary structure after formation of drain contact via structures and upper-level metal line structures according to the second embodiment of the present disclosure.

Referring to FIG. 53, the processing steps discussed above with reference to FIGS. 29A and 29B may be performed to form drain contact via structures 88 and bit lines 98 through the first contact level dielectric layer 280 directly on top surfaces of the drain regions 63. Upper-level metal line structures and upper-level dielectric material layers may be formed in the same manner as in the first embodiment. If some of the peripheral devices (e.g., transistors) 710 are located laterally past the end of the staircase, then they may be connected to the top instead of the bottom of the flanged conductive via structure 186 using the peripheral region line structures 94 contacting, and/or electrically connected to, a respective one of the peripheral region contact via structures 488 and one or more respective flanged conductive via structures 186.

Referring to various drawings of the present disclosure and according to various embodiments of the present disclosure, a device structure is provided, which comprises: an alternating stack {(132, 146) and/or (232, 246)} of insulating layers (132 and/or 232) and electrically conductive layers (146 and/or 246) and including stepped surfaces in a staircase region 200; a dielectric liner (264 or 164) located on the stepped surfaces; a retro-stepped dielectric material portion (265 and/or 165) overlying the dielectric liner (264 or 164) and having a top surface located at, or above, a topmost surface of the alternating stack {(132, 146) and/or (232, 246)}; a flanged conductive via structure 186 including a conductive pillar portion 866 extending through the retro-stepped dielectric material portion (265 and/or 165), the dielectric liner (264 and/or 164), a horizontal surface selected from the stepped surfaces, and a subset of layers within the alternating stack {(132, 146) and/or (232, 246)}, and a conductive flange portion 868 laterally protruding from the conductive pillar portion 866 and contacting a top surface of a topmost electrically conductive layer (146 or 246) in the subset of layers within the alternating stack {(132, 146) and/or (232, 246)}; and annular insulating spacers 847 located at each level of electrically conductive layers (146 and optionally 246) in the subset of layers within the alternating stack {(132, 146) and/or (232, 246)} and laterally surrounding the conductive pillar portion 866.

In one embodiment, the insulating layers (132, 232) comprise a first silicon oxide material, the dielectric liner (264 and/or 164) comprises a second silicon oxide material, and the retro-stepped dielectric material portion (265 and/or 165) comprises a third silicon oxide material. An etch rate of the second silicon oxide material in a 100:1 dilute HF solution is greater than an etch rate of the first silicon oxide material in the 100:1 dilute HF solution by a factor of at least 3, and the etch rate of the second silicon oxide material in the 100:1 dilute HF solution is greater than an etch rate of the third silicon oxide material in the 100:1 dilute HF solution by a factor of at least 3. In one embodiment, the first silicon oxide material and the third silicon oxide material are undoped silicate glass materials, and the second silicon oxide material includes a material selected from borosilicate glass, phosphosilicate glass, borophosphosilicate glass, and organosilicate glass.

In one embodiment, the annular insulating spacers 847 comprise a material selected from silicon oxide and a dielectric metal oxide. In one embodiment, a contact area between the conductive flange portion 868 and the topmost electrically conductive layer (146 or 246) in the subset of layers within the alternating stack {(132, 146) and/or (232, 246)} is an annular area located between an outer periphery of the contact area and an inner periphery of the contact area, and the outer periphery of the contact area is laterally offset outward from the inner periphery of the contact area by a uniform lateral distance, which may be the difference between the second lateral offset distance lod2 and the first lateral offset distance lod1. In one embodiment, each of the annular insulating spacers 847 is located within an opening (i.e., a hole) in a respective one of the electrically conductive layers (146 or 246), and contacts a sidewall of the conductive pillar portion 866, and a topmost one of the annular insulating spacers 847 contacts a bottom surface of the conductive flange portion 868.

In one embodiment, the dielectric liner (264 or 164) continuously extends from a bottommost layer within the alternating stack {(132, 146) or (232, 246)} to a topmost layer within the alternating stack {(132, 146) or (232, 246)} and includes a plurality of openings therein, and each of the plurality of openings is located within a respective horizontal portion of the dielectric liner (264, 164) that overlies horizontal surfaces of the stepped surfaces.

In one embodiment, an annular top surface of the conductive flange portion 868 is located within a same horizontal plane as top surface of a horizontal portion of the dielectric liner (264 or 164), and an annular bottom surface of the conductive flange portion 868 is located within a same horizontal plane as a bottom surface of the horizontal portion of the dielectric liner (264 or 164).

In one embodiment, the conductive pillar portion 866 has an upper straight sidewall that extends from a topmost surface of the conductive pillar portion 866 to a periphery at which a top surface of the conductive flange portion 868 adjoins the conductive pillar portion 866, and the conductive pillar portion 866 has a lower straight sidewall that extends from a periphery at which a bottom surface of the conductive flange portion 868 adjoins the conductive pillar portion 866 to a bottommost surface of the conductive pillar portion 866.

In one embodiment, the device structure may comprise lower-level metal interconnect structures 780 formed within lower-level dielectric material layers 760 and located between the substrate 8 and the alternating stack {(132, 146) and/or (232, 246)}, wherein the bottommost surface of the conductive pillar portion 866 contacts a top surface of one of the lower-level metal interconnect structures 780.

In one embodiment, memory stack structures 55 may extend through the alternating stack {(132, 146) and/or (232, 246)}. Each of the memory stack structures 55 comprises a vertical stack of charge storage elements (comprising sections of a charge storage layer located at levels of the electrically conductive layers (146, 246)), a tunneling dielectric layer 56 laterally surrounded by the vertical stack of charge storage elements, and a vertical semiconductor channel 60 laterally surrounded by the tunneling dielectric layer 56. A driver circuitry containing a lower-level metal interconnect structure 780 is located below the alternating stack. The conductive pillar portion 866 physically contacts the lower-level metal interconnect structure 780 located below the alternating stack.

In one embodiment, the device structure comprises a monolithic three-dimensional NAND memory device, the electrically conductive layers (146, 246) comprise, or are electrically connected to, a respective word line of the monolithic three-dimensional NAND memory device, and the substrate 8 comprises a silicon substrate. In one embodiment, the monolithic three-dimensional NAND memory device comprises an array of monolithic three-dimensional NAND strings over the silicon substrate, at least one memory cell in a first device level of the array of monolithic three-dimensional NAND strings is located over another memory cell in a second device level of the array of monolithic three-dimensional NAND strings, and the silicon substrate contains an integrated circuit comprising a driver circuit for the memory device located thereon. In one embodiment, the electrically conductive layers (146, 246) comprise a plurality of control gate electrodes having a strip shape extending substantially parallel to the top surface of the substrate, and the plurality of control gate electrodes comprise at least a first control gate electrode located in the first device level and a second control gate electrode located in the second device level. In one embodiment, the array of monolithic three-dimensional NAND strings comprises: a plurality of semiconductor channels 60, wherein at least one end portion of each of the plurality of semiconductor channels extends substantially perpendicular to a top surface of the substrate 8, and one of the plurality of semiconductor channels 60 including the vertical semiconductor channel 60, and a plurality of charge storage elements, each charge storage element located adjacent to a respective one of the plurality of semiconductor channels 60.

Figure 54A:
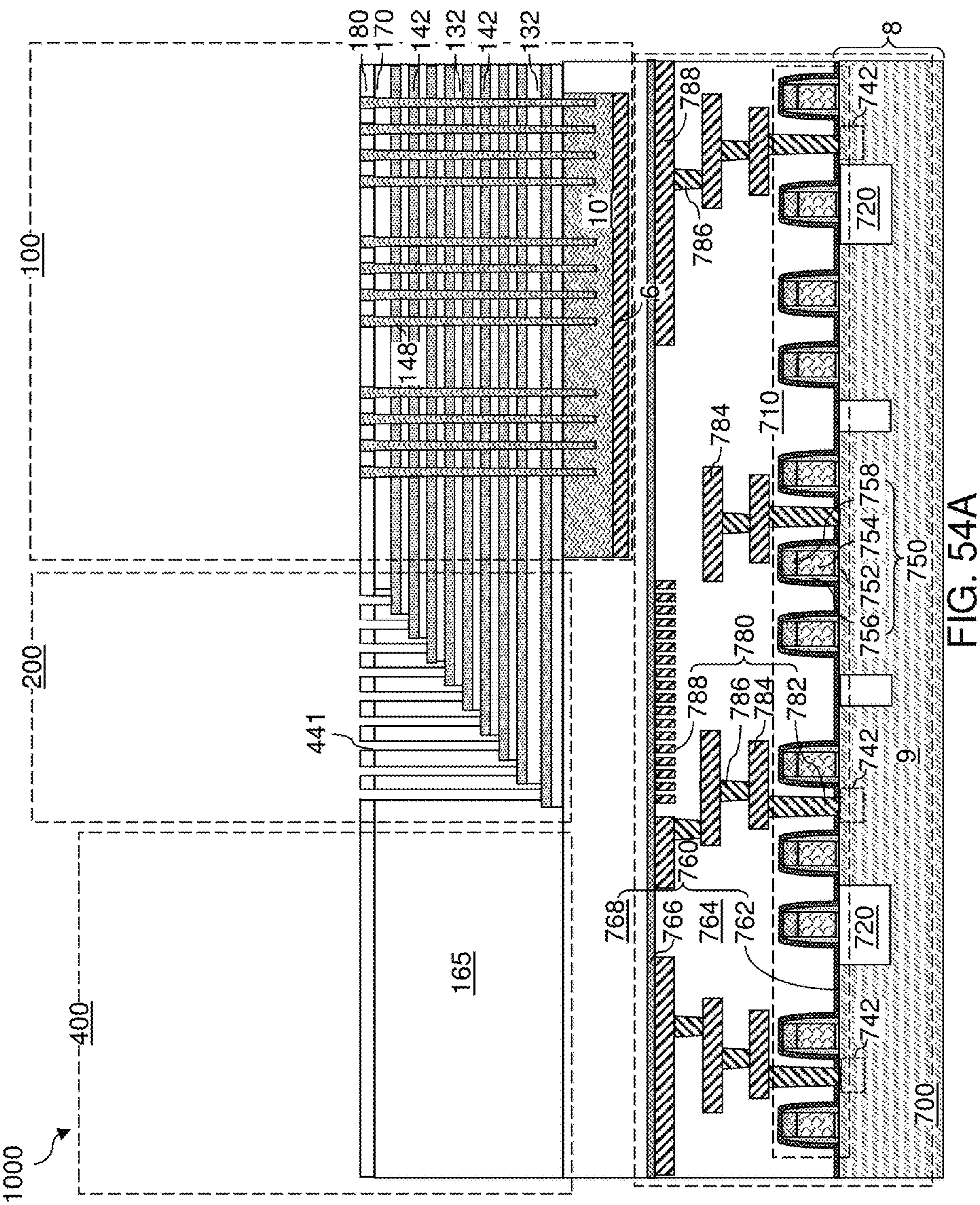
FIG. 54A is a vertical cross-sectional view of a third exemplary structure after formation of a first alternating stack, first stepped surfaces, a first retro-stepped dielectric material portion, sacrificial memory opening fill portions, and first-tier in-process via cavities according to a third embodiment of the present disclosure.
Figure 54B:
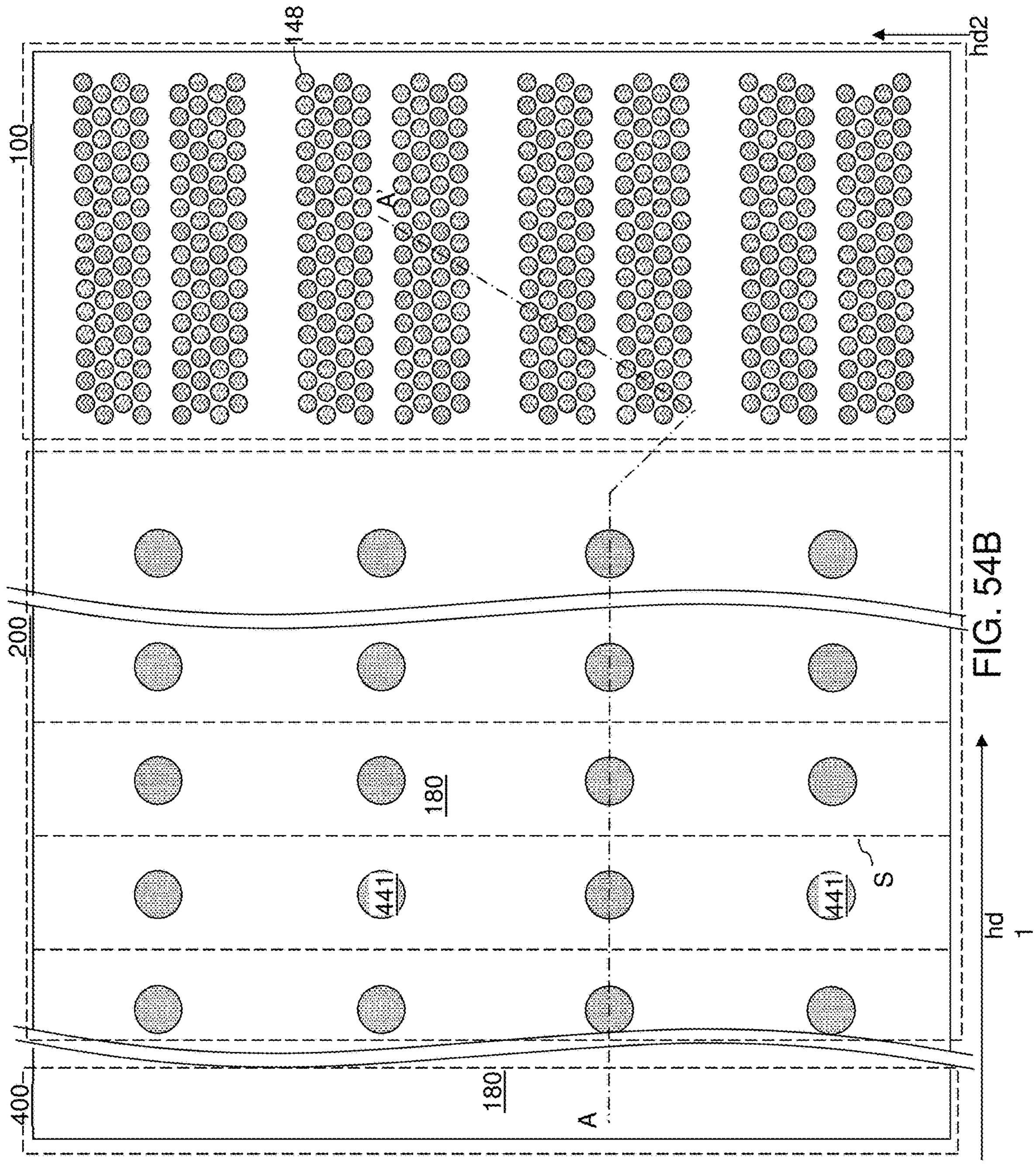
FIG. 54B is a top-down view of the third exemplary structure of FIG. 54A.

Referring to FIGS. 54A and 54B, a third exemplary structure after according to a third embodiment of the present disclosure may be derived from the first exemplary structure of FIG. 7 by forming first-tier in-process via cavities 441. A photoresist layer may be applied and patterned over the first exemplary structure as discussed above with reference to FIG. 7 to form an array of openings in staircase region 200 overlying the first stepped surfaces of the first alternating stack (132, 142). Each opening in the photoresist layer may be formed within the area of a respective underlying horizontal surface, which is contained within the first stepped surfaces and located between a neighboring pair of vertical steps S in the first stepped surfaces.

An anisotropic etch that etches the materials of the inter-tier dielectric layer 180 and the first retro-stepped dielectric material portion 165 selective to the material of the first sacrificial material layers 142 may be performed to form the first-tier in-process via cavities 441. The first-tier in-process via cavities 441 extending through the inter-tier dielectric layer 180 and the first retro-stepped dielectric material portion 165 may be formed underneath the openings in the photoresist layer. Each first-tier in-process via cavity 441 may vertically extend from a top surface of the inter-tier dielectric layer 180 to a top surface of a respective one of the first sacrificial material layers 142. Each of the first-tier in-process via cavities 441 may have an areal overlap with a respective underlying one of the lower-level metal interconnect structures 780 such as topmost lower-level metal line structures 788. In one embodiment, each of the first-tier in-process via cavities 441 may be formed entirely, or substantially, within the area of a respective underlying one of the lower-level metal interconnect structures 780. In one embodiment, the lower-level metal interconnect structures 780 may be lines or pads that repeat along the first horizontal direction hd1 with a periodicity. In one embodiment, the lower-level metal interconnect structures 780 underlying the first stepped surfaces may be arranged in a row along the first horizontal direction hd1, and each of the first-tier in-process via cavities 441 may be formed entirely, or substantially, within the area of every other one of the lower-level metal interconnect structures 780 within the row. The photoresist layer may be removed, for example, by ashing.

Figure 55A:
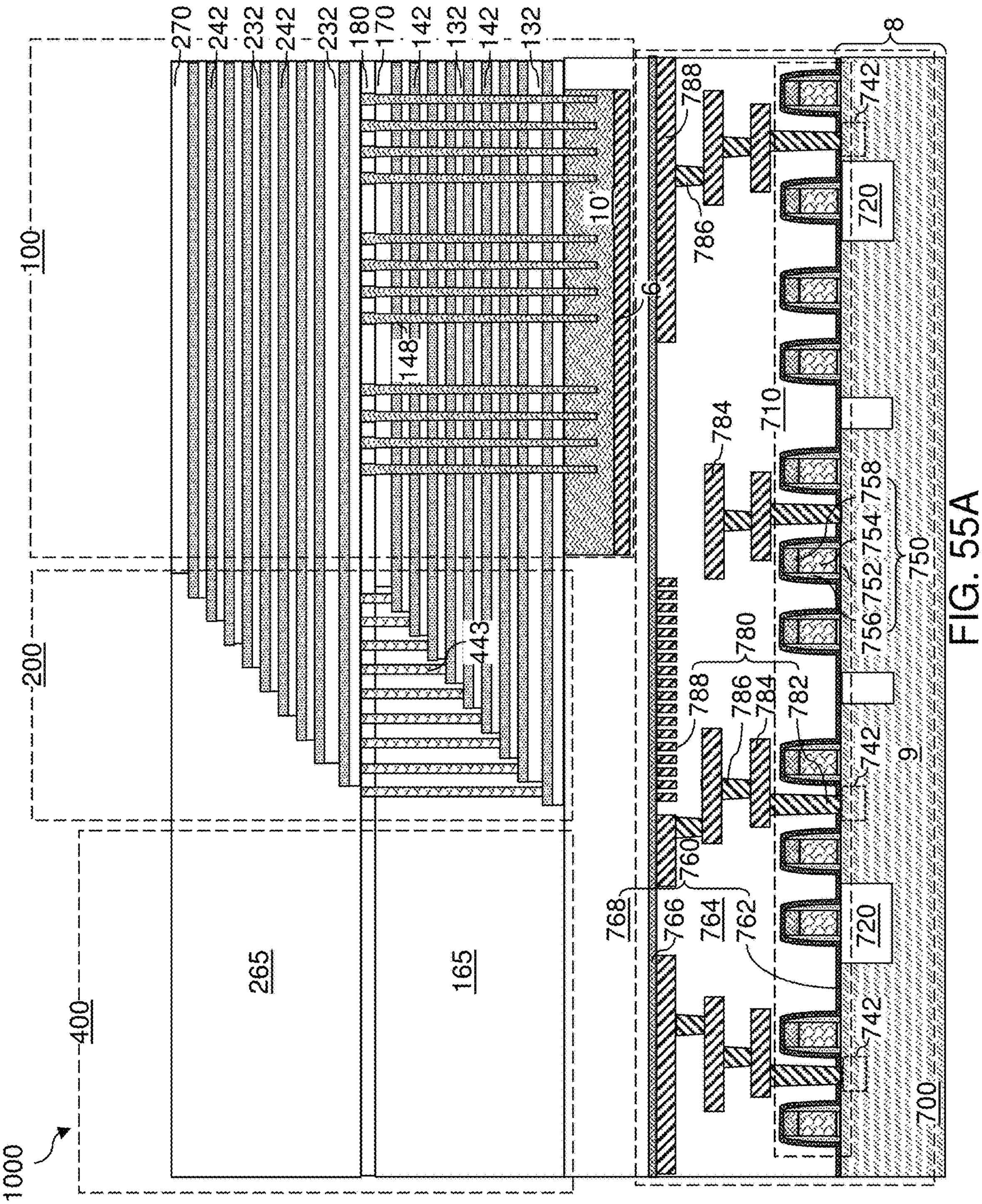
FIG. 55A is a vertical cross-sectional view of the third exemplary structure after formation of sacrificial via fill structures, a second alternating stack, second stepped surfaces, and a second retro-stepped dielectric material portion according to a third embodiment of the present disclosure.
Figure 55B:
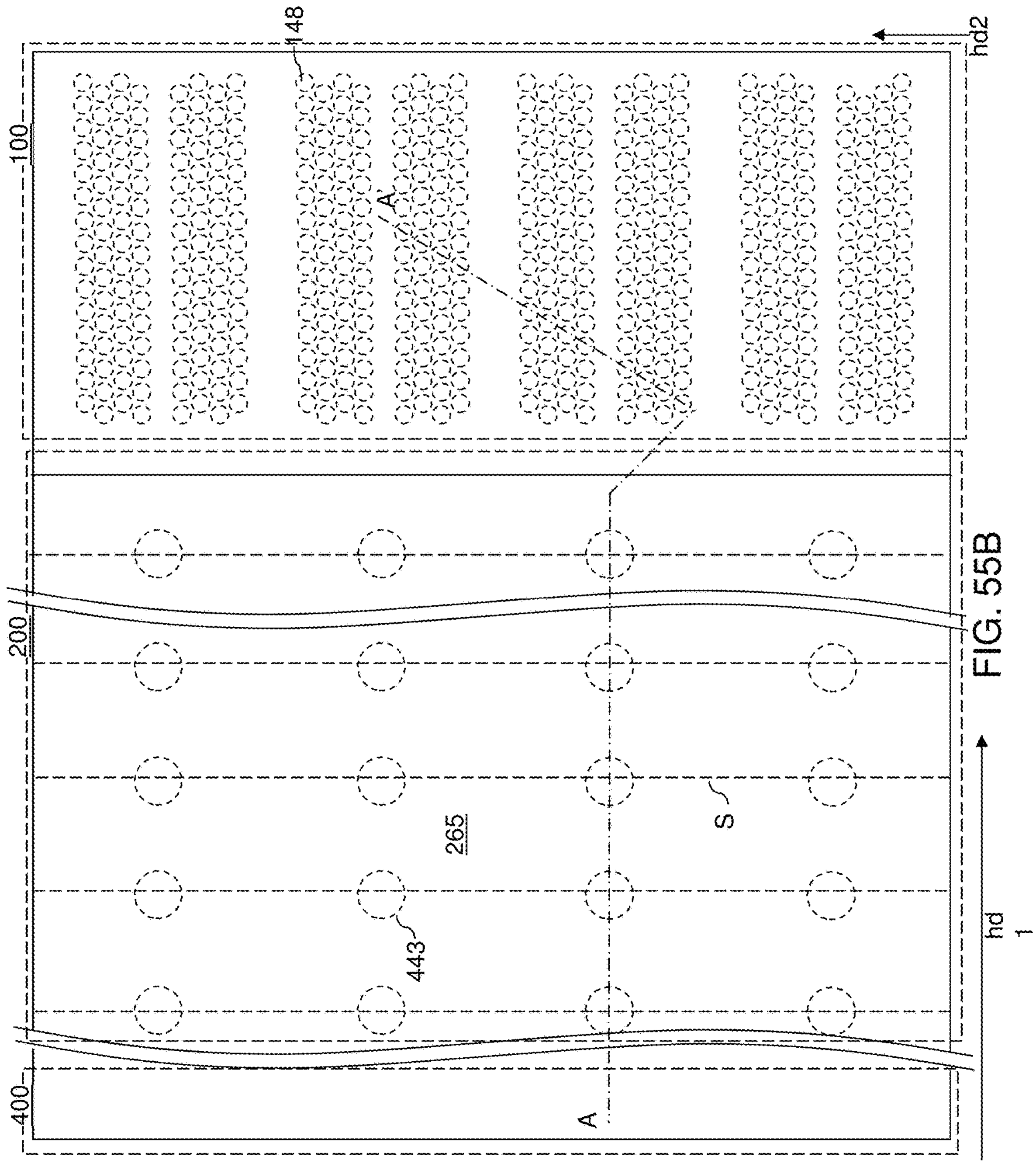
FIG. 55B is a partial see-through top-down view of the third exemplary structure of FIG. 55A.

Referring to FIGS. 55A and 55B, first sacrificial via fill structures 443 are formed in the first-tier in-process via cavities 441. The first sacrificial via fill structures 443 may be formed by depositing a first sacrificial via fill material within the first-tier in-process via cavities 441 and by removing excess portions of the first sacrificial via fill material from above the horizontal plane including the top surface of the inter-tier dielectric layer 180 by a planarization process, which may use chemical mechanical planarization (CMP) or a recess etch. The first sacrificial via fill material includes a material that may be removed selective to the materials of the inter-tier dielectric layer 180, the first retro-stepped dielectric material portion 165, and the first sacrificial material layers 142. For example, the first sacrificial via fill material may include amorphous silicon, polysilicon, a silicon-germanium alloy, organosilicate glass, amorphous carbon, diamond-like carbon, an organic polymer, or a silicon-based polymer. In an illustrative example, the sacrificial fill material may include amorphous silicon or amorphous carbon. The processing steps as discussed above with reference to FIG. 8 may be performed on the structure discussed with reference to FIG. 54A-54B to form a second alternating stack (232, 242), a second insulating cap layer 270, second stepped surfaces, and a second retro-stepped dielectric material portion 265.

According to an embodiment of the present disclosure, the pattern of the second stepped surfaces in the staircase region may be selected such that areas of horizontal surfaces of the second stepped surfaces overlap with areas of horizontal surfaces of the first stepped surfaces in a plan view. The plan view is a view along a direction that is perpendicular to parallel horizontal surfaces of the first insulating layers 132, the first sacrificial material layers 142, the second insulating layers 232, and the second sacrificial material layers 242. In one embodiment, the locations of steps S in the second stepped surfaces may overlap with a respective column of first sacrificial via fill structures 443. Generally, at least 50%, and/or at least 90%, of the area of the second stepped surfaces in the plan view may overlap with the area of the first stepped surfaces in the plan view. Forming the second stepped surfaces in an area having an areal overlap with the first stepped surfaces may provide the advantage of reducing the total area of a semiconductor die that is used to form stepped surfaces and layer-contact via structures.

Figure 56:
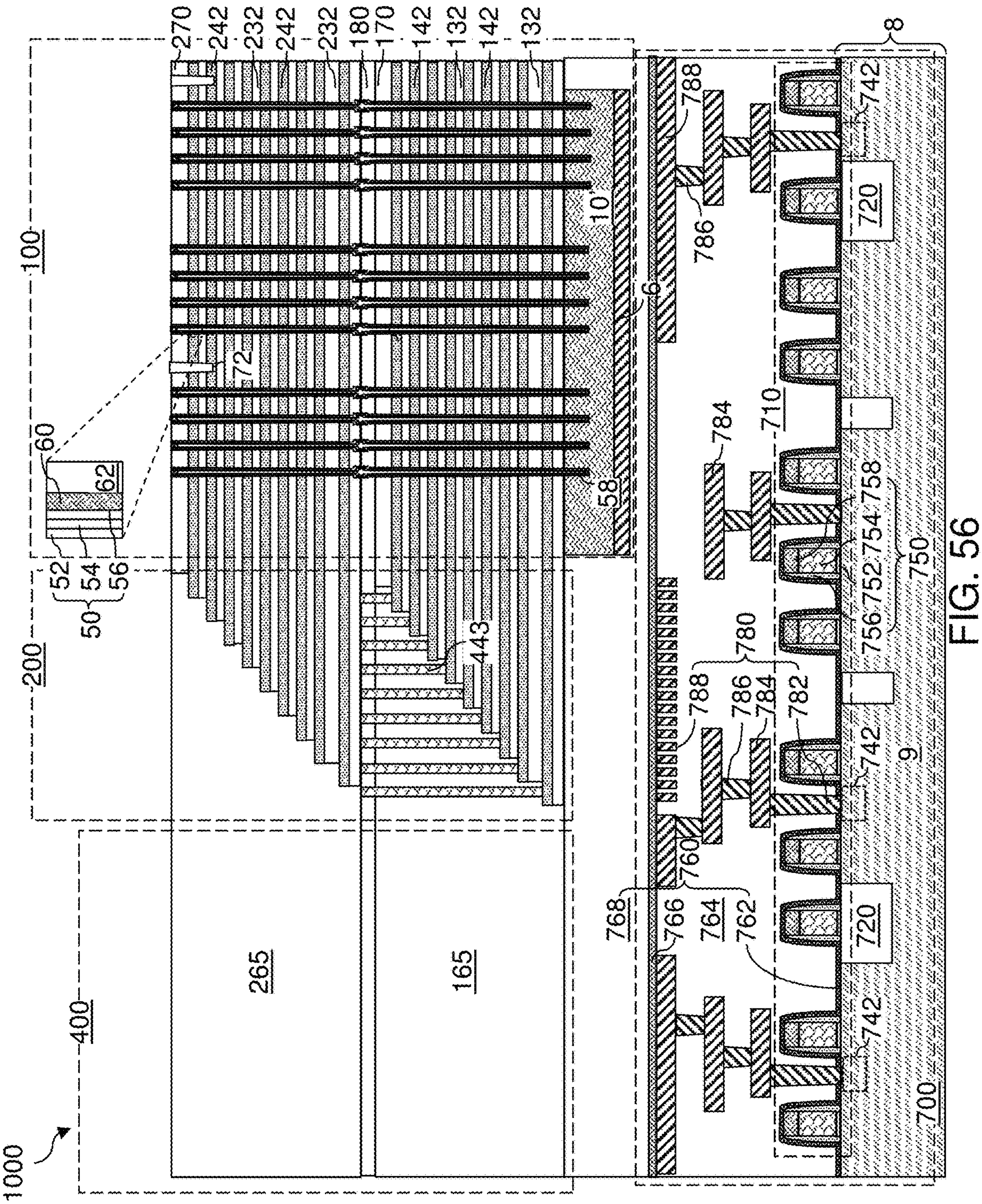
FIG. 56 is a vertical cross-sectional view of the third exemplary structure after formation of memory opening fill structures according to the third embodiment of the present disclosure.

Referring to FIG. 56, the processing steps as discussed above with reference to FIGS. 8A and 8B may be performed on the structure illustrated in FIGS. 55A and 55B to form drain-select-level isolation structures 72. The processing steps as discussed above with reference to FIGS. 9A and 9B, 10A and 10B, 11A-11D, and 12 may be performed to form memory openings 49 and memory opening fill structures 58.

Figure 57A:
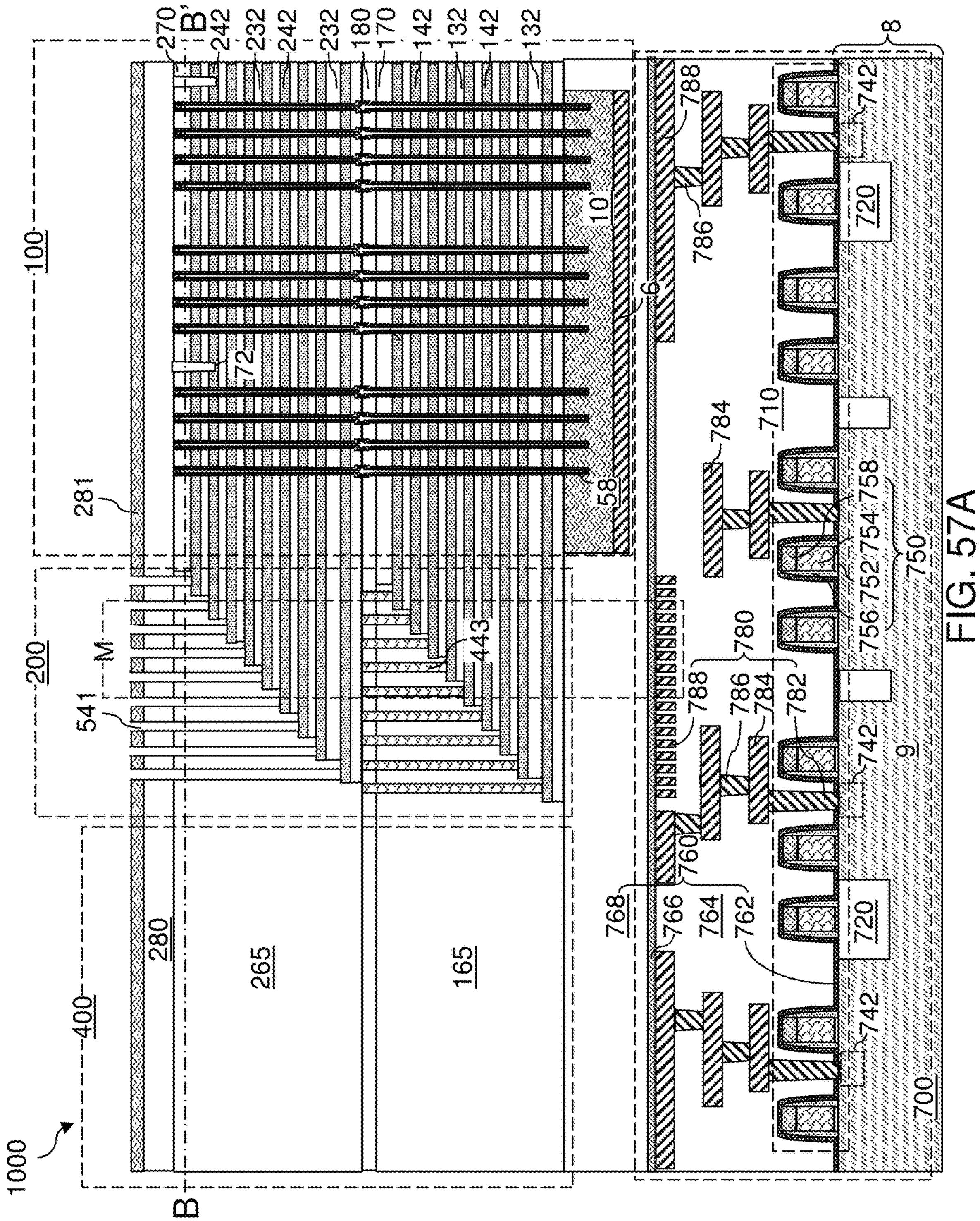
FIG. 57A is a vertical cross-sectional view of the third exemplary structure after formation of second-tier in-process via cavities according to the third embodiment of the present disclosure.
Figure 57B:
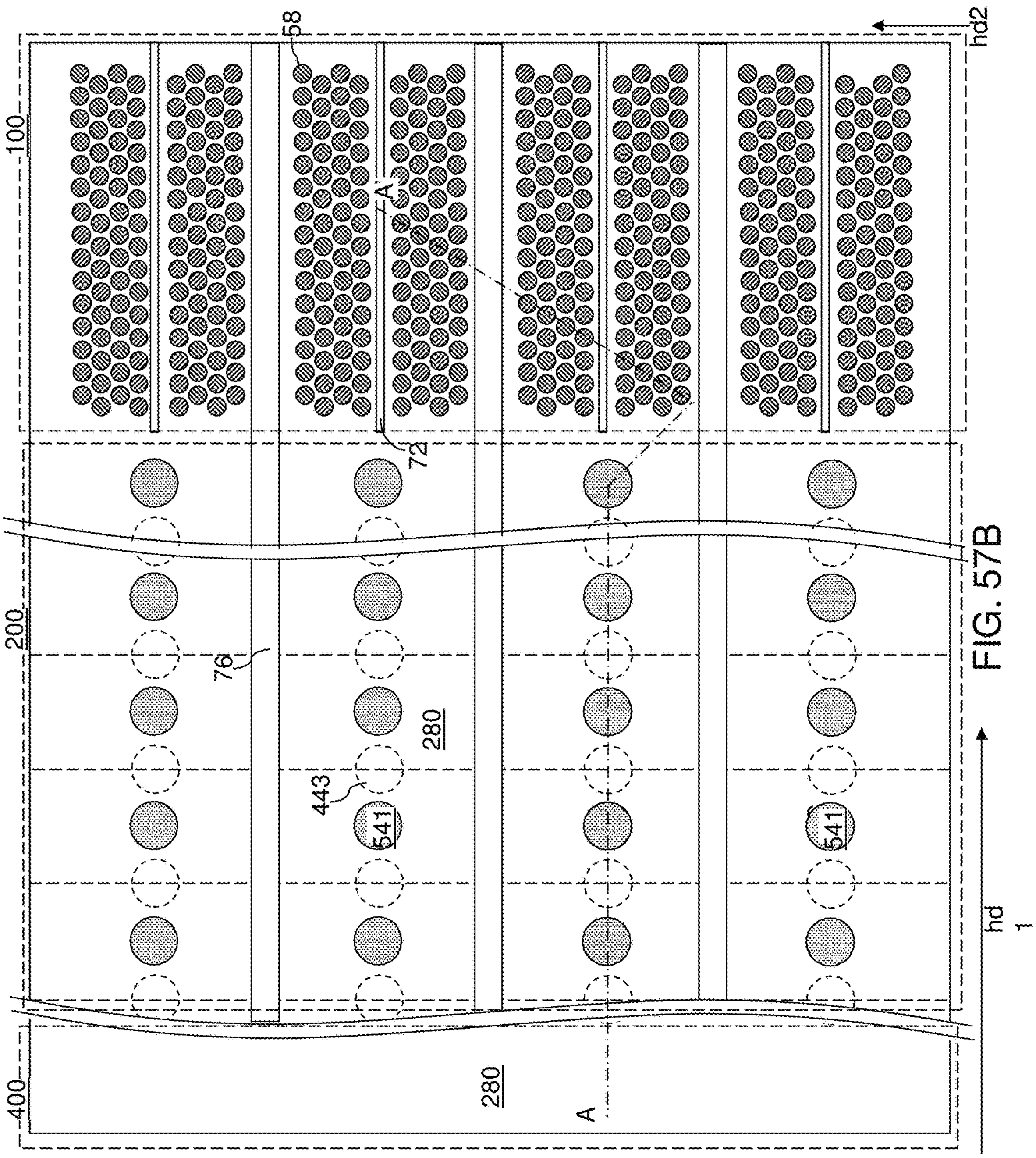
FIG. 57B is a horizontal cross-sectional view of the third exemplary structure along the horizontal plane B-B' of FIG. 57A.
Figure 57C:
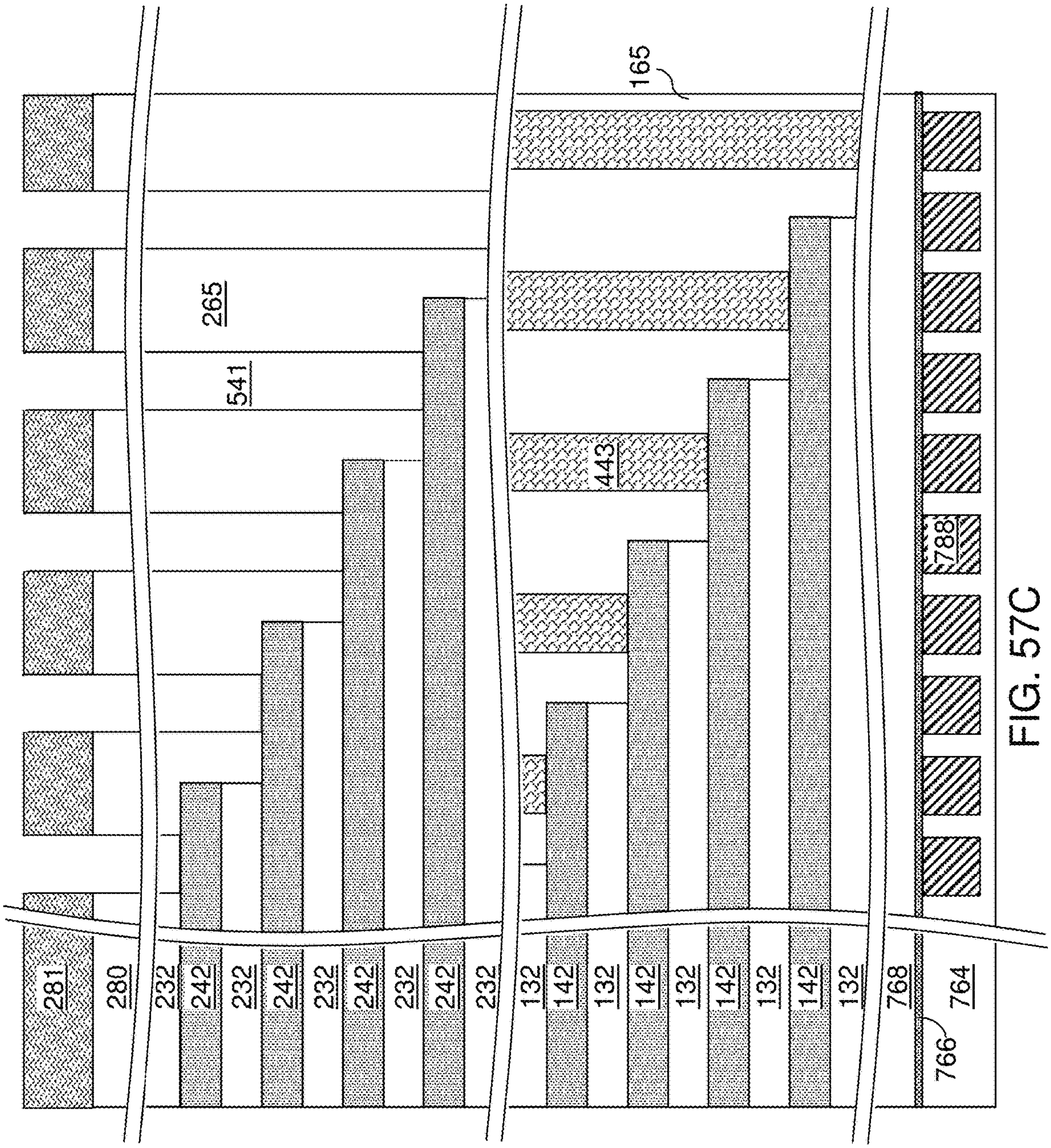
FIG. 57C is a magnified view of a region of the vertical cross-sectional view of FIG. 57A.

Referring to FIGS. 57A-57C, a first contact level dielectric layer 280 may be formed over the second insulating cap layer 270 and the memory opening fills structures 58 in the same manner as in the first embodiment. FIG. 57C illustrates a magnified view of the magnification region M of FIG. 57A. A first patterning film 281 may be applied over the first contact level dielectric layer 280, and may be lithographically patterned to form an array of openings overlying the second stepped surfaces of the second alternating stack (232, 242). For example, a photoresist layer (not shown) may be applied over the first patterning film 281 and may be lithographically patterned. The pattern in the photoresist layer may be transferred into the first patterning film 281 by an anisotropic etch process. The first patterning film 281 may function as a more robust etch mask layer than the photoresist layer. Each opening in the first patterning film 281 may be formed within the area of a respective underlying horizontal surface contained within the second stepped surfaces and located between a neighboring pair of vertical steps S in the second stepped surfaces. In one embodiment, the openings in the first patterning film 281 may be formed as a two-dimensional array of openings that do not overlap with the areas of the first sacrificial via fill structures 443 contained in the first-tier structure (132, 142, 170, 165, 443). In one embodiment, the array of the first sacrificial via fill structures 443 and the array of the openings in the first patterning film 281 may have the same two-dimensional periodicity with a lateral offset along the first horizontal direction hd1 that is one half of the periodicity of each of the two arrays.

An anisotropic etch that etches the materials of the second insulating cap layer 270 and the second retro-stepped dielectric material portion 265 selective to the material of the second sacrificial material layers 242 may be performed to form second-tier in-process via cavities 541. The second-tier in-process via cavities 541 extending through the second insulating cap layer 270 and the second retro-stepped dielectric material portion 265 may be formed underneath the openings in the first patterning film 281. Each second-tier in-process via cavity 541 may vertically extend from a top surface of the second insulating cap layer 270 to a top surface of a respective one of the second sacrificial material layers 242. Each of the second-tier in-process via cavities 541 may have an areal overlap with a respective underlying one of the lower-level metal interconnect structures 780 such as topmost lower-level metal line structures 788. In one embodiment, each of the second-tier in-process via cavities 541 may be formed entirely, or substantially, within the area of a respective underlying one of the lower-level metal interconnect structures 780. Each second-tier in-process via cavity 541 is an in-process via cavity that extends through the second retro-stepped dielectric material portion 265. A bottom surface of each second-tier in-process via cavity 541 is formed on a respective one of the second sacrificial material layers 242.

In one embodiment, the lower-level metal interconnect structures 780 may include an array of metal interconnect structures (such as topmost lower-level metal line structures 788) that are arranged along the first horizontal direction hd1, and are sequentially numbered with a consecutive set of natural numbers without any gap throughout (such as a set of consecutive natural numbers beginning with 1). In one embodiment, the first-tier in-process via cavities 441 may be formed within areas of even-numbered ones of the metal interconnect structures at the processing steps of FIGS. 54A and 54B and the second-tier in-process via cavities 541 may be formed within areas of odd-numbered ones of the metal interconnect structures at the processing steps of FIGS. 57A-57C. Alternatively, the first-tier in-process via cavities 441 may be formed within areas of odd-numbered ones of the metal interconnect structures at the processing steps of FIGS. 54A and 54B and the second-tier in-process via cavities 541 may be formed within areas of even-numbered ones of the metal interconnect structures at the processing steps of FIGS. 57A-57C.

Figure 58A:
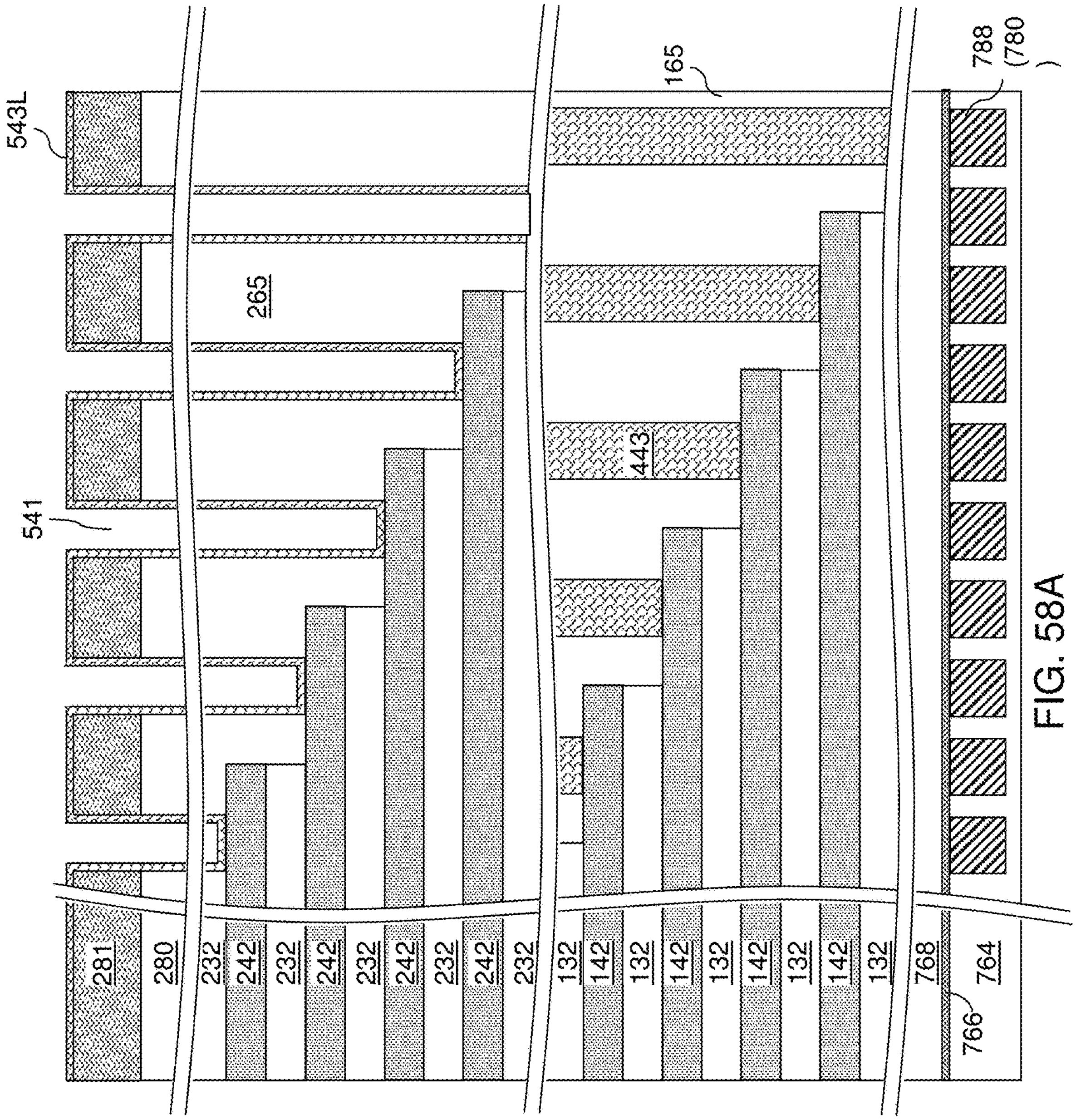
FIGS. 58A-58P are sequential vertical cross-sectional views of a region of the third exemplary structure during formation of laterally-insulated staircase region via structures according to an embodiment of the present disclosure.

Referring to FIG. 58A, a second-tier sacrificial liner layer 543L may be deposited over the first patterning film 281 and at a periphery of each second-tier in-process via cavity 541. The second-tier sacrificial liner layer 543L includes a material that may be removed selective to the materials of the first and second retro-stepped dielectric material portions (165, 265), the first and second insulating layers (132, 232), and the first and second sacrificial material layers (142, 242). For example, the second-tier sacrificial liner layer 543L may include a semiconductor material such as amorphous silicon or polysilicon. The thickness of the second-tier sacrificial liner layer 543L may be in a range from 2 nm to 20 nm, such as from 3 nm to 10 nm, although lesser and greater thicknesses may also be used. The second-tier sacrificial liner layer 543L may be deposited, for example, by low pressure chemical vapor deposition process.

Figure 58B:
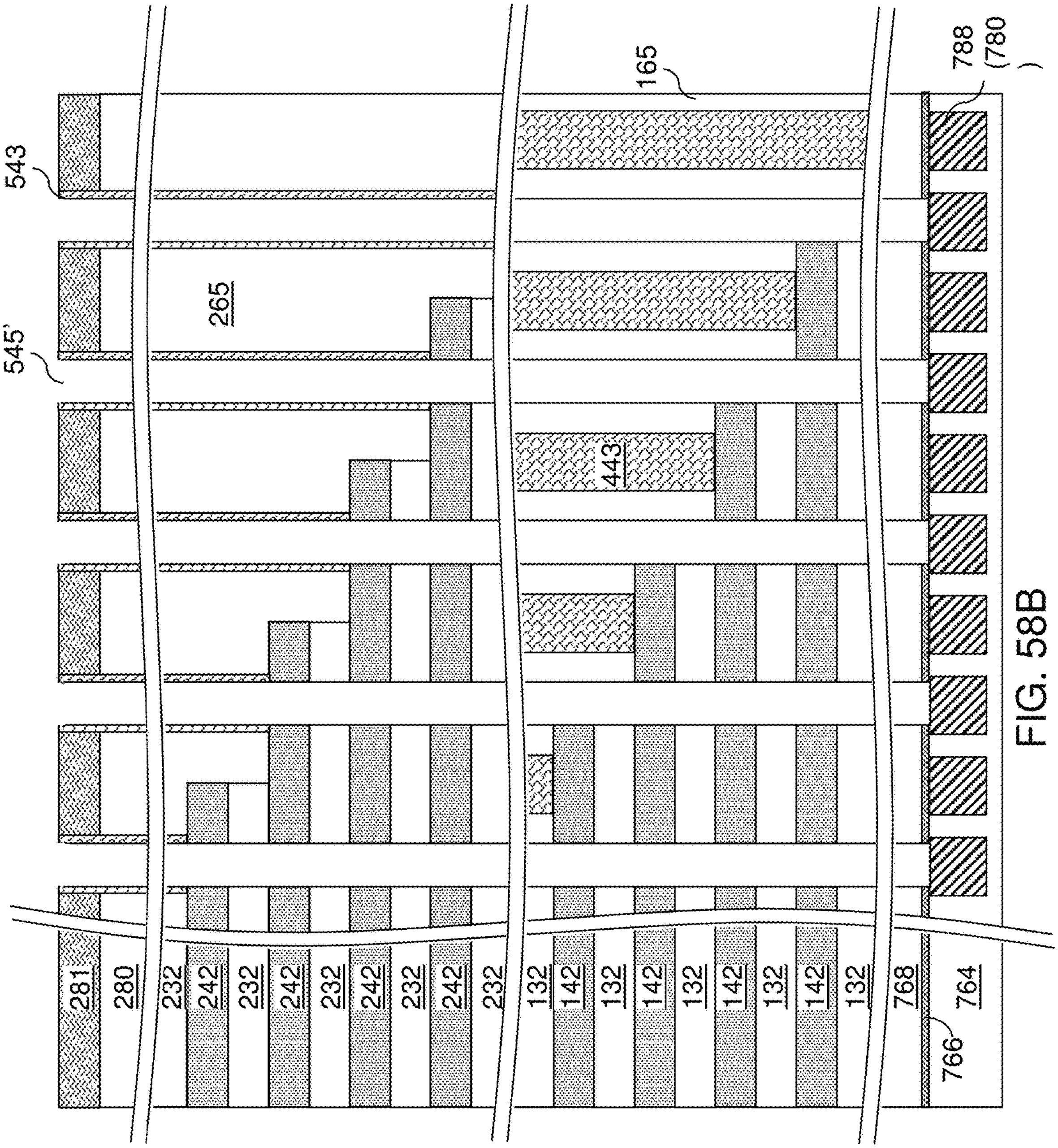
FIG. 58Q is a magnified view of a contact region of a laterally-insulated staircase region via structure of FIG. 58P.

Referring to FIG. 58B, an anisotropic etch process may be subsequently performed. The anisotropic etch process includes a first step that etches horizontal portions of the second-tier sacrificial liner layer 543L from above the first patterning film 281 and from the bottom region of each second-tier in-process via cavity 541. Each remaining cylindrical portion of the second-tier sacrificial liner layer 543L constitutes a second-tier sacrificial liner 543. The second-tier sacrificial liners 543 are formed within the second-tier in-process via cavities 541.

The anisotropic etch process includes a second step in which the materials of the first retro-stepped dielectric material portion 165, the first and second insulating layers (132, 232), the first and second sacrificial material layers (142, 242), and the at least one second dielectric material layer 768 are etched selective to the materials of the second-tier sacrificial liners 543 and the first patterning film 281. The second-tier in-process via cavities 541 are vertically extended through the second alternating stack (232, 242), the first retro-stepped dielectric material portion 165, the first alternating stack (132, 142), and the at least one second dielectric material layer 768 within areas that are not masked by the combination of the second-tier sacrificial liners 543 and the first patterning film 281. First vertically-extended in-process via cavities 545' are formed by vertically extending the second-tier in-process via cavities 541 in the second step of the anisotropic etch process. A top surface of a lower-level metal interconnect structure 780 (such as a respective topmost lower-level metal line structure 788) is physically exposed at the bottom of each first vertically-extended in-process via cavity 545'.

Figure 58C:
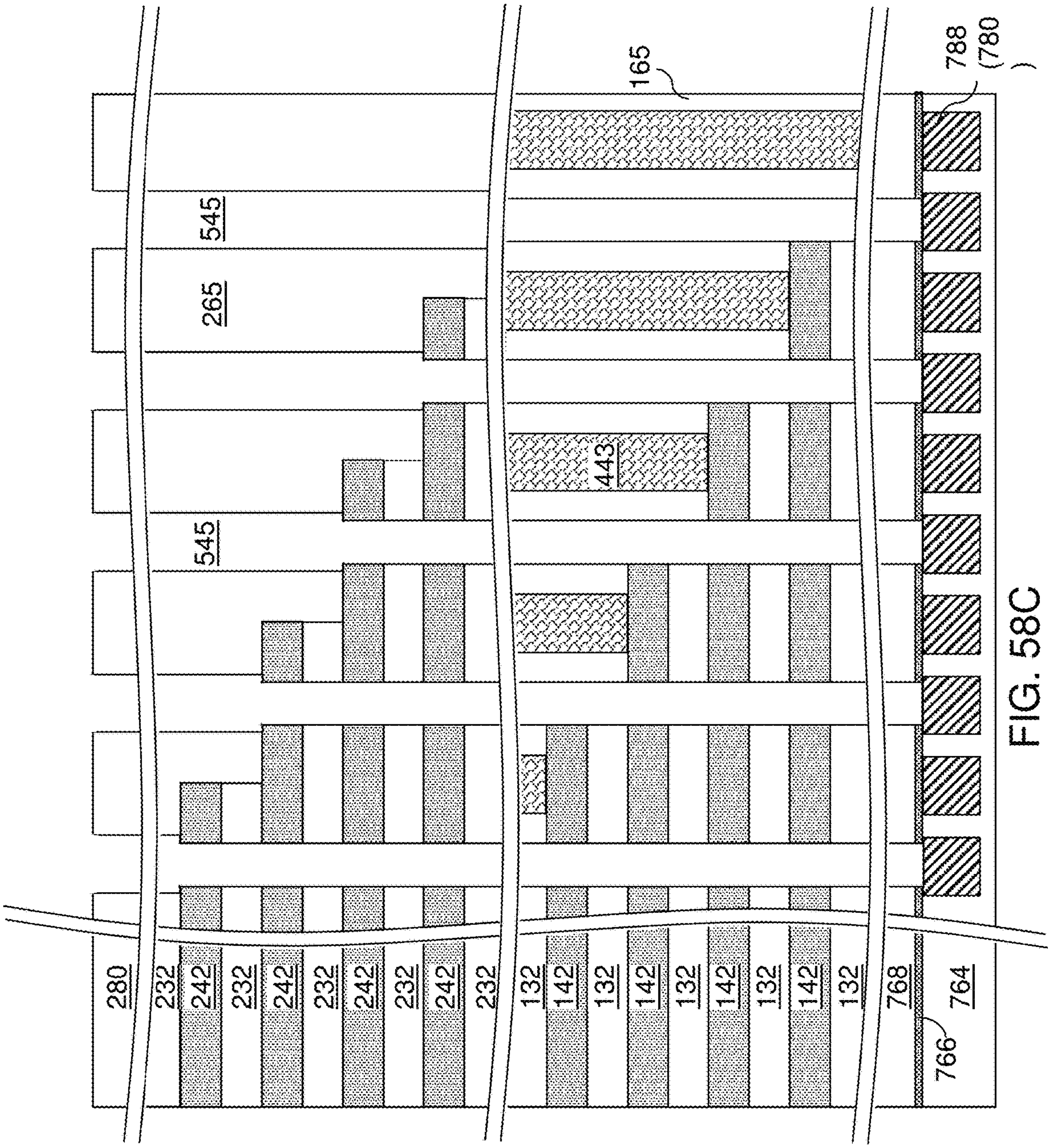

Referring to FIG. 58C, the remaining portions of the second-tier sacrificial liners 543 and the first patterning film 281 may be removed selective to the materials of the first and second retro-stepped dielectric material portions (165, 265), the first and second insulating layers (132, 232), the first and second sacrificial material layers (142, 242), the first contact level dielectric layer 280, and the physically exposed ones of the lower-level metal interconnect structures 780 (such as the topmost lower-level metal line structures 788). For example, a wet etch process using hot trimethyl-2 hydroxyethyl ammonium hydroxide ("hot TMY") or tetramethyl ammonium hydroxide (TMAH) may be used to remove the second-tier sacrificial liners 543. The first patterning film 281 may be removed, for example, by ashing. First inter-tier stepped via cavities 545 are formed by laterally expanding the volumes of the first vertically-extended in-process via cavities 545' through removal of the second-tier sacrificial liners 543. Each first inter-tier stepped via cavity 545 includes an upper cavity portion overlying a physically exposed annular surface of a second sacrificial material layer 242 and having a greater lateral dimension, and a lower cavity portion underlying the upper cavity portion and extending through the second alternating stack (232, 242), the first retro-stepped dielectric material portion 165, and the first alternating stack (132, 142). A top surface of a lower-level metal interconnect structure 780 (such as a respective topmost lower-level metal line structure 788) is physically exposed at the bottom of each first inter-tier stepped via cavity 545.

Figure 58D:
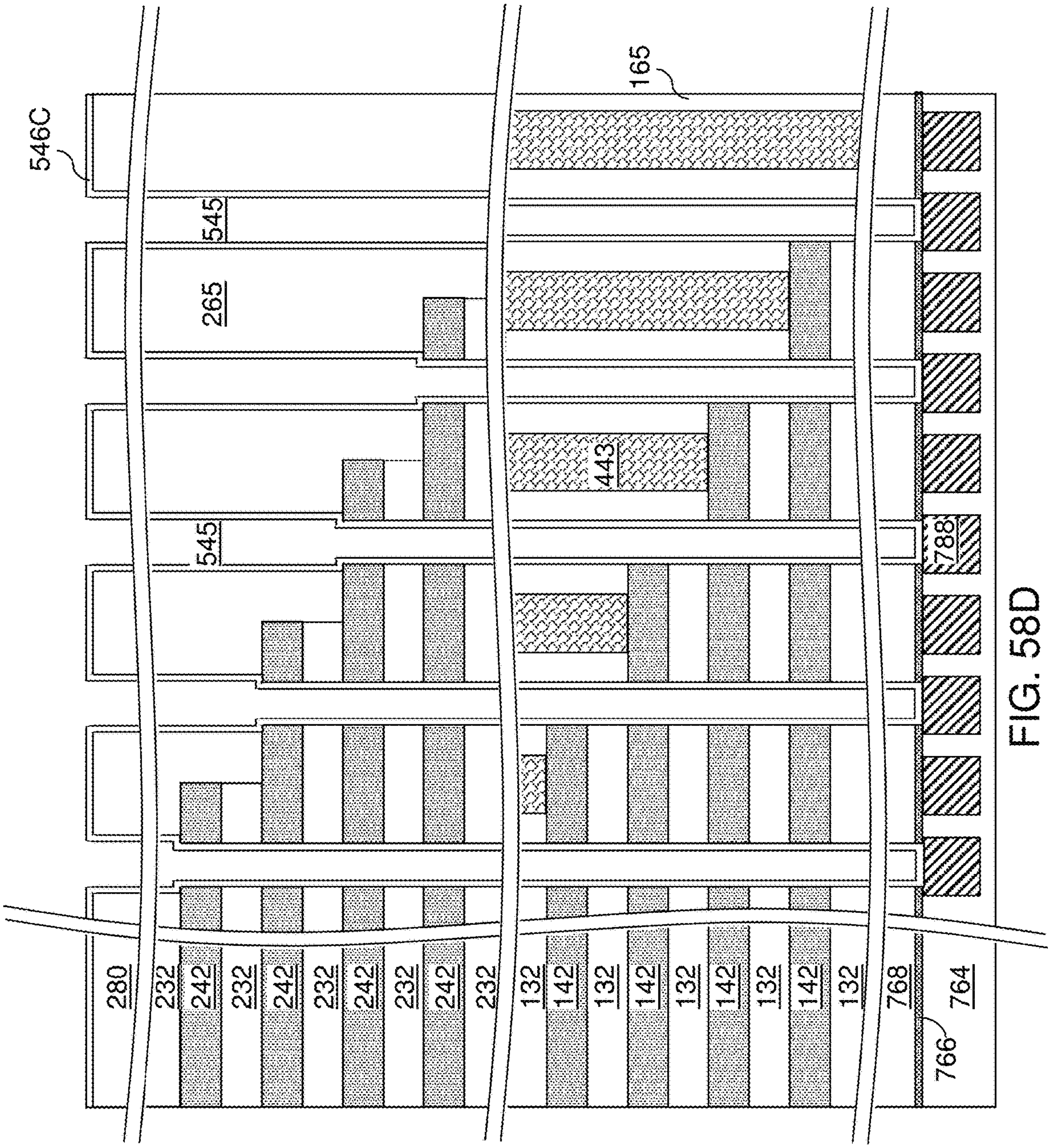

Referring to FIG. 58D, a first inter-tier dielectric liner layer 546C is formed within the first inter-tier stepped via cavities 545 and over the first contact level dielectric layer 280 by conformal deposition of a dielectric material such as silicon oxide or a dielectric metal oxide (e.g., aluminum oxide). The first inter-tier dielectric liner layer 546C may be deposited by a conformal deposition process such as low pressure chemical vapor deposition, and may have a thickness in a range from 2 nm to 20 nm, such as from 3 nm to 10 nm, although lesser and greater thicknesses may also be used.

Figure 58E:
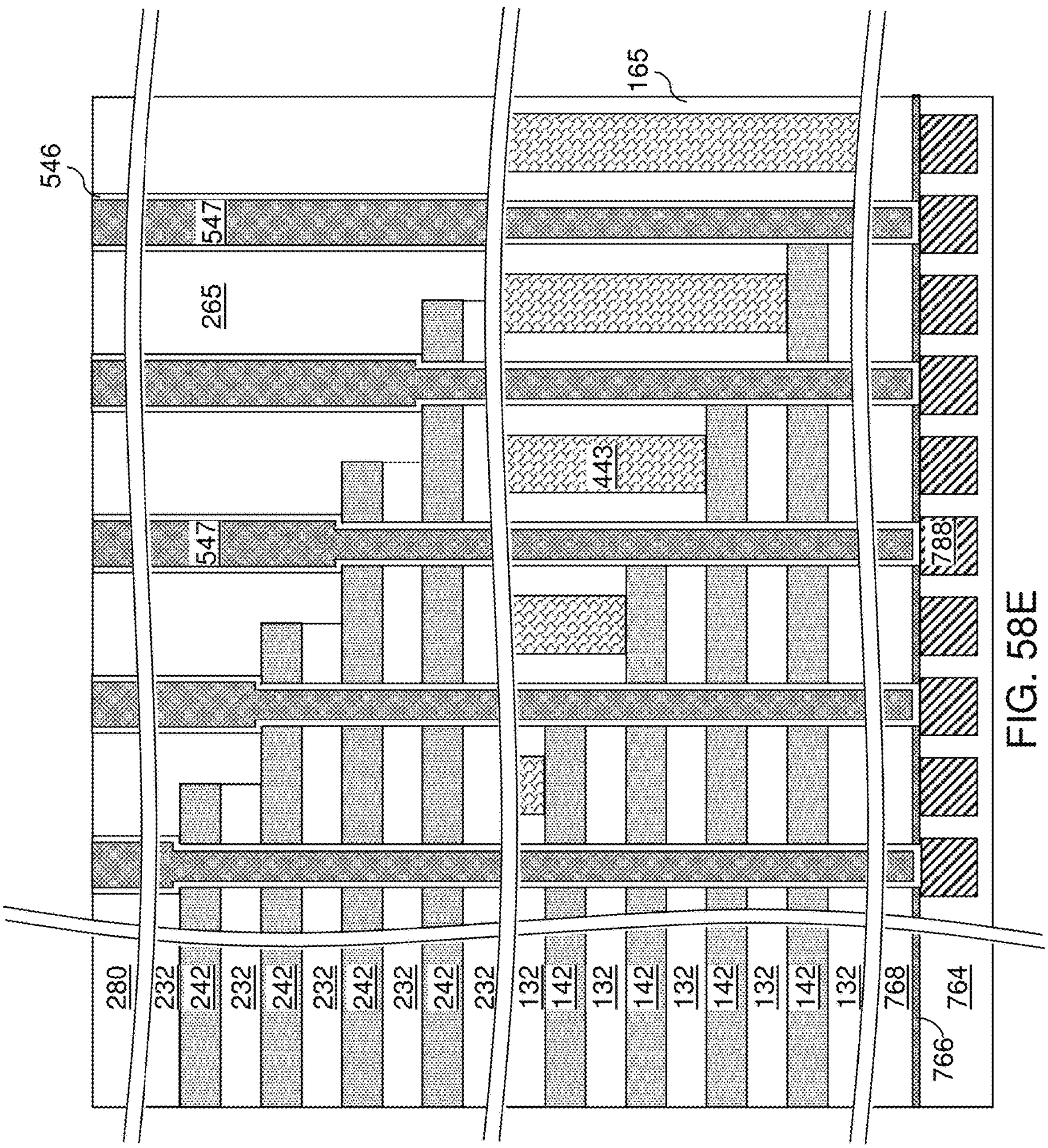

Referring to FIG. 58E, a second sacrificial via fill material may be deposited in unfilled volumes of the first inter-tier stepped via cavities 545 and over the first contact level dielectric layer 280. The second sacrificial via fill material is a material that is different from the material of the first inter-tier dielectric liner layer 546C. Any material that may be removed selective to the material of the first inter-tier dielectric liner layer 546C may be used for the second sacrificial via fill material. For example, the second sacrificial via fill material may include silicon nitride. Excess portions of the second sacrificial via fill material and the horizontal portion of the first inter-tier dielectric liner layer 546C may be removed from above the top surface of the first contact level dielectric layer 280 by a planarization process. The planarization process may use chemical mechanical planarization (CMP) and/or at least one recess etch. Each remaining discrete portion of the second sacrificial via fill material in a respective first inter-tier stepped via cavity 545 constitutes a first inter-tier sacrificial via fill structure 547.

Figure 58F:
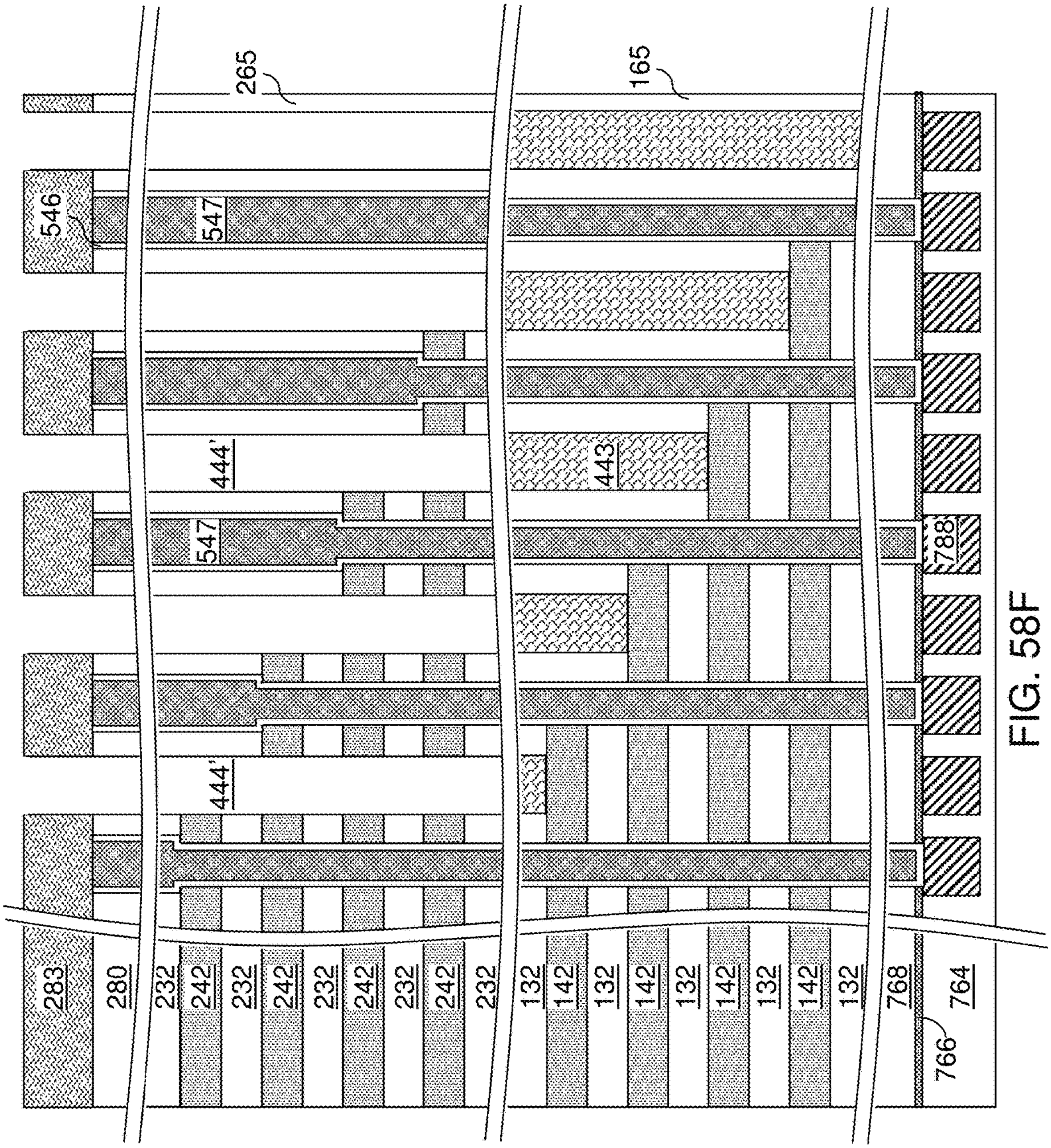

Referring to FIG. 58F, a second patterning film 283 may be applied over the first contact level dielectric layer 280, and may be lithographically patterned to form openings having the same pattern as the first sacrificial via fill structures 443. For example, a photoresist layer may be applied and patterned over the second patterning film 283 with a pattern of openings that has the same pattern as the pattern for the first sacrificial via fill structures 443. The pattern in the photoresist layer may be transferred into the second patterning film 283 by a first step of an anisotropic etch process. A second step of the anisotropic etch process may be performed to form extension via cavities 444' that extent through the first contact level dielectric layer 280, the second retro-stepped dielectric material portion 265, the second alternating stack (231, 242), and the inter-tier dielectric layer 180 to a top surface of a respective one of the first sacrificial via fill structures 443. Each of the extension via cavities 444' may be aligned to an underlying one of the first sacrificial via fill structures 443 and may have the same lateral dimension as the underlying one of the first sacrificial via fill structures 443. Alternatively, the extension via cavities 444' may be laterally offset with respective to the underlying one of the first sacrificial via fill structures 443 due to overlay variations during a lithographic process that pattern the photoresist layer over the second patterning film 283.

Figure 58G:
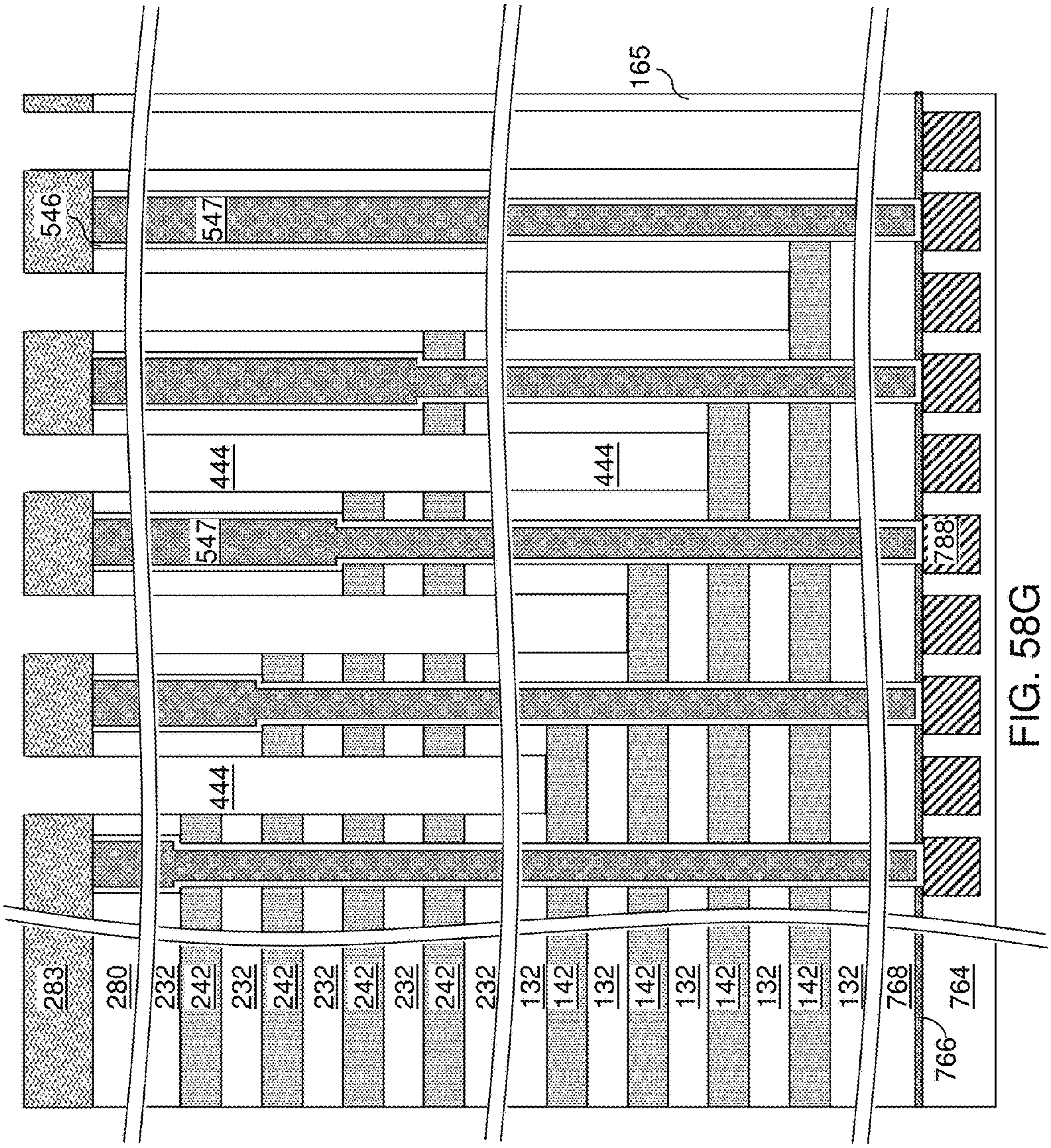

Referring to FIG. 58G, the first sacrificial via fill structures 443 may be removed from underneath the extension via cavities 444' by an etch process, which may include an anisotropic etch process or an isotropic etch process. For example, if the first sacrificial via fill structures 443 include undoped silicon, the first sacrificial via fill structures 443 may be removed by a wet etch process using hot trimethyl-2 hydroxyethyl ammonium hydroxide ("hot TMY") or tetramethyl ammonium hydroxide (TMAH). The extension via cavities 444' are vertically extended to form the inter-tier in-process via cavities 444. Each inter-tier in-process via cavity 444 may vertically extend from the top surface of the first contact level dielectric layer 280 to a top surface of a respective one of the first sacrificial material layers 142.

Figure 58H:
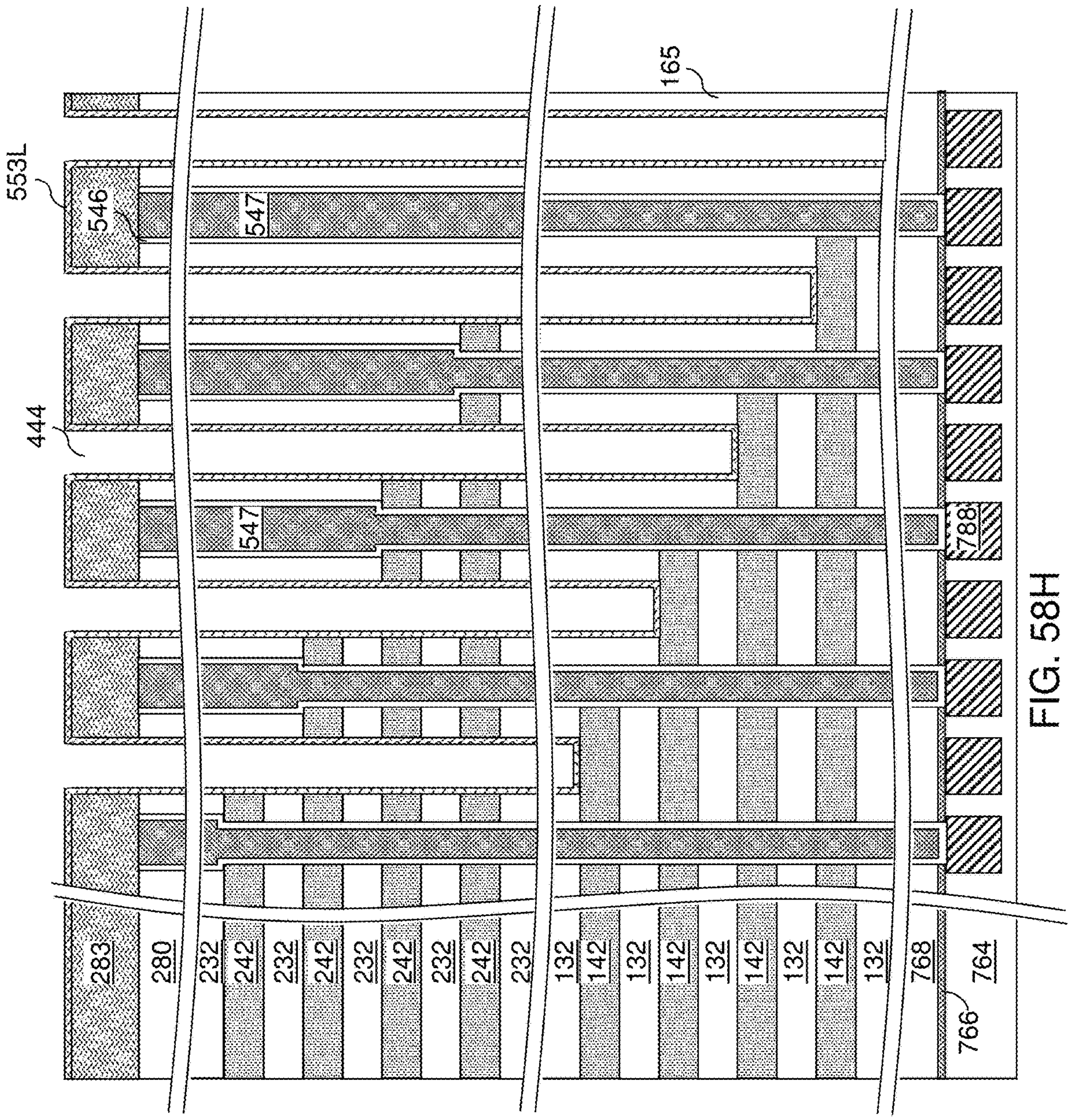

Referring to FIG. 58H, an inter-tier sacrificial liner layer 553L may be deposited over the second patterning film 283 and at a periphery of each inter-tier in-process via cavity 444. The inter-tier sacrificial liner layer 553L includes a material that may be removed selective to the materials of the first and second retro-stepped dielectric material portions (165, 265), the first and second insulating layers (132, 232), and the first and second sacrificial material layers (142, 242). For example, the inter-tier sacrificial liner layer 553L may include a semiconductor material such as amorphous silicon or polysilicon. The thickness of the inter-tier sacrificial liner layer 553L may be in a range from 2 nm to 20 nm, such as from 3 nm to 10 nm, although lesser and greater thicknesses may also be used. The inter-tier sacrificial liner layer 553L may be deposited, for example, by low pressure chemical vapor deposition process.

Figure 58I:
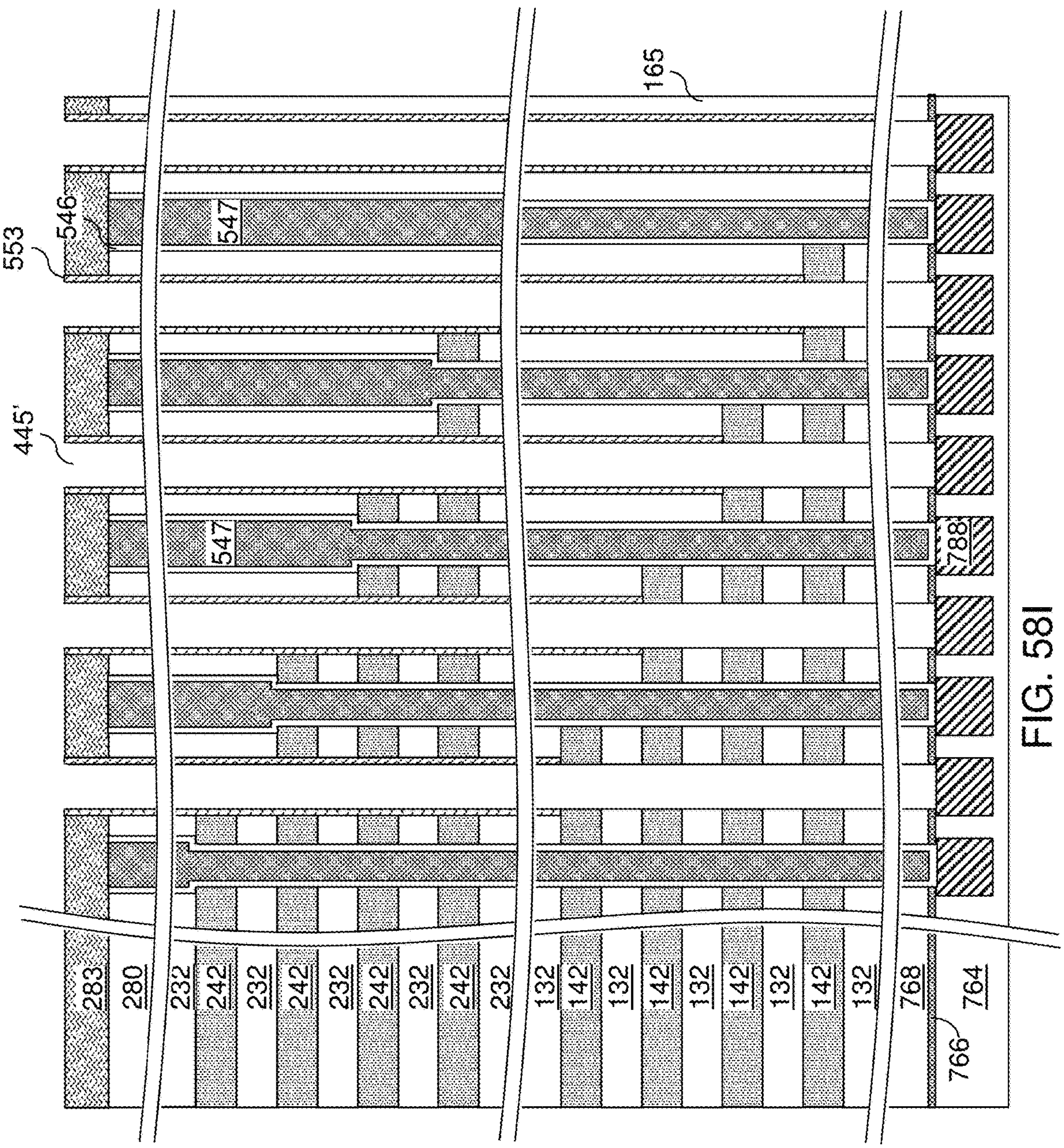

Referring to FIG. 58I, an anisotropic etch process may be subsequently performed. The anisotropic etch process includes a first step that etches horizontal portions of the inter-tier sacrificial liner layer 553L from above the second patterning film 283 and from the bottom region of each inter-tier in-process via cavity 444. Each remaining cylindrical portion of the inter-tier sacrificial liner layer 553L constitutes an inter-tier sacrificial liner 553. The inter-tier sacrificial liners 553 are formed within the inter-tier in-process via cavities 444.

The anisotropic etch process includes a second step in which the materials of the first alternating stack (132, 142) are etched selective to the materials of the inter-tier sacrificial liners 553 and the second patterning film 283. The inter-tier in-process via cavities 444 are vertically extended through the first alternating stack (132, 142) and the at least one second dielectric material layer 768 within areas that are not masked by the combination of the inter-tier sacrificial liners 553 and the second patterning film 283. Second vertically-extended in-process via cavities 445' are formed by vertically extending the inter-tier in-process via cavities 444 in the second step of the anisotropic etch process. A top surface of a lower-level metal interconnect structure 780 (such as a respective topmost lower-level metal line structure 788) is physically exposed at the bottom of each second vertically-extended in-process via cavity 445'.

Figure 58J:
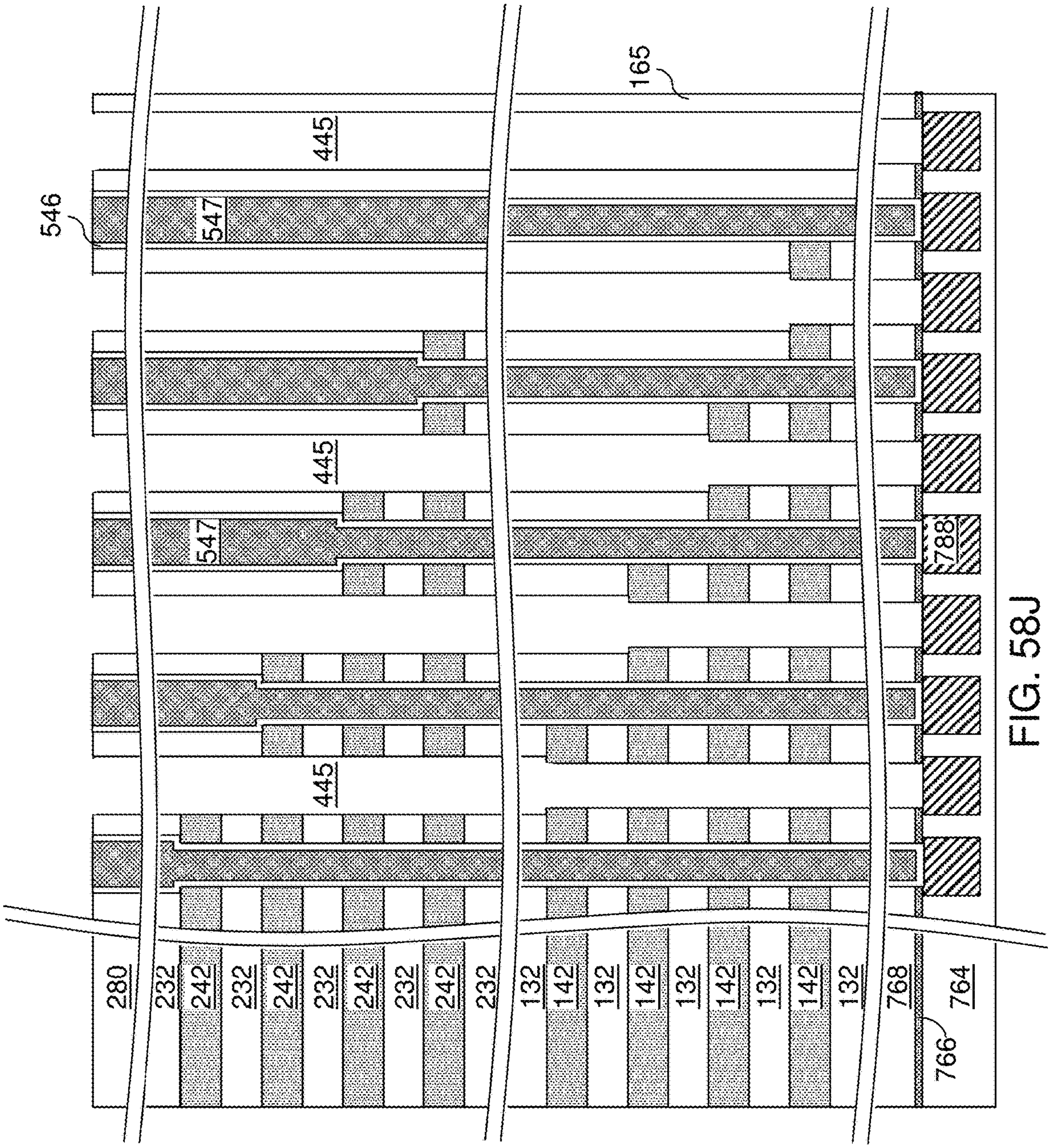

Referring to FIG. 58J, the remaining portions of the inter-tier sacrificial liners 553 and the second patterning film 283 may be removed selective to the materials of the first and second retro-stepped dielectric material portions (165, 265), the first and second insulating layers (132, 232), the first and second sacrificial material layers (142, 242), the first contact level dielectric layer 280, and the physically exposed ones of the lower-level metal interconnect structures 780 (such as the topmost lower-level metal line structures 788). For example, a wet etch process using hot trimethyl-2 hydroxyethyl ammonium hydroxide ("hot TMY") or tetramethyl ammonium hydroxide (TMAH) may be used to remove the inter-tier sacrificial liners 553. The second patterning film 283 may be removed, for example, by ashing. Second inter-tier stepped via cavities 445 are formed by laterally expanding the volumes of the second vertically-extended in-process via cavities 445' through removal of the inter-tier sacrificial liners 553. Each second inter-tier stepped via cavity 445 includes an upper cavity portion overlying a physically exposed annular surface of a first sacrificial material layer 142 and having a greater lateral dimension and extending through the second retro-stepped dielectric material portion 265, the second alternating stack (232, 242), and the first retro-stepped dielectric material portion 165, and includes a lower cavity portion underlying the upper cavity portion and extending through the first alternating stack (132, 142). A top surface of a lower-level metal interconnect structure 780 (such as a respective top-most lower-level metal line structure 788) is physically exposed at the bottom of each second inter-tier stepped via cavity 445.

Figure 58K:
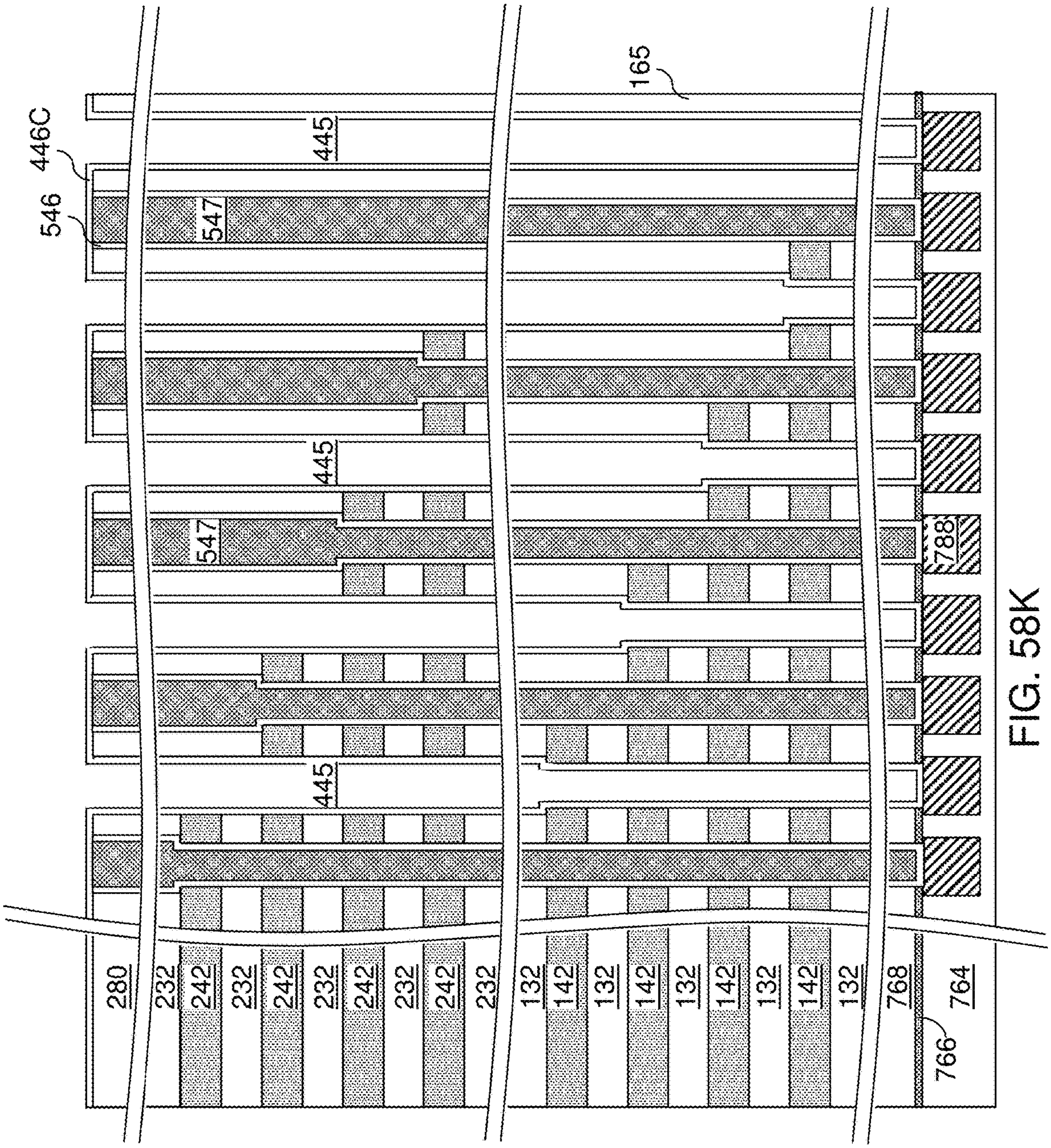

Referring to FIG. 58K, a second inter-tier dielectric liner layer 446C is formed within the second inter-tier stepped via cavities 445 and over the first contact level dielectric layer 280 by conformal deposition of a dielectric material such as silicon oxide or a dielectric metal oxide (e.g., aluminum oxide). The second inter-tier dielectric liner layer 446C may be deposited by a conformal deposition process such as low pressure chemical vapor deposition, and may have a thickness in a range from 2 nm to 20 nm, such as from 3 nm to 10 nm, although lesser and greater thicknesses may also be used.

Figure 58L:
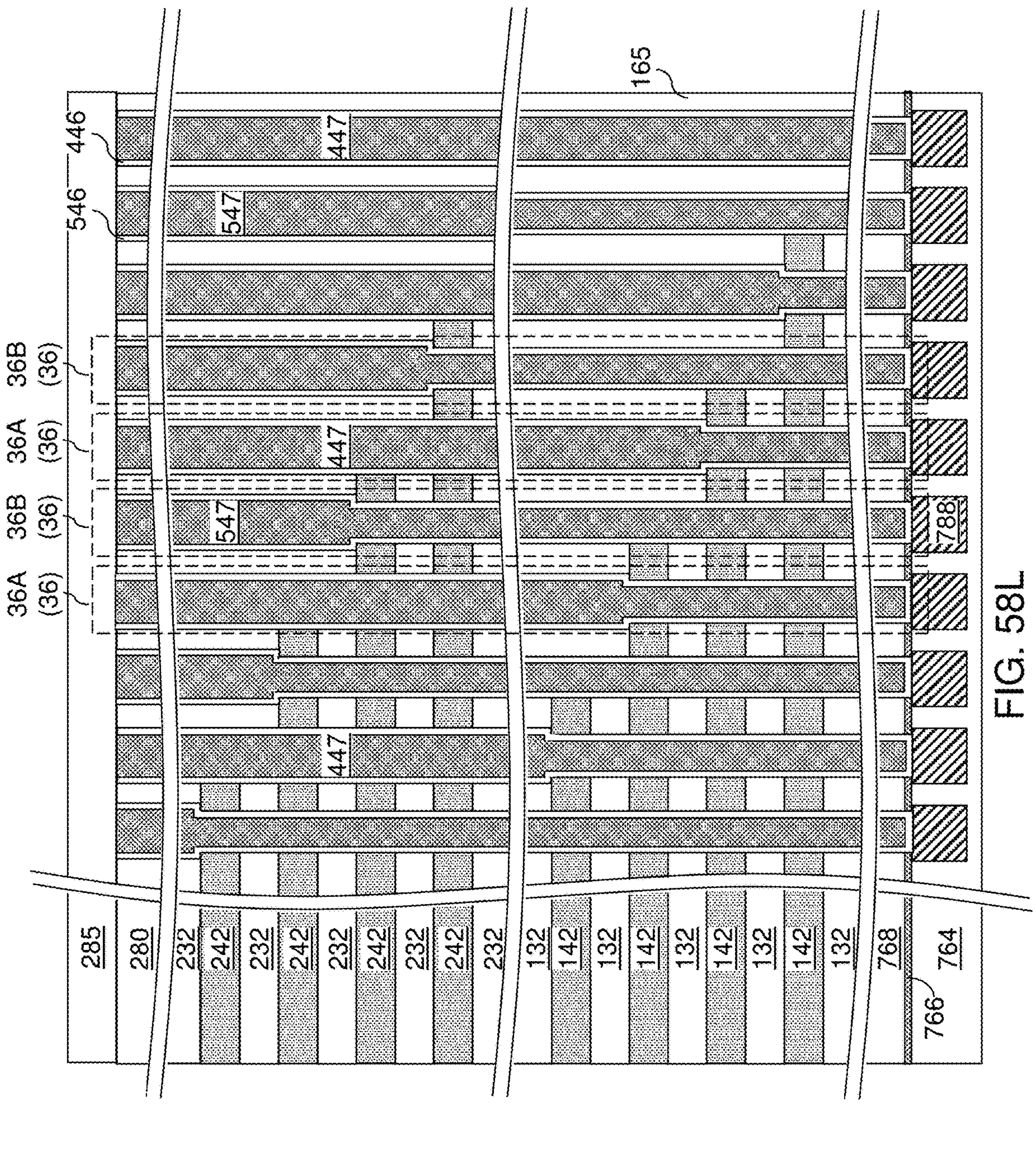

Referring to FIG. 58L, a third sacrificial via fill material may be deposited in unfilled volumes of the second inter-tier stepped via cavities 445 and over the first contact level dielectric layer 280. The third sacrificial via fill material is a material that is different from the material of the second inter-tier dielectric liner layer 446C. Any material that may be removed selective to the material of the second inter-tier dielectric liner 446C may be used for the third sacrificial via fill material. For example, the third sacrificial via fill material may include silicon nitride. Excess portions of the third sacrificial via fill material and the horizontal portion of the second inter-tier dielectric liner layer 446C may be removed from above the top surface of the first contact level dielectric layer 280 by a planarization process. The planarization process may use chemical mechanical planarization (CMP) and/or at least one recess etch. Each remaining discrete portion of the third sacrificial via fill material in a respective second inter-tier stepped via cavity 445 constitutes a second inter-tier sacrificial via fill structure 447. Each remaining discrete portion of the second inter-tier dielectric liner layer 446C in a respective second inter-tier stepped via cavity 445 constitutes a second inter-tier dielectric liner 446.

Each combination of a first inter-tier sacrificial via fill structure 547 and a first inter-tier dielectric liner 546 constitutes a second laterally-insulated staircase region sacrificial via structure 36B. Each combination of a second inter-tier sacrificial via fill structure 447 and a second inter-tier dielectric liner 446 constitutes a first laterally-insulated staircase region sacrificial via structure 36A. The first laterally-insulated staircase region sacrificial via structures 36A and the second laterally-insulated staircase region sacrificial via structures 36B are collectively referred to as laterally-insulated staircase region sacrificial via structures 36.

Figure 58M:
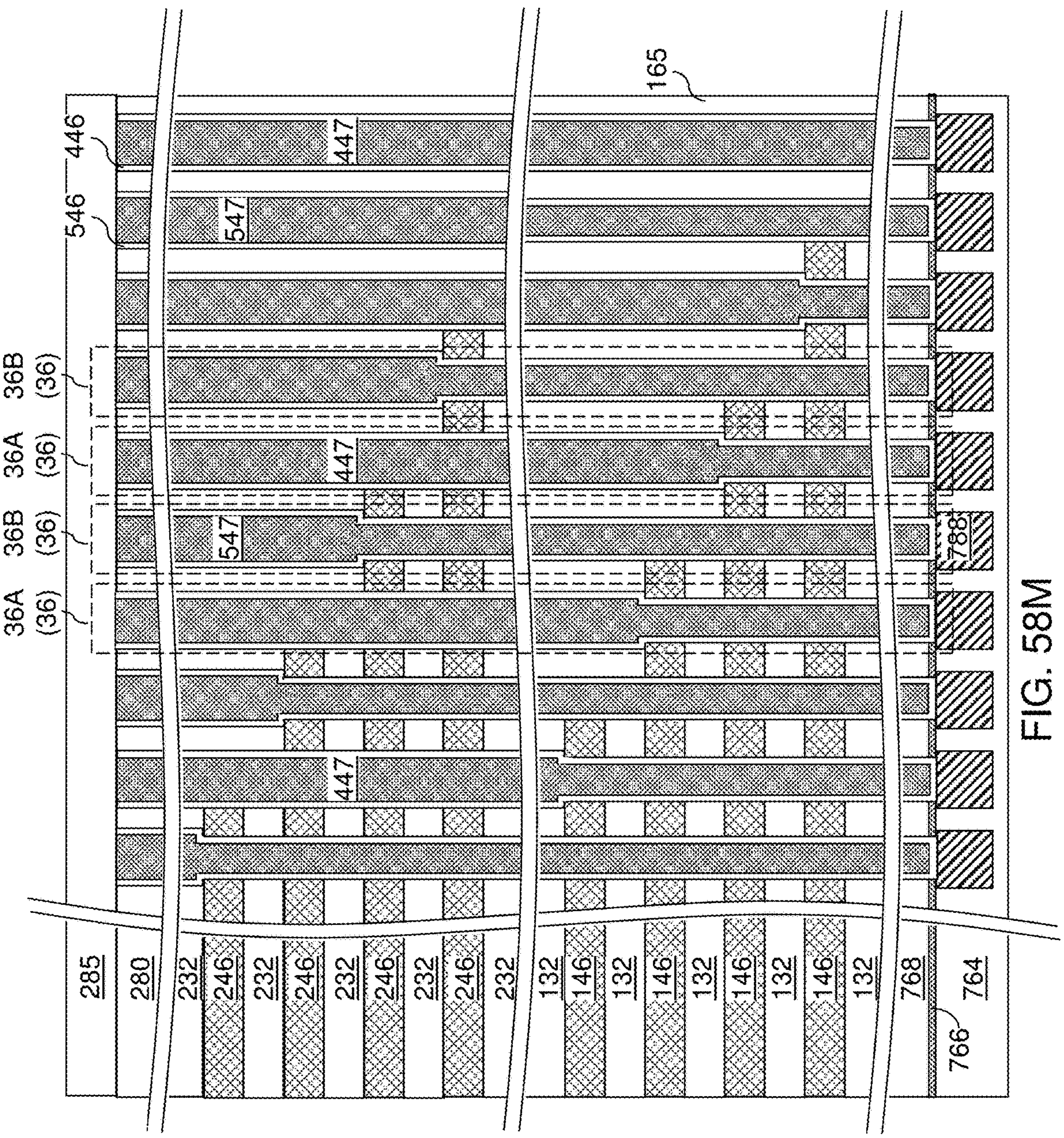

Referring to FIG. 58M, a sacrificial protection layer 285 may be formed over the first contact level dielectric layer 280 to encapsulate the laterally-insulated staircase region sacrificial via structures 36 and to provide protection from etchants to be subsequently used to remove the first and second sacrificial material layers (142, 242). In one embodiment, the sacrificial protection layer 285 may have a thickness in a range from 10 nm to 300 nm, and may include a silicon oxide-based material such as undoped silicate glass or a doped silicate glass. The processing steps of FIGS. 20A and 20B, 21A-21E, 22-24, and 25A-25E may be performed to form backside trenches 79, to replace the in-process source-level material layers 10' with source-level material layers 10, to replace the first and second sacrificial material layers (142, 242) with first and second electrically conductive layers (146, 246), and to form dielectric wall structures 76 in the backside trenches 79. In one embodiment, the first and second electrically conductive layers may contact, and/or surround, at least one first laterally-insulated staircase region sacrificial via structures 36A and at least one second laterally-insulated staircase region sacrificial via structures 36B.

Figure 58N:
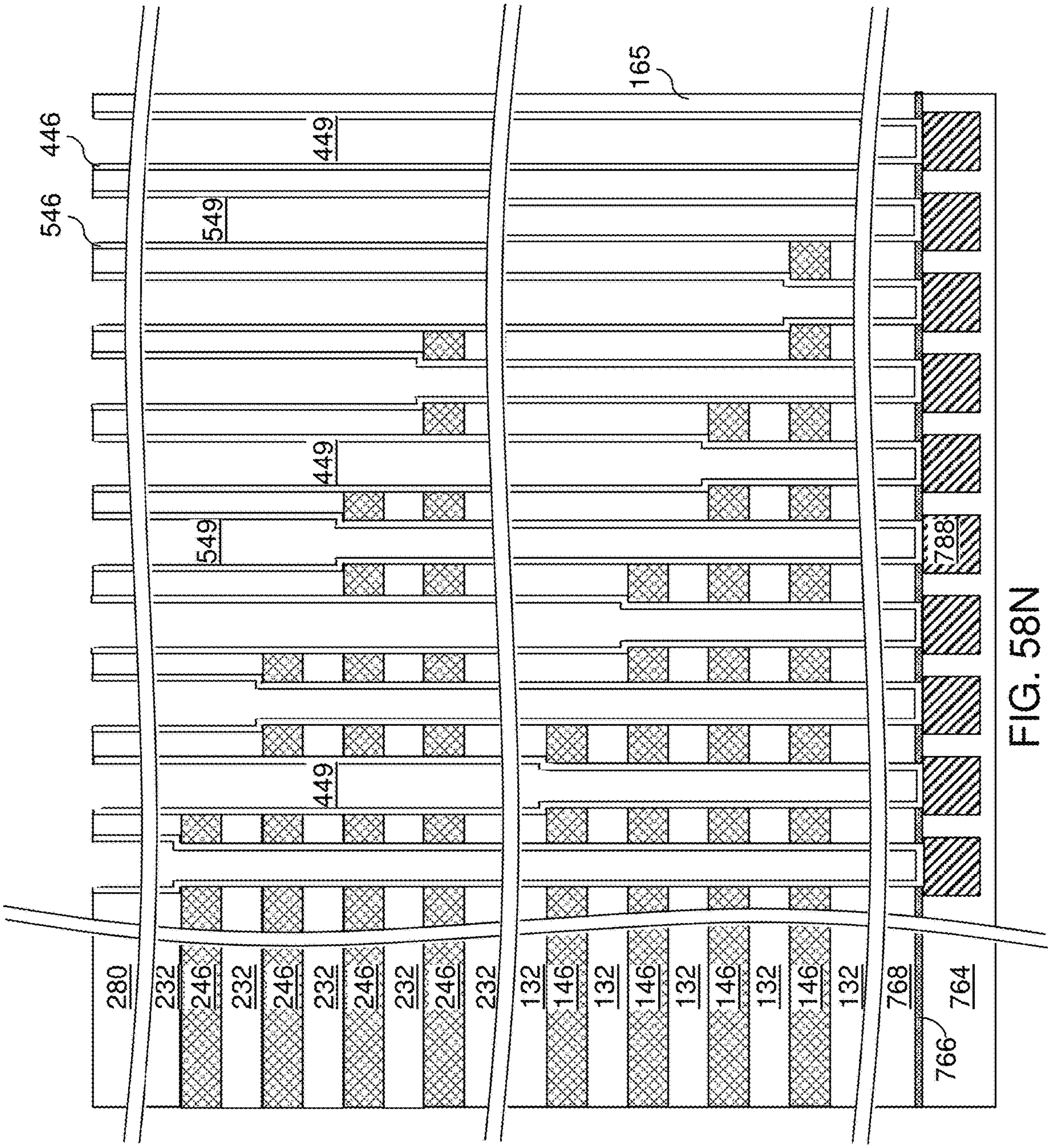

Referring to FIG. 58N, the sacrificial protection layer 285 may be removed by an etch process, which may us a wet etch process or a dry etch process. Subsequently, the first inter-tier sacrificial via fill structures 547 and the second inter-tier sacrificial via fill structures 447 may be removed selective to the materials of the first inter-tier dielectric liners 546, the second inter-tier dielectric liners 446, and the first contact level dielectric layer 280 by an etch process. For example, if the first inter-tier sacrificial via fill structures 547 and the second inter-tier sacrificial via fill structures 447 include silicon nitride, and if the first inter-tier dielectric liners 546, the second inter-tier dielectric liners 446, and the first contact level dielectric layer 280 include silicon oxide, a wet etch process using hot phosphoric acid may be used to remove the first inter-tier sacrificial via fill structures 547 and the second inter-tier sacrificial via fill structures 447. First-tier-layer-contact via cavities 449 are formed in volumes from which the second inter-tier sacrificial via fill structures 447 are removed, and second-tier-layer-contact via cavities 549 are formed in volumes from which the first inter-tier sacrificial via fill structures 547 are removed.

Figure 58O:
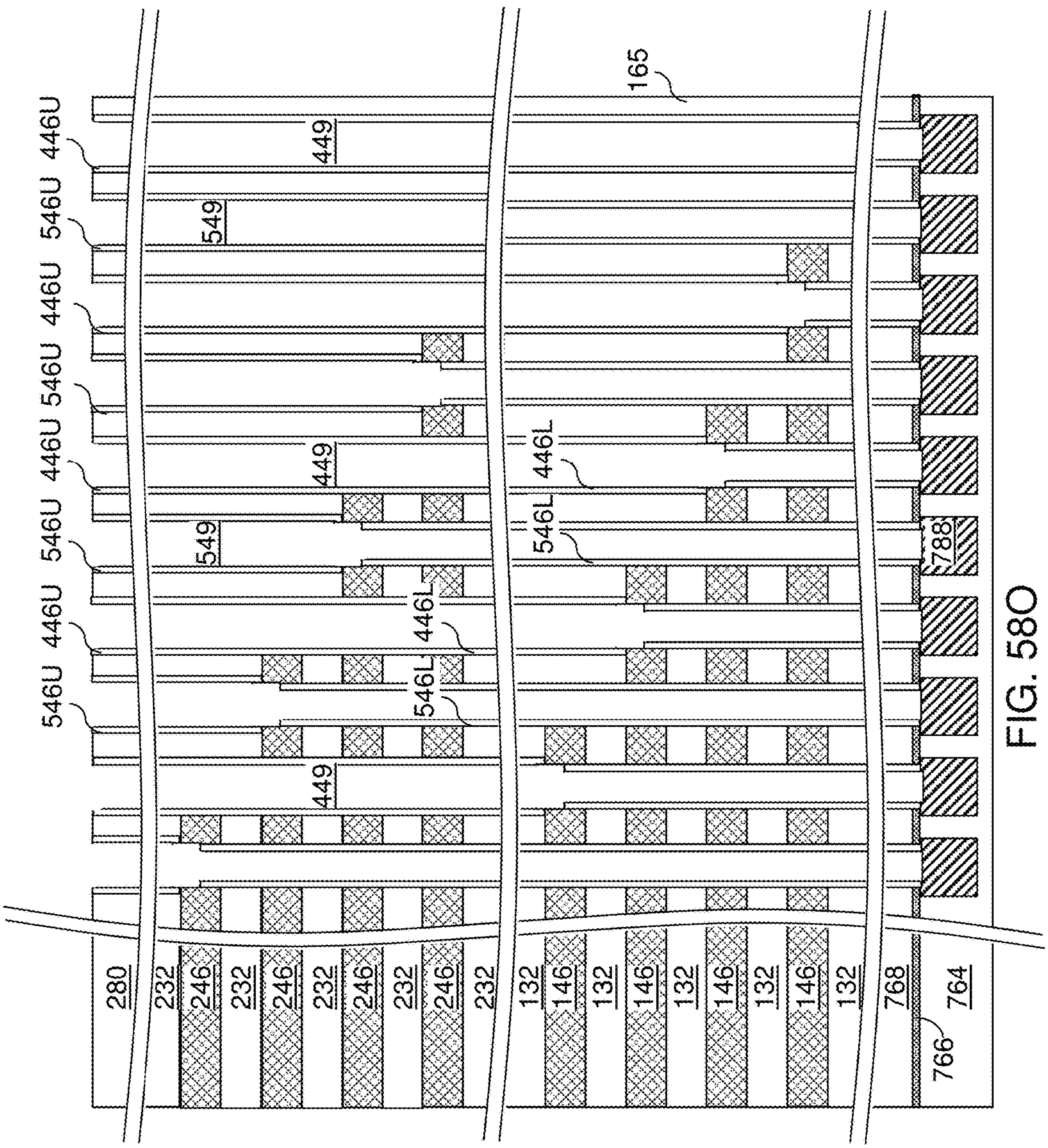

Referring to FIG. 58O, an anisotropic etch process is performed to remove portions of the first inter-tier dielectric liners 546 and the second inter-tier dielectric liners 446 that are located at annular ledges that connect upper vertical portions and the lower vertical portions of each of the first inter-tier dielectric liners 546 and the second inter-tier dielectric liners 446. Annular portions of each of the first inter-tier dielectric liners 546 and the second inter-tier dielectric liners 446 are removed at each horizontal interface at which the first and second electrically conductive layers (146, 246) contact a respective annular horizontal surface of the first inter-tier dielectric liners 546 and the second inter-tier dielectric liners 446. Remaining portions of the first inter-tier dielectric liners 546 and the second inter-tier dielectric liners 446 may be further recessed such that a cylindrical surface of one of the first and second electrically conductive layers (146, 246) is physically exposed around each of the first-tier-layer-contact via cavities 449 and the second-tier-layer-contact via cavities 549.

Each of first inter-tier dielectric liners 546 is divided into a first upper dielectric liner 546U and a first lower dielectric liner 546L by the anisotropic etch process. Each of the second inter-tier dielectric liners 446 is divided int a second upper dielectric liner 446U and a second lower dielectric liner 446L. Each first upper dielectric liner 546U overlies and contacts an annular top surface of a second electrically conductive layer 246. Each first lower dielectric liner 546L contacts a cylindrical surface of a second electrically conductive layer 246 that is contacted by an overlying first upper dielectric liner 546U. Each second upper dielectric liner 446U overlies and contacts an annular top surface of a first electrically conductive layer 146. Each second lower dielectric liner 446L contacts a cylindrical surface of a first electrically conductive layer 246 that is contacted by an overlying second upper dielectric liner 446U.

A cylindrical surface of a second electrically conductive layer 246 is physically exposed around each second-tier-layer-contact via cavity 549. In case the first upper dielectric liners 546U are thinner than the second-tier sacrificial liners 543, an annular top surface of a second electrically conductive layer 246 may be physically exposed within each second-tier-layer-contact via cavity 549. A cylindrical surface of a first electrically conductive layer 146 is physically exposed around each first-tier-layer-contact via cavity 449. In case the second upper dielectric liners 446U are thinner than the inter-tier sacrificial liners 553, an annular top surface of a first electrically conductive layer 146 may be physically exposed within each first-tier-layer-contact via cavity 449.

Figure 58P:
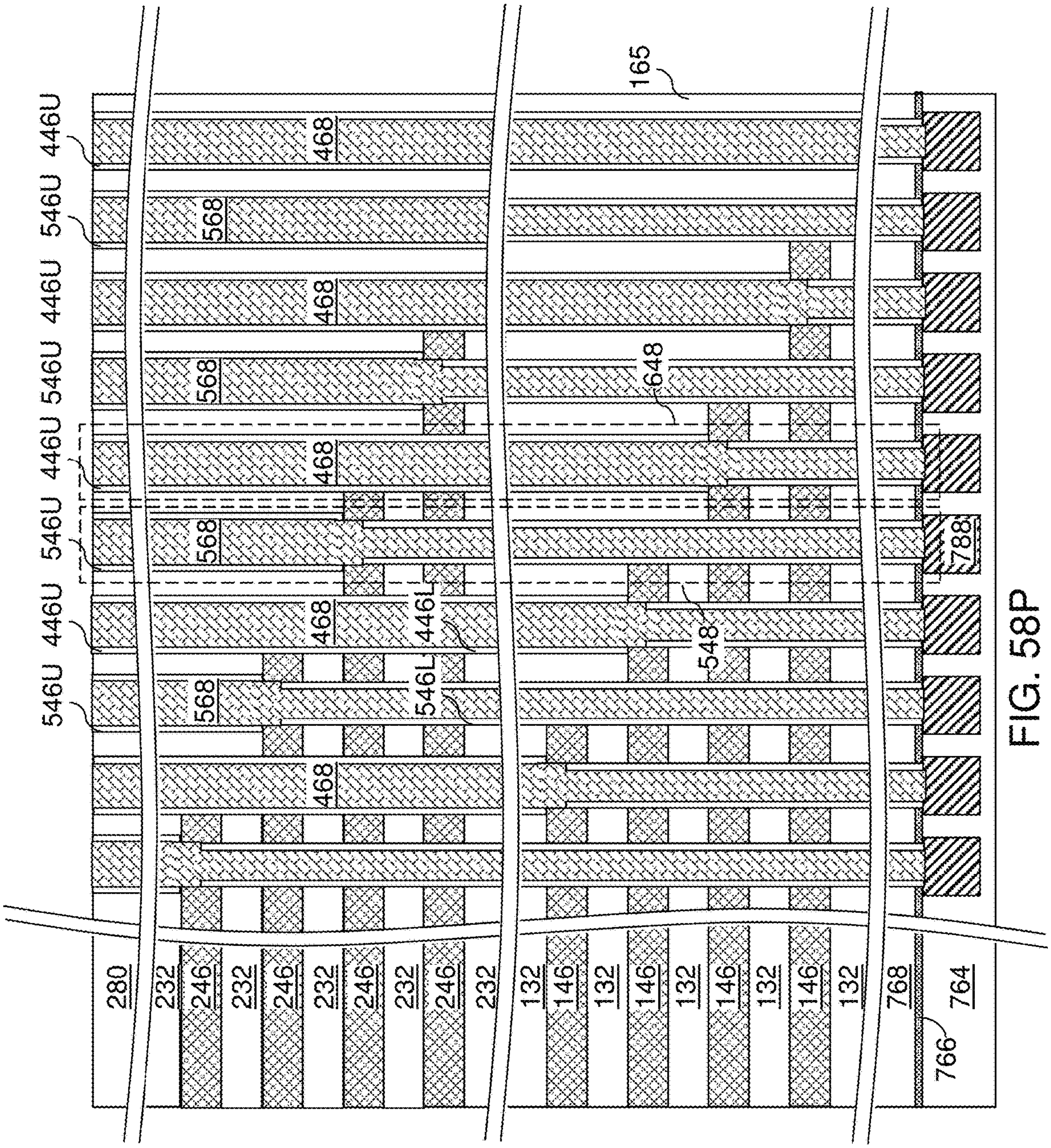
Figure 58Q:
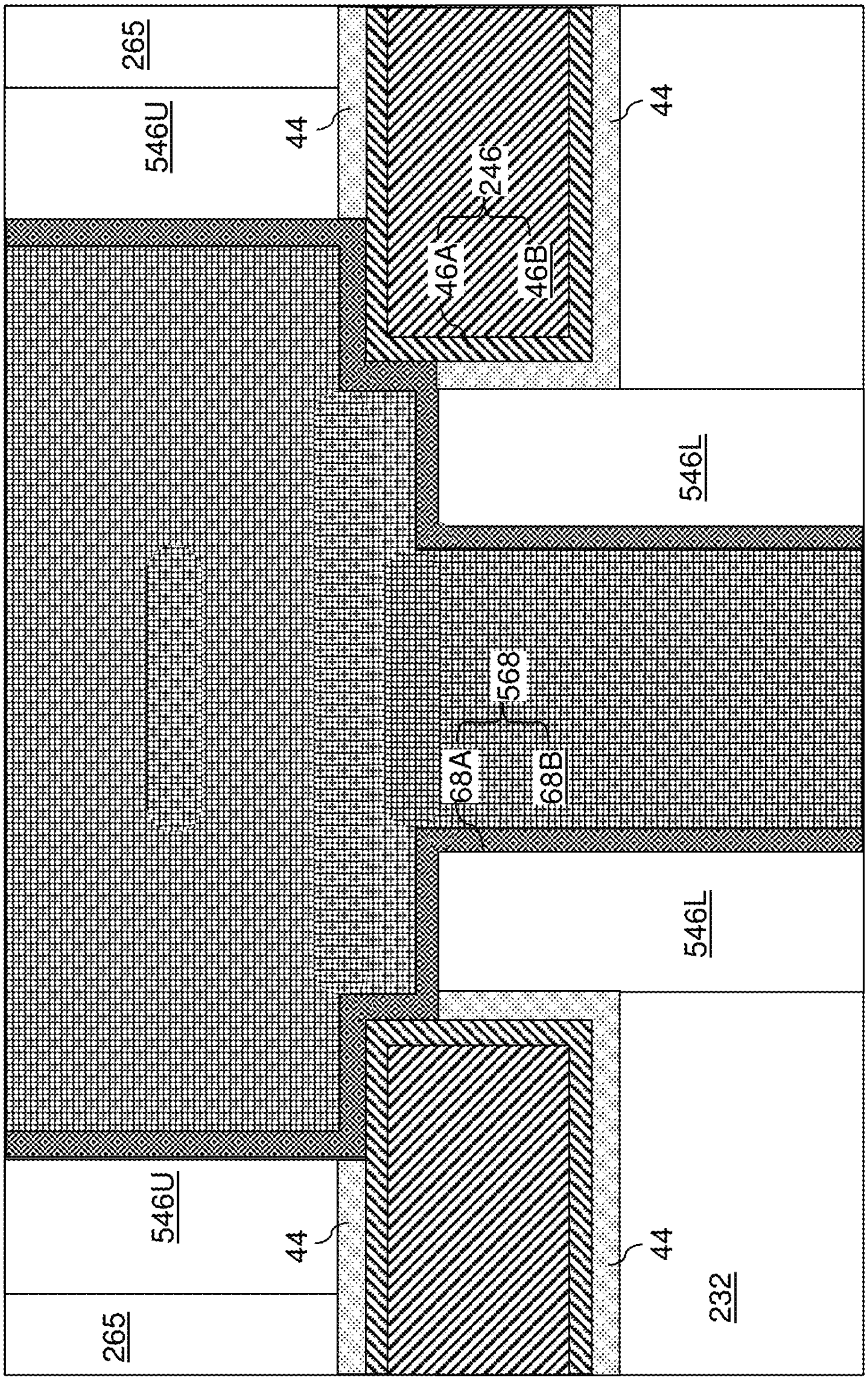

Referring to FIGS. 58P and 58Q, at least one conductive material may be deposited in the first-tier-layer-contact via cavities 449 and the second-tier-layer-contact via cavities 549. The at least one conductive material may include a contact via metallic liner 68A and a contact via metal fill portion 68B. The contact via metallic liner 68A may include a conductive metallic nitride such as TiN, TaN, or WN. The contact via metal fill portion 68B may include an elemental metal such as W, Mo, Co, Cu, or Ru or an intermetallic alloy. Excess portions of the at least one conductive material may be removed from above the horizontal plane including the top surface of the first contact level dielectric layer 280. For example, the processing steps discussed above with reference to FIGS. 52A-52G may be performed to deposit, and to remove excess portions of, the at least one conductive material.

Each remaining portion of the at least one conductive material in the second-tier-layer-contact via cavities 549 constitutes a first conductive via structure 568, which is a second-tier-layer-contact via structure, which is a second-tier-layer-contact via structure that contact a conductive layer in the second-tier structure, i.e., a second electrically conductive layers 246. Each remaining portion of the at least one conductive material in the first-tier-layer-contact via cavities 449 constitutes a second conductive via structure 468, which is a first-tier-layer-contact via structure that contact a conductive layer in the first-tier structure, i.e., a first electrically conductive layer 146. Each first inter-tier sacrificial via fill structure 547 is replaced with a first conductive via structure 568. Each second inter-tier sacrificial via fill structure 447 is replaced with a second conductive via structure 468.

Each first conductive via structure 568 is formed within a respective first upper dielectric liner 546U and a respective first lower dielectric liner 546L. A set of a first conductive via structure 568, a first upper dielectric liner 546U, and a first lower dielectric liner 546L constitutes a first laterally-insulated staircase region via structure 548. A first laterally-insulated staircase region via structure 548 may be formed through a respective first subset of the second insulating layers 232 of the second alternating stack (232, 246) and through as respective first subset of the first insulating layers 132 of the first alternating stack (132, 146). Each first laterally-insulated staircase region via structure 548 comprises a first conductive via structure 568 that contacts a cylindrical sidewall of one of the second electrically conductive layers 246 and is electrically isolated from each of the first electrically conductive layers 146.

Each second conductive via structure 468 is formed within a respective second upper dielectric liner 446U and a respective second lower dielectric liner 446L. A set of a second conductive via structure 468, a second upper dielectric liner 446U, and a second lower dielectric liner 446L constitutes a second laterally-insulated staircase region via structure 648. A second laterally-insulated staircase region via structure 648 may be formed through a respective second subset of the second insulating layers 232 of the second alternating stack (232, 246) and through as respective second subset of the first insulating layers 132 of the first alternating stack (132, 146). Each first laterally-insulated staircase region via structure 548 comprises a first conductive via structure 568 that contacts one of the first electrically conductive layers 146 and is electrically isolated from each of the second electrically conductive layers 246. A laterally-insulated staircase region via structure (548 or 648) may be formed through the second retro-stepped dielectric material portion 265 and a first retro-stepped dielectric material portion 165.

Each of the first and second electrically conductive layers (146, 246) may include a metallic nitride liner 46A and a metallic fill material portion 46B. For example, each first electrically conductive layer 146 includes a first metallic nitride liner and a first metallic fill material portion, and each second electrically conductive layer 246 includes a second metallic nitride liner 46A and a second metallic fill material portion 46B. The metallic nitride liners 46A may include TiN, TaN, and/or WN. The first metallic fill material portions and the metallic fill material portions 46B may include a same metal fill material such as W, Co, Mo, and/or Cu. Each first conductive via structure 568 and each second conductive via structure 468 includes a respective contact via metallic liner 68A surrounding a contact via metal fill portion 68B. In one embodiment, an annular horizontal surface of a second metallic nitride liner 46A contacts an annular horizontal surface of a contact via metallic liner 68A of a first conductive via structure 568. In one embodiment, an annular horizontal surface of the first metallic nitride liner 46A of a first electrically conductive layer 146 contacts an annular horizontal surface of a contact via metallic liner 68A of a second conductive via structure 468. In one embodiment, a concave cylindrical surface of a first metallic liner of a first electrically conductive layer 146 contacts a convex cylindrical surface of the contact via metallic liner 68A of a first conductive via structure 568. In one embodiment, a concave cylindrical surface of a second metallic nitride liner 46A contacts a convex cylindrical surface of the contact via metallic liner 68A of a second conductive via structure 468.

Each combination of a first conductive via structures 568, a first upper dielectric liner 546U, and a first lower dielectric liner 546L constitutes a first laterally-insulated staircase region via structure 548. The first conductive via structure 568 is electrically connected to only one of the second electrically conductive layers 246 and electrically isolated from all other second electrically conductive layer 246 and from the first electrically conductive layers 146. Each combination of a second conductive via structures 468, a second upper dielectric liner 446U, and a second lower dielectric liner 446L constitutes a second laterally-insulated staircase region via structure 448. The second conductive via structure 468 is electrically connected to only one of the first electrically conductive layers 146 and electrically isolated from all other first electrically conductive layers 146 and from the second electrically conductive layers 246.

Figure 59A:
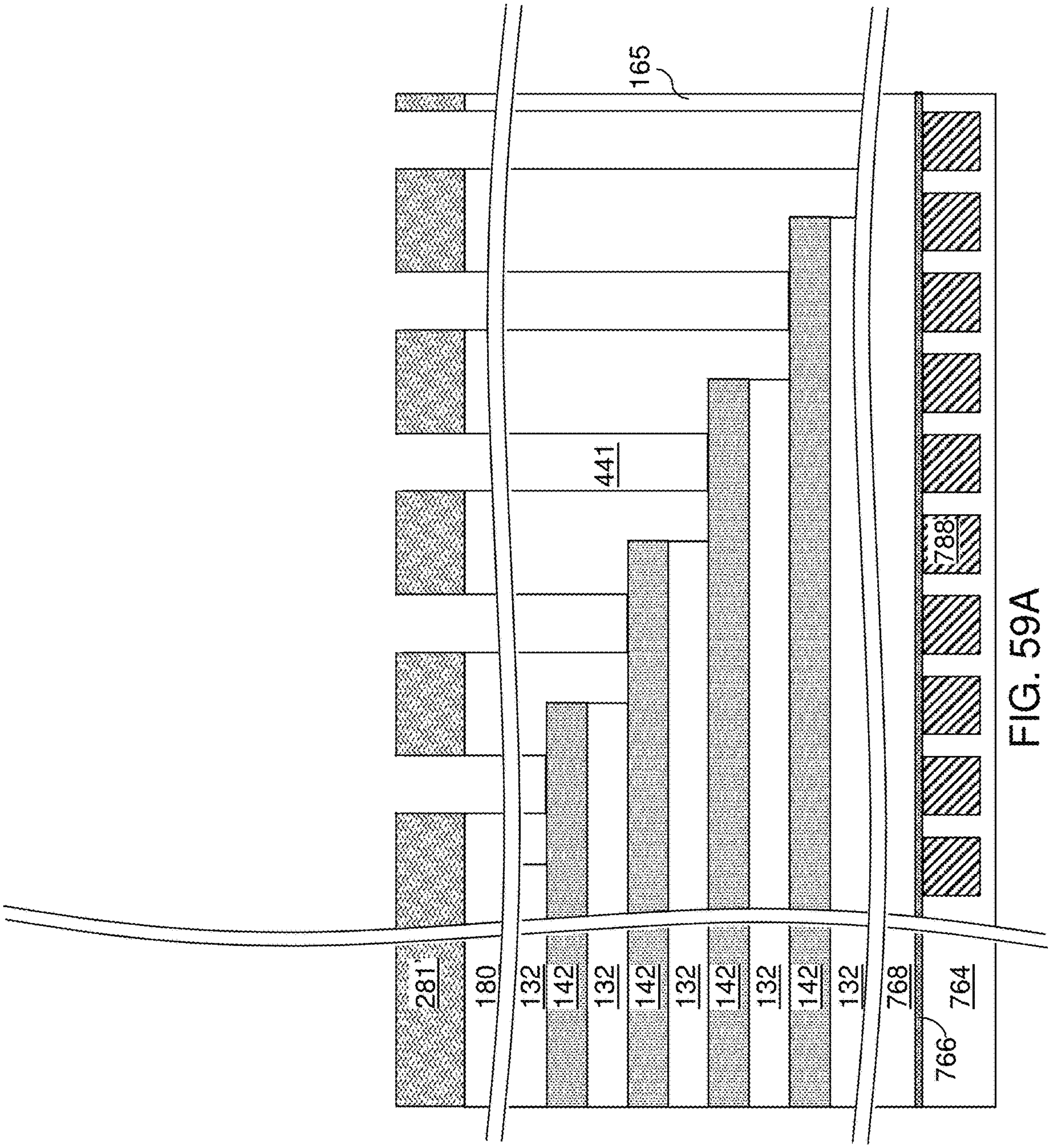
FIGS. 59A-59R are sequential vertical cross-sectional views of a region of a fourth exemplary structure during formation of laterally-insulated staircase region via structures according to an embodiment of the present disclosure.

Referring to FIG. 59A, a fourth exemplary structure according to a fourth embodiment of the present disclosure may be derived from the first exemplary structure of FIG. 7 by applying a first patterning film 281' over the inter-tier dielectric layer 180, patterning the first patterning film 281' with a lithographic pattern including an array of openings having the same pattern as the first-tier in-process via cavities 441 of FIGS. 54A and 54B, and forming first-tier in-process via cavities 441 through the inter-tier dielectric layer 180 and the first retro-stepped dielectric material portion 165 to a top surface of a respective one of the first sacrificial material layers 142. In other words, the first-tier in-process via cavities 441 may be formed with the same pattern as the first-tier in-process via cavities 441 of FIGS. 54A and 54B with an overlying first patterning film 281' having a same pattern of openings therethrough as the underlying first-tier in-process via cavities 441. The first patterning film 281' may be used as an etch mask during the anisotropic etch process that forms the first-tier in-process via cavities 441. The first-tier in-process via cavities 441 may be formed within the area of a respective underlying horizontal surface, which is contained within the first stepped surfaces and located between a neighboring pair of vertical steps S in the first stepped surfaces.

The first-tier in-process via cavities 441 extending through the inter-tier dielectric layer 180 and the first retro-stepped dielectric material portion 165 may be formed underneath the openings in the first patterning film 281'. Each first-tier in-process via cavity 441 may vertically extend from a top surface of the inter-tier dielectric layer 180 to a top surface of a respective one of the first sacrificial material layers 142. Each of the first-tier in-process via cavities 441 may have an areal overlap with a respective underlying one of the lower-level metal interconnect structures 780 such as topmost lower-level metal line structures 788. In one embodiment, each of the first-tier in-process via cavities 441 may be formed entirely, or substantially, within the area of a respective underlying one of the lower-level metal interconnect structures 780. In one embodiment, the lower-level metal interconnect structures 780 may be lines or pads that repeat along the first horizontal direction hd1 with a periodicity. In one embodiment, the lower-level metal interconnect structures 780 underlying the first stepped surfaces may be arranged in a row along the first horizontal direction hd1, and each of the first-tier in-process via cavities 441 may be formed entirely, or substantially, within the area of every other one of the lower-level metal interconnect structures 780 within the row.

Figure 59B:
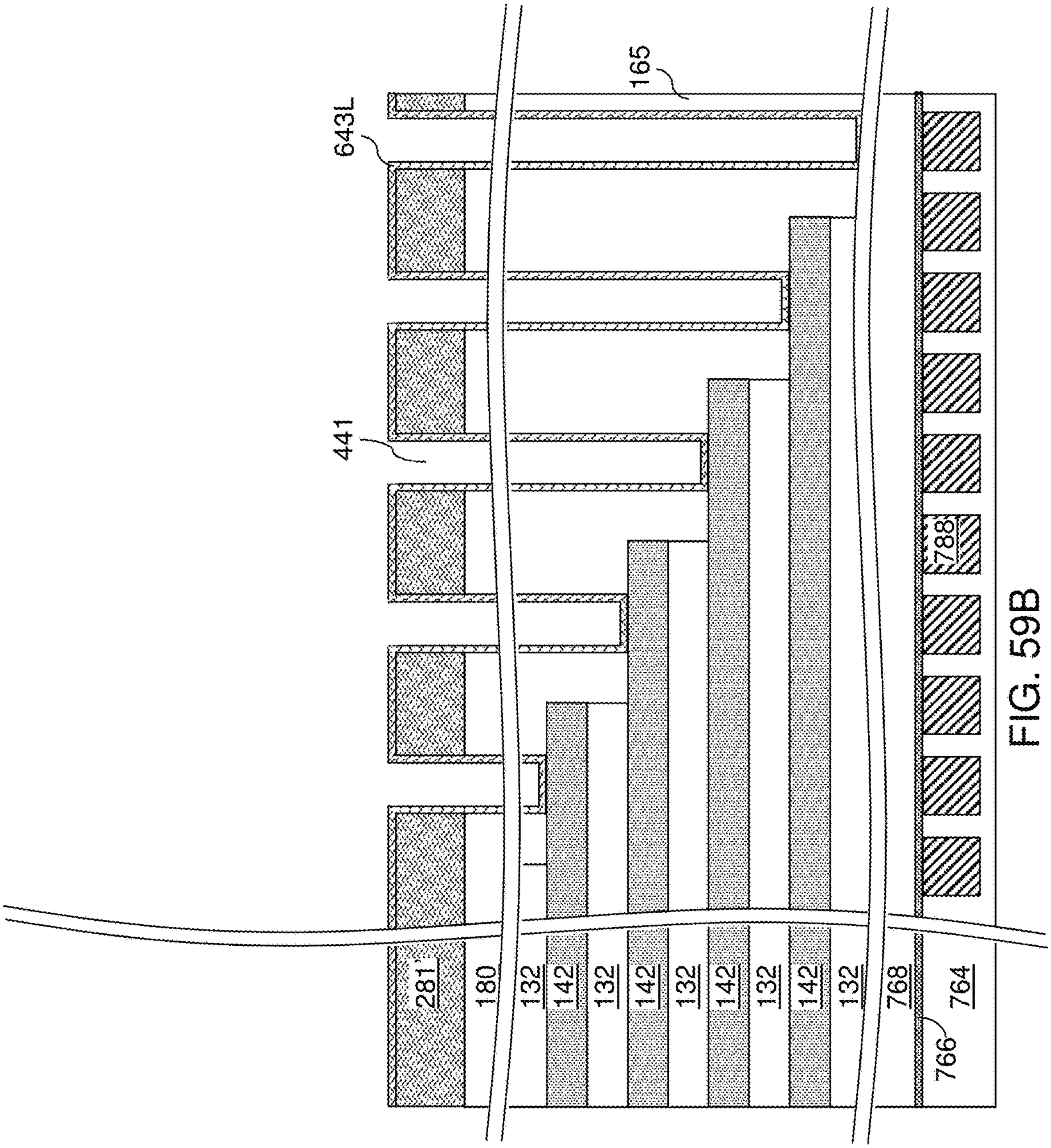
FIG. 59S is a magnified view of a contact region between a first laterally-insulated staircase region via structure and a second electrically conductive layer of FIG. 59R.
FIG. 59T is a magnified view of a contact region between a second laterally-insulated staircase region via structure and a first electrically conductive layer of FIG. 59R.

Referring to FIG. 59B, a first-tier sacrificial liner layer 643L may be deposited over the first patterning film 281' and at a periphery of each first-tier in-process via cavity 441. The first-tier sacrificial liner layer 643L includes a material that may be removed selective to the materials of the first retro-stepped dielectric material portion 165 and the first and second insulating layers (132, 232). For example, the first-tier sacrificial liner layer 643L may include a semiconductor material such as amorphous silicon or polysilicon. The thickness of the first-tier sacrificial liner layer 643L may be in a range from 2 nm to 20 nm, such as from 3 nm to 10 nm, although lesser and greater thicknesses may also be used. The first-tier sacrificial liner layer 643L may be deposited, for example, by low pressure chemical vapor deposition process.

Figure 59C:
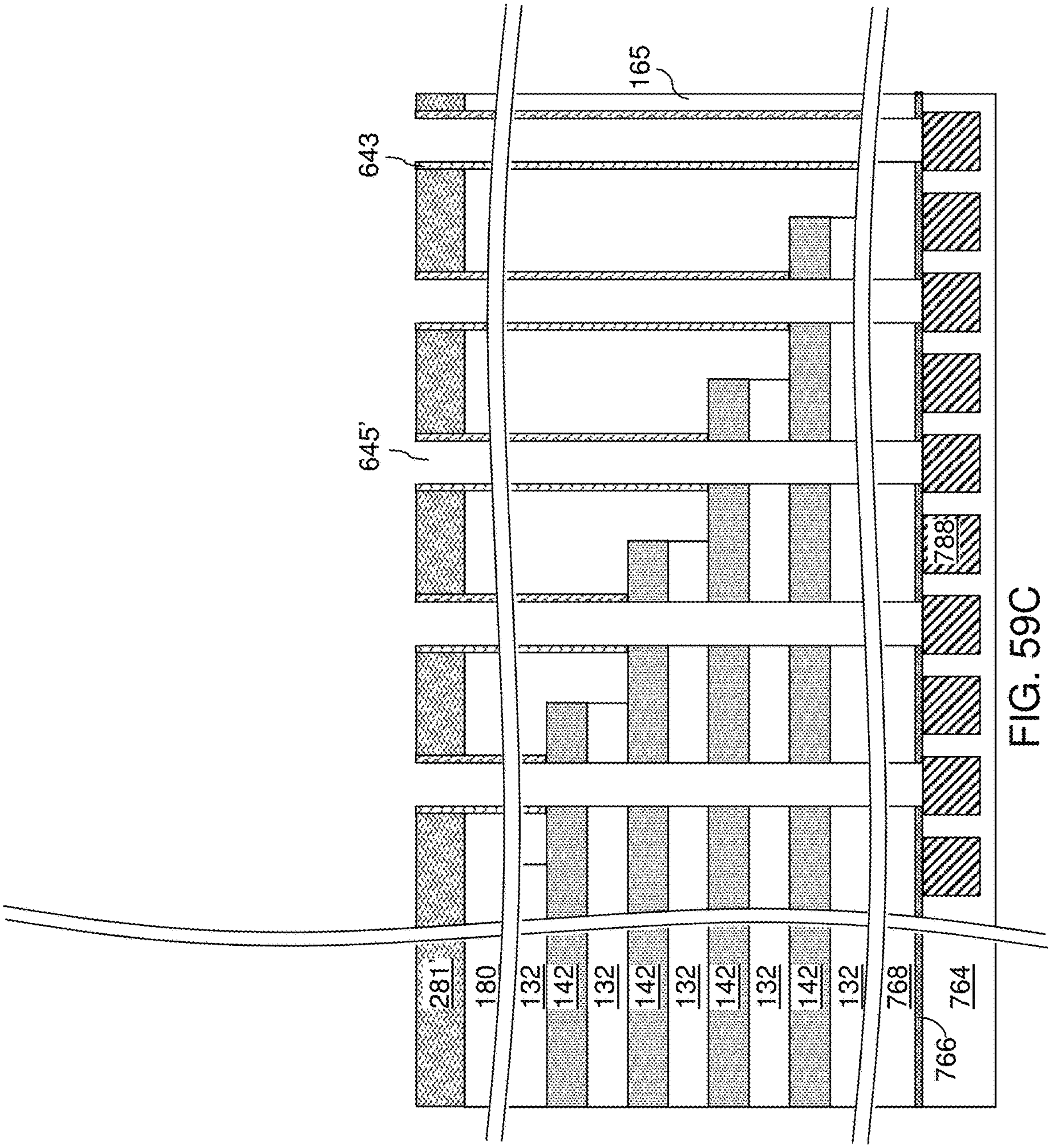

Referring to FIG. 59C, an anisotropic etch process may be subsequently performed. The anisotropic etch process includes a first step that etches horizontal portions of the first-tier sacrificial liner layer 643L from above the first patterning film 281' and from the bottom region of each first-tier in-process via cavity 441. Each remaining cylindrical portion of the first-tier sacrificial liner layer 643L constitutes a first-tier sacrificial liner 643. The first-tier sacrificial liners 643 are formed within the first-tier in-process via cavities 441.

The anisotropic etch process includes a second step in which the materials of the first and second insulating layers (132, 232) and the at least one second dielectric material layer 768 are etched selective to the materials of the first-tier sacrificial liners 643 and the first patterning film 281'. The first-tier in-process via cavities 441 are vertically extended through the first alternating stack (132, 142) and the at least one second dielectric material layer 768 within areas that are not masked by the combination of the first-tier sacrificial liners 643 and the first patterning film 281'. Vertically-extended in-process via cavities 645' are formed by vertically extending the first-tier in-process via cavities 441 in the second step of the anisotropic etch process. A top surface of a lower-level metal interconnect structure 780 (such as a respective topmost lower-level metal line structure 788) is physically exposed at the bottom of vertically-extended in-process via cavity 645'.

Figure 59D:
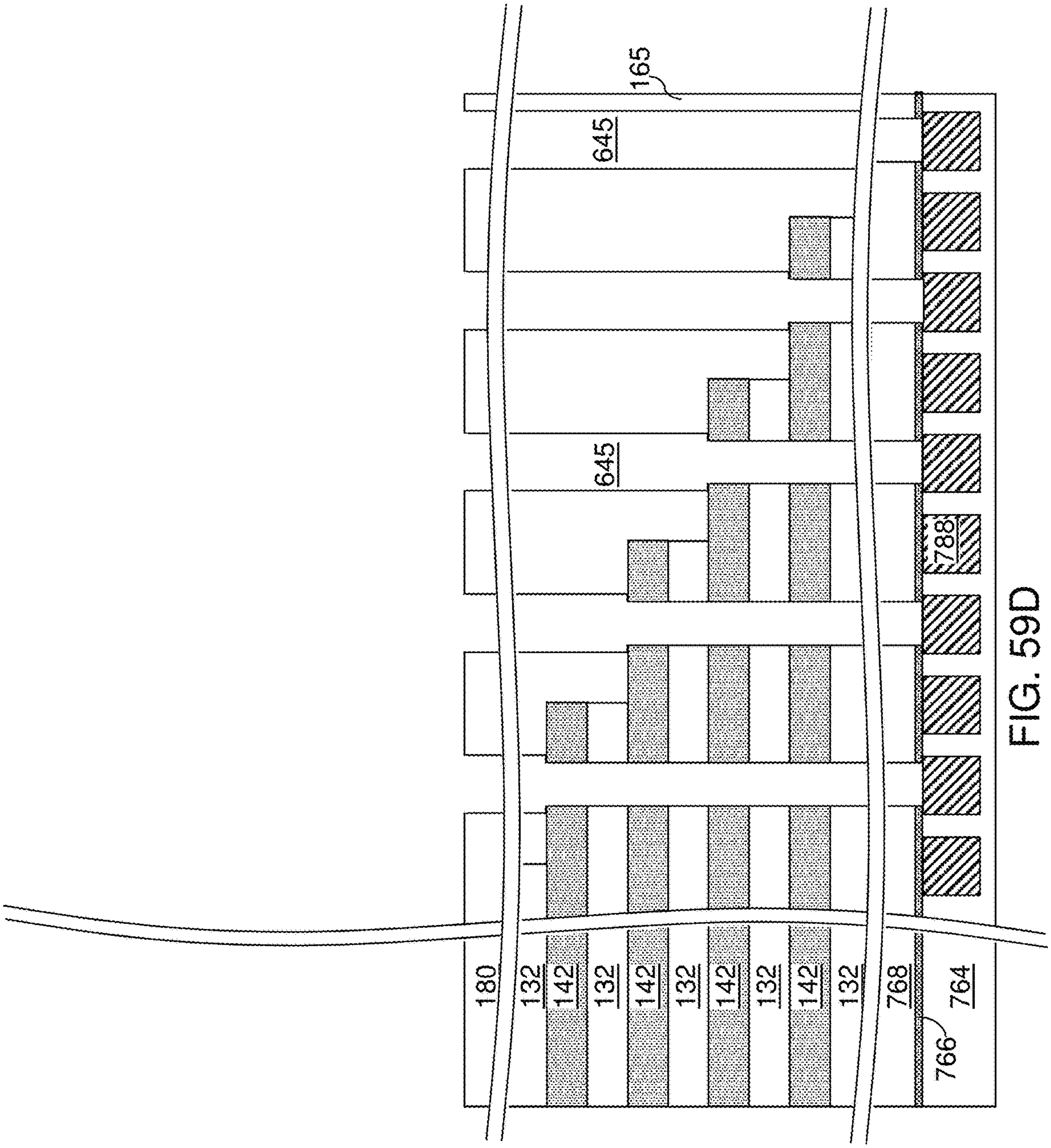

Referring to FIG. 59D, the remaining portions of the first-tier sacrificial liners 643 and the first patterning film 281' may be removed selective to the materials of the first retro-stepped dielectric material portion 165, the first alternating stack (132, 142), the first contact level dielectric layer 280, the at least one second dielectric material layer 768, and the physically exposed ones of the lower-level metal interconnect structures 780 (such as the topmost lower-level metal line structures 788). For example, a wet etch process using hot trimethyl-2 hydroxyethyl ammonium hydroxide ("hot TMY") or tetramethyl ammonium hydroxide (TMAH) may be used to remove the first-tier sacrificial liners 643. The first patterning film 281' may be removed, for example, by ashing. First-tier stepped via cavities 645 are formed by laterally expanding the volumes of the vertically-extended in-process via cavities 645' through removal of the first-tier sacrificial liners 643. Each first-tier stepped via cavity 645 includes an upper cavity portion overlying a physically exposed annular surface of a first sacrificial material layer 142 and having a greater lateral dimension, and a lower cavity portion underlying the upper cavity portion and extending through the first alternating stack (132, 142) and the at least one second dielectric material layer 768. A top surface of a lower-level metal interconnect structure 780 (such as a respective topmost lower-level metal line structure 788) is physically exposed at the bottom of each first-tier stepped via cavity 645.

Figure 59E:
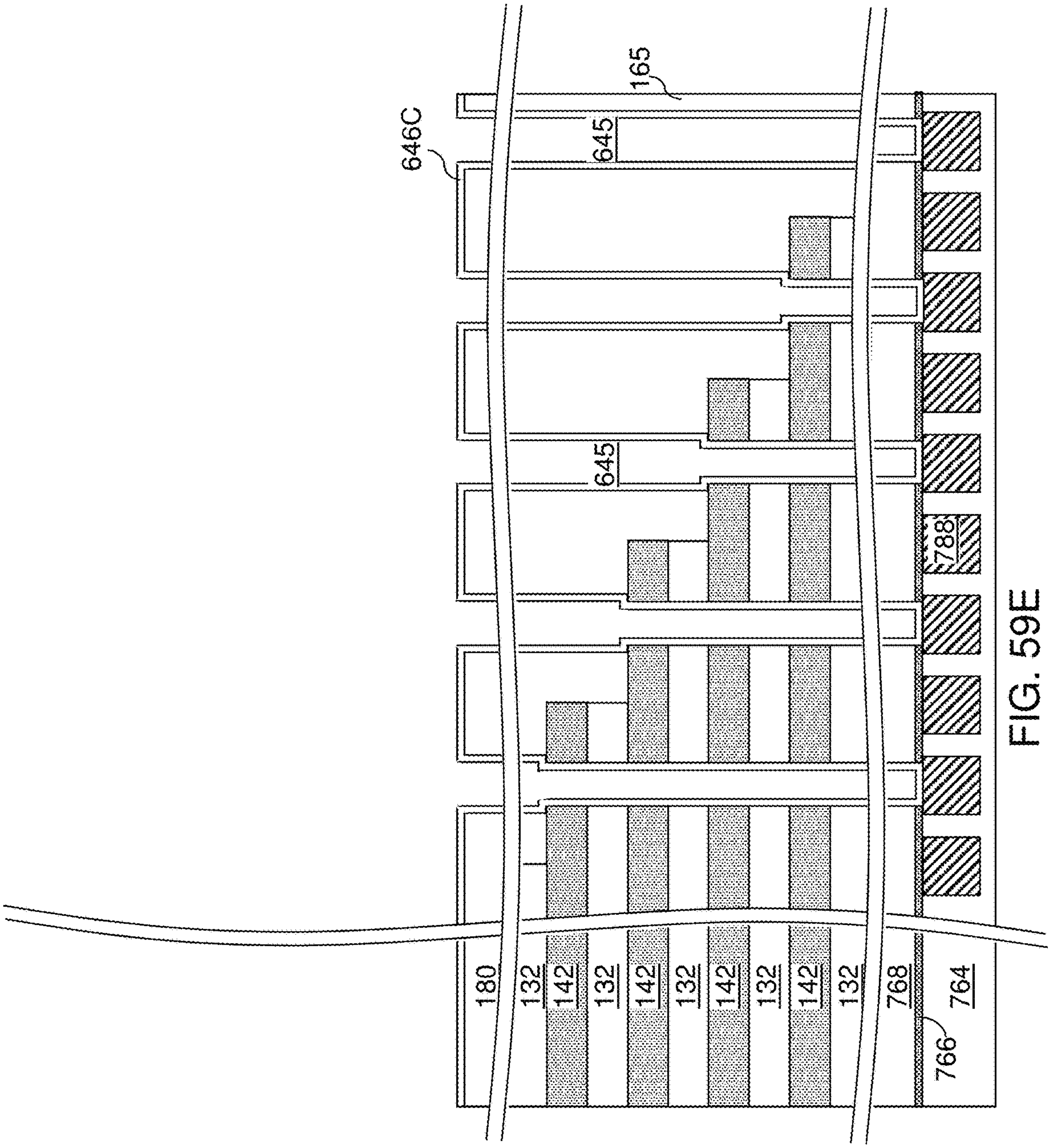

Referring to FIG. 59E, a first-tier dielectric liner layer 646C is formed within the first-tier stepped via cavities 645 and over the inter-tier dielectric layer 180 by conformal deposition of a dielectric material such as silicon oxide or a dielectric metal oxide (e.g., aluminum oxide). The first-tier dielectric liner layer 646C may be deposited by a conformal deposition process such as low pressure chemical vapor deposition, and may have a thickness in a range from 2 nm to 20 nm, such as from 3 nm to 10 nm, although lesser and greater thicknesses may also be used.

Figure 59F:
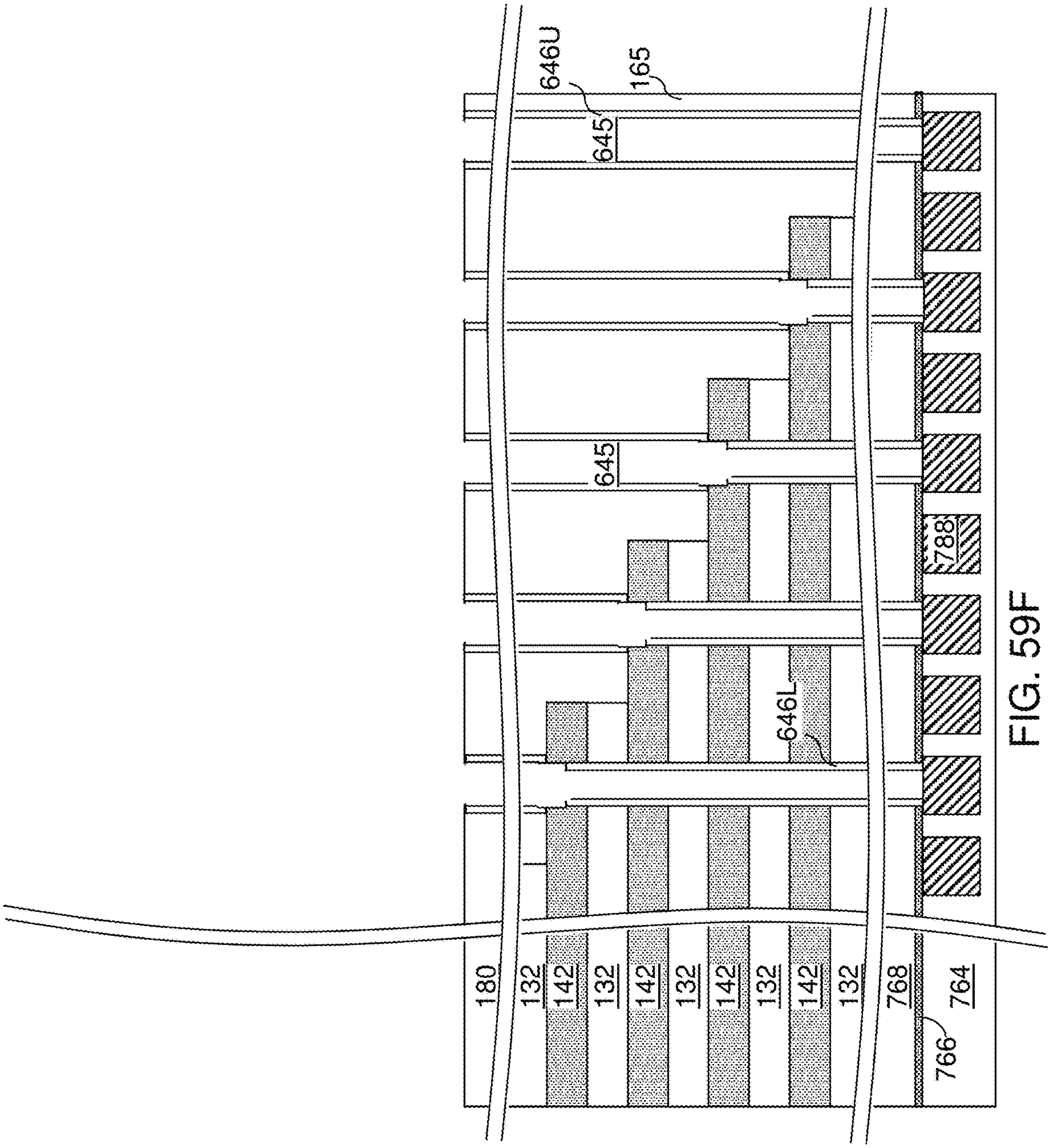

Referring to FIG. 59F, an anisotropic etch process is performed to remove portions of the first-tier dielectric liners 646 that are located at annular ledges that connect upper vertical portions and the lower vertical portions of each of the first-tier dielectric liners 646. Annular portions of each first-tier dielectric liner 646 are removed at each horizontal interface at which the first sacrificial material layers 142 contact a respective annular horizontal surface of the first-tier dielectric liners 646. Remaining portions of the first-tier dielectric liners 646 may be further recessed such that a cylindrical surface of a first sacrificial material layer 142 is physically exposed around each void within the first-tier stepped via cavities 645.

Each of first-tier dielectric liners 646 is divided into a first-tier upper dielectric liner 646U and a first-tier lower dielectric liner 646L by the anisotropic etch process. Each first-tier upper dielectric liner 646U overlies and contacts an annular top surface of a first sacrificial material layer 142. Each first-tier lower dielectric liner 646L contacts a cylindrical surface of a first sacrificial material layer 142 that is contacted by an overlying first-tier upper dielectric liner 646U. A cylindrical surface of a first sacrificial material layer 142 is physically exposed around each first-tier stepped via cavity 645.

Figure 59G:
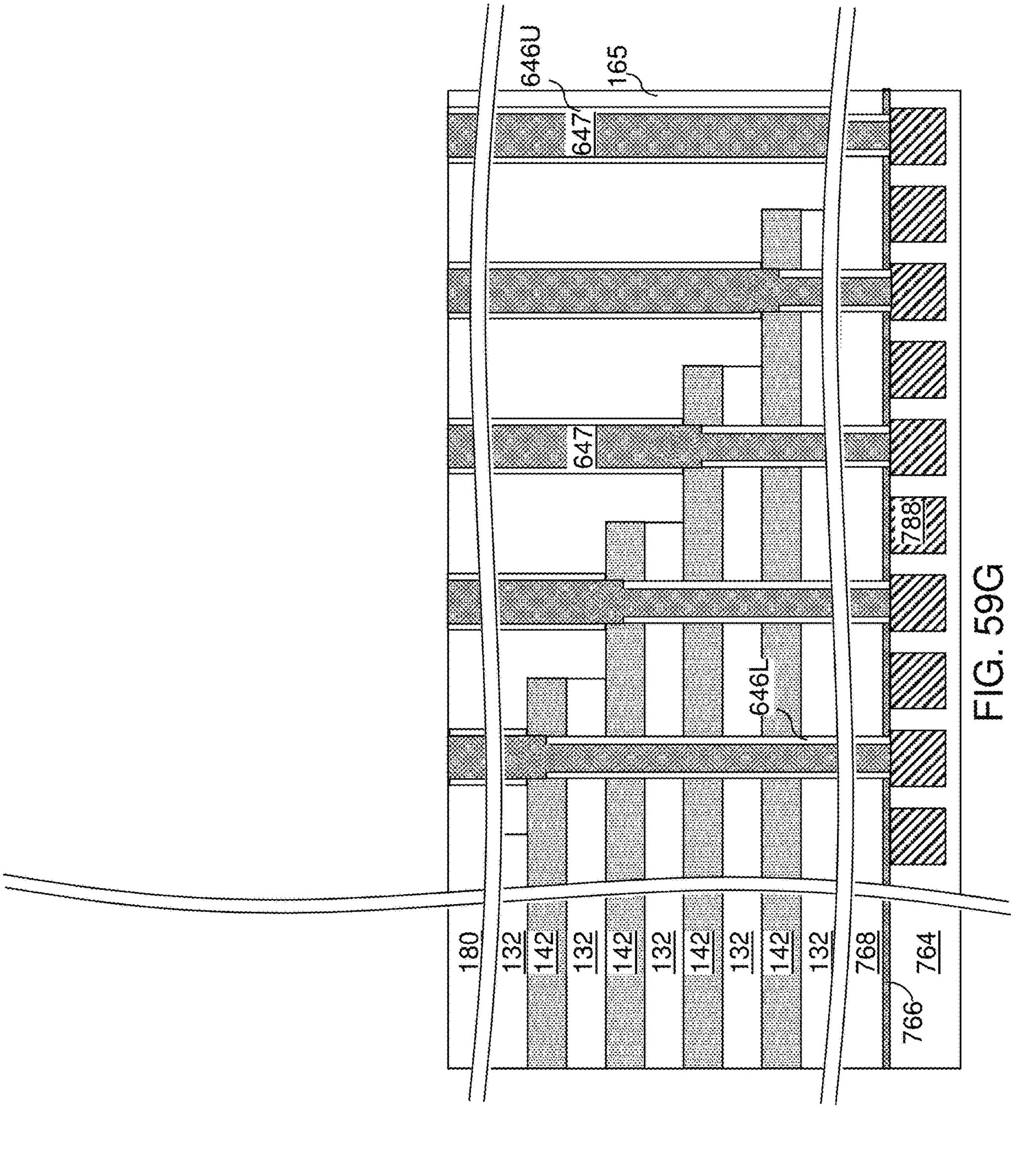

Referring to FIG. 59G, a first sacrificial via fill material may be deposited in unfilled volumes of the first-tier stepped via cavity 645 and over the inter-tier dielectric layer 180. The first sacrificial via fill material is a material that is different from the material of the first-tier lower dielectric liners 646L and the first-tier upper dielectric liners 646U. Any material that may be removed selective to the material of the first-tier lower dielectric liners 646L and the first-tier upper dielectric liners 646U may be used for the first sacrificial via fill material. For example, the first sacrificial via fill material may include silicon nitride. Excess portions of the second sacrificial via fill material may be removed from above the top surface of the inter-tier dielectric layer 180 by a planarization process. The planarization process may use chemical mechanical planarization (CMP) and/or at least one recess etch. Each remaining discrete portion of the first sacrificial via fill material in a respective first-tier stepped via cavity 645 constitutes a first-tier sacrificial via fill structure 647.

Figure 59H:
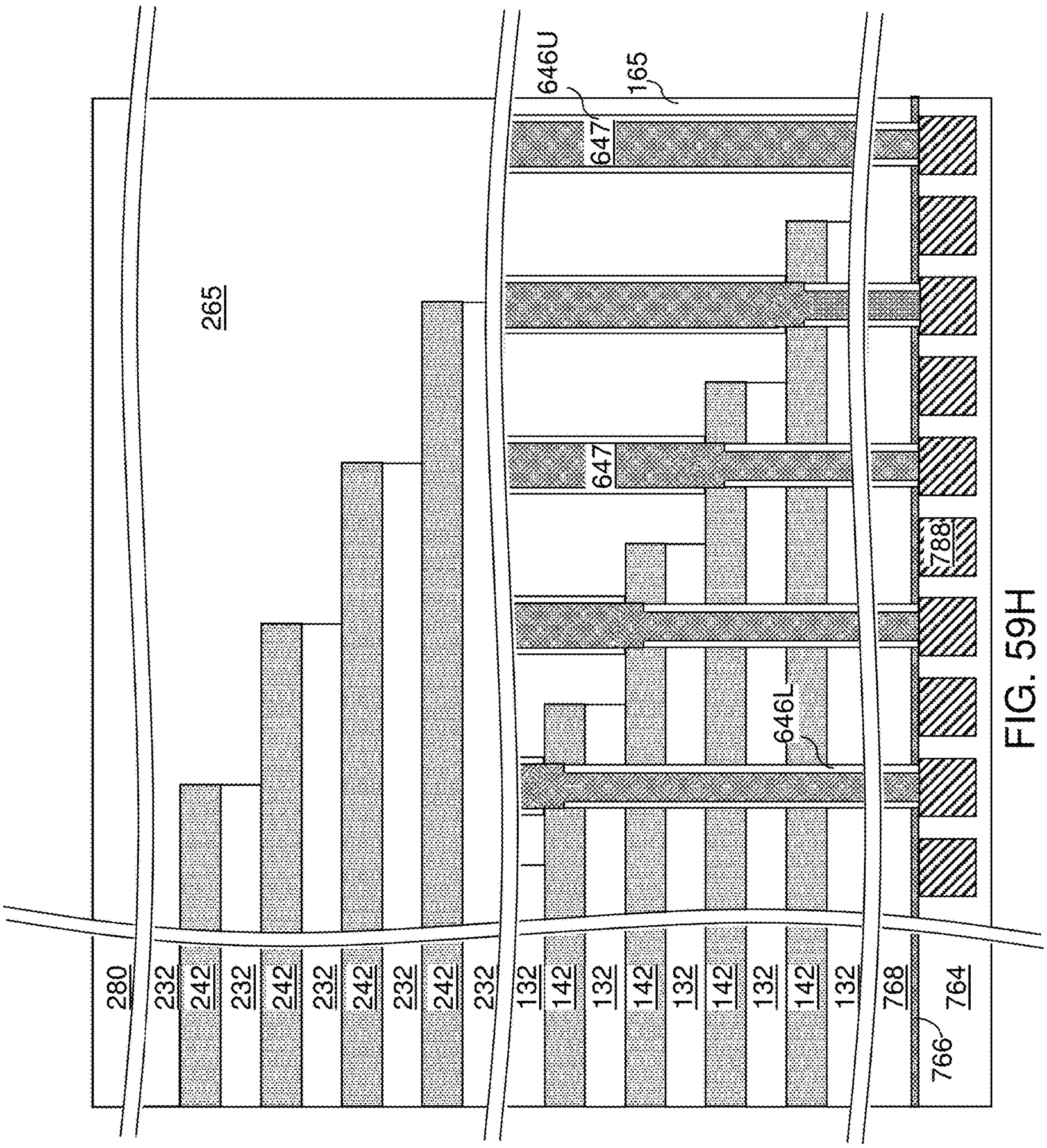

Referring to FIG. 59H, the processing steps as discussed above with reference to FIGS. 55A, 55B, and 56 may be performed to form a second alternating stack (232, 242), a second insulating cap layer 270, second stepped surfaces, a second retro-stepped dielectric material portion 265, and drain-select-level isolation structures 72. A first contact level dielectric layer 280 may be formed over the second insulating cap layer 270 in the same manner as in the first and third embodiments.

Figure 59I:
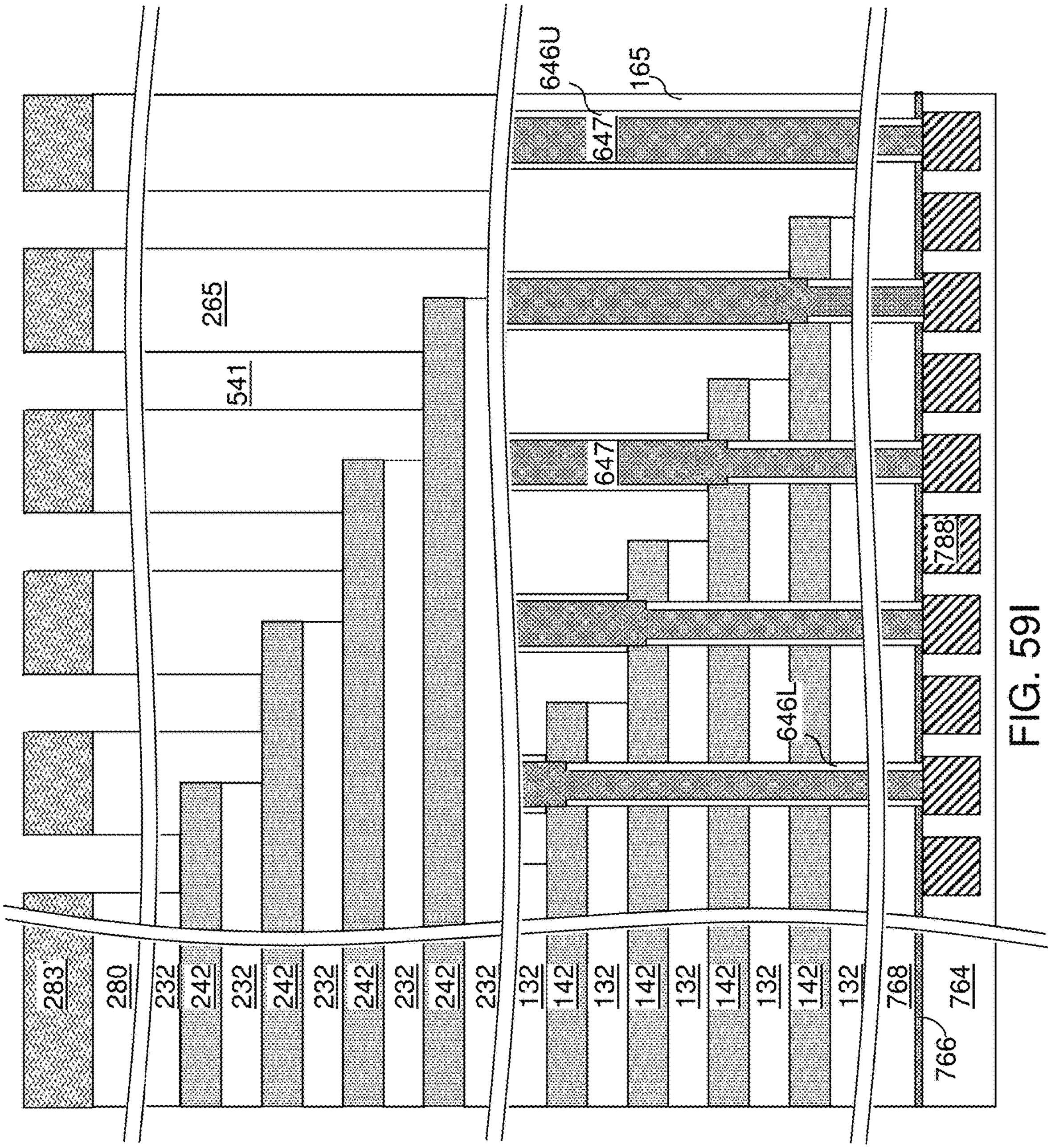

Referring to FIG. 59I, a second patterning film 283' may be applied over the first contact level dielectric layer 280, and may be lithographically patterned to form an array of openings overlying the second stepped surfaces of the second alternating stack (232, 242). For example, a photoresist layer (not shown) may be applied over the second patterning film 283' and may be lithographically patterned. The pattern in the photoresist layer may be transferred into the second patterning film 283' by an anisotropic etch process. The second patterning film 283' may function as a more robust etch mask layer than the photoresist layer. Each opening in the second patterning film 283' may be formed within the area of a respective underlying horizontal surface contained within the second stepped surfaces and located between a neighboring pair of vertical steps S in the second stepped surfaces. In one embodiment, the openings in the second patterning film 283' may be formed as a two-dimensional array of openings that do not overlap with the areas of the first-tier sacrificial via fill structures 647 contained in the first-tier structure (132, 142, 170, 165, 647). In one embodiment, the array of the first-tier sacrificial via fill structures 647 and the array of the openings in the second patterning film 283' may have the same two-dimensional periodicity with a lateral offset along a horizontal direction that is one half of the periodicity of each of the two arrays.

An anisotropic etch that etches the materials of the first contact level dielectric layer 280, the second insulating cap layer 270 and the second retro-stepped dielectric material portion 265 selective to the material of the second sacrificial material layers 242 may be performed to form second-tier in-process via cavities 541. The second-tier in-process via cavities 541 extending through the first contact level dielectric layer 280, the second insulating cap layer 270 and the second retro-stepped dielectric material portion 265 may be formed underneath the openings in the second patterning film 283'. Each second-tier in-process via cavity 541 may vertically extend from a top surface of the first contact level dielectric layer 280 to a top surface of a respective one of the second sacrificial material layers 242. Each of the second-tier in-process via cavities 541 may have an areal overlap with a respective underlying one of the lower-level metal interconnect structures 780 such as topmost lower-level metal line structures 788. In one embodiment, each of the second-tier in-process via cavities 541 may be formed entirely, or substantially, within the area of a respective underlying one of the lower-level metal interconnect structures 780. Each second-tier in-process via cavity 541 is an in-process via cavity that extends through the second retro-stepped dielectric material portion 265. A bottom surface of each second-tier in-process via cavity 541 is formed on a respective one of the second sacrificial material layers 242.

In one embodiment, the lower-level metal interconnect structures 780 may include an array of metal interconnect structures (such as topmost lower-level metal line structures 788) that are arranged along the first horizontal direction, and are sequentially numbered with a consecutive set of natural numbers without any gap throughout (such as a set of consecutive natural numbers beginning with 1). In one embodiment, the first-tier in-process via cavities 441 may be formed within areas of even-numbered ones of the metal interconnect structures at the processing steps of FIG. 59A and the second-tier in-process via cavities 541 may be formed within areas of odd-numbered ones of the metal interconnect structures at the processing steps of FIG. 59I. Alternatively, the first-tier in-process via cavities 441 may be formed within areas of odd-numbered ones of the metal interconnect structures at the processing steps of FIGS. 59A and 54B and the second-tier in-process via cavities 541 may be formed within areas of even-numbered ones of the metal interconnect structures at the processing steps of FIG. 59I.

Figure 59J:
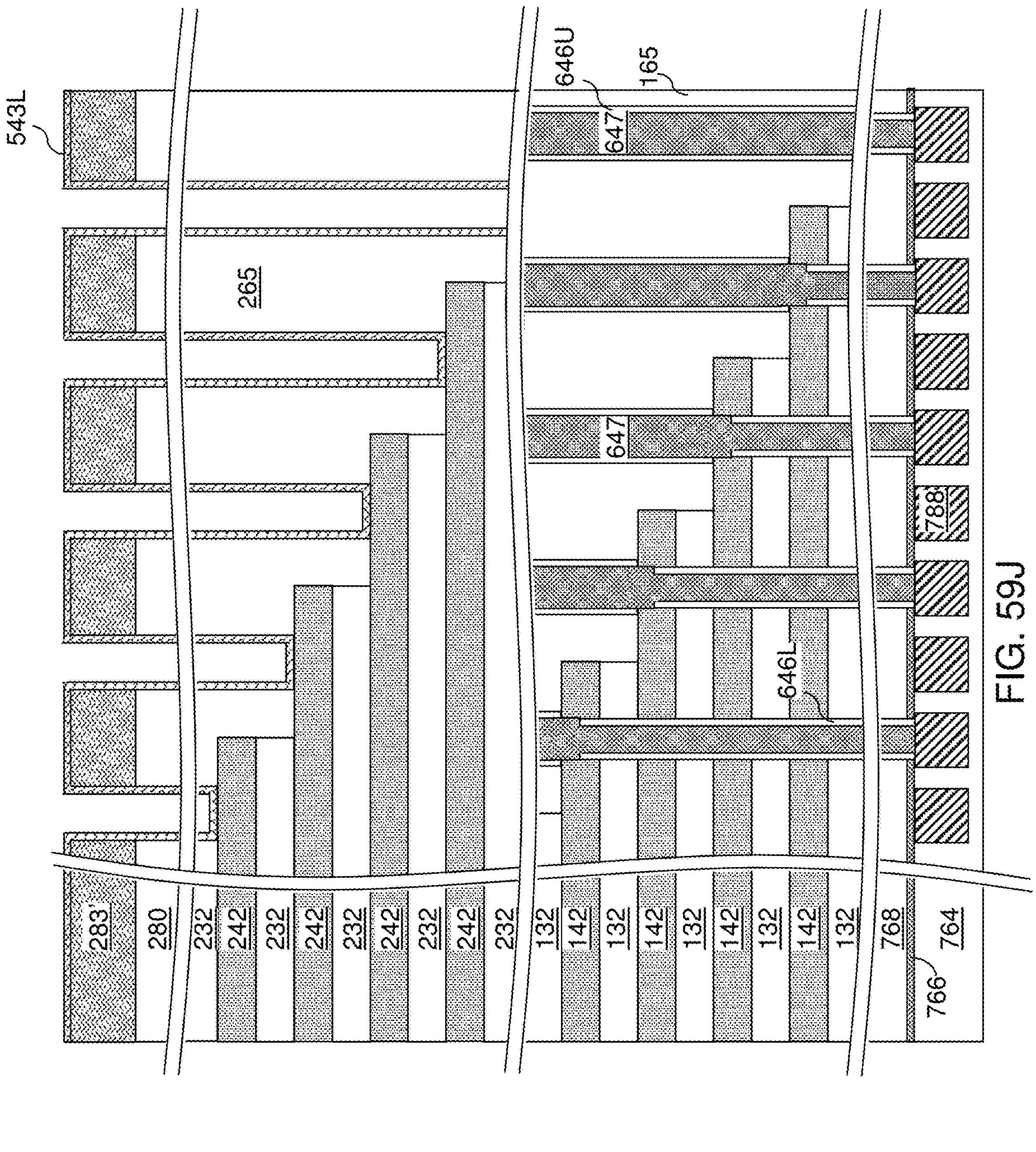

Referring to FIG. 59J, a second-tier sacrificial liner layer 543L may be deposited over the second patterning film 283' and at a periphery of each second-tier in-process via cavity 541. The second-tier sacrificial liner layer 543L includes a material that may be removed selective to the materials of the first and second retro-stepped dielectric material portions (165, 265), the first and second insulating layers (132, 232), and the first and second sacrificial material layers (142, 242). For example, the second-tier sacrificial liner layer 543L may include a semiconductor material such as amorphous silicon or polysilicon. The thickness of the second-tier sacrificial liner layer 543L may be in a range from 2 nm to 20 nm, such as from 3 nm to 10 nm, although lesser and greater thicknesses may also be used. The second-tier sacrificial liner layer 543L may be deposited, for example, by low pressure chemical vapor deposition process.

Figure 59K:
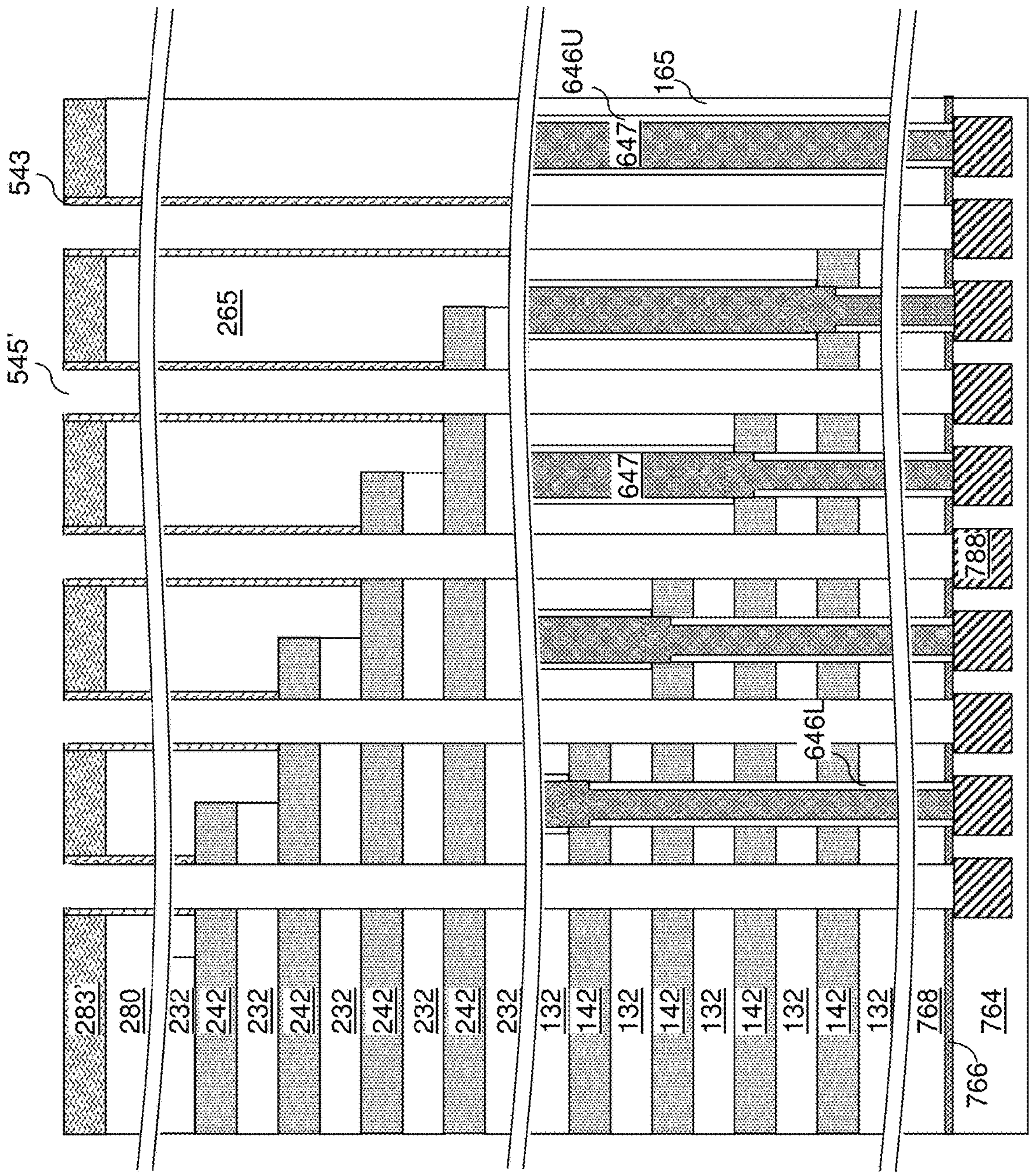

Referring to FIG. 59K, an anisotropic etch process may be subsequently performed. The anisotropic etch process includes a first step that etches horizontal portions of the second-tier sacrificial liner layer 543L from above the second patterning film 283' and from the bottom region of each second-tier in-process via cavity 541. Each remaining cylindrical portion of the second-tier sacrificial liner layer 543L constitutes a second-tier sacrificial liner 543. The second-tier sacrificial liners 543 are formed within the second-tier in-process via cavities 541.

The anisotropic etch process includes a second step in which the materials of the first retro-stepped dielectric material portion 165, the first and second insulating layers (132, 232), and the first and second sacrificial material layers (142, 242) are etched selective to the materials of the second-tier sacrificial liners 543 and the second patterning film 283'. The second-tier in-process via cavities 541 are vertically extended through the second alternating stack (232, 242), the first retro-stepped dielectric material portion 165, and the first alternating stack (132, 142) within areas that are not masked by the combination of the second-tier sacrificial liners 543 and the second patterning film 283'. First vertically-extended in-process via cavities 545' are formed by vertically extending the second-tier in-process via cavities 541 in the second step of the anisotropic etch process. A top surface of a lower-level metal interconnect structure 780 (such as a respective topmost lower-level metal line structure 788) is physically exposed at the bottom of each first vertically-extended in-process via cavity 545'.

Figure 59L:
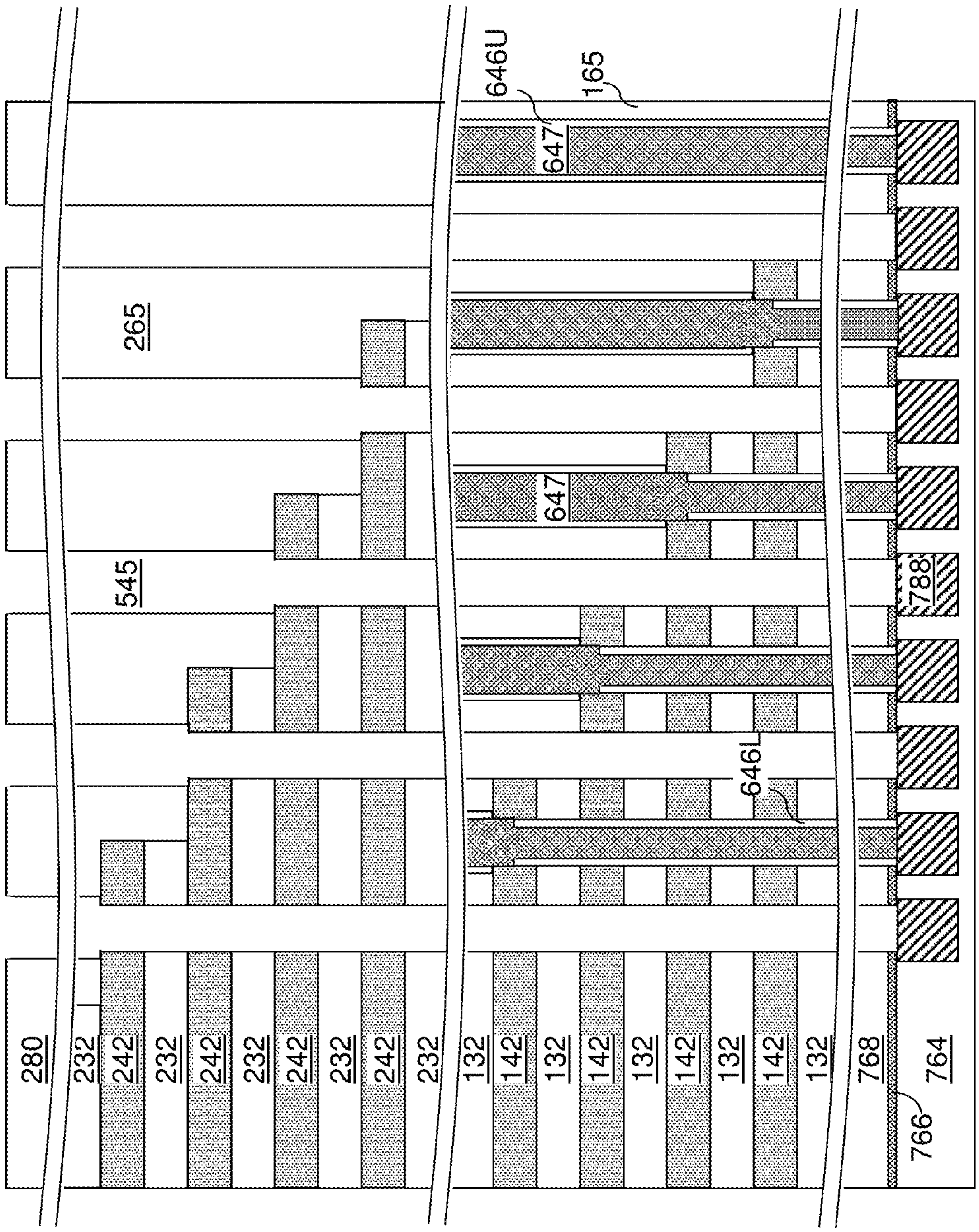

Referring to FIG. 59L, the remaining portions of the second-tier sacrificial liners 543 and the second patterning film 283' may be removed selective to the materials of the first and second retro-stepped dielectric material portions (165, 265), the first and second insulating layers (132, 232), the first and second sacrificial material layers (142, 242), the first contact level dielectric layer 280, and the physically exposed ones of the lower-level metal interconnect structures 780 (such as the topmost lower-level metal line structures 788). For example, a wet etch process using hot trimethyl-2 hydroxyethyl ammonium hydroxide ("hot TMY") or tetramethyl ammonium hydroxide (TMAH) may be used to remove the second-tier sacrificial liners 543. The second patterning film 283' may be removed, for example, by ashing. Inter-tier stepped via cavities 545 are formed by laterally expanding the volumes of the first vertically-extended in-process via cavities 545' through removal of the second-tier sacrificial liners 543. Each inter-tier stepped via cavity 545 includes an upper cavity portion overlying a physically exposed annular surface of a second sacrificial material layer 242 and having a greater lateral dimension, and a lower cavity portion underlying the upper cavity portion and extending through the second alternating stack (232, 242), the first retro-stepped dielectric material portion 165, and the first alternating stack (132, 142). A top surface of a lower-level metal interconnect structure 780 (such as a respective topmost lower-level metal line structure 788) is physically exposed at the bottom of each inter-tier stepped via cavity 545.

Figure 59M:
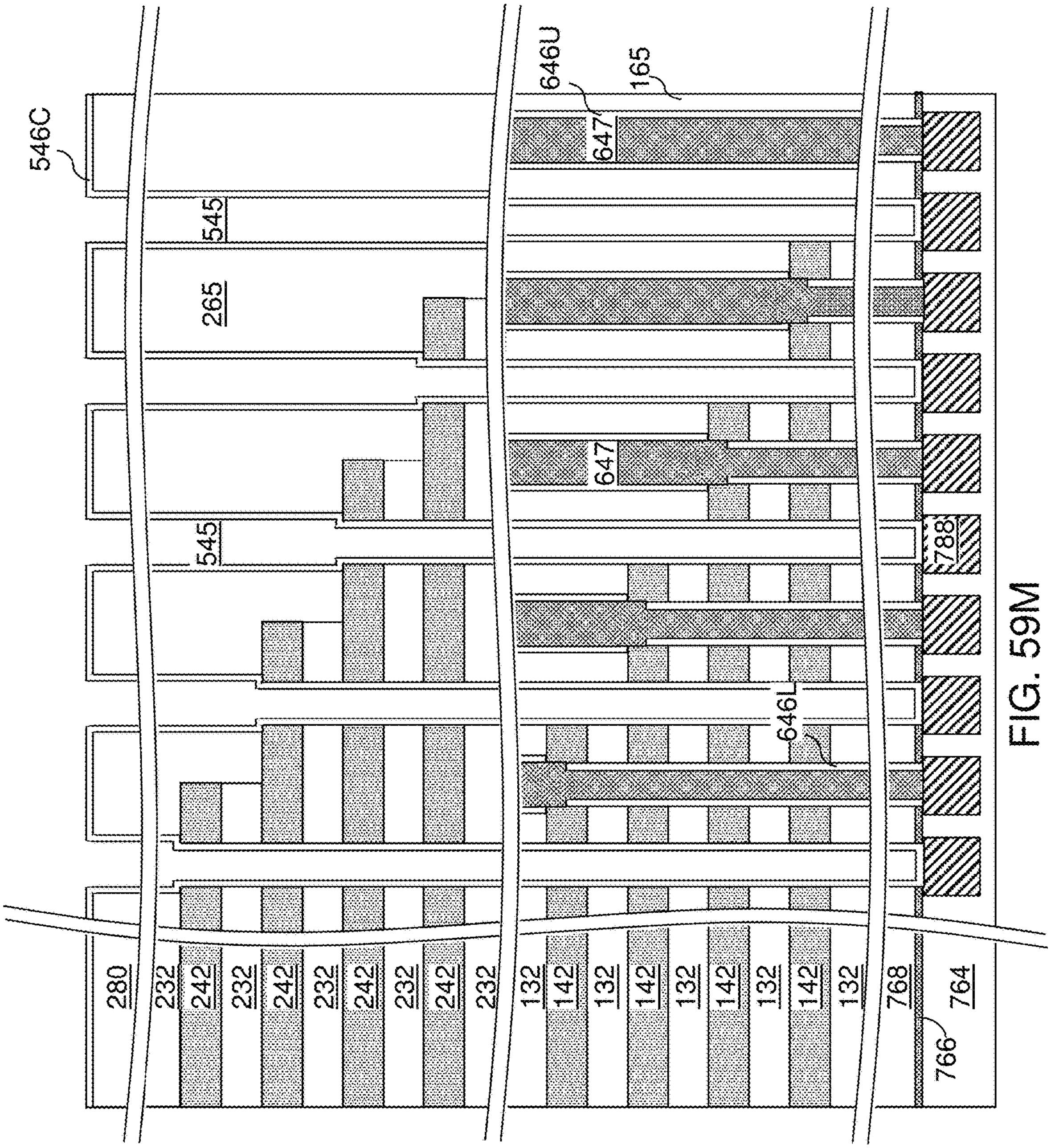

Referring to FIG. 59M, an inter-tier dielectric liner layer 546C is formed within the inter-tier stepped via cavities 545 and over the first contact level dielectric layer 280 by conformal deposition of a dielectric material such as silicon oxide or a dielectric metal oxide (e.g., aluminum oxide). The inter-tier dielectric liner layer 546C may be deposited by a conformal deposition process such as low pressure chemical vapor deposition, and may have a thickness in a range from 2 nm to 20 nm, such as from 3 nm to 10 nm, although lesser and greater thicknesses may also be used.

Figure 59N:
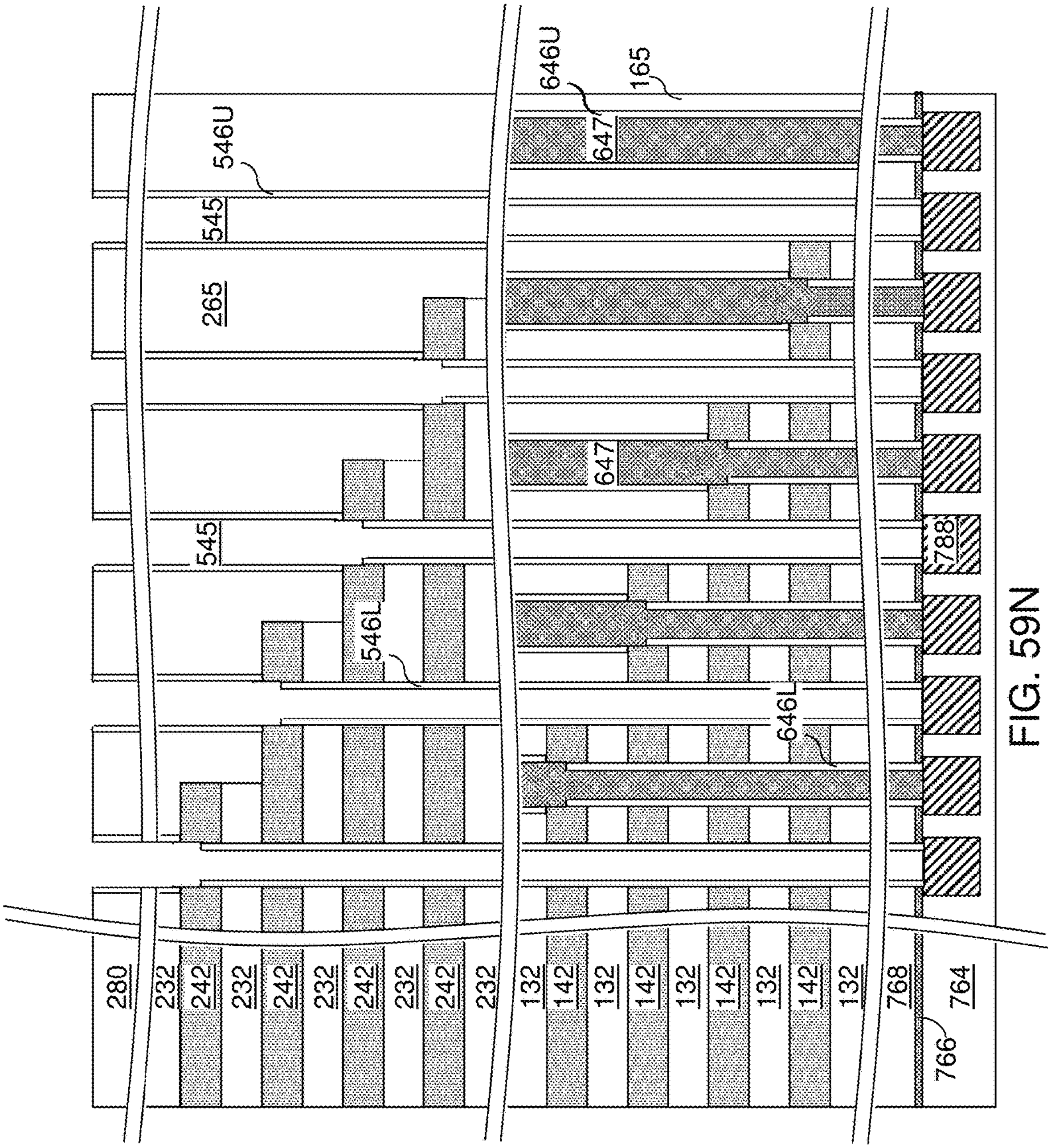

Referring to FIG. 59N, an anisotropic etch process is performed to remove horizontal portions of the inter-tier dielectric liner layer 546C and portions of the inter-tier dielectric liner layer 546C that are located at annular ledges at which the lateral dimension of the inter-tier stepped via cavities 545 change. The horizontal portion of the inter-tier dielectric liner layer 546C overlying the first contact level dielectric layer 280 is physically exposed. The inter-tier dielectric liner layer 546C is vertically recessed around horizontal interfaces at which the second sacrificial material layers 242 contact the inter-tier dielectric liner layer 546C. Remaining portions of the inter-tier dielectric liner layer 546C are further recessed such that a cylindrical surface of a second sacrificial material layer 242 is physically exposed around each of the inter-tier stepped via cavities 545.

A first upper dielectric liner 546U and a first lower dielectric liner 546L are formed by remaining portions of the inter-tier stepped via cavities 545 after the anisotropic etch process. Each first upper dielectric liner 546U overlies and contacts an annular top surface of a second sacrificial material layer 242. Each first lower dielectric liner 546L contacts a cylindrical surface of a second sacrificial material layer 242 that is contacted by an overlying first upper dielectric liner 546U. In case the first upper dielectric liners 546U are thinner than the second-tier sacrificial liners 543, an annular top surface of a second sacrificial material layer 242 may be physically exposed within each inter-tier stepped via cavity 545.

Figure 59O:
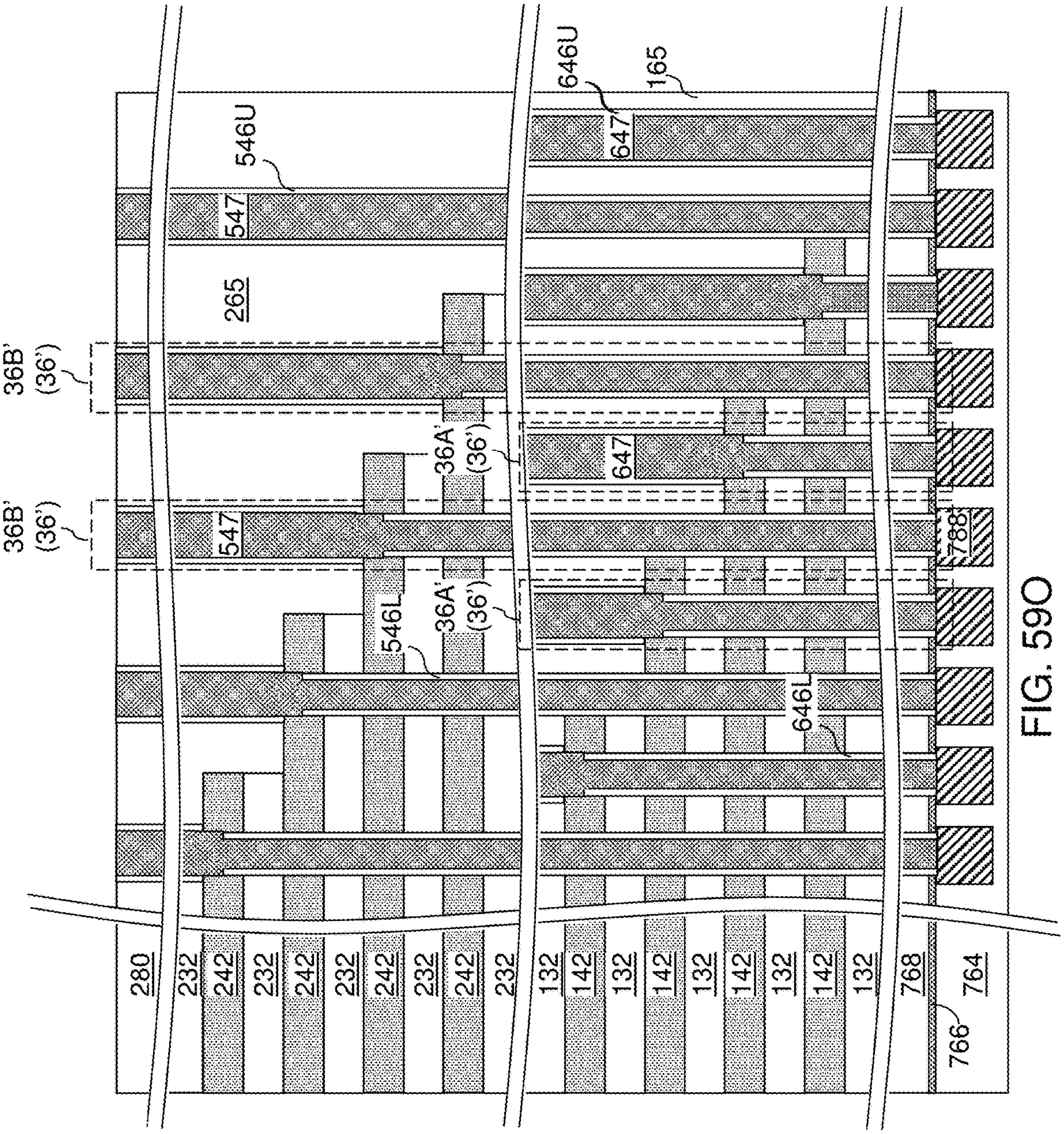

Referring to FIG. 59O, a second sacrificial via fill material may be deposited in unfilled volumes of the inter-tier stepped via cavities 545 and over the first contact level dielectric layer 280. The second sacrificial via fill material is a material that is different from the material of the first upper dielectric liners 546U and the first lower dielectric liners 546L. Any material that may be removed selective to the material of the first upper dielectric liners 546U and the first lower dielectric liners 546L may be used for the second sacrificial via fill material. For example, the second sacrificial via fill material may include silicon nitride. Excess portions of the second sacrificial via fill material may be removed from above the top surface of the first contact level dielectric layer 280 by a planarization process. The planarization process may us chemical mechanical planarization (CMP) and/or at least one recess etch. Each remaining discrete portion of the second sacrificial via fill material in a respective inter-tier stepped via cavity 545 constitutes an inter-tier sacrificial via fill structure 547.

Each combination of a first-tier sacrificial via fill structure 647, a first-tier upper dielectric liner 646U and a first-tier lower dielectric liner 646L constitutes a first laterally-insulated staircase region sacrificial via structure 36A'. Each combination of an inter-tier sacrificial via fill structure 547, a first upper dielectric liner 546U, and a first lower dielectric liner 546L constitutes a second laterally-insulated staircase region sacrificial via structure 36B'. The first laterally-insulated staircase region sacrificial via structures 36A' and the second laterally-insulated staircase region sacrificial via structures 36B' are collectively referred to as laterally-insulated staircase region sacrificial via structures 36'.

Figure 59P:
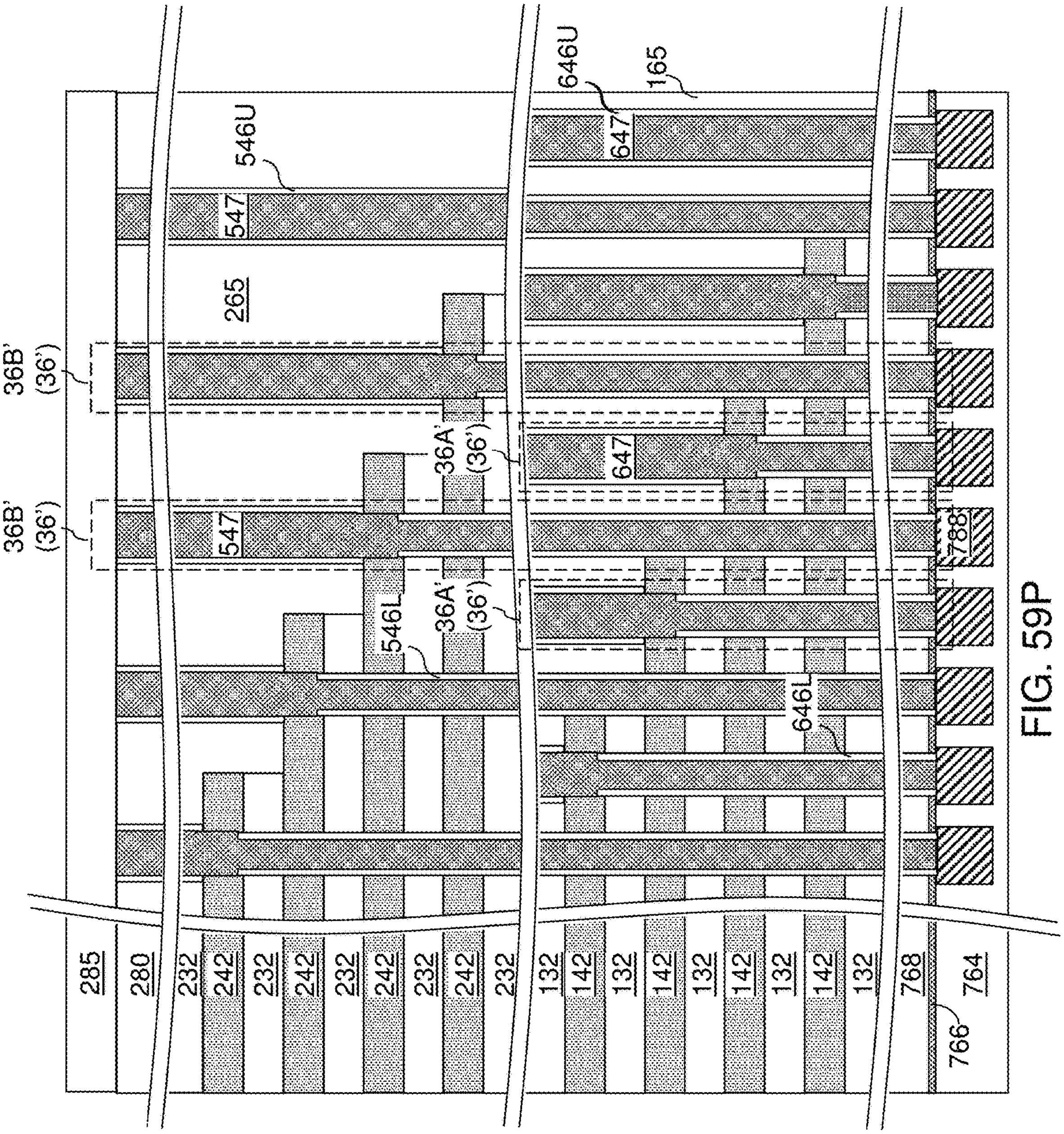

Referring to FIG. 59P, a sacrificial protection layer 285 may be formed over the first contact level dielectric layer 280 to encapsulate the laterally-insulated staircase region sacrificial via structures 36 and to provide protection from etchants to be subsequently used to remove the first and second sacrificial material layers (142, 242). In one embodiment, the sacrificial protection layer 285 may have a thickness in a range from 10 nm to 300 nm, and may include a silicon oxide-based material such as undoped silicate glass or a doped silicate glass.

Figure 59Q:
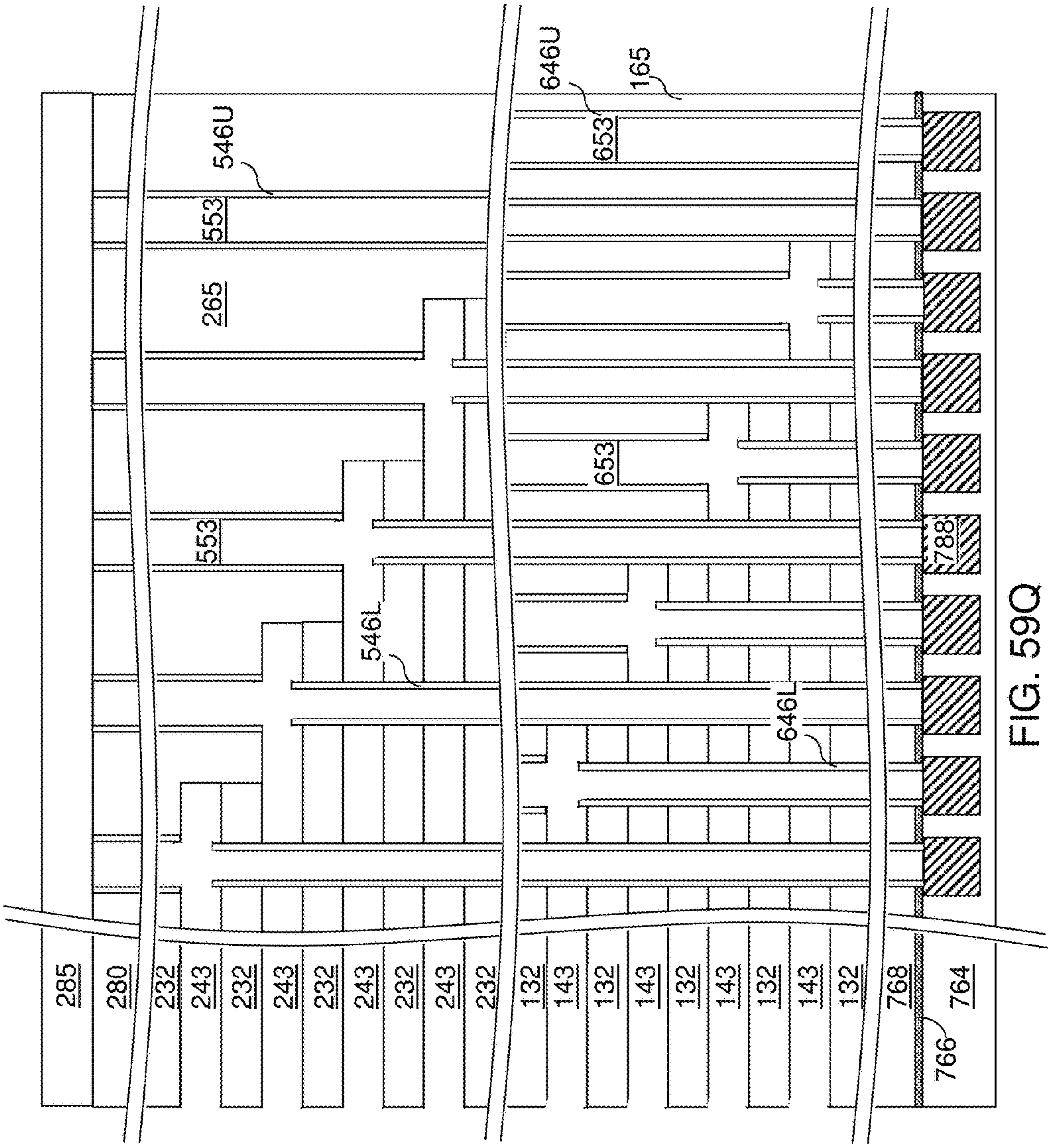

Referring to FIG. 59Q, the processing steps of FIGS. 20A and 20B, 21A-21E, 22, and 23 may be performed to form backside trenches 79, to replace the in-process source-level material layers 10' with source-level material layers 10, and to form first backside recesses 143 and the second backside recesses 243. The first-tier sacrificial via fill structures 647 and the inter-tier sacrificial via fill structures 547 may be removed concurrently with, or after, removal of the first and second sacrificial material layers (142, 242) to form first vertically-extending cavities 653 and second vertically-extending cavities 553. The first backside recesses 143 may be used as the path for providing the etchant for etching the first-tier sacrificial via fill structures 647. The second backside recesses 242 may be used as the path for providing the etchant for etching the inter-tier sacrificial via fill structures 547. Etching of the materials of the first-tier sacrificial via fill structures 647 and the inter-tier sacrificial via fill structures 547 may be performed selective to the materials of the first-tier upper dielectric liners 646U, the first-tier lower dielectric liners 646L, the upper dielectric liners 546U, and the first lower dielectric liners 546L. In one embodiment, the first and second sacrificial material layers (142, 242), the first-tier sacrificial via fill structures 647, and the inter-tier sacrificial via fill structures 547 may include silicon nitride, and removal of the first and second sacrificial material layers (142, 242), the first-tier sacrificial via fill structures 647, and the inter-tier sacrificial via fill structures 547 may be performed by a wet etch process using hot phosphoric acid.

Figure 59R:
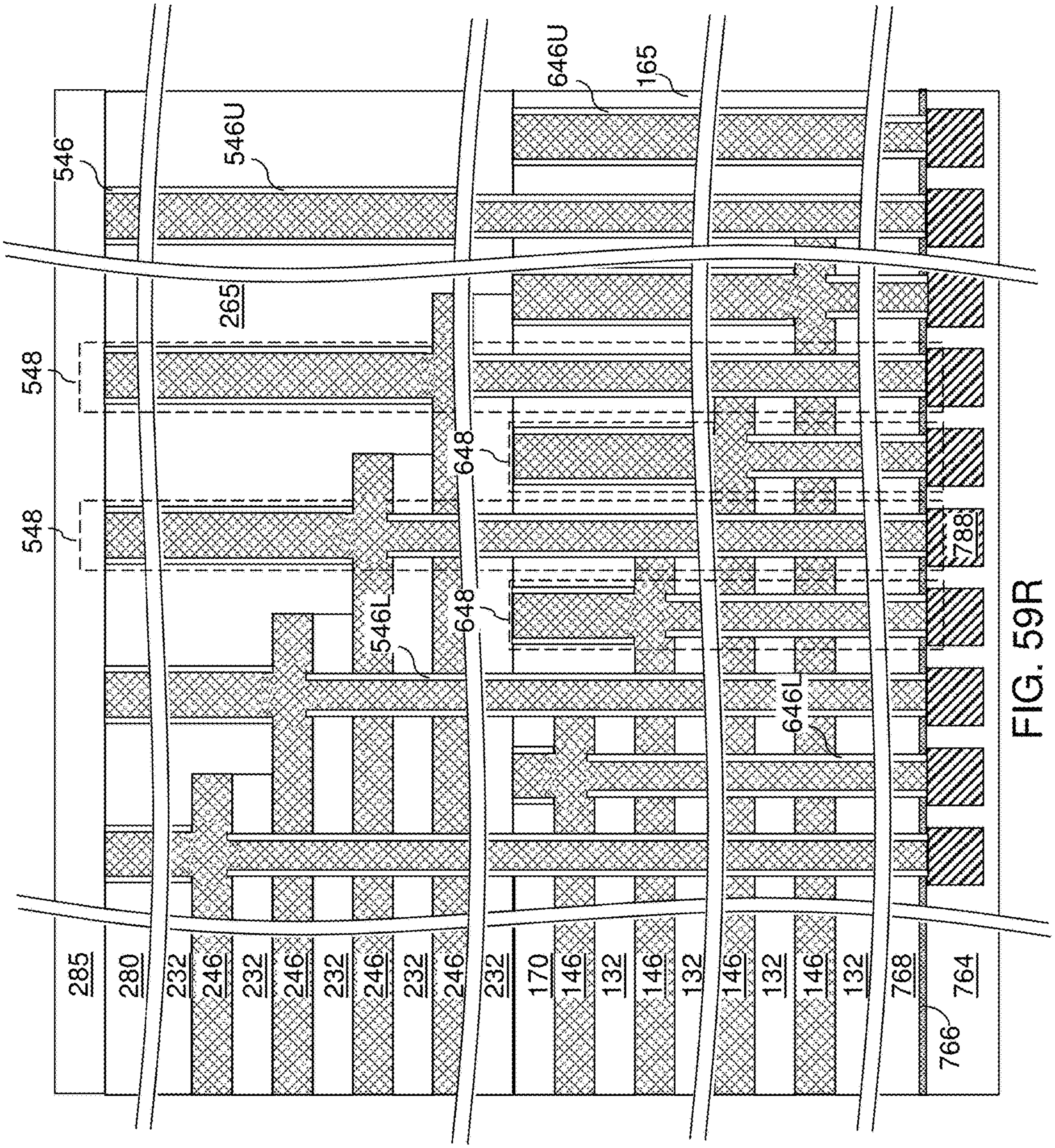
Figure 59S:
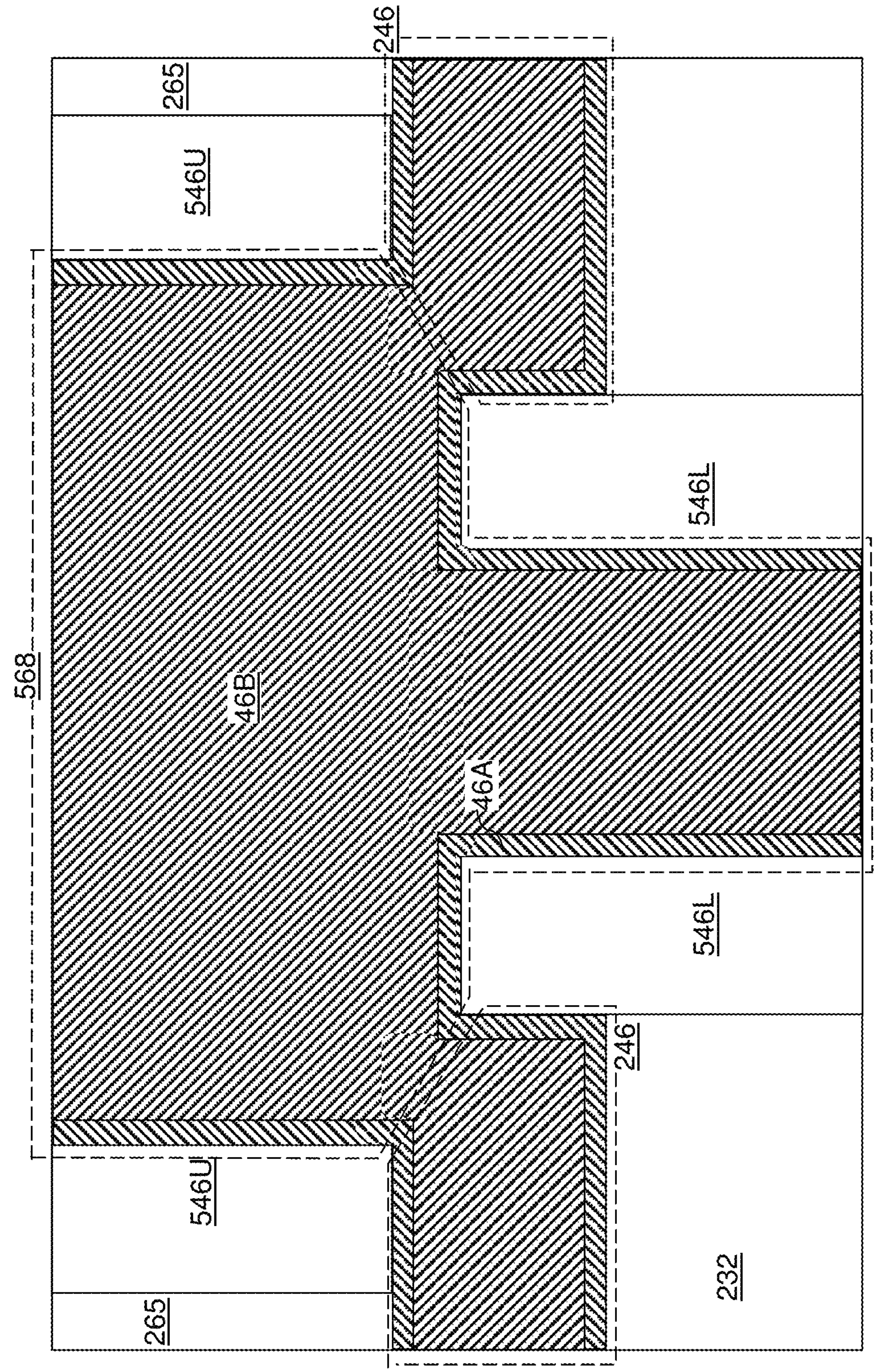
Figure 59T:
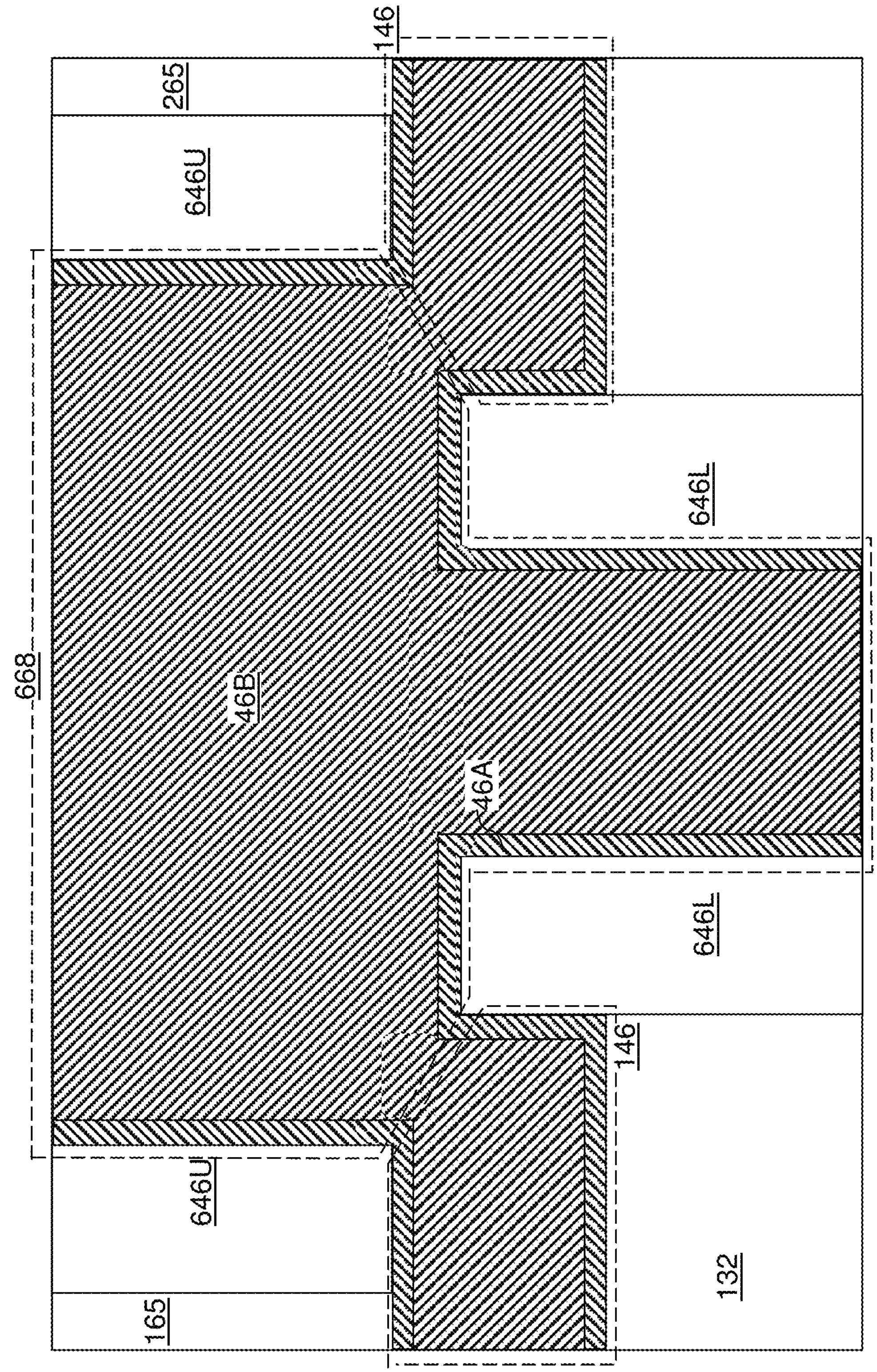

Referring to FIGS. 59R, 59S, and 59T, the processing steps as discussed above with reference to FIGS. 24 and 25A-25E may be performed to deposit at least one conductive material in the first vertically-extending cavities 653, the second vertically-extending cavities 553, and the first and second backside recesses (143, 243). The at least one conductive material fills the first vertically-extending cavities 653 to form second conductive via structures 668, fills the second vertically-extending cavities 553 to form first conductive via structures 568, fills the first backside recesses 143 to form first electrically conductive layers 146, and fills the second backside recesses 243 to form second electrically conductive layers 246. Each of the second conductive via structures 668, the first conductive via structures 568, the first electrically conductive layers 146, and the second electrically conductive layers 246 may include a metallic nitride liner 46A and a metallic fill material portion 46B. The metallic nitride liner 46A may include TiN, TaN, and/or WN. The metallic fill material portion 46B may include W, Co, Mo, and/or Cu. A pair of a first electrically conductive layer 146 and a second conductive via structures 668 may include portions of a common metallic nitride liner 46A and portions of a common metallic fill material portion 46B. A pair of a second electrically conductive layer 246 and a first conductive via structure 568 may include portions of a common metallic nitride liner 46A and portions of a common metallic fill material portion 46B.

Each combination of a first conductive via structures 568, a first upper dielectric liner 546U, and a first lower dielectric liner 546L constitutes a first laterally-insulated staircase region via structure 548. The first conductive via structure 568 is electrically connected to only one of the second electrically conductive layers 246 and electrically isolated from all other second electrically conductive layer 246 and from the first electrically conductive layers 146. Each combination of a second conductive via structures 668, a first-tier upper dielectric liner 646U, and a first-tier lower dielectric liner 646L constitutes a second laterally-insulated staircase region via structure 648. The second conductive via structure 668 is electrically connected to only one of the first electrically conductive layers 146 and electrically isolated from all other first electrically conductive layers 146 and from the second electrically conductive layers 246.

Figure 60A:
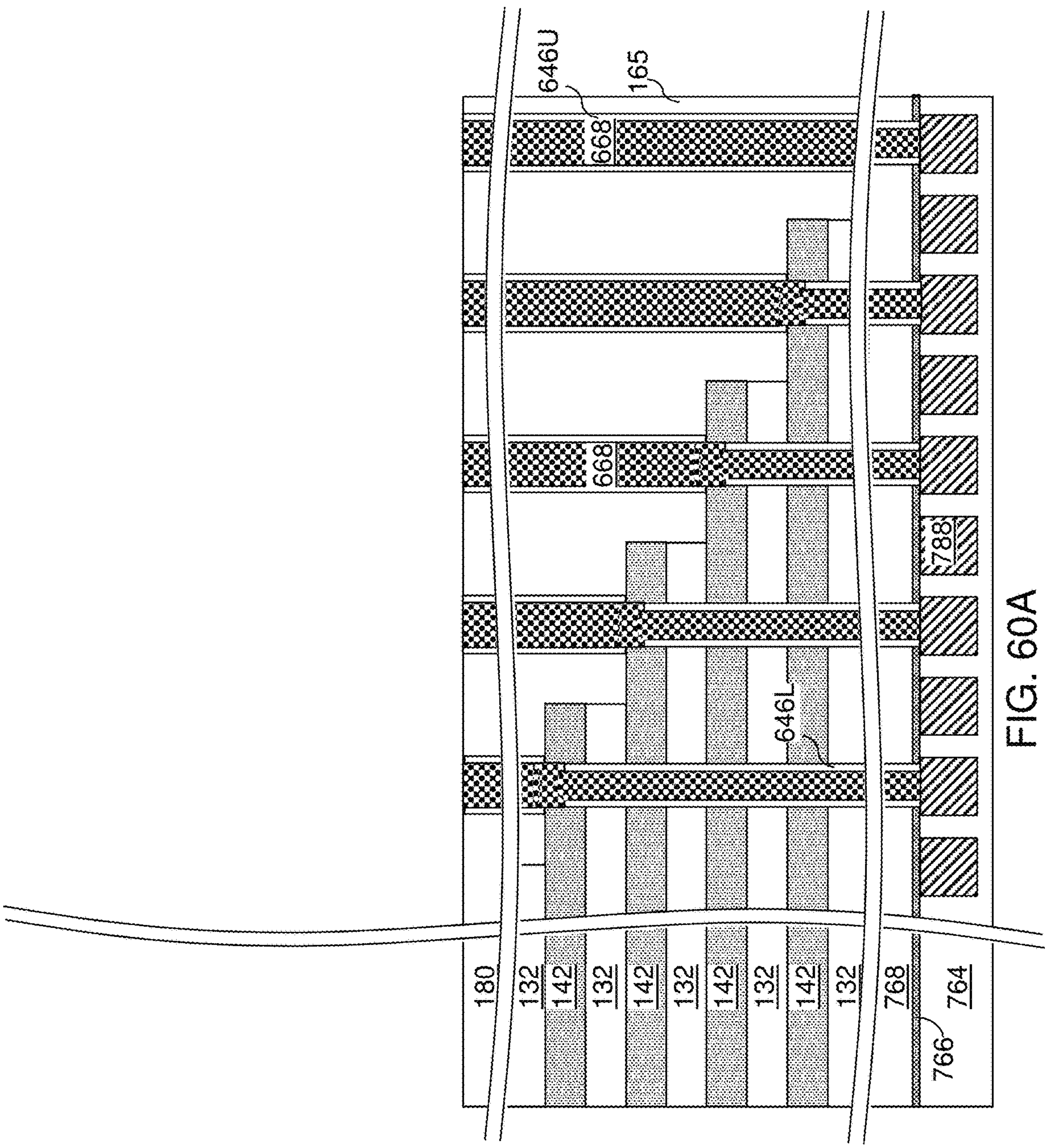
FIGS. 60A-60K are sequential vertical cross-sectional views of a region of a fifth exemplary structure during formation of laterally-insulated staircase region via structures according to an embodiment of the present disclosure.

Referring to FIG. 60A, a fifth exemplary structure according to an embodiment of the present disclosure may be derived from the fourth exemplary structure of FIG. 59F by depositing at least one conductive material in the first-tier stepped via cavities 645 and directly on physically exposed top surfaces of lower-level metal interconnect structure 780 (such as top surfaces of the topmost lower-level metal line structure 788). The at least one conductive material may include a metallic liner material and a metal fill material. In one embodiment, the metallic liner material may include a conductive metal nitride such as TiN, and the metal fill material may include a metal such as tungsten, cobalt, molybdenum, or copper. Excess portions of the at least one conductive material may be removed from above the top surface of the inter-tier dielectric layer 180 by a planarization process, which may us a recess etch and/or chemical mechanical planarization (CMP). Each remaining portion of the at least one conductive material that fills a respective first-tier stepped via cavity 645 constitutes a conductive via structure, which is herein referred to as a second conductive via structure 668.

Figure 60B:
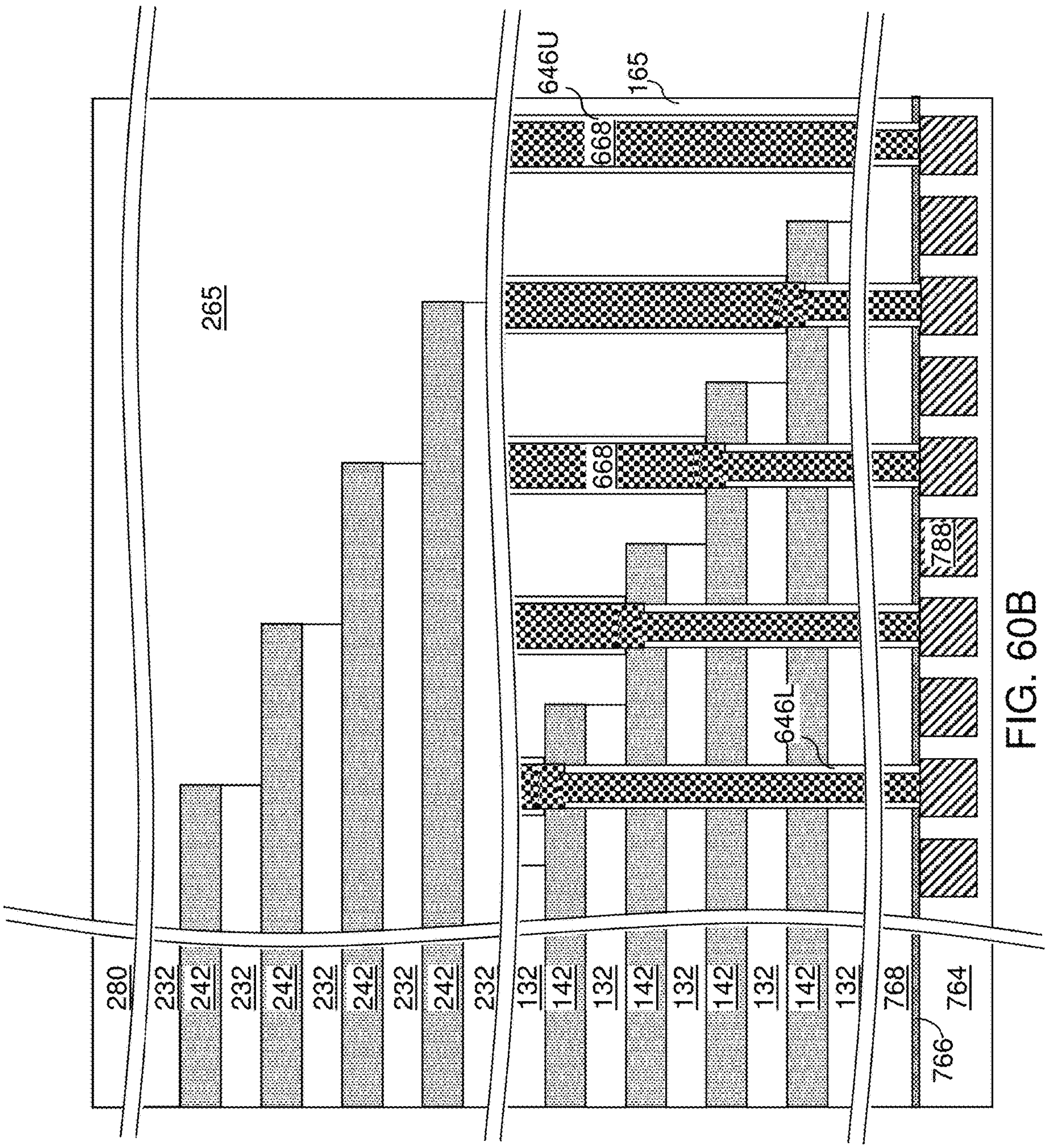

Referring to FIG. 60B, the processing steps as discussed above with reference to FIGS. 55A, 55B, and 56 may be performed to form a second alternating stack (232, 242), a second insulating cap layer 270, second stepped surfaces, a second retro-stepped dielectric material portion 265, and drain-select-level isolation structures 72. A first contact level dielectric layer 280 may be formed over the second insulating cap layer 270 in the same manner as in the first and third embodiments.

Figure 60C:
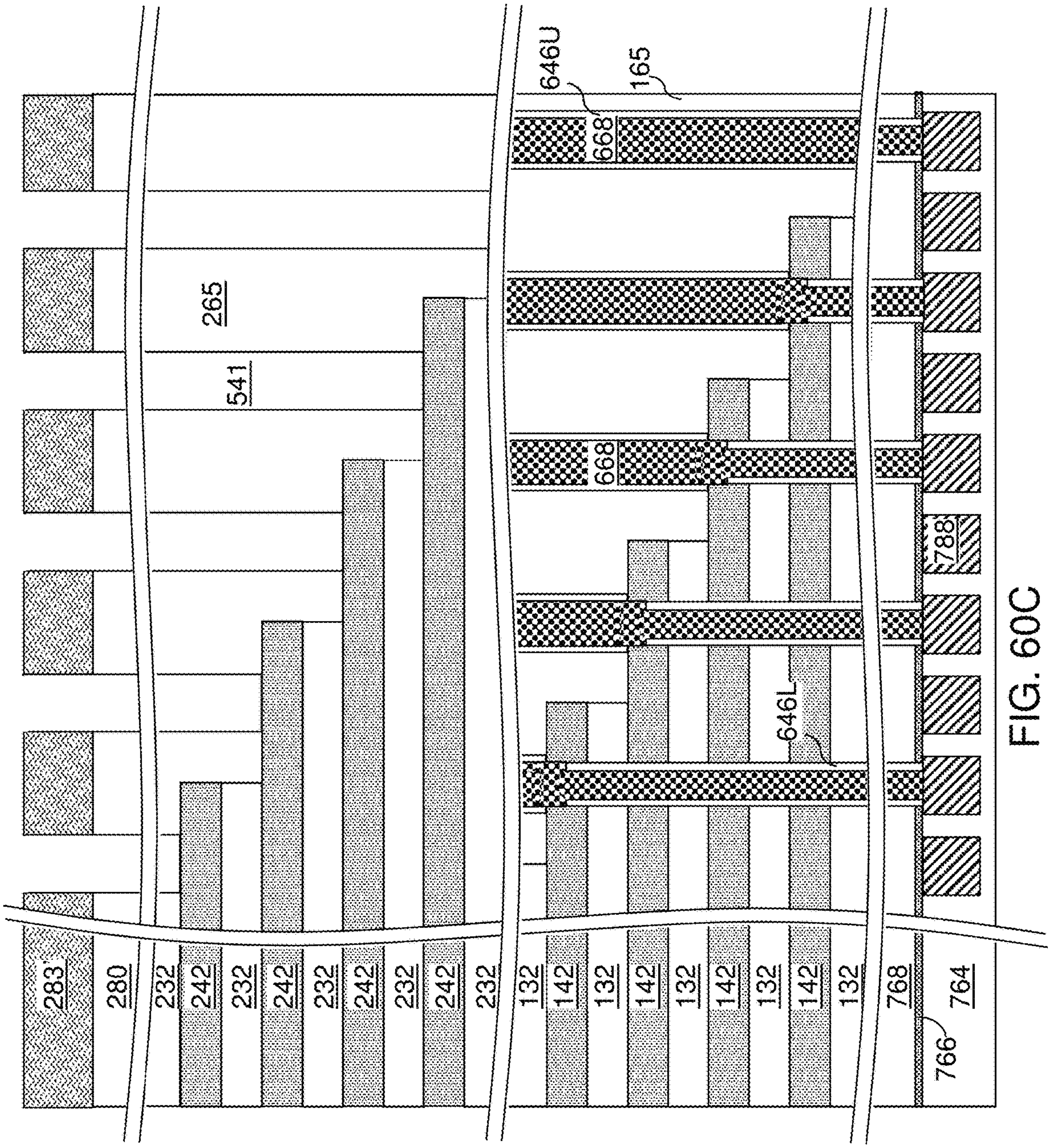

Referring to FIG. 60C, a second patterning film 283' may be applied over the first contact level dielectric layer 280, and may be lithographically patterned to form an array of openings overlying the second stepped surfaces of the second alternating stack (232, 242). For example, a photoresist layer (not shown) may be applied over the second patterning film 283' and may be lithographically patterned. The pattern in the photoresist layer may be transferred into the second patterning film 283' by an anisotropic etch process. The second patterning film 283' may function as a more robust etch mask layer than the photoresist layer. Each opening in the second patterning film 283' may be formed within the area of a respective underlying horizontal surface contained within the second stepped surfaces and located between a neighboring pair of vertical steps S in the second stepped surfaces. In one embodiment, the openings in the second patterning film 283' may be formed as a two-dimensional array of openings that do not overlap with the areas of the second conductive via structures 668 contained in the first-tier structure (132, 142, 170, 165, 668). In one embodiment, the array of the second conductive via structures 668 and the array of the openings in the second patterning film 283' may have the same two-dimensional periodicity with a lateral offset along a horizontal direction that is one half of the periodicity of each of the two arrays.

An anisotropic etch that etches the materials of the first contact level dielectric layer 280, the second insulating cap layer 270 and the second retro-stepped dielectric material portion 265 selective to the material of the second sacrificial material layers 242 may be performed to form second-tier in-process via cavities 541. The second-tier in-process via cavities 541 extending through the first contact level dielectric layer 280, the second insulating cap layer 270 and the second retro-stepped dielectric material portion 265 may be formed underneath the openings in the second patterning film 283'. Each second-tier in-process via cavity 541 may vertically extend from a top surface of the first contact level dielectric layer 280 to a top surface of a respective one of the second sacrificial material layers 242. Each of the second-tier in-process via cavities 541 may have an areal overlap with a respective underlying one of the lower-level metal interconnect structures 780 such as topmost lower-level metal line structures 788. In one embodiment, each of the second-tier in-process via cavities 541 may be formed entirely, or substantially, within the area of a respective underlying one of the lower-level metal interconnect structures 780. Each second-tier in-process via cavity 541 is an in-process via cavity that extends through the second retro-stepped dielectric material portion 265. A bottom surface of each second-tier in-process via cavity 541 is formed on a respective one of the second sacrificial material layers 242.

In one embodiment, the lower-level metal interconnect structures 780 may include an array of metal interconnect structures (such as topmost lower-level metal line structures 788) that are arranged along the first horizontal direction, and are sequentially numbered with a consecutive set of natural numbers without any gap throughout (such as a set of consecutive natural numbers beginning with 1). In one embodiment, the first-tier in-process via cavities 441 may be formed within areas of even-numbered ones of the metal interconnect structures at the processing steps of FIG. 59A and the second-tier in-process via cavities 541 may be formed within areas of odd-numbered ones of the metal interconnect structures at the processing steps of FIG. 60C. Alternatively, the first-tier in-process via cavities 441 may be formed within areas of odd-numbered ones of the metal interconnect structures at the processing steps of FIGS. 59A and 54B and the second-tier in-process via cavities 541 may be formed within areas of even-numbered ones of the metal interconnect structures at the processing steps of FIG. 50C.

Figure 60D:
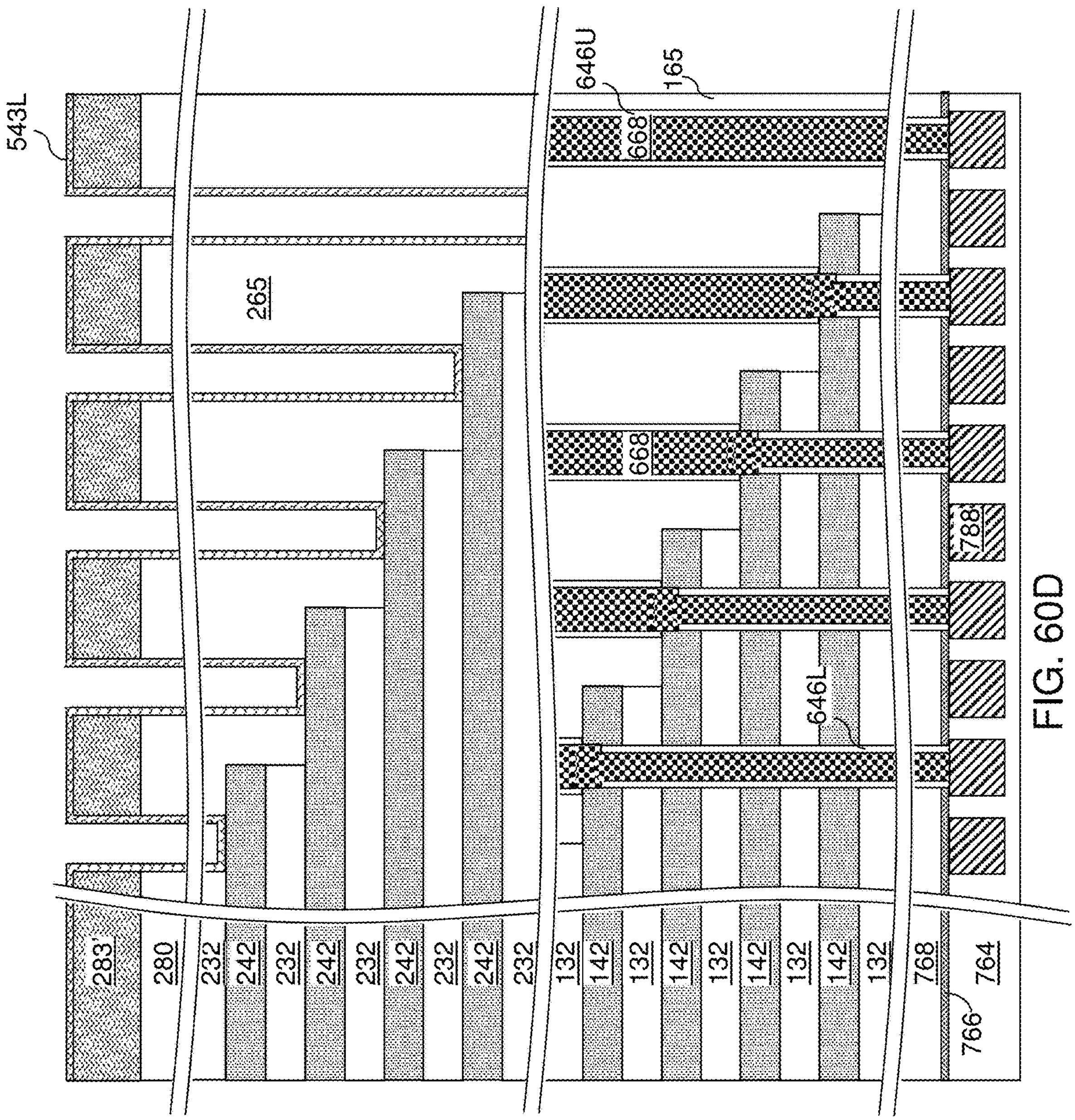

Referring to FIG. 60D, a second-tier sacrificial liner layer 543L may be deposited over the second patterning film 283' and at a periphery of each second-tier in-process via cavity 541. The second-tier sacrificial liner layer 543L includes a material that may be removed selective to the materials of the first and second retro-stepped dielectric material portions (165, 265), the first and second insulating layers (132, 232), and the first and second sacrificial material layers (142, 242). For example, the second-tier sacrificial liner layer 543L may include a semiconductor material such as amorphous silicon or polysilicon. The thickness of the second-tier sacrificial liner layer 543L may be in a range from 2 nm to 20 nm, such as from 3 nm to 10 nm, although lesser and greater thicknesses may also be used. The second-tier sacrificial liner layer 543L may be deposited, for example, by low pressure chemical vapor deposition process.

Figure 60E:
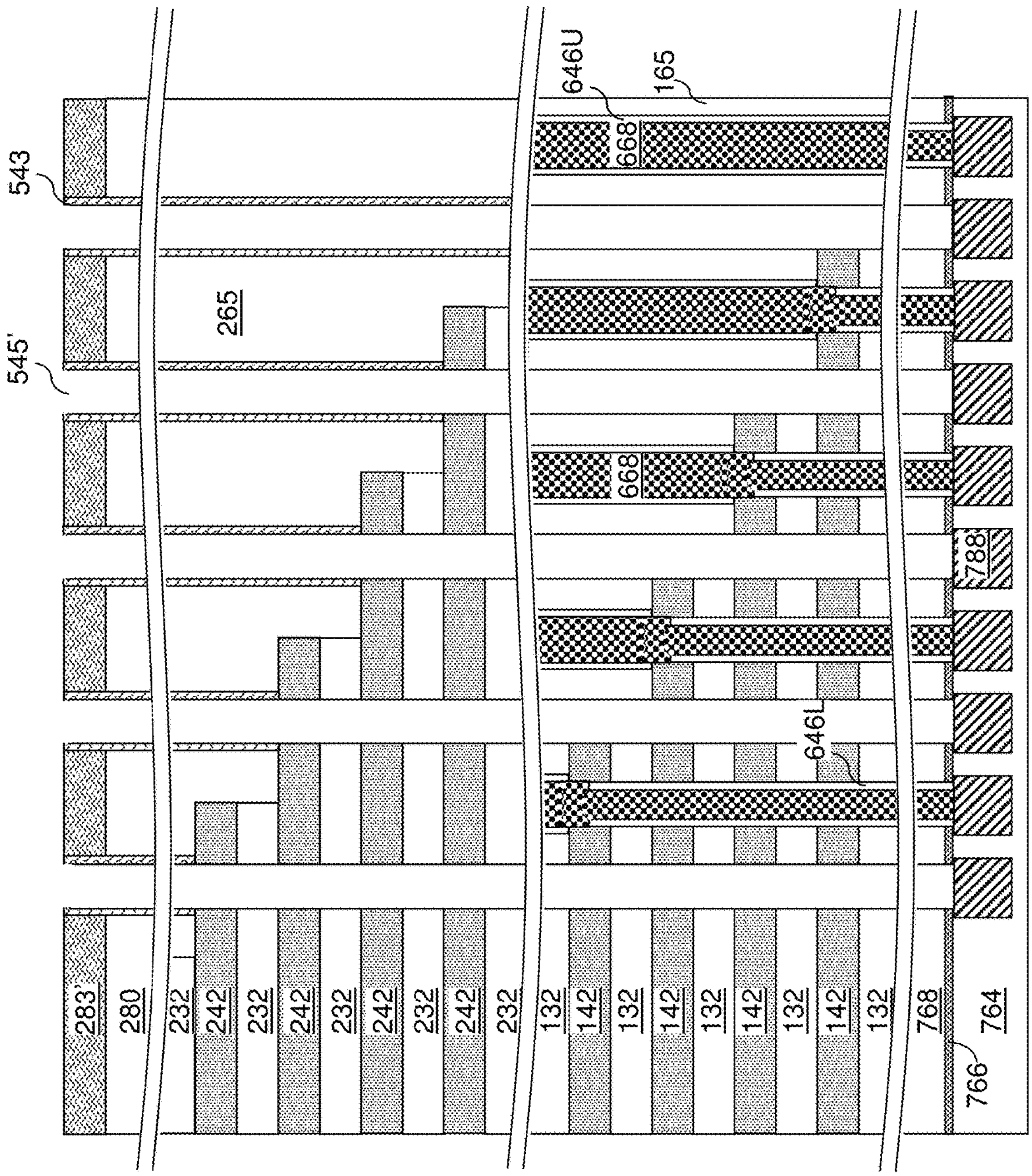

Referring to FIG. 60E, an anisotropic etch process may be subsequently performed. The anisotropic etch process includes a first step that etches horizontal portions of the second-tier sacrificial liner layer 543L from above the second patterning film 283' and from the bottom region of each second-tier in-process via cavity 541. Each remaining cylindrical portion of the second-tier sacrificial liner layer 543L constitutes a second-tier sacrificial liner 543. The second-tier sacrificial liners 543 are formed within the second-tier in-process via cavities 541.

The anisotropic etch process includes a second step in which the materials of the first retro-stepped dielectric material portion 165, the first and second insulating layers (132, 232), and the first and second sacrificial material layers (142, 242) are etched selective to the materials of the second-tier sacrificial liners 543 and the second patterning film 283'. The second-tier in-process via cavities 541 are vertically extended through the second alternating stack (232, 242), the first retro-stepped dielectric material portion 165, and the first alternating stack (132, 142) within areas that are not masked by the combination of the second-tier sacrificial liners 543 and the second patterning film 283'. First vertically-extended in-process via cavities 545' are formed by vertically extending the second-tier in-process via cavities 541 in the second step of the anisotropic etch process. A top surface of a lower-level metal interconnect structure 780 (such as a respective topmost lower-level metal line structure 788) is physically exposed at the bottom of each first vertically-extended in-process via cavity 545'.

Figure 60F:
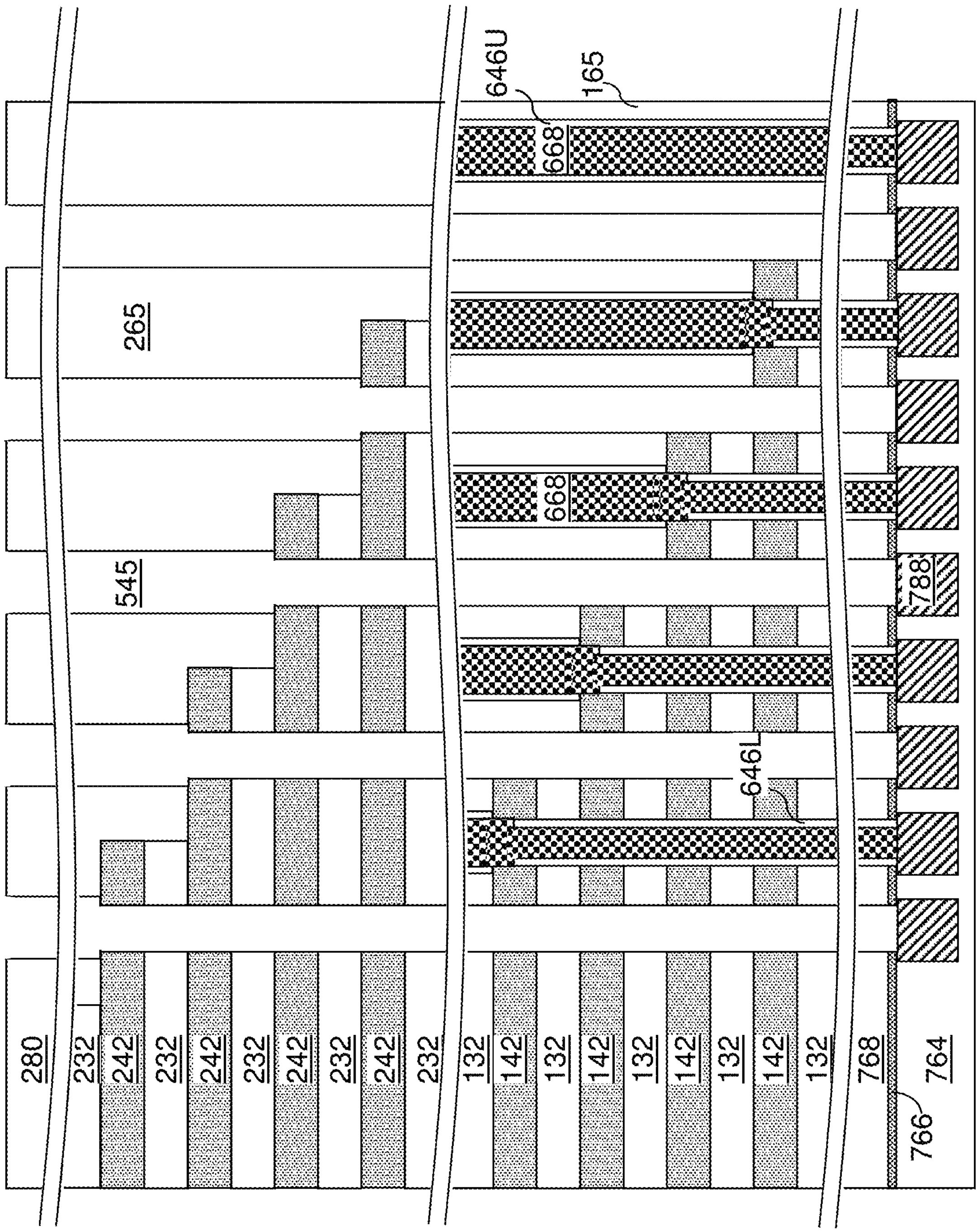

Referring to FIG. 60F, the remaining portions of the second-tier sacrificial liners 543 and the second patterning film 283' may be removed selective to the materials of the first and second retro-stepped dielectric material portions (165, 265), the first and second insulating layers (132, 232), the first and second sacrificial material layers (142, 242), the first contact level dielectric layer 280, and the physically exposed ones of the lower-level metal interconnect structures 780 (such as the topmost lower-level metal line structures 788). For example, a wet etch process using hot trimethyl-2 hydroxyethyl ammonium hydroxide ("hot TMY") or tetramethyl ammonium hydroxide (TMAH) may be used to remove the second-tier sacrificial liners 543. The second patterning film 283' may be removed, for example, by ashing. Inter-tier stepped via cavities 545 are formed by laterally expanding the volumes of the first vertically-extended in-process via cavities 545' through removal of the second-tier sacrificial liners 543. Each inter-tier stepped via cavity 545 includes an upper cavity portion overlying a physically exposed annular surface of a second sacrificial material layer 242 and having a greater lateral dimension, and a lower cavity portion underlying the upper cavity portion and extending through the second alternating stack (232, 242), the first retro-stepped dielectric material portion 165, and the first alternating stack (132, 142). A top surface of a lower-level metal interconnect structure 780 (such as a respective topmost lower-level metal line structure 788) is physically exposed at the bottom of each inter-tier stepped via cavity 545.

Figure 60G:
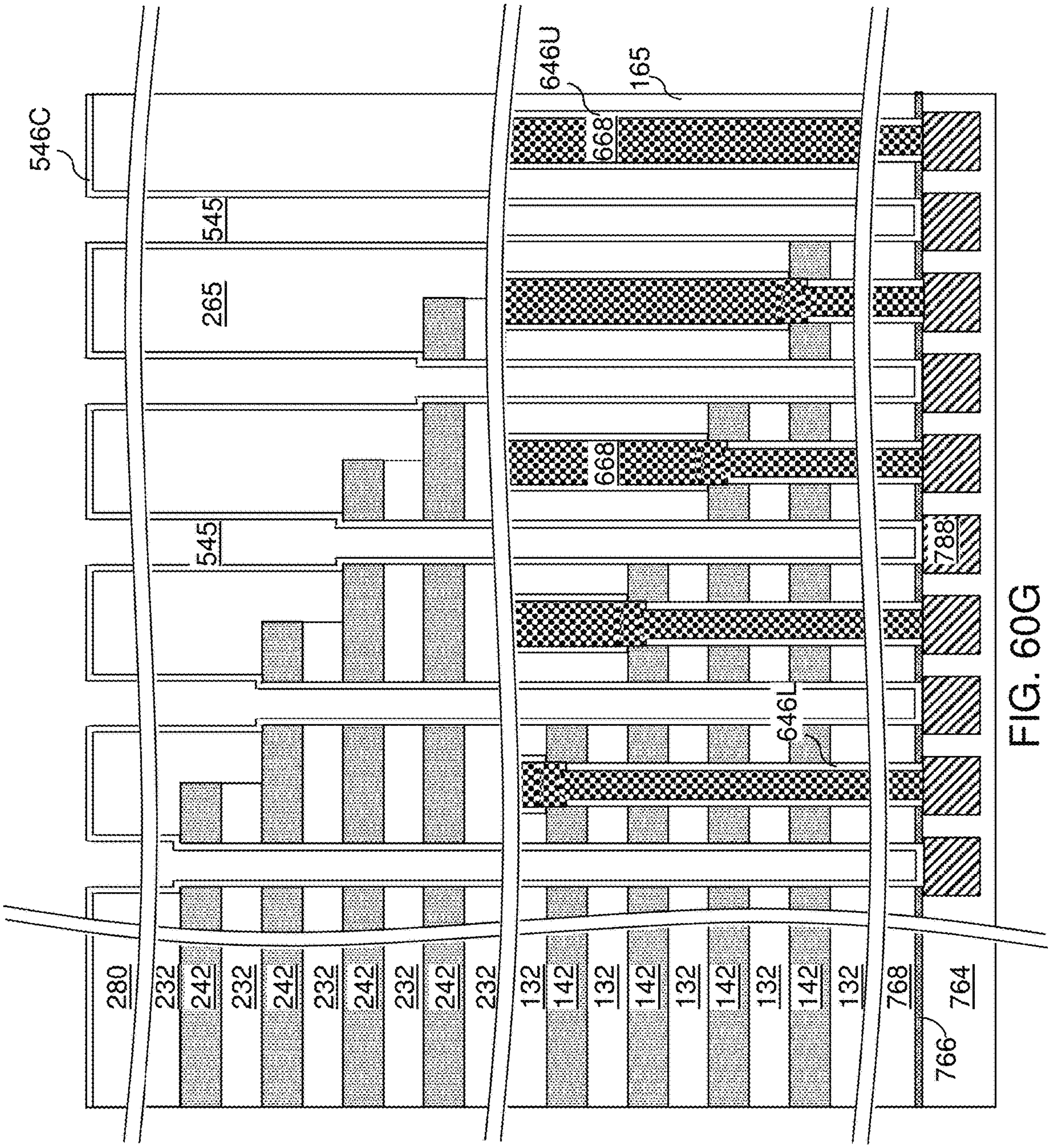

Referring to FIG. 60G, an inter-tier dielectric liner layer 546C is formed within the inter-tier stepped via cavities 545 and over the first contact level dielectric layer 280 by conformal deposition of a dielectric material such as silicon oxide or a dielectric metal oxide (e.g., aluminum oxide). The inter-tier dielectric liner layer 546C may be deposited by a conformal deposition process such as low pressure chemical vapor deposition, and may have a thickness in a range from 2 nm to 20 nm, such as from 3 nm to 10 nm, although lesser and greater thicknesses may also be used.

Figure 60H:
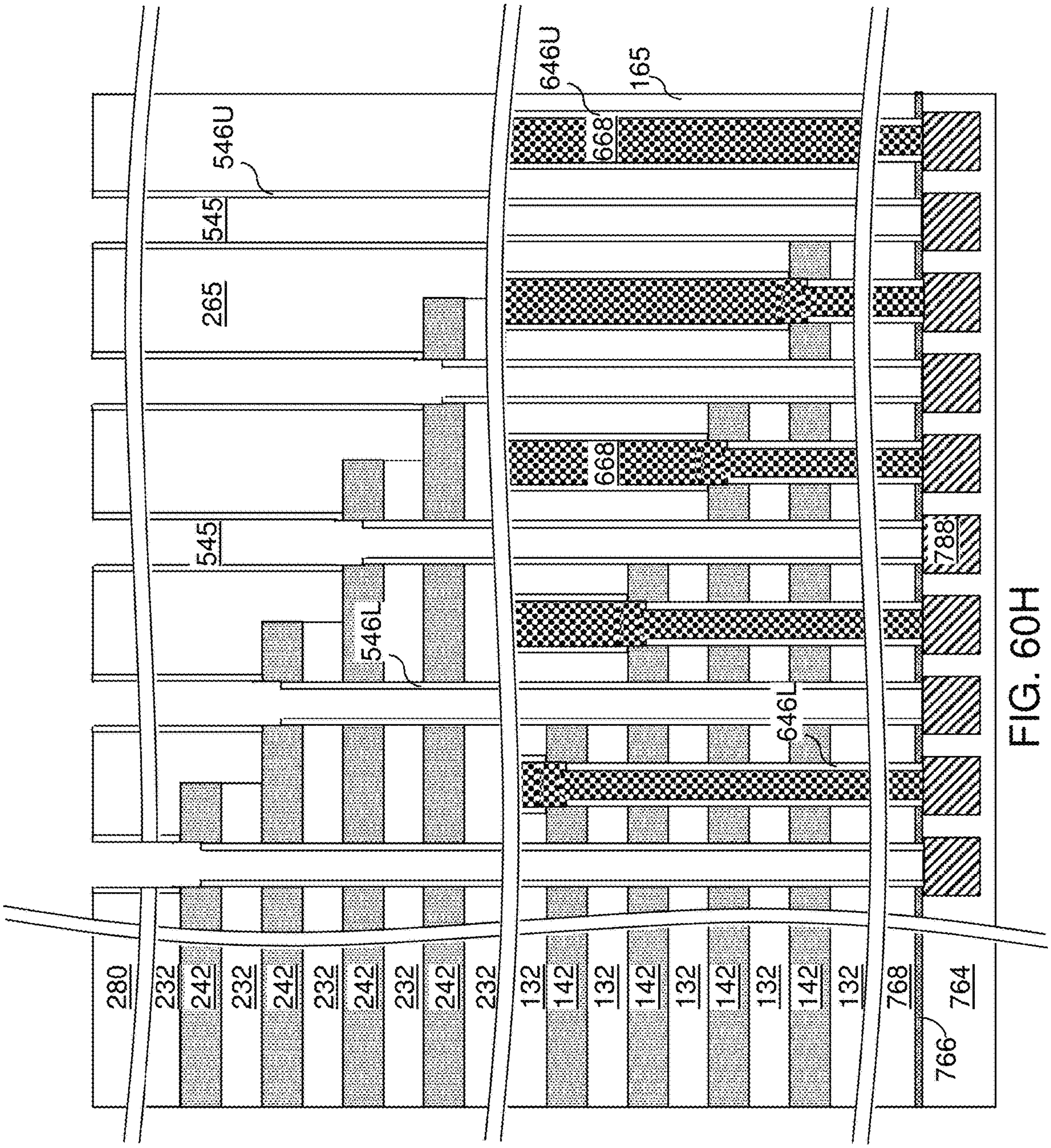

Referring to FIG. 60H, an anisotropic etch process is performed to remove horizontal portions of the inter-tier dielectric liner layer 546C and portions of the inter-tier dielectric liner layer 546C that are located at annular ledges at which the lateral dimension of the inter-tier stepped via cavities 545 change. The horizontal portion of the inter-tier dielectric liner layer 546C overlying the first contact level dielectric layer 280 is physically exposed. The inter-tier dielectric liner layer 546C is vertically recessed around horizontal interfaces at which the second sacrificial material layers 242 contact the inter-tier dielectric liner layer 546C. Remaining portions of the inter-tier dielectric liner layer 546C are further recessed such that a cylindrical surface of a second sacrificial material layer 242 is physically exposed around each of the inter-tier stepped via cavities 545.

A first upper dielectric liner 546U and a first lower dielectric liner 546L are formed by remaining portions of the inter-tier stepped via cavities 545 after the anisotropic etch process. Each first upper dielectric liner 546U overlies and contacts an annular top surface of a second sacrificial material layer 242. Each first lower dielectric liner 546L contacts a cylindrical surface of a second sacrificial material layer 242 that is contacted by an overlying first upper dielectric liner 546U. In case the first upper dielectric liners 546U are thinner than the second-tier sacrificial liners 543, an annular top surface of a second sacrificial material layer 242 may be physically exposed within each inter-tier stepped via cavity 545.

Figure 60I:
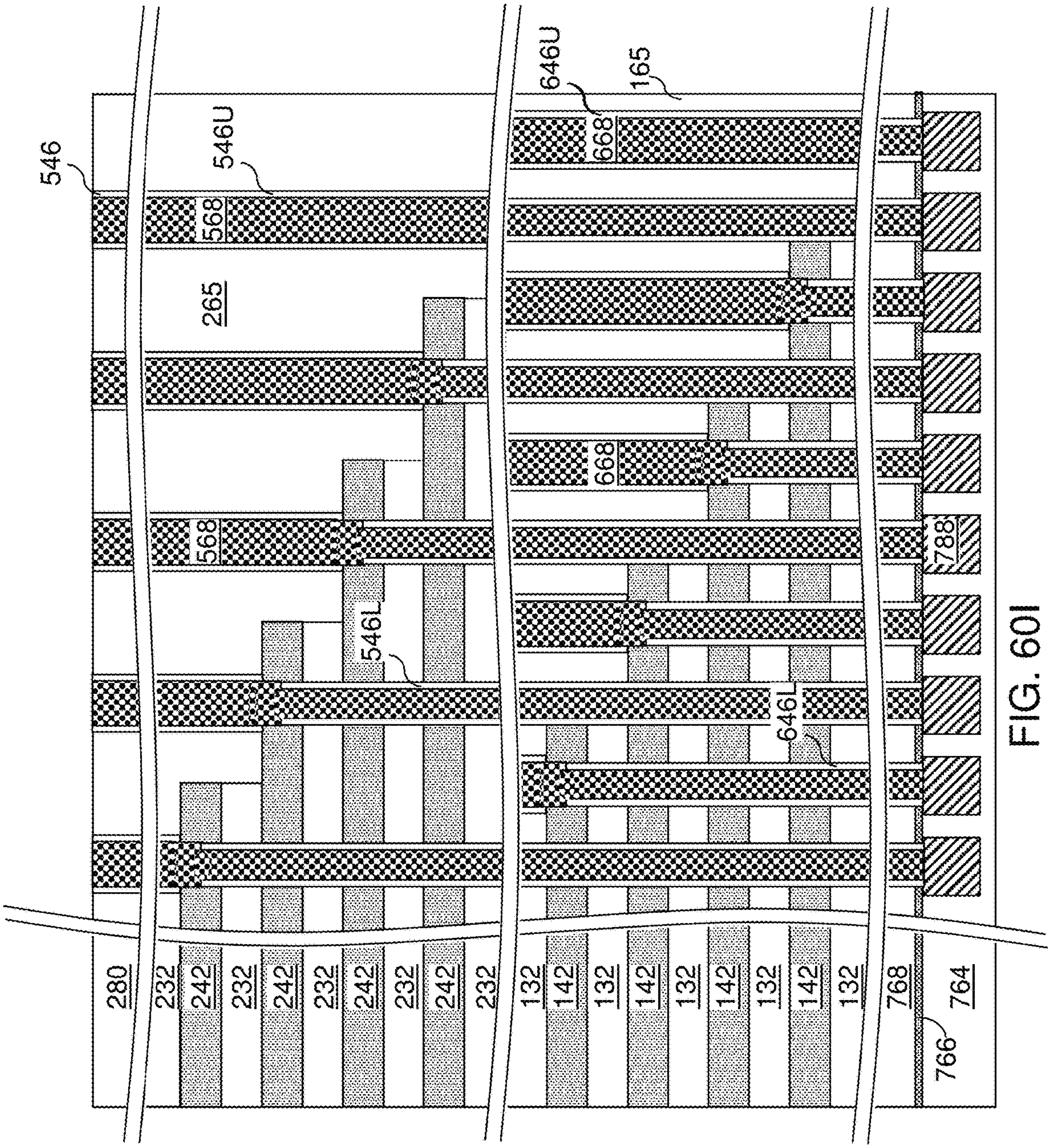

Referring to FIG. 60I, at least one conductive material in the inter-tier stepped via cavities 545 and directly on physically exposed top surfaces of lower-level metal interconnect structure 780 (such as top surfaces of the topmost lower-level metal line structure 788). The at least one conductive material may include a metallic liner material and a metal fill material. In one embodiment, the metallic liner material may include a conductive metal nitride such as TiN, and the metal fill material may include a metal such as tungsten, cobalt, molybdenum, or copper. Excess portions of the at least one conductive material may be removed from above the top surface of the first contact level dielectric layer 280 by a planarization process, which may use a recess etch and/or chemical mechanical planarization (CMP). Each remaining portion of the at least one conductive material that fills a respective inter-tier stepped via cavity 545 constitutes a conductive via structure, which is herein referred to as a first conductive via structure 668.

Figure 60J:
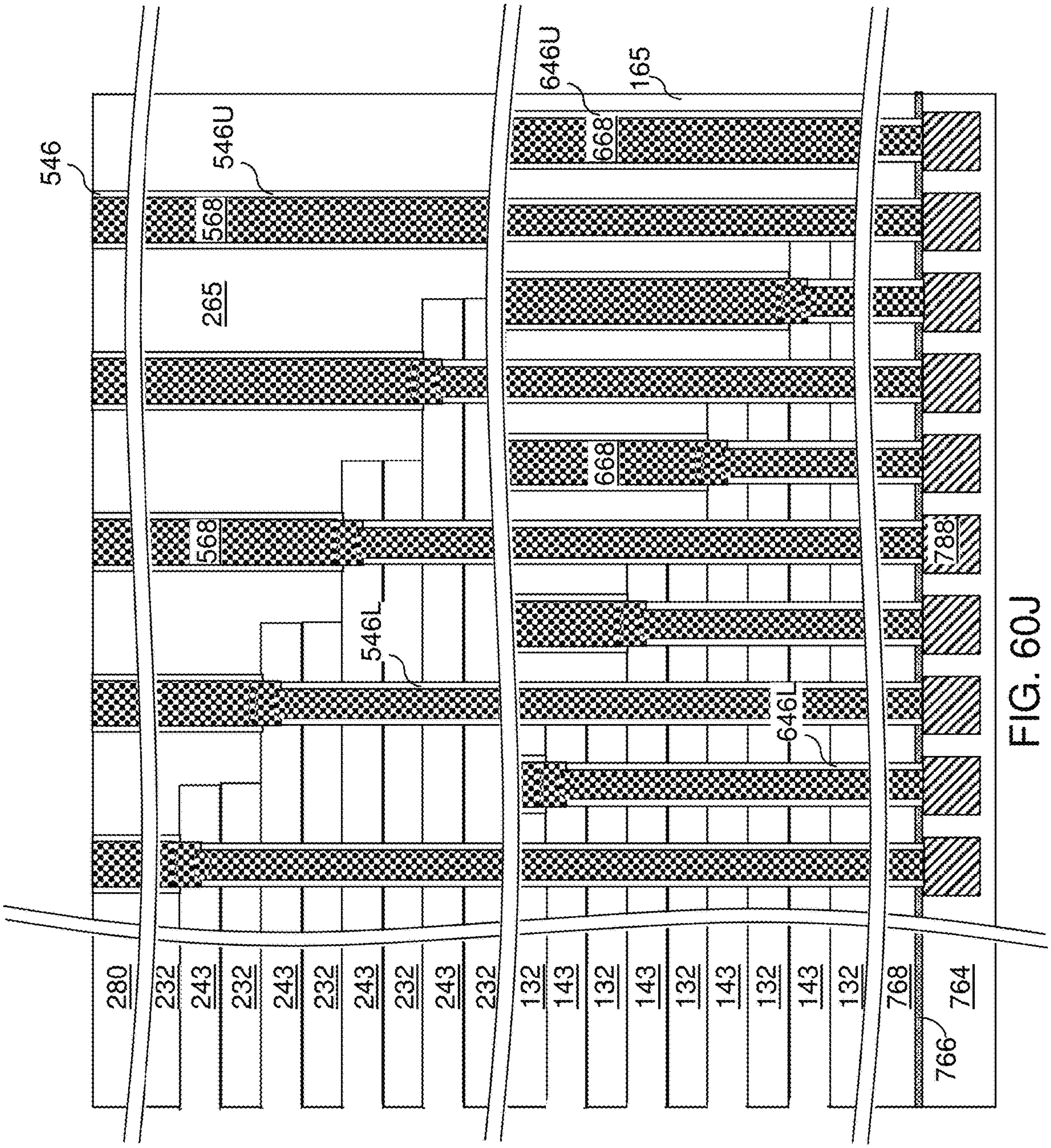

Referring to FIG. 60J, the processing steps of FIGS. 20A and 20B, 21A-21E, 22, and 23 may be performed to form backside trenches 79, to replace the in-process source-level material layers 10' with source-level material layers 10, and to form first backside recesses 143 and the second backside recesses 243. A cylindrical sidewall surface, and optionally an annular bottom surface, of a first conductive via structure 668 is physically exposed within each second backside recess 243. A cylindrical sidewall surface, and optionally an annular bottom surface, of a second conductive via structure 568 is physically exposed within each first backside recess 143.

Figure 60K:
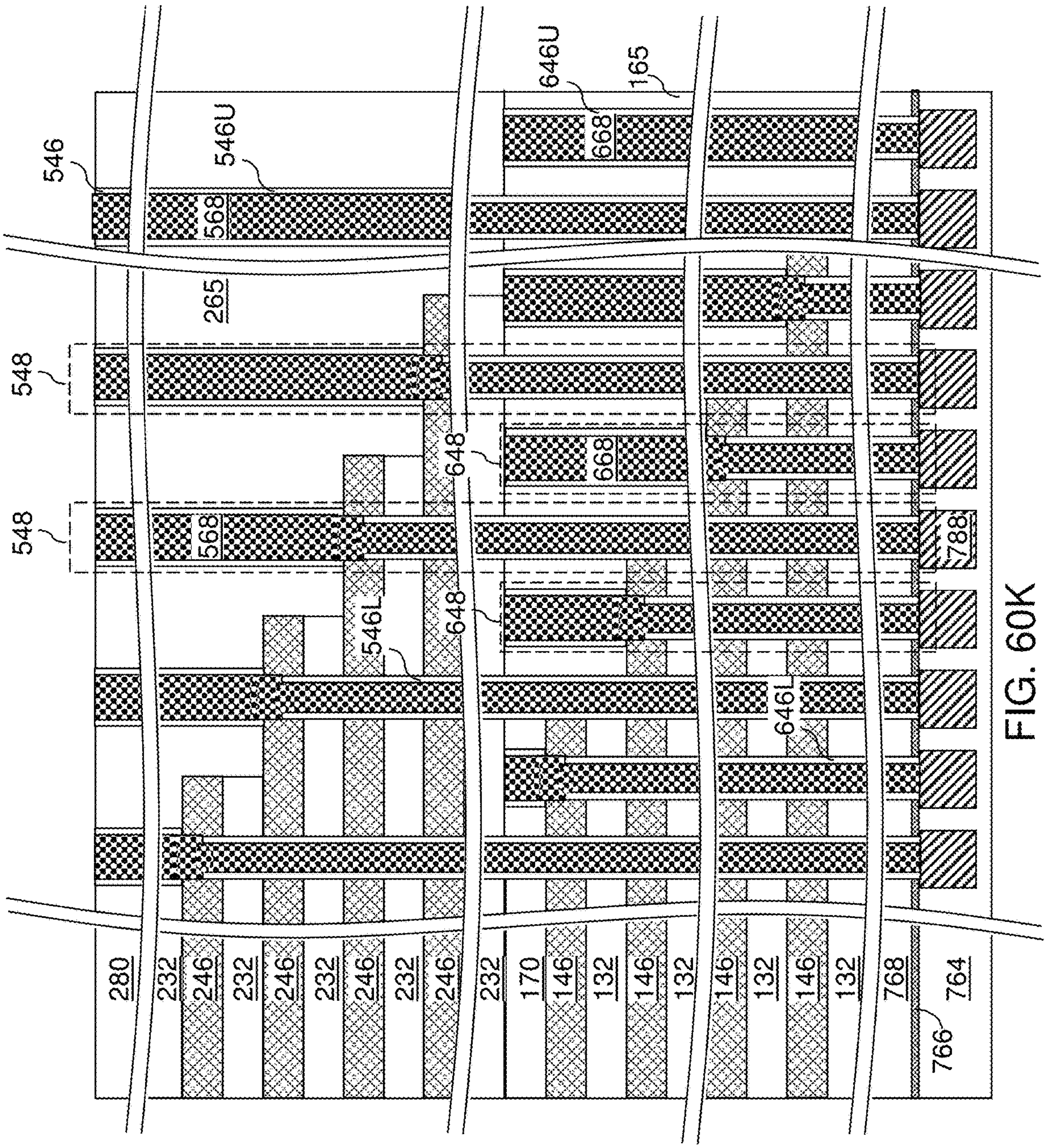
Figure 60L:
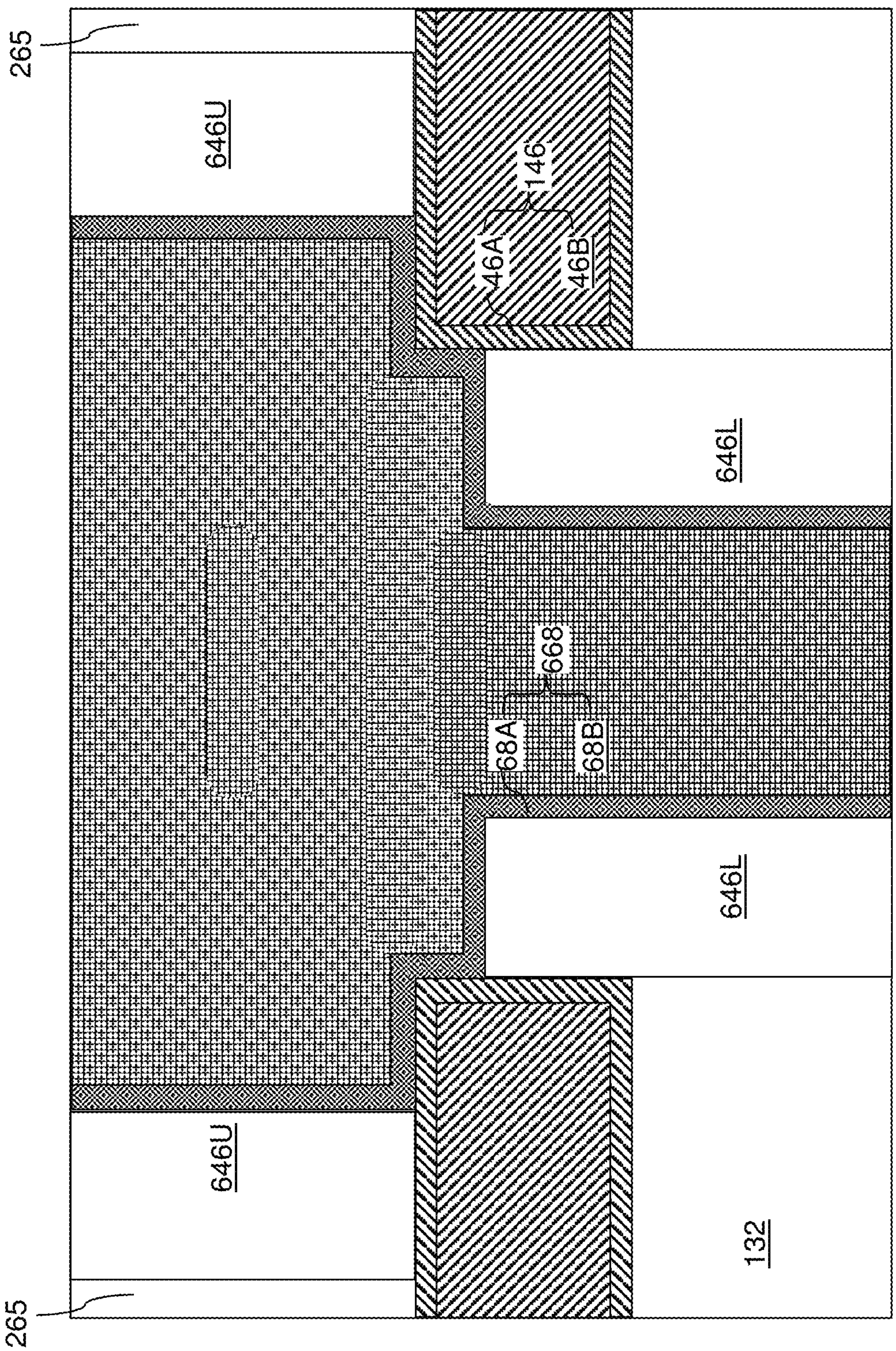
FIG. 60L is a magnified view of a contact region of a laterally-insulated staircase region via structure of FIG. 60K.

Referring to FIGS. 60K and 60L, the processing steps of FIGS. 24 and 25A-25E may be performed to deposit at least one conductive material in the first and second backside recesses (143, 243). The at least one conductive material fills the first backside recesses 143 to form first electrically conductive layers 146, and fills the second backside recesses 243 to form second electrically conductive layers 246. Each of the first electrically conductive layers 146, and the second electrically conductive layers 246 may include a metallic nitride liner 46A and a metallic fill material portion 46B. The metallic nitride liner 46A may include TiN, TaN, and/or WN. The metallic fill material portion 46B may include W, Co, Mo, and/or Cu.

Each combination of a first conductive via structures 568, a first upper dielectric liner 546U, and a first lower dielectric liner 546L constitutes a first laterally-insulated staircase region via structure 548. The first conductive via structures 568 is electrically connected to only one of the second electrically conductive layers 246 and electrically isolated from all other second electrically conductive layer 246 and from the first electrically conductive layers 146. Each combination of a second conductive via structures 668, a first-tier upper dielectric liner 646U, and a first-tier lower dielectric liner 646L constitutes a second laterally-insulated staircase region via structure 648. The second conductive via structures 668 is electrically connected to only one of the first electrically conductive layers 146 and electrically isolated from all other first electrically conductive layers 146 and from the second electrically conductive layers 246.

Referring to all drawings and according to various embodiments of the present disclosure, a device structure is provided, which comprises: a first alternating stack (132, 146) of first insulating layers 132 and first electrically conductive layers 146 located over a substrate 8 and including first stepped surfaces in a staircase region 200; a first retro-stepped dielectric material portion 165 overlying the first stepped surfaces of the first alternating stack (132, 146); a second alternating stack of second insulating layers 232 and second electrically conductive layers 246 located over the first alternating stack (132, 146) and including second stepped surfaces in the staircase region 200; a second retro-stepped dielectric material portion 265 overlying the second stepped surfaces of the second alternating stack (232, 246); and a first laterally-insulated staircase region via structure 548 vertically extending through, and contacting, a first subset of the second insulating layers 232 of the second alternating stack (232, 246), the first retro-stepped dielectric material portion 165, and a first subset of the first insulating layers 132 of the first alternating stack (132, 146) (and may contact one or more of the first electrically conductive layers 146), wherein the first laterally-insulated staircase region via structure 548 comprises a first conductive via structure 568 that is electrically connected to one of the second electrically conductive layers 246, and is electrically isolated from each of the first electrically conductive layers 146.

In one embodiment, areas of horizontal surfaces of the second stepped surfaces overlap with areas of horizontal surfaces of the first stepped surfaces in a plan view along a direction (e.g., a vertical direction when the exemplary structures are in an upright position) that is perpendicular to parallel horizontal surfaces of the first insulating layers 132, the first electrically conductive layers 146, the second insulating layers 242, and the second electrically conductive layers 246.

In one embodiment, vertical steps of the second stepped surfaces are laterally offset relative to vertical steps of the first stepped surfaces along a horizontal direction (such as a horizontal direction corresponding to the first horizontal direction hd1 in FIG. 9B) that is perpendicular to a horizontal direction (such as a horizontal direction corresponding to the second horizontal direction hd2 in FIG. 9B) along which the vertical steps of the second stepped surfaces laterally extend.

In one embodiment, the device structure comprises a lower-level metal interconnect structure 780 formed within a lower-level dielectric material layer 760 that is located between the substrate 8 and the first alternating stack (132, 146), wherein a bottom surface of the first conductive via structure 568 contacts the lower-level metal interconnect structure 780.

In one embodiment, the first conductive via structure 568 comprises: an upper conductive via portion extending through the second retro-stepped dielectric material portion 265 and overlying the one of the second electrically conductive layers 246; and a lower conductive via portion extending from a level of the one of the second electrically conductive layers 246 at least to a bottommost layer of the first alternating stack (132, 146) and having a lesser lateral extent than the upper conductive via portion.

In one embodiment, the first laterally-insulated staircase region via structure 548 comprises: an upper dielectric liner 546U laterally surrounding the upper conductive via portion and contacting a sidewall of the second retro-stepped dielectric material portion 265; and a lower dielectric liner 546L laterally surrounding the lower conducive via portion and contacting the first subset of the second insulating layers 232 of the second alternating stack (232, 246), the portion of the first retro-stepped dielectric material portion 165, and the first subset of the first insulating layers 132 of the first alternating stack (132, 146), wherein the lower dielectric liner 546L is disjoined from the upper dielectric liner 546U (i.e., not in direct contact with the upper dielectric liner 546U).

In one embodiment, the device structure comprises a second laterally-insulated staircase region via structure 446 vertically extending through, and contacting, the second retro-stepped dielectric material portion 265, a second subset of the second insulating layers 232 of the second alternating stack (232, 246), the first retro-stepped dielectric material portion 165, and a second subset of the first insulating layers 132 of the first alternating stack (132, 146), wherein the second laterally-insulated staircase region via structure 446 comprises a second conductive via structure 468 that is electrically connected to one of the first electrically conductive layers 146, and is electrically isolated from each of the second electrically conductive layers 246. In one embodiment, a topmost surface of the first laterally-insulated staircase region via structure 546 and a topmost surface of the second laterally-insulated staircase region via structure 446 are located within a same horizontal plane (such as the horizontal plane including the top surface of the first contact level dielectric layer 280).

In one embodiment, the device structure comprises a second laterally-insulated staircase region via structure 646 vertically extending through, and contacting, the first retro-stepped dielectric material portion 165 and a second subset of the first insulating layers 132 of the first alternating stack (132, 146), wherein: the second laterally-insulated staircase region via structure 646 comprises a second conductive via structure 668 that is electrically connected to one of the first electrically conductive layers 146; and a topmost surface of the second laterally-insulated staircase region via structure 646 underlies the second alternating stack (132, 246) (which may be located within a horizontal plane including a bottommost surface of the second alternating stack (232, 246).

In one embodiment, the one of the first electrically conductive layers 146 comprises a metallic nitride liner 46A formed around a metallic fill material portion 46B; the second conductive via structure 668 comprises contact via metallic liner 68A formed around a contact via metal fill portion 68B; an annular horizontal surface of the metallic nitride liner 46A contacts an annular horizontal surface of the contact via metallic liner 68A; and a concave cylindrical surface of the metallic nitride liner 46A contacts a convex cylindrical surface of the contact via metallic liner 68A.

In one embodiment, each of the second conductive via structure 668 and the one of the first electrically conductive layers 146 comprises a respective portion of a metallic nitride liner 46A that continuously extends across the second conductive via structure 668 and the one of the first electrically conductive layers 146 with a homogeneous material composition throughout; and each of the second conductive via structure 668 and the one of the first electrically conductive layers 146 comprises a respective segment of a metallic fill material portion 46B that is formed within the metallic nitride liner 46A.

The various embodiments disclose structures and methods for forming the structures to decrease the area of the staircase region (i.e., region of stepped surfaces). In particular, in multi-tiered structure having at least an upper region of stepped surfaces stacked on top of a lower region of stepped surfaces. In various disclosed embodiments the region of stepped surfaces may be decreased by half without decreasing the width of each region of stepped surfaces. In some embodiments, by forming the upper stepped surfaces in an area having an areal overlap with the lower stepped surfaces may provide the advantage of reducing the total area of a semiconductor die that is used to form stepped surfaces and layer-contact via structures.

Figure 61B:
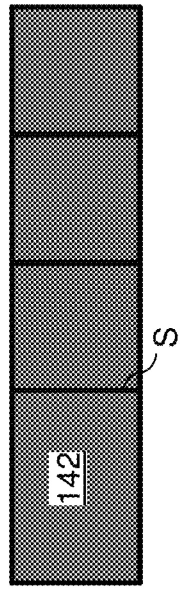
FIG. 61B is a see-through top-down view of region B of FIG. 61A.
Figure 61A:
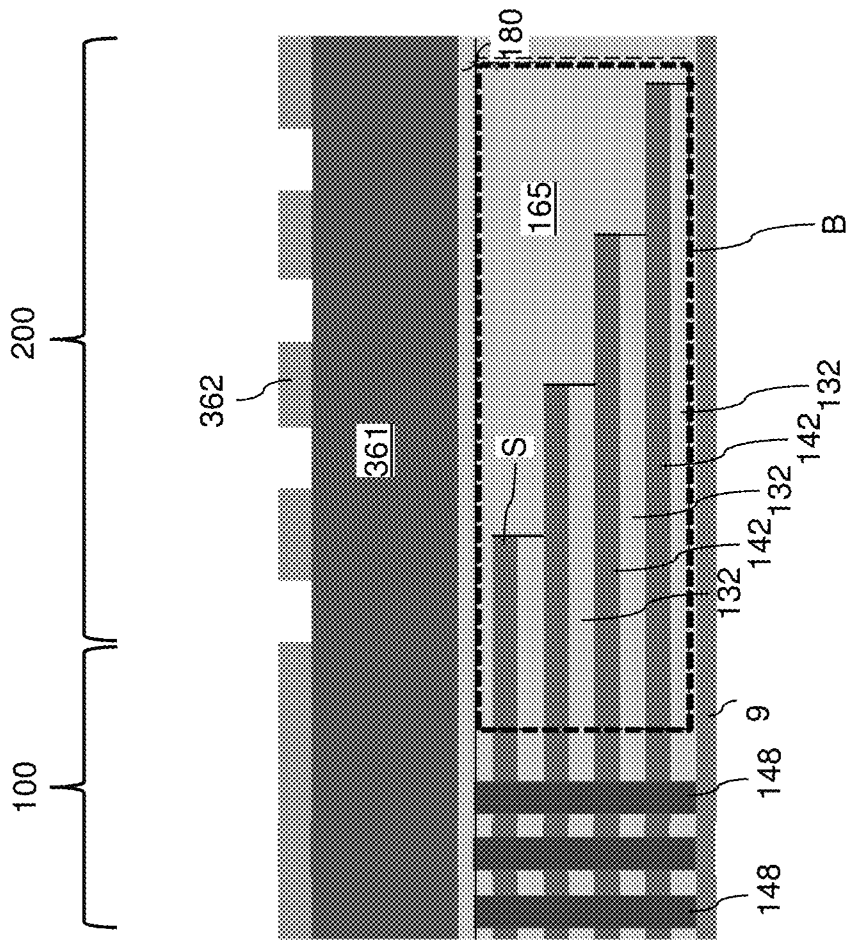
FIG. 61A is a vertical cross-sectional view of a region of a sixth exemplary structure after application of a first patterning film and formation of a first patterned photoresist layer according to an embodiment of the present disclosure.

FIGS. 61A and 61B illustrate a sixth exemplary structure after according to a sixth embodiment of the present disclosure. In this embodiment, the peripheral semiconductor devices 710 in the peripheral device region 700 may be located next to and/or between the alternating stacks {(132, 146), (232, 246)} instead of or in addition to below the alternating stacks. In this embodiment, the source level material layers 10 may be omitted if desired, and in one aspect, the alternating stacks may be located directly on the substrate semiconductor layer 9 of the substrate 8. The sixth exemplary structure shown in FIGS. 61A and 61B may be derived from the first exemplary structure of FIG. 7 by forming a first patterning film 361 and a first patterned photoresist layer 362 on a top surface of the inter-tier dielectric layer 180. The first patterning film 361 can include a carbon-based film that can subsequently function as an etch mask layer. For example, the first patterning film 361 can include Advanced Patterning Film (APF) available from Applied Materials, Inc. The thickness of the first patterning film 361 can be in a range from 100 nm to 600 nm, although lesser and greater thicknesses can also be employed.

The first photoresist layer 362 is applied over the first patterning film 361, and is lithographically patterned to form an array of openings in staircase region 200 overlying the first stepped surfaces of the first alternating stack (132, 142). Each opening in the first photoresist layer 362 may be formed within the area of a respective underlying horizontal surface, which is contained within the first stepped surfaces and located between a neighboring pair of vertical steps S in the first stepped surfaces.

Figure 62B:
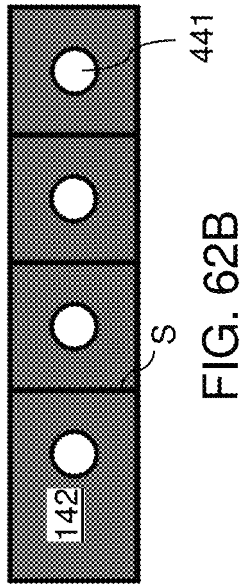
FIG. 62B is a see-through top-down view of region B of FIG. 62A.
Figure 62A:
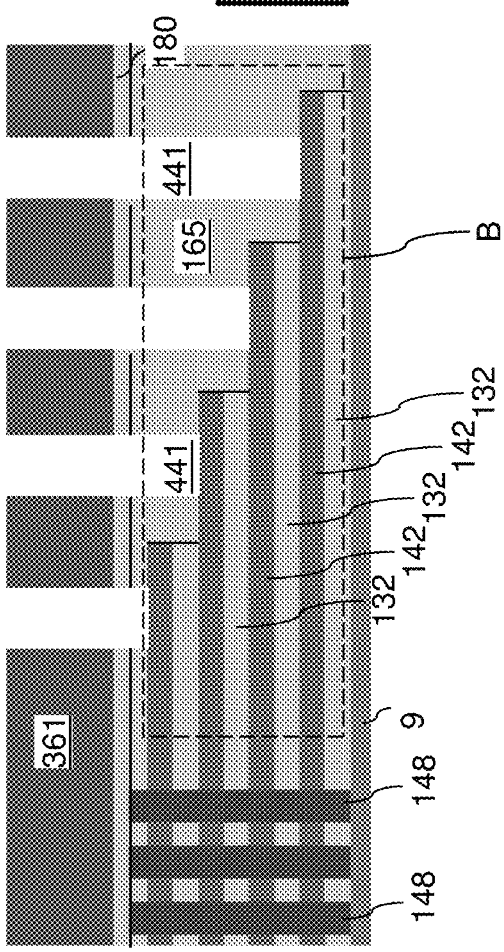
FIG. 62A is a vertical cross-sectional view of a region of the sixth exemplary structure after formation of first-tier via cavities according to an embodiment of the present disclosure.

Referring to FIGS. 62A and 62B, an anisotropic etch that etches the materials of the first patterning film 361, the inter-tier dielectric layer 180, and the first retro-stepped dielectric material portion 165 selective to the material of the first sacrificial material layers 142 may be performed to form first-tier via cavities 441. The first-tier via cavities 441 extend through the inter-tier dielectric layer 180 and the first retro-stepped dielectric material portion 165 underneath the openings in the first photoresist layer 362. A top surface of a respective first sacrificial material layer 142 can be physically exposed at the bottom of each first-tier via cavity 441. The first photoresist layer 362 can be consumed during the anisotropic etch process, or can removed after the anisotropic etch process.

Figure 63B:
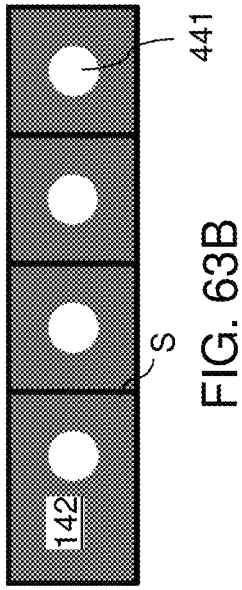
FIG. 63B is a see-through top-down view of region B of FIG. 63A.
Figure 63A:
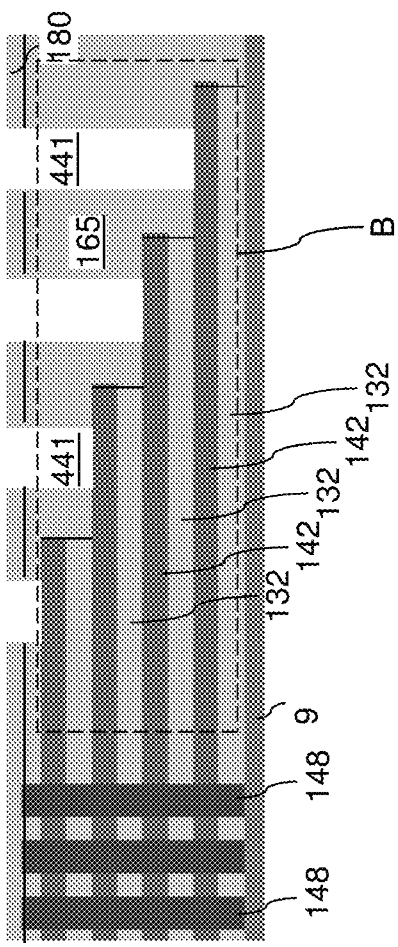
FIG. 63A is a vertical cross-sectional view of a region of the sixth exemplary structure after removal of the first patterning film according to an embodiment of the present disclosure.

Referring to FIGS. 63A and 63B, the first patterning film 361 can be removed selective to the inter-tier dielectric layer 180, for example, by ashing. Each first-tier via cavity 441 may vertically extend from a top surface of the inter-tier dielectric layer 180 to a top surface of a respective one of the first sacrificial material layers 142.

Figure 64B:
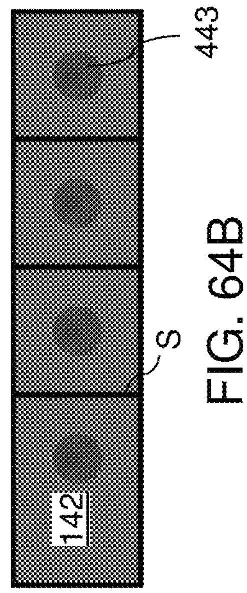
FIG. 64B is a see-through top-down view of region B of FIG. 64A.
Figure 64A:
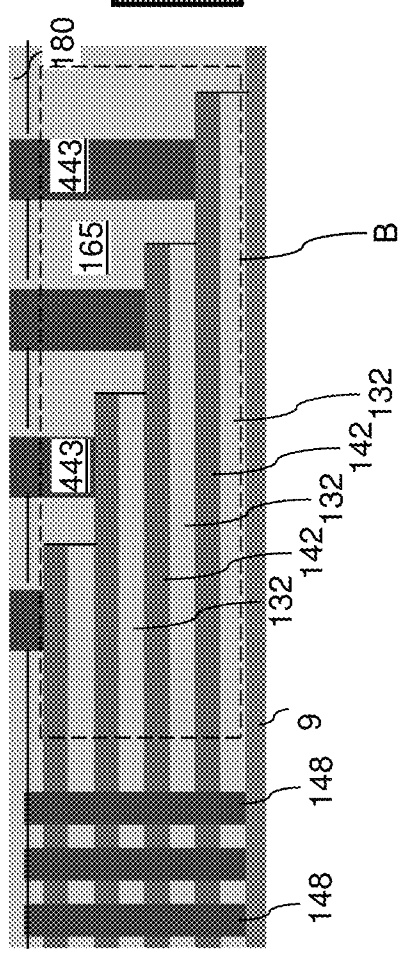
FIG. 64A is a vertical cross-sectional view of a region of the sixth exemplary structure after formation of sacrificial via fill structures according to an embodiment of the present disclosure.

Referring to FIGS. 64A and 64B, first sacrificial via fill structures 443 are formed in the first-tier via cavities 441. The first sacrificial via fill structures 443 may be formed by depositing a first sacrificial via fill material within the first-tier via cavities 441 and by removing excess portions of the first sacrificial via fill material from above the horizontal plane including the top surface of the inter-tier dielectric layer 180 by a planarization process, which may use chemical mechanical planarization (CMP) or a recess etch. The first sacrificial via fill material includes a material that may be removed selective to the materials of the inter-tier dielectric layer 180, the first retro-stepped dielectric material portion 165, and the first sacrificial material layers 142. For example, the first sacrificial via fill material may include amorphous silicon, polysilicon, a silicon-germanium alloy, organosilicate glass, amorphous carbon, diamond-like carbon, an organic polymer, or a silicon-based polymer. In an illustrative example, the sacrificial fill material may include amorphous silicon or amorphous carbon.

Figure 65C:
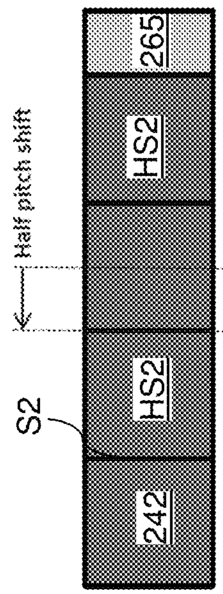
FIG. 65C is a see-through top-down view of region C of FIG. 65A.
Figure 65B:
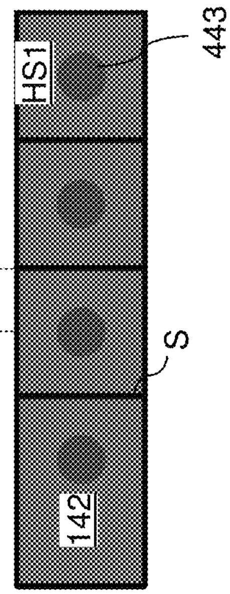
FIG. 65B is a see-through top-down view of region B of FIG. 65A.
Figure 65A:
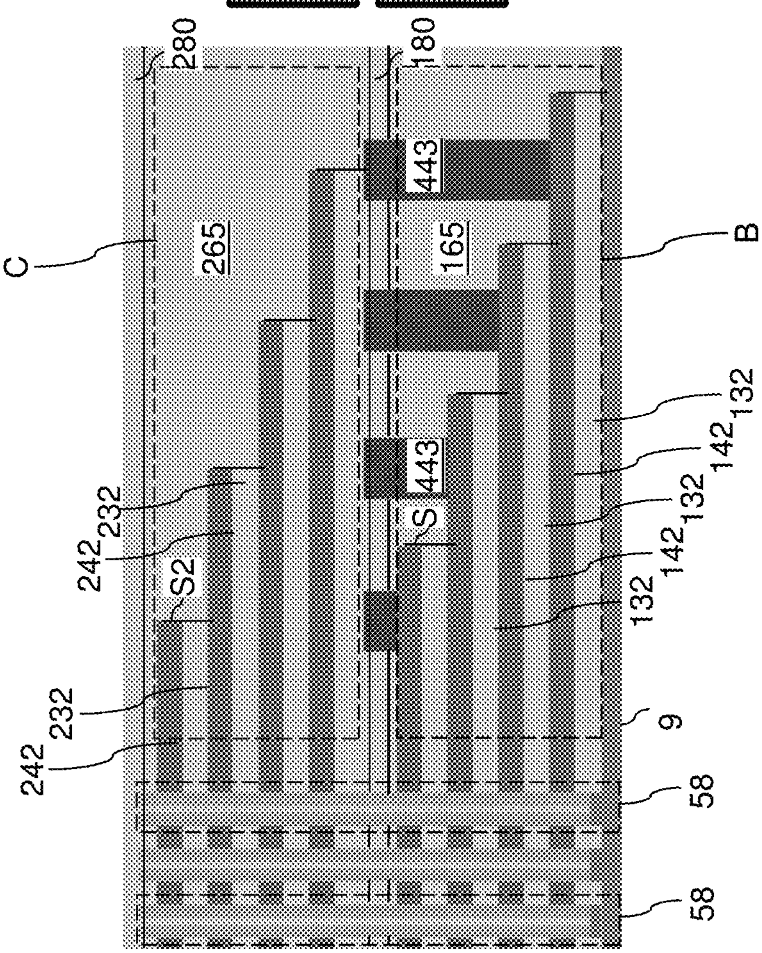
FIG. 65A is a vertical cross-sectional view of a region of the sixth exemplary structure after formation of a second alternating stack of second insulating layers and second sacrificial material layers, second stepped surfaces, and a second retro-stepped dielectric material portion according to an embodiment of the present disclosure.

Referring to FIGS. 65A-65C, the processing steps of FIG. 8 may be subsequently performed the exemplary structure to form a second alternating stack (232, 242), a second insulating cap layer 280, second stepped surfaces, and a second retro-stepped dielectric material portion 265.

According to an aspect of the present disclosure, the pattern of the second stepped surfaces in the staircase region 200 may be selected such that areas of horizontal surfaces HS2 of the second stepped surfaces overlap with areas of horizontal surfaces HS1 of the first stepped surfaces in a plan view. The plan view is a view along a direction that is perpendicular to horizontal surfaces (HS1, HS2) of the first insulating layers 132, the first sacrificial material layers 142, the second insulating layers 232, and the second sacrificial material layers 242. In one embodiment, the locations of the vertical steps S2 in the second stepped surfaces may overlap with a respective column of first sacrificial via fill structures 443. In other words, the edges (i.e., S2) of the steps in the second alternating stack are located in vertical planes that extend through the first sacrificial via fill structures 443 in the first alternating stack. Forming the second stepped surfaces in an area having an areal overlap with the first stepped surfaces may provide the advantage of reducing the total area of a semiconductor die that is used to form stepped surfaces and layer-contact via structures.

In one embodiment, the vertical steps S of the first stepped surfaces of the first alternating stack (132, 142) can have a uniform pitch along the horizontal direction (e.g., word line horizontal direction hd1) that is perpendicular to the lengthwise direction of the vertical steps S of the first stepped surfaces. The vertical steps S2 of the second stepped surfaces of the second alternating stack (232, 242) can have the uniform pitch along the same horizontal direction hd1. Vertical steps S2 of the second stepped surfaces can be laterally offset relative to vertical steps S of the first stepped surfaces along the word line horizontal direction hd1. In one embodiment, the vertical steps S2 of the second stepped surfaces of the second alternating stack (232, 242) can be laterally offset (i.e., shifted) from the vertical steps S of the first stepped surfaces of the first alternating stack (132, 142) by one half of the uniform pitch along the horizontal direction. Other offset amounts may also be used.

The processing steps of FIGS. 8A and 8B may be subsequently performed to form an optional second insulating cap layer 270 and optional drain-select-level isolation structures 72. The processing steps of FIGS. 9A and 9B, 10A and 10B, 11A-11D, and 12 may be performed to form memory openings 49 and memory opening fill structures 58. A first contact level dielectric layer 280 may be formed over the second insulating cap layer 270 and the memory opening fills structures 58 in the same manner as in the first embodiment.

Figures 66A, 66B, 66C:
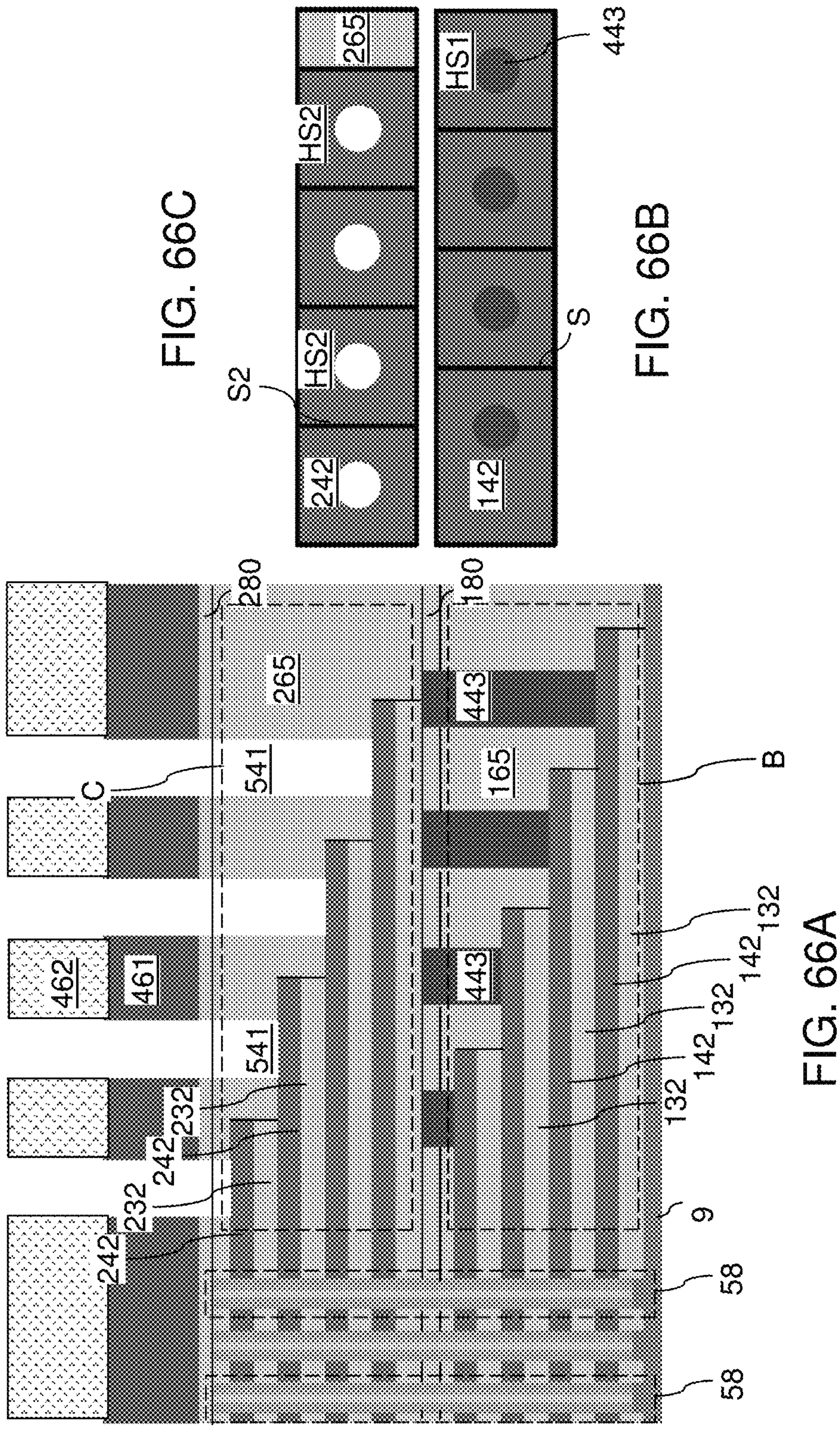
FIG. 66A is a vertical cross-sectional view of a region of the sixth exemplary structure after formation of second-tier via cavities according to an embodiment of the present disclosure.
FIG. 66B is a see-through top-down view of region B of FIG. 66A.
FIG. 66C is a see-through top-down view of region C of FIG. 66A.

Referring to FIGS. 66A-66C, a second patterning film 461 and a second patterned photoresist layer 462 can be formed on a top surface of the first contact level dielectric layer 280. The second patterning film 461 can include a carbon-based film that can subsequently function as an etch mask layer. For example, the second patterning film 461 can include Advanced Patterning Film (APF) available from Applied Materials, Inc. The thickness of the second patterning film 461 can be in a range from 200 nm to 600 nm, although lesser and greater thicknesses can also be employed.

The second photoresist layer 462 is applied over the second patterning film 461, and is lithographically patterned to form an array of openings in staircase region 200 overlying the second stepped surfaces (i.e., horizontal surfaces HS2) of the second alternating stack (232, 242). Each opening in the second photoresist layer 462 may be formed within the area of a respective underlying horizontal surface, which is contained within the second stepped surfaces and located between a neighboring pair of vertical steps S2 in the second stepped surfaces.

An anisotropic etch that etches the materials of the second patterning film 461, the first contact level dielectric layer 280, and the second retro-stepped dielectric material portion 265 selective to the material of the second sacrificial material layers 242 may be performed to form second-tier via cavities 541. The second-tier via cavities 541 extend through the first contact level dielectric layer 280 and the second retro-stepped dielectric material portion 265 underneath the openings in the second photoresist layer 462. A top horizontal surface HS2 of a second sacrificial material layer 242 can be physically exposed at the bottom of each second-tier via cavity 541. The second photoresist layer 462 can be consumed during the anisotropic etch process, or can removed after the anisotropic etch process.

Figures 67A, 67B, 67C:
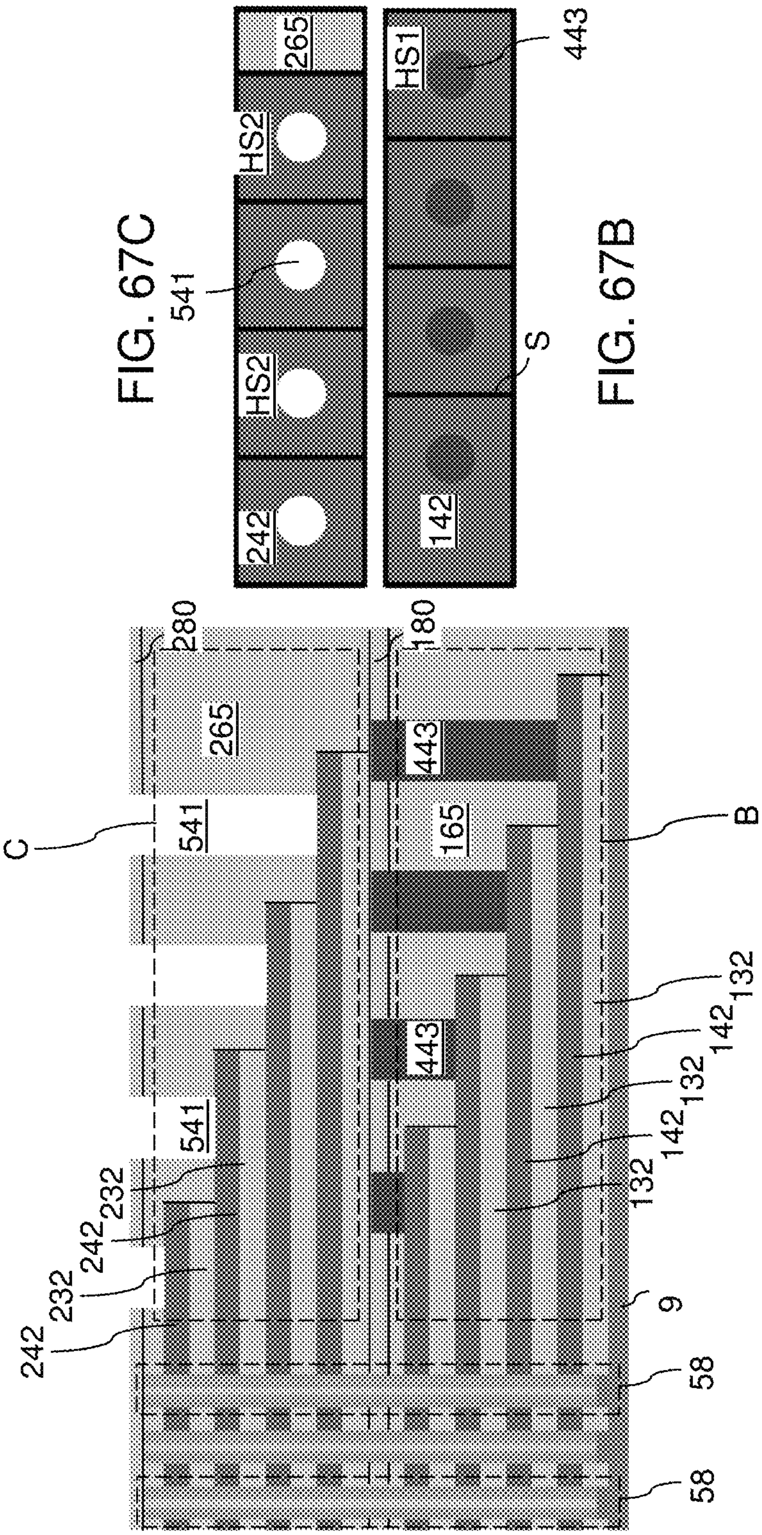
FIG. 67A is a vertical cross-sectional view of a region of the sixth exemplary structure after removal of a second patterning film according to an embodiment of the present disclosure.
FIG. 67B is a see-through top-down view of region B of FIG. 67A.
FIG. 67C is a see-through top-down view of region C of FIG. 67A.

Referring to FIGS. 67A-67C, the second patterning film 461 can be removed selective to the first contact level dielectric layer 280, for example, by ashing. Each second-tier via cavity 541 may vertically extend from a top surface of the first contact level dielectric layer 280 to a top horizontal surface HS2 of a respective one of the second sacrificial material layers 242.

Figures 68A, 68B, 68C:
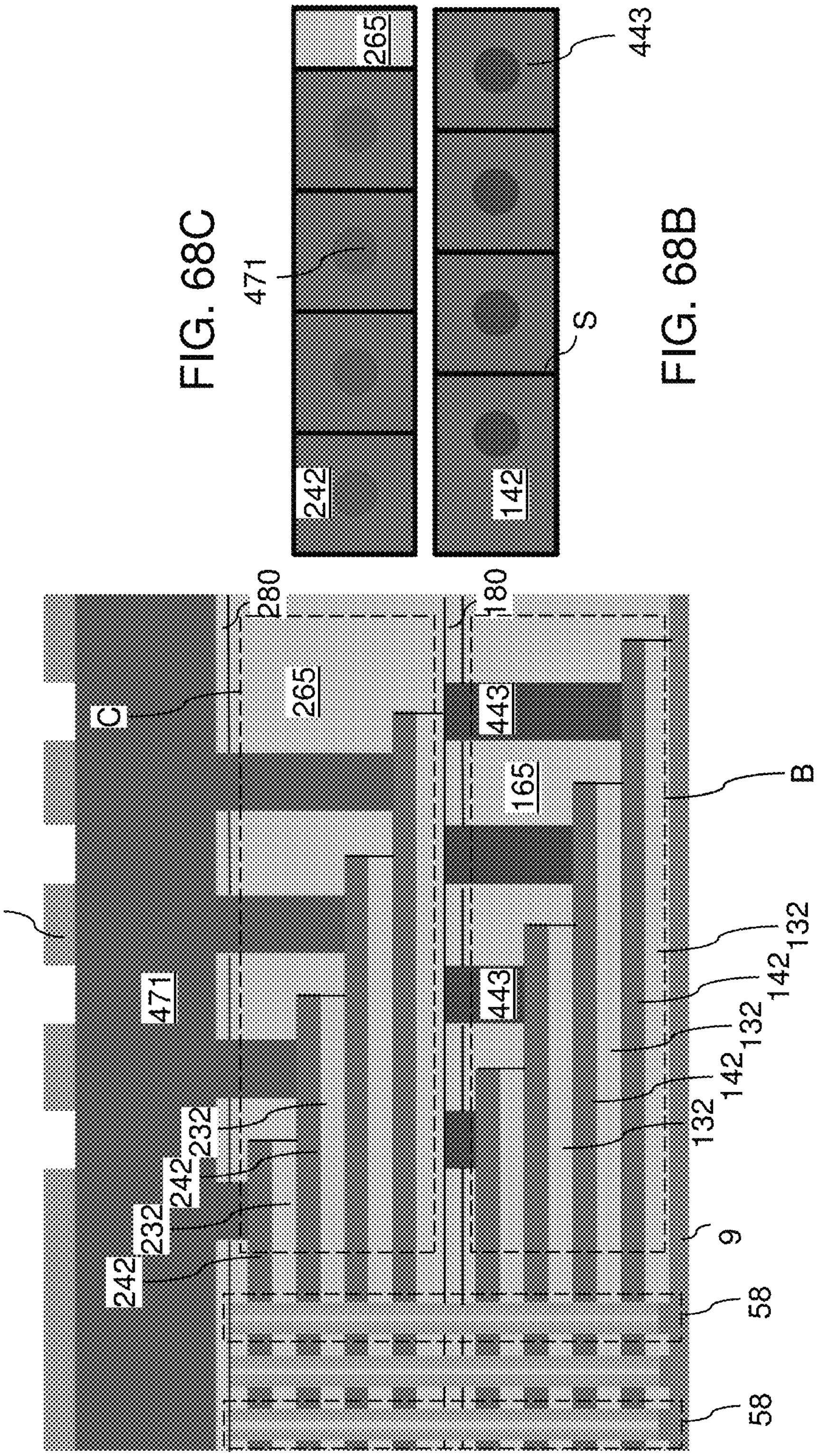
FIG. 68A is a vertical cross-sectional view of a region of the sixth exemplary structure after application of a third patterning film and formation of a third patterned photoresist layer according to an embodiment of the present disclosure.
FIG. 68B is a see-through top-down view of region B of FIG. 68A.
FIG. 68C is a see-through top-down view of region C of FIG. 68A.

Referring to FIGS. 68A-68C, a third patterning film 471 and a third patterned photoresist layer 472 can be subsequently formed. The third patterning film 471 fills the second-tier via cavities 541 and provides a planar top surface that overlies the first contact level dielectric layer 280. The third patterning film 471 can include a carbon-based film that can subsequently function as an etch mask layer. For example, the third patterning film 471 can include Advanced Patterning Film (APF) available from Applied Materials, Inc. The thickness of the third patterning film 471 can be in a range from 200 nm to 700 nm, although lesser and greater thicknesses can also be employed.

The third photoresist layer 472 is applied over the third patterning film 471, and is lithographically patterned to form an array of openings. The pattern of the openings in the third photoresist layer 472 can be identical to the pattern of openings in the first photoresist layer 362 as described above. Thus, each opening in the third photoresist layer 472 may be formed directly above a respective underlying one of the first sacrificial via fill structures 443. Each opening in the third photoresist layer 472 can be laterally offset from volumes of the second-tier via cavities 541.

Figure 69C:
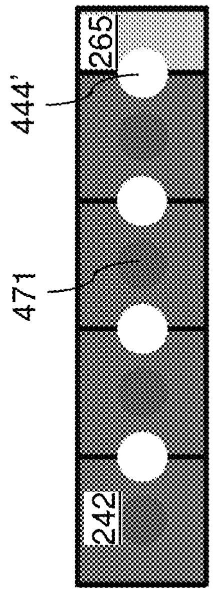
FIG. 69C is a see-through top-down view of region C of FIG. 69A.
Figure 69B:
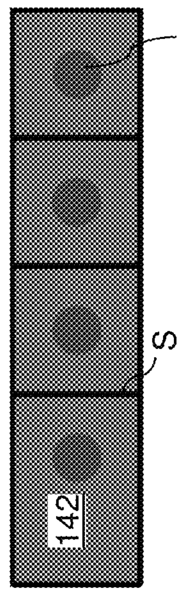
FIG. 69B is a see-through top-down view of region B of FIG. 69A.
Figure 69A:
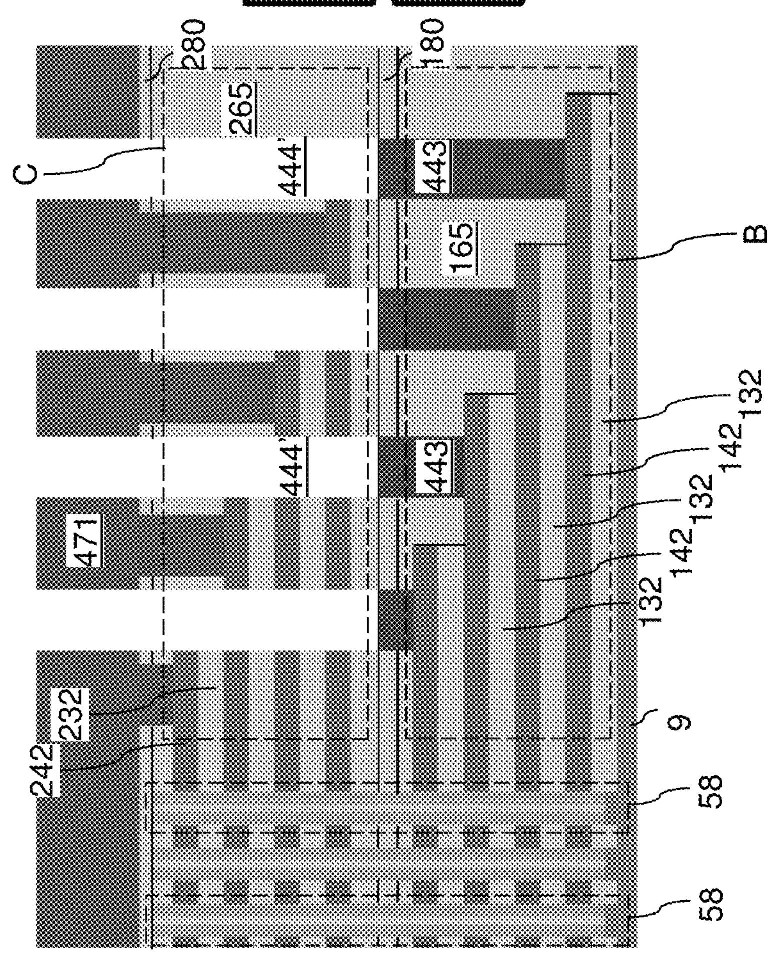
FIG. 69A is a vertical cross-sectional view of a region of the sixth exemplary structure after formation of extension via cavities according to an embodiment of the present disclosure.

Referring to FIGS. 69A-69C, an anisotropic etch process can be performed to etch through unmasked portions of the third patterning film 471, the first contact level dielectric layer 280, the second retro-stepped dielectric material portion 265, the second insulating layers 232, and the second sacrificial material layers 242 that underlie the openings in the third photoresist layer 472. Optionally, the terminal portion of the anisotropic etch process can be selective to the material of the sacrificial via fill structures 443. Extension via cavities 444' can be formed underneath each opening in the third photoresist layer 472 through the third patterning film 471, the first contact level dielectric layer 280, the second retro-stepped dielectric material portion 265, the second insulating layers 232, and the second sacrificial material layers 242 and directly onto a top surface of a respective one of the sacrificial via fill structures 443. A top surface of a sacrificial via fill structures 443 can be physically exposed at the bottom of each extension via cavity 444'. Each extension via cavity 444' can be formed through the second retro-stepped dielectric material portion 265 and through a subset of layers of the second alternating stack (232, 242) on a top surface of a respective sacrificial via fill structure 443. The third photoresist layer 472 can be consumed during the anisotropic etch process, or can removed after the anisotropic etch process.

Figure 70C:
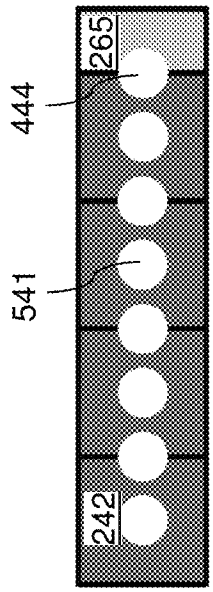
FIG. 70C is a see-through top-down view of region C of FIG. 70A.
Figure 70B:
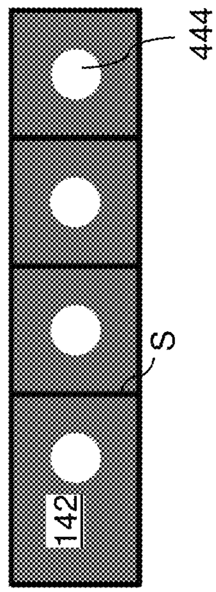
FIG. 70B is a see-through top-down view of region B of FIG. 70A.
Figure 70A:
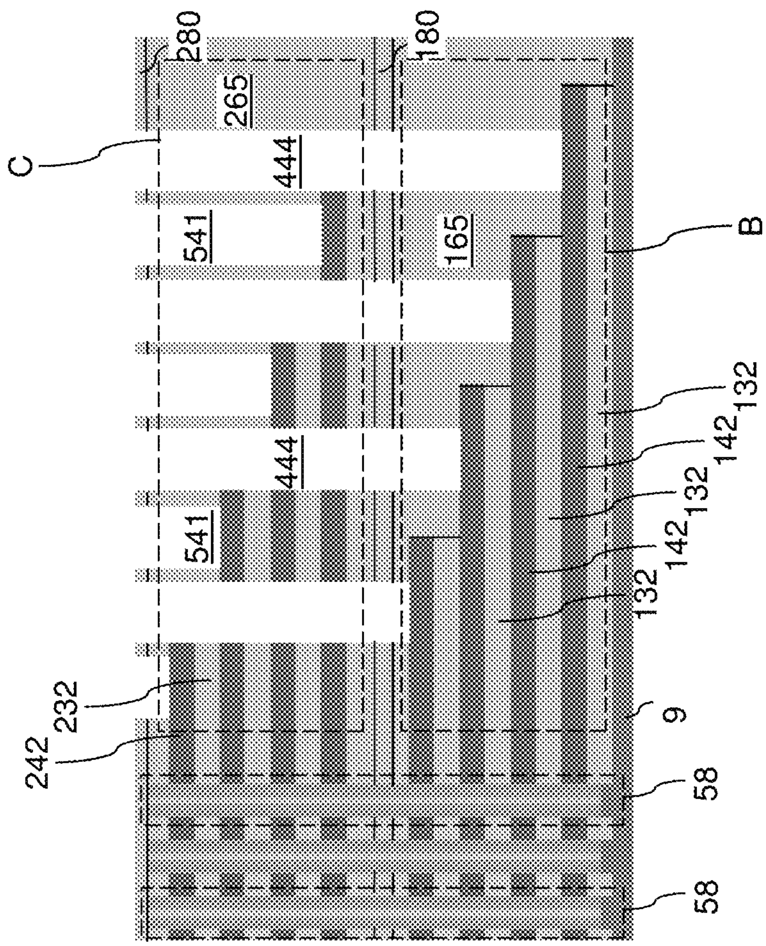
FIG. 70A is a vertical cross-sectional view of a region of the sixth exemplary structure after formation of inter-tier via cavities and removal of the third patterning film from the second-tier via cavities according to an embodiment of the present disclosure.

Referring to FIGS. 70A-70C, the third patterning film 471 can be removed selective to the first contact level dielectric layer 280 and the second retro-stepped dielectric material portion 265, for example, by ashing. The third patterning film 471 is removed from the volumes of the second-tier via cavities 541. Thus, voids are present within the volumes of the second-tier via cavities 541 and the extension via cavities 444'.

The sacrificial via fill structures 443 can be subsequently removed selective to the materials of the first contact-level dielectric layer 280, the second retro-stepped dielectric material portion 265, the second insulating layers 232, the second sacrificial material layers 242, the first retro-stepped dielectric material portion 165, and the first sacrificial material layers 142 by a selective etch process. For example, if the sacrificial via fill structures 443 include a semiconductor material such as amorphous silicon or polysilicon, a wet etch process using hot trimethyl-2 hydroxyethyl ammonium hydroxide ("hot TMY") or tetramethyl ammonium hydroxide (TMAH) may be performed to remove the sacrificial via fill structures 443. Each extension via cavity 444' can be vertically extended down to a top horizontal surface HS1 of an underlying first sacrificial material layer 142 to become an inter-tier via cavity 444. Each inter-tier via cavity includes a volume of an extension via cavity 444' and a volume of a sacrificial via fill structure 443. In one embodiment, an upper sidewall of an extension via cavity 444' and a lower sidewall of the extension via cavity 444' can have a lateral jog therebetween in the horizontal plane including an interface between the inter-tier dielectric layer 180 and a bottommost layer of the second alternating stack (232, 242), which may be the bottommost second insulating layer 232.

Figures 71A, 71B, 71C:
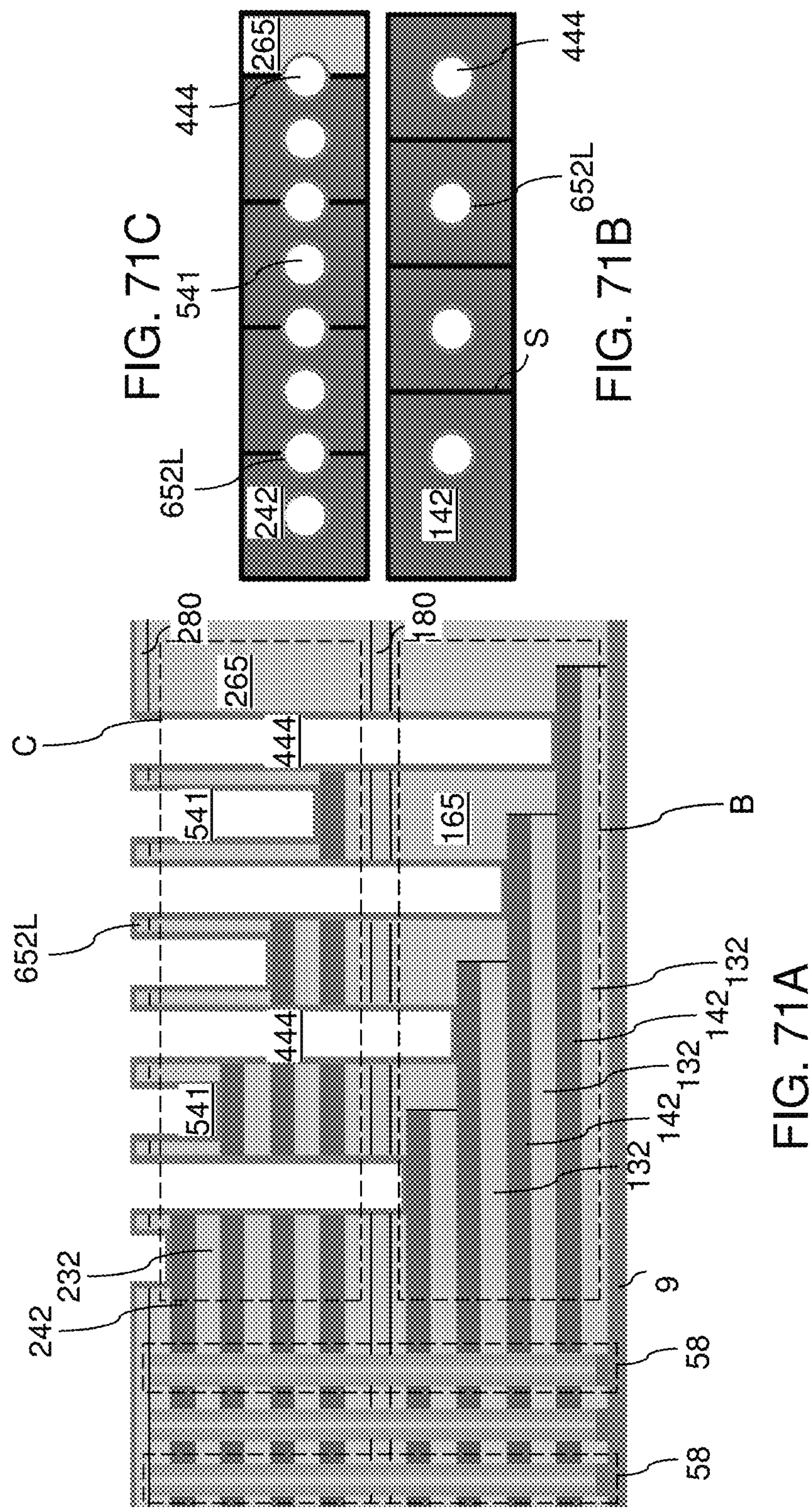

Referring to FIGS. 71A-71C, a continuous dielectric liner 652L can be deposited within the inter-tier via cavities 444 and the second-tier via cavities 541 and over the first contact level dielectric layer 280. The continuous dielectric liner 652L can be formed by conformal deposition of a dielectric material such as silicon oxide or a dielectric metal oxide (e.g., aluminum oxide). The continuous dielectric liner 652L may be deposited by a conformal deposition process such as low pressure chemical vapor deposition, and may have a thickness in a range from 2 nm to 20 nm, such as from 3 nm to 10 nm, although lesser and greater thicknesses may also be used. A horizontal portion of the continuous dielectric liner 652L can contact a horizontal top surface of each first sacrificial material layer 142 at the bottom of a respective inter-tier via cavity 444. A horizontal portion of the continuous dielectric liner 652L can contact a horizontal top surface of each second sacrificial material layer 242 at the bottom of a respective second-tier via cavity 541.

Figures 72A, 72B, 72C:
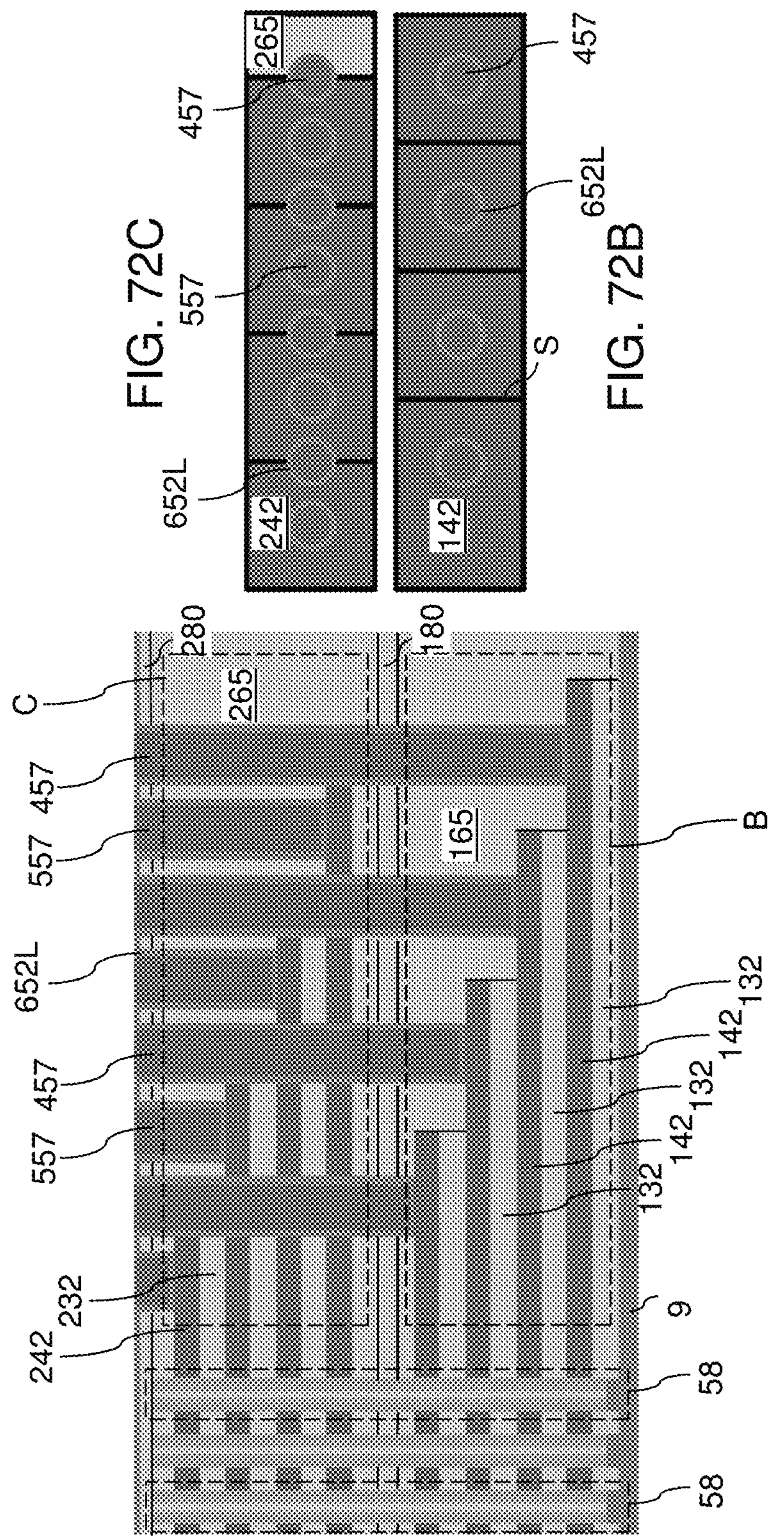

Referring to FIGS. 72A-72C in a first aspect of the sixth embodiment, a sacrificial via fill material may be deposited in unfilled volumes of the inter-tier via cavities 444 and the second-tier via cavities 541. The sacrificial via fill material is a material that is different from the material of the continuous dielectric liner 652L. In one embodiment, the sacrificial via fill material may be the same as, or may be different from, the materials of the first sacrificial material layers 142 and the second sacrificial material layers 242. For example, the sacrificial via fill material may include silicon nitride or a semiconductor material (such as amorphous silicon). Excess portions of the sacrificial via fill material may be removed from above the top surface of the horizontal portion of the continuous dielectric liner 652L and/or from above the first contact level dielectric layer 280 by a planarization process. The planarization process may use chemical mechanical planarization (CMP) and/or at least one recess etch. Each remaining discrete portion of the sacrificial via fill material in a second-tier via cavity 541 constitutes a second-tier sacrificial via fill structure 557. Each remaining discrete portion of the sacrificial via fill material in an inter-tier via cavity 444 constitutes an inter-tier sacrificial via fill structure 457. Thus, each second-tier sacrificial via fill structure 557 is formed within a volume of a second-tier via cavity 541, and each inter-tier sacrificial via fill structure 457 is formed within a volume of an inter-tier via cavity 444.

Referring to FIGS. 73A-73C, the processing steps of FIGS. 20A and 20B, 21A-21E, 22, and 23 may be performed to form backside trenches 79 and to form first backside recesses 143 and the second backside recesses 243. In one embodiment, a sacrificial capping layer (not shown) including a dielectric material such as silicon oxide can be formed over the first contact level dielectric layer 280 prior to formation of the backside trenches 79 to protect the inter-tier sacrificial via fill structures 457 and the second-tier sacrificial via fill structure 557 during formation of the backside recesses 143 if the inter-tier sacrificial via fill structures 457 and the second-tier sacrificial via fill structures 557 comprise a same material as the first and second sacrificial material layers (142, 242). The continuous dielectric liner 652L can protect the inter-tier sacrificial via fill structures 457 and the second-tier sacrificial via fill structure 557. In one embodiment, the first and second sacrificial material layers (142, 242) may include silicon nitride, and removal of the first and second sacrificial material layers (142, 242) may be performed by a wet etch process using hot phosphoric acid.

Referring to FIGS. 74A-74D, the processing steps of FIGS. 24 and 25A-25E can be performed to deposit at least one conductive material in the first and second backside recesses (143, 243). The at least one conductive material fills the first backside recesses 143 to form first electrically conductive layers 146 and fills the second backside recesses 243 to form second electrically conductive layers 246. Each of the first electrically conductive layers 146 and the second electrically conductive layers 246 can include a metallic nitride liner 46A and a metallic fill material portion 46B. The metallic nitride liner 46A can include TiN, TaN, and/or WN. The metallic fill material portion 46B can include W, Co, Mo, and/or Cu. Each of the first electrically conductive layers 146 and the second electrically conductive layers 246 can contact a bottom surface of a continuous dielectric liner 652L at the bottom of a respective one of the second-tier via cavities 541 and inter-tier via cavities 444. The first sacrificial material layers 142 and the second sacrificial material layers 242 are replaced with first electrically conductive layers 146 and second electrically conductive layers 246, respectively, while the inter-tier sacrificial via fill structures 457 and the second-tier sacrificial via fill structure 557 are present.

Referring to FIGS. 75A-75C, the sacrificial capping layer (not shown), if present, can be removed from above the first contact level dielectric layer 280. The inter-tier sacrificial via fill structures 457 and the second-tier sacrificial via fill structure 557 can be removed selective to the continuous dielectric liner 652L. A wet etch process that etches the material of the inter-tier sacrificial via fill structures 457 and the second-tier sacrificial via fill structure 557 selective to the material of the continuous dielectric liner 652L can be performed. For example, if the inter-tier sacrificial via fill structures 457 and the second-tier sacrificial via fill structure 557 include silicon nitride, a wet etch process employing hot phosphoric acid can be performed. If the inter-tier sacrificial via fill structures 457 and the second-tier sacrificial via fill structure 557 include a semiconductor material, a wet etch process employing hot trimethyl-2 hydroxyethyl ammonium hydroxide ("hot TMY") may be performed to remove the inter-tier sacrificial via fill structures 457 and the second-tier sacrificial via fill structure 557. An inter-tier via cavity 459 is formed in each volume from which an inter-tier sacrificial via fill structure 457 is removed. A second-tier via cavity 559 is formed in each volume from which a second-tier sacrificial via fill structure 557 is removed.

Referring to FIGS. 76A-76C, an anisotropic etch process can be performed to remove horizontal portions of the continuous dielectric liner 652L. Each remaining cylindrical portion of the continuous dielectric liner 652L constitutes a dielectric liner 652. A top surface of a first electrically conductive layer 146 is physically exposed at the bottom of each inter-tier via cavity 459. A top surface of a second electrically conductive layer 246 is physically exposed at the bottom of each second-tier via cavity 559.

Referring to FIGS. 77A-77D, at least one conductive material may be deposited in the inter-tier via cavities 459 and the second-tier via cavities 559. The at least one conductive material may include a contact via metallic liner 780A and a contact via metal fill portion 780B. The contact via metallic liner 780A may include a conductive metallic nitride such as TiN, TaN, or WN. The contact via metal fill portion 780B may include an elemental metal such as W, Mo, Co, Cu, or Ru or an intermetallic alloy. Excess portions of the at least one conductive material may be removed from above the horizontal plane including the top surface of the first contact level dielectric layer 280 by a planarization process, which can employ a recess etch and/or chemical mechanical planarization.

Each remaining portion of the at least one conductive material in the inter-tier via cavities 459 constitutes a first conductive via structure 780, which contacts a respective first electrically conductive layers 146. Each remaining portion of the at least one conductive material in the second-tier via cavities 559 constitutes a second conductive via structure 880, which contacts a respective second electrically conductive layer 246. Each inter-tier sacrificial via fill structure 457 is replaced with a first conductive via structure 780. Each second-tier sacrificial via fill structure 557 is replaced with a second conductive via structure 880.

Each of the first conductive via structures 780 and the second conductive via structures 880 is laterally surrounded by a respective dielectric liner 652. Each contiguous combination of a first conductive via structure 780 and a dielectric liner 652 constitutes a first laterally-insulated staircase region via structure (780, 652). A first laterally-insulated staircase region via structure (780, 652) can be formed through the first and second retro-stepped dielectric material portions (165, 265) and through a respective first subset of layers of the second alternating stack (232, 246) and directly on a respective first electrically conductive layer 146. The respective first subset of layers of the second alternating stack (232, 246) includes at least a bottommost insulating layer of the second alternating stack (232, 246). Each contiguous combination of a second conductive via structure 880 and a dielectric liner 652 constitutes a second laterally-insulated staircase region via structure (880, 652). A second laterally-insulated staircase region via structure (880, 652) can be formed through the second retro-stepped dielectric material portion 265 directly on a respective one of the second electrically conductive layers 246.

Each of the first laterally-insulated staircase region via structure (780, 652) is formed in a volume of an inter-tier via cavity 459. Each inter-tier sacrificial via fill structure 457 is replaced with a respective first contact via structure 780. Each of the first conductive via structures 780 is electrically connected to one of the first electrically conductive layers 146, and is electrically isolated from each of the second electrically conductive layers 246.

All or some of the first laterally-insulated staircase region via structures (780, 652) vertically extend through a first subset of the second electrically conductive layers 246 of the second alternating stack (232, 246) and the first retro-stepped dielectric material portion 165. Each first laterally-insulated staircase region via structure (780, 652) comprises a respective dielectric liner 652, which is herein referred to as a first dielectric liner. Each first dielectric liner 652 laterally surrounds a respective first conductive via structure 780 and contacts each of the first subset of the second electrically conductive layers 246 of the second alternating stack (232, 246). In one embodiment, all or some of the first laterally-insulated staircase region via structures (780, 652) extend through, and contacts, one of vertical steps of the second stepped surfaces of the second alternating stack (232, 246). At least a portion of one first laterally-insulated staircase region via structure 781 of the first laterally-insulated staircase region via structures (780, 652) does not vertically extend through a second subset of the second electrically conductive layers 246 of the second alternating stack (232, 246) that includes a topmost one of the second electrically conductive layers 246. For example, an outer portion of the first laterally-insulated staircase region via structure 781 protrudes laterally past the vertical edge of the bottommost second electrically conductive layer 246.

Each second laterally-insulated staircase region via structure (880, 652) vertically extends through the second retro-stepped dielectric material portion 265 and contacts a respective second electrically conductive layer 246 within the second alternating stack (232, 246). Each topmost surface of the first laterally-insulated staircase region via structures (780, 652) and each topmost surface of the second laterally-insulated staircase region via structures (880, 652) can be located within a same horizontal plane, which can be the horizontal plane including the top surface of the first contact level dielectric layer 280.

In one embodiment, each first conductive via structure 780 comprises a contact via metallic liner 780A comprising a metallic nitride material and a contact via metal fill portion 780B embedded in the contact via metallic liner 780A. Each first electrically conductive layer 146 can comprise a metallic nitride liner 146A comprising another metallic nitride material and a metallic fill material portion 146B embedded in the metallic nitride liner 146A. Each contact via metal fill portion 780B can be vertically spaced from an underlying metallic fill material portion 146B by a contact via metallic liner 780A and a metallic nitride liner 146A. A bottommost surface of each first conductive via structure 780 can contact a top surface of a respective one of the first electrically conductive layers 146.

In a first alternative aspect of the sixth embodiment illustrated in FIGS. 78A to 81D, the first and second conductive via structures (780, 880) are formed prior to the electrically conductive layers (146, 246), and the sacrificial via fill structures (457, 557) may be omitted. Referring to FIGS. 78A-78C, the first alternative configuration of the sixth exemplary structure can be derived from the sixth exemplary structure illustrated in FIGS. 71A-71C by performing an anisotropic etch process that removes horizontal portions of the continuous dielectric liner 652L. Each remaining cylindrical portion of the continuous dielectric liner 652L constitutes a dielectric liner 652. A top surface of a first sacrificial material layer 142 is physically exposed at the bottom of each inter-tier via cavity 459, and a top surface of a second sacrificial material layer 242 is physically exposed at the bottom of each second-tier via cavity 559.

Referring to FIGS. 79A-79C, the processing steps of FIGS. 77A-77C can be performed to form first conductive via structures 780 in each of the inter-tier via cavities 459, and to form second conductive via structures 880 in each of the second-tier via cavities 559.

Each of the first conductive via structures 780 and the second conductive via structures 880 is laterally surrounded by a respective dielectric liner 652. Each contiguous combination of a first conductive via structure 780 and a dielectric liner 652 constitutes a first laterally-insulated staircase region via structure (780, 652). A first laterally-insulated staircase region via structure (780, 652) can be formed through the first and second retro-stepped dielectric material portions (165, 265) and through a respective first subset of layers of the second alternating stack (232, 242) and directly on a respective first electrically conductive layer 146. The respective first subset of layers of the second alternating stack (232, 242) includes at least a bottommost insulating layer of the second alternating stack (232, 242). Each contiguous combination of a second conductive via structure 880 and a dielectric liner 652 constitutes a second laterally-insulated staircase region via structure (880, 652). A second laterally-insulated staircase region via structure (880, 652) can be formed through the second retro-stepped dielectric material portion 265 directly on a respective one of the second sacrificial material layer 242.

Referring to FIGS. 80A-80C, the processing steps of FIGS. 20A and 20B, 21A-21E, 22, and 23 may be performed to form backside trenches 79, and to form first backside recesses 143 and the second backside recesses 243. In one embodiment, the first and second sacrificial material layers (142, 242) may include silicon nitride, and removal of the first and second sacrificial material layers (142, 242) may be performed by a wet etch process using hot phosphoric acid. A bottom surface of a first conductive via structure 780 is physically exposed to each first backside recess 143, and a bottom surface of a second conductive via structure 880 is physically exposed to each second backside recess 243.

Referring to FIGS. 81A-81D, the processing steps of FIGS. 24 and 25A-25E can be performed to deposit at least one conductive material in the first and second backside recesses (143, 243). The at least one conductive material fills the first backside recesses 143 to form first electrically conductive layers 146 and fills the second backside recesses 243 to form second electrically conductive layers 246. Each of the first electrically conductive layers 146 and the second electrically conductive layers 246 can include a metallic nitride liner 46A and a metallic fill material portion 46B. The metallic nitride liner 46A can include TiN, TaN, and/or WN. The metallic fill material portion 46B can include W, Co, Mo, and/or Cu. The structure shown in FIG. 81D is similar to the structure shown in FIG. 77D.

Each of the first conductive via structures 780 is electrically connected to one of the first electrically conductive layers 146, and is electrically isolated from each of the second electrically conductive layers 246. Each contact via metal fill portion 780B can be vertically spaced from an underlying metallic fill material portion 146B by a contact via metallic liner 780A and a metallic nitride liner 146A. A bottommost surface of each first conductive via structure 780 can contact a top surface of a respective one of the first electrically conductive layers 146. A bottommost surface of each second conductive via structure 880 can contact a top surface of a respective one of the second electrically conductive layers 246.

In a second alternative aspect of the sixth embodiment illustrated in FIGS. 82A to 85D, the first and second conductive via structures (780, 880) are formed at the same time (i.e., during the same deposition step(s)) as the electrically conductive layers (146, 246), and the sacrificial via fill structures (457, 557) may be omitted. Referring to FIGS. 82A-82C, the second alternative configuration of the sixth exemplary structure can be derived from the sixth exemplary structure illustrated in FIGS. 71A-71 by performing an anisotropic etch process that removes horizontal portions of the continuous dielectric liner 652L. Each remaining cylindrical portion of the continuous dielectric liner 652L constitutes a dielectric liner 652. A top surface of a first sacrificial material layer 142 is physically exposed at the bottom of each inter-tier via cavity 459, and a top surface of a second sacrificial material layer 242 is physically exposed at the bottom of each second-tier via cavity 559.

Referring to FIGS. 83A-83C, the processing steps of FIGS. 20A and 20B, 21A-21E, 22, and 23 may be performed to form backside trenches 79, and to form first backside recesses 143 and the second backside recesses 243. In one embodiment, the first and second sacrificial material layers (142, 242) may include silicon nitride, and removal of the first and second sacrificial material layers (142, 242) may be performed by a wet etch process using hot phosphoric acid. The first sacrificial material layers 142 and the second sacrificial material layers 242 are removed selective to the first insulating layers 132 and the second insulating layers 232 while the inter-tier via cavities 459 and the second-tier cavities 559 contain voids. Each first backside recess 143 can be connected to a respective one of the inter-tier via cavities 459, and each second backside recess 243 can be connected to a respective one of the second-tier via cavities 559.

Referring to FIGS. 84A and 84B, the processing steps of FIGS. 24 and 25A-25E can be performed to deposit at least one conductive material in the inter-tier via cavities 459, the second-tier via cavities 559, and the first and second backside recesses (143, 243). The at least one conductive material fills the inter-tier via cavities 449 to form first conductive via structures 780, fills the second-tier via cavities 559 to form second conductive via structures 880, fills the first backside recesses 143 to form first electrically conductive layers 146, and fills the second backside recesses 243 to form second electrically conductive layers 246. A horizontally-extending portion of the at least one conductive material can be deposited over the first contact level dielectric layer 280 to form a conductive material layer 780L. The first electrically conductive material layers 146 and the second electrically conductive layers 246 are formed concurrently with formation of the first conductive via structures 780 in the inter-tier via cavities 559 and the second conductive via structures 880 in the second-tier via cavities 459 by deposition of the at least one conductive material.

Referring to FIGS. 85A-85D, the conductive material layer 780L that overlies the horizontal plane including the top surface of the first contact level dielectric layer 280 can be removed by a planarization process. The planarization process can employ a recess etch process and/or chemical mechanical planarization.

Each of the first conductive via structures 780, the second conductive via structures 880, the first electrically conductive layers 146, and the second electrically conductive layers 246 may include a metallic nitride liner 146A and a metallic fill material portion 146B. The metallic nitride liner 146A may include TiN, TaN, and/or WN. The metallic fill material portion 146B may include W, Co, Mo, and/or Cu. A pair of a first electrically conductive layer 146 and a first conductive via structures 780 may include portions of a common metallic nitride liner 146A and portions of a common metallic fill material portion 146B. A pair of a second electrically conductive layer 246 and a second conductive via structure 880 may include portions of a common metallic nitride liner 146A and portions of a common metallic fill material portion 146B.

Each contiguous set of a first conductive via structures 780 and a dielectric liner 652 constitutes a first laterally-insulated staircase region via structure (780, 652). The first conductive via structure 780 is electrically and physically connected to only one of the first electrically conductive layers 146, and is electrically isolated from all other first electrically conductive layer 146 and from the second electrically conductive layers 246. Each contiguous set of a second conductive via structures 880 and a dielectric liner 652 constitutes a second laterally-insulated staircase region via structure (880, 652). The second conductive via structure 880 is electrically connected to only one of the second electrically conductive layers 246 and electrically isolated from all other second electrically conductive layers 246 and from the first electrically conductive layers 146.

In one embodiment, each first conductive via structure 780 comprises a vertically-extending portion of a metallic nitride liner 780A comprising a metallic nitride material and a vertically-extending portion of a metallic fill material (comprising a metallic fill material portion 780B) embedded in the vertically-extending portion of the metallic nitride liner 780A. One of the first electrically conductive layers 146 comprises a horizontally-extending portion of the metallic nitride liner 146A and a horizontally-extending portion of the metallic fill material (comprising the metallic fill material portion 146B) embedded in the horizontally-extending portion of the metallic nitride liner 146A. The metallic fill material portion 146B directly contacts the metallic fill material portion 780B such that no seam or interface is present between them. A first conductive via structure 780 and an adjoining one of the first electrically conductive layers 146 can be formed as an integrated structure including a conductive material portion (such as a metallic nitride liner (146A, 780A) and/or a metallic fill material portion (146B, 780B)) that continuously extends inside the first conductive via structure 780 and inside the one of the first electrically conductive layers 146.

Referring to all drawings and according to various embodiments of the present disclosure, a device structure is provided, which comprises: a first alternating stack of first insulating layers 132 and first electrically conductive layers 146 located over a substrate 8 and including first stepped surfaces in a staircase region 200; a first retro-stepped dielectric material portion 165 overlying the first stepped surfaces of the first alternating stack (132, 146); a second alternating stack of second insulating layers 232 and second electrically conductive layers 246 located over the first alternating stack and including second stepped surfaces in the staircase region 200; a second retro-stepped dielectric material portion 265 overlying the second stepped surfaces of the second alternating stack (232, 246); and a first laterally-insulated staircase region via structure (780, 652) vertically extending through a first subset of the second electrically conductive layers 246 of the second alternating stack and the first retro-stepped dielectric material portion 165, wherein the first laterally-insulated staircase region via structure (780, 652) comprises a first conductive via structure 780 that is electrically connected to one of the first electrically conductive layers 146, and is electrically isolated from each of the second electrically conductive layers 246.

In one embodiment, areas of horizontal surfaces HS2 of the second stepped surfaces overlap with areas of horizontal surfaces HS1 of the first stepped surfaces in a plan view along a direction hd1 that is perpendicular to horizontal surfaces of the first insulating layers 132, the first electrically conductive layers 146, the second insulating layers 232, and the second electrically conductive layers 246.

In one embodiment, vertical steps S2 of the second stepped surfaces are laterally offset relative to vertical steps S of the first stepped surfaces along a horizontal direction that is perpendicular to a horizontal direction hd1 along which the vertical steps of the second stepped surfaces laterally extend.

In one embodiment, the first laterally-insulated staircase region via structure (780, 652) comprises a first dielectric liner 652 that laterally surrounds the first conductive via structure 780 and contacts each of the first subset of the second electrically conductive layers 246 of the second alternating stack (232, 246).

In one embodiment, the first conductive via structure 780 comprises a contact via metallic liner 780A comprising a metallic nitride material and a contact via metal fill portion 780B embedded in the contact via metallic liner 780A. One of the first electrically conductive layers 146 comprises a metallic nitride liner 146A comprising another metallic nitride material and a metallic fill material portion 146B embedded in the metallic nitride liner 146A. The contact via metal fill portion 780B is vertically spaced from the metallic fill material portion 146B by the contact via metallic liner 780A and the metallic nitride liner 146A.

In one embodiment shown in FIGS. 77D and 81D, the first conductive via structure 780 comprises a vertically-extending portion of a metallic nitride liner 780A comprising a metallic nitride material and a vertically-extending portion of a metallic fill material (comprising a metallic fill material portion 146B) embedded in the vertically-extending portion of the metallic nitride liner 780. One of the first electrically conductive layers 146 comprises a horizontally-extending portion of the metallic nitride liner 146A and a horizontally-extending portion of the metallic fill material (comprising the metallic fill material portion 146B) embedded in the horizontally-extending portion of the metallic nitride liner 146A.

In another embodiment shown in FIG. 85D, the first conductive via structure 780 and the one of the first electrically conductive layers 146 are an integrated structure including a conductive material portion (which can comprise a metallic nitride liner (146A, 780A) and/or as a metallic fill material portion (146B, 780B)) that continuously extends inside the first conductive via structure 780 and inside the one of the first electrically conductive layers 146, such that no seam or interface is present between the first conductive via structure 780 and one of the first electrically conductive layers 146.

A second laterally-insulated staircase region via structure (880, 652) can vertically extend through the second retro-stepped dielectric material portion 265, and can contact a respective second electrically conductive layer 246 within the second alternating stack (232, 246). In one embodiment, a topmost surface of the first laterally-insulated staircase region via structure (780, 652) and a topmost surface of the second laterally-insulated staircase region via structure (880, 652) are located within a same horizontal plane.

In one embodiment, the first subset of the second electrically conductive layers 246 of the second alternating stack (232, 246) comprises a bottommost one of the second electrically conductive layers 246; and at least a portion of a first laterally-insulated staircase region via structure 781 of the first laterally-insulated staircase region via structures (780, 652) does not vertically extend through a second subset of the second electrically conductive layers 246 of the second alternating stack (232, 246) that includes a topmost one of the second electrically conductive layers 246.

In one embodiment, the first laterally-insulated staircase region via structure (780, 652) extends through, and contacts, one of vertical steps of the second stepped surfaces of the second alternating stack (232, 246). In one embodiment, a bottommost surface of the first conductive via structure 780 contacts a top surface of the one of the first electrically conductive layers 146.

Memory stack structures 55 vertically extend through the first alternating stack (132, 146) and the second alternating stack (232, 246) within an area in which each layer of the first alternating stack (132, 146) and the second alternating stack (232, 246) is present. In one embodiment, each of the memory stack structures 55 comprises a vertical semiconductor channel 60 and a vertical stack of memory elements (as embodied as portions of charge storage layers 54 located at levels of the electrically conductive layers (146, 246)) located at levels of the first electrically conductive layers 146 and the second electrically conductive layers 246; the memory stack structures 55 are arranged as a two-dimensional array; and the device structure comprises a three-dimensional array of memory elements.

The areal overlap of the first stepped surfaces and the second stepped surfaces reduces the total area of the staircase region 200, and thus provides a three-dimensional memory device having a higher device density.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A device structure comprising:

a first alternating stack of first insulating layers and first electrically conductive layers located over a substrate and including first stepped surfaces in a staircase region;

a first retro-stepped dielectric material portion overlying the first stepped surfaces of the first alternating stack;

a second alternating stack of second insulating layers and second electrically conductive layers located over the first alternating stack and including second stepped surfaces in the staircase region;

a second retro-stepped dielectric material portion overlying the second stepped surfaces of the second alternating stack; and a first laterally-insulated staircase region via structure vertically extending through a first subset of the second electrically conductive layers of the second alternating stack and the first retro-stepped dielectric material portion, wherein the first laterally-insulated staircase region via structure comprises a first conductive via structure that is electrically connected to one of the first electrically conductive layers, and is electrically isolated from each of the second electrically conductive layers;

wherein the first laterally-insulated staircase region via structure comprises a first dielectric liner that laterally surrounds the first conductive via structure and contacts each of the first subset of the second electrically conductive layers of the second alternating stack; and wherein a bottommost one of the second electrically conductive layers of the second alternating stack entirely laterally surrounds the first laterally-insulated staircase region via structure as a single continuous structure.

2. A device structure comprising:

a first alternating stack of first insulating layers and first electrically conductive layers located over a substrate and including first stepped surfaces in a staircase region;

a first retro-stepped dielectric material portion overlying, and contacting, the first stepped surfaces of the first alternating stack;

a second alternating stack of second insulating layers and second electrically conductive layers located over the first alternating stack and including second stepped surfaces in the staircase region;

a second retro-stepped dielectric material portion overlying the second stepped surfaces of the second alternating stack; and first laterally-insulated staircase region via structures vertically extending through a respective first subset of the second electrically conductive layers of the second alternating stack and through a portion of the first retro-stepped dielectric material portion, wherein each of the first laterally-insulated staircase region via structures contacts a respective one of the first electrically conductive layers at a respective horizontal portion of the first stepped surfaces of the first staircase region, and a bottommost one of the second electrically conductive layers of the second alternating stack entirely laterally surrounds each of the first laterally-insulated staircase region via structures as a single continuous structure, wherein each of the first laterally-insulated staircase region via structures comprises a respective first conductive via structure that is electrically connected to the respective one of the first electrically conductive layers, and is electrically isolated from each of the second electrically conductive layers.

3. The device structure of claim 2, wherein the portion of the first retro-stepped dielectric material layer through which the first laterally-insulated staircase region via structures vertically extend underlies, and has an areal overlap with, the second stepped surfaces of the second alternating stack.

4. The device structure of claim 2, wherein the portion of the first retro-stepped dielectric material layer contacts each horizontal surface and each vertical surface of the first stepped surfaces of the first staircase region.

5. The device structure of claim 2, wherein:

each of the first laterally-insulated staircase region via structures comprises a first dielectric liner that laterally surrounds the respective first conductive via structure and contacts each of the first subset of the second electrically conductive layers of the second alternating stack; and each of first dielectric liners continuously extends from a top surface of the respective one of the first electrically conductive layers to a top surface of the second retro-stepped dielectric material portion and does not extend through a bottommost one of the first electrically conductive layers.

* * * * *